United States Patent [19]
Lipkis et al.
[11] Patent Number: 4,914,567
[45] Date of Patent: Apr. 3, 1990

[54] DESIGN SYSTEM USING VISUAL LANGUAGE

[75] Inventors: Thomas A. Lipkis, Topanga; William S. Mark, San Carlos; Melvin W. Pirtle, Santa Monica, all of Calif.

[73] Assignee: Savoir, Hayward, Calif.

[21] Appl. No.: 261,953

[22] Filed: Oct. 24, 1988

Related U.S. Application Data

[63] Continuation-in-part of Ser. No. 115,473, Nov. 2, 1987, abandoned.

[51] Int. Cl.[4] .............................................. G06F 15/00
[52] U.S. Cl. .................................... 364/188; 364/191; 364/578
[58] Field of Search ............... 364/188, 189, 190, 191, 364/192, 193, 200, 300, 900, 578

[56] References Cited

U.S. PATENT DOCUMENTS 4,570,217 2/1986 Allen et al. ......................... 364/188

OTHER PUBLICATIONS

Rock Miller, "Savoir: The Object is Cell Control", *Managing Automation,* Apr. 1988.
The Flexis Toolset Core Technology for Systems Engineering, *Savoir,* 9/88.

*Primary Examiner*—Allen MacDonald
*Attorney, Agent, or Firm*—Townsend and Townsend

[57] ABSTRACT

A computer-based tool, in the form of a computer system and method, for designing, constructing and interacting with any system containing or comprising concurrent asychronous processes, such as a factory operation. In the system according to the invention a variety of development and execution tools are supported. The invention features a highly visual user presentation of a control system, including structure, specification, and operation, offering a user an interactive capability for rapid design, modification, and exploration of the operating characteristics of a control system comprising asynchronous processes. The invention captures a representation of the system (RS) that is equivalent to the actual system (AS)—rather than a simulation of the actual system. This allows the invention to perform tests and modification on RS instead of AS, yet get accurate results. RS and AS are equivalent because AS is generated directly from RS by an automated process. Effectively, pressing a button in the RS environment can "create" the AS version or any selected portion of it, by "downloading" a translation of the RS version that can be executed by a programmable processor in the AS environment. Information can flow both ways between AS and RS. That AS and RS can interact is important. This allows RS to "take on" the "state" of AS whenever desired, through an "uploading" procedure, thereby reflecting accurately the condition of AS at a specific point in time.

15 Claims, 3 Drawing Sheets

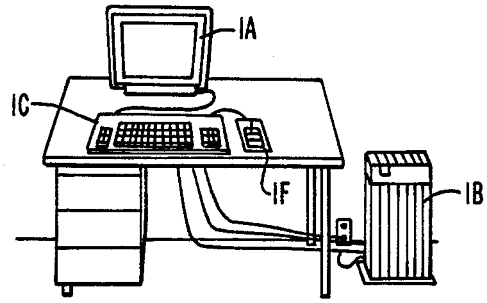
FIG._1.
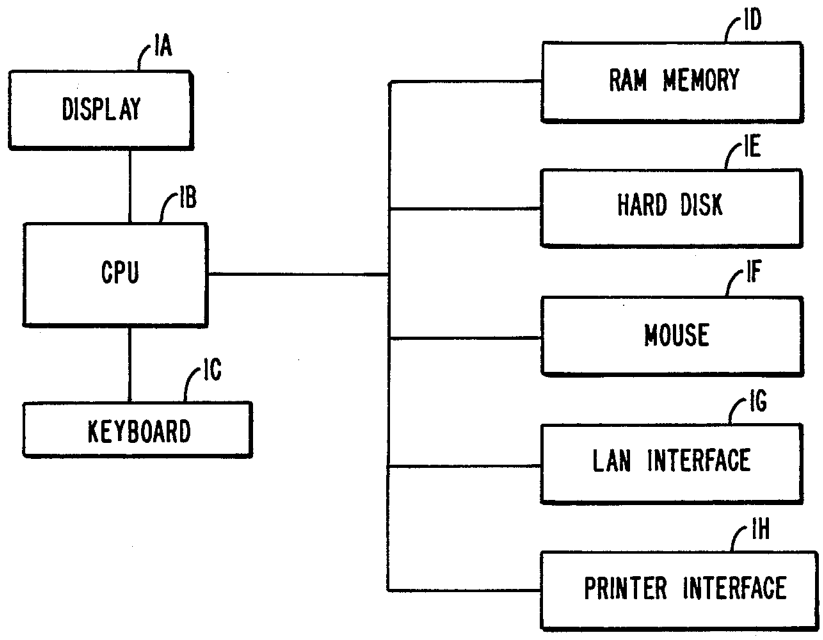
FIG._2.

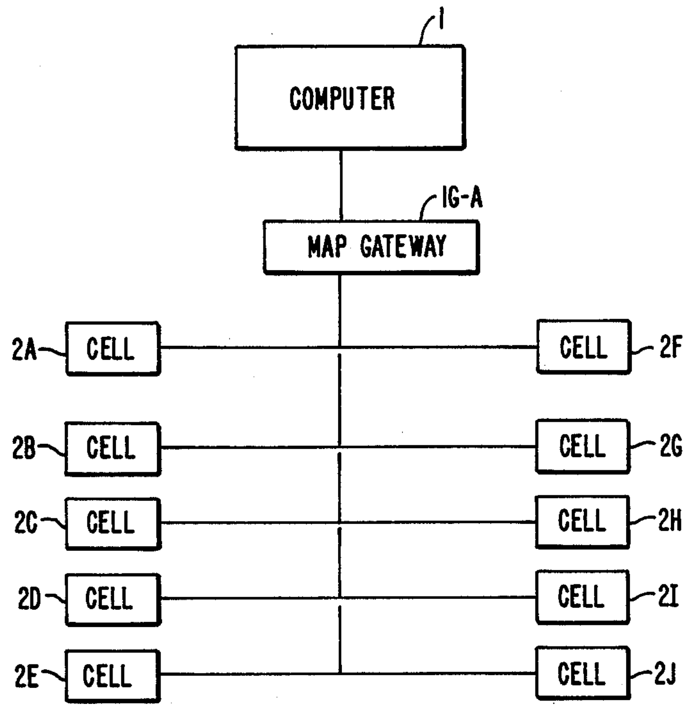
FIG._3.

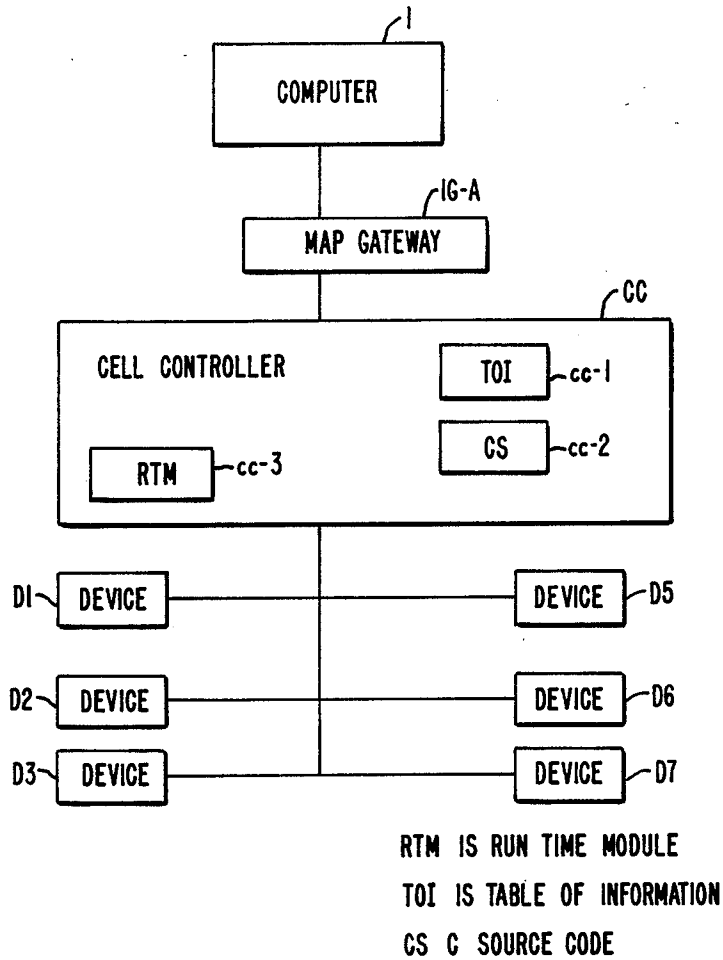
FIG._4.

DESIGN SYSTEM USING VISUAL LANGUAGE

BACKGROUND OF THE INVENTION

This application is a continuation-in-part of copending U.S. patent application Ser. No. 07/115,473 filed Nov. 2, 1987 in the names of Lipkis, Mark and Pirtle. An appendix has been added by this continuation-in-part application now abandoned.

FIELD OF THE INVENTION

The present invention relates to computer programs and more particularly to a computer program for designing, constructing and supporting systems of concurrent asynchronous processes.

BACKGROUND AND PRIOR ART

An automated factory is an example of a large complex interactive system. The design of such large complex systems is a significant technological challenge. There is much literature on the subject and there are various computer programs that can assist an engineer in the process of designing an automated system. The existing design aids have a variety of shortcomings and none of them address the entire problem.

For example in the factory environment, there are many automated devices available such as robots, artificial vision systems, and the like. There are also known design aids for automating a single device such as a robot. However, to achieve the next level of automation, a multitude of devices must be coordinated as a composite unit: the factory cell.

In a factory cell, devices operate asynchronously and concurrently. The detailed actions of each device are managed by individual device controllers. The cell control logic must coordinate these device controllers usually by communicating with them over a network or direct link. Optimally, this cell logic must also provide the interface for operators and maintenance personnel. In addition, many applications require the cell to collect data about device performance and part quality. Communication with other parts of the factory may also be a requirement.

A cell system, in broad terms, consists of interacting asynchronous concurrent processes. The fundamental problem of cell control is creating logic for processes that operate and communicate in parallel.

One of the stumbling blocks to complete factory automation is the inability of efficiently configure individual factory processes into productive, cooperative systems. One of the major problems to a coordinated factory automation program is that all processes do not move at the same pace or begin and end in the same field of time as other processes.

Present systems do not include an integrated approach where control programs can be sent to cell controllers for execution on a local controller in an interactive environment. Stated differently, present systems do not provide an completely integrated and interactive specification, design, and operating environment.

OBJECTS OF THE INVENTION

An object of the present invention is to provide an improved technique for designing complex systems.

Another object is to be able to communicate the behavior and structure of a complex system.

Another object is reduce the time required to design a completely functional system.

Still another object is to provide a means to rapidly prototype a number of different approaches without spending time at the detail level.

Yet another object is to provide diagnostic tools to enable one to discover quickly why an operational system is not behaving as desired.

Another object is to speed up the integration process in a situation where one is trying to verify that each functional element relates accurately to the entire system.

Still another object is to allow a user to deal with the creation and verification process in an integrated manner.

SUMMARY OF THE INVENTION

The invention is a computer-based tool, in the form of a computer system and method, for designing, constructing and interacting with any system containing or comprising concurrent asynchronous processes, such as a factory operation. In the system according to the invention a variety of development and execution tools are supported. The invention features a highly visual user presentation of the structure, specification, and operation of a control system. The invention offers a user an interactive capability for rapid design, modification, and exploration of the operating characteristics of the system. The invention provides a set of integrated and interactive functional capabilities that help the user produce a complete detailed specification, offering rapid prototyping, comprehensive documentation, system emulation, functional animation, and system analysis capabilities. Specifically, the invention provides an environment supporting the combination of:

(a) A high-level, graphic, control-flow language, specifically the international standard Grafcet, for pictorially specifying the structure and detailed interaction of a system of concurrent processes.

(b) A low-level logic specification language for setting and testing state variables, transferring information between control processes, collecting data, and other fundamental activities. Specific examples are C and LISP applied as logic specific languages.

(c) An emulation capability that "executes" the control specification, visually highlighting the active steps on displayed Grafcet charts, showing the value changes of displayed variables, and displaying the inter-process message traffic of selected processes.

(d) An animation capability that helps the user develop a depiction of the controlled devices and manipulate the images as the system is emulated; adding an extra dimension to the graphic display of a functioning control specification.

(e) A messaging capability which provides templates for message development, message tracing, message sending and receiving, and which automatically facilitates information transfer in formats which are compatible with standard network protocols, such as the Manufacturing Application Protocol (MAP).

(f) Structural depictions that will draw the hierarchical relationship among sub-elements of a process, and also draw the communication interconnection among processes, offering a highly visual operational representation of the entire control structure.

(g) Built-in analysis tools which enable the user to locate and examine specific aspects and interactions of a design, to trace emulated operational characteristics, and to time the activities of emulated devices and processes.

(h) Documentation facilities which automatically format the process documentation for printing and provide hierarchical diagrams, Grafcet charts, logic program listings, indexing, and a table of contents.

(i) A capability to interface with a network, such as a MAP (Manufacturing Automation PRotocol) factory network interface, in a manner to allow the user to substitute selected actual devices for emulated device and to send message traffic across the network as well as to the on-screen emulation.

(j) A direct MAP control capability which allows the user to control a remote device directly by sending messages directly to the device and asking for return status information.

(k) An MMI (man machine interface) development capability for assisting the user develop MMI screens for use on the shop floor computer.

(l) A download capability for compiling the designer specification and for sending it across the factory network to a run time module in a shop floor computer or device (a cell) for on-floor execution.

(m) A monitoring capability which can remotely interact with a downloaded module.

The invention provides a mechanism for capturing a representation of the system (RS) that is equivalent to an actual system (AS)—rather than a simulation of the actual system. This allows the tools according to the invention to perform tests and modifications on the RS instead of the AS, yet get accurate results.

RS and AS are equivalent because AS is generated directly from RS by an automated process. Pressing a button for example in the RS environment can "create" the AS version or any selected portion of it, by "downloading" a translation of the RS version that can be executed by a programmable processor in the AS environment.

Information can flow both ways between AS and RS. That AS and RS can interact is important. This allows RS to "take on" the "state" of AS whenever desired, through an "uploading" procedure, thereby reflecting accurately the condition of AS at a specific point in time. This permits an engineer to explore and dissect, so to speak, the RS version of the system without effecting the AS version that may still be in active operation. This is important for systems that cannot be easily taken out of service for diagnosis or maintenance.

The foregoing and other objects, features and advantages of the invention will be apparent from the following more particular description of preferred embodiments of the invention, as illustrated in the accompanying drawings.

BRIEF DESCRIPTION OF THE DRAWINGS

FIG. 1 shows a computer work station used to implement the present invention.

FIG. 2 is a fundamental block diagram of the computer system shown in FIG. 1.

FIG. 3 is a diagram of an overall automated factory.

FIG. 4 is a block diagram showing how an individual cell may be operated and tested.

FIG. 5 shows a representative image on the display.

FIG. 6 is a hierarchical diagram of a representative group of the programming objects used to implement the system.

DESCRIPTION OF SPECIFIC EMBODIMENTS

A specific embodiment of the invention disclosed herein is represented as it might be implemented using a Xerox 1185/86 Artificial Intelligence Work Station. The Xerox 1185/86 Work Station is a computer which provides an object-oriented applications platform and interconnections with other equipment as hereinafter explained. The present invention takes advantage of the speed offered by this work station's micro-coded object-oriented environment, coupling high performance without comprising the object-oriented benefits.

As will be explained later, the computer work station can be coupled to the factor floor through a factory network. Once a design is fully developed and checked-out, the system control can be downloaded to an industrial computer. For later maintenance activity when a powerful diagnostic tool is needed, a reconnection over the network can upload the system's state.

The 1185/86 computer is commercially available from Xerox Corporation, and it is described among other places in the manual published by Xerox entitled "1186 User's Guide" (Manual 3101678, May 1986). This computer utilizes an object oriented programming language which is described in a manual published by Xerox entitled "Interlisp-D Reference Manual Volume 1: Language" (Publication 3101272 October 1985). The above-referenced manuals are hereby incorporated herein by reference.

The computer system shown to implement the specific embodiment of the invention is shown in FIG. 1. The major components of the system are shown diagrammatically in FIG. 2. They include a display 1A, a central processing unit 1B, a keyboard 1C and a mouse 1F. As shown in FIG. 2, the system preferably includes 3.7 megabytes of RAM memory 1D and 80 megabytes of Hard Disk storage 1E. The display is for example a monochrome 1152×861 pixel display. The system may include an Ethernet LAN interface 1G and Laser Printer interface 1H.

In the following discussion, certain commonly used abbreviations will be used. The meaning of these abbreviations are: Flexible Assembly Systems (FAS), Computer Integrated Manufacturing (CIM), Artificial Intelligence (AI), Local Area Network (LAN) and Manufacturing Application Protocol (MAP). The system also uses the Grafcet visual presentation language, which is a well-known manner of presenting and describing information, and the "C" programming language which is a well-known programming language. Since the above are well-documented in the literature, they will not be explained herein.

The present invention provides a tool to support hierarchical top-down design and system implementation. It provides system operational analysis through Grafcet charts, it provides logic state level control through C language functions, and it provides complete system documentation with cross-references, table of contents and indexing.

The environment according to the invention is useful at many levels. On the front-end, while initiating a proposal, the present invention offers rapid prototyping and creation of system proposals and specifications. It can eliminate costly misunderstandings between vendor and user.

At system design, the present invention provides the tools necessary to quickly structure, develop and analyze various approaches. Its speed encourages the exploration of several approaches to find the optimum strategy before implementation begins.

During implementation, the present invention provides a comprehensive set of integration and check-out tools that permit safe and rapid integration. The present invntion also aids in the acceptance and test and vendor supplied subsystems.

Once a system is operational, the present invention provides powerful diagnostic capabilities that can analyze the uploaded state of an operational or malfunctioning system.

Finally, the present invention makes the subsequent modification or reconfiguration of even a complex system a straightforward and relatively easy task.

FIG. 4 shows how the system interrelates to the various cells in a factory. Cells are the basic units of autonomous operation in a factory. In the embodiment shown, each of the cells 2A to 2J in the factory interrelate through a network using a MAP protocol. The cells 2A to 2J could each be robots or they could be other types of automated equipment. The nature of each of the cells is not important to an understanding of the invention, and they will not be described further.

The computer 1 can be connected to the various cells through a LAN interface 1G and a MAP Gateway IG-A. Thus, the computer 1 can communicate with each of the cells using the MAP protocol. As shown in FIG. 3, the computer 1 interrelates with the cells 2A to 2J in an operational environment, and the invention can be used in its monitoring capacity.

Alternatively, the computer 1 can be connected to a single cell as shown in FIG. 4. In this case the invention can simulate the rest of the factory, and it can exercise the cell 2A as if the cell 2A were connected to the other machines in the network. With the present invention the same tool used to design the system is thus used to test the individual components of the system and to monitor the system when it is finally operational.

The engineering cycle of the system begins with initial concept, moves through the development and construction phases, becomes a diagnostic and maintenance activity when the system is finally operational, and eventually re-cycles when modification and upgrades are required. The cycle can be described as follows:

(1) Specification (developing the requirements and documentation);

(2) Design (developing the approach and its documentation);

(3) Development (implementing the design and generating its documentation);

(4) Simulation and/or Emulation (activating the design implementation in an artificial environment in such a way as to demonstrate the dynamics of the system);

(5) Debug (isolate and correct the cause of undesired behavior within a functional element before it is put into service, sometimes using simulation techniques to anticipate its eventual behavior);

(6) Translate and transfer the developed system into its operational embodiment;

(7) System integration and check-out (the process that verifies that each functional system element will interact and cooperate properly with the other functional elements in the system, usually involves recycling through the debug phase);

(8) Monitor and interact with (modify) the operational system;

(9) Diagnose malfunctions or unexplained behavior in the operational system; and

(10) Modify the system to the extent that the cycle begins again at phase 1 for some portion of the system.

Normally this cycle is a sequential process, with early stages being completed before later stages ae possible. Key to the invention is the ability to move freely through this cycle at will, maximizing the utilization of the engineer's creative insight.

One aspect of the invention is the use of a captured representation of the system (RS) that is equivalent to the actual system (AS)—rather than a simulation of the actual system. This allows tests and modification on RS instead of AS, yet get accurate results.

RS is the representation of the system, that is, the design specification of a system expressed in a form suitable for visual presentation on a work station terminal display. AS is the equivalent automatically rewritten in source code at the work station, which can be compiled or interpreted for direct use by the autonomous remote cells with a runtime module. In a specific embodiment, AS is executable code and associated tables of values which can operate with a generic runtime module.

It is a consequence of the invention that AS and RS are equivalent, because AS is generated directly from RS by an automated process. Effectively, pressing a button in the RS environment can "create" the AS version or any selected portion of it, by "downloading" a translation of the RS version that can be executed by a programmable processor in the AS environment.

Information can flow both ways from RS to AS and from AS to RS. That AS and RS can interact is important. This allows RS to "take on" the "state" of AS whenever desired, through an "uploading" procedure, thereby reflecting accurately the condition of AS at a specific point in time. This permits an engineer to explore and dissect, so to speak, the RS version of the system without affecting the AS version that may still be in active operation. This is important for systems that cannot be easily taken out of service for diagnosis or maintenance.

FIG. 4 shows how a representative cell is organized. The cell includes a cell controller CC and a number of devices D1 to D7 which are controlled by the cell controller. The cell controller includes a Run Time Module (RTM) cc-3. This RTM manages the execution of the system description that can be sent to it, and it interprets the Grafcet structural information in order to control the sequencing of the programs that actually send commands to the devices D1 to D7. The RTM also acts as the interface with computer 1 to upload a state of the controller and the devices. The computer 1 sends controller CC a Table of Information (TOI) cc-1 that represents the Grafcet structural information and other information such as breakpoint information and variable values. The computer 1 also sends cell controller CC programming source code cc-2. This code is compiled under control of the Run Time Module cc-3 to generate the control programs for the devices D1 to D7.

FIG. 5 shows a representative screen which appears on display 1A. The screen has the following areas which facilitate communication with the operator. Area 21 is a basic system interface for accessing computer files and processes. Area 22 is the interface to the MAP network. Area 23 is a the menu of items for interacting with the map network. Area 24 is a communication diagram drawn by the system to show how individual functional elements relate to each other. Area 25 is a trace window that displays message traffic between functional elements during operation or simulation. Area 26 is a window that displays the values of selected variables in simulated or operational mode. Area 27 is an animated depiction of the system's functional characteristics. Area 28 is a hierarchical diagram of a selected functional element. Area 29 is a window that displays a C language function within a functional element. Area 30 is the menu of high level activities that the user may select. Area 31 is a user interface to the underlying operating system that runs on the work station. Area 32 is a Grafcet program representing one of the elements in the hierarchical diagram.

These windows are all created using the facility of the basic underlying operating system which is described in the previously-referenced manuals. The contents of the windows are provided by the programming objects shown in FIG. 6.

The programming in computer 1 is an object-type of programming. Such programming, while different from conventional programming, is well known and is described in various textbooks. Object-oriented programming is not described by usual flow diagrams. Rather, it is described by diagrams such as FIG. 6. The objects and their interrelationship are shown in FIG. 6. The following is a description of the principal objects that comprise the embodiment of the invention shown herein. Item names are the objects found on the hierarchical diagram.

Program 102: A program for executable specification of a program. Programs may be written by the user. Certain programs are provided in libraries as part of the system. Programs may contain other programs as subparts.

GrafcetProgram 109: A specification of control flow written in the Grafcet language. It is made up of GrafcetObjects.

OtherProgram 110: A language-independent program or fragment (expression) used to specify low-level actions, Boolean conditions, etc. It is primarily used with GrafcetPrograms, but it is also used in other places where it is appropriate for the user to specify custom behavior (e.g., MMI). The two languages supported in the specific embodiment are C and LISP. (These subclasses are completely interchangeable: the user can choose whichever is best suited to a particular situation.)

GrafcetObject 103: The pieces from which Grafcet "flowcharts" are assembled.

GrafcetStep 111: A "node" is a Grafcet "flowchart" that is activated when control passes to it and is deactivated when control passes out. Control passes as a result of a change in value of a GrafcetTransition 112. A GrafcetStep that is displayed on the screen while a simulation is running will be highlighted when it is activated.

GrafcetRegularStep 145: A GrafcetStep that contains up to three OtherPrograms that specify the actions taken (i) when the step is activated, (ii) continuously while the step is active, and (iii) when the step is deactivated, respectively.

GrafcetMacroStep 146: A GrafcetStep that contains another Grafcet "flowchart" (a GrafcetMacroProgram).

GrafcetMMFSStep 147: A library GrafcetStep for specifying MMFS message templates and send and receive behavior.

GrafcetReceiptStep: A GrafcetStep that contains MMFSReceiveTemplates for MMFSMessages to be received on some specified connection(s). When a message is received and a matching template is found, parameters are stored and actions taken according to specifications in the template.

GrafcetSendStep 164: A GrafcetStep that contains MMFSSendTemplates and specifications for building and sending MMFSMessages.

GrafcetTransition: An object which connects two or more GrafcetSteps and specifies a boolean condition (an OtherProgram expression). The value of the boolean condition determines when control can pass from the preceding GrafcetStep(s) through the transition to the succeeding GrafcetStep(s) in the Grafcet "flowchart".

GrafcetLink 113: A connector between GrafcetSteps and GrafcetTransitions. Various types of links indicate one-to-one connections, or synchronous or asynchronous parallel splits or joins.

Folder 104: A collection of objects of a similar type. Some are permanent parts of the user's program (e.g., MMFSTemplateeFolder), while others are temporarily created by the system to display various information (e.g., MessageTraceFolder, AnalysisFolder). Folders are displayed and their contents manipulated by FolderBrowsers.

ModuleFolder 114: The top level user interface for manipulating modules ("main programs" created on the system) as a whole. Provides the capability to create, delete, copy, rename, compile, load and save modules, and to invoke various other types of Browsers on them.

MMFSTemplateFolder 115: Contains user-specified templates for sending or receiving MMFSMessages.

MessageTraceFolder 116: Contains network messages sent and/or received on specified connections or groups of connections.

StateVariableFolder 117: Contains lists of user variables and their current values.

NetworkConnectionFolder 118: Contains user specified parameters describing network connections.

AnalysisFolder 166: Contains lists of objects derived from analysis of the user's program in response to queries regarding the location of reference to variables, calls to functions, etc.

TransmissionMessage 119: A message to be sent on, or received from, a communications network or device. MAP (Manufacturing Automation Protocol) and IMS (Maxitron) networks may be supported in a specific embodiment. A TransmissionMessage contains information pertinent to transmission on a particular type of network (e.g., source and destination addresses), and an ApplicationMessage.

ApplicationMessage 110: An application-level message with data (contents) formatted according to some application protocol (e.g., MMFS, MMS). Any application level protocol can be used with any type of network by using the appropriate combination of TransmissionMessage and ApplicationMessage.

Browser 106: A screen window that provides the user with an interface to an object and some Context operating on that object. The same type of Browser may apply to multiple types of Contexts of objects (e.g. SimulationBrowser).

FormEditor 121: General purpose editor for viewing and editing fields of structured objects such as message templates, connection parameters, profile information.

GrafcetProgramEditor 124: Graphical editor for Grafcet "flowcharts". Allows GrafcetSteps, Grafcet- Transitions and GrafcetLinks to be added, deleted, copied, renamed, zoomed, etc.

GrafcetStructureBrowser 125: Displays the hierarchical structure of one or more Grafcet Programs.

SimulationBrowser 126: Monitoring and control interface to the (local) simulation or (remote) execution of a GrafcetProgram. Allows the user to start, stop or single step the program, set breakpoints, display variable values, etc.

AnimationBrowser 127: Displays a running animation of factory devices.

AnimationEditor 124: Allows the user to create and edit animations of factory devices.

MMIBrowser 129: Man-Machine Interface "Control console" interface to programs.

MMIScreenEditor 130: Allows the user to create and edit MMI screens and establish their interaction with a Program.

ManualMessageBrowser 131: Allows the user to manually establish and break network connections, and send, receive and trace messages to and from remote devices and processes.

Context 107: A set of related operations that can be performed on an object, such as editing, simulation and analysis. The capabilities of a Context are presented to the user via a Browser.

LocalGrafcetSimulationContext 156: The "execution engine" for running programs locally. Consists of a Grafcet interpreter and facilities for handling breakpoints, starting, stopping, stepping and displaying real time status of programs.

RemoteGrafcetExecutionContext 157: The "execution engine" for running programs remotely. Exchanges command and monitoring information between a SimulationBrowser and an execution engine running on a remote machine. (In FIG. 5 this is shown as cc-3.)

Network 108: Provides a consistent interface to a physical communication network, or simulates such a network for internal connections.

The attached Appendix A is the LISP listing of elements of the system as implemented in an Interlisp operating environment. The LISP code implements Grafcet. as well as the tools described herein. The attached appendixes B and C illustrate, respectively, the syntax and semantics of Grafcet as implemented in connection with the present invention. Appendix D is the documentation for a piece of a single application implemented in accordance with the invention.

The invention has now been particularly described with reference to preferred embodiments. It will nevertheless be understood by those skilled in the art that the foregoing and other advantages in the form and detail may be made therein without departing from the spirit and scope of the invention. For example, the invention is not necessarily limited to use in a manufacturing environment, as it can be used in connection with any system of asynchronous processes adapted for exchange of information under automatic control. It is therefore not intended that the invention be limited, except as indicated by the appended claims.

MAIL ROOM
OCT 24 1988
PAT. & TRADEMARK OFF.

APPENDIX A

PROGRAM LISTINGS

1. Fis
2. FidObjects
3. FidGrafCet
4. FidGrafProg
5. GrafSim
6. CellTool
7. Feditor
8. FidBlock
9. Fiscc
10. FisCombine
11. FisCopy
12. FisDoc
13. FisFontHack
14. FisFontHack
15. FisUtil
16. Gems
17. GrafBrowser
18. GrafCet
19. GrafCetC
20. GrafContext
21. MapNetwork
22. MMFS
23. MMFSDefs
24. MMFSInterface
25. NetStat
26. FisVersion
27. FisSv
28. FisFolder
29. FisDownload
30. FisRemote

FUNCTION INDEX

DeviceControl ...................3
FB.EXIT ........................4
FISDebugMode ....................6
FISGraphDirectory ...............4
FISInit ........................3
FISOperatorMessage .............3
FISSetupScreenSizeRegions .......8
FISToggleTopLevel ...............8
MY.DIR.GRAPH.FNS ................5
MY.MIDDLE.DIR.COMMAND ..........5
SavoirCopyright .................6
SetUpFIS .......................6
SetupForDelivery ...............7
SetUpPROMPTWINDOW ..............7

VARIABLE INDEX

DeliveryBackgroundMenuCommands ..8
DesignerDefaultDirectory ........5
DesignerOnlyFlg .................2
DWIMINMACROSFLG .................3
FISCellAnimationUnit ............4
FISCellInterruptFlg .............4
FISCellInterruptTimer ...........4
FISCellPulser ...................4
FISDebugFlg .....................3
FISDebugInterrupts ..............9
FISDebugTeditInterrupts .........9
FISFiles ........................3
FISGraphHeight ..................5
FISGraphWidth ...................5
FISLastPulseTime ................4
FISMapAnimationUnit .............4
FISNormalInterrupts .............9
FISNormalTeditInterrupts ........9
FISOneCR ........................3
FISPermitEdits ..................3
FISPromptWindowFont .............8
FISPromptWindowTLCommands .......8
FISSavedWindows .................4
FISScreenSizeRegions ............3
FISTTYWindowHeight ..............9
FISTwoCR ........................3
FISWindowMenuCommands ...........8
FISWindowTitleFont ..............8
FONTDEFS .......................10
informationRegion ...............8
JLDeviceStream ..................5
JLTraceStream ...................5
Old.FB.MENU.ITEMS ...............5
OldBackgroundMenuCommands .......9
SavoirCopyrightString1 ..........8
SavoirCopyrightString2 ..........8
SavoirPromptTitle ...............3
SavoirPROMPTWINDOW ..............8
SMALLCROSSHAIRS ................10
StandardIconWindowMenuCommands ..4
StandardWindowMenuCommands ......4
SWDIRECTORIES ...................2

PROPERTY INDEX

DesignerDefaultDirectory ........5
FIS ..........................2,10
FISCellAnimationUnit ............3
FISDebugFlg .....................3
FISGraphHeight ..................5
FISGraphWidth ...................5
FISMapAnimationUnit .............3
FISNetworkProcess ...............3
MapNetwork ......................3
SavoirPROMPTWINDOW ..............9 changes to: (VARS FISCOMS)

previous date: 4-Aug-88 11:14:28 (POGO:AISNORTH:XEROX)<LIPKIS>FIS>FIS.;140

Read Table: INTERLISP

Package: IL

;; Copyright (c) 1985, 1986, 1987, 1988 by Savoir, Inc.. All rights reserved.

```
(RPAQQ FISCOMS
       [(DECLARE%: DONTCOPY (PROP MAKEFILE-ENVIRONMENT FIS))
        (FILES (FROM WORKS)
               SWBASIC)
        (ADDVARS (SWDIRECTORIES {DSK}<LISPFILES>FIS>))
        (P (DEFCLASSES GrafcetStep))
        [COMS
              ;; Split Designer from Designer/Exerciser

              (INITVARS (DesignerOnlyFlg NIL))
              (VARS (FISFiles '(FIS FISUTIL FISERROR FISFOLDER CELLTOOL FISSV FIDOBJECTS GRAFCET FIDGRAFPROG
                                FIDGRAFCET MAPNETWORK GRAFSIM FEDITOR GRAFBROWSER GRAFCONTEXT GRAFCETC
                                FIDBLOCK MMFS FISCC FISCOMBINE NETSTAT FISMODULETL FISFONTHACK FISDOC
                                GEMS MMFSINTERFACE MMFSDEFS FISVERSION FISCOPY))
                    (SavoirPromptTitle "FLEXIS ToolSet"))
              [P (COND (DesignerOnlyFlg [SETQ FISFiles (LDIFFERENCE FISFiles '(NETSTAT MMFSINTERFACE GEMS]
                               (SETQ SavoirPromptTitle "FLEXIS Designer"]
              (P (APPLY 'FILESLOAD FISFiles)
                 (NCONC1 FISFiles 'DFIS]
        (FNS DeviceControl FISInit FISOperatorMessage)
        (PROP GLOBALVAR FISDebugFlg MapNetwork FISMapAnimationUnit FISCellAnimationUnit FISNetworkProcess)
        [VARS FISScreenSizeRegions (FISPermitEdits T)
              (DWIMINMACROSFLG NIL)
              (FISDebugFlg T)
              (FISOneCR (ALLOCSTRING 1 (CHARCODE CR)))
              (FISTwoCR (ALLOCSTRING 2 (CHARCODE CR]
        (GLOBALVARS FISOneCR FISTwoCR)
        (INITVARS (FISSavedWindows NIL)
               (FISMapAnimationUnit NIL)
               (FISCellAnimationUnit NIL)
               (FISCellPulser NIL)
               (FISCellInterruptTimer 0)
               (FISCellInterruptFlg NIL)
               (FISLastPulseTime 0)
               (StandardWindowMenuCommands NIL)
               (StandardIconWindowMenuCommands NIL))
        (P (FISInit)
           ;; (FISCellInit)
           )
```

```
[COMS .. File tool functionality
      (FNS FB.EXIT FISGraphDirectory MY.DIR.GRAPH.FNS MY.MIDDLE.DIR.COMMAND)
      (VARS (FISGraphWidth 275)
            (FISGraphHeight 150))
      (INITVARS (DesignerDefaultDirectory)
             (Old.FB.MENU.ITEMS))
      (PROP GLOBALVAR DesignerDefaultDirectory FISGraphWidth FISGraphHeight)
      (FILES (SYSLOAD FROM LISPUSERS)
             DIRECTORYTOOLS)
      (P (MOVD 'MIDDLE.DIR.COMMAND 'LEFT.DIR.COMMAND)
         (MOVD 'MY.MIDDLE.DIR.COMMAND 'MIDDLE.DIR.COMMAND)
         (AND (NOT Old.FB.MENU.ITEMS)
              (SETQ Old.FB.MENU.ITEMS (COPY FB.MENU.ITEMS)))
         (DREMOVE (FASSOC 'Compile FB.MENU.ITEMS)
                FB.MENU.ITEMS)
         (AND (NOT (FASSOC 'Exit FB.MENU.ITEMS))
              (ADDTOVAR FB.MENU.ITEMS (Exit FB.EXIT "Exit this file browser")))
         (AND (FASSOC 'Edit FB.MENU.ITEMS)
              (RPLACD (FASSOC 'Edit FB.MENU.ITEMS)
                     '((FB.EDITCOMMAND TEDIT)
                       "Calls a text editor on selected files"]
(COMS .. for compatibility with JLCall, set up JL streams
      (GLOBALVARS JLTraceStream JLDeviceStream)
      (INITVARS (JLTraceStream GlobalTraceStream)
             (JLDeviceStream GlobalDeviceStream)))
(COMS .. Environment Control
      (FNS FISDebugMode SavoirCopyright SetUpFIS SetupForDelivery SetUpPROMPTWINDOW
           FISSetupScreenSizeRegions FISToggleTopLevel)
      (VARS informationRegion (FISWindowTitleFont (FONTCREATE 'HELVETICA 12 'BRR))
            (SavoirPROMPTWINDOW PROMPTWINDOW)
            (SavoirCopyrightString1 "Copyright (c) 1986,1987,1988 Savoir")
            (SavoirCopyrightString2 "All Rights Reserved")
            [FISWindowMenuCommands (FISMenuSubset '(Move Shape Bury Redisplay Hardcopy]
            [FISPromptWindowTLCommands '((Logout (ConfirmLogout)
                                                 "Logout from the system, saving the current state")
                                         (Files (FISGraphDirectory)
                                                "Toggle file system manipulation window")
                                         (Modes (SWTopLevelModeWindow '(576 759 195 70))
                                                "Pop-up Savoir Designer Mode Window")
                                         (Processes (FISToggleTopLevel)
                                                "Toggle top level process directory display"]
            [FISPromptWindowFont (FONTCREATE '(HELVETICA 10 BRR]
            DeliveryBackgroundMenuCommands)
      (APPENDVARS (AFTERLOGOUTFORMS (SavoirCopyright))
             (AFTERSYSOUTFORMS (SavoirCopyright)))
      (P (OR (NLISTP (CAR AFTERSYSOUTFORMS))
             (NEQ (CAAR AFTERSYSOUTFORMS)
                  'SavoirCopyright))
         (SETQ AFTERSYSOUTFORMS (CONS '(SavoirCopyright)
                                      AFTERSYSOUTFORMS)))
      [INITVARS (OldBackgroundMenuCommands)
             (FISTTYWindowHeight 160)
             [FISDebugInterrupts '((3 (FISAbortCompile)
                                      T)
                                   (127 RUBOUT T)
                                   (20 (CONTROL-T)
                                       NIL)
                                   (16 PRINTLEVEL NIL)
                                   (7 HELP T)
                                   (5 ERROR MOUSE)
                                   (4 RESET MOUSE)
                                   (2 BREAK MOUSE]
             [FISNormalInterrupts '((3 (FISAbortCompile)
                                       T)
                                    (127 RUBOUT T)
                                    (7 HELP T)
                                    (261 ERROR MOUSE)
                                    (260 RESET MOUSE]
             [FISDebugTeditInterrupts '((2 BREAK MOUSE)
                                        (3 (FISAbortCompile)
                                           T)
                                        (5 ERROR MOUSE)
                                        (7 HELP T)
                                        (20 (CONTROL-T)
                                            NIL]
             (FISNormalTeditInterrupts '((3 (FISAbortCompile)
                                            T)
                                         (261 ERROR MOUSE)
                                         (7 HELP T]
       (PROP GLOBALVAR SavoirPROMPTWINDOW)
       (GLOBALVARS informationPos FISTTYWindowHeight FISPromptWindowFont FISPromptWindowTLCommands
              SavoirPromptTitle SavoirPROMPTWINDOW FISInterrupts TEDIT.INTERRUPTS FISDebugInterrupts
              FISNormalInterrupts FISDebugTeditInterrupts FISNormalTeditInterrupts FISWindowTitleFont)
       (P (FONTCREATE 'HELVETICA 14 'BRR)
          (FONTCREATE 'HELVETICA 12 'BRR)
          (FONTCREATE 'HELVETICA 18 'BRR))
       (ALISTS (FONTDEFS SAVOIRFIS)))
(CURSORS SMALLCROSSHAIRS)
(P (FISSetupScreenSizeRegions FISScreenSizeRegions))
(PROP FILETYPE FIS)
(DECLARE%: DONTEVAL@LOAD DOEVAL@COMPILE DONTCOPY COMPILERVARS (ADDVARS (NLAMA DeviceControl)
                                                                       (NLAML)
                                                                       (LAMA]
```

Page 2

```
(DECLARE%: DONTCOPY

(PUTPROPS FIS MAKEFILE-ENVIRONMENT (:PACKAGE "IL" :READTABLE "INTERLISP" :BASE 10))
)

(FILESLOAD (FROM WORKS)
       SWBASIC)

(ADDTOVAR SWDIRECTORIES {DSK}<LISPFILES>FIS>)

. Split Designer from Designer/Exerciser

(RPAQ? DesignerOnlyFlg NIL)
                                                                                     Page 3

(RPAQQ FISFiles (FIS FISUTIL FISERROR FISFOLDER CELLTOOL FISSV FIDOBJECTS GRAFCET FIDGRAFPROG FIDGRAFCET
                     MAPNETWORK GRAFSIM FEDITOR GRAFBROWSER GRAFCONTEXT GRAFCETC FIDBLOCK MMFS FISCC
                     FISCOMBINE NETSTAT FISMODULETL FISFONTHACK FISDOC GEMS MMFSINTERFACE MMFSDEFS FISVERSION
                     FISCOPY))

(RPAQ SavoirPromptTitle "FLEXIS ToolSet")

(COND
   (DesignerOnlyFlg [SETQ FISFiles (LDIFFERENCE FISFiles '(NETSTAT MMFSINTERFACE GEMS]
          (SETQ SavoirPromptTitle "FLEXIS Designer")))

(APPLY 'FILESLOAD FISFiles)

(NCONC1 FISFiles 'DFIS)

(DEFINEQ

(DeviceControl
  [NLAMBDA Command                                               (* TAL "22-Jun-86 13:52")
    (TEDIT.INSERT JLDeviceStream (CONCATLIST (NCONC1 (CDR (for x in (NLAMBDA.ARGS Command)
                                                               join (LIST " " x)))
                                                      (CONSTANT (MKSTRING (CHARACTER (CHARCODE EOL])

(FISInit
  [LAMBDA NIL                                                    (* TAL "11-Oct-85 12.25")
    (SETQ FISGlobalClock 0)
    (DEL.PROCESS 'FISNetworkProcess)
    (SETQ FISNetworkProcess (ADD.PROCESS '(FISNetworkProcess)
                                         'RESTARTABLE T))
    NIL])

(FISOperatorMessage
  [LAMBDA (String)                                               (* TAL "22-Jun-86 13.48")
    (TEDIT.INSERT JLTraceStream (CONCAT String (CONSTANT (CHARACTER (CHARCODE EOL])
)

(PUTPROPS FISDebugFlg GLOBALVAR T)

(PUTPROPS MapNetwork GLOBALVAR T)

(PUTPROPS FISMapAnimationUnit GLOBALVAR T)

(PUTPROPS FISCellAnimationUnit GLOBALVAR T)

(PUTPROPS FISNetworkProcess GLOBALVAR T)

(RPAQQ FISScreenSizeRegions
       [[(1024 808)
         (JLTraceWindowRegion '(588 616 435 192))
         (JLDeviceWindowRegion '(741 500 410 180))
         (SWParametersIconPos '(903 . 543))
         (SWParametersWindowPos '(870 . 528))
         (informationRegion '(0 748 583 60]
        [(832 633)
         (JLTraceWindowRegion '(716 669 435 192))
         (JLDeviceWindowRegion '(741 500 410 180))
         (SWParametersIconPos '(711 . 378))
         (SWParametersWindowPos '(678 . 363))
         (informationRegion '(0 573 583 60]
        ((1152 861)
         (JLTraceWindowRegion '(741 680 410 179))
         (JLDeviceWindowRegion '(741 500 410 180))
         (SWParametersIconPos '(1031 . 596))
         (SWParametersWindowPos '(998 . 581))
         (informationRegion '(6 801 583 70])

(RPAQQ FISPermitEdits T)

(RPAQQ DWIMINMACROSFLG NIL)

(RPAQQ FISDebugFlg T)

(RPAQ FISOneCR (ALLOCSTRING 1 (CHARCODE CR)))

(RPAQ FISTwoCR (ALLOCSTRING 2 (CHARCODE CR)))

(DECLARE%: DOEVAL@COMPILE DONTCOPY
```

```
{DSK}<LISPFILES2>FIS>FIS.;141

(GLOBALVARS FISOneCR FISTwoCR)
)

(RPAQ? FISSavedWindows NIL)

(RPAQ? FISMapAnimationUnit NIL)

(RPAQ? FISCellAnimationUnit NIL)

(RPAQ? FISCellPulser NIL)

(RPAQ? FISCellInterruptTimer 0)

(RPAQ? FISCellInterruptFlg NIL)

(RPAQ? FISLastPulseTime 0)

(RPAQ? StandardWindowMenuCommands NIL)

(RPAQ? StandardIconWindowMenuCommands NIL)

(FISInit)

;; (FISCellInit)

;; File tool functionality

(DEFINEQ

(FB.EXIT
  [LAMBDA (Browser Key Item Menu)                          (* mcl%. " 4-Aug-86 08.52")
    (CLOSEW (MAINWINDOW (WFROMMENU Menu)
                T])

(FISGraphDirectory
  [LAMBDA NIL                                              ; Edited 3-Jun-88 15.33 by·
    (LET (dg path)
      [COND
        [(AND (SETQ dg (WINDOWPROP SavoirPROMPTWINDOW 'FISGraph))
              (EQUAL (WINDOWPROP dg 'FISDefault)
                     DesignerDefaultDirectory))            ; Have we already computed a graph?
         (COND
           ((WINDOWPROP dg 'FISStatus)
            (COND
              ((FIND.PROCESS 'DIRECTORY% GRAPHER)
               (PROMPTPRINT "Directory search in progress - please wait")
               (TERPRI PROMPTWINDOW))
              (T (WINDOWPROP dg 'FISStatus NIL)
                 (CLOSEW dg)))                             ; If its exposed, close it

            )
           ((MOUSECONFIRM "Recompute?" "click LEFT to recompute, else RIGHT")
                                                           ; Optionally recompute
            (WINDOWPROP SavoirPROMPTWINDOW 'FISGraph NIL)
            (FISGraphDirectory))
           (T                                              ; Just open what we have
             (OPENW dg)
             (WINDOWPROP dg 'FISStatus T]
        (T (AND dg (CLOSEW dg))                            ; GRAPH.DIRECTORY must have a host
           [SETQ path (COND
                        [DesignerDefaultDirectory (COND
                                                    ((UNPACKFILENAME DesignerDefaultDirectory 'HOST)
                                                     DesignerDefaultDirectory)
                                                    (T (PACKFILENAME 'HOST '{DSK} 'BODY
                                                              DesignerDefaultDirectory]
                        (T '{DSK}<LISPFILES>]
           [COND
             ((NOT (DIRECTORYNAMEP path))
              (SETQ path '{DSK}<LISPFILES>]
           (GETMOUSESTATE)
           (SETQ dg (GRAPH.DIRECTORY path (CREATEW (GETBOXREGION FISGraphWidth FISGraphHeight LASTMOUSEX
                                                                  LASTMOUSEY)
                                                   " " NIL T)))
           (WINDOWPROP SavoirPROMPTWINDOW 'FISGraph dg)
           (WINDOWPROP dg 'FISDefault DesignerDefaultDirectory)
           (WINDOWPROP dg 'FISStatus T)
           (WINDOWPROP dg 'SCROLLEXTENTUSE 'LIMIT)
           (WINDOWADDPROP dg 'CLOSEFN (FUNCTION (LAMBDA (WINDOW)
                                                  (WINDOWPROP WINDOW 'FISStatus NIL]
      (Nothing])
```

```
(MY.DIR.GRAPH.FNS
  [LAMBDA (ITEM MENU BUTTON)                               (* mcl%: "17-Jul-86 16:13")
    (LET (path)
      (SETQ path (DIR.FROM.GRAPH (CAADR ITEM)
                                 (CADADR ITEM)))
      (SELECTQ (CAR ITEM)
          (FileBrowser (FILEBROWSER path))
          (Connect (CNDIR (MKATOM path)))
          NIL])
```

```
(MY.MIDDLE.DIR.COMMAND
  [LAMBDA (NODE WINDOW)                                          (* mcl%: "17-Jul-86 16:09")
    (AND NODE WINDOW (MENU (create MENU
                                   ITEMS _ (LIST (LIST 'FileBrowser (CONS NODE (CONS WINDOW))
                                                       "Will bring up a FILEBROWSER on the selected
                                                       directory")
                                                 (LIST 'Connect (CONS NODE (CONS WINDOW))
                                                       "Connect to selected directory"))
                                   WHENSELECTEDFN _ (FUNCTION MY.DIR.GRAPH.FNS])

)

(RPAQQ FISGraphWidth 275)

(RPAQQ FISGraphHeight 150)

(RPAQ? DesignerDefaultDirectory )

(RPAQ? Old.FB.MENU.ITEMS )

(PUTPROPS DesignerDefaultDirectory GLOBALVAR T)

(PUTPROPS FISGraphWidth GLOBALVAR T)

(PUTPROPS FISGraphHeight GLOBALVAR T)

(FILESLOAD (SYSLOAD FROM LISPUSERS)
       DIRECTORYTOOLS)

(MOVD 'MIDDLE.DIR.COMMAND 'LEFT.DIR.COMMAND)

(MOVD 'MY.MIDDLE.DIR.COMMAND 'MIDDLE.DIR.COMMAND)

(AND (NOT Old.FB.MENU.ITEMS)
     (SETQ Old.FB.MENU.ITEMS (COPY FB.MENU.ITEMS)))

(DREMOVE (FASSOC 'Compile FB.MENU.ITEMS)
       FB.MENU.ITEMS)

(AND (NOT (FASSOC 'Exit FB.MENU.ITEMS))
     (ADDTOVAR FB.MENU.ITEMS (Exit FB.EXIT "Exit this file browser")))

[AND (FASSOC 'Edit FB.MENU.ITEMS)
     (RPLACD (FASSOC 'Edit FB.MENU.ITEMS)
             '((FB.EDITCOMMAND TEDIT)
               "Calls a text editor on selected files"]

;; for compatibility with JLCall, set up JL streams

(DECLARE%: DOEVAL@COMPILE DONTCOPY

(GLOBALVARS JLTraceStream JLDeviceStream)
)

(RPAQ? JLTraceStream GlobalTraceStream)

(RPAQ? JLDeviceStream GlobalDeviceStream)
```

```
;; Environment Control

(DEFINEQ

(FISDebugMode
  [LAMBDA (ONFlg)                                                (* mcl%: "18-Feb-87 09:35")
    (SETQ IconWindowMenu NIL)
    (SETQ WindowMenu NIL)
    (SetupForDelivery ONFlg)
    [COND
       (ONFlg (RESET.INTERRUPTS (SETQ FISInterrupts FISDebugInterrupts))
              (SETQ TEDIT.INTERRUPTS FISDebugTeditInterrupts)
              (AND StandardWindowMenuCommands (SETQ WindowMenuCommands (COPY StandardWindowMenuCommands)))
              (AND StandardIconWindowMenuCommands (SETQ IconWindowMenuCommands (COPY
                                                                StandardIconWindowMenuCommands
                                                                   )))
              (SETQ FISDebugFlg T)
              (SETQ SWDebugFlg T)
              (for d in SWDIRECTORIES do (pushnew DIRECTORIES d)))
       (T (RESET.INTERRUPTS (SETQ FISInterrupts FISNormalInterrupts))
          (SETQ TEDIT.INTERRUPTS FISNormalTeditInterrupts)
          (OR StandardWindowMenuCommands (SETQ StandardWindowMenuCommands (COPY WindowMenuCommands)))
          (SETQ WindowMenuCommands (COPY FISWindowMenuCommands))
          (OR StandardIconWindowMenuCommands (SETQ StandardIconWindowMenuCommands (COPY
                                                                      IconWindowMenuCommands
                                                                        )))
          (SETQ IconWindowMenuCommands (COPY FISWindowMenuCommands))
          (SETQ FISDebugFlg NIL)
          (SETQ SWDebugFlg NIL)
          (for d in SWDIRECTORIES do (DREMOVE d DIRECTORIES]
    ONFlg])
```

SavoirCopyright

```
(SavoirCopyright
  [LAMBDA (Window)                                          (* mct%. " 6-Sep-87 17 08")
    (LET (wreg halfn (window (OR Window SavoirPROMPTWINDOW)))
      (CLEARW window)
      (SETQ wreg (DSPCLIPPINGREGION NIL window))
      (SETQ halfh (IQUOTIENT (fetch HEIGHT of wreg)
                             2))
      (CENTERPRINTINREGION SavoirCopyrightString1 (create REGION
                                                         BOTTOM _ (IPLUS (fetch BOTTOM of wreg)
                                                                         halfh)
                                                         HEIGHT _ halfh using wreg)
           window)
      (CENTERPRINTINREGION SavoirCopyrightString2 (create REGION
                                                         HEIGHT _ halfh using wreg)
           window)

        (* * CENTERPRINTINREGION leaves the position at 0, so (TAB 0 0) doesn't do the necessary CR)

      (POSITION window 1)
      (WINDOWPROP window 'Copyright T])
```

SetUpFIS

```
(SetUpFIS
  [LAMBDA (DontClearScreen DontChangeFonts)                 . Edited 13-Jun-88 11:00 by mct
    (DECLARE (GLOBALVARS FISSavedWindows WindowTitleDisplayStream FISTTYWindowHeight))
    (COND
      (FISSavedWindows                                      . On the way out
              (DETACHALLWINDOWS SavoirPROMPTWINDOW)
              (DestroyAllVisibleWindows)
              (SwitchWindowsOn FISSavedWindows)
              (SETQ FISSavedWindows NIL)
              (FONTSET 'STANDARD)                            . (DSPFONT DEFAULTFONT TTY)
              (SETQ INPUTFONT DEFAULTFONT)
              (SETQ PRINTOUTFONT DEFAULTFONT)
              (DSPFONT DEFAULTFONT TTY)
              (FISSetUpBackArrows T)
              (FISDebugMode T))
      (T (PROG (w sw oldReg)
               (COND
                 ((NOT DontChangeFonts)
                  (FONTSET 'SAVOIRFIS)                       . (DSPFONT DEFAULTFONT TTY)
                  (SETQ INPUTFONT DEFAULTFONT)
                  (SETQ PRINTOUTFONT DEFAULTFONT)
                  (DSPFONT DEFAULTFONT SavoirPROMPTWINDOW)
                  (FISSetUpBackArrows)))
               [COND
                 (DontClearScreen (FISDebugMode T)
                        (SetUpPROMPTWINDOW)
                        (SETQ oldReg (WINDOWPROP TTY 'REGION))
                        (SHAPEW TTY (create REGION
                                           LEFT _ (DIFFERENCE SCREENWIDTH (fetch WIDTH of oldReg))
                                           BOTTOM _ (DIFFERENCE SCREENHEIGHT (fetch HEIGHT of oldReg))
                                      using oldReg)))
                 (T (SETQ FISSavedWindows (SwitchWindowsOff))
                    (FISDebugMode)
                    (SetUpPROMPTWINDOW)
                    (SETQ oldReg (WINDOWPROP SavoirPROMPTWINDOW 'REGION))
                    (CLEARW TTY)
                    (SHAPEW TTY (create REGION
                                      LEFT _ (fetch PRIGHT of oldReg)
                                      BOTTOM _ (DIFFERENCE SCREENHEIGHT FISTTYWindowHeight)
                                      HEIGHT _ FISTTYWindowHeight using oldReg]
               (SETQ TopLevelBrowsers NIL)
               (SETQ BrowserRegions (APPEND MasterBrowserRegions))
          T])
```

Page 7

SetupForDelivery

```
(SetupForDelivery
  [LAMBDA (UndoFlg)                                         (* mct%. " 4-Sep-86 09:54")
    (KEYACTION 'LOCK '(LOCKDOWN . LOCKUP))
    (COND
      (UndoFlg (AND OldBackgroundMenuCommands (SETQ BackgroundMenuCommands OldBackgroundMenuCommands)))
      (T (AND (NOT OldBackgroundMenuCommands)
              (SETQ OldBackgroundMenuCommands BackgroundMenuCommands))
         (SETQ BackgroundMenuCommands DeliveryBackgroundMenuCommands)))
    (SETQ BackgroundMenu NIL])
```

SetUpPROMPTWINDOW

```
(SetUpPROMPTWINDOW
  [LAMBDA NIL                                               . Edited 13-Jun-88 12:32 by mct
    (DECLARE (GLOBALVARS WindowTitleDisplayStream informationRegion SavoirPromptTitle FISVersionString
                         FISPromptWindowTLCommands))
    (LET (aw font title (sp " "))
      (SETQ aw (OR (CAR (ALLATTACHEDWINDOWS SavoirPROMPTWINDOW))
                   (ATTACHMENU (create MENU
                                       ITEMS _ FISPromptWindowTLCommands
                                       CENTERFLG _ T
                                       MENUBORDERSIZE _ 1
                                       MENUFONT _ (FONTCREATE 'HELVETICA 12 'BRR))
                          SavoirPROMPTWINDOW
                          'TOP
                          'JUSTIFY T)))
      (DSPFONT (SETQ font (FONTCREATE 'HELVETICA 18 'MRR))
             WindowTitleDisplayStream)
```

```
(SHAPEW SavoirPROMPTWINDOW (create REGION
                                WIDTH _ (DIFFERENCE (QUOTIENT SCREENWIDTH 2)
                                                    (fetch LEFT of informationRegion))
                                BOTTOM _ (DIFFERENCE SCREENHEIGHT (PLUS (fetch HEIGHT
                                                                         of (WINDOWPROP
                                                                              aw
                                                                              'REGION))
                                                                      (fetch HEIGHT of
                                                                             informationRegion
                                                                              )))
                                HEIGHT _ (PLUS (fetch HEIGHT of (WINDOWPROP aw 'REGION))
                                               (fetch HEIGHT of informationRegion))
                             using informationRegion))
(SETQ title (CONCAT SavoirPromptTitle "  " FISVersionString))
(WINDOWPROP SavoirPROMPTWINDOW 'TITLE
       (CONCAT (ALLOCSTRING (OR (NUMBERP (IQUOTIENT (IQUOTIENT (IDIFFERENCE (fetch WIDTH
                                                                               of (WINDOWPROP
                                                                                   SavoirPROMPTWINDOW
                                                                                   'REGION))
                                                                            (STRINGWIDTH title font))
                                                               2)
                                                    (STRINGWIDTH sp font)))
                                1)
                            (CHARCODE SP))
              title))
(DSPFONT FISWindowTitleFont WindowTitleDisplayStream)
(WINDOWADDPROP SavoirPROMPTWINDOW 'CLOSEFN 'DON'T T)
(SavoirCopyright])
```

(FISSetupScreenSizeRegions

```
  [LAMBDA (AList)                                       (* TAL "24-Mar-86 08:19")
    (PROG ((size (LIST SCREENWIDTH SCREENHEIGHT))
           regions)
          (COND
             ((SETQ regions (SASSOC size AList))
              (for x in (CDR regions) do (SET (CAR x)
                                              (EVAL (CADR x])
```

(FISToggleTopLevel

```
  [LAMBDA (ModuleLst)                                   (* mcf%: "15-Sep-87 13.57")
    (LET (tl)
      (COND
         ((WINDOWPROP SavoirPROMPTWINDOW 'Copyright)
          (CLEARW SavoirPROMPTWINDOW)
          (WINDOWPROP SavoirPROMPTWINDOW 'Copyright NIL)))
      (COND
         ([ObjectExists? (SETQ tl (WINDOWPROP SavoirPROMPTWINDOW 'FISTopLevel]
          (_ tl Exit)
          (WINDOWPROP SavoirPROMPTWINDOW 'FISTopLevel NIL))
         (T (WINDOWPROP SavoirPROMPTWINDOW 'FISTopLevel (StartModuleTopLevel ModuleLst])

)

(RPAQQ informationRegion (0 748 583 60))

(RPAQ FISWindowTitleFont (FONTCREATE 'HELVETICA 12 'BRR))

(RPAQ SavoirPROMPTWINDOW PROMPTWINDOW)

(RPAQ SavoirCopyrightString1 "Copyright (c) 1986,1987,1988 Savoir")

(RPAQ SavoirCopyrightString2 "All Rights Reserved")

(RPAQ FISWindowMenuCommands (FISMenuSubset '(Move Shape Bury Redisplay Hardcopy)))

(RPAQQ FISPromptWindowTLCommands ((Logout (ConfirmLogout)
                                          "Logout from the system, saving the current state")
                                  (Files (FISGraphDirectory)
                                         "Toggle file system manipulation window")
                                  (Modes (SWTopLevelModeWindow '(576 759 195 70))
                                         "Pop-up Savoir Designer Mode Window")
                                  (Processes (FISToggleTopLevel)
                                         "Toggle top level process directory display")))

(RPAQ FISPromptWindowFont (FONTCREATE '(HELVETICA 10 BRR)))

(RPAQQ DeliveryBackgroundMenuCommands
       ((Hardcopy '(HARDCOPYW)
                "Send hardcopy of screen region to printer."
                (SUBITEMS ("To a file" '(HARDCOPYREGION.TOFILE)
                                 "Writes a region of screen to a file; prompts for filename and format")
                          ("To a printer" '(HARDCOPYREGION.TOPRINTER)
                                 "Sends a region of screen to a printer of your choosing")))
        (Snap '(SNAPW)
              "Saves a snapshot of a region of the screen.")
        [Idle '(IDLE)
              "Enter Idle mode"
              (SUBITEMS ("Show Profile" '(IDLE.SHOW.OPTIONS)
                                "Print current idle options in prompt window")
                        ("Set Timeout" '(IDLE.SET.OPTION 'TIMEOUT)
                                "Set how long before idling started")
                        ("Choose Display" '(IDLE.SET.OPTION 'DISPLAYFN)
                                "Choose idle display")
```

```
(("Forget" '(IDLE.SHOW.OPTION 'FORGET)
        "Erase password when leaving idle mode?"
        (SUBITEMS ("Do" '(IDLE.SET.OPTION 'FORGET T)
                        "Erase password upon exiting idle mode")
                ("Don't" '(IDLE.SET.OPTION 'FORGET NIL)
                        "Retain password through idle mode (unless someone logs in)")))
 ["Allowed Logins" '(IDLE.SHOW.OPTION 'ALLOWED.LOGINS)
        "Who can exit idle mode"
        (SUBITEMS ("Unlocked" '(IDLE.SET.OPTION 'ALLOWED.LOGINS 'UNLOCKED)
                        "No login required to exit idle mode")
                ("Locked" '(IDLE.SET.OPTION 'ALLOWED.LOGINS '(T))
                        "Only the current user may exit idle mode")
                ("Any Login" '(IDLE.SET.OPTION 'ALLOWED.LOGINS '(*))
                        "Any user may exit, but require login")
                ("Group" '(IDLE.SET.OPTION 'ALLOWED.LOGINS 'ADD)
                        "Only allow specific users and/or groups to exit"
                        (SUBITEMS ("Include Previous User" '(IDLE.SET.OPTION
```

```
                                                                'ALLOWED.LOGINS T)
                                                "If current user exits, check old password")
                                ("Add Member" '(IDLE.SET.OPTION 'ALLOWED.LOGINS 'ADD)
                                        "Add a group or username")
                                ("Remove Member" '(IDLE.SET.OPTION 'ALLOWED.LOGINS
                                                        'REMOVE)
                                        "Remove a group or username"]
        ("Authenticate" '(IDLE.SHOW.OPTION 'AUTHENTICATE)
                "Authenticate user upon exiting idle mode?"
                (SUBITEMS ("Do" '(IDLE.SET.OPTION 'AUTHENTICATE T)
                                "User will be authenticated upon exiting idle mode")
                        ("Don't" '(IDLE.SET.OPTION 'AUTHENTICATE NIL)
                                "Accept any password--no authentication check"]
  (Logout '(ConfirmLogout)
        "Logout from the system, saving the current state")))

(APPENDTOVAR AFTERLOGOUTFORMS (SavoirCopyright))

(APPENDTOVAR AFTERSYSOUTFORMS (SavoirCopyright))

(OR (NLISTP (CAR AFTERSYSOUTFORMS))
    (NEQ (CAAR AFTERSYSOUTFORMS)
         'SavoirCopyright))

(SETQ AFTERSYSOUTFORMS (CONS '(SavoirCopyright)
                             AFTERSYSOUTFORMS))

(RPAQ? OldBackgroundMenuCommands )

(RPAQ? FISTTYWindowHeight 160)

(RPAQ? FISDebugInterrupts
       '((3 (FISAbortCompile)
            T)
         (127 RUBOUT T)
         (20 (CONTROL-T)
             NIL)
         (16 PRINTLEVEL NIL)
         (7 HELP T)
         (5 ERROR MOUSE)
         (4 RESET MOUSE)
         (2 BREAK MOUSE)))

(RPAQ? FISNormalInterrupts '((3 (FISAbortCompile)
                               T)
                            (127 RUBOUT T)
                            (7 HELP T)
                            (261 ERROR MOUSE)
                            (260 RESET MOUSE)))

(RPAQ? FISDebugTeditInterrupts '((2 BREAK MOUSE)
                                 (3 (FISAbortCompile)
                                    T)
                                 (5 ERROR MOUSE)
                                 (7 HELP T)
                                 (20 (CONTROL-T)
                                     NIL)))

(RPAQ? FISNormalTeditInterrupts '((3 (FISAbortCompile)
                                     T)
                                  (261 ERROR MOUSE)
                                  (7 HELP T)))

(PUTPROPS SavoirPROMPTWINDOW GLOBALVAR T)

(DECLARE%: DOEVAL@COMPILE DONTCOPY

(GLOBALVARS informationPos FISTTYWindowHeight FISPromptWindowFont FISPromptWindowTLCommands SavoirPromptTitle
       SavoirPROMPTWINDOW FISInterrupts TEDIT.INTERRUPTS FISDebugInterrupts FISNormalInterrupts
       FISDebugTeditInterrupts FISNormalTeditInterrupts FISWindowTitleFont)
)

(FONTCREATE 'HELVETICA 14 'BRR)

(FONTCREATE 'HELVETICA 12 'BRR)

(FONTCREATE 'HELVETICA 18 'BRR)
```

```
(ADDTOVAR FONTDEFS
          [SAVOIRFIS (FONTCHANGEFLG . ALL)
                 (FILELINELENGTH . 102)
                 (COMMENTLINELENGTH 116 . 126)
                 (LAMBDAFONTLINELENGTH . 95)
                 (FIRSTCOL . 60)
                 (PRETTYLCOM . 25)
                 (FONTPROFILE (DEFAULTFONT 1 (GACHA 10 BRR)
                                    (GACHA 8)
                                    (TERMINAL 8)
                                    (4045XLP (TITAN 10)))
                        (BOLDFONT 2 (HELVETICA 10 BRR)
                               (HELVETICA 8 BRR)
                               (MODERN 8 BRR))
                        (LITTLEFONT 3 (HELVETICA 8)
                               (HELVETICA 6 MIR)
                               (MODERN 8 MIR))
                        (BIGFONT 4 (HELVETICA 12 BRR)
                               (HELVETICA 10 BRR)
                               (MODERN 10 BRR))
                        (USERFONT BOLDFONT)
                        (COMMENTFONT LITTLEFONT)
                        (LAMBDAFONT BIGFONT)
                        (SYSTEMFONT)
                        (CLISPFONT BOLDFONT)
                        (CHANGEFONT)
                        (PRETTYCOMFONT BOLDFONT)
                        (FONT1 DEFAULTFONT)
                        (FONT2 BOLDFONT)
                        (FONT3 LITTLEFONT)
                        (FONT4 BIGFONT)
                        (FONT5 5 (HELVETICA 10 BIR)
                               (HELVETICA 8 BIR)
                               (MODERN 8 BIR))
                        (FONT6 6 (HELVETICA 10 BRR)
                               (HELVETICA 8 BRR)
                               (MODERN 8 BRR))
                        (FONT7 7 (GACHA 12)
                               (GACHA 12)
                               (TERMINAL 12])
```

(RPAQ SMALLCROSSHAIRS (CURSORCREATE '  'NIL 7 7))

```
(FISSetupScreenSizeRegions FISScreenSizeRegions)

(PUTPROPS FIS FILETYPE :FAKE-COMPILE-FILE)

(DECLARE%: DONTEVAL@LOAD DOEVAL@COMPILE DONTCOPY COMPILERVARS

(ADDTOVAR NLAMA DeviceControl)

(ADDTOVAR NLAML )

(ADDTOVAR LAMA )
)

(PUTPROPS FIS COPYRIGHT ("Savoir, Inc." 1985 1986 1987 1988))
```

FUNCTION INDEX

CheckFIDObjects ................11
FID.AdjustSlope ................11
FID.ComputeCenter ..............11
FID.ScaleUp ....................11
FID.StretchLine ................11
FIDLineEllipseIntersection .....12
FIDRegionFromShape .............12
FIDTransformRegion .............12
FIDTransformShape ..............12

METHOD INDEX

FIDBitmapObject.ComputeXRegion .....................3
FIDBitmapObject.Draw ...............................3
FIDBitmapObject.Erase ..............................3
FIDBitmapObject.GetBitmap ..........................3
FIDBitmapObject.GetShape ...........................3
FIDBoxObject.ComputeHighlightRegions ...............4
FIDBoxObject.ComputeRegion .........................4
FIDBoxObject.ComputeRegion1 ........................4
FIDBoxObject.Delete ................................4
FIDBoxObject.Draw ..................................4
FIDBoxObject.DrawBox ...............................5
FIDBoxObject.DrawIcon ..............................5
FIDBoxObject.DrawLine ..............................6
FIDBoxObject.DrawLinePart ..........................6
FIDBoxObject.DrawText ..............................6
FIDBoxObject.GetPaletteIcon ........................6
FIDBoxObject.GetShape ..............................6
FIDBoxObject.GetWidth ..............................7
FIDBrowser.Destroy .................................7
FIDBrowser.Repaint .................................7
FIDCompositeObject.ClearAllHighlights ..............7
FIDCompositeObject.ComputeBasicExtent ..............7
FIDCompositeObject.ComputeExtent ...................7
FIDCompositeObject.DrawAll .........................7
FIDCompositeObject.RepaintHighlights ...............8
FIDCompositeObject.SendToParts1 ....................8
FIDConnector.CanLinkTo? ............................8
FIDConnector.Connected? ............................8
FIDConnector.ConnectTo .............................8
FIDConnector.Disconnect ............................8
FIDConnector.HalfConnect ...........................8
FIDConnector.HalfDisconnect ........................8
FIDHighlightObject.ComputeHighlightRegion ..........8
FIDHighlightObject.ComputeHighlightRegions .........8
FIDHighlightObject.Highlight .......................9
FIDObject.DeInstall ................................9
FIDObject.Erase ....................................9
FIDObject.ExtendExtent .............................9
FIDObject.FindSpace ................................10
FIDObject.FindSpaceManually ........................10
FIDObject.GetNeeds .................................10
FIDObject.GetPaletteIcon ...........................10
FIDObject.Install ..................................10
FIDObject.ObjectChanged ............................10
FIDObject.PermissibleP .............................10
FIDObject.SpaceP ...................................10
FIDPart.DrawLabel ..................................10
FIDPart.GetLabelShape ..............................11
FIDPart.Moved ......................................11
FIDPart.SetLabel ...................................11

CLASS INDEX

FIDBitmapObject ........1
FIDBoxObject ...........1
FIDBrowser .............1
FIDCompositeObject .....2
FIDConnector ...........2
FIDHighlightObject .....2
FIDObject ..............2
FIDPart ................2

RECORD INDEX

FIDShape ..............12
FIDXform ..............12

PROPERTY INDEX

FIDOBJECTS ..........1,12

VARIABLE INDEX

NullExtent ............12

File created: 2-Aug-88 18:48:50 {DSK}<LISPFILES>FIS>FIDOBJECTS.;89 changes to: (METHODS FIDBoxObject.DrawIcon FIDBoxObject.Draw FIDBoxObject.GetPaletteIcon)
(VARS FIDOBJECTSCOMS)

previous date: 29-Jul-88 14:51:49 {DSK}<LISPFILES>FIS>FIDOBJECTS.;88

Read Table: INTERLISP

Package: IL

Copyright (c) 1985, 1986, 1987, 1988 by Savoir, Inc.. All rights reserved.

```
(RPAQQ FIDOBJECTSCOMS
       ((DECLARE%: DONTCOPY (PROP MAKEFILE-ENVIRONMENT FIDOBJECTS))
        (CLASSES FIDBitmapObject FIDBoxObject FIDBrowser FIDObject FIDHighlightObject FIDPart
               FIDCompositeObject FIDConnector)
        (METHODS FIDBitmapObject.ComputeXRegion FIDBitmapObject.Draw FIDBitmapObject.Erase
               FIDBitmapObject.GetBitmap FIDBitmapObject.GetShape FIDBoxObject.ComputeHighlightRegions
               FIDBoxObject.ComputeRegion FIDBoxObject.ComputeRegion1 FIDBoxObject.Delete FIDBoxObject.Draw
               FIDBoxObject.DrawBox FIDBoxObject.DrawIcon FIDBoxObject.DrawLine FIDBoxObject.DrawLinePart
               FIDBoxObject.DrawText FIDBoxObject.GetPaletteIcon FIDBoxObject.GetShape FIDBoxObject.GetWidth
               FIDBrowser.Destroy FIDBrowser.Repaint FIDCompositeObject.ClearAllHighlights
```

```
            FIDCompositeObject.ComputeBasicExtent FIDCompositeObject.ComputeExtent
            FIDCompositeObject.DrawAll FIDCompositeObject.RepaintHighlights
            FIDCompositeObject.SendToParts1 FIDConnector.CanLinkTo? FIDConnector.ConnectTo
            FIDConnector.Connected? FIDConnector.Disconnect FIDConnector.HalfConnect
            FIDConnector.HalfDisconnect FIDHighlightObject.ComputeHighlightRegion
            FIDHighlightObject.ComputeHighlightRegions FIDHighlightObject.Highlight FIDObject.DeInstall
            FIDObject.Erase FIDObject.ExtendExtent FIDObject.FindSpace FIDObject.FindSpaceManually
            FIDObject.GetNeeds FIDObject.GetPaletteIcon FIDObject.Install FIDObject.ObjectChanged
            FIDObject.PermissibleP FIDObject.SpaceP FIDPart.DrawLabel FIDPart.GetLabelShape FIDPart.Moved
            FIDPart.SetLabel)
      (FNS CheckFIDObjects FID.AdjustSlope FID.ComputeCenter FID.ScaleUp FID.StretchLine
          FIDLineEllipseIntersection FIDRegionFromShape FIDTransformRegion FIDTransformShape)
      (RECORDS FIDShape FIDXform)
      [VARS (NullExtent '(32767 32767 -65536 -65536]
      (EXPORT (GLOBALVARS NullExtent))
      (PROP FILETYPE FIDOBJECTS)))

(DECLARE%: DONTCOPY

(PUTPROPS FIDOBJECTS MAKEFILE-ENVIRONMENT (:PACKAGE "IL" :READTABLE "INTERLISP" :BASE 10))
)

(DEFCLASS FIDBitmapObject (MetaClass Class Edited%:            (* mcl " 2-Oct-85 11 41")
                                doc "This is the default metaClass for all classes")
      (Supers FIDObject)
      (InstanceVariables (bitmap #,($A GetBitmap FFSendSelf ReplaceMe) DontSave Any doc "bitmap cache")
            (xRegion #,($A ComputeXRegion FFSendSelf ReplaceMe) DontSave Any doc "translation region for
                  this bitmap")))

(DEFCLASS FIDBoxObject (MetaClass Class Edited%:            (* mcl%. "28-Sep-85 15.42")
                                doc "This is the default metaClass for all classes")
      (Supers FIDHighlightObject)
      (ClassVariables (LineWidth 1 doc "Default line width for display")
            (BoxWidth 2 doc "Default width of any boxes within the icon")
            (DisplayDefaultScale 10 doc "default amount to scale shape when drawing")
            (IconDefaultScale 6 doc "default amount to scale shape when drawing"))
      (InstanceVariables (region #,($A ComputeRegion1 FFSendSelf ReplaceMe) doc "AV replacement")
            (highlightRegion #,($A ComputeHighlightRegion FFSendSelf ReplaceMe) DontSave Any doc "AV
                  replacement region to use for basic highlighting; often differs from objects real
                  region")
            (connectPts NIL DontSave Any doc "Points in the object where connections are valid: set when
                  object is drawn, reset when object is moved")
            (timesW 1 DontSave Any doc "Multiplier for object width")
            (timesH 1 DontSave Any doc "Multiplier for object height")))

(DEFCLASS FIDBrowser (MetaClass Class Edited%:            (* mcl%. " 3-Dec 86 12.15")
                                doc "This is the default metaClass for all classes")
      (Supers Browser)
      (ClassVariables (PrintName NIL doc "Basic editor name string"))
      (InstanceVariables (dirty T DontSave Any doc "Set when window has been modified")
            (object NIL doc "The object being edited")))
                                                                                  Page 2

(DEFCLASS FIDObject (MetaClass AbstractClass Edited%:            (* mcl%: "20-Oct-86 15:03")
                          doc "Abstract classes are placeholders in the inheritance network, which cannot
                          themselves be instantiated.")
      (Supers FIDPart)
      (ClassVariables (VieweeClass #,($C FISObject) doc "The class of semantic object of which I am a view")
            (WholeShapeBorder 2 doc "Amount by which the object's region is larger than itself")
            (DefaultShade 1024 doc "Shade to use if none supplied")
            (DisplayDefaultScale 10 doc "default amount to scale shape when drawing")
            (IconDefaultScale 6 doc "default amount to scale shape when drawing")
            (NeededIVs NIL doc "List of IVs that need values for this to be a complete object.")
            (PermissibleActionLst NIL doc "Actions permissible on this object"))
      (InstanceVariables (label NIL doc "The label on this step")
            (superObject NIL doc "The object of which I am an immediate subobject if any")
            (center NIL doc "The center of the object in screen coords. The object does all its
                  computations from its center")
            (region NIL DontSave Any doc "The region on the screen where the object is displayed")
            (dirty T DontSave Any doc "set when object is moved - cleared when re-drawn")
            (bitmap NIL DontSave Any doc "bitmap cache")
            (scale #,($A DisplayDefaultScale GetFromCV ReplaceMe) DontSave Any doc "IV accessing scale of
                  object")))

(DEFCLASS FIDHighlightObject (MetaClass Class Edited%:            (* mcl%. "25-Aug-86 11 56")
                                doc "This is the default metaClass for all classes")
      (Supers FIDObject)
      (InstanceVariables (highlightMode Invert DontSave Any doc "Mode to use when highlighting an object on
                                the display")
            (highlightOn? NIL DontSave Any doc "flag set when displaying a highlight")
            (highlightRegion #,($A region GetFromIV ReplaceMe) DontSave Any doc "region to use for basic
                  highlighting; often differs from objects real region")
            (highlightShade NIL DontSave Any doc "set to a shade when :highLightMode = SHADE")
            (highlightRegions #,($A ComputeHighlightRegions FFSendSelf ReplaceMe) DontSave Any doc
                  "Separately highlightable regions within an object")))

(DEFCLASS FIDPart (MetaClass AbstractClass Edited%:            (* mcl " 2-Oct-85 11 18")
                          doc "Abstract classes are placeholders in the inheritance network, which cannot
                          themselves be instantiated.")
      (Supers WorkstationObject)
      (ClassVariables (IconDescription NIL doc "Eventually this will be a SKETCH-like description. For now
                                it is ad hoc"))
      (InstanceVariables (label NIL doc "The label on this object")
            (owningPart NIL doc "The object of which I am a part")
            (relativePosition NIL doc "My position relative to my owning part")))
```

```
(DEFCLASS FIDCompositeObject (MetaClass AbstractClass Edited%:
                                                            (* TAL " 2-Mar-86 22:49")
                              doc "Abstract classes are placeholders in the inheritance network, which
                              cannot themselves be instantiated.")
      (Supers AbstractObject)
      (ClassVariables (Composition (subObjects)
                        doc "list of IVs that totally describe the contents of some object. Ordering
                        may be significant in layout.")
            (PaletteFIDObjects NIL doc "List of display objects to offer user in a pallette when an
                  instance of me is being edited"))
      (InstanceVariables (displayEditor NIL DontSave Any doc "The editor willing to display it")
            (displayStream NIL DontSave Any doc "The stream on which to display it")
            (subObjects NIL doc "The objects that comprise me")
            (rawExtent #,($A ComputeExtent FFSendSelf ReplaceMe) doc "extent caching")))

(DEFCLASS FIDConnector (MetaClass Class Edited%:            (* TAL "28-Jun-85 02:19")
                        doc "This is the default metaClass for all classes")
      (Supers FIDPart)
      (InstanceVariables (connectorName NIL doc "Name of IV in owningNode that contains this connector")
            (connections NIL doc "List of connectors to which I am connected")
            (value NIL)
            (direction NIL doc "Input, Output or I/O")
            (connectPosition NIL doc "Position relative to my Node, to which connecting lines should be
                  drawn")))

(\BatchMethodDefs)
```

```
(Method ((FIDBitmapObject ComputeXRegion) self) ; mct 2-Oct-85 11:43
   "cache translation region"
   [LET (region)
     (SETQ region (fetch (FIDShape Region) of (_ self GetShape)))
     (_@ %:xRegion (CREATEREGION (IMINUS (fetch (REGION LEFT) of region))
                         (IMINUS (fetch (REGION BOTTOM) of region))
                         (fetch WIDTH of region)
                         (fetch HEIGHT of region)))])

(Method ((FIDBitmapObject Draw) self stream Xform Bitmap Mode)
                                                            ; mct: 15-Jan-86 13:17
   "Draw the bitmap"
   [LET* [center (xregion (@ %:xRegion))
              (bitmap (OR Bitmap (@ %:bitmap)))
              (region (OR (@ %:region)
                          (CREATEREGION)))
              (mode (OR Mode 'INVERT]
     [SETQ center (COND
                     ((POSITIONP Xform)
                      Xform)
                     ((AND Xform (fetch (FIDXform XTranslation) of Xform))
                      (create POSITION
                             XCOORD _ (fetch (FIDXform XTranslation) of Xform)
                             YCOORD _ (fetch (FIDXform YTranslation) of Xform)))
                     ((@ self %:center))
                     (T (FID.ComputeCenter (_ self FindSpace stream)]
     (AND bitmap (_@ %:region (SETQ region (create REGION
                                                  LEFT _ (IPLUS (fetch XCOORD of center)
                                                                (fetch LEFT of xregion))
                                                  BOTTOM _ (IPLUS (fetch YCOORD of center)
                                                                  (fetch BOTTOM of xregion))
                                                  WIDTH _ (fetch WIDTH of xregion)
                                                  HEIGHT _ (fetch HEIGHT of xregion) smashing region)))
          (AND stream (BITBLT bitmap 0 0 stream (fetch LEFT of region)
                             (fetch BOTTOM of region)
                             (fetch WIDTH of region)
                             (fetch HEIGHT of region)
                             'INPUT mode])

(Method ((FIDBitmapObject Erase) self stream)              mct: 10-Oct-85 12:00
   "Remove my picture from the display"
   [LET (region bitmap)
     (AND stream (SETQ region (@ %:region))
          (SETQ bitmap (@ %:bitmap))
          (BITBLT bitmap 0 0 stream (fetch (REGION LEFT) of region)
                 (fetch (REGION BOTTOM) of region)
                 (fetch (REGION WIDTH) of region)
                 (fetch (REGION HEIGHT) of region)
                 'INPUT
                 'INVERT])

(Method ((FIDBitmapObject GetBitmap) self)                 mct: 2 Oct 85 14:18
   "cache our CV bitmap in an IV"
   (EVAL (LISTGET (@ |::IconDescription|)
                'Bitmap)))

(Method ((FIDBitmapObject GetShape) self mode scale)
                                                           mct 3 Oct 85 16:26
   "Get the rectangular shape of a bitmap object"
   (LET* ((desc (@ |::IconDescription|))
          (scale (OR scale (@ |::DisplayDefaultScale|)))
          [bitmap (EVAL (LISTGET desc 'Bitmap]
```

```
        (width (OR (LISTGET desc 'Width)
                   (AND bitmap (BITMAPWIDTH bitmap))
                   0))
        (height (OR (LISTGET desc 'Height)
                    (AND bitmap (BITMAPHEIGHT bitmap))
                    0)))
    (create FIDShape
          Shape _ 'Rectangle
          Region _ (create REGION
                        LEFT _ (SUB1 (LRSH width 1))
                        BOTTOM _ (LRSH height 1)
                        WIDTH _ width
                        HEIGHT _ height))))
```

(Method ((FIDBoxObject ComputeHighlightRegions) self) . mcl: 25-Aug-86 10:43

```
  "New method template"
  (LET ((boxincr (@ |::BoxWidth|))
        (center (@ %:center)))
    (DREVERSE (for reg in (for rg in (LISTGET (@ |::IconDescription|)
                                              'BoxDraw)
                           collect (LISTGET (_ self GetShape NIL (@ |:superObject:progScale|)
                                                (LIST rg)
                                                T)
                                            'Rectangle))
              collect (replace LEFT of reg with (PLUS (fetch XCOORD of center)
                                                      (fetch LEFT of reg)
                                                      boxincr))
                      (replace BOTTOM of reg with (PLUS (fetch YCOORD of center)
                                                        (fetch BOTTOM of reg)
                                                        boxincr))
                      (replace WIDTH of reg with (DIFFERENCE (fetch WIDTH of reg)
                                                             (LLSH boxincr 1)))
                      (replace HEIGHT of reg with (DIFFERENCE (fetch HEIGHT of reg)
                                                              (LLSH boxincr 1)))
                      reg))))
```

(Method ((FIDBoxObject ComputeRegion) self Center Scale) . mct 5-Sep-85 00:37

```
  "Compute region of box object from center"
  (LET ((center (OR Center (@ self %:center)
                    (create POSITION
                            XCOORD _ 0
                            YCOORD _ 0)))
        (scale (OR Scale (@ self %:scale)))
        region)
    (SETQ region (fetch (FIDShape Region) of (_ self GetShape NIL scale)))
    (create REGION
          LEFT _ (PLUS (fetch (POSITION XCOORD) of center)
                       (fetch (REGION LEFT) of region))
          BOTTOM _ (PLUS (fetch (POSITION YCOORD) of center)
                         (fetch (REGION BOTTOM) of region))
          WIDTH _ (fetch (REGION WIDTH) of region)
          HEIGHT _ (fetch (REGION HEIGHT) of region))))
```

(Method ((FIDBoxObject ComputeRegion1) self) mct 5-Sep-85 00.40

```
  "New method template"
  (_ self ComputeRegion))
```

(Method ((FIDBoxObject Delete) self super stream) . W Mark 30-Aug-85 15 38

```
  "Delete an object logically and physically"
  (_ self DeInstall super))
```

(Method ((FIDBoxObject Draw) self stream Xform Mode) . mct 5-Sep-85 00.37

```
  "Draw a picture of myself"
  (LET ((scale (OR (fetch (FIDXform Scale) of Xform)
                   (@ DisplayDefaultScale)))
        (mode (OR Mode 'REPLACE))
        center region)
    (SETQ center (_ self DrawBox stream Xform Mode))
    [COND
      ((@ self dirty)
       (_@ self dirty NIL)
       (_@ self center center)
       (_@ self region (_ self ComputeRegion center scale))
       (_@ self highlightRegion (_ self ComputeHighlightRegion))
       (_@ self connectPts (for pts in (LISTGET (@ IconDescription)
                                                'ConnectPoints)
                           collect (COND
                                     ((POSITIONP pts)
                                      (FID.ScaleUp pts scale center))
                                     (T pts))))]
    center))
```

```
(Method ((FIDBoxObject DrawBox) self stream Xform Mode)
                                                    . mct: 22-May-87 11:46
   "Draw a picture of a box type object"
   (LET* [(desc (@ |::IconDescription|))
          (scale (OR (fetch (FIDXform Scale) of Xform)
                     (@ |::DisplayDefaultScale|)))
          (mode (OR Mode 'REPLACE))
          (linewidth (@ |::LineWidth|))
          center
          (timesW (OR (fetch (FIDXform TimesW) of Xform)
                      (@ self %:timesW)))
          (timesH (OR (fetch (FIDXform TimesH) of Xform)
                      (@ self %:timesH))]
     [SETQ center (COND
                    ((AND Xform (fetch (FIDXform XTranslation) of Xform))
                     (create POSITION
                            XCOORD _ (fetch (FIDXform XTranslation) of Xform)
                            YCOORD _ (fetch (FIDXform YTranslation) of Xform)))
                    ((@ self %:center))
                    (T (FID.ComputeCenter (_ self FindSpace stream)]
     [for box boxwidth pos x b w w1 h h1 iscale (dirty _ (@ self %:dirty)) in (LISTGET desc 'BoxDraw)
        first (SETQ boxwidth (@ |::BoxWidth|))
              (AND dirty (_@ self %:highlightRegions NIL))
        do [COND
             ((NOT (REGIONP box))
              (SETQ iscale (CADR box))
              (SETQ box (CAR box]
           (SETQ pos (FID.ScaleUp (create POSITION
                                         XCOORD _ (fetch LEFT of box)
                                         YCOORD _ (fetch BOTTOM of box))
                                  scale center))
           (SETQ x (fetch XCOORD of pos))
           (SETQ b (fetch YCOORD of pos))
           (SETQ w (TIMES (fetch WIDTH of box)
                          scale))
           [COND
             ((IGREATERP timesW 1)
              (SETQ w1 w)
              (SETQ w (ITIMES w1 timesW))
              (SETQ x (IDIFFERENCE x (LRSH (IDIFFERENCE w w1)
                                           1]
           (SETQ h (TIMES (fetch HEIGHT of box)
                          scale))
           [COND
             ((IGREATERP timesH 1)
              (SETQ h1 h)
              (SETQ h (ITIMES h1 timesH))
              (SETQ b (IDIFFERENCE b (LRSH (IDIFFERENCE h h1)
                                           1]
           (COND
             (iscale (SETQ iscale (FIX (TIMES iscale scale)))
                     (SETQ x (IDIFFERENCE x iscale))
                     (SETQ b (IDIFFERENCE b iscale))
                     (SETQ w (IPLUS w (TIMES iscale 2)))
                     (SETQ h (IPLUS h (TIMES iscale 2)))
                     (SETQ iscale NIL)))
           (DRAWAREABOX x b (add w 1)
                  (add h 1)
                  (FIXR (TIMES boxwidth (DSPSCALE NIL stream)))
                  mode stream)
           (AND dirty (push (@ self %:highlightRegions)
                            (CREATEREGION (IPLUS x boxwidth)
                                   (IPLUS b boxwidth)
                                   (IDIFFERENCE w (LLSH boxwidth 1))
                                   (IDIFFERENCE h (LLSH boxwidth 1]
     (_ self DrawLinePart stream scale center desc mode)
     center))

(Method ((FIDBoxObject DrawIcon) self Stream XForm Mode) "Method documentation"
   (_ self Draw Stream XForm))
```

```
(Method ((FIDBoxObject DrawLine) self stream spoint dpoint width mode)
                                                    : mct: 20-Aug-86 12:02
   "Draw a straight line on the diplay between two points"
   (DRAWLINE (fetch (POSITION XCOORD) of spoint)
          (fetch (POSITION YCOORD) of spoint)
          (fetch (POSITION XCOORD) of dpoint)
          (fetch (POSITION YCOORD) of dpoint)
          (FIXR (TIMES width (DSPSCALE NIL stream)))
          (OR mode 'REPLACE)
          stream))

(Method ((FIDBoxObject DrawLinePart) self stream scale center desc mode)
                                                    mct: 20-Aug-86 12.13
   "New method template"
   (for lst bind [linewidth _ (FIXR (TIMES (@ |::LineWidth|)
                                          (DSPSCALE NIL stream]
      in (LISTGET desc 'LineDraw) do (for pos bind p1 p2 in (CDR lst) first (SETQ p1 (FID.ScaleUp
                                                                                    (CAR lst)
                                                                                    scale center))
                                        do (SETQ p2 (FID.ScaleUp pos scale center))
                                           (DRAWBETWEEN p1 p2 linewidth mode stream)
                                           (SETQ p1 p2))))
```

```
(Method ((FIDBoxObject DrawText) self stream text region)
                                                        mct: 20-Aug-86 11 19
   "given text and a region. print the text there in the stream"
   (PRIN1ATBOX text stream region))

(Method ((FIDBoxObject GetPaletteIcon) self)            mct 5-Sep-85 00:41
   "Make an icon bitmap for the object"
   (LET* ((scale (@ self IconDefaultScale))
          (shape (GROW/REGION (fetch (FIDShape Region) of (_ self GetShape NIL scale))
                              (@ self WholeShapeBorder)))
          (w (fetch (REGION WIDTH) of shape))
          (h (fetch (REGION HEIGHT) of shape))
          bitmap)
     (SETQ bitmap (BITMAPCREATE w h))
     (_ self DrawIcon (DSPCREATE bitmap)
            (create FIDXform
                    XTranslation _ (LRSH w 1)
                    YTranslation _ (LRSH h 1)
                    Scale _ scale))
     bitmap))

(Method ((FIDBoxObject GetShape) self mode scale BoxRegs BoxOnlyFlg)
                                                        mct: 25-Aug-86 10 29
   "get the basic outline shape of the object"
   [LET (desc (scale (OR scale (@ |::DisplayDefaultScale|)))
             (left 0)
             (bottom 0)
             (right 0)
             (top 0)
             (timesW (@ self %:timesW))
             (timesH (@ self %:timesH))
             newleft newbottom width width1 height height1)
     [for reg in (OR BoxRegs (LISTGET (SETQ desc (@ |::IconDescription|))
                                      'BoxDraw))
        do [COND
             ((NOT (REGIONP reg))
              (SETQ reg (CAR reg]
           (SETQ left (MIN left (fetch LEFT of reg)))
           (SETQ bottom (MIN bottom (fetch BOTTOM of reg)))
           (SETQ right (MAX right (fetch PRIGHT of reg)))
           (SETQ top (MAX top (fetch PTOP of reg]
     [AND (NOT BoxOnlyFlg)
          (OR desc (SETQ desc (@ |::IconDescription|)))
          (for lst in (LISTGET desc 'LineDraw) do (for pos in lst do (SETQ left (MIN left
                                                                              (fetch XCOORD
                                                                                 of pos)))
                                                                     (SETQ bottom
                                                                      (MIN bottom (fetch YCOORD of pos)))
                                                                     (SETQ right (MAX right
                                                                              (fetch XCOORD
                                                                                 of pos)))
                                                                     (SETQ top (MAX top (fetch YCOORD
                                                                                   of pos]
     (SETQ newleft (FIX (TIMES left scale)))
     (SETQ width (TIMES (DIFFERENCE right left)
                        scale))
```

Page 7

```
     [COND
        ((IGREATERP timesW 1)
         (SETQ width1 width)
         (SETQ width (ITIMES width1 timesW))
         (SETQ newleft (IDIFFERENCE newleft (LRSH (IDIFFERENCE width width1)
                                                  1]
     (SETQ newbottom (FIX (TIMES bottom scale)))
     (SETQ height (TIMES (DIFFERENCE top bottom)
                         scale))
     [COND
        ((IGREATERP timesH 1)
         (SETQ height1 height)
         (SETQ height (ITIMES height1 timesH))
         (SETQ newbottom (IDIFFERENCE newbottom (LRSH (IDIFFERENCE height height1)
                                                      1]
     (create FIDShape
             Shape _ 'Rectangle
             Region _ (create REGION
                              LEFT _ newleft
                              BOTTOM _ newbottom
                              WIDTH _ (ADD1 width)
                              HEIGHT _ (ADD1 height])

(Method ((FIDBoxObject GetWidth) self mode scale)       mct: 29-Aug-85 21 32
   "Get actual width of object"
   (fetch (REGION WIDTH) of (fetch (FIDShape Region) of (_ self GetShape NIL scale))))

(Method ((FIDBrowser Destroy) self)                     mct: 10-Oct-85 19.52
   "Specialization"
   (LET ((object (@ %:object)))
     (_@ object %:displayEditor NIL)
     (_@ object %:displayStream NIL)
     (_Super self Destroy)))
```

```
(Method ((FIDBrowser Repaint) self)                    . mcf: 30-Sep-85 10:11
   "Basic Repaint functionality"
   (LET ((window (@ window)))
     (DSPFILL NIL NIL NIL window)
     (_ (@ self object)
        DrawAll window)))

(Method ((FIDCompositeObject ClearAllHighlights) self)
                                                       TAL 5-Mar-86 05 04
   "Clear any highlights of my subObjects"
   [LET ((stream (@ %:displayStream)))
     (for subobjIV in (@ |::Composition|) do (for subobj in (@ %:!\subobjIV)
                                               do (_ subobj Highlight stream 'Off)])

(Method ((FIDCompositeObject ComputeBasicExtent) self)
                                                       . mcf: 18-Dec-85 20:08
   "Return the basic extent, presuming no subobjects, for the browser viewing this object"
   (CREATEREGION 0 0 0 0))

(Method ((FIDCompositeObject ComputeExtent) self)
                                                       . mcf: 18-Dec-85 20:32
   "Basic method for drawing a composite object composed of possibly many disparate subobjects."
   (bind (extent _ (COPY NullExtent)) for subobjIV in (@ |::Composition|)
     do (for subobj in (REVERSE (@ %:!\subobjIV)) do (_ subobj ExtendExtent extent))
     yield (COND
             ((EQUAL extent NullExtent)
              (_ self ComputeBasicExtent))
             (T extent))))

(Method ((FIDCompositeObject DrawAll) self Stream)  . mcf: 5 Nov-86 13:18
   "Basic method for drawing a composite object composed of possibly many disparate subobjects."
   (for subobjIV in (@ |::Composition|) do (for subobj in (REVERSE (@ %:!\subobjIV))
                                             do (_ subobj Draw Stream))))
```

Page 8

```
(Method ((FIDCompositeObject RepaintHighlights) self Stream)
                                                       ; mcf 8-Sep-85 22:41
   "New method template"
   [for subobjIV in (@ |::Composition|) do (for subobj in (@ %:!\subobjIV) do (_ subobj Highlight Stream
                                                                                 'Repaint)])

(Method ((FIDCompositeObject SendToParts1) self options msg.arg1 arg2 arg3 arg4)
                                                       . TAL 7-Jul-88 04:32
   "Specialization"
   (for iv in (@ |::Composition|) do (for part in (GetValue self iv) when (ObjectExists? part)
                                       do (_ part SendToParts options msg arg1 arg2 arg3 arg4))))

(Method ((FIDConnector CanLinkTo?) self Connector)    . TAL 26-Jun-85 04:36
  "Returns T if I can connect to Connector"
  (LET ((hisDir (@ Connector %:direction)))
    (SELECTQ (@ %:direction)
         (Input (NEQ hisDir 'Input))
         (Output (NEQ hisDir 'Output))
         T)))

(Method ((FIDConnector ConnectTo) self OtherConnector)
                                                       . TAL 3-Jul-85 01.38
   "Establish a connection between myself and OtherConnector"
   (_ self HalfConnect OtherConnector)
   (_ OtherConnector HalfConnect self)
   self)

(Method ((FIDConnector Connected?) self OtherConnector)
                                                       . TAL 19-Jun-85 12.00
   "Test whether I am connected to OtherConnector"
   (COND
     ((FMEMB OtherConnector (@ %:connections))
      self)))

(Method ((FIDConnector Disconnect) self OtherConnector)
                                                       . TAL 3-Jul-85 01 49
   "Disconnect this connector from OtherConnector. OtherConnector can also be a list of connectors, or NIL
   meaning disconnect all connections"
   (for c inside (OR OtherConnector (@ %:connections)) do (_ self HalfDisconnect c)
                                                            (_ c HalfDisconnect self))
   self)

(Method ((FIDConnector HalfConnect) self OtherConnector)
                                                       TAL 3-Jul-85 01 28
   "Connect myself to the other connecter, and install myself in my node if necessary"
   (LET ((node (@ %:owningPart)))
     (pushnew (@ %:connections)
            OtherConnector)
     (pushnew (@ node %:connectors)
            self))
   self)
```

```
(Method ((FIDConnector HalfDisconnect) self OtherConnector)
                                                              . TAL 3-Jul-85 01 46
   "Disconnect this connector from OtherConnector."
   (_@ %:connections (DREMOVE OtherConnector (@ %:connections)))
   self)

(Method ((FIDHighlightObject ComputeHighlightRegion) self)
                                                              . mct: 18-Nov-85 15 26
   "Stretch the region for basic highlight"
   (GROW/REGION (@ self %:region)
          (@ |::WholeShapeBorder|)))

(Method ((FIDHighlightObject ComputeHighlightRegions) self)
                                                              . mct: 25-Aug-86 11 54
   "New method template"
   (LIST (_ self ComputeHighlightRegion)))
```

```
(Method ((FIDHighlightObject Highlight) self Stream Mode Shade Region)
                                                              . mct: 28-Mar-88 15:43
   "If Region is specified, it takes precedence over the object's region. Used when only part of an object is
   highlighted"
   (DECLARE (GLOBALVARS BLACKSHADE))
   [LET ((mode (OR Mode (@ self %:highlightMode)
                  'Invert))
         (shade Shade)
         (region Region)
         (on? (@ self %:highlightOn?)))
     (COND
        ((SELECTQ mode
              ((Invert Shade)
                  (COND
                     ((NOT on?)
                      (OR (REGIONP region)
                          (SETQ region (@ self %:highlightRegion)))
                      (AND shade (_@ self %:highlightShade shade))
                      (_@ self %:highlightMode mode)
                      (_@ self %:highlightOn? region))))
              (Flash  .. Crock to permit blind highlighting. Caller must keep track of state

                     (SETQ mode 'Invert)
                     (OR (REGIONP region)
                         (SETQ region (@ self %:highlightRegion))))
              (Off [COND
                      (on? (_@ self %:highlightMode NIL)
                           (_@ self %:highlightOn? NIL)
                           (OR shade (SETQ shade (@ self %:highlightShade)))
                           (_@ self %:highlightShade NIL)
                           (OR region (SETQ region on?])
              (Repaint (COND
                          ((SETQ region on?)
                           (OR shade (SETQ shade (@ self %:highlightShade)))
                           T)))
              (HELP mode ": Invalid highlight mode"))
         (OR shade (SETQ shade BLACKSHADE))
         (COND
            (Stream (BITBLT NIL NIL NIL Stream (fetch (REGION LEFT) of region)
                           (fetch (REGION BOTTOM) of region)
                           (fetch (REGION WIDTH) of region)
                           (fetch (REGION HEIGHT) of region)
                           'TEXTURE
                           'INVERT shade])

(Method ((FIDObject DeInstall) self superObject)           . TAL 3-Jul-85 02.05
   "New method template"
   (change (@ superObject %:subObjects)
         (DREMOVE self DATUM))
   (_@ %:superObject NIL)
   (_SuperFringe
    self DeInstall superObject)
   self)

(Method ((FIDObject Erase) self stream)                    . mct: 3-Oct-85 13 13
   "Remove my picture from the display"
   [LET ((region (@ self %:region)))
     (AND region (BITBLT stream (fetch (REGION LEFT) of region)
                         (fetch (REGION BOTTOM) of region)
                         stream
                         (fetch (REGION LEFT) of region)
                         (fetch (REGION BOTTOM) of region)
                         (fetch (REGION WIDTH) of region)
                         (fetch (REGION HEIGHT) of region)
                         NIL
                         'ERASE])

(Method ((FIDObject ExtendExtent) self extent)             . mct: 30-Sep-85 11 03
   "Modifies extent arg to include region occupied by this object. Default is to do nothing."
   (LET ((region (@ %:region)))
     (COND
        (region (EXTENDREGION extent region))
        (extent))))
```

```
(Method ((FIDObject FindSpace) self Stream)                    . mct 1-Jul-85 12:21
   "Gets a region on a display stream"
   (_ self FindSpaceManually Stream))

(Method ((FIDObject FindSpaceManually) self Stream region)
                                                               . mct 31-Jul-85 16:37
   "Interactive function for obtaining a region from the display stream"
   [OR region (REGIONP (SETQ region (@ %:region)))
       (SETQ region (FIDRegionFromShape (_ self GetShape)]
   (bind newregion wregion wborder cregion first (SETQ wregion (WINDOWPROP Stream 'REGION))
                                                  (SETQ wborder (WINDOWPROP Stream 'BORDER))
                                                  (SETQ cregion (DSPCLIPPINGREGION NIL Stream))
      do (SETQ newregion (SETQ region (GETBOXREGION (fetch (REGION WIDTH) of region)
                                              (fetch (REGION HEIGHT) of region)
                                              (IDIFFERENCE (IPLUS (fetch (REGION LEFT) of region)
                                                                  (fetch (REGION LEFT) of wregion)
                                                                  wborder)
                                                     (fetch LEFT of cregion))
                                              (IDIFFERENCE (IPLUS (fetch (REGION BOTTOM) of region)
                                                                  (fetch (REGION BOTTOM) of wregion)
                                                                  wborder)
                                                     (fetch BOTTOM of cregion))
                                              Stream)))
      repeatuntil (_ self SpaceP newregion) finally (RETURN newregion)))

(Method ((FIDObject GetNeeds) self)                            TAL 3-Jul-85 05.47
   "New method template"
   (for iv in (@ |::NeededIVs|) unless (GetValue self iv) collect iv))

(Method ((FIDObject GetPaletteIcon) self)                      . mct 8-Jul-85 17.52
   "Return an icon bitmap of the object"
   (EVAL (@ self |::PaletteIcon|)))

(Method ((FIDObject Install) self containingObject)            . mct 1-Jul-85 08:54
   "New method template"
   (pushnew (@ containingObject %:subObjects)
        self)
   (_@ %:superObject containingObject)
   (_SuperFringe
    self Install containingObject)
   self)

(Method ((FIDObject ObjectChanged) self markAsChanged)
                                                               . TAL 10-Mar-86 11:34
   "New method template"
   [LET ((sup (@ %:superObject)))
     (_Super )
     (COND
        (sup                                                   (* Pass markAsChanged up to the named object of which we are a part)
             (_ sup ObjectChanged markAsChanged)])

(Method ((FIDObject PermissibleP) self action)                 . mct 7-Jul-85 21.48
   "verifies that action is permissible for object"
   (for act in (@ self |::PermissibleActionLst|) thereis (EQ act action)))

(Method ((FIDObject SpaceP) self region)                       . mct 19-Jul-85 16:00
   "check for region conflicts"
   (for node r in (@ |:superObject:subObjects|) never (AND (REGIONP (SETQ r (@ node %:region)))
                                                           (NEQ self node)
                                                           (REGIONSINTERSECTP r region))))

(Method ((FIDPart DrawLabel) self Stream Xform Mode)           TAL 26-Jun-85 03.45
   "Display the node's label, if any"
   (COND
     ((@ %:label)
      (CENTERPRINTINREGION (@ %:label)
              (FIDRegionFromShape (_ self GetLabelShape)
                     Xform)
              Stream)))
   self)
```

```
(Method ((FIDPart GetLabelShape) self)                         . TAL 26-Jun-85 03:45
                                                               . Return the region in which to display this node's label
   "Default is to center the label in the node"
   (_ self GetShape))

(Method ((FIDPart Moved) self)                                 . mct 4-Jul-85 11 45
   "method for sub to specialize. It is called when the node is moved"
   self)
```

```
(Method ((FIDPart SetLabel) self NewLabel OptionalSubpart)
                                                              TAL 26-Jun-85 03:45
   "Store the label for a node or subpart"
   (_@ (OR OptionalSubpart self)
       %:label NewLabel)
   self)

(\UnbatchMethodDefs)

(DEFINEQ

(CheckFIDObjects
  [LAMBDA (FIDObjects FIDComposites)                         (* TAL "10-Aug-85 00:21")
    (LET NIL
      [for x in (OR FIDObjects (_ ($ FIDObject)
                                   AllInstances!))
         do (COND
              ((NULL (@ x %:superObject)))
              ((NOT (FMEMB x (@ x |:superObject:subObjects|)))
               (printout T x "is not subObject of its superObject." T]
      (bind b for x in (OR FIDComposites (_ ($ FIDCompositeObject)
                                             AllInstances!))
         do (COND
              ((SETQ b (for s in (@ x %:subObjects) when (NEQ x (@ s %:superObject)) collect s))
               (printout T x " has subObjects for which it is not their superObject: " b T])

(FID.AdjustSlope
  [LAMBDA (slope desc)                                       (* mcf%: " 3-Jul-85 18:01")
    (replace (POSITION XCOORD) of slope with (PLUS 10 (fetch (POSITION XCOORD) of slope)))
    (replace (POSITION YCOORD) of slope with (PLUS 10 (fetch (POSITION YCOORD) of slope)))
    slope])

(FID.ComputeCenter
  [LAMBDA (region)                                           (* mcf%: " 3-Jul-85 15:13")
    (create POSITION
            XCOORD _ (IPLUS (fetch (REGION LEFT) of region)
                            (LRSH (fetch (REGION WIDTH) of region)
                                  1))
            YCOORD _ (IPLUS (fetch (REGION BOTTOM) of region)
                            (LRSH (fetch (REGION HEIGHT) of region)
                                  1])

(FID.ScaleUp
  [LAMBDA (pos scale center)                                 (* mcf%. " 8-Jul-85 19:41")
    (create POSITION
            XCOORD _ (IPLUS (TIMES (fetch (POSITION XCOORD) of pos)
                                   scale)
                            (fetch (POSITION XCOORD) of center))
            YCOORD _ (IPLUS (TIMES (fetch (POSITION YCOORD) of pos)
                                   scale)
                            (fetch (POSITION YCOORD) of center])

(FID.StretchLine
  [LAMBDA (endpoint stretchdist offset)                      (* mcf%. " 3-Jul-85 21:50")
    (LET (incr)
      (SETQ incr (FPLUS [FQUOTIENT stretchdist (SQRT (PLUS (TIMES (fetch (POSITION XCOORD) of endpoint)
                                                                  (fetch (POSITION XCOORD) of endpoint))
                                                           (TIMES (fetch (POSITION YCOORD) of endpoint)
                                                                  (fetch (POSITION YCOORD) of endpoint]
                        1))
      (create POSITION
              XCOORD _ (PLUS (fetch (POSITION XCOORD) of offset)
                             (FIX (FTIMES (fetch (POSITION XCOORD) of endpoint)
                                          incr)))
              YCOORD _ (PLUS (fetch (POSITION YCOORD) of offset)
                             (FIX (FTIMES (fetch (POSITION YCOORD) of endpoint)
                                          incr])
```

```
(FIDLineEllipseIntersection
  [LAMBDA (I J SemiMajorRadius SemiMinorRadius)              (* TAL "19-Jun-85 17:31")

          (* * Computes the intersection point of an ellipse centered at 0,0 having the specified SemiMajorRadius and SemiMinorRadius, and a
          line from 0,0 to I,J)

    (PROG (X Y (Major2 (TIMES SemiMajorRadius SemiMajorRadius))
             (Minor2 (TIMES SemiMinorRadius SemiMinorRadius)))
          [COND
            ((NOT (ZEROP I))
             [SETQ X (SQRT (FQUOTIENT (TIMES Major2 Minor2)
                                      (PLUS (FQUOTIENT (TIMES Major2 J J)
                                                       (TIMES I I))
                                            Minor2]
             [COND
               ((MINUSP I)
                (SETQ X (MINUS X]
             (SETQ Y (FQUOTIENT (TIMES J X)
                                I)))
```

```
          (T (SETQ X 0)
             (SETQ Y SemiMinorRadius)
             (COND
                ((MINUSP J)
                 (SETQ Y (MINUS Y]
        (RETURN (create POSITION
                        XCOORD _ (FIXR X)
                        YCOORD _ (FIXR Y])
```

(FIDRegionFromShape (* TAL "17-Jun-85 17 25")

```
  [LAMBDA (Shape Xform)
    (SELECTQ (fetch (FIDShape Shape) of Shape)
         (Rectangle (FIDTransformRegion (fetch (FIDShape Region) of Shape)
                                        Xform))
         (HELP "Unknown FIDShape " Shape])
```

(FIDTransformRegion (* TAL "17-Jun-85 17:24")

```
  [LAMBDA (Region Xform)
    (COND
       [Xform (create REGION reusing Region LEFT _ (PLUS (fetch LEFT of Region)
                                                         (fetch XTranslation of Xform))
                                          BOTTOM _ (PLUS (fetch BOTTOM of Region)
                                                         (fetch YTranslation of Xform]
       (T Region])
```

(FIDTransformShape (* TAL "17-Jun-85 17:22")

```
  [LAMBDA (Shape Xform)
    (SELECTQ (fetch (FIDShape Shape) of Shape)
         (Rectangle (create FIDShape
                            Shape _ 'Rectangle
                            Region _ (FIDTransformRegion (fetch (FIDShape Region) of Shape)
                                                         Xform)))
         (HELP "Unknown FIDShape " Shape])

)

(DECLARE%: EVAL@COMPILE

(RECORD FIDShape (Shape Region))

(RECORD FIDXform (XTranslation YTranslation Scale TimesW TimesH))
)

(RPAQQ NullExtent (32767 32767 -65536 -65536))

.. FOLLOWING DEFINITIONS EXPORTED

(DECLARE%: DOEVAL@COMPILE DONTCOPY

(GLOBALVARS NullExtent)
)

. END EXPORTED DEFINITIONS

(PUTPROPS FIDOBJECTS FILETYPE :FAKE-COMPILE-FILE)

(PUTPROPS FIDOBJECTS COPYRIGHT ("Savoir, Inc.." 1985 1986 1987 1988))
```

FUNCTION INDEX

FID.FindFurthest ...............32
FID.TransitionOrderFn ..........33
FISAddAbbrevDelimiters .........33
GetCompositeFromWindow .........33
GetStepFromWindow ..............33

VARIABLE INDEX

AnyPreviousTransitionTemplate ..35
FISAbbrevDelimiter .............33
FISDownArrow ...................35
FISLeftArrow ...................35
FISLeftIncr ....................35
FISMinArrowDistance ............35
FISRightArrow ..................35
FISRightIncr ...................35
FISUpArrow .....................35
FISUpIncr ......................35
GrafcetInitialStepPalette8M ....35
GrafcetProcessStepPalette8M ....35
INStepTemplate .................35
LabelReadTbl ...................33
OtherwiseTransitionTemplate ....35
OUTStepTemplate ................35

CLASS INDEX

FIDGrafcetNexus .................2
FIDGrafcetObject ................2
GrafcetAsynchronousLink .........2
GrafcetInitialStep ..............3
GrafcetLink .....................3
GrafcetMacroStep ................3
GrafcetProcessStep ..............3
GrafcetRegularStep ..............3
GrafcetRemoteLink ...............4
GrafcetSplitStep ................4
GrafcetStep .....................4
GrafcetSynchronousLink ..........4
GrafcetTransition ...............5

INSTANCE INDEX

GrafcetAsynchronousLink ........35
GrafcetInitialStep .............34
GrafcetMacroProgram ............34
GrafcetMainProgram .............34
GrafcetRegularStep ..........34,35
GrafcetTransition ..............34

PROPERTY INDEX

FIDGRAFCET ...................2,35

METHOD INDEX

FIDGrafcetNexus.ClearLinkCache .....................5
FIDGrafcetNexus.ClearRegions .......................5
FIDGrafcetNexus.ComputeLabelRegion .................5
FIDGrafcetNexus.DeAdjustLinks ......................5
FIDGrafcetNexus.Document ...........................6
FIDGrafcetNexus.DocumentPart .......................6
FIDGrafcetNexus.GetAccessList ......................6
FIDGrafcetNexus.GetDescription .....................6
FIDGrafcetNexus.GetName ............................6
FIDGrafcetNexus.HasContents? .......................6
FIDGrafcetNexus.Highlight ..........................7
FIDGrafcetNexus.InProgram? .........................7
FIDGrafcetNexus.Kill ...............................7
FIDGrafcetNexus.Kill! ..............................7
FIDGrafcetNexus.Linkable? ..........................8
FIDGrafcetNexus.Moved ..............................8
FIDGrafcetNexus.NameConflict? ......................8
FIDGrafcetNexus.Rename .............................8
FIDGrafcetNexus.Rename! ............................8
FIDGrafcetNexus.SetAbbreviation ....................8
FIDGrafcetNexus.SetLabel1 ..........................9
FIDGrafcetNexus.SWIVSource .........................8
FIDGrafcetNexus.Transferable? ......................9
FIDGrafcetNexus.UsesContextApplicable? .............9
FIDGrafcetNexus.WhoUses ............................9
FIDGrafcetObject.ClearRegions ......................9
FIDGrafcetObject.Compile ...........................9
FIDGrafcetObject.DeLink ............................9
FIDGrafcetObject.Draw .............................10
FIDGrafcetObject.DrawConnection ...................10
FIDGrafcetObject.DrawLabel ........................10
FIDGrafcetObject.Erase ............................10
FIDGrafcetObject.EraseLabel .......................10
FIDGrafcetObject.ExtendExtent .....................10
FIDGrafcetObject.FindSpaceManually ................10
FIDGrafcetObject.GetCenterFromBottom ..............11
FIDGrafcetObject.GetCenterFromTop .................11
FIDGrafcetObject.GetConnectPoint ..................11
FIDGrafcetObject.GetGrid ..........................11
FIDGrafcetObject.GetNamedParts ....................11
FIDGrafcetObject.GetPaletteIcon ...................11
FIDGrafcetObject.GetShape .........................11
FIDGrafcetObject.GetWidth .........................12
FIDGrafcetObject.GridJustify ......................12
FIDGrafcetObject.MainProgram ......................12
FIDGrafcetObject.NameQualifier ....................12
FIDGrafcetObject.PrintNameQualifier ...............13
FIDGrafcetObject.RegionIntersectP .................13
FIDGrafcetObject.SpaceP ...........................13
FIDGrafcetObject.SWCopyMade .......................13
GrafcetAsynchronousLink.DetermineDrawPoints .......13
GrafcetAsynchronousLink.DrawLink ..................13
GrafcetInitialStep.Transferable? ..................14
GrafcetLink.DrawConnection ........................14
GrafcetLink.ExtendExtent ..........................15
GrafcetLink.UpConnectionPoints ....................16
GrafcetMacroStep.ChangeType .......................16
GrafcetMacroStep.ComputeMacroProgramName ..........16
GrafcetMacroStep.DeInstall ........................16
GrafcetMacroStep.EvaluateContinuous ...............16
GrafcetMacroStep.GetAccessList ....................16
GrafcetMacroStep.GetStepNumber ....................17
GrafcetMacroStep.Install ..........................17
GrafcetMacroStep.NameConflict? ....................17
GrafcetMacroStep.Rename ...........................17
GrafcetMacroStep.Rename! ..........................17
GrafcetMacroStep.SendToParts1 .....................18
GrafcetMacroStep.SetLabel .........................18
GrafcetMacroStep.SetLabel1 ........................18
GrafcetMacroStep.SWCopyMade .......................18
GrafcetMacroStep.Transferable? ....................18
GrafcetMacroStep.ValidStepNumber? .................18
GrafcetProcessStep.ChangeType .....................18
GrafcetProcessStep.Draw ...........................19
GrafcetRegularStep.ComputeStaticAnalysis ..........19
GrafcetRegularStep.ComputeStepProgName ............19
GrafcetRegularStep.DeleteProgram ..................19
GrafcetRegularStep.DocumentPart ...................19
GrafcetRegularStep.Draw ...........................20
GrafcetRegularStep.DrawDots .......................20
GrafcetRegularStep.GetPaletteIcon .................20
GrafcetRegularStep.NameConflict? ..................20
GrafcetRegularStep.ObjectChanged ..................21
GrafcetRegularStep.SendToParts1 ...................21
GrafcetRegularStep.SWCopyMade .....................21
GrafcetRegularStep.WhoUses ........................21
GrafcetRemoteLink.ComputeLabelRegion ..............21
GrafcetRemoteLink.DrawLink ........................21
GrafcetRemoteLink.ExtendExtent ....................22
GrafcetSplitStep.DrawID ...........................22

GrafcetSplitStep.GetHighlightRegion ....................22
GrafcetStep.AdjustLinks ....................23
GrafcetStep.ClearRegions ....................23
GrafcetStep.ComputeLabelRegion ....................23
GrafcetStep.ComputePrintName ....................23
GrafcetStep.ComputeStepNumberRegion ....................23
GrafcetStep.DeInstall ....................24
GrafcetStep.Draw ....................24
GrafcetStep.DrawLinePart ....................24
GrafcetStep.DrawStepNumber ....................24
GrafcetStep.Erase ....................24
GrafcetStep.EraseStepNumber ....................24
GrafcetStep.EvaluateActivation ....................24
GrafcetStep.EvaluateContinuous ....................25
GrafcetStep.EvaluateDeactivation ....................25
GrafcetStep.ExtendExtent ....................25
GrafcetStep.GetDescription ....................25
GrafcetStep.GetHighlightRegion ....................25
GrafcetStep.GetName ....................25
GrafcetStep.GetStepName ....................25
GrafcetStep.GetStepNumber ....................25
GrafcetStep.HasContents? ....................25
GrafcetStep.Install ....................25
GrafcetStep.Link ....................26
GrafcetStep.Linkable? ....................26
GrafcetStep.MakeFileSource ....................26
GrafcetStep.Moved ....................26
GrafcetStep.NameConflict? ....................26
GrafcetStep.NameConflictMsg ....................26
GrafcetStep.QualifiedPrintName ....................26
GrafcetStep.RegionIntersectP ....................27
GrafcetStep.SetLabel ....................27
GrafcetStep.SWCopyMade! ....................27
GrafcetStep.UsesContextApplicable? ....................27
GrafcetStep.ValidStepNumber? ....................27
GrafcetSynchronousLink.DrawLink ....................27
GrafcetSynchronousLink.UpFromSynchronous ....................28
GrafcetTransition.AdjustLinks ....................29
GrafcetTransition.CompileTrans ....................29
GrafcetTransition.ComputeLabelRegion ....................29
GrafcetTransition.ConstructPrintName ....................30
GrafcetTransition.DeInstall ....................30
GrafcetTransition.Document ....................30
GrafcetTransition.Evaluate ....................30
GrafcetTransition.GetDescription ....................30
GrafcetTransition.GetPaletteIcon ....................30
GrafcetTransition.Install ....................30
GrafcetTransition.Link ....................31
GrafcetTransition.Linkable? ....................31
GrafcetTransition.LocateBrowsers ....................31
GrafcetTransition.Moved ....................31
GrafcetTransition.QualifiedPrintName ....................31
GrafcetTransition.SetLabel ....................31
GrafcetTransition.WhoUses ....................32

---

File created: 12-Sep-88 21:21:07 {DSK}<LISPFILES>FIS>FIDGRAFCET.;267 changes to: (METHODS GrafcetMacroStep.Transferable? GrafcetStep.NameConflict?
FIDGrafcetNexus.UsesContextApplicable? GrafcetStep.UsesContextApplicable?)
(VARS FIDGRAFCETCOMS)

previous date: 5-Sep-88 17:05:33 (DSK)<LISPFILES>FIS>FIDGRAFCET.;266

Read Table: INTERLISP

Package: IL

.. Copyright (c) 1985, 1986, 1987, 1988 by Savoir, Inc.. All rights reserved.

```
(RPAQQ FIDGRAFCETCOMS
       ((DECLARE%: DONTCOPY (PROP MAKEFILE-ENVIRONMENT FIDGRAFCET))
        (CLASSES FIDGrafcetNexus FIDGrafcetObject GrafcetAsynchronousLink GrafcetInitialStep GrafcetLink
               GrafcetMacroStep GrafcetProcessStep GrafcetRegularStep GrafcetRemoteLink GrafcetSplitStep
               GrafcetStep GrafcetSynchronousLink GrafcetTransition)
        (METHODS FIDGrafcetNexus.ClearLinkCache FIDGrafcetNexus.ClearRegions
               FIDGrafcetNexus.ComputeLabelRegion FIDGrafcetNexus.DeAdjustLinks FIDGrafcetNexus.Document
               FIDGrafcetNexus.DocumentPart FIDGrafcetNexus.GetAccessList FIDGrafcetNexus.GetDescription
               FIDGrafcetNexus.GetName FIDGrafcetNexus.HasContents? FIDGrafcetNexus.Highlight
               FIDGrafcetNexus.InProgram? FIDGrafcetNexus.Kill FIDGrafcetNexus.Kill!
               FIDGrafcetNexus.Linkable? FIDGrafcetNexus.Moved FIDGrafcetNexus.NameConflict?
               FIDGrafcetNexus.Rename FIDGrafcetNexus.Rename! FIDGrafcetNexus.SWIVSource
               FIDGrafcetNexus.SetAbbreviation FIDGrafcetNexus.SetLabel1 FIDGrafcetNexus.Transferable?
               FIDGrafcetNexus.UsesContextApplicable? FIDGrafcetNexus.WhoUses FIDGrafcetObject.ClearRegions
               FIDGrafcetObject.Compile FIDGrafcetObject.DeLink FIDGrafcetObject.Draw
               FIDGrafcetObject.DrawConnection FIDGrafcetObject.DrawLabel FIDGrafcetObject.Erase
               FIDGrafcetObject.EraseLabel FIDGrafcetObject.ExtendExtent FIDGrafcetObject.FindSpaceManually
               FIDGrafcetObject.GetCenterFromBottom FIDGrafcetObject.GetCenterFromTop
               FIDGrafcetObject.GetConnectPoint FIDGrafcetObject.GetGrid FIDGrafcetObject.GetNamedParts
               FIDGrafcetObject.GetPaletteIcon FIDGrafcetObject.GetShape FIDGrafcetObject.GetWidth
               FIDGrafcetObject.GridJustify FIDGrafcetObject.MainProgram FIDGrafcetObject.NameQualifier
               FIDGrafcetObject.PrintNameQualifier FIDGrafcetObject.RegionIntersectP
               FIDGrafcetObject.SWCopyMade FIDGrafcetObject.SpaceP
               GrafcetAsynchronousLink.DetermineDrawPoints GrafcetAsynchronousLink.DrawLink
               GrafcetInitialStep.Transferable? GrafcetLink.DrawConnection GrafcetLink.ExtendExtent
               GrafcetLink.UpConnectionPoints GrafcetMacroStep.ChangeType
               GrafcetMacroStep.ComputeMacroProgramName GrafcetMacroStep.DeInstall
               GrafcetMacroStep.EvaluateContinuous GrafcetMacroStep.GetAccessList
               GrafcetMacroStep.GetStepNumber GrafcetMacroStep.Install GrafcetMacroStep.NameConflict?
               GrafcetMacroStep.Rename GrafcetMacroStep.Rename! GrafcetMacroStep.SWCopyMade
               GrafcetMacroStep.SendToParts1 GrafcetMacroStep.SetLabel GrafcetMacroStep.SetLabel1
               GrafcetMacroStep.Transferable? GrafcetMacroStep.ValidStepNumber? GrafcetProcessStep.ChangeType
               GrafcetProcessStep.Draw GrafcetRegularStep.ComputeStaticAnalysis
               GrafcetRegularStep.ComputeStepProgName GrafcetRegularStep.DeleteProgram
               GrafcetRegularStep.DocumentPart GrafcetRegularStep.Draw GrafcetRegularStep.DrawDots
               GrafcetRegularStep.GetPaletteIcon GrafcetRegularStep.NameConflict?
               GrafcetRegularStep.ObjectChanged GrafcetRegularStep.SWCopyMade GrafcetRegularStep.SendToParts1
               GrafcetRegularStep.WhoUses GrafcetRemoteLink.ComputeLabelRegion GrafcetRemoteLink.DrawLink
               GrafcetRemoteLink.ExtendExtent GrafcetSplitStep.DrawID GrafcetSplitStep.GetHighlightRegion
               GrafcetStep.AdjustLinks GrafcetStep.ClearRegions GrafcetStep.ComputeLabelRegion
               GrafcetStep.ComputePrintName GrafcetStep.ComputeStepNumberRegion GrafcetStep.DeInstall
               GrafcetStep.Draw GrafcetStep.DrawLinePart GrafcetStep.DrawStepNumber GrafcetStep.Erase
               GrafcetStep.EraseStepNumber GrafcetStep.EvaluateActivation GrafcetStep.EvaluateContinuous
               GrafcetStep.EvaluateDeactivation GrafcetStep.ExtendExtent GrafcetStep.GetDescription
               GrafcetStep.GetHighlightRegion GrafcetStep.GetName GrafcetStep.GetStepName
```

```
            GrafcetStep.GetStepNumber GrafcetStep.HasContents? GrafcetStep.Install GrafcetStep.Link
            GrafcetStep.Linkable? GrafcetStep.MakeFileSource GrafcetStep.Moved GrafcetStep.NameConflict?
            GrafcetStep.NameConflictMsg GrafcetStep.QualifiedPrintName GrafcetStep.RegionIntersectP
            GrafcetStep.SWCopyMade1 GrafcetStep.SetLabel GrafcetStep.UsesContextApplicable?
            GrafcetStep.ValidStepNumber? GrafcetSynchronousLink.DrawLink
            GrafcetSynchronousLink.UpFromSynchronous GrafcetTransition.AdjustLinks
            GrafcetTransition.CompileTrans GrafcetTransition.ComputeLabelRegion
            GrafcetTransition.ConstructPrintName GrafcetTransition.DeInstall GrafcetTransition.Document
            GrafcetTransition.Evaluate GrafcetTransition.GetDescription GrafcetTransition.GetPaletteIcon
            GrafcetTransition.Install GrafcetTransition.Link GrafcetTransition.Linkable?
            GrafcetTransition.LocateBrowsers GrafcetTransition.Moved GrafcetTransition.QualifiedPrintName
            GrafcetTransition.SetLabel GrafcetTransition.WhoUses)
        (FNS FID.FindFurthest FID.TransitionOrderFn FISAddAbbrevDelimiters GetCompositeFromWindow
            GetStepFromWindow)
        (EXPORT (GLOBALVARS FISAbbrevDelimiter LabelReadTbl))
        (VARS FISAbbrevDelimiter (LabelReadTbl (COPYREADTABLE NIL)))
        (P (PROGN (PUTPROP '& 'CLISPTYPE (GETPROP 'AND 'CLISPTYPE))
                  (PUTPROP '& 'LISPFN 'AND)
                  (PUTPROP '& 'BROADSCOPE T)
                  (PUTPROP 'AND 'CLISPINFIX '&)
                                                                                        Page 2
                  (PUTPROP '%| 'CLISPTYPE (GETPROP 'OR 'CLISPTYPE))
                  (PUTPROP '%| 'LISPFN 'OR)
                  (PUTPROP '%| 'BROADSCOPE T)
                  (PUTPROP 'OR 'CLISPINFIX '%|)
                  (ADDTOVAR CLISPCHARS & %|)
                  (SETQ CLISPCHARARRAY (MAKEBITTABLE CLISPCHARS)))

           ;; (SETSYNTAX (CHARCODE -) (QUOTE (MACRO (LAMBDA (FL RDTBL) (LIST (QUOTE NOT) (READ FL RDTBL))))) LabelReadTbl) Why was this here?  It
           ;; seems to screw things up.

           (SETSYNTAX (CHARCODE <)
                  '[MACRO (LAMBDA (FL RDTBL)
                                 'LT]
                  LabelReadTbl)
           (SETSYNTAX (CHARCODE >)
                  '[MACRO (LAMBDA (FL RDTBL)
                                 'GT]
                  LabelReadTbl))
        (COMS (INSTANCES AnyPreviousTransitionTemplate OtherwiseTransitionTemplate SimpleInitialMainTemplate
                     SimpleInOutMacroTemplate INStepTemplate OUTStepTemplate)
              (VARS GrafcetInitialStepPaletteBM GrafcetProcessStepPaletteBM (AnyPreviousTransitionTemplate
                                                                     #,($& GrafcetTransition (|DBVO.L2
[:.3J:| . 4)))
                    (OtherwiseTransitionTemplate #,($& GrafcetTransition (|DBVO.L2[:.3J:| . 5)))
                    (INStepTemplate #,($& GrafcetRegularStep (|FJXO.L2[:.X\=| . 28)))
                    (OUTStepTemplate #,($& GrafcetRegularStep (|FJXO.L2[:.X\=| . 29)))))
        (COMS                                                  ; support for arrows on grafcet links
              (VARS FISMinArrowDistance FISRightArrow FISDownArrow FISLeftArrow FISUpArrow (FISLeftIncr 8)
                    (FISRightIncr 10)
                    (FISUpIncr 20))
              (GLOBALVARS FISMinArrowDistance FISRightArrow FISLeftArrow FISDownArrow FISUpArrow FISLeftIncr
                     FISRightIncr FISUpIncr))
        (PROP FILETYPE FIDGRAFCET)))

(DECLARE%: DONTCOPY

(PUTPROPS FIDGRAFCET MAKEFILE-ENVIRONMENT (:PACKAGE "IL" :READTABLE "INTERLISP" :BASE 10))
)

(DEFCLASS FIDGrafcetNexus (MetaClass AbstractClass Edited%:    (* mcf%. "20-Oct-86 15:03")
                              doc "Abstract classes are placeholders in the inheritance network, which
                              cannot themselves be instantiated.")
       (Supers FIDGrafcetObject AbstractObject)
       (ClassVariables (DocumentationParts NIL doc "Parts of me that can be documented"))
       (InstanceVariables (successors NIL doc "List of transitions that follow this step")
              (predecessors NIL doc "List of transitions that precede this step")
              (macroStep #,($A superObject GetFromIV PutToIV) DontSave Any doc "The macro step (if any) to
                     which this step belongs")
              (labelRegion #,($A ComputeLabelRegion FFSendSelf ReplaceMe) DontSave Any doc "Place where label
                     is drawn")
              (abbreviation #,($A NIL FISAddAbbrevDelimiters NIL) doc "an abbreviated form of the label")
              (highlightPart NIL DontSave Any doc "Preserve part of object highlighted (e.g. Active Out) so
                     that reshaping a highlighted step will clear an redraw highlight appropriately")))

(DEFCLASS FIDGrafcetObject (MetaClass Class Edited%:         Edited 2 Aug-88 15.25 by mcf
                              doc "This is the default metaClass for all classes")
       (Supers FIDBoxObject)
       (ClassVariables (LineWidth 1)
              (PaletteIcon NIL doc "PaletteIcon for this step type, if it has one."))
       (InstanceVariables (linkType NIL doc "type of link")
              (scale #,($A (superObject progScale) GetIndirectThroughIV Noop) DontSave Any doc "Scale at
                     which this object is drawn")))

(DEFCLASS GrafcetAsynchronousLink (MetaClass Class Edited%:    (* mcf%. "10-Jul-85 04 14")
                                     doc "This is the default metaClass for all classes")
       (Supers GrafcetLink)
       (ClassVariables (IconDescription (LineDraw (((-1 . 0)
                                                    (1 . 0)))
                                         ConnectPoints
                                         (Top (-1 . 0)
                                              Bottom
                                              (1 . 0)))
                           doc "a list of lists of points which, when combined with a scale factor, will
                           draw the object around a specified center")
              (Prototype #,($& GrafcetAsynchronousLink (LIUO.1E+%:.@c1 . 78)) doc "Undocumented CV added by
                     FEBER")))
```

```
(DEFCLASS GrafcetInitialStep (MetaClass Class Edited%:        . Edited 5-Aug-88 10:11 by mcf
                                    doc "This is the default metaClass for all classes")
      (Supers GrafcetRegularStep)
      (ClassVariables (IconDescription (BoxDraw (((-1 -1 2 2)
                                                   -0.4)
                                                  (-1 -1 2 2))
                                                LineDraw
                                                (((0 . 2)
                                                  (0 . 1))
                                                 ((0 . -1)
                                                  (0 . -2)))
                                                ConnectPoints
                                                (Top (0 . 2)
                                                     Bottom
                                                     (0 . -2)))
                             doc "BoxDraw is a region descriptor, while LineDraw is a list of point to be
                             connected. When combined with a scale factor these descriptors will draw the
                             object around a specified center")
            (PaletteIcon #,($A (PROGN GrafcetInitialStepPaletteBM) EveryFetch NoUpdatePermitted))
            (Prototype #,($& GrafcetInitialStep (LIU0.1E+%:.@c1 . 79))))
      (InstanceVariables (stepType #,($A InitialStep FFCache ReplaceMe) DontSave Any doc "One of Regular,
                               Macro or Initial")))

(DEFCLASS GrafcetLink (MetaClass Class Edited%:        (* TAL " 4-Mar-86 22 52")
                             doc "This is the default metaClass for all classes")
      (Supers FIDGrafcetObject)
      (ClassVariables (PermissibleActionLst (Add Delete LinkType Move)))
      (InstanceVariables (drawPoints NIL doc "Points in grid on which a line has been drawn, stored in
                               source objects only")
            (linkSource NIL doc "source object of this link")
            (linkDestination NIL doc "destination object of this link")
            (superObject #,($A (linkSource superObject) GetIndirectThroughIV ReplaceMe) DontSave Any doc
                  "save space on file by indirecting through source")))

(DEFCLASS GrafcetMacroStep (MetaClass Class Edited%:        . Edited 2 Aug-88 15 58 by mcf
                                  doc "This is the default metaClass for all classes")
      (Supers GrafcetSplitStep)
      (ClassVariables (BrowseableSubParts (macroProgram))
            (CachedIVs #,($A (macroProgram macroProgramName) UnionSuperValue NoUpdatePermitted))
            (BackPointerIVs (macroProgram))
            (Prototype #,($& GrafcetMacroStep (|OHW0.L2[:.f1:| . 336))))
      (InstanceVariables (stepType #,($A Macro FFCache ReplaceMe) DontSave Any doc "One of Regular, Macro or
                               Initial")
            (macroProgram #,($A NIL EFLookupNamedObject NoUpdatePermitted) NamedByIV macroProgramName VR
                  #,($C GrafcetMacroProgram)
                  DontSave Any Editable T doc "Cached pointer to macro program named by our label")
            (macroProgramName #,($A ComputeMacroProgramName FFSendSelf NoUpdatePermitted) DontSave Any doc
                  "Is this the same as the label?")
            (printName #,($A label GetFromIV NoUpdatePermitted) DontSave Any)
            (inStep #,($A (macroProgram inStep) GetIndirectThroughIV NoUpdatePermitted) DontSave Any doc
                  "The IN step of this macro")
            (outStep #,($A (macroProgram outStep) GetIndirectThroughIV NoUpdatePermitted) DontSave Any doc
                  "The OUT step of this macro")
            (mainProgram #,($A (macroStep mainProgram) GetIndirectThroughIV NoUpdatePermitted) DontSave Any
                  doc "just point to parent's main program")
            (staticAnalysis NIL old #,($A (macroProgram staticAnalysis) GetIndirectThroughIV NIL) DontSave
                  Any)))

(DEFCLASS GrafcetProcessStep (MetaClass Class Edited%:        . Edited 5-Aug-88 10:15 by mcf
                                    doc "This is the default metaClass for all classes")
      (Supers GrafcetMacroStep)
      (ClassVariables (PaletteIcon #,($A (PROGN GrafcetProcessStepPaletteBM) EveryFetch NoUpdatePermitted))
            (Prototype #,($& GrafcetProcessStep (|JKW0.L2[:.e=0| . 1)))))

(DEFCLASS GrafcetRegularStep (MetaClass Class Edited%:        (* mcf%. "24-Nov-87 14:43")
                                    doc "This is the default metaClass for all classes")
      (Supers GrafcetStep)
      (ClassVariables (IconDescription (BoxDraw ((-1 -1 2 2))
                                                LineDraw
                                                (((0 . 2)
                                                  (0 . 1))
                                                 ((0 . -1)
                                                  (0 . -2)))
                                                ConnectPoints
                                                (Top (0 . 2)
                                                     Bottom
                                                     (0 . -2)))
                             doc "BoxDraw is a region descriptor, while LineDraw is a list of point to be
                             connected. When combined with a scale factor these descriptors will draw the
                             object around a specified center")
            (BrowseableSubParts (activation continuous deactivation))
            (BackPointerIVs (activation continuous deactivation))
```

```
                (CachedIVs #.($A (activation continuous deactivation) UnionSuperValue NoUpdatePermitted))
                (Prototype #.($& GrafcetRegularStep (LOUO.1E+%:.dk6 . 17)))
                (DocumentationParts (activation continuous deactivation)))
        (InstanceVariables (stepType #.($A Regular FFCache ReplaceMe) DontSave Any doc "One of Regular, Macro
                        or Initial")
                (activation #.($A NIL FFLookupNamedObject NoUpdatePermitted) NamedByIV activationName Editable
                        T VR #.($C NonGrafcetProgram) DontSave Any ZoomName "activation" doc "Definition of the
                        activation part of this step.")
                (continuous #.($A NIL FFLookupNamedObject NoUpdatePermitted) NamedByIV continuousName Editable
                        T VR #.($C NonGrafcetProgram) DontSave Any ZoomName "continuous" doc "Definition of the
                        continuous part of this step.")
                (deactivation #.($A NIL FFLookupNamedObject NoUpdatePermitted) NamedByIV deactivationName
                        Editable T VR #.($C NonGrafcetProgram) DontSave Any ZoomName "deactivation" doc
                        "Definition of the deactivation part of this step.")
                (activationName #.($A ComputeStepProgName AVSendSelf NoUpdatePermitted) DontSave Any)
                (continuousName #.($A ComputeStepProgName AVSendSelf NoUpdatePermitted) DontSave Any)
                (deactivationName #.($A ComputeStepProgName AVSendSelf NoUpdatePermitted) DontSave Any)))

(DEFCLASS GrafcetRemoteLink (MetaClass Class Edited%:        (* mcf%. "17-Oct-86 13:23")
                                doc "This is the default metaClass for all classes")
        (Supers GrafcetLink))

(DEFCLASS GrafcetSplitStep (MetaClass AbstractClass Edited%:   Edited 2-Aug-88 15:58 by mcf
                                )
        (Supers GrafcetStep)
        (ClassVariables (IconDescription (BoxDraw ((-1 -1 2 1)
                                                   (-1 0 2 1))
                                          LineDraw
                                          (((0 . 1)
                                            (0 . 2))
                                           ((0 . -1)
                                            (0 . -2)))
                                          ConnectPoints
                                          (Top (0 . 2)
                                               Bottom
                                               (0 . -2)))
                        doc "BoxDraw is a region descriptor, while LineDraw is a list of point to be
                        connected. When combined with a scale factor these descriptors will draw the
                        object around a specified center")))

(DEFCLASS GrafcetStep (MetaClass AbstractClass Edited%:      (* mcf%: " 2-Feb-88 18:58")
                        doc "Abstract classes are placeholders in the inheritance network, which cannot
                        themselves be instantiated.")
        (Supers FIDGrafcetNexus)
        (ClassVariables (CachedIVs #.($A (staticAnalysis) UnionSuperValue NoUpdatePermitted))
                (PermissibleActionLst (Move Add Delete Label Link Number Rename Transfer Copy Comment))
                (AnalysisCallerClass #.($C AnalysisRefStepProg)))
        (InstanceVariables (stepType NIL doc "One of Regular, Macro or Initial")
                (stepNumber NIL doc "Number of this step, or IN or OUT")
                (printName #.($A ComputePrintName AVSendSelf NoUpdatePermitted) DontSave Any)
                (successors NIL VR #.($C GrafcetTransition))
                (predecessors NIL VR #.($C GrafcetTransition))
                (stepNumberRegion #.($A ComputeStepNumberRegion FFSendSelf ReplaceMe) DontSave Any doc
                        "Place where step number is drawn")
                (staticAnalysis #.($A ComputeStaticAnalysis FFSendSelf ReplaceMe) DontSave Any)
                (firstTrueFlg #.($A NIL FFCache ReplaceMe))))

(DEFCLASS GrafcetSynchronousLink (MetaClass Class Edited%:    (* mcf " 3-Sep-85 12:21")
                                        doc "This is the default metaClass for all classes")
        (Supers GrafcetLink)
        (ClassVariables (IconDescription (LineDraw (((-1 . 0.3)
                                                     (1 . 0.3))
                                                    ((-1 . -0.3)
                                                     (1 . -0.3)))
                                          ConnectPoints
                                          (Top (0 . 0.3)
                                               Bottom
                                               (0 . -0.3)))
                        doc "a list of lists of points which, when combined with a scale factor, will
                        draw the object around a specified center")
                (Prototype #.($& GrafcetSynchronousLink (LIUO.1E+%:.@c1 . 82)) doc "Undocumented CV added by
                        FEBER")))
```

```
(DEFCLASS GrafcetTransition (MetaClass Class Edited%:        (* mcf "12-Jan-88 17:42")
                                doc "This is the default metaClass for all classes")
        (Supers FIDGrafcetNexus)
        (ClassVariables (IconDescription (LineDraw (((0 . 1)
                                                     (0 . -1))
                                                    ((-0.5 . 0)
                                                     (0.5 . 0)))
                                          ConnectPoints
                                          (Top (0 . 1)
                                               Bottom
                                               (0 . -1)))
                        doc "a list of lists of points which, when combined with a scale factor, will
                        draw the object around a specified center")
                (PermissibleActionLst (Move Add Abbreviate Delete Label Link Transfer Copy Comment))
                (Prototype #.($& GrafcetTransition (|S+W0.L2[:.EaD| . 1)) doc "Undocumented CV added by FEBER")
                (SummaryFields (abbreviation label))
                (DisplayFields (label abbreviation))
                (AnalysisCallerClass #.($C AnalysisRefTrans)))
```

```
(InstanceVariables (successors NIL VR #.($C GrafcetStep))
        (predecessors NIL VR #.($C GrafcetStep))
        (definition NIL DontSave Any doc "Boolean expr compiled from label")
        (tKey NIL doc "SELECTQ key for this transition in the composite function")
        (staticAnalysis NIL DontSave Any)
        (printName #.($A ConstructPrintName FFSendSelf ReplaceMe) DontSave Any)))

(\BatchMethodDefs)

(Method ((FIDGrafcetNexus ClearLinkCache) self)        . mcf: 25-Jul-85 21 48
   "Clear cache on links"
   (for link in (@ self %:linkType) do (_@ link drawPoints NIL))
   [for pred in (@ self %:predecessors) do (for link in (@ pred %:linkType)
                                                 do (_@ link drawPoints NIL)
                                                 when (EQ self (@ link %:linkDestination))])

(Method ((FIDGrafcetNexus ClearRegions) self)        . mcf: 20-Oct-86 09.57
   "Specialization"
   (_Super self ClearRegions)
   (_@ self %:labelRegion NotSetValue))

(Method ((FIDGrafcetNexus ComputeLabelRegion) self)
                                                   . mcf: 20-Oct-86 09:59
   "New method template"
   (LET (label stregion)
     (COND
       ((SETQ label (OR (@ self %:abbreviation)
                        (@ self %:label)))
        (SETQ stregion (STRINGREGION label (@ self !:superObject:displayStream!)))
        (change (fetch LEFT of stregion)
                (IPLUS (fetch (REGION PRIGHT) of (@ %:highlightRegion))
                       (@ !::WholeShapeBorder!)))
        (change (fetch BOTTOM of stregion)
                (fetch (POSITION YCOORD) of (@ %:center)))
        stregion))))

(Method ((FIDGrafcetNexus DeAdjustLinks) self stream scale source dest)
                                                   . mcf: 5-Dec-86 16:39
   "Change any synchronous links who should now be asynchronous as a result of link deletion"
   [LET (preds link links newlink)
     (COND
       [source (COND
                 ((AND (EQ (LENGTH (SETQ link (@ source %:linkType)))
                           1)
                       (_ (SETQ link (CAR link))
                          InstOf
                          'GrafcetSynchronousLink)
                       (OR (EQ 1 (LENGTH (@ link !:linkDestination:predecessors!)))
                           (EQ (LENGTH (for p in (@ link !:linkDestination:predecessors!)
                                          join (for ls in (@ p %:linkType)
                                                  when (AND (EQ (@ ls %:linkDestination)
                                                                (@ link %:linkDestination))
                                                            (_ ls InstOf 'GrafcetSynchronousLink))
                                                  collect ls)))
                               1)))
                  (_ link DrawLink stream scale 'ERASE)
                  (RPLACA (@ source %:linkType)
                          (SETQ newlink (_ ($ GrafcetAsynchronousLink)
                                           New)))
                  (_@ newlink %:linkSource (@ link %:linkSource))
```

Page 6

```
                  (_@ newlink %:linkDestination (@ link %:linkDestination))
                  (_ link Destroy)
                  (_ newlink DrawLink stream scale)]
       (dest (COND
               ([EQ 1 (LENGTH (SETQ preds (@ dest %:predecessors)]
                (SETQ preds (CAR preds))
                (SETQ links (@ preds %:linkType))     (* (COND ((EQ 1 (LENGTH (for ls in links when
                                                      (AND (_ ls InstOf (QUOTE GrafcetSynchronousLink))
                                                      (EQ dest (@ ls %.linkDestination))) collect ls)))
                                                      (for ls on links when (AND (SETQ link
                                                      (CAR ls)) (AND (_ link InstOf (QUOTE GrafcetSynchronousLink))
                                                      (EQ dest (@ link %.linkDestination)))) do
                                                      (_ link DrawLink stream scale (QUOTE ERASE))
                                                      (RPLACA ls (SETQ newlink (_ ($ GrafcetAsynchronousLink) New)))
                                                      (_@ newlink %:linkSource (@ link %.linkSource))
                                                      (_@ newlink %:linkDestination (@ link %.linkDestination))
                                                      (_ link Destroy) (_ newlink DrawLink stream scale)))))
                (COND
                  ([SETQ link (for l in links thereis (AND (_ l InstOf 'GrafcetSynchronousLink)
                                                           (EQ (@ l %:linkDestination)
                                                               dest]
                   (COND
                     ([for l in links never (AND (NEQ l link)
                                                 (_ l InstOf 'GrafcetSynchronousLink)
                                                 (OR (_ preds InstOf 'GrafcetTransition)
                                                     (EQ (@ l %:linkDestination)
                                                         dest]
                      (_ link DrawLink stream scale 'ERASE)
                      (RPLACA (FMEMB link links)
                              (SETQ newlink (_ ($ GrafcetAsynchronousLink)
                                               New)))
```

```
            (_@ newlink %:linkSource (@ link %:linkSource))
            (_@ newlink %:linkDestination (@ link %:linkDestination))
            (_ link Destroy)
            (_ newlink DrawLink stream scale)])
```

(Method ((FIDGrafcetNexus Document) self File Index)
mct 25-Nov-86 15 18

```
   "New method template"
   (for partiv in (@ |::DocumentationParts|) do (_ self DocumentPart File partiv Index)))
```

(Method ((FIDGrafcetNexus DocumentPart) self File PartIV Index)
mct: 25-Nov-86 15 21

```
   "New method template"
   self)
```

(Method ((FIDGrafcetNexus GetAccessList) self access)
TAL 18-Nov-87 12 06

```
   "New method template"
   [LET ((anal (@ %:staticAnalysis)))
     (for x inside access funion (CDR (FASSOC x anal])
```

(Method ((FIDGrafcetNexus GetDescription) self) mct 27-Oct-87 17 04

```
   "New method template"
   self)
```

(Method ((FIDGrafcetNexus GetName) self) mct 2-Dec-85 14 01

```
   "New method template"
   (@ %:label))
```

(Method ((FIDGrafcetNexus HasContents?) self) mct 11-Jan-88 17 31

```
   "Default to no contents"
   NIL)
```

Page 7

(Method ((FIDGrafcetNexus Highlight) self Stream Mode Shade Region)
mct: 28-Mar-88 15:19

```
   "Specialization If region is Run or Active any previous highlight is removed before highlighting with the
   appropriate region"
   [PROG (on? parts type (hRegions (@ self %:highlightRegions))
              (region Region)
              (mode Mode))
         [COND
           ((AND region (ATOM region))
            (SETQ type region)
            (COND
               ((SETQ region (_ self GetHighlightRegion type hRegions))
                (SELECTQ type
                     ((Run RunActive Active Out)
                          (COND
                             ((SETQ on? (@ self %:highlightOn?))
                              (AND (EQ region on?)
                                   (EQ Shade (@ %:highlightShade))
                                   (RETURN))
                              (_Super self Highlight Stream 'Off)
                              (_@ self %:highlightPart NIL))))
                     NIL))
              (T (SETQ type NIL)
                 (SETQ region NIL)
                 (_@ self %:highlightPart NIL)]

         (* The following is used when reshaping an object with a highlight; the old highlight is removed with repaint, and then redrawn with
         repaint after the new region is computed)

         (COND
           ([SELECTQ mode
                (Repaint (AND (@ self %:highlightOn?)
                              (SETQ parts (@ self %:highlightPart))))
                (Off (COND
                         (type (COND
                                 ((FMEMB type (@ self %:highlightPart))
                                  (change (@ self %:highlightPart)
                                          (DREMOVE type DATUM)))
                                 (T (RETURN)))
                               NIL)
                         ((SETQ parts (@ self %:highlightPart))
                          (_@ self %:highlightPart NIL)
                          T)
                         (T (RETURN))))
                (COND
                   ((AND type (FMEMB type (@ %:highlightPart)))
                    (RETURN))
                   (T (AND type (push (@ %:highlightPart)
                                      type))
                      (_@ self %:highlightOn? NIL)]
            (for part in parts do (_@ self %:highlightOn? (OR (_ self GetHighlightRegion part hRegions)
                                                              (@ self %:highlightRegion)))
                                  (_Super self Highlight Stream mode Shade region))
            (RETURN)))
         (_Super self Highlight Stream mode Shade region)
         (for part in (@ self %:highlightPart) do (_@ self %:highlightOn? (_ self GetHighlightRegion part
                                                                              hRegions))])
```

```
(Method ((FIDGrafcetNexus InProgram?) self program)        TAL 1-Sep-86 22 22
  "True if self is part of the specified program"
  [OR (EQ self program)
      (LET ((sup (@ %:superObject)))
        (AND sup (_ sup InProgram? program)]))

(Method ((FIDGrafcetNexus Kill) self)                       mcf: 20 Aug-87 15 12
  "Specialization"
  (for l in (@ %:linkType) when (ObjectExists? l) do (_ l Kill))
  (_Super self Kill))

(Method ((FIDGrafcetNexus Kill!) self)                      mcf 27 Oct 87 12 07
  "New method template"
  (_ self SendToParts NIL 'Kill))
```

Page 8

```
(Method ((FIDGrafcetNexus Linkable?) self stream scale dest)
                                                            mcf: 17-Oct-86 14.04
  "Return error message on failure"
  (LET (vr)                        (* (AND (NOT (FMEMB dest (@ %.successors)))
                                   (COND ((AND (SETQ vr (@ l.successors:.VRI))
                                   (NEQ vr NotSetValue)) (_ dest InstOf! vr))
                                   (T T))))

    (COND
      ((FMEMB dest (@ %:successors))
       "ERROR: Objects already linked")
      ((AND (SETQ vr (@ l:successors:.VRI))
            (NEQ vr NotSetValue)
            (_ dest InstOf! vr))
       NIL)
      (T "ERROR: Objects not Linkable"))))

(Method ((FIDGrafcetNexus Moved) self)                      mcf: 25-Jul-85 21.26
                                                            Specialization
  "Clear cache on links"
  (_ self ClearLinkCache)
  (_Super self Moved))

(Method ((FIDGrafcetNexus NameConflict?) self Name SuperObj CopyFlg)
                                                            mcf: 21-Oct-87 11.01
  "New method template"
  NIL)

(Method ((FIDGrafcetNexus Rename) self QualName ProgName StepName)
                                                            Edited 2-Sep-88 14 31 by mcf
                                                            mcf: 13-Oct-87 11 13
                                                            New method template
  "SetLabel will return a string error message if step cannot be renamed"
  [LET (temp)
    (AND StepName (_ self SetLabel! StepName (AND (SETQ temp (@ self superObject))
                                                  (SETQ temp (_ temp FindBrowser))
                                                  (@ temp window)))])

(Method ((FIDGrafcetNexus Rename!) self NewName QualName ProgName)
                                                            mcf: 6-Oct-87 10:22
  "New method template"
  (COND
    ((OR QualName NewName)
     (_ self SendToParts NIL 'Rename QualName ProgName NewName)))
  NIL)

(Method ((FIDGrafcetNexus SWIVSource) self NewObjAList)
                                                            mcf 28 Sep-87 15 36
  "Specialization"
  (LET (source)
    (SETQ source (_Super self SWIVSource NewObjAList))
    (COND
      ((FASSOC (@ self %:superObject)
               NewObjAList)
       source)
      (T (for x in '(superObject linkType successors predecessors) do (DREMOVE (FASSOC x source)
                                                                                source))
         source))))

(Method ((FIDGrafcetNexus SetAbbreviation) self Abbrev Stream)
                                                            mcf: 20-Oct-86 13 02
  "New method template"
  (_@ self %:abbreviation Abbrev)
  (_ self EraseLabel Stream)
  (AND Stream (_ self DrawLabel Stream))
  NIL)
```

```
(Method ((FIDGrafcetNexus SetLabel1) self Label Stream)
                                                    mcf: 13-Oct-87 10 58

;; Caller expects NIL returned when successful

   "Label used to be passed as a list"
   (LET [(label (COND
                  ((LISTP Label)
                   (SUBSTRING Label 2 -2))
                  (T Label]
     (_ self EraseLabel Stream)
     (_@ self %:label label)
     (AND Stream (_ self DrawLabel Stream))
     NIL))

(Method ((FIDGrafcetNexus Transferable?) self Destination)
                                                    mcf: 2-Feb-88 18.53
   "New method template"
   (LET ((label (@ %:label)))
     (COND
        (label (NOT (_ self NameConflict? (@ %:label)
                                Destination)))
        (T))))

(Method ((FIDGrafcetNexus UsesContextApplicable?) self)
                                                    Edited 12-Sep-88 20 19 by mcf
   "Should a vars used context apply to me?"
   (LET [(tmp (ObjectExists? (@ self superObject)]
     (AND tmp (SETQ tmp (ObjectExists? (@ tmp mainProgram)))
          (_ tmp UsesContextApplicable?))))

(Method ((FIDGrafcetNexus WhoUses) self item access)
                                                    TAL 29-Nov-87 18:45
   "New method template"
   NIL)

(Method ((FIDGrafcetObject ClearRegions) self)     mcf: 20-Oct-86 09:57
   "Clear regions associated with the object"
   (_@ self %:region NotSetValue)
   (_@ self %:highlightRegion NotSetValue)
   (_@ self %:highlightRegions NotSetValue))

(Method ((FIDGrafcetObject Compile) self)          TAL 7-Jul-86 04:56
   "Compile does nothing by default"
   self)

(Method ((FIDGrafcetObject DeLink) self LinkSwitch stream scale)
                                                    mcf: 14-Jan-86 18:21
   "unlink the object"
   (LET ((ls (OR LinkSwitch 'Both))
         preds dests)
    (SELECTQ ls
        ((Source Both)
             (for pred in (SETQ preds (@ self %:predecessors))
                do (change (@ pred %:successors)
                           (DREMOVE self DATUM))
                   (for linkTail on (@ pred %:linkType) when (EQ self (@ (CAR linkTail)
                                                                      %:linkDestination))
                      do (RPLACA linkTail NIL) finally (change (@ pred %:linkType)
                                                               (DREMOVE NIL DATUM)))
                                                    (* new version gets all links to us, should there be any by mistake)
                   )
             (_@ self %:predecessors NIL)
             (for pred in preds do (_ self DeAdjustLinks stream scale pred)
                                   (_ pred Erase stream)
                                   (_ pred Draw stream)))
        NIL)
    (SELECTQ ls
        ((Dest Both)
             (for succ in (SETQ dests (@ self %:successors)) do (change (@ succ %:predecessors)
                                                                      (DREMOVE self DATUM)))
             (for succ in dests do (_ self DeAdjustLinks stream scale NIL succ)
                                   (_ succ Erase stream)
                                   (_ succ Draw stream))
             (_@ self %:successors NIL)
             (_@ self %:linkType NIL))
```

```
        NIL)))

(Method ((FIDGrafcetObject Draw) self stream Xform Mode)
                                                    mcf: 5-Nov-86 15.54
   "Draw a picture of myself"
   [LET [center scale (mode (OR Mode 'REPLACE))
             (xform (OR Xform (create FIDXform]
```

```
[SETQ scale (OR (fetch (FIDXform Scale) of xform)
                (replace (FIDXform Scale) of xform with (@ |:superObject:progScale|))]
(SETQ center (_Super self Draw stream xform mode))
(for links in (@ %:linkType) do (_ links DrawLink stream scale))
(_ self DrawLabel stream)
(AND (@ %:highlightOn?)
     (_ self Highlight stream 'Repaint)])

(Method ((FIDGrafcetObject DrawConnection) self stream points mode hackFlg)
                                                        TAL 22-Apr-86 12:57
  "Draw a (possibly) segmented line using a list of points"
  (for pos bind p1 (width _ (@ |::LineWidth|)) in (CDR points) first (SETQ p1 (CAR points))
     do (_ self DrawLine stream p1 pos (COND
                                         ((AND hackFlg (EQ (fetch YCOORD of p1)
                                                           (fetch YCOORD of pos)))
                                          (TIMES 3 width))
                                         (T width))
               mode)
        (SETQ p1 pos)))

(Method ((FIDGrafcetObject DrawLabel) self Stream)    Edited 31-Aug-88 14 40 by mct
                                                      mct: 20-Oct-86 12.55
  "Print the comment"
  [LET [(label (OR (@ self abbreviation)
                   (@ self label))]
    (COND
       ((AND label (NOT (@ self |:superObject:quietFlg|)))
        (_ self DrawText Stream label (@ labelRegion))])

(Method ((FIDGrafcetObject Erase) self stream)         mct 2-Sep-85 18:17
  "Remove my picture from the display"
  (_Super self Erase stream)
  (_ self EraseLabel stream))

(Method ((FIDGrafcetObject EraseLabel) self Stream)   Edited 31-Aug-88 14 36 by mct
                                                      mct: 17-Dec-86 11 13
  "New method template"
  (LET ((region (@ self labelRegion)))
    (AND region Stream (DSPFILL region NIL NIL Stream))
    (_@ self labelRegion NotSetValue)))

(Method ((FIDGrafcetObject ExtendExtent) self extent)
                                                      mct 3-Sep-85 12.44
  "Specialization"
  [COND
     ((@ %:highlightRegion)
      (EXTENDREGION extent (@ %:highlightRegion)]
  [AND (NOT (@ |:superObject:quietFlg|))
       (COND
          ((@ %:labelRegion)
           (EXTENDREGION extent (@ %:labelRegion)]
  (for link in (@ %:linkType) do (_ link ExtendExtent extent))
  extent)

(Method ((FIDGrafcetObject FindSpaceManually) self Stream region)
                                                      mct: 13-Aug-85 20.24
  "Specialization"
  (_ self GridJustify (_Super self FindSpaceManually Stream region)
         (@ |:superObject:progScale|)))
```

```
(Method ((FIDGrafcetObject GetCenterFromBottom) self aregion scale)
                                                      mct: 15-Jan-86 13:21
  "Given a position, get a position that would draw the object appropriately with its bottom connection on
  the position"
  [LET [(bottom (LISTGET (LISTGET (@ self |::IconDescription|)
                                  'ConnectPoints)
                         'Bottom))
        (scale (OR scale (@ |:superObject:progScale|)))
        (rcenter (COND
                   ((REGIONP aregion)
                    (FID.ComputeCenter aregion))
                   (aregion]
    (create POSITION
           XCOORD _ (IPLUS (fetch (POSITION XCOORD) of rcenter)
                           (TIMES scale (fetch (POSITION XCOORD) of bottom)))
           YCOORD _ (IDIFFERENCE (fetch (POSITION YCOORD) of rcenter)
                           (TIMES scale (fetch (POSITION YCOORD) of bottom])

(Method ((FIDGrafcetObject GetCenterFromTop) self aregion scale)
                                                      mct: 15-Jan-86 13.21
  "Given a position, get a position that would draw the object appropriately with its top connection on the
  position"
  [LET ((top (LISTGET (LISTGET (@ self |::IconDescription|)
                               'ConnectPoints)
                      'Top))
        (scale (OR scale (@ |:superObject:progScale|)))
        (rcenter (FID.ComputeCenter aregion)))
```

```
(create POSITION
        XCOORD _ (IDIFFERENCE (fetch (POSITION XCOORD) of rcenter)
                       (TIMES scale (fetch (POSITION XCOORD) of top)))
        YCOORD _ (IDIFFERENCE (fetch (POSITION YCOORD) of rcenter)
                       (TIMES scale (fetch (POSITION YCOORD) of top])
```

```
(Method ((FIDGrafcetObject GetConnectPoint) self direction scale center)
                                              . mcf: 13-Aug-85 20 24
                                              . Retrieve a valid position for a connection from an installed object
                                              . given a direction
  (LET [(relpos (LISTGET (LISTGET (@ self |::IconDescription|)
                                   'ConnectPoints)
                  direction))
        (center (OR center (@ self %:center)))
        (scale (OR scale (@ |:superObject:progScale|)]
    (FID.ScaleUp relpos scale center)))
```

```
(Method ((FIDGrafcetObject GetGrid) self)          . mcf: 17-Jan-86 17 10
  "Retrieve the grid for this display"
  [LET (grid)
    (COND
      ((SETQ grid (@ self |:superObject:displayEditor|))
       (@ grid %:gridSpec)])
```

```
(Method ((FIDGrafcetObject GetNamedParts) self PartLst PartType)
                                              . mcf: 24-Sep-87 14 05
  "New method template"
  NIL)
```

```
(Method ((FIDGrafcetObject GetPaletteIcon) self) "Make an icon bitmap for the object"
  (OR (@ self PaletteIcon)
      (_Super self GetPaletteIcon)))
```

```
(Method ((FIDGrafcetObject GetShape) self mode scale BoxRegs BoxOnlyFlg)
                                              . mcf: 25-Aug-86 09 41
  "Specialization"
  (_Super self GetShape mode (OR scale (@ |:superObject:progScale|))
          BoxRegs BoxOnlyFlg))
```

Page 12

```
(Method ((FIDGrafcetObject GetWidth) self mode scale)
                                              . mcf: 13-Aug-85 20:27
  "Get actual width of object"
  [fetch (REGION WIDTH) of (fetch (FIDShape Region) of (_ self GetShape NIL (OR scale (@
                                                              |:superObject:progScale|
)))])
```

```
(Method ((FIDGrafcetObject GridJustify) self place scale direction)
                                              . mcf: 17-Jan-86 17 10
  "justify a region or a position within the grid"
  [LET (X Y pos grid halfgrid)

        (* For now the grid resides in the editor. This may not be correct, but only this method and the Browser s GridJustify method would
        need to be changed)

    (SETQ grid (OR (_ self GetGrid)
                   scale))
    (SETQ halfgrid (SUB1 (LRSH grid 1)))
    [COND
      ((COND
          ((REGIONP place)
           (SETQ pos (FID.ComputeCenter place)))
          ((POSITIONP place)
           (SETQ pos place)))
       [SETQ X (IPLUS (SETQ X (fetch XCOORD of pos))
                      (COND
                        ((MINUSP X)
                         (IMINUS halfgrid))
                        (halfgrid]
       (SETQ Y (IPLUS (SETQ Y (fetch YCOORD of pos))
                      (COND
                        (direction (SELECTQ direction
                                     (Bottom (IMINUS halfgrid))
                                     (Top (SUB1 grid))
                                     0))
                        ((MINUSP Y)
                         (IMINUS halfgrid))
                        (halfgrid]
    (COND
      ((REGIONP place)
       (create REGION
              LEFT _ (IDIFFERENCE (ITIMES (IQUOTIENT X grid)
                                          grid)
                        (LRSH (fetch (REGION WIDTH) of place)
                              1))
              BOTTOM _ (IDIFFERENCE (ITIMES (IQUOTIENT Y grid)
                                            grid)
                          (LRSH (fetch (REGION HEIGHT) of place)
                                1))
```

```
        WIDTH _ (fetch (REGION WIDTH) of place)
        HEIGHT _ (fetch (REGION HEIGHT) of place)))
   ((POSITIONP place)
    (create POSITION
        XCOORD _ (ITIMES (IQUOTIENT X grid)
                         grid)
        YCOORD _ (ITIMES (IQUOTIENT Y grid)
                         grid)))
   ((NUMBERP place)                          (* (IPLUS place (IDIFFERENCE (LRSH scale 1)
                                             (IREMAINDER (COND ((MINUSP place)
                                             (SETQ place (IDIFFERENCE scale place)))
                                             (place)) scale))))

    (ITIMES grid (IQUOTIENT [COND
                              ((MINUSP place)
                               (IDIFFERENCE place (LRSH grid 1)))
                              (T (IPLUS place (LRSH grid 1]
                 grid])
```

```
(Method ((FIDGrafcetObject MainProgram) self)          TAL 2-Dec-87 18 08
  "New method template"
  (_ (@ %:superObject)
    MainProgram))
```

```
(Method ((FIDGrafcetObject NameQualifier) self)        Edited 5 Sep-88 15.34 by mcf
                                                       mcf: 23-Sep 87 12 18
  "New method template"
  (LET [(sup (ObjectExists? (@ self superObject)]
    (AND sup (_ sup NameQualifier))))
```

Page 13

```
(Method ((FIDGrafcetObject PrintNameQualifier) self)
                                                       Edited 5-Sep-88 15.34 by mcf
  "Method documentation"
  (LET [(sup (ObjectExists? (@ self superObject)]
    (AND sup (_ sup PrintNameQualifier))))
```

```
(Method ((FIDGrafcetObject RegionIntersectP) self region)
                                                       ; mcf 3-Sep-85 13:17
  "New method template"
  [OR (REGIONSINTERSECTP (@ %:region)
             region)
      (LET ((reg (@ %:labelRegion)))
        (AND reg (REGIONSINTERSECTP reg region])
```

```
(Method ((FIDGrafcetObject SWCopyMade) self XLations)
                                                       ; mcf: 15-Oct-87 13:39
  "Specialization"
  self)
```

```
(Method ((FIDGrafcetObject SpaceP) self region)        ; W.Mark 30-Aug-85 13:47
  "Temporary replacement"
  [LET* ((incr (LRSH (@ |:superObject:progScale|)
                     2))
         (treg (create REGION
                  BOTTOM _ (IPLUS (fetch BOTTOM of region)
                                  incr)
                  HEIGHT _ (IDIFFERENCE (fetch HEIGHT of region)
                                        (LLSH incr 1))
                  using region)))
    (for node bind reg in (@ |:superObject:subObjects|) never (AND (NEQ self node)
                                                                   (REGIONP (SETQ reg (@ node %:region)))
                                                                   (REGIONSINTERSECTP reg treg])
```

```
(Method ((GrafcetAsynchronousLink DetermineDrawPoints) self source dest spoint dpoint)
                                                       ; mcf: 13-Aug-85 20:22
  "Determine and return points for indirect links"
  [LET (furthest (scale (@ |:superObject:progScale|)))
    (COND
      ((SETQ furthest (FID.FindFurthest source dest spoint dpoint (APPEND (@ source |:superObject:steps|)
                                                                          (@ source
                                                                             |:superObject:transitions|
))
                                        scale))
       (SETQ furthest (_ self GridJustify furthest scale))
       (LIST spoint (create POSITION
                       XCOORD _ furthest
                       YCOORD _ (fetch YCOORD of spoint))
             (create POSITION
                XCOORD _ furthest
                YCOORD _ (fetch YCOORD of dpoint))
             dpoint))
      (T (LIST spoint [COND
                        ((_ source InstOf! 'GrafcetTransition)
                         (create POSITION
                            XCOORD _ (fetch XCOORD of spoint)
                            YCOORD _ (fetch YCOORD of dpoint)))
                        (T (create POSITION
                              XCOORD _ (fetch XCOORD of dpoint)
                              YCOORD _ (fetch YCOORD of spoint]
             dpoint])
```

```
(Method ((GrafcetAsynchronousLink DrawLink) self stream scale mode)
                                                    mcf: 25-Nov-86 18.47
   "draw a connection between source and dest which have already been linked"
   [LET [(source (@ self %:linkSource))
         dest spoint sgridpoint dpoint dgridpoint (dir 'Bottom)
         (pts (@ self %:drawPoints))
         (scale (OR scale (@ |:superObject:progScale|))]
     [COND
        ((NOT pts)
         (SETQ dest (@ self %:linkDestination))
         (SETQ spoint (_ source GetConnectPoint dir))
         [COND
            ([NOT (EQUAL spoint (SETQ sgridpoint (_ self GridJustify spoint scale)]
             (COND
                ((IGREATERP (fetch YCOORD of sgridpoint)
                            (fetch YCOORD of spoint))
```

```
                 (SETQ sgridpoint (_ self GridJustify spoint scale dir)]
         [COND
            ([NOT (AND (_ source InstOf! 'GrafcetTransition)
                       (_ dest InstOf! 'GrafcetTransition)]
             (SETQ dir 'Top]
         (SETQ dpoint (_ dest GetConnectPoint dir))
         [COND
            ([NOT (EQUAL dpoint (SETQ dgridpoint (_ self GridJustify dpoint scale)]
             (COND
                ((SELECTQ dir
                      (Top (IGREATERP (fetch YCOORD of dpoint)
                                      (fetch YCOORD of dgridpoint)))
                      (Bottom (IGREATERP (fetch YCOORD of dgridpoint)
                                         (fetch YCOORD of dpoint)))
                      T)
                 (SETQ dgridpoint (_ self GridJustify dpoint scale dir)]
         [SETQ pts (COND
                      ((EQUAL spoint dpoint)
                       (LIST spoint dpoint))
                      ((AND (EQUAL (fetch (POSITION XCOORD) of spoint)
                                   (fetch (POSITION XCOORD) of dpoint))
                            (AND (GREATERP (fetch YCOORD of dpoint)
                                           (fetch YCOORD of spoint))
                                 (GREATERP (IDIFFERENCE (fetch YCOORD of dpoint)
                                                        (fetch YCOORD of spoint))
                                           scale)))
                       (_ self UpConnectionPoints source dest sgridpoint dgridpoint scale stream))
                      ((EQUAL (fetch (POSITION YCOORD) of spoint)
                              (fetch (POSITION YCOORD) of dpoint))
                       (LIST sgridpoint dgridpoint))
                      ((EQUAL (fetch (POSITION XCOORD) of spoint)
                              (fetch (POSITION XCOORD) of dpoint))
                       (LIST spoint dpoint))
                      ([IGREATERP (OR (_ self GetGrid)
                                      scale)
                                  (ABS (IDIFFERENCE (fetch YCOORD of spoint)
                                                    (fetch YCOORD of dpoint]
                       (_ self DetermineDrawPoints source dest spoint dpoint))
                      (T (_ self DetermineDrawPoints source dest sgridpoint dgridpoint)]
         (SETQ pts (NCONC1 (CONS spoint pts)
                           dpoint))
         (_@ self drawPoints (SETQ pts (LIST (INTERSECTION pts pts))))]
     (_ self DrawConnection stream (CAR pts)
          mode
          (AND (_ source InstOf! 'GrafcetStep)
               (@ source %:firstTrueFlg)))])

(Method ((GrafcetInitialStep Transferable?) self Destination)
                                                    mcf: 15-Feb-88 14 36
   "Specialization"
   (AND (_Super self Transferable? Destination)
        (_ Destination InstOf! 'GrafcetMainProgram)))

(Method ((GrafcetLink DrawConnection) self stream points mode hackFlg SyncFlg)
                                                    mcf: 4-Nov-86 15 56
   "Specialization"
   (_Super self DrawConnection stream points mode hackFlg)
   [AND (NOT SyncFlg)
        (IGREATERP (LENGTH points)
              1)
        (LET (lft btm wdth hgt x1 x2 y1 y2 arrow offset minD (font (DSPFONT NIL stream))
                  (dScale (DSPSCALE NIL stream))
                  (mde mode))
          (SETQ minD (FIXR (TIMES dScale FISMinArrowDistance)))
          (AND (NEQ mde 'ERASE)
               (SETQ mde 'PAINT))
          (SETQ offset (PLUS 2 (LRSH minD 2)))
          (SETQ wdth (BITMAPWIDTH FISUpArrow))
          (SETQ hgt (BITMAPHEIGHT FISUpArrow))
          (bind pt1 for pt2 in (CDR points) first (SETQ pt1 (CAR points))
             do [COND
                   ([COND
                       [(NEQ (SETQ x1 (fetch XCOORD of pt1))
                             (SETQ x2 (fetch XCOORD of pt2)))
                        (COND
```

```
                 ((IGREATERP (ABS (IDIFFERENCE x1 x2))
                        minD)
                  (SETQ y1 (fetch YCOORD of pt1))
                  (SETQ y2 (fetch YCOORD of pt2))
                  (SETQ btm (IDIFFERENCE y1 (LRSH hgt 1)))
```

```
              (COND
                 ((ILESSP x1 x2)
                  (SETQ lft (IDIFFERENCE (IDIFFERENCE x2 wdth)
                                         offset))
                  (SETQ arrow FISRightArrow))
                 (T (SETQ lft (IPLUS x2 offset))
                    (SETQ arrow FISLeftArrow]
          ((NEQ (SETQ y1 (fetch YCOORD of pt1))
                (SETQ y2 (fetch YCOORD of pt2)))
           (COND
              ((IGREATERP (ABS (IDIFFERENCE y1 y2))
                     minD)
               (SETQ lft (IDIFFERENCE x1 (LRSH wdth 1)))
               (COND
                  ((ILESSP y1 y2)
                   (SETQ btm (IDIFFERENCE (IDIFFERENCE y2 offset)
                                          hgt))
                   (SETQ arrow FISUpArrow))
                  (T (SETQ btm (IPLUS y2 offset))
                     (SETQ arrow FISDownArrow]
        (SELECTQ (IMAGESTREAMTYPE stream)
            (DISPLAY (BITBLT arrow 0 0 stream lft btm wdth hgt 'INPUT mde))
            (PROGN (SETQ arrow (SELECT arrow (FISRightArrow
                                  (SETQ lft (IDIFFERENCE
                                             (IDIFFERENCE x2
                                                   (CHARWIDTH (CONSTANT (CHARCODE
                                                                         >))
                                                              font))
                                             offset))
                                  (CONSTANT (CHARCODE >)))
                              (FISLeftArrow (CONSTANT (CHARCODE <)))
                              [FISUpArrow (SETQ btm (IDIFFERENCE (IDIFFERENCE y2 offset)
                                                             (FONTASCENT font)))
                                     (CONSTANT (CONS (CHARCODE /)
                                                     (CHARCODE \]
                              [FISDownArrow (CONSTANT (CONS (CHARCODE \)
                                                            (CHARCODE /]
                              NIL))
                 (COND
                   ((LISTP arrow)
                    [SETQ lft (SUB1 (IDIFFERENCE x1 (SETQ wdth (CHARWIDTH (CONSTANT
                                                                     (CHARCODE /))
                                                                          font]
                    (MOVETO (IPLUS lft (IQUOTIENT wdth FISLeftIncr))
                            btm stream)
                    (PRIN1 (CHARACTER (CAR arrow))
                           stream)
                    (MOVETO (IDIFFERENCE (SUB1 (IPLUS lft wdth (LRSH wdth 1)))
                                   (IQUOTIENT wdth FISRightIncr))
                            btm stream)
                    (PRIN1 (CHARACTER (CDR arrow))
                           stream))
                   (arrow (MOVETO lft (IDIFFERENCE (IPLUS yi 2 (IQUOTIENT (FONTHEIGHT font)
                                                                      FISUpIncr))
                                          (LRSH (IDIFFERENCE (FONTHEIGHT font)
                                                       (FONTDESCENT font))
                                                1))
                                  stream)
                          (PRIN1 (CHARACTER arrow)
                                  stream]
      repeateachtime (SETQ pt1 pt2])
```

```
(Method ((GrafcetLink ExtendExtent) self extent)          . mcf: 12-Dec-86 12.39
   "Specialization"
   [for posLst in (@ %:drawPoints) do (for pos in posLst unless (INSIDEP extent pos)
                                         do (EXTENDREGION extent (CREATEREGION (IDIFFERENCE (fetch XCOORD
                                                                                                of pos)
                                                                                         4)
                                                                             (IDIFFERENCE (fetch YCOORD
                                                                                                 of pos)
                                                                                         4)
                                                                             8 8]
   extent)
```

```
(Method ((GrafcetLink UpConnectionPoints) self source dest spoint dpoint scale stream)
                                                                   . mcf: 22-Jul-86 12.45
   "Draw a connection to an object directly above the source"
   (LET (stepregion upx interferex)
     (SETQ stepregion (@ (COND
                            ((_ source InstOf! 'GrafcetStep)
                             source)
                            (T dest))
                         %:region))
     (SETQ upx (IDIFFERENCE (IDIFFERENCE (fetch LEFT of stepregion)
                                   (STRINGWIDTH "M177" stream))
                      (LLSH (@ |::WholeShapeBorder|)
                            1)))                      (* hack the x pos to fall on a grid point center)
                                                      (* (SETQ upx (IDIFFERENCE (_ self GridJustify upx scale) scale)))
                                                      (* (SETQ upx (_ self GridJustify upx scale)))
```

```
[COND
   ((SETQ interferex (FID.FindFurthest source dest (create POSITION
                                                           XCOORD _ upx
                                                           YCOORD _ (fetch YCOORD of spoint))
                              dpoint
                              (APPEND (@ source |:superObject:steps|)
                                      (@ source |:superObject:transitions|))
                              scale T))               (* (SETQ upx (_ self GridJustify interferex scale)))
                                                      (* return list of points)
      ]                                               (* (LIST spoint (create POSITION XCOORD _ upx YCOORD
                                                      (fetch YCOORD of spoint)) (create POSITION XCOORD _ upx YCOORD
                                                      (fetch YCOORD of dpoint)) dpoint))
 (LIST spoint (_ self GridJustify (create POSITION
                                          XCOORD _ upx
                                          YCOORD _ (fetch YCOORD of spoint)))
       (_ self GridJustify (create POSITION
                                   XCOORD _ upx
                                   YCOORD _ (fetch YCOORD of dpoint)))
       dpoint)))

(Method ((GrafcetMacroStep ChangeType) self)        . mct: 22-Dec-87 18:10
  "New method template"
  (_ self ChangeClass 'GrafcetProcessStep))

(Method ((GrafcetMacroStep ComputeMacroProgramName) self)
                                                    . mct: 18 Sep-87 12.49

... invoked by AV macroProgramName

  "FISQualifierRenameHack is bound when processing a mainProgram written before name qualification was
  enforced"
  [LET ((name (@ %:label)))
    (COND
       (FISQualifierRenameHack (MKATOM name))
       (name (FISQualifyName self name])

(Method ((GrafcetMacroStep DeInstall) self SuperObject)
                                                    . mct: 2 Oct-87 10 24
  "Specialization"
  [LET [main (superObject (OR SuperObject (@ %:superObject)]
    (_Super self DeInstall superObject)
    (COND
       ((SETQ main (@ superObject %:mainProgram))
        (_@ main %:macroPrograms NotSetValue)
        (_@ main %:macroSteps NotSetValue)])

(Method ((GrafcetMacroStep EvaluateContinuous) self process)
                                                    . TAL 26-Jul-85 14:06
  "Specialization"
  NIL)

(Method ((GrafcetMacroStep GetAccessList) self access)
                                                    TAL 18-Nov-87 12.02
  "Specialization"
  (LET ((mp (@ %:macroProgram)))
    (AND mp (_ mp GetAccessList access))))
```

Page 17

```
(Method ((GrafcetMacroStep GetStepNumber) self) . mct 25-Nov-85 14:28
  "New method template"
  (LET ((stepn (@ %:stepNumber)))
    (AND stepn (PACK* 'M stepn))))

(Method ((GrafcetMacroStep Install) self SuperObject)  . mct: 2-Oct-87 10:22
  "Specialization"
  [LET [main (superObject (OR SuperObject (@ %:superObject)]
    (_Super self Install superObject)
    (COND
       ((SETQ main (@ superObject %:mainProgram))
        (_@ main %:macroPrograms NotSetValue)
        (_@ main %:macroSteps NotSetValue)])

(Method ((GrafcetMacroStep NameConflict?) self Name SuperObj CopyFlg)
                                                    . mct: 1-Nov-87 12:39
                                                    . Specialization
  "Determine if the proposed name conflicts with any macroprogram within the scope of the superObject's
  mainprogram"
  [LET (main obj sObj qName (newName (MKATOM Name)))
    (COND
       ((_Super self NameConflict? Name SuperObj)
        (_ self NameConflictMsg T))
       ((SETQ sObj (OR SuperObj (@ %:superObject)))
        (SETQ qName (FISQualifyName sObj newName))
        (SETQ main (@ sObj %:mainProgram))
        (COND
           ((EQ newName (_ main GetName))
            (_ self NameConflictMsg))
```

```
((FMEMB qName (@ main %:macroSteps))
 (_ self NameConflictMsg))
(NIL                                         (* This is now unnecessary)
    (AND (SETQ main (@ sObj %:mainProgram))
         (SETQ obj (FISQualifyName (OR sObj self)
                                  newName))
         (SETQ obj (SWDereferenceName obj))
         (_ obj InProgram? main)])
```

(Method ((GrafcetMacroStep Rename) self QualName ProgName StepName)
. Edited 2 Sep-88 14:31 by mcf
. mcf: 13-Oct-87 11 08

```
"Specialization"
[LET (temp (mprog (@ macroProgram)))
  (COND
    ((OR QualName ProgName)
     [COND
       ((AND ProgName)
        (_ self SetLabel1 ProgName (AND (SETQ temp (@ self superObject))
                                        (SETQ temp (_ temp FindBrowser))
                                        (@ temp window)))]
     (COND
       ((ObjectExists? mprog)
        (_ mprog Rename QualName ProgName StepName)))
     (COND
       ((NEQ (@ self mac. ..rogramName)
             (MKATOM ProgName))
        (_@ self macroProgramName NotSetValue)])
```

(Method ((GrafcetMacroStep Rename!) self NewName QualName)
. mcf: 6-Oct-87 11 05
. Specialization

```
"(_Super self Rename! NewName)"
[LET (main hiers)
  (COND
    ((OR NewName QualName)
     (_ self Rename QualName NewName)
     (COND
       ((AND (ObjectExists? (@ %:macroProgram))
             (SETQ main (@ %:mainProgram)))
        (SETQ hiers (_ main CheckPropList 'GRAFCETSTRUCTUREBROWSER))
        (AND hiers (for h in hiers do (_ (CADR h)
                                          Recompute)])
```

Page 18

(Method ((GrafcetMacroStep SWCopyMade) self XLations)
. mcf: 19-Oct-87 10:48

```
"Specialization"
(_ self SWCopyMade1 (fetch MacroSteps of XLations)))
```

(Method ((GrafcetMacroStep SendToParts1) self options msg arg1 arg2 arg3 arg4)
. TAL 7-Jul-86 04:26

```
"Specialization"
[LET ((m (@ %:macroProgram)))
  (COND
    ((ObjectExists? m)
     (_ m SendToParts options msg arg1 arg2 arg3 arg4)])
```

(Method ((GrafcetMacroStep SetLabel) self Label Stream SuperObj)
. mcf 8-Jan-87 18:00

```
"Specialization"
(LET (brwsr mobj obj xlations (label (MKATOM Label)))
  (COND
    ((NOT label)

     (* * we need to do something more with the macroprogram%: either kill it or rename it to something innocuous)

     (COND
       ((ObjectExists? (SETQ mobj (@ %:macroProgram)))
        (_@ self %:macroProgram NotSetValue)
        (_@ self %:macroProgramName NotSetValue)
        (_ mobj Kill!)))
     (_ self SetLabel1 label Stream)
     NIL)
    ((_ self NameConflict? label SuperObj))
    ((@ self %:label)
     (_ self Rename! label)
     NIL)
    (T (_ self SetLabel1 label Stream)
       NIL))))
```

(Method ((GrafcetMacroStep SetLabel1) self Label Stream)
. mcf. 13-Oct-87 11 18

```
"Specialization"
[LET (main)
  (_Super self SetLabel1 Label Stream)
  (COND
    ((SETQ main (@ self |:superObject:mainProgram|))
     (_@ main %:macroPrograms NotSetValue)
     (_@ main %:macroSteps NotSetValue)])
```

```
(Method ((GrafcetMacroStep Transferable?) self Destination)
                                                        . Edited 8-Sep 88 16 22 by mcf
  "Specialization"
  (LET (main prg)
    (COND
      ((_Super self Transferable? Destination)
        .. if the step itself can be moved, make sure the contents are legal also
        (COND
          ((SETQ prg (@ self macroProgram))
            (for x in (_ prg FindAllMacroSteps) never (_ self NameConflict? (FISDequalifyName x)
                                                                  Destination)))
          (T)))
      ((AND (SETQ main (@ Destination mainProgram))
            (_ self InProgram? main))                   . Are we transfering to the same object?
       T))))

(Method ((GrafcetMacroStep ValidStepNumber?) self stepn super)
                                                        . mcf 24-Oct-86 15:13
  "Specialization"
  (COND
    ((NOT (NUMBERP stepn))
     (SETQ stepn (MKATOM (SUBSTRING stepn 2 -1]
  (NUMBERP (_Super self ValidStepNumber? stepn super)))

(Method ((GrafcetProcessStep ChangeType) self)        . mcf 22 Dec 87 18:10
  "New method template"
  (_ self ChangeClass 'GrafcetMacroStep))
```

Page 19

```
(Method ((GrafcetProcessStep Draw) self Stream Xform Mode)
                                                        . mcf 7-Jan-87 17:34
  "Specialization"
  (_Super self Draw Stream Xform Mode)
  (_ self DrawID Stream "A"))

(Method ((GrafcetRegularStep ComputeStaticAnalysis) self)
                                                        ; TAL 15-Nov-87 16:19
  "New method template"
  (LET (analysis)
    [bind part for iv in '(activation continuous deactivation) when (AND (SETQ part (GetValue self iv))
                                                                     (NOT (DestroyedObject? part)))
       do (change analysis (UnionStaticAnalysis DATUM (@ part %:staticAnalysis)]
    analysis))

(Method ((GrafcetRegularStep ComputeStepProgName) self varName propName)
                                                        , mcf: 18-Sep-87 12:49
... Invoked by AV on activationName, continuousName, deactivationName

  "FISQualifierRenameHack is bound when processing a mainProgram written before name qualification was
  enforced"
  [LET ((name (@ %:label)))
    (AND name (NOT (STREQUAL "" name))
         [SETQ name (PACK* (@ %:printName)
                           '%.
                           (SELECTQ varName
                                (activationName
                                     'activation)
                                (continuousName
                                     'continuous)
                                (deactivationName
                                     'deactivation)
                                (SHOULDNT]
         (COND
           (FISQualifierRenameHack name)
           (T (FISQualifyName self name]))

(Method ((GrafcetRegularStep DeleteProgram) self varName stream)
                                                        . mcf: 13-Oct-87 14:24
  "New method template"
  [LET (fn program ced)
    (COND
      ((SETQ program (GetValue self varName))
       (AND (SETQ ced (_ program CheckPropList 'CEDITOR))
            (ObjectExists? ced)
            (_ ced ExitBrowser))
       (AND (SETQ fn (@ program %:functionName))
            (PUTD fn NIL))
       (_ program Destroy)                              (* ObjectChanged/CacheFlush will do this
                                                        (_@ self % \varName NotSetValue))
       (_ self ObjectChanged)])
```

```
(Method ((GrafcetRegularStep DocumentPart) self Stream PartIV Index)
                                                        . mct: 6-Jul-87 17.29

   "Specialization"
   (LET (sn part pName)
     (SELECTQ PartIV
          ((activation continuous deactivation)
               (COND
                  ((SETQ part (GetValue self PartIV))
                   (FISTurnPage Stream 'PORTRAIT)
                   (COND
                      ((SETQ pName (@ part %:printName))
                       (AND Index (FISDocIndexEntry Stream Index (SELECTQ PartIV
                                                                   (activation 'GrafAct)
                                                                   (continuous 'GrafCont)
                                                                   (deactivation 'GrafDeAct)
                                                                   NIL)
                                            pName))
                       (printout Stream .FONT FISDocCHeaderFont (CONCAT (COND
                                                                          ((SETQ sn (@ %:stepNumber))
                                                                           (CONCAT sn ". "))
                                                                          (T Nothing))
                                                                        (L-CASE PartIV T)
                                                                        " program: " pName)
                                 T T)))
                  (printout Stream .FONT FISDocCCodeFont (@ part %:text)
                                                                                          Page 20

                            T T))))
          NIL)))

(Method ((GrafcetRegularStep Draw) self stream Xform Mode)
                                                        . TAL 8-Mar-86 16:03

   "Specialization"
   (PROG1 (_Super self Draw stream Xform Mode)
          (_ self DrawDots stream Xform Mode)))

(Method ((GrafcetRegularStep DrawDots) self stream Xform Mode)
                                                        . mct: 28-Mar-88 16:20

   "New method template"
   (LET (reg top mid bot incr l w boxincr sc)
     [SETQ reg (CAR (LAST (@ %:highlightRegions)]
     (SETQ incr (QUOTIENT (fetch HEIGHT of reg)
                          8))
     (SETQ l (PLUS (fetch LEFT of reg)
                   incr))
     [SETQ w (ADD1 (FIXR (MAX 1 incr]
     [SETQ top (DIFFERENCE (fetch TOP of reg)
                           (PLUS incr (FIXR (MAX 2 (QUOTIENT w 2]
     (SETQ bot (PLUS (fetch BOTTOM of reg)
                     incr))
     (SETQ mid (PLUS bot w (QUOTIENT (DIFFERENCE (DIFFERENCE top bot)
                                                 (TIMES w 2))
                                     2)))
     [COND
       ((LEQ top (PLUS mid w))
        (SETQ top (PLUS mid w 1]
     [COND
       ((LEQ (DIFFERENCE mid bot)
             w)
        (SETQ bot (SUB1 bot]
     [SELECTQ (IMAGESTREAMTYPE stream)
         (DISPLAY                                  (* (DSPFILL reg (COND ((@ %.highlightOn?) BLACKSHADE)
                                                   (T WHITESHADE)) NIL stream))
                 (DSPFILL reg WHITESHADE NIL stream)
                 (COND
                    [(@ %:highlightOn?)
                     (COND
                        ((@ %:highlightShade)
                         (DSPFILL reg WHITESHADE NIL stream)
                         (_ self Highlight stream 'Repaint NIL reg))
                        (T (DSPFILL reg BLACKSHADE NIL stream]
                    (T (DSPFILL reg WHITESHADE NIL stream))))
         (PROGN                                    (* hack to position dots appropriately in the larger. 4045stream square)
                (SETQ boxincr (@ |::BoxWidth|))
                (SETQ sc (FIXR (DSPSCALE NIL stream)))
                (add l (DIFFERENCE (TIMES sc boxincr)
                                   boxincr))
                (SETQ top (DIFFERENCE top sc))
                (SETQ mid (DIFFERENCE mid (QUOTIENT sc 2]
     (for y in (LIST bot mid top) as part in '(deactivation continuous activation)
        when (GetValue self part) collect [BLTSHADE BLACKSHADE stream l (FIXR y)
                                                    w w (OR Mode (COND
                                                                   ((@ %:highlightOn?)
                                                                    'INVERT)
                                                                   (T 'REPLACE]
                                          y)))

(Method ((GrafcetRegularStep GetPaletteIcon) self) . mct: 15-Feb-88 15:17
   "Specialization"
   (OR (@ self %:stepNumber)
       (_Super self GetPaletteIcon)))
```

```
(Method ((GrafcetRegularStep NameConflict?) self Name SuperObj CopyFlg)
                                                         mct 21-Oct 87 10 16
  "Specialization"
  [LET [(name (MKATOM Name))
        (sObj (OR SuperObj (@ %:superObject)]
    (COND
      ((_Super self NameConflict? Name SuperObj)
       (_ self NameConflictMsg T))
      ((AND sObj (for x in (@ sObj %:steps) when (AND (EQ (@ x %:stepType)
                                                          (@ self %:stepType))
                                                     (OR CopyFlg (NEQ self x)))
                     thereis (EQ (MKATOM (@ x %:label))
                                 name)))
```

```
       (_ self NameConflictMsg)]])

(Method ((GrafcetRegularStep ObjectChanged) self markAsChanged)
                                                         TAL 10-Mar-86 12:46
  "Specialization"
  [LET (sup ds)
    (_Super )
    (COND
      ((AND (SETQ sup (@ %:superObject))
            (SETQ ds (@ sup %:displayStream)))
       (_ self DrawDots ds NIL NIL)])

(Method ((GrafcetRegularStep SWCopyMade) self XLations)
                                                         mct: 19-Oct-87 10:46
  "Specialization"
  (_ self SWCopyMade1 (fetch RegularSteps of XLations)))

(Method ((GrafcetRegularStep SendToParts1) self options msg arg1 arg2 arg3 arg4)
                                                         TAL 7-Jul-86 04 29
  "Specialization"
  (bind part for iv in '(activation continuous deactivation) eachtime (SETQ part (GetValue self iv))
     when (ObjectExists? part) do (_ part SendToParts options msg arg1 arg2 arg3 arg4)))

(Method ((GrafcetRegularStep WhoUses) self item access)
                                                         TAL 23-Nov-87 15 42
  "Specialization"
  [COND
    ((FISInAnalysis? item access (@ %:staticAnalysis))
     (bind part for iv in '(activation continuous deactivation) when (AND (SETQ part (GetValue self iv))
                                                                          (NOT (DestroyedObject? part)))
        join (_ part WhoUses item access iv)])

(Method ((GrafcetRemoteLink ComputeLabelRegion) self Label Point Scale Stream)
                                                         mct: 30-Dec-86 17 06
  "New method template"
  (LET (region)
    (SETQ region (STRINGREGION Label Stream))
    (change (fetch LEFT of region)
            (IPLUS (fetch XCOORD of Point)
                   (LRSH Scale 1)))
    (replace BOTTOM of region with (fetch YCOORD of Point))
    region))

(Method ((GrafcetRemoteLink DrawLink) self stream scale mode)
                                                         mct: 15-Jan-87 14 51
  "New method template"
  [LET [(label font dpoint spoint wdth (pts (@ self %:drawPoints))
              (source (@ self %:linkSource))
              (scale (OR scale (@ |:superObject:progScale|)]
    [COND
      [(NOT pts)
       (SETQ spoint (_ source GetConnectPoint 'Bottom))
       (SETQ dpoint (create POSITION
                            XCOORD _ (fetch (POSITION XCOORD) of spoint)
                            YCOORD _ (IDIFFERENCE (fetch (POSITION YCOORD) of spoint)
                                                  scale)))
       (_@ self drawPoints (SETQ pts (LIST (LIST spoint dpoint))))]
      (T (SETQ dpoint (CADAR pts]
    (_ self DrawConnection stream (CAR pts)
       mode)
    [COND
      (stream (SELECTQ (IMAGESTREAMTYPE stream)
                 (DISPLAY (SETQ wdth (BITMAPWIDTH FISDownArrow))
                          (BITBLT FISDownArrow 0 0 stream (IDIFFERENCE (fetch XCOORD of dpoint)
                                                                       (LRSH wdth 1))
                                  (fetch YCOORD of dpoint)
                                  wdth
                                  (BITMAPHEIGHT FISDownArrow)
                                  'INPUT
                                  (COND
                                    ((NEQ mode 'ERASE)
                                     'PAINT)
                                    (T mode))))
                 (PROGN (SETQ font (DSPFONT NIL stream))
                        (MOVETO (IDIFFERENCE (fetch XCOORD of dpoint)
                                             (LRSH (CHARWIDTH (CONSTANT (CHARCODE v))
```

```
                                                        font)
                                                   1))
                                       (fetch YCOORD of dpoint)
                                       stream)
                                  (PRIN1 'v stream]
  (COND
     ((AND (SETQ label (OR (@ |:linkDestination:label|)
                           (@ |:linkDestination:stepNumber|)))
           (NOT (@ self |:superObject:quietFlg|)))
      (SELECTQ mode
          (ERASE (DSPFILL (_ self ComputeLabelRegion label dpoint scale stream)
                          NIL NIL stream))
          (_ source DrawText stream label (_ self ComputeLabelRegion label dpoint scale stream))])
```

(Method ((GrafcetRemoteLink ExtendExtent) self extent)
. mcf: 30-Dec-86 17 06

```
   "Specialization"
   (LET (label super scale stream)
     (_Super self ExtendExtent extent)
     (AND (SETQ label (OR (@ |:linkDestination:label|)
                          (@ |:linkDestination:stepNumber|)))
          (SETQ super (@ self %:superObject))
          (SETQ scale (@ super %:progScale))
          (SETQ stream (@ super %:displayStream))
          (EXTENDREGION extent (_ self ComputeLabelRegion label (CADAR (@ %:drawPoints))
                                      scale stream)))
     extent))
```

(Method ((GrafcetSplitStep DrawID) self Stream ID BoxFlg) "Method documentation"

```
   [LET (h w width font (reg (@ self region)))
     (CENTERPRINTINREGION ID reg Stream)
     (SETQ font (DSPFONT NIL Stream))
     (SETQ w (CHARWIDTH (APPLY* (FUNCTION CHARCODE)
                                ID)
                        font))
     (SETQ h (FONTPROP font 'HEIGHT))
     (SETQ width (IPLUS (fetch LEFT of reg)
                        (IQUOTIENT (IDIFFERENCE (fetch WIDTH of reg)
                                                w)
                                   2)))
     (COND
        [(AND (NOT BoxFlg)
              (NEQ 'DISPLAY (IMAGESTREAMTYPE Stream]
        (T (DRAWAREABOX (COND
                           ((EVENP w),
                            width)
                           (T (SUB1 width)))
                        (SUB1 (IPLUS (fetch BOTTOM of reg)
                                     (IQUOTIENT (IDIFFERENCE (fetch HEIGHT of reg)
                                                             h)
                                                2)))
                        (IPLUS w 2)
                        (IPLUS h 2)
                        1
                        (COND
                           (BoxFlg 'REPLACE)
                           (T 'ERASE))
                        Stream])
```

(Method ((GrafcetSplitStep GetHighlightRegion) self Type HighlightRegions) "Specialization"

```
   (LET [(hrs (OR HighlightRegions (@ self highlightRegions))]
     (SELECTQ Type
         ((Run Top)
            (OR (CAR hrs)
                (@ self region)))
         ((Active Bottom)
            (OR (CAR (LAST hrs))
                (@ self region)))
         (RunActive (UNIONREGIONS (CAR hrs)
                                  (CAR (LAST hrs))))
         NIL)))
```

(Method ((GrafcetStep AdjustLinks) self stream scale dest)
. mcf 5-Aug-85 00:47

```
   "Specialization"
   [LET (preds)
     (COND
        ((SETQ preds (@ dest %:predecessors))
         [for pred in preds do [for link in (@ pred %:linkType) do (_ link DrawLink stream scale 'ERASE)
                                  when (AND (_ link InstOf! 'GrafcetAsynchronousLink)
                                            (EQ dest (@ link %:linkDestination))]
                               (for links link newlink on (@ pred %:linkType)
                                  do (RPLACA links (SETQ newlink (_ ($ GrafcetSynchronousLink)
                                                                    New)))
                                     (_@ newlink %:linkSource (@ link %:linkSource))
                                     (_@ newlink %:linkDestination (@ link %:linkDestination))
                                     (_ link Destroy)
                                     (_ newlink DrawLink stream scale)
                                  when (AND (SETQ link (CAR links))
                                            (AND (_ link InstOf! 'GrafcetAsynchronousLink)
                                                 (EQ dest (@ link %:linkDestination))]
         ($ GrafcetSynchronousLink))
        (T ($ GrafcetAsynchronousLink])
```

```
(Method ((GrafcetStep ClearRegions) self)                    Edited 31-Aug-88 14:58 by mct
   "Specialization"
   (_Super self ClearRegions)
   (_@ self stepNumberRegion NotSetValue))

(Method ((GrafcetStep ComputeLabelRegion) self)              Edited 31-Aug-88 14:17 by mct
                                                             mct: 20-Oct-86 09:35
   "Specialization"
   (LET (stregion)
     (COND
       ((SETQ stregion (_Super self ComputeLabelRegion)).
        .. (COND ((SETQ label (OR (@ self shortlabel) (@ self label))) (SETQ stregion (STRINGREGION label (OR (STREAMP stream) (@ self
        .. superObject:displayStream)))) (change (fetch LEFT of stregion) (fetch (REGION PRIGHT) of (@ highlightRegion))) (change (fetch BOTTOM of stregion)
        .. (IDIFFERENCE (fetch (POSITION YCOORD) of (@ center)) (@ self .scale))) stregion))
        (change (fetch LEFT of stregion)
                (fetch (REGION PRIGHT) of (@ self highlightRegion)))
        (change (fetch BOTTOM of stregion)
                (IDIFFERENCE DATUM (@ self scale)))
        stregion))))

(Method ((GrafcetStep ComputePrintName) self)                mct: 24-Sep-87 16:03
   "New method template"
   [LET (lab sup)
     (COND
       ((AND (ObjectExists? (SETQ sup (@ %:superObject)))
             (SETQ sup (@ sup %:printName)))
        (COND
          ((AND (SETQ lab (@ %:label))
                (NOT (STREQUAL lab "")))
           (CONCAT sup "." lab))
          (T (CONCAT sup ".S" (@ %:stepNumber)])

(Method ((GrafcetStep ComputeStepNumberRegion) self stream)
                                                             mct: 20-Aug-86 12:18
   "New method template"
   (LET (stregion (stepn (_ self GetStepNumber)))
     (COND
       ((@ %:stepNumber)
        [SETQ stregion (STRINGREGION stepn (OR (STREAMP stream)
                                               (@ self |:superObject:displayStream|)]
        [change (fetch LEFT of stregion)
                (IDIFFERENCE (fetch (REGION LEFT) of (@ %:region))
                       (PLUS (fetch (REGION WIDTH) of stregion)
                             (@ |::WholeShapeBorder|)]
        (change (fetch BOTTOM of stregion)
                (fetch (POSITION YCOORD) of (@ %:center)))
        stregion))))
```

Page 24

```
(Method ((GrafcetStep DeInstall) self superObject)           TAL 9-Aug-85 23:54
   "Remove a step from mainProgram, as an immediate part of superObject, which is either a macro step or the
   same as mainProgram. Not necessary to supply arg."
   (_ (OR superObject (@ %:macroStep))
      DeInstallStep self)                                    (_@ macroStep NIL) macroStep now indirect to superObject
   (_Super ))

(Method ((GrafcetStep Draw) self stream Xform Mode)          mct 2-Sep-85 18:07
   "Specialization"
   (_Super self Draw stream Xform Mode)
   (_ self DrawStepNumber stream))

(Method ((GrafcetStep DrawLinePart) self stream scale center desc mode)
                                                             mct: 20-Aug-86 12:33
   "Specialization"
   (for lst (top _ (LISTGET (LISTGET desc 'ConnectPoints)
                            'Top))
        (bottom _ (LISTGET (LISTGET desc 'ConnectPoints)
                           'Bottom))
        [linewidth _ (FIXR (TIMES (@ |::LineWidth|)
                                  (DSPSCALE NIL stream]
        (pred _ (@ self %:predecessors))
        (succ _ (@ self %:successors)) in (LISTGET desc 'LineDraw)
      do (for pos bind p1 p2 in (CDR lst) first (SETQ p1 (FID.ScaleUp (CAR lst)
                                                                       scale center))
            when (SELECTQ mode
                      (ERASE [COND
                                ((AND (MEMBER top lst)
                                      (NOT pred)))
                                ((AND (MEMBER bottom lst)
                                      (NOT succ])
                      (COND
                         ((MEMBER top lst)
                          pred)
                         ((MEMBER bottom lst)
                          succ)
                         (T)))
            do (SETQ p2 (FID.ScaleUp pos scale center))
               (DRAWBETWEEN p1 p2 linewidth mode stream)
               (SETQ p1 p2))))
```

```
(Method ((GrafcetStep DrawStepNumber) self stream)
                                                        . TAL 5-Mar-86 06.18
   "Print step number on display stream"
   [LET ((stepn (_ self GetStepNumber)))
     (COND
       ((AND stepn (NOT (@ self |:superObject:quietFlg|)))
        (_ self DrawText stream stepn (@ %:stepNumberRegion))])

(Method ((GrafcetStep Erase) self stream)               . mct 2-Sep-85 18:10
   "Specialization"
   (_ self EraseStepNumber stream)
   (_Super self Erase stream))

(Method ((GrafcetStep EraseStepNumber) self stream)
                                                        . TAL 5-Mar-86 06.14
   "New method template"
   (LET ((region (@ self %:stepNumberRegion)))
     (COND
       (region (DSPFILL region NIL NIL stream)))
     (_@ self %:stepNumberRegion NotSetValue)))

(Method ((GrafcetStep EvaluateActivation) self process)
                                                        . TAL 1-Sep-86 20 09

... Perform the activation part of a step.

   "If step has no activation, should it do nothing on this scan, or perform the continuous part?"
   [LET ((act (@ %:activation)))
     (COND
       (act (_ act Evaluate process self 'Activation)])
```

```
(Method ((GrafcetStep EvaluateContinuous) self process)
                                                        . TAL 19-Sep-85 19.49
   "Perform the continuous part of a step"
   [LET ((cont (@ %:continuous)))
     (COND
       (cont (_ cont Evaluate process self 'Continuous)])

(Method ((GrafcetStep EvaluateDeactivation) self process)
                                                        . TAL 1-Sep-86 20:11
   "Perform the deactivation part of a step, if any"
   [LET ((deact (@ %:deactivation)))
     (COND
       (deact (_ deact Evaluate process self 'Deactivation)])

(Method ((GrafcetStep ExtendExtent) self extent)        . mct 3-Sep-85 12:43
   "Specialization"
   (_Super self ExtendExtent extent)
   [COND
     ((AND (NOT (@ |:superObject:quietFlg|))
           (@ %:stepNumberRegion))
      (EXTENDREGION extent (@ %:stepNumberRegion)]
   extent)

(Method ((GrafcetStep GetDescription) self)             . mct. 27-Oct-87 17:08
                                                        . Specialization
   "(_Super self GetDescription)"
   (CONCAT (@ self %:stepType)
           " Step "
           (OR (@ self %:label)
               (_ self GetStepNumber))))

(Method ((GrafcetStep GetHighlightRegion) self Type HighlightRegions)
                                                        . mct: 14-Mar-88 16.35
   "New method template"
   (OR (CAR (OR HighlightRegions (@ self %:highlightRegions)))
       (@ self %:region)))

(Method ((GrafcetStep GetName) self)                    . mct: 2-Dec-85 14:03
   "Specialization"
   (OR (_Super self GetName)
       (@ %:stepNumber)))

(Method ((GrafcetStep GetStepName) self)                TAL 7-Mar-86 20.16
   "Returns the step's label as an atom"
   (MKATOM (@ %:label)))

(Method ((GrafcetStep GetStepNumber) self)              . mct 25-Nov-85 14 25
   "New method template"
   (@ %:stepNumber))
```

```
(Method ((GrafcetStep HasContents?) self)                    mct 12-Jan-88 13.40
                                                             Specialization
   "BrowseableSubParts is not strictly appropriate for this test, but in the cases below GrafcetStep it is
   the most uniform way of testing."
   (for x in (@ |::BrowseableSubParts|) when (@ %:!\x) do (RETURN T)))


(Method ((GrafcetStep Install) self superObject)             mct 31-Oct-86 15.39
   "Install a step into mainProgram, as an immediate part of superObject, which is either a macro step or the
   same as mainProgram"
   (_Super )                          ( @ macroStep superObject) macroStep is now indirect to superObject
   (_ superObject InstallStep self)
   (_ self CacheFlush))
```

```
(Method ((GrafcetStep Link) self stream scale dest)          mct: 6-Sep-85 00:36
   "perform logical linking of source and dest. Draw new links."
   (LET (link linktype)
     (COND
        ((_ dest InstOf! 'GrafcetTransition)
         (SETQ linktype (_ self AdjustLinks stream scale dest))
         (push (@ %:successors)
               dest)
         (SORT (@ self %:successors)
               (FUNCTION FID.TransitionOrderFn))
         (push (@ dest %:predecessors)
               self)
         (push (@ %:linkType)
               (SETQ link (_ linktype New)))
         (_@ link %:linkSource self)
         (_@ link %:linkDestination dest)     (* (_@ link %.macroStep (@ %.macroStep)) Gets super from source or
                                              dest now:)
         (_ self DrawLinePart stream scale (@ %:center)
              (@ self |::IconDescription|)
              'REPLACE)
         (_ link DrawLink stream scale))
        ((_ dest InstOf! 'GrafcetStep)
         NIL))))


(Method ((GrafcetStep Linkable?) self stream scale dest Type)
                                                             mct. 17-Oct 86 14 01
   "Specialization"
   (COND
      (Type "ERROR: Remote link not allowed")
      ((_Super self Linkable? stream scale dest))))


(Method ((GrafcetStep MakeFileSource) self file)             mct: 25-Nov-86 18.43
   "Specialization"
   (LET [(firstTrueFlg (GetIVHere self 'firstTrueFlg]
     (COND
        ((AND (NOT firstTrueFlg)
              (NOT (NotSetValue firstTrueFlg)))
         (PutValueOnly self 'firstTrueFlg NotSetValue)))
     (_Super self MakeFileSource file)))


(Method ((GrafcetStep Moved) self)                           TAL 5-Mar-86 08.14
   "New method template"
   (_@ self %:stepNumberRegion NotSetValue)
   (_Super self Moved))


(Method ((GrafcetStep NameConflict?) self Name SuperObj CopyFlg)
                                                             Edited 8-Sep-88 17 33 by mct
                                                             mct: 21-Oct 87 11 09
   "Specialization"
   (DECLARE (GLOBALVARS FISValidCIdentifierNegBT))
   [LET* [[sobj (ObjectExists? (OR SuperObj (@ self superObject)]
          (mp (AND sobj (@ sobj mainProgram)]
     (COND
        (mp (_ mp InvalidNameSyntax? Name mp))
        ((NUMBERP (NTHCHAR Name 1)))
        ((STRPOSL FISValidCIdentifierNegBT Name])


(Method ((GrafcetStep NameConflictMsg) self InvalidFlg)
                                                             mct: 20-Oct-87 11 21
   "New method template"
   (CONCAT "ERROR: " (@ %:stepType)
          (COND
             (InvalidFlg " step name invalid.")
             (T " step name conflict."))))


(Method ((GrafcetStep QualifiedPrintName) self)              Edited 5 Sep-88 15 59 by mct
   "Specialization"
   (DECLARE (GLOBALVARS FISQPrintNameSepr))
   [LET ((qual (_ self PrintNameQualifier)))
     (COND
        (qual (CONCAT qual FISQPrintNameSepr (@ self printName)))
        (T (@ self printName)])
```

```
(Method ((GrafcetStep RegionIntersectP) self region). mcf 3-Sep-85 13:17
   "Specialization"
   [OR (_Super self RegionIntersectP region)
       (LET ((reg (@ %:stepNumberRegion)))
         (AND reg (REGIONSINTERSECTP reg region])

(Method ((GrafcetStep SWCopyMade1) self XLations) . mcf: 19-Oct-87 12:42
   "New method template"
   (LET ((label (@ %:label)))
     (_@ %:label (OR (CDR (FASSOC (MKATOM label)
                                   XLations))
                     label))))

(Method ((GrafcetStep SetLabel) self Label Stream)      . Edited 31-Aug-88 17:21 by mcf
   "Specialization"
   (LET [(label (MKATOM (COND
                          ((LISTP Label)
                           (SUBSTRING Label 2 -2))
                          (T Label]
     (COND
       ((NOT label)
        (_ self SetLabel1 label Stream)
        NIL)
       ((_ self NameConflict? label))
       ((@ self label)
        (_ self Rename! label)
        NIL)
       (T (_ self SetLabel1 label Stream)
          NIL))))

(Method ((GrafcetStep UsesContextApplicable?) self)
                                                  . Edited 12-Sep-88 20:30 by mcf
   "Should a vars used context apply to me?"
   (COND
     ((_ self HasContents?)
      (_Super self UsesContextApplicable?))))

(Method ((GrafcetStep ValidStepNumber?) self stepn super)
                                                  . mcf: 15-Feb 88 14 58
   "Check for validity"
   [LET (step)
     (COND
       ((OR (NOT (SETQ step (_ super GetNumberedStep stepn)))
            (EQ step self))                       (* "number" requested must not already be in use)
        (COND
          ((NUMBERP stepn)
           stepn)
          ((OR (EQ stepn 'IN)
               (EQ stepn 'OUT))
           (AND (NOT (_ super InstOf! 'GrafcetMainProgram))
                stepn])

(Method ((GrafcetSynchronousLink DrawLink) self stream Scale mode)
                                                  . mcf 31-Jul-86 10:44
   "draw synchronous connecting link"
   [LET (spoint dpoint slinkpos dlinkpos pts offset scale)
     (COND
       ((NOT (SETQ pts (@ self %:drawPoints)))
        [SETQ offset (SETQ scale (OR Scale (@ |:superObject:progScale|)]
        (SETQ spoint (_ (@ %:linkSource)
                        GetConnectPoint
                        'Bottom))
        (SETQ dpoint (_ (@ %:linkDestination)
                        GetConnectPoint
                        'Top))

        (* First determine logical connector between synchronous link as object and connection points on source and dest objects)

        [SETQ dlinkpos (create POSITION
                               XCOORD _ (fetch XCOORD of dpoint)
                               YCOORD _ (IPLUS scale (fetch YCOORD of dpoint]
        (SETQ slinkpos (create POSITION
                               XCOORD _ (fetch XCOORD of spoint)
                               YCOORD _ (fetch YCOORD of dlinkpos)))
        [COND
          ((_ (@ %:linkSource)
              InstOf!
```

```
          'GrafcetTransition)
        (replace YCOORD of dlinkpos with (IDIFFERENCE (fetch YCOORD of spoint)
                                                      scale))
        (replace YCOORD of slinkpos with (fetch YCOORD of dlinkpos]
                                                   (* Cache connections between source and dest and actual line
                                                   representing synchronous link)

     [push pts (COND
                 ((AND (IGREATERP (fetch YCOORD of dpoint)
                                  (fetch YCOORD of dlinkpos))
                       (IGREATERP (ABS (IDIFFERENCE (fetch YCOORD of dpoint)
                                                    (fetch YCOORD of dlinkpos)))
                                  scale))
                  (replace XCOORD of dlinkpos with (IPLUS (for x in (@ (@ %:linkSource)
                                                                       %:successors)
                                                              maximize (fetch XCOORD
                                                                         of (@ x %:center)))
                                                           (TIMES scale 2)))
                  (SETQ dlinkpos (_ self GetConnectPoint 'Bottom NIL dlinkpos))
                  (_ self UpFromSynchronous (@ %:linkSource)
                        (@ %:linkDestination)
                        dlinkpos dpoint scale stream))
                 (T (LIST (SETQ dlinkpos (_ self GetConnectPoint 'Bottom NIL dlinkpos))
                          dpoint]
     [push pts (LIST spoint (SETQ slinkpos (_ self GetConnectPoint 'Top NIL slinkpos)]
                                                   (* Create respective endpoints of synchronous lines offset beyond
                                                   actual connect point)
     (AND (IGREATERP (fetch XCOORD of dlinkpos)
                     (fetch XCOORD of slinkpos))
          (SETQ offset (IMINUS offset)))
     (SETQ slinkpos (create POSITION
                            XCOORD _ (IPLUS (fetch XCOORD of slinkpos)
                                            offset)
                            YCOORD _ (fetch YCOORD of slinkpos)))
     (SETQ dlinkpos (create POSITION
                            XCOORD _ (IDIFFERENCE (fetch XCOORD of dlinkpos)
                                                  offset)
                            YCOORD _ (fetch YCOORD of dlinkpos)))
                                                   (* Finally cache endpoints of the synchronous connector)
     [push pts (LIST slinkpos (create POSITION
                                      XCOORD _ (fetch XCOORD of dlinkpos)
                                      YCOORD _ (fetch YCOORD of slinkpos]
     [push pts (LIST dlinkpos (create POSITION
                                      XCOORD _ (fetch XCOORD of slinkpos)
                                      YCOORD _ (fetch YCOORD of dlinkpos]
     (_@ self %:drawPoints pts)))
   (_ self DrawConnection stream (CAR pts)
        mode NIL T)
   (_ self DrawConnection stream (CADR pts)
        mode NIL T)
   (for pt in (CDDR pts) do (_ self DrawConnection stream pt mode NIL (LEQ (LENGTH pt)
                                                                            2))))


(Method ((GrafcetSynchronousLink UpFromSynchronous) self source dest slink dlink scale)
                                                   . mcl: 22-Jul-86 14 40

  "New method template"
  (LET (tem pts pt1)
    (SETQ tem (for l in (@ source %:linkType) collect l when (@ l %:drawPoints)))
    [COND
      [NIL tem (SETQ pt1 (CONS [for ds in tem maximize (for dps in (@ ds %:drawPoints)
                                                            maximize (for pt in dps maximize (CAR pt]
                               (fetch YCOORD of slink]
      (T (SETQ pt1 (CONS (fetch XCOORD of slink)
                         (fetch YCOORD of slink]
    (push pts pt1)
    (SETQ pt1 (CONS (fetch XCOORD of pt1)
                    (IDIFFERENCE (fetch YCOORD of pt1)
                                 scale)))
    (push pts pt1)
    (SETQ pt1 (CONS (IPLUS (IMAX (fetch XCOORD of pt1)
                                 (fetch XCOORD of dlink))
                           (TIMES scale 2))
                    (fetch YCOORD of pt1)))
    (push pts pt1)
    (SETQ pt1 (CONS (fetch XCOORD of pt1)
                    (fetch YCOORD of dlink)))
    (push pts pt1)
    (push pts dlink)
    (DREVERSE pts)))
```

```
(Method ((GrafcetTransition AdjustLinks) self stream scale dest)
                                                   . mct 4-Aug-85 21.43

  "Adjust previous links to accomodate this one"
  (COND
    ((@ self %:successors)
     (for link in (@ self %:linkType) do (_ link DrawLink stream scale 'ERASE)
        when (_ link InstOf! 'GrafcetAsynchronousLink))
     [for links link newlink on (@ self %:linkType) do (SETQ newlink (_ ($ GrafcetSynchronousLink)
                                                                         New))
                                                       (_@ newlink %:linkSource self)
                                                       (_@ newlink %:linkDestination (@ link
                                                                                        %:linkDestination
```

```
))
                                        (RPLACA links newlink)
                                        (_ link Destroy)
                                        (_ newlink DrawLink stream scale)
        when (AND (SETQ link (CAR links))
                  (_ link InstOf! 'GrafcetAsynchronousLink)]
      ($ GrafcetSynchronousLink))
     (T ($ GrafcetAsynchronousLink))))
```

(Method ((GrafcetTransition CompileTrans) self ccEnv)
; TAL 13-Nov-87 19:44

```
.. Compile the label string into an executable predicate, storing the expr into .definition and returning it
"Note: this method cannot be called Compile, as it would get run automatically under Compile! at the wrong
time. Transitions need to be compiled after their enclosing decls, but before the macro program gathers
the definitions into a function. Therefor this is invoked explicitly as part of compiling a macro
program."
(LET ((label (@ %:label))
      (FISCompilingObject self)
      resultEnv def analysis)
  (DECLARE (SPECVARS FISCompilingObject))
  [SETQ def (COND
              ((OR (NULL label)
                   (EQ 0 (NCHARS label)))
               T)
              ((STRING-EQUAL label 'Otherwise)
               '(NOT anyPrevious))
              ((STRING-EQUAL label 'AnyPrevious)
               'anyPrevious)
              ([NLSETQ (SETQ resultEnv (CC.CompileExprString (CONCAT "(" label ")")
                                                             ccEnv
                                                             'boolean]
               (SETQ analysis (CCEnv.ExprAnalysis resultEnv))

      (* CC.TranslateExprString returns NIL if there wasn't actually an expression, in which case we want the transition to be T)
                                          (* This fails if compiler simplifies expr, in which case 0" compiles into
               NIL)
               (OR (CCEnv.ExprCode resultEnv)
                   T]
  (_@ %:definition def)
  (_@ %:staticAnalysis (COND
                         (analysis (FISStaticAnalysisFromDetail analysis))
                         (T NIL)))        (* This is also wrong if compiler simplifies, since NIL return means
                                          failure)
  def))
```

(Method ((GrafcetTransition ComputeLabelRegion) self)
, mcf: 20-Oct-86 09:39

```
"Specialization"
(LET (stregion)
  (COND
    ((SETQ stregion (_Super self ComputeLabelRegion))     (* (COND ((SETQ label (OR (@ self %.shortlabel)
                                                          (@ self %.label))) (SETQ stregion (STRINGREGION label
                                                          (@ self |:superObject:displayStream|)))
                                                          (change (fetch LEFT of stregion) (PLUS
                                                          (fetch (REGION PRIGHT) of (@ %.region))
                                                          (@ |.WholeShapeBorder|))) (change (fetch BOTTOM of stregion)
                                                          (IDIFFERENCE (fetch (POSITION YCOORD) of
                                                          (@ %:center)) (LRSH (fetch (REGION HEIGHT) of stregion) 1))) stregion)))
     (change (fetch LEFT of stregion)
             (PLUS (fetch (REGION PRIGHT) of (@ %:region))
                   (@ |::WholeShapeBorder|)))
     (change (fetch BOTTOM of stregion)
             (IDIFFERENCE DATUM (LRSH (fetch (REGION HEIGHT) of stregion)
                                      1)))
     stregion))))
```

(Method ((GrafcetTransition ConstructPrintName) self)
, mcf: 18-Nov-87 13:31

```
"New method template"
[LET ((super (@ %:superObject)))
  (CONCAT "Transition " (COND
                          ((AND super (SETQ super (@ super %:printName)))
                           (CONCAT "in " super])
```

(Method ((GrafcetTransition DeInstall) self superObject)
, TAL 9-Jul-85 18:46

```
"Remove a transition from a Grafcet."
(change (@ superObject %:transitions)
        (DREMOVE self DATUM))
(_Super )
self)
```

(Method ((GrafcetTransition Document) self Stream Index)
, mcf: 29-May-87 16:17

```
"New method template"
[LET (olm lm strings (sepr ": ")
      (abbrev (@ %:abbreviation)))
```

```
(COND
   ((AND abbrev Stream)
    (SETQ abbrev (SUBSTRING abbrev 2 -2))
    (SETQ olm (DSPLEFTMARGIN NIL Stream))
    (printout Stream .FONT FISDocCHeaderFont abbrev ": " .FONT FISDocCCodeFont)
    (DSPLEFTMARGIN (SETQ lm (IPLUS olm (CHARWIDTH (CHARCODE %:)
                                                   Stream)
                                    (STRINGWIDTH abbrev Stream)))
           Stream)
    [SETQ strings (SWBreakIntoLines (@ %:label)
                           Stream
                           (IDIFFERENCE (DSPRIGHTMARGIN NIL Stream)
                                  (ADD1 lm]
    (for s in strings do (printout Stream s T) finally (DSPLEFTMARGIN olm Stream)
                                                         (printout Stream T])
```

(Method ((GrafcetTransition Evaluate) self process anyPrevious)
. TAL 29-Jun-86 08:30

... Evaluate a transition in the specified process

... Transition is valid if all its preceding steps are active. and its condition is met

```
  "Old (LET ((def (@ :definition))) (SELECTQ def (Otherwise (NOT anyPrevious)) (AnyPrevious anyPrevious)
  (EvaluateLispProgramObject self def process NIL NIL)))"
  (_ (@ %:superObject)
     EvaluateTrans self process anyPrevious))
```

(Method ((GrafcetTransition GetDescription) self)
. mcf: 27-Oct-87 17 13
. Specialization

```
  "(_Super self GetDescription)"
  (CONCAT "Transition " (OR (@ self %:abbreviation)
                            (@ self %:label)
                            Nothing)))
```

(Method ((GrafcetTransition GetPaletteIcon) self)
. mcf: 2-Dec-86 16:49

```
  "Specialization"
  (OR (@ self %:label)
      (_Super self GetPaletteIcon)))
```

(Method ((GrafcetTransition Install) self superObject)
. TAL 30-Jun-86 13.03

```
  "Install a transition in a Grafcet program."
  (_Super )
  (_@ %:tKey (_ superObject NextTransitionKey))
  (pushnew (@ superObject %:transitions)
         self)                         (_@ self macroStep superObject) macroStep is now indirect to
                                       superObject
  self)
```

(Method ((GrafcetTransition Link) self stream scale dest Type)
. mcf: 21-Oct-86 16:45
. perform logical linking of source and dest. Return link.

```
  "transition -> transition linking no longer legal: ((_ dest InstOf! (QUOTE GrafcetTransition))
  (MakeActiveValue self (QUOTE successors) (QUOTE GetIndirect) (QUOTE ReplaceMe) (LIST dest (QUOTE
  successors)) NIL (QUOTE IV)) (SETQ linktype ($ GrafcetAsynchronousLink)) T)"
  [LET (link linktype)
    (COND
       ((COND
           ((SETQ linktype Type))
           ((_ dest InstOf! 'GrafcetStep)
            (SETQ linktype (_ self AdjustLinks stream scale dest))
            T))
        (push (@ %:successors)
              dest)
        (push (@ dest %:predecessors)
              self)
        (_ dest DrawLinePart stream scale (@ dest %:center)
               (@ dest |::IconDescription|)
               'REPLACE)
        (push (@ %:linkType)
               (SETQ link (_ linktype New)))
        (_@ link %:linkSource self)
        (_@ link %:linkDestination dest)         (* (_@ link %.macroStep (@ % macroStep)) Gets super from source or
                                                 dest now)
        (_ link DrawLink stream scale)])
```

(Method ((GrafcetTransition Linkable?) self stream scale dest Type)
. mcf: 20-Oct-86 07 52
. Specialization

```
  "Return message on error"
  [LET (link)
    (OR (_Super self Linkable? stream scale dest)
        (COND
           ([OR (AND Type (@ %:successors))
                (AND (SETQ link (@ %:linkType))
                     (EQ (LENGTH link)
                         1)
                     (_ (CAR link)
                        InstOf
                        'GrafcetRemoteLink)]       (* Only explicit type currently is remote. and it is restricted to one
                                                   destination)
            "ERROR: Single remote links only"])
```

```
(Method ((GrafcetTransition LocateBrowsers) self BrowserType)
                                                          . mcf: 11-Nov-87 14:17
   "Specialization"
   (APPEND (_Super self LocateBrowsers BrowserType)
           (_ (@ self %:superObject)
              LocateBrowsers BrowserType)))

(Method ((GrafcetTransition Moved) self)                  . mcf: 5-Aug-85 14 23
   "Specialization"
   (for pred in (@ self %:predecessors) do (SORT (@ pred %:successors)
                                                 (FUNCTION FID.TransitionOrderFn)))
   (_Super self Moved))

(Method ((GrafcetTransition QualifiedPrintName) self)
                                                          . Edited 5-Sep-88 16:00 by mcf
   "Specialization"
   [LET ((super (@ self superObject)))
     (COND
        ((ObjectExists? super)
         (CONCAT "Transition in " (_ super QualifiedPrintName)))
        (T (@ self printName)])

(Method ((GrafcetTransition SetLabel) self Label Stream)
                                                          . mcf: 13-Oct-87 11 06
                                                          . Return NIL on success, else error message
   "Specialization to force label to be recompiled"
   (PROG1 (_ self SetLabel1 Label Stream)
          (_@ self %:definition ...)))
```

Page 32

```
(Method ((GrafcetTransition WhoUses) self item access)
                                                          . TAL 23-Nov-87 18:09
   "Specialization"
   [LET (refObj)
     (COND
        ((FISInAnalysis? item access (@ %:staticAnalysis))
         (SETQ refObj (_ (@ |::AnalysisCallerClass|)
                         New))
         (_ refObj FillIn self)
         (LIST refObj])

(\UnbatchMethodDefs)

(DEFINEQ

(FID.FindFurthest
  [LAMBDA (source dest spoint dpoint objlst scale UpFlg)        (* mcf " 3-Sep-85 11:47")

          (* Given two points and a list of objects this function determines if there is any interference between the region implied by the two
          points and any of the objects in the list. If there is, it makes a reasonable guess at an xcoord that will permit a link to be drawn
          around the interfering objects)

    (LET [lftpoint rgtpoint hipoint lowpoint (cleanobjlst (REMOVE source (REMOVE dest objlst]
      (COND
         ((IGREATERP (fetch XCOORD of dpoint)
                 (fetch XCOORD of spoint))
          (SETQ lftpoint spoint)
          (SETQ rgtpoint dpoint))
         (T (SETQ lftpoint dpoint)
            (SETQ rgtpoint spoint)))
      (COND
         ((IGREATERP (fetch YCOORD of spoint)
                 (fetch YCOORD of dpoint))
          (SETQ hipoint spoint)
          (SETQ lowpoint dpoint))
         (T (SETQ hipoint dpoint)
            (SETQ lowpoint spoint)))

          (* First, see if the region implied by the source and destination connect points interferes with any existing objects.
          If it does, get the xcoord that will allow you to draw around them)

      (COND
         [(for obj bind (impregion _ (UNIONREGIONS (CREATEREGION (fetch XCOORD of rgtpoint)
                                                     (IDIFFERENCE (fetch YCOORD of hipoint)
                                                                  2)
                                                     0 0)
                                        (CREATEREGION (fetch XCOORD of lftpoint)
                                                      (IPLUS (fetch YCOORD of lowpoint)
                                                             2)
                                                      0 0)))
             in cleanobjlst thereis (_ obj RegionIntersectP impregion))
          (for obj bind (lx _ (fetch XCOORD of lftpoint))
                        (rx _ (fetch XCOORD of rgtpoint))
                        (hi _ (fetch YCOORD of hipoint))
                        (low _ (fetch YCOORD of lowpoint))
                        farlx farrx reg center ox oy xx
             in (COND
                   ((IGREATERP (fetch YCOORD of dpoint)
                           (fetch YCOORD of spoint))
                    objlst)
                   (T cleanobjlst))
```

```
         first (SETQ farlx lx)
               (SETQ farrx rx)
         do (SETQ reg (@ obj %:region))
            (SETQ center (@ obj %:center))
            (SETQ ox (fetch XCOORD of center))
            (SETQ oy (fetch YCOORD of center))
            [COND
               ((AND (IGREATERP hi oy)
                     (IGREATERP oy low))
                (COND
                   ((ILESSP (SETQ xx (fetch LEFT of reg))
                            farlx)
                    (SETQ farlx xx))
                   ((IGREATERP (SETQ xx (IPLUS xx (fetch WIDTH of reg)))
                            farrx)
                    (SETQ farrx xx]
         yield                                          (* Don't modify final result if we didn't find anything wider than
                                                        ourselves)
               (COND
                  [(IGREATERP (IDIFFERENCE lx farlx)
                          (IDIFFERENCE farrx rx))
                   (COND
```

```
                      ((EQ farrx rx)
                       farrx)
                      (T (IPLUS farrx (IPLUS scale (LLSH scale 1]
                  (T (COND
                        ((EQ farlx lx)
                         farlx)
                        (T (IDIFFERENCE farlx (IPLUS scale (LLSH scale 1]
      ((AND (NOT UpFlg)
            (IGREATERP (fetch YCOORD of dpoint)
                   (fetch YCOORD of spoint)))

       (* When there is no interference, mediate between points if the destination is higher than the source)

       (RSH (IPLUS (fetch XCOORD of dpoint)
                   (fetch XCOORD of spoint))
            1])
```

(FID.TransitionOrderFn

```
  [LAMBDA (A B)                                         (* mcf%: " 5-Aug-85 14:11")
    (COND
       ((AND (_ A InstOf! 'GrafcetTransition)
             (_ B InstOf! 'GrafcetTransition))
        (ILEQ (fetch LEFT of (@ A %:region))
              (fetch LEFT of (@ B %:region)])
```

(FISAddAbbrevDelimiters

```
  [LAMBDA (self varName localSt propName activeVal type)       (* TAL "10-Jan-88 19:41")

           (* This is a getFn. The value of this getFn is returned as the value of the enclosing GetValue.)

    (LET (fore aft)
      (COND
         ((NULL localSt)
          NIL)
         (T (OR (EQ (NTHCHAR localSt 1)
                    FISAbbrevDelimiter)
                (SETQ fore FISAbbrevDelimiter))
            (OR (EQ (NTHCHAR localSt -1)
                    FISAbbrevDelimiter)
                (SETQ aft FISAbbrevDelimiter))
            (COND
               ((OR fore aft)
                (CONCAT (OR fore Nothing)
                        localSt
                        (OR aft Nothing)))
               (T localSt])
```

(GetCompositeFromWindow

```
  [LAMBDA (window)                                      (* mcf%: " 5-Sep-85 17:06")
    (@ (WINDOWPROP (OR window (WHICHW))
              'LoopsWindow)
       |:context:object|)])
```

(GetStepFromWindow

```
  [LAMBDA (stepNumber window)                           (* mcf "31-Jul-85 16:28")
    (_ (GetCompositeFromWindow window)
       GetNumberedStep stepNumber)])
)
```

```
. FOLLOWING DEFINITIONS EXPORTED

(DECLARE%: DOEVAL@COMPILE DONTCOPY

(GLOBALVARS FISAbbrevDelimiter LabelReadTbl)
)

. END EXPORTED DEFINITIONS

(RPAQQ FISAbbrevDelimiter °)

(RPAQ LabelReadTbl (COPYREADTABLE NIL))
```

```
(PROGN (PUTPROP '& 'CLISPTYPE (GETPROP 'AND 'CLISPTYPE))
       (PUTPROP '& 'LISPFN 'AND)
       (PUTPROP '& 'BROADSCOPE T)
       (PUTPROP 'AND 'CLISPINFIX '&)
       (PUTPROP '%| 'CLISPTYPE (GETPROP 'OR 'CLISPTYPE))
       (PUTPROP '%| 'LISPFN 'OR)
       (PUTPROP '%| 'BROADSCOPE T)
       (PUTPROP 'OR 'CLISPINFIX '%|)
       (ADDTOVAR CLISPCHARS & %|)
       (SETQ CLISPCHARARRAY (MAKEBITTABLE CLISPCHARS)))

;; (SETSYNTAX (CHARCODE ~) (QUOTE (MACRO (LAMBDA (FL RDTBL) (LIST (QUOTE NOT) (READ FL RDTBL))))) LabelReadTbl) Why was this here? It seems to screw
;; things up.

(SETSYNTAX (CHARCODE <)
       '[MACRO (LAMBDA (FL RDTBL)
                 'LT]
       LabelReadTbl)

(SETSYNTAX (CHARCODE >)
       '[MACRO (LAMBDA (FL RDTBL)
                 'GT]
       LabelReadTbl)

(DEFINST GrafcetTransition (AnyPreviousTransitionTemplate (|DBVO.L2[:.3J:| . 4))
       (name #,($A AnyPreviousTransitionTemplate NIL RememberName))
       (label anyprevious))

(DEFINST GrafcetTransition (OtherwiseTransitionTemplate (|DBVO.L2[:.3J:| . 5))
       (name #,($A OtherwiseTransitionTemplate NIL RememberName))
       (label otherwise))

(DEFINST GrafcetMainProgram (SimpleInitialMainTemplate (|L]VO.08Z:.bJ7| . 870))
       (subObjects (#,($& GrafcetTransition (|L]VO.08Z:.bJ7| . 871)) #,($& GrafcetInitialStep (|L]VO.08Z:.bJ7|
 . 872))))
       (rawExtent (0 0 350 250))
       (objectIdentifier (SimpleInitialMainTemplate NoVersion))
       (quietFlg NIL))

(DEFINST GrafcetMacroProgram (SimpleInOutMacroTemplate (MHVO.kga%:.6K5 . 1077))
       (subObjects (#,($& GrafcetRegularStep (MHVO.kga%:.6K5 . 1104)) #,($& GrafcetTransition (MHVO.kga%:.6K5
 . 1105)) #,($& GrafcetRegularStep (MHVO.kga%:.6K5 . 1106))))
       (rawExtent (0 0 350 250))
       (objectIdentifier (SimpleInOutMacroTemplate NoVersion))
       (quietFlg NIL))

(DEFINST GrafcetRegularStep (INStepTemplate (|FJXO.L2[:.X\=| . 28))
       (name #,($A INStepTemplate NIL RememberName))
       (stepNumber IN))

(DEFINST GrafcetRegularStep (OUTStepTemplate (|FJXO.L2[:.X\=| . 29))
       (name #,($A OUTStepTemplate NIL RememberName))
       (stepNumber OUT))

(DEFINST GrafcetTransition ((|L]VO.08Z:.bJ7| . 871))
       (label NIL)
       (superObject #,($& GrafcetMainProgram (|L]VO.08Z:.bJ7| . 870)))
       (center (180 . 190))
       (predecessors (#,($& GrafcetInitialStep (|L]VO.08Z:.bJ7| . 872))))
       (tKey 0))

(DEFINST GrafcetInitialStep ((|L]VO.08Z:.bJ7| . 872))
       (label NIL)
       (superObject #,($& GrafcetMainProgram (|L]VO.08Z:.bJ7| . 870)))
       (center (180 . 220))
       (linkType (#,($& GrafcetAsynchronousLink (|L]VO.08Z:.bJ7| . 873))))
       (successors (#,($& GrafcetTransition (|L]VO.08Z:.bJ7| . 871))))
       (stepNumber 0))

(DEFINST GrafcetRegularStep ((MHVO.kga%:.6K5 . 1104))
       (label NIL)
       (superObject #,($& GrafcetMacroProgram (MHVO.kga%:.6K5 . 1077)))
       (center (90 . 30))
       (stepNumber OUT))

(DEFINST GrafcetTransition ((MHVO.kga%:.6K5 . 1105))
       (label NIL)
       (superObject #,($& GrafcetMacroProgram (MHVO.kga%:.6K5 . 1077)))
       (center (90 . 180))
       (predecessors (#,($& GrafcetRegularStep (MHVO.kga%:.6K5 . 1106))))
       (tKey 0))
```

```
(DEFINST GrafcetRegularStep ((MHVO.kga%:.6K5 . 1106))
       (label NIL)
       (superObject #,($& GrafcetMacroProgram (MHVO.kga%:.6K5 . 1077)))
       (center (90 . 210))
       (linkType (#,($& GrafcetAsynchronousLink (MHVO.kga%:.6K5 . 1107))))
       (successors (#,($& GrafcetTransition (MHVO.kga%:.6K5 . 1105))))
       (stepNumber IN))
```

```
(DEFINST GrafcetAsyncnronousLink ((|L]VO.08Z:.bJ7| . 873))
       [drawPoints (((180 . 200]
       (linkSource #,($& GrafcetInitialStep (|L]VO.08Z:.bJ7| . 872)))
       (linkDestination #,($& GrafcetTransition (|L]VO.08Z:.bJ7| . 871))))

(DEFINST GrafcetAsyncnronousLink ((WHVO.kga%:.6K5 . 1107))
       [drawPoints (((90 . 190]
       (linkSource #,($& GrafcetRegularStep (WHVO.kga%:.6K5 . 1106)))
       (linkDestination #,($& GrafcetTransition (WHVO.kga%:.6K5 . 1105))))

(RPAQQ GrafcetInitialStepPaletteBM )
```

```
(RPAQQ GrafcetProcessStepPaletteBM )
```

```
(RPAQ AnyPreviousTransitionTemplate #.($& GrafcetTransition (|DBVO.L2[:.3J:| . 4)))

(RPAQ OtherwiseTransitionTemplate #.($& GrafcetTransition (|DBVO.L2[:.3J:| . 5)))

(RPAQ INStepTemplate #.($& GrafcetRegularStep (|FJXO.L2[:.X\=| . 28)))

(RPAQ OUTStepTemplate #.($& GrafcetRegularStep (|FJXO.L2[:.X\=| . 29)))

;; support for arrows on grafcet links

(RPAQQ FISMinArrowDistance 30)

(RPAQQ FISRightArrow >)

(RPAQQ FISDownArrow v)

(RPAQQ FISLeftArrow <)

(RPAQQ FISUpArrow ^)

(RPAQQ FISLeftIncr 8)

(RPAQQ FISRightIncr 10)

(RPAQQ FISUpIncr 20)

(DECLARE%: DOEVAL@COMPILE DONTCOPY

(GLOBALVARS FISMinArrowDistance FISRightArrow FISLeftArrow FISDownArrow FISUpArrow FISLeftIncr FISRightIncr
       FISUpIncr)
)

(PUTPROPS FIDGRAFCET FILETYPE :FAKE-COMPILE-FILE)

(PUTPROPS FIDGRAFCET COPYRIGHT ("Savoir, Inc." 1985 1986 1987 1988))
```

FUNCTION INDEX

FISCheckOnSettingIds ...........17
FISLintComplaint ...............17
GrafcetTransFnInvalid ..........17

METHOD INDEX

GrafcetMacroProgram.GetInStep ......................3
GrafcetMacroProgram.GetNamedParts ..................3
GrafcetMacroProgram.GetOutStep .....................3
GrafcetMacroProgram.GetPrintName ...................3
GrafcetMacroProgram.GetSuperEnv ....................3
GrafcetMacroProgram.InProgram? .....................3
GrafcetMacroProgram.Lint ...........................3
GrafcetMacroProgram.MainProgram ....................3
GrafcetMacroProgram.QualifyCacheFlush ..............3
GrafcetMacroProgram.SWCopyMade .....................4
GrafcetMainProgram.ChangeName ......................4
GrafcetMainProgram.CollectAllIds ...................4
GrafcetMainProgram.CollectInitialSteps .............4
GrafcetMainProgram.ComputeFolderName ...............4
GrafcetMainProgram.ComputeS/RStepALists ............4
GrafcetMainProgram.DeInstallStep ...................4
GrafcetMainProgram.FindAllMacroSteps ...............4
GrafcetMainProgram.GetSuperEnv .....................4
GrafcetMainProgram.InProgram? ......................5
GrafcetMainProgram.Kill ............................5
GrafcetMainProgram.Lint ............................5
GrafcetMainProgram.MainProgram .....................5
GrafcetMainProgram.MessageReceive ..................5
GrafcetMainProgram.NameQualifier ...................5
GrafcetMainProgram.PrintNameQualifier ..............5
GrafcetMainProgram.QualifiedPrintName ..............5
GrafcetMainProgram.Rename ..........................5
GrafcetMainProgram.SWCopyMade ......................6
GrafcetProgram.BuildCommunicationLst ...............6
GrafcetProgram.Compile .............................6
GrafcetProgram.Compile! ............................6
GrafcetProgram.CompileDecls ........................6
GrafcetProgram.CompileTransitions ..................7
GrafcetProgram.ComputeBasicExtent ..................7
GrafcetProgram.ComputeLocalMacroSteps ..............7
GrafcetProgram.ComputeNumberCache ..................7
GrafcetProgram.ComputeNumberToStepAList ............7
GrafcetProgram.ComputeS/RStepALists ................8
GrafcetProgram.ComputeSend/ReceiveStepAList ........8
GrafcetProgram.ComputeStaticAnalysis ...............8
GrafcetProgram.ComputeSteps ........................8
GrafcetProgram.ComputeTransitions ..................8
GrafcetProgram.DeInstallStep .......................8
GrafcetProgram.Document ............................8
GrafcetProgram.DocumentChart .......................9
GrafcetProgram.DocumentPart .......................11
GrafcetProgram.EvaluateTrans ......................11
GrafcetProgram.FindAllMacroPrograms ...............11
GrafcetProgram.FindAllMacroSteps ..................11
GrafcetProgram.FindBrowser ........................11
GrafcetProgram.FindMMFSProgram ....................11
GrafcetProgram.FindProcessName ....................12
GrafcetProgram.GetAccessList ......................12
GrafcetProgram.GetCompileEnv ......................12
GrafcetProgram.GetNumberedStep ....................12
GrafcetProgram.InitializeVars .....................12
GrafcetProgram.InstallStep ........................13
GrafcetProgram.InvalidNameSyntax? .................13
GrafcetProgram.Kill ...............................13
GrafcetProgram.Kill! ..............................13
GrafcetProgram.Lint ...............................13
GrafcetProgram.Lint! ..............................14
GrafcetProgram.NameConflict? ......................14
GrafcetProgram.NameQualifier ......................14
GrafcetProgram.NeedRecompile ......................15
GrafcetProgram.NextTransitionKey ..................15
GrafcetProgram.PrintNameQualifier .................15
GrafcetProgram.Rename .............................15
GrafcetProgram.SaveInstance? ......................15
GrafcetProgram.ScaleIt ............................15
GrafcetProgram.ShiftPoint .........................16
GrafcetProgram.UsesContextApplicable? .............16
GrafcetProgram.WhoUses ............................16
GrafcetProgram.WhoUses! ...........................17

VARIABLE INDEX

FISGrafcetProgramPaletteObjects ..................17
FISMainProgramPaletteObjects .....................17
FISValidCIdentifierChars .........................17
FISValidCIdentifierNeg8T .........................17
\FISRecompilingInheritedMsgPrinted ...............17

CLASS INDEX

GrafcetMacroProgram .............2
GrafcetMainProgram ..............2
GrafcetProgram ..................2

PROPERTY INDEX

FIDGRAFPROG ..................1,17 changes to: (CLASSES GrafcetMainProgram)
(METHODS GrafcetProgram.InvalidNameSyntax? GrafcetProgram.NameConflict?
GrafcetProgram.UsesContextApplicable? GrafcetMainProgram.NameQualifier
GrafcetMainProgram.PrintNameQualifier)
(VARS FIDGRAFPROGCOMS)

previous date: 5-Sep-88 17:25:59 (DSK)<LISPFILES>FIS>FIDGRAFPROG.;99

Read Table: INTERLISP

Package: IL

Copyright (c) 1986, 1987, 1997, 1988 by Savoir, Inc.. All rights reserved.

```
(RPAQQ FIDGRAFPROGCOMS
       ((DECLARE%: DONTCOPY (PROP MAKEFILE-ENVIRONMENT FIDGRAFPROG))
                                                          . File created by FEBER
        (CLASSES GrafcetMacroProgram GrafcetMainProgram GrafcetProgram)
        (METHODS GrafcetMacroProgram.GetInStep GrafcetMacroProgram.GetNamedParts
               GrafcetMacroProgram.GetOutStep GrafcetMacroProgram.GetPrintName
               GrafcetMacroProgram.GetSuperEnv GrafcetMacroProgram.InProgram? GrafcetMacroProgram.Lint
               GrafcetMacroProgram.MainProgram GrafcetMacroProgram.QualifyCacheFlush
               GrafcetMacroProgram.SWCopyMade GrafcetMainProgram.ChangeName GrafcetMainProgram.CollectAllIds
               GrafcetMainProgram.CollectInitialSteps GrafcetMainProgram.ComputeFolderName
               GrafcetMainProgram.ComputeS/RStepALists GrafcetMainProgram.DeInstallStep
               GrafcetMainProgram.FindAllMacroSteps GrafcetMainProgram.GetSuperEnv
               GrafcetMainProgram.InProgram? GrafcetMainProgram.Kill GrafcetMainProgram.Lint
               GrafcetMainProgram.MainProgram GrafcetMainProgram.MessageReceive
               GrafcetMainProgram.NameQualifier GrafcetMainProgram.PrintNameQualifier
               GrafcetMainProgram.QualifiedPrintName GrafcetMainProgram.Rename GrafcetMainProgram.SWCopyMade
               GrafcetProgram.BuildCommunicationLst GrafcetProgram.Compile GrafcetProgram.Compile!
               GrafcetProgram.CompileDecls GrafcetProgram.CompileTransitions
               GrafcetProgram.ComputeBasicExtent GrafcetProgram.ComputeLocalMacroSteps
               GrafcetProgram.ComputeNumberCache GrafcetProgram.ComputeNumberToStepAList
               GrafcetProgram.ComputeS/RStepALists GrafcetProgram.ComputeSend/ReceiveStepAList
               GrafcetProgram.ComputeStaticAnalysis GrafcetProgram.ComputeSteps
               GrafcetProgram.ComputeTransitions GrafcetProgram.DeInstallStep GrafcetProgram.Document
               GrafcetProgram.DocumentChart GrafcetProgram.DocumentPart GrafcetProgram.EvaluateTrans
               GrafcetProgram.FindAllMacroPrograms GrafcetProgram.FindAllMacroSteps
               GrafcetProgram.FindBrowser GrafcetProgram.FindMMFSProgram GrafcetProgram.FindProcessName
               GrafcetProgram.GetAccessList GrafcetProgram.GetCompileEnv GrafcetProgram.GetNumberedStep
               GrafcetProgram.InitializeVars GrafcetProgram.InstallStep GrafcetProgram.InvalidNameSyntax?
               GrafcetProgram.Kill GrafcetProgram.Kill! GrafcetProgram.Lint GrafcetProgram.Lint!
               GrafcetProgram.NameConflict? GrafcetProgram.NameQualifier GrafcetProgram.NeedRecompile
               GrafcetProgram.NextTransitionKey GrafcetProgram.PrintNameQualifier GrafcetProgram.Rename
               GrafcetProgram.SaveInstance? GrafcetProgram.ScaleIt GrafcetProgram.ShiftPoint
               GrafcetProgram.UsesContextApplicable? GrafcetProgram.WhoUses GrafcetProgram.WhoUses!)
        (FNS FISCheckOnSettingIds FISLintComplaint GrafcetTransFnInvalid)
        [VARS (\FISRecompilingInheritedMsgPrinted NIL)
               [FISMainProgramPaletteObjects '((#,($C GrafcetRegularStep) #,($C GrafcetInitialStep)
                                                    #,($C GrafcetSendStep)
                                                    #,($C GrafcetReceiveStep))
                                               (#,($C GrafcetMacroStep) #,($C GrafcetProcessStep))
                                               (#,($C GrafcetTransition) AnyPreviousTransitionTemplate
                                                    OtherwiseTransitionTemplate]
               (FISGrafcetProgramPaletteObjects '((#,($C GrafcetRegularStep) INStepTemplate OUTStepTemplate
                                                    #,($C GrafcetSendStep)
                                                    #,($C GrafcetReceiveStep))
                                                  (#,($C GrafcetMacroStep) #,($C GrafcetProcessStep))
                                                  (#,($C GrafcetTransition) AnyPreviousTransitionTemplate
                                                    OtherwiseTransitionTemplate]
        [COMS
              .. Name syntax stuff

               (VARS FISValidCIdentifierChars (FISValidCIdentifierNegBT))
               (P (SETQ FISValidCIdentifierNegBT (MAKEBITTABLE FISValidCIdentifierChars T]
        (PROP FILETYPE FIDGRAFPROG)))

(DECLARE%: DONTCOPY

(PUTPROPS FIDGRAFPROG MAKEFILE-ENVIRONMENT (:PACKAGE "IL" :READTABLE "INTERLISP" :BASE 10))
)


File created by FEBER

                                                                                          Page 2


(DEFCLASS GrafcetMacroProgram (MetaClass Class Edited%:         . Edited 22-Jun-88 19:19 by TAL
                                      doc "This is the default metaClass for all classes")
       (Supers GrafcetProgram)
       (InstanceVariables (mainProgram #,($A (caller mainProgram) GetIndirectThroughIV NoUpdatePermitted) doc
                                  "Top level program of which this step is a part")
              (inStep #,($A GetInStep AVSendSelf ReplaceMe) DontSave Any doc "The IN step of this macro")
              (outStep #,($A GetOutStep AVSendSelf ReplaceMe) DontSave Any doc "The OUT step of this macro"))
       )

(DEFCLASS GrafcetMainProgram (MetaClass Class Edited%:          . Edited 8-Sep-88 17:07 by mcf
                                     doc "This is the default metaClass for all classes")
       (Supers GrafcetProgram)
       (ClassVariables (PaletteFIDObjects
                               #,($A (PROGN FISMainProgramPaletteObjects) EveryFetch NoUpdatePermitted))
              (CachedIVs
  #,($A (macroPrograms macroSteps ids allSendStepAList allReceiveStepAList) UnionSuperValue NoUpdatePermitted)
                    doc "the other FirstFetch IVs here get updated correctly as changes are made")
              (BrowseableSubParts #,($A (mapAssociations) UnionSuperValue NoUpdatePermitted))
              (FolderExtension MAPAssociations)
              (Prototype #,($& GrafcetMainProgram (SFXO.1Y%:.L12.03< . 1689)) doc
                                                                 (* CV added by FEBER))
              (NameSyntaxBitTable #,($A (PROGN FISValidCIdentifierNegBT) EveryFetch NoUpdatePermitted) doc
                    "On main program so it can be shadowed by library main program"))
       (InstanceVariables (mainProgram #,($A SHARED GetSelf NoUpdatePermitted) DontSave Any doc "Top level
                            program of which this step is a part")
              (label #,($A printName GetFromIV NoUpdatePermitted) DontSave Any)
              (macroPrograms #,($A FindAllMacroPrograms FFSendSelf ReplaceMe) DontSave Any doc "The macro
                    programs at any level in this program (not necessarily included in :steps)")
              (ids #,($A #,($A CollectAllIds FFSendSelf ReplaceMe) NIL FISCheckOnSettingIds) DontSave Any doc
                  "All identifiers we know about")
              (initialSteps #,($A CollectInitialSteps FFSendSelf ReplaceMe) DontSave Any doc "The steps that
                    are initially active")
```

```
        (interestingStateVariables NIL doc "List of interesting variables to appear when showing short
              list in simulation")
        (processContext NIL DontSave Any doc "link back to context simulating this program")
        (mapAssociations NIL VR #,($C MapAssociationFolder) Editable T doc "MAP associations
              permissable at and below this main program")
        (animation NIL DontSave Any doc "Value is an animation object, if this grafcet has some
              animation associated with it")
        (mmi NIL doc "Atomic name of the mmi prototyper process associated with this grafcet")
        (version 2.17 doc "Version under which this object was last saved. If version is less than or
              equal to 2.17 the named objects must be qualified. The version is made the current one
              on qualification or when the file is written.")
        (allSendStepAList #,($A ComputeS/RStepALists FFSendSelf ReplaceMe) DontSave Any doc "AList
              mapping sender name to (step sendProg) pair")
        (allReceiveStepAList #,($A ComputeS/RStepALists FFSendSelf ReplaceMe) DontSave Any doc
              "AList mapping receiver name to (step sendProg) pair")
        (macroSteps #,($A FindAllMacroSteps FFSendSelf ReplaceMe) DontSave Any doc "The macro step
              names at any level in this program")
        (renameQualifier NIL DontSave Any doc "temporary holder for qualified name when renaming")))

(DEFCLASS GrafcetProgram (MetaClass Class Edited%:          . Edited 2-Aug-88 16.42 by mct
                      doc "This is the default metaClass for all classes")
    (Supers SWNamedObject FIDCompositeObject FactoryProgram)
    (ClassVariables (Composition (steps transitions))
        (PrintName "Grafcet")
        (Prototype #,($& GrafcetProgram (LSUO.1E+%:.Ce9 . 12)))
        (PaletteFIDObjects #,($A (PROGN FISGrafcetProgramPaletteObjects) EveryFetch NoUpdatePermitted))
        (CachedIVs
      #,($A (staticAnalysis sendStepAList receiveStepAList rawExtent) UnionSuperValue NoUpdatePermitted)
              doc "the other FirstFetch IVs here get updated correctly as changes are made")
        (MinScale 2 doc "smallest scale size")
        (MinWidth 350 doc "used for width")
        (MinHeight 250 doc "used for height")
        (ScaleFactors (Up 2 Down 2)
              doc "Scale factors for respective size choices")
        (DocumentationParts (cDecls))
        (AnalysisCallerClass #,($C AnalysisRefDecls)))
    (InstanceVariables (steps #,($A ComputeSteps FFSendSelf ReplaceMe) DontSave Any VR #,($C GrafcetStep)
                      doc "the top level steps that make up this Grafcet program")
        (transitions #,($A ComputeTransitions FFSendSelf ReplaceMe) DontSave Any VR
              #,($C GrafcetTransition)
              doc "the transitions that make up this Grafcet program")
        (staticAnalysis #,($A ComputeStaticAnalysis FFSendSelf ReplaceMe) DontSave Any)
        (declsAnalysis NIL DontSave Any doc "Condensed analysis (ala staticAnalysis) of decls")
        (declsDetail NIL DontSave Any doc "Detailed analysis of decls")
        (numberToStepAList #,($A ComputeNumberToStepAList FFSendSelf ReplaceMe) DontSave Any doc
              "AList mapping step number into step")
        (sendStepAList #,($A ComputeSend/ReceiveStepAList FFSendSelf ReplaceMe) DontSave Any doc
              "AList mapping sender name to step")
        (receiveStepAList #,($A ComputeSend/ReceiveStepAList FFSendSelf ReplaceMe) DontSave Any)
        (numberCache #,($A ComputeNumberCache FFSendSelf ReplaceMe) DontSave Any doc "Largest number
```

```
              entered so far")
        (progScale 10 doc "Scale of objects displayed here")
        (quietFlg NIL doc "disables label printing")
        (mainProgram NIL doc "Top level program of which this step is a part")
        (cDecls NIL doc "Declarations and subroutines")
        (cEnv NIL DontSave Any doc "C environment resulting from compiling the declarations, and in
              which steps and transitions are compiled")
        (localIds NIL DontSave Any doc "C identifiers of static vars declared at this level")
        (transFn NIL DontSave Any doc "Name of composite function that evaluates transitions")
        (initFn NIL DontSave Any doc "Name of function that performs static variable initialization")))

(\BatchMethodDefs)

(Method ((GrafcetMacroProgram GetInStep) self) "Method documentation"
   (_ self GetNumberedStep 'IN))

(Method ((GrafcetMacroProgram GetNamedParts) self PartLst PartType)
                                                       . mct: 7-Oct-87 13:16
   "Specialization"
   [COND
      ((OR (NOT PartType)
           (EQ PartType 'Macro))
       (SETQ PartLst (NCONC1 PartLst self])

(Method ((GrafcetMacroProgram GetOutStep) self) "Method documentation"
   (_ self GetNumberedStep 'OUT))

(Method ((GrafcetMacroProgram GetPrintName) self)
                                                       . mct: 15-Sep-87 13.27
   "Specialization"
   (FISDequalifyName (_Super self GetPrintName)))
```

```
(Method ((GrafcetMacroProgram GetSuperEnv) self)
                                                    TAL 31-Oct-87 22.22
  "Returns the C environment of my super"
  (LET ((caller (@ %:caller)))
    (AND caller (_ (@ caller %:superObject)
                   GetCompileEnv))))

(Method ((GrafcetMacroProgram InProgram?) self program)
                                                    mcf 31-Dec-87 13.28
  "True if self is part of the specified program"
  [LET (caller)
    (OR (EQ self program)
        (AND (SETQ caller (ObjectExists? (@ %:caller)))
             (_ caller InProgram? program)])

(Method ((GrafcetMacroProgram Lint) self Stream)    mcf 17 Dec-86 11 42
  "Specialization"
  (bind sALst first (SETQ sALst (@ %:numberToStepAList)) for s in '(IN OUT)
     when (NOT (FASSOC s sALst)) do (FISLintComplaint self Stream (CONCAT "Missing " s " step")
                                                  T))
  (_Super self Lint Stream))

(Method ((GrafcetMacroProgram MainProgram) self)
                                                    TAL 18-Nov-87 17 56
  "New method template"
  (_ (@ %:caller)
     MainProgram))

(Method ((GrafcetMacroProgram QualifyCacheFlush) self)
                                                    mcf: 17 Sep-87 11 54
  "Specialization"
  [COND
    ((FISQualified self))
    (T (_ self ChangeName (FISQualifyName self (_ self GetName)))]
  (_ self CacheFlush))
```

Page 4

```
(Method ((GrafcetMacroProgram SWCopyMade) self XLations)
                                                    mcf: 30-Oct-87 16.04
                                                    Specialization
  "(_Super self SWCopyMade XLations)"
  [LET (pid qid (id (@ self %:objectIdentifier)))
    (COND
      (id (SETQ pid (MKATOM (fetch SWIDPrimaryName of id)))
          (_@ self %:objectIdentifier (create SWObjectIdentifier
                               SWIDPrimaryName _ (OR (CDR (FASSOC pid (fetch MacroPrograms
                                                                        of XLations)))
                                                     (AND (SETQ qid (fetch Qualifier
                                                                      of XLations))
                                                          (FISQualifyName NIL (
                                                                        FISDequalifyName
                                                                         pid)
                                                                   qid))
                                                     pid)
                       copying id))])

(Method ((GrafcetMainProgram ChangeName) self NewName)
                                                    mcf: 24-Sep-87 10.57
  "Specialization"
  (_Super self ChangeName (FISDequalifyName NewName NIL T)))

(Method ((GrafcetMainProgram CollectAllIds) self)   TAL 1-Nov-87 16.27
  "Returns list of all CCIdentifiers declared globally in the main program"
  (for mac in (@ %:macroPrograms) join (APPEND (@ mac %:localIds))))

(Method ((GrafcetMainProgram CollectInitialSteps) self)
                                                    mcf: 8-Dec-86 12.32
  "New method template"
  (for s in (@ %:steps) when (EQ (@ s %:stepType)
                                 'InitialStep)
     collect s))

(Method ((GrafcetMainProgram ComputeFolderName) self)
                                                    mcf: 8-Oct-86 16.45
  "New method template"
  (AND (@ %:label)
       (PACK* (@ %:label)
              "."
              (@ |::FolderExtension|))))
```

```
(Method ((GrafcetMainProgram ComputeS/RStepALists) self varName)
                                                        mct 22-Oct-87 11 41
   "New method template"
   (bind lst for mac in (@ %:macroPrograms) when (SETQ lst (SELECTQ varName
                                                        ((allSendStepAList Send)
                                                            (@ mac %:sendStepAList))
                                                        ((allReceiveStepAList Receive)
                                                            (@ mac %:receiveStepAList))
                                                        NIL))
      join (COPY lst)))

(Method ((GrafcetMainProgram DeInstallStep) self step)
                                                        mct: 8-Dec-86 12.29
   "Specialization"
   (AND (EQ (@ step %:stepType)
            'InitialStep)
        (change (@ %:initialSteps)
                (DREMOVE step DATUM)))
   (_Super self DeInstallStep step))

(Method ((GrafcetMainProgram FindAllMacroSteps) self)
                                                        mct: 15-Oct-87 14 11
   "Specialization"
   (for x in (@ %:macroPrograms) join (_ x ComputeLocalMacroSteps)))

(Method ((GrafcetMainProgram GetSuperEnv) self)   TAL 31-Oct-87 22 39
   "A main program's super environment is empty"
   (CC.MakeCompileEnvironment NIL))
```

Page 5

```
(Method ((GrafcetMainProgram InProgram?) self program)
                                                        TAL 8-Oct-85 23:25
   "True if self is part of the specified program"
   (EQ self program))

(Method ((GrafcetMainProgram Kill) self)                mct: 15-Jan-88 13:40
   "Specialization"
   (DECLARE (GLOBALVARS ActiveSimulations))
   (LET (active (map (@ %:mapAssociations)))
     (AND FISGlobalModuleLst (SETQ FISGlobalModuleLst (DREMOVE (_ self GetName)
                                                        FISGlobalModuleLst)))
     (AND (ObjectExists? map)
          (_ map Kill))
     (AND (LISTP ActiveSimulations)
          (SETQ active (FASSOC self ActiveSimulations))
          (SETQ ActiveSimulations (DREMOVE active ActiveSimulations)))
     (_Super self Kill)))

(Method ((GrafcetMainProgram Lint) self Stream)         mct: 17-Dec-86 11:43
   "Specialization"
   (OR (@ %:initialSteps)
       (FISLintComplaint self Stream "Missing initial step" T))
   (_Super self Lint Stream))

(Method ((GrafcetMainProgram MainProgram) self)   TAL 18-Nov-87 17 54
   "A MainProgram is its own MainProgram"
   self)

(Method ((GrafcetMainProgram MessageReceive) self Id Cmd Local Remote)
                                                        mct: 14-Oct-86 13.44
   "New method template"
   (SELECTQ Cmd
        ((Association)                                  (* put id into connection variable)
             [LET (element (pc (@ %:processContext)))
               (COND
                  ((AND Id Local Remote (SETQ element (@ %:mapAssociations))
                        (SETQ element (@ element %:elements))
                        [SETQ element (for e in element thereis (AND (EQ Local (@ e %:local))
                                                                     (EQ Remote (@ e %:remote)]
                        (SETQ element (@ element %:connectionVariable))
                        (ObjectExists? pc))
                   (_ pc SetStateVariable element Id)]])
        NIL))

(Method ((GrafcetMainProgram NameQualifier) self). Edited 7-Sep-88 12.02 by mct
   "New method template"
   (@ self printName))

(Method ((GrafcetMainProgram PrintNameQualifier) self)
                                                        Edited 7 Sep-88 12:02 by mct
   "Method documentation"
   (OR (@ self renameQualifier)
       (_ self NameQualifier)))
```

```
(Method ((GrafcetMainProgram QualifiedPrintName) self)
                                                  . Edited 2-Sep-86 15:56 by mct
                                                  . mct: 18-Jan-88 13:23

   "Specialization"
   (@ self printName))

(Method ((GrafcetMainProgram Rename) self QualName ProgName StepName)
                                                  mct: 30-Oct-87 13.33
   "Specialization"
   (LET ((q QualName)
         (p ProgName))
     (COND
        ((AND p (NOT q))
         (SETQ q p)))
     (_Super self Rename q p StepName)))
```

```
(Method ((GrafcetMainProgram SWCopyMade) self XLations)
                                                  . mct: 30-Oct-87 15.51
                                                  : Specialization
   "(_Super self SWCopyMade XLations)"
   [LET (pid (id (@ self %:objectIdentifier)))
     (COND
        (id (SETQ pid (MKATOM (fetch SWIDPrimaryName of id)))
            (_@ self %:objectIdentifier (create SWObjectIdentifier
                                    SWIDPrimaryName _ (OR (fetch Qualifier of XLations)
                                                          pid)
                               copying id))])

(Method ((GrafcetProgram BuildCommunicationLst) self Macs)
                                                  . mct 31-Dec-87 11:19
   "Build a list containing a source/destination representation of all the communication occuring at and
   below this step"
   (LET [aLst (macs (OR Macs (_ self FindAllMacroPrograms)]
     [SETQ aLst (bind sLst for mp in macs when (SETQ sLst (@ mp %:sendStepAList))
                  join (bind temp for s in sLst when (SETQ temp (@ (CADR s)
                                                                   %:sendableTemplates))
                          collect (bind ed dests for e in (@ temp %:elements)
                                     when (SETQ ed (MKATOM (@ e %:destination)))
                                     do (pushnew dests ed) yield (CONS (CAR s)
                                                                       dests]
     [bind rLst for mp in macs when (SETQ rLst (@ mp %:receiveStepAList))
        do (bind temp for r in rLst when (SETQ temp (@ (CADR r)
                                                       %:receivableTemplates))
              do (bind es srcs for e in (@ temp %:elements) when (SETQ es (MKATOM (@ e %:source)))
                    do (pushnew srcs es) finally (AND srcs (COND
                                                              ((SETQ temp (FASSOC (CAR r)
                                                                                  aLst))
                                                               (for x in srcs
                                                                  do (pushnew (CDR temp)
                                                                              x)))
                                                              (T (push aLst (CONS (CAR r)
                                                                                  srcs]
     aLst))

(Method ((GrafcetProgram Compile) self)           . mct: 3-Dec-86 15:52
   "New method template"
   (AND (_ self CompileDecls)
        (_ self CompileTransitions)))

(Method ((GrafcetProgram Compile!) self)          mct: 3-Dec-86 15:52
                                                  . Compile me then all my parts
   "Old (_ self SendToParts (QUOTE After) (QUOTE Compile))"
   [LET (mSteps)
     (_ self Lint)
     (COND
        [(_ self CompileDecls)
         (_ self CompileTransitions)
         [for x in (@ %:steps) do (SELECTQ (@ x %:stepType)
                                     (Macro (push mSteps x))
                                     (_ x SendToParts 'After 'Compile)]
         (bind mProg for x in mSteps do (COND
                                          ((ObjectExists? (SETQ mProg (@ x %:macroProgram)))
                                           (_ mProg Compile!)]
        (T (FISCompileMsg (CONCAT "Errors in declarations -- not compiling " (@ %:printName)
                                  " or below
                                  "])

(Method ((GrafcetProgram CompileDecls) self)      . TAL 16-Nov-87 09.37
   "Compiles the declaration string, returning NIL iff an error occurred"
   (LET ((decls (@ %:cDecls))
         (superEnv (_ self GetSuperEnv))
         (FISCompilingObject self)
         env)
```

```
(DECLARE (SPECVARS FISCompilingObject))
(_ self NeedRecompile)                          (* Make sure children know they need to get redone)
[SETQ env (COND
              ((NULL superEnv)                  (* Something above us didn't compile)
               NIL)
              [(AND (STRINGP decls)
                    (NEQ 0 (NCHARS decls)))
               (CAR (NLSETQ (CC.CompileString decls 0 superEnv
                                  '(QUIET T FunctionPrefix ,(CONCAT (_ self NameQualifier)
                                                                    FISNameQSepr]
```

Page

```
              (T (CC.MakeCompileEnvironment superEnv]
(COND
   (env                                         (* If successful, update list of vars declared at this level
                                                (and, for now, cause list of all ids in main to be recomputed))
        (_@ %:localIds (CCEnv.GlobalIDs env))
        (_@ |:mainProgram:ids| NotSetValue)
        (_@ %:initFn (CC.StaticInitFn env))
        (_@ %:declsAnalysis (bind anal for detail in (_@ %:declsDetail (CCEnv.Analysis env))
                             do [change anal (UnionStaticAnalysis DATUM (FISStaticAnalysisFromDetail
                                                                          (CDR detail]
                             yield anal)))
   (T
      (* Compile failed here or above. Don't change localIds or initFn so can still run existing simulation.)
))
(_@ %:cEnv env)
env))
```

(Method ((GrafcetProgram CompileTransitions) self file)
. TAL 31-Mar-88 17:40
. Builds a SELECTQ out of all the transitions, and compiles it into transFn

```
"Need to figure out a way to avoid always recompiling all the transitions."
(LET ((trans (@ %:transitions))
      (ccEnv (_ self GetCompileEnv))
      errors code name)
  (COND
     (ccEnv [SETQ code '(LAMBDA (key anyPrevious /stateVariables\)
                          (SELECTQ key
                             (\,@ (bind expr for tran in trans
                                     eachtime (OR (SETQ expr (_ tran CompileTrans ccEnv))
                                                  (SETQ errors T))
                                     collect (LIST (@ tran %:tKey)
                                                   expr)))
                             (GrafcetTransFnInvalid ',(@ self %:printName)]
          (CC.QuietCompile (LIST (CONS (_@ %:transFn (PACK* (_ self GetName)
                                                            '.\Trans))
                                       code))
                  file)
          (NOT errors))
     (T NIL))))
```

(Method ((GrafcetProgram ComputeBasicExtent) self)
. mcf: 18-Dec-85 20:45

```
"Starting size for new object's browser"
(CREATEREGION 0 0 (@ |::MinWidth|)
       (@ |::MinHeight|)))
```

(Method ((GrafcetProgram ComputeLocalMacroSteps) self)
. mcf: 2-Oct-87 10:06

```
"New method template"
(for x in (@ %:steps) collectwhen (AND (AND (EQ 'Macro (@ x %:stepType)))
                                       (@ x %:macroProgramName))))
```

(Method ((GrafcetProgram ComputeNumberCache) self)
. TAL 9-Aug-85 23:15

```
"New method template"
(MAX (for n in (@ %:numberToStepAList) when (NUMBERP (CAR n)) maximize (CAR n))
     -1))
```

(Method ((GrafcetProgram ComputeNumberToStepAList) self)
. mcf: 24-Oct-86 15:26
. New method template

```
"(for step in (@ :steps) collect (CONS (@ step :stepNumber) step) when (NOT (_ step InstOf! ($ GrafcetMacroStep))))"
(for step in (@ %:steps) collect (CONS (@ step %:stepNumber)
                                       step)))
```

```
(Method ((GrafcetProgram ComputeS/RStepALists) self varName)
                                                  , mct: 22-Oct-87 11.52
  "New method template"
  (bind lst for mac in (_ self FindAllMacroPrograms) when (SETQ lst (SELECTQ varName
                                                         ((allSendStepAList Send)
                                                              (@ mac %:sendStepAList))
                                                         ((allReceiveStepAList Receive)
                                                              (@ mac %:receiveStepAList))
                                                         NIL))
     join (COPY lst)))

(Method ((GrafcetProgram ComputeSend/ReceiveStepAList) self varName)
                                                  , TAL 11-Mar-86 08:06
  "New method template"
  (for step in (@ %:steps) when (_ step InstOf! (SELECTQ varName
                                                  (sendStepAList
                                                       (DEFERREDCONSTANT ($ GrafcetSendStep)))
                                                  (receiveStepAList
                                                       (DEFERREDCONSTANT ($ GrafcetReceiveStep)))
                                                  (SHOULDNT)))
     collect (LIST (MKATOM (@ step %:label))
                   step)))

(Method ((GrafcetProgram ComputeStaticAnalysis) self)
                                                  , TAL 16-Nov-87 09.37
  "New method template"
  (LET (analysis)
    [for part in (@ %:steps) do (change analysis (UnionStaticAnalysis DATUM (@ part %:staticAnalysis)]
    [for part in (@ %:transitions) do (change analysis (UnionStaticAnalysis DATUM (@ part %:staticAnalysis)]
    (change analysis (UnionStaticAnalysis DATUM (@ %:declsAnalysis)))
    analysis))

(Method ((GrafcetProgram ComputeSteps) self)      , mct: 16-Oct-87 08:17
  "New method template"
  (SORT (bind (vr _ (@ !:steps:,VR!)) for x in (@ %:subObjects) when (_ x InstOf! vr) collect x)
        (FUNCTION FISSortByStepNumber)))

(Method ((GrafcetProgram ComputeTransitions) self)
                                                  ; TAL 9-Aug-85 22.12
  "New method template"
  (bind (vr _ (@ !:transitions:,VR!)) for x in (@ %:subObjects) when (_ x InstOf! vr) collect x))

(Method ((GrafcetProgram DeinstallStep) self step)   , mct: 22-Jul-86 09:12
  "Remove the specified step from me"
  (change (@ %:steps)
          (DREMOVE step DATUM))
  (_@ self %:numberToStepAList NotSetValue)
  (_@ %:numberCache (_ self ComputeNumberCache)))

(Method ((GrafcetProgram Document) self Stream Index)
                                                  , mct: 4-Aug-87 10.02
  "New method template"
  (LET (oldFont orient (name (@ self %:printName))
             (turnPageFlg T))
    (DECLARE (SPECVARS turnPageFlg))
    (SETQ oldFont (DSPFONT NIL Stream))
    (SETQ orient (_ self DocumentChart Stream))
    (DSPFONT FISDocCCodeFont Stream)
    (AND Index (FISDocIndexEntry Stream Index 'GrafProg name))
    (bind (FirstTime _ T) for tran in (@ %:transitions) when (@ tran %:abbreviation)
       do (COND
            (FirstTime (FISTurnPage Stream 'PORTRAIT)
                   (printout Stream .FONT FISDocCHeaderFont (CONCAT (OR name Nothing)
                                                                    " Transition Label Abbreviations:")
                             T T)
                   (SETQ FirstTime NIL)))
          (_ tran Document Stream Index))
    (for partiv in (@ !::DocumentationParts!) do (_ self DocumentPart Stream partiv Index))
    (for s in [SORT (COPY (@ %:steps))
                   (FUNCTION (LAMBDA (A B)         (* document IN and OUT steps first, MMFS steps last)
                                (LET ((anum (@ A %:stepNumber))
                                      (bnum (@ B %:stepNumber))
                                      a b)
                                  (AND (EQ (@ A %:stepType)
                                           'MMFS)
                                       (NUMBERP anum)
```

```
                                       (add anum MAX.SMALLP))
                                  (AND (EQ (@ B %:stepType)
                                           'MMFS)
                                       (NUMBERP bnum)
                                       (add bnum MAX.SMALLP))
                                  (SETQ a (COND
                                            ((FIXP anum))
                                            ((EQ anum 'IN)
                                             -1)
```

```
                              ((EQ anum 'OUT)
                               (CONSTANT (SUB1 MAX.SMALLP)))
                              (T 0)))
                    (SETQ b (COND
                              ((FIXP bnum))
                              ((EQ bnum 'IN)
                               -1)
                              ((EQ bnum 'OUT)
                               (CONSTANT (SUB1 MAX.SMALLP)))
                              (T 0)))
                    (GREATERP b a]
     do (_ s Document Stream Index))
   (DSPFONT oldFont Stream)))

(Method ((GrafcetProgram DocumentChart) self Stream)
                                                        . mcl: 5-Oct-87 15.20
   "Print a program's chart"
   (DECLARE (GLOBALVARS FISDocLandscapeChartFlg FISDocShrinkChartFlg \FISDocumentationUninterruptable
                 \FISInterruptDocumentation))
   (DECLARE (USEDFREE turnPageFlg))
   (LET (clip newScale margin scale swidth sheight xsheets ysheets
         (offset (OR (STREAMPROP Stream 'XYOFFSET)
                     (create POSITION
                             XCOORD _ 0
                             YCOORD _ 0)))
         (orient 'PORTRAIT)
         (dspScale (FIX (DSPSCALE NIL Stream)))
         (oldScale (@ %:progScale))
         (extent (@ %:rawExtent))
         (fontScale 0)
         (sX 0)
         (sY 0))
    (FISChangeOrientation Stream orient T)
    (SETQ clip (DSPCLIPPINGREGION NIL Stream))
    (SETQ scale dspScale)
    (SETQ swidth (TIMES scale (fetch WIDTH of extent)))
    (SETQ sheight (TIMES scale (fetch HEIGHT of extent)))
    (SETQ margin (TIMES scale FISDocFromLeft))
    .. See if the chart fits without any changes in either portrait or landscape orientations.  If not, and shrinking is allowed, try to make it fit on a landscape page
    (COND
       ((LEQ swidth (DIFFERENCE (fetch PRIGHT of clip)
                               margin))
        (SETQ turnPageFlg NIL)
        (DSPNEWPAGE Stream))
       ([AND FISDocLandscapeChartFlg (LEQ swidth (DIFFERENCE (fetch PTOP of clip)
                                                             margin))
          (LEQ sheight (DIFFERENCE (fetch PRIGHT of clip)
                                  (TIMES 3 scale FISDocFromTop]
        (FISChangeOrientation Stream (SETQ orient 'LANDSCAPE))
        (SETQ clip (DSPCLIPPINGREGION NIL Stream)))
       [FISDocShrinkChartFlg (FISChangeOrientation Stream (SETQ orient 'LANDSCAPE))
             (SETQ clip (DSPCLIPPINGREGION NIL Stream))
             (SETQ scale (bind pwidth width for s from scale to 1 by -1
                            first (SETQ $$VAL scale)
                                  (SETQ pwidth (fetch PRIGHT of clip))
                                  (SETQ width (fetch WIDTH of extent))
                            thereis [NOT (MINUSP (DIFFERENCE pwidth (TIMES width s]
                            finally (AND (ILESSP s scale)
                                         (SETQ fontScale -4]
       (T (DSPNEWPAGE Stream)))
    (SETQ newScale (TIMES oldScale scale))
    [SETQ extent (create REGION
                        LEFT _ (TIMES scale (fetch LEFT of extent))
                        BOTTOM _ (TIMES scale (fetch BOTTOM of extent))
                        WIDTH _ (TIMES scale (fetch WIDTH of extent))
                        HEIGHT _ (TIMES scale (fetch HEIGHT of extent]
                                                              . center
    (COND
       ((LEQ (fetch WIDTH of extent)
             (IDIFFERENCE (fetch PRIGHT of clip)
                    margin))
```

```
        (add sX (QUOTIENT (IDIFFERENCE (fetch PRIGHT of clip)
                                 (fetch WIDTH of extent))
                      2)))
       (T (add sX margin)))
    (add sX (IMINUS (fetch LEFT of extent)))                . adjust by extent
    (add sY (IMINUS (fetch BOTTOM of extent)))
    (add sY (DIFFERENCE (DIFFERENCE (DSPTOPMARGIN NIL Stream)
                               (TIMES 2 FISDocFromTop dspScale))
                  (fetch HEIGHT of extent)))                . adjust below title
    (FISDocPrintHeader Stream (CONCAT "Documentation for: " (@ self %:printName)))
    (DSPFONT (SELECTQ (IPLUS oldScale fontScale)
                 ((2 4 6)
                    '(HELVETICA 6))
                 ((8 10 12)
                    '(HELVETICA 8 BOLD))
                 ((14 16)
                    '(HELVETICA 10 BOLD))
                 '(HELVETICA 12 BOLD))
         Stream)
```

```
(RESETLST
    (RESETSAVE \FISDocumentationUninterruptable T)
    (RESETSAVE (DSPRIGHTMARGIN (PLUS (DSPRIGHTMARGIN NIL Stream)
                                     (fetch WIDTH of extent))
                     Stream)
           (LIST 'DSPRIGHTMARGIN (DSPRIGHTMARGIN NIL Stream)
                 Stream))
    (RESETSAVE (PROGN (AND (WINDOWP (@ self %:displayStream))
                           (WINDOWPROP (@ self %:displayStream)
                                 'LoopsWindow NIL))
                     (PutValue self 'displayStream Stream))
           (LIST [FUNCTION (LAMBDA (self Stream)
                             (PutValue self 'displayStream Stream)
                             (AND (WINDOWP Stream)
                                  (WINDOWPROP Stream 'LoopsWindow (@ self %:displayEditor)]
                 self
                 (@ self %:displayStream)))
    (RESETSAVE (DoMethod self 'ScaleIt NIL oldScale newScale)
          (LIST 'DoMethod self ''ScaleIt NIL newScale oldScale))
    (RESETSAVE NIL '(SETQ \FISDocumentationUninterruptable T))
    (SETQ \FISDocumentationUninterruptable NIL)
    (COND
       (\FISInterruptDocumentation (RESET)))
    (SETQ swidth (IDIFFERENCE (fetch WIDTH of clip)
                     margin))
    (SETQ sheight (IDIFFERENCE (fetch HEIGHT of clip)
                      (TIMES 2 FISDocFromTop dspScale)))
                                    ; (SETQ sheight (IDIFFERENCE (fetch HEIGHT of clip) (LLSH margin 1)))
    (SETQ xsheets (IQUOTIENT (fetch WIDTH of extent)
                      swidth))
    (AND (IREMAINDER (fetch WIDTH of extent)
             swidth)
        (add xsheets 1))
    [SETQ ysheets (IQUOTIENT (fetch HEIGHT of extent)
                      (IDIFFERENCE sheight (IDIFFERENCE (fetch HEIGHT of clip)
                                                (DSPTOPMARGIN NIL Stream]
    (AND [IREMAINDER (fetch HEIGHT of extent)
             (IDIFFERENCE sheight (IDIFFERENCE (fetch HEIGHT of clip)
                                       (DSPTOPMARGIN NIL Stream]
        (add ysheets 1))
    (replace XCOORD of offset with sX)
    (replace YCOORD of offset with sY)
    (SETFILEINFO Stream 'XYOFFSET offset)
    (COND
       ((OR (IGREATERP xsheets 1)
            (IGREATERP ysheets 1))
        (SETQ turnPageFlg T)
        (bind head page first (SETQ head (STREAMPROP Stream 'HEADING NIL))
                              (SETQ page (STREAMPROP Stream 'PAGENUMBER NIL))
           to ysheets do (to xsheets do (_ self DrawAll Stream)
                                        (change (fetch XCOORD of offset)
                                               (IDIFFERENCE DATUM swidth))
                                        (SETFILEINFO Stream 'XYOFFSET offset)
                                        (DSPNEWPAGE Stream)
                            finally (replace XCOORD of offset with sX))
                         (change (fetch YCOORD of offset)
                                (IPLUS DATUM sheight))
                         (SETFILEINFO Stream 'XYOFFSET offset)
           finally (STREAMPROP Stream 'HEADING head)
                   (STREAMPROP Stream 'PAGENUMBER page)))
       (T (_ self DrawAll Stream)))
    (replace XCOORD of offset with 0)
    (replace YCOORD of offset with 0)
```

Page 11

```
    (SETFILEINFO Stream 'XYOFFSET offset)
    (COND
       ((AND FISDocCompressFlg (NOT turnPageFlg))
        (DSPXPOSITION (DSPLEFTMARGIN NIL Stream)
              Stream)
        (DSPYPOSITION (DIFFERENCE (DIFFERENCE (DSPTOPMARGIN NIL Stream)
                                        (TIMES 4 FISDocFromTop dspScale))
                            (fetch HEIGHT of extent))
              Stream)
        (OR [IGREATERP (DSPYPOSITION NIL Stream)
                  (IPLUS (DSPBOTTOMMARGIN NIL Stream)
                         (TIMES FISDocMinLinesLeft (DSPLINEFEED NIL Stream]
            (SETQ turnPageFlg T)))
       (T (SETQ turnPageFlg T))))
  (SETQ \FISDocumentationUninterruptable NIL)
  (COND
     (\FISInterruptDocumentation (RESET)))
  orient))
```

(Method ((GrafcetProgram DocumentPart) self Stream PartIV Index)
mcf: 4-Aug-87 09:58

```
  "New method template"
  (LET (part name)
    (SELECTQ PartIV
        (cDecls (COND
                   ([AND (SETQ part (GetValue self PartIV))
                         (NOT (ZEROP (NCHARS part]
                    (FISTurnPage Stream 'PORTRAIT)
```

```
                (SETQ name (@ self %:printName))
                (AND Index (FISDocIndexEntry Stream Index 'GrafDecls name))
                (printout Stream .FONT FISDocCHeaderFont "C Declarations for: " name T T)
                (printout Stream .FONT FISDocCCodeFont part T T))))
        NIL)))

(Method ((GrafcetProgram EvaluateTrans) self trans process anyPrevious)
                                                            . TAL 29-Jun-86 08.45
   "New method template"
   [LET ((fn (@ %:transFn))
         (key (@ trans %:tKey))
         (/stateVariables\ (@ process %:stateVariables)))
     (DECLARE (SPECVARS /stateVariables\))
     (COND
        ((AND fn (DEFINEDP fn))
         (APPLY* fn key anyPrevious /stateVariables\))
        (T (HELP "Macro has no transition fn: " fn])

(Method ((GrafcetProgram FindAllMacroPrograms) self)
                                                            . TAL 5-Mar-86 05.29
   "New method template"
   (CONS self (bind prog for ms in (@ %:steps) when (AND (EQ (@ ms %:stepType)
                                                            'Macro)
                                                        (SETQ prog (@ ms %:macroProgram)))
               join (_ prog FindAllMacroPrograms))))

(Method ((GrafcetProgram FindAllMacroSteps) self) . mcf: 15-Oct-87 14 04
   "New method template"
   (for x in (_ self FindAllMacroPrograms) join (_ x ComputeLocalMacroSteps)))

(Method ((GrafcetProgram FindBrowser) self)         . mcf: 22-Jul-87 16:09
   "New method template"
   (ObjectExists? (_ self CheckPropList 'FOEGRAFCETBROWSER)))

(Method ((GrafcetProgram FindMMFSProgram) self name type goDownFlg)
                                                            . TAL 5-Mar-86 06:02
   "Finds a MMFS sender or receiver (specified by type) from its name."
   [OR [CADR (FASSOC name (SELECTQ type
                              ((Receive Receiver receive receiver)
                                  (@ %:receiveStepAList))
                              ((Send Sender send sender)
                                  (@ %:sendStepAList))
                              (SHOULDNT]
      (COND
         (goDownFlg (bind step for m in (@ %:steps) when (_ m InstOf! (DEFERREDCONSTANT ($ GrafcetMacroStep)
                                                                                          ))
                        thereis (AND (SETQ m (@ m %:macroProgram))
                                     (SETQ step (_ m FindMMFSProgram name type T)))
```

```
                        thenyield step))
         ((AND (NOT (_ self InstOf! 'GrafcetMainProgram))
               (@ |:macroStep:caller|))
          (_ (@ |:macroStep:caller|)
             FindMMFSProgram name type NIL)])

(Method ((GrafcetProgram FindProcessName) self)   . TAL 9-Oct-85 22.27
   "Returns the name of the send or receive step at top level, if any"
   (LET [(aList (OR (@ %:receiveStepAList)
                    (@ %:sendStepAList))]
     (AND aList (CAAR aList))))

(Method ((GrafcetProgram GetAccessList) self access)
                                                            . TAL 18-Nov-87 12.06
   "New method template"
   [for mp in (_ self FindAllMacroPrograms) funion (bind (anal _ (@ mp %:staticAnalysis)) for x inside access
                                                  funion (CDR (FASSOC x anal])

(Method ((GrafcetProgram GetCompileEnv) self)     . TAL 2-Nov-87 16:59
   "Return cEnv resulting from decls at this level. If none current, recompile decls to create one and warn
   user that it will take longer."
   (DECLARE (SPECVARS \FISRecompilingInheritedMsgPrinted))
   (COND
      ((@ %:cEnv))
      ((AND (NOT \FISRecompilingInheritedMsgPrinted)
            (@ %:cDecls))

        (* Only print the msg once, and even then don't bother if no local decls, as CompileDecls will be quick and can't fail)

       [LET ((\FISRecompilingInheritedMsgPrinted T))
         (printout PROMPTWINDOW .TAB0 0 "Recompiling inherited decls...")
         (RESETFORM (CURSOR WAITINGCURSOR)
                (COND
                   ((_ self CompileDecls)
                    (printout PROMPTWINDOW "  OK."))
                   (T (printout PROMPTWINDOW "  Failed."]
```

```
      (@ %:cEnv))
    (T (_ self CompileDecls)
       (@ %:cEnv))))
```

(Method ((GrafcetProgram GetNumberedStep) self stepNumber)
. TAL 5-Mar-86 08.04

.. Returns the step of this program with the specified number

```
   "Step numbers are either the number of a top level step or a list (I J) . If I is the atom M, then this
   specifies macro step J. If I is a number, then this specifies step J of macro step I. In this last case. J
   can also be the atom IN or OUT"
   (COND
      [(ATOM stepNumber)
       (CDR (LISTP (FASSOC stepNumber (@ %:numberToStepAList)]
      ((LISTP stepNumber)                         (* Complex step numbers should no longer be used)
                                                  (* (LET ((m (CAR stepNumber)) (s (CADR stepNumber)) mac)
                                                  (COND ((EQ m (QUOTE M)) (CDR (FASSOC s
                                                  (@ %:numberToMacroStepAList)))) ((FIXP m)
                                                  (SETQ mac (CDR (FASSOC m (@ %.numberToMacroStepAList))))
                                                  (COND (mac (_ mac GetNumberedStep s))))))
       (SHOULDNT))))
```

(Method ((GrafcetProgram InitializeVars) self svHash) . TAL 6-Aug-86 13.54

```
   "Call the initializer function that was built from the static variable declarations"
   [LET ((initFn (@ %:initFn))
         (/stateVariables\ svHash))
     (DECLARE (SPECVARS /stateVariables\))
     (COND
        ((AND initFn (OR (EXPRP initFn)
                         (DEFINEDP initFn)))           (* (APPLY* initFn svHash))
         (APPLY* initFn])
```

(Method ((GrafcetProgram InstallStep) self step) . mcf: 16-Oct-87 08:16

```
   "Install the specified step as an immediate part of me"
   [LET ((stepn (@ step %:stepNumber)))
     (pushnew (@ %:steps)
              step)
     (SORT (@ %:steps)
           (FUNCTION FISSortByStepNumber))
     (COND
        ((_ step InstOf! 'GrafcetInitialStep)
         (pushnew (@ self %:initialSteps)
                  step)))
     (COND
        ((PROGN                                   (* For now, macro numbers and step numbers come from the same
                                                  pool)
                                                  (* (NOT (_ step InstOf! (QUOTE GrafcetMacroStep))))
                  T)
         (_@ self %:numberToStepAList NotSetValue)
         (AND (NUMBERP stepn)
              (change (@ self %:numberCache)
                      (MAX stepn DATUM])
```

(Method ((GrafcetProgram InvalidNameSyntax?) self Name MainProgram)
. Edited 8-Sep-88 17:33 by mcf

```
   "Method documentation"
   (DECLARE (GLOBALVARS FISValidCIdentifierNegBT))
   (LET [(mp (ObjectExists? (OR MainProgram (@ self mainProgram)]
     (COND
        ((NUMBERP (NTHCHAR Name 1))
         "contains invalid syntax")
        ((STRPOSL (COND
                     (mp (@ mp NameSyntaxBitTable))
                     (T FISValidCIdentifierNegBT))
                  Name)
         "contains invalid syntax"))))
```

(Method ((GrafcetProgram Kill) self) . mcf: 5-Sep-87 11 10

```
   "Specialization"
   (LET [(oldTrans (@ %:transFn))
         (hiers (_ self CheckPropList 'GRAFCETSTRUCTUREBROWSER)]
     (AND hiers (for h in hiers do (_ (CADR h)
                                      DeleteObject self)))
     (AND (DEFINEDP oldTrans)
          (PUTD oldTrans NIL))
     (_Super self Kill)))
```

(Method ((GrafcetProgram Kill!) self) . mcf: 18-Sep-87 16 29

```
   "New method template"
   (_ self SendToParts NIL 'Kill))
```

```
(Method ((GrafcetProgram Lint) self Stream)                    mcf: 11-Jan-87 23:14
   "New method template"
   (bind msgString kind for s in (@ self %:steps) when (_ s InstOf! 'GrafcetMacroStep)
      eachtime (SETQ msgString NIL) do (COND
                                          ((NOT (@ s %:macroProgramName))
                                           (SETQ msgString " not labeled")
                                           (SETQ kind "Step "))
                                          ((NOT (@ s %:macroProgram))
                                           (SETQ msgString " undefined")
                                           (SETQ kind "Program ")))
                                       (AND msgString (FISLintComplaint self Stream
                                                         (CONCAT "Macro " kind
                                                                 (OR (@ s %:label)
                                                                     (CONCAT 'M (@ s %:stepNumber)))
                                                                 msgString)
                                                         T)))
   [bind source dest stype for s in (@ self %:steps) eachtime (SETQ source (SETQ dest NIL))
                                                              (SETQ stype (@ s %:stepType))
      do (AND (NOT (@ s %:predecessors))
              (NEQ (@ s %:stepNumber)
                   'IN)
              (NEQ stype 'InitialStep)
              (SETQ source T))
         (AND (NOT (@ s %:successors))
              (NEQ (@ s %:stepNumber)
                   'OUT)
              (SETQ dest T))
         (COND
            ((OR source dest)
```

```
             (FISLintComplaint self Stream (CONCAT (SELECTQ stype
                                                            (InitialStep 'Initial)
                                                            stype)
                                                   " Step "
                                                   (OR (@ s %:label)
                                                       (CONCAT (OR (AND (EQ stype 'Macro)
                                                                        'M)
                                                                   Nothing)
                                                               (@ s %:stepNumber)))
                                                   " has no "
                                                   (OR (AND source "source ")
                                                       Nothing)
                                                   (OR (AND source dest "or ")
                                                       Nothing)
                                                   (OR (AND dest "destination ")
                                                       Nothing)
                                                   "links"]
   [bind source dest for tran in (@ self %:transitions) eachtime (SETQ source (SETQ dest NIL))
      do (AND (NOT (@ tran %:predecessors))
              (SETQ source T))
         (AND (NOT (@ tran %:successors))
              (SETQ dest T))
         (COND
            ((OR source dest)
             (FISLintComplaint self Stream (CONCAT "Transition " (OR (@ tran %:label)
                                                                     Nothing)
                                                   " has no "
                                                   (OR (AND source "source ")
                                                       Nothing)
                                                   (OR (AND source dest "or ")
                                                       Nothing)
                                                   (OR (AND dest "destination ")
                                                       Nothing)
                                                   "links"])

(Method ((GrafcetProgram Lint!) self Stream)                   mcf: 3-Dec-86 16:52
   "New method template"
   (for mp in (_ self FindAllMacroPrograms) do (_ mp Lint Stream)))

(Method ((GrafcetProgram NameConflict?) self Name Type)
                                                     Edited 8-Sep-86 17:33 by mcf
   "Check validity of both syntax and step type conflicts"
   [LET (qName (type (OR Type 'Macro))
               (mp (@ self mainProgram))
               (name (MKATOM Name)))
     (COND
        ((_ self InvalidNameSyntax? name mp))
        (mp (SELECTQ type
                (Macro (SETQ qName (FISQualifyName mp name))
                       (AND (OR (EQ name (_ mp GetName))
                                (FMEMB qName (@ mp macroSteps)))
                            "conflicts with existing Macro program"))
                (Main (AND (SWDereferenceName name)
                           "conflicts with existing Main program"))
                (MMFSSend (AND (FASSOC name (@ mp allSendStepAList))
                               "conflicts with existing Send step"))
                (MMFSReceive (AND (FASSOC name (@ mp allReceiveStepAList))
                                  "conflicts with existing Receive step"))
                NIL])
```

```
(Method ((GrafcetProgram NameQualifier) self)          . Edited  5-Sep-88 15.41 by mcf
                                                        . mcf:  9-Sep-87 15.24
  "New method template"
  [LET ((obj (@ self mainProgram)))
    (COND
      ((ObjectExists? obj)
       (_ obj NameQualifier)])
```

```
(Method ((GrafcetProgram NeedRecompile) self)      . TAL  1-Nov-87 14:30
  "When decls are changed, all decls below need to be recompiled. Eventually this should mark other things
  as well"
  [LET NIL
    (COND                                        (* Can stop recursion as soon as we hit one that isn't compiled)
      ((@ %:cEnv)
       (_@ %:cEnv NIL)
       (bind prog for ms in (@ %:steps) when [AND (EQ (@ ms %:stepType)
                                                       'Macro)
                                                   (ObjectExists? (SETQ prog (@ ms %:macroProgram)]
          do (_ prog NeedRecompile)])

(Method ((GrafcetProgram NextTransitionKey) self)  . TAL 29-Jun-86 07.08
  "Returns the next available selectq key for a transition condition in the composite function stored in the
  macro prog"
  [LET [(l (for x in (@ %:transitions) collectwhen (NUMBERP (@ x %:tKey)]
    (for n from 1 suchthat (NOT (FMEMB n l])

(Method ((GrafcetProgram PrintNameQualifier) self) . Edited  5-Sep-88 15.40 by mcf
  "Method documentation"
  [LET ((obj (@ self mainProgram)))
    (COND
      ((ObjectExists? obj)
       (_ obj PrintNameQualifier)])

(Method ((GrafcetProgram Rename) self QualName ProgName StepName)
                                                      . mcf:  7-Oct-87 10.25
  "New method template"
  [LET (brwsr oldTrans newTrans psteps (oldName (_ self GetName)))
    (COND
      ((OR QualName (AND ProgName (NEQ ProgName oldName)))
       (for s in (@ self steps) do (SELECTQ (@ s stepType)
                                     (Macro (AND QualName (_ s Rename QualName)))
                                     ((Process Task)
                                       (push psteps s)
                                       (_ s SendToParts NIL 'Rename QualName ProgName StepName))
                                     (_ s SendToParts NIL 'Rename QualName ProgName StepName)))
       (_ self ChangeName (FISQualifyName self (OR ProgName (FISDequalifyName oldName))
                                   QualName))
       [COND
         (psteps (for s in psteps do (_ s SendToParts NIL 'ObjectChanged)]
       (COND
         ((SETQ oldTrans (@ self transFn))
          (SETQ newTrans (PACK* (_ self GetName)
                                '..\Trans))
          (COND
            ((DEFINEDP oldTrans)
             (MOVD oldTrans newTrans)
             (PUTD oldTrans NIL)))
          (_@ self transFn newTrans)])

(Method ((GrafcetProgram SaveInstance?) self file outInstances)
                                                      . TAL  5-Mar-86 01 46
  "Don't save on files just because someone pointed to us (which they shouldn't really) . This probably
  belongs in SWNamedObject"
  [AND file (_Super self SaveInstance? file outInstances)
       (FMEMB (@ self %:name)
              (FILECOMSLST file 'INSTANCES])

(Method ((GrafcetProgram ScaleIt) self oldscale newscale ShiftX ShiftY BeforeFlg)
                                                      . mcf: 17-Jul-87 14:23
  "Change display size of object"
  [COND
    ((OR ShiftX ShiftY (NEQ oldscale newscale))
     (_@ self %:progScale newscale)
     (_@ self %:quietFlg NIL)
     (_@ self %:rawExtent NotSetValue)
     (for obj in (@ %:subObjects)
        do (_@ obj %:dirty T)
           (_ obj ClearRegions)
           (_@ obj %:center (_ self ShiftPoint (@ obj %:center)
                                  oldscale newscale ShiftX ShiftY BeforeFlg))
           (for link in (@ obj %:linkType)
              do (COND
                   ((_ link InstOf! ($ GrafcetSynchronousLink))
                    (_@ link %:drawPoints NIL))
                   (T (_@ link %:drawPoints
```

```
                    (for lst in (@ link %:drawPoints)
                       collect (for pt in lst
                                  collect (_ self ShiftPoint pt oldscale newscale ShiftX ShiftY
                                                BeforeFlg)))))])
```

(Method ((GrafcetProgram ShiftPoint) self point oldscale newscale ShiftX ShiftY BeforeFlg)
. mcf: 21-Aug-86 14:17

```
"New method template"
[LET (x y)
  (COND
    [(OR ShiftX ShiftY)
     (COND
       [BeforeFlg (SETQ x (fetch XCOORD of point))
              (AND (FIXP ShiftX)
                   (add x ShiftX))
              (SETQ y (fetch YCOORD of point))
              (AND (FIXP ShiftY)
                   (add y ShiftY))
              (create POSITION
                      XCOORD _ (ITIMES (LRSH newscale 1)
                                       (IQUOTIENT x (LRSH oldscale 1)))
                      YCOORD _ (ITIMES (LRSH newscale 1)
                                       (IQUOTIENT y (LRSH oldscale 1]
       (T [SETQ x (ITIMES (LRSH newscale 1)
                          (IQUOTIENT (fetch XCOORD of point)
                                     (LRSH oldscale 1]
          (AND (FIXP ShiftX)
               (add x ShiftX))
          [SETQ y (ITIMES (LRSH newscale 1)
                          (IQUOTIENT (fetch YCOORD of point)
                                     (LRSH oldscale 1]
          (AND (FIXP ShiftY)
               (add y ShiftY))
          (create POSITION
                  XCOORD _ x
                  YCOORD _ y]
    (T (create POSITION
               XCOORD _ (ITIMES (LRSH newscale 1)
                                (IQUOTIENT (fetch XCOORD of point)
                                           (LRSH oldscale 1)))
               YCOORD _ (ITIMES (LRSH newscale 1)
                                (IQUOTIENT (fetch YCOORD of point)
                                           (LRSH oldscale 1])
```

(Method ((GrafcetProgram UsesContextApplicable?) self)
. Edited 12-Sep-88 20.05 by mcf

```
"Should a Vars used context apply to me? Default is yes."
T)
```

(Method ((GrafcetProgram WhoUses) self item access) . TAL 4-Dec-87 19:33
. New method template

```
"(LET (res) (COND ((FISInAnalysis? item access (@ :staticAnalysis)) (SETQ res (APPEND (for part in (@
:steps) join (_ part WhoUses item access)) (for part in (@ :transitions) join (_ part WhoUses item
access)))) (COND ((FISInAnalysis? item access (@ :declsAnalysis)) (CONS self res)) (T res)))))"
[LET (res)
  (COND
    ((FISInAnalysis? item access (@ %:staticAnalysis))
     [SETQ res (APPEND (for part in (@ %:steps) join (_ part WhoUses item access))
                       (for part in (@ %:transitions) join (_ part WhoUses item access)]
     (COND
       ((FISInAnalysis? item access (@ %:declsAnalysis))
        (NCONC (bind refObj l (refClass _ (@ |::AnalysisCallerClass|)) for fn in (@ %:declsDetail)
                  when (SETQ l (FISInDetailedAnalysis? item access (CDR fn)))
                  collect (SETQ refObj (_ refClass New))
                        (_ refObj FillIn self (SELECTQ (CAR fn)
                                                       (.Top. NIL)
                                                       (CAR fn))
                                  l)
                        refObj)
               res))
       (T res])
```

(Method ((GrafcetProgram WhoUses!) self item access)
. TAL 22-Nov-87 16.04

```
"New method template"
(for x in (_ self FindAllMacroPrograms) join (_ x WhoUses item access)))
```

```
(\UnbatchMethodDefs)

(DEFINEQ
```

(FISCheckOnSettingIds
```
  [LAMBDA (self varName newValue propName activeVal type)      (* mcf%: "17-Feb-88 12.01")
```

(* This is a putFn. *NOTE* The value of this function will be returned as the value of any enclosing PutValue. This usually means that you want to return the value returned by PutLocalState.)
(* Clear cache on process context when collected ids change)

```
(LET [(pc (ObjectExists? (@ %:processContext)]
  (PutLocalState activeVal newValue self varName propName type)
  (COND
     (pc (_@ pc %:stateVariableNames NotSetValue)
         (_ (@ pc %:myBrowser)
            ClearSVCache T)])
```

(FISLintComplaint

```
                                                        (* mcl%. "17-Dec-86 11 40")
 [LAMBDA (self Stream Msg ErrorFlg)
   (LET [(stream (OR Stream (FISGetCompileErrorStream]
     (printout stream (OR (AND ErrorFlg "Error")
                          "Warning")
           ": Grafcet Syntax in "
           (@ self %:printName)
           T)
     (printout stream .TAB 2 Msg T T])
```

(GrafcetTransFnInvalid

```
                                                        (* TAL "31-Mar-88 17 42")
 [LAMBDA (name)                                         (* Called from compiled transition in when key not found)
   (ERROR (CONCAT "Grafcet program " name " has been edited and needs to be recompiled."])
)

(RPAQQ \FISRecompilingInheritedMsgPrinted NIL)

(RPAQQ FISMainProgramPaletteObjects ((#,($C GrafcetRegularStep) #,($C GrafcetInitialStep)
                                     #,($C GrafcetSendStep)
                                     #,($C GrafcetReceiveStep))
                                    (#,($C GrafcetMacroStep) #,($C GrafcetProcessStep))
                                    (#,($C GrafcetTransition) AnyPreviousTransitionTemplate
                                     OtherwiseTransitionTemplate)))

(RPAQQ FISGrafcetProgramPaletteObjects ((#,($C GrafcetRegularStep) INStepTemplate OUTStepTemplate
                                        #,($C GrafcetSendStep)
                                        #,($C GrafcetReceiveStep))
                                       (#,($C GrafcetMacroStep) #,($C GrafcetProcessStep))
                                       (#,($C GrafcetTransition) AnyPreviousTransitionTemplate
                                        OtherwiseTransitionTemplate)))

;; Name syntax stuff

(RPAQQ FISValidCIdentifierChars
       (65 66 67 68 69 70 71 72 73 74 75 76 77 78 79 80 81 82 83 84 85 86 87 88 89 90 97 98 99 100 101 102
           103 104 105 106 107 108 109 110 111 112 113 114 115 116 117 118 119 120 121 122 95 48 49 50 51 52
           53 54 55 56 57))

(RPAQQ FISValidCIdentifierNegBT NIL)

(SETQ FISValidCIdentifierNegBT (MAKEBITTABLE FISValidCIdentifierChars T))

(PUTPROPS FIDGRAFPROG FILETYPE :FAKE-COMPILE-FILE)

(PUTPROPS FIDGRAFPROG COPYRIGHT ("Savoir, Inc." 1986 1987 1997 1988))
```

FUNCTION INDEX

AbortGrafcetMacroStep ....13
EvaluateLispProgramObject ....13
ExpandSimulationBreak ....14
FactoryProcessBrowser-ClearSVCache ....15
FISBackgroundProcess ....14
FISEvaluateExpr ....14
FISRunInterrupts ....14
FLDifference ....15
GetBrowserObjectRegions ....16
GetFISRegions ....15
GrafcetStepOrder ....15
SimulateFactoryProcess ....15
SVCloseFN ....13
SVTopWhenSelectedFN ....14
USTREQUAL ....16
\DeviceCommand ....16
\RequestSystemReset ....16

METHOD INDEX

FactoryProcessBrowser.AddStateWindow ....2
FactoryProcessBrowser.Browse ....2
FactoryProcessBrowser.CheckStopButton ....3
FactoryProcessBrowser.ClearSVCache ....3
FactoryProcessBrowser.ComputeDisplayedStateVariables ....3
FactoryProcessBrowser.ComputeSVRegion ....3
FactoryProcessBrowser.ContentsChanged ....3
FactoryProcessBrowser.ContinueProcess ....3
FactoryProcessBrowser.CreateMethodMenu ....4
FactoryProcessBrowser.CreateStateDisplay ....4
FactoryProcessBrowser.CreateStateMenu ....4
FactoryProcessBrowser.CreateStateWindow ....4
FactoryProcessBrowser.Destroy ....4
FactoryProcessBrowser.FastSim ....5
FactoryProcessBrowser.HandleSimulationBreak ....5
FactoryProcessBrowser.Initialize ....5
FactoryProcessBrowser.InitializeManually ....5
FactoryProcessBrowser.InitializeState ....5
FactoryProcessBrowser.InstallSelection ....6
FactoryProcessBrowser.OneManualScan ....6
FactoryProcessBrowser.OneScan ....6
FactoryProcessBrowser.PrintRunState ....6
FactoryProcessBrowser.RemoveStateWindow ....6
FactoryProcessBrowser.ShowAllState ....7
FactoryProcessBrowser.ShowSelectedState ....7
FactoryProcessBrowser.ShowState ....7
FactoryProcessBrowser.StartProcess ....7
FactoryProcessBrowser.StartSimProcess ....8
FactoryProcessBrowser.StopProcess ....8
FactoryProcessBrowser.SVAbortFN ....6
FactoryProcessBrowser.SVCloseFN ....6
FactoryProcessBrowser.SVExitFN ....7
FactoryProcessBrowser.SVInstall ....7
FactoryProcessBrowser.SVOKFN ....7
FactoryProcessBrowser.ToggleStateDisplay ....8
FactoryProcessBrowser.UpdateMMIVariableDisplay ....8
FactoryProcessBrowser.UpdateStateVariableDisplay ....9
GrafcetProcessContext.AbortStepInProc ....9
GrafcetProcessContext.ActivateStep ....9
GrafcetProcessContext.ClearAllHighlights ....10
GrafcetProcessContext.DeactivateStep ....10
GrafcetProcessContext.Exit ....10
GrafcetProcessContext.InitializeState ....11
GrafcetProcessContext.Reset ....11
GrafcetProcessContext.ScanChart ....11
GrafcetProcessContext.ScanProcessSteps ....12
GrafcetProcessContext.SetStateVariable ....12
GrafcetProcessContext.SetupForSimulation ....12
GrafcetProcessContext.StepActive? ....12
GrafcetProcessContext.UpdateActiveStepHighlights ....13
RunActorContext.AddingTraceFilter ....13
RunActorContext.ComputeSVNames ....13
RunActorContext.RemovingTraceFilter ....13

VARIABLE INDEX

ActiveSimulations ....17
FactoryProcessStateMenus ....17
FISDefaultAnimationWait ....17
FISMaxAnimationWait ....17
FISPrettyReadtable ....17
FISScanRepeatLimit ....17
ProcessBrowserMenuItems ....16

PROPERTY INDEX

FISGlobalClock ....17
GRAFSIM ....1,17
SimulationBreak ....16

MACRO INDEX

DeviceCommand ....17
RequestSystemReset ....17
SimulationBreak ....17

CLASS INDEX

FactoryProcessBrowser ...........2 GrafcetProcessContext ...........2 RunActorContext ................2

RECORD INDEX

ProgActivationChanges ..........17 changes to: (CLASSES FactoryProcessBrowser)
(METHODS FactoryProcessBrowser.CreateStateWindow)

previous date: 2-Aug-88 17:56:26 {DSK}<LISPFILES2>FIS>GRAFSIM.;135

Read Table: INTERLISP

Package: IL

;; Copyright (c) 1985, 1986, 1987, 1988 by Savoir, Inc.. All rights reserved.

```
(RPAQQ GRAFSIMCOMS
       [(DECLARE%: DONTCOPY (PROP MAKEFILE-ENVIRONMENT GRAFSIM))
        (CLASSES FactoryProcessBrowser GrafcetProcessContext RunActorContext)
        (METHODS FactoryProcessBrowser.AddStateWindow FactoryProcessBrowser.Browse
               FactoryProcessBrowser.CheckStopButton FactoryProcessBrowser.ClearSVCache
               FactoryProcessBrowser.ComputeDisplayedStateVariables FactoryProcessBrowser.ComputeSVRegion
               FactoryProcessBrowser.ContentsChanged FactoryProcessBrowser.ContinueProcess
               FactoryProcessBrowser.CreateMethodMenu FactoryProcessBrowser.CreateStateDisplay
               FactoryProcessBrowser.CreateStateMenu FactoryProcessBrowser.CreateStateWindow
               FactoryProcessBrowser.Destroy FactoryProcessBrowser.FastSim
               FactoryProcessBrowser.HandleSimulationBreak FactoryProcessBrowser.Initialize
               FactoryProcessBrowser.InitializeManually FactoryProcessBrowser.InitializeState
               FactoryProcessBrowser.InstallSelection FactoryProcessBrowser.OneManualScan
               FactoryProcessBrowser.OneScan FactoryProcessBrowser.PrintRunState
               FactoryProcessBrowser.RemoveStateWindow FactoryProcessBrowser.SVAbortFN
               FactoryProcessBrowser.SVCloseFN FactoryProcessBrowser.SVExitFN FactoryProcessBrowser.SVInstall
               FactoryProcessBrowser.SVOKFN FactoryProcessBrowser.ShowAllState
               FactoryProcessBrowser.ShowSelectedState FactoryProcessBrowser.ShowState
               FactoryProcessBrowser.StartProcess FactoryProcessBrowser.StartSimProcess
               FactoryProcessBrowser.StopProcess FactoryProcessBrowser.ToggleStateDisplay
               FactoryProcessBrowser.UpdateMMIVariableDisplay
               FactoryProcessBrowser.UpdateStateVariableDisplay GrafcetProcessContext.AbortStepInProc
               GrafcetProcessContext.ActivateStep GrafcetProcessContext.ClearAllHighlights
               GrafcetProcessContext.DeactivateStep GrafcetProcessContext.Exit
               GrafcetProcessContext.InitializeState GrafcetProcessContext.Reset
               GrafcetProcessContext.ScanChart GrafcetProcessContext.ScanProcessSteps
               GrafcetProcessContext.SetStateVariable GrafcetProcessContext.SetupForSimulation
               GrafcetProcessContext.StepActive? GrafcetProcessContext.UpdateActiveStepHighlights
               RunActorContext.AddingTraceFilter RunActorContext.ComputeSVNames
               RunActorContext.RemovingTraceFilter)
        (FNS AbortGrafcetMacroStep EvaluateLispProgramObject SVCloseFN SVTopWhenSelectedFN
             ExpandSimulationBreak FISBackgroundProcess FISEvaluateExpr FISRunInterrupts FLDifference
             FactoryProcessBrowser-ClearSVCache GetFISRegions GrafcetStepOrder SimulateFactoryProcess
             GetBrowserObjectRegions USTREQUAL \DeviceCommand \RequestSystemReset)
        (VARS ProcessBrowserMenuItems)
        (PROP ARGNAMES SimulationBreak)
        (MACROS DeviceCommand RequestSystemReset SimulationBreak)
        (RECORDS ProgActivationChanges)
        (PROP GLOBALVAR FISGlobalClock)
        (EXPORT (GLOBALVARS FISPrettyReadtable ActiveSimulations FactoryProcessStateMenus))
        (INITVARS (FactoryProcessStateMenus (LIST (CONS 1 2)))
               (ActiveSimulations NIL)
               (FISScanRepeatLimit 1)
               (FISPrettyReadtable (COPYREADTABLE NIL)))
        (VARS FISDefaultAnimationWait FISMaxAnimationWait)
        (EXPORT (GLOBALVARS FISScanRepeatLimit FISDefaultAnimationWait FISMaxAnimationWait))
        (P (SETSYNTAX '%# 'OTHER FISPrettyReadtable))
        (PROP FILETYPE GRAFSIM)
        (DECLARE%: DONTEVAL@LOAD DOEVAL@COMPILE DONTCOPY COMPILERVARS (ADDVARS (NLAMA)
                                                                              (NLAML)
                                                                              (LAMA])

(DECLARE%: DONTCOPY

(PUTPROPS GRAFSIM MAKEFILE-ENVIRONMENT (:PACKAGE "IL" :READTABLE "INTERLISP" :BASE 10))
)
```

```
(DEFCLASS FactoryProcessBrowser (MetaClass Class Edited%:        ; Edited 11-Sep-88 17:09 by TAL
                                       doc "This is the default metaClass for all classes")
       (Supers Browser BrowserMenuWindowMixin)
       (ClassVariables (PrintName "Process Simulation")
              (MethodItems #.($A (PROGN ProcessBrowserMenuItems) EveryFetch NoUpdatePermitted))
              (MinHeight 20))
       (InstanceVariables (simulationProcess NIL doc "the lisp process performing a simulation, if any")
              (scanDismissTime #.($A 1 FFCache NoUpdatePermitted) doc "Time to wait between scans")
```

```
        (autoScanFlg NIL doc "T if auto scan process should keep going")
        (autoScanEvent NIL doc "Event for waking up auto scan process")
        (stateVariableWindows #,($A NIL NIL FactoryProcessBrowser-ClearSVCache))
        (stateVariableMenu NIL doc "cache for state variable menu")
        (displayedStateVariables #,($A ComputeDisplayedStateVariables FFSendSelf NoUpdatePermitted) doc
              "List of names of displayed variables")
        (oldStateVariables NIL doc "Record of old values so can update only changed")
        (updateSVOn #,($A T FFCache ReplaceMe) doc "On when automatic update of state variables is
              enabled")
        (stopMenuItemRegion NIL doc "For checking stop button during scan")
        (initializeDone NIL doc "to keep it from happening twice in a row")
        (mmiStateVariables #,($A NIL FFCache NoUpdatePermitted) doc "state variables maintained by the
              MMI")))

(DEFCLASS GrafcetProcessContext (MetaClass Class Edited%:      (* TAL "23-Apr-88 17:52")
                                  doc "This is the default metaClass for all classes")
    (Supers RunActorContext)
    (ClassVariables (Browser #,($C FactoryProcessBrowser))
        (MenuDoc "Watch a execution of a program")
        (MenuName "Run Program")
        (InitialActions (SetupForSimulation))
        (StateIVs (activeSteps activatedSteps deactivatedSteps activeProcessSteps)))
    (InstanceVariables (program #,($A object GetFromIV NoUpdatePermitted))
        (activeSteps NIL doc "List of currently active steps")
        (activatedSteps NIL doc "List of steps that were activated on the most recent scan")
        (deactivatedSteps NIL doc "List of steps that were deactivated on the most recent scan")
        (activeProcessSteps NIL doc "List of active process macro steps")
        (activationChanges NIL doc "Harray indexed by macro step, containing ProgActivationChanges
              record listing changes in that macro step")
        (initialConditions T doc "T if the first scan hasn't run yet")
        (resetRequested NIL doc "If set to T, an initialize will be done after the current scan")
        (scanNumber NIL doc "Counts scans since initialize")
        (cAllocations NIL doc "\CR.BasePointers is bound to this during sim, so allocated storage can
              be freed when process reset")
        (activityFlg NIL doc "Set to T during scan by events to indicate that another scan might be
              useful")))

(DEFCLASS RunActorContext (MetaClass Class Edited%:      (* TAL " 7-Mar-88 00:13")
                           doc "This is the default metaClass for all classes")
    (Supers DefaultContext)
    (InstanceVariables (object NIL VR #,($C GrafcetMainProgram) doc "The program running in this process")
        (stateVariableNames #,($A ComputeSVNames FFSendSelf ReplaceMe) doc "List of state variable
              names")
        (stateVariables NIL doc "HARRAY of state variable names and values")))

(\BatchMethodDefs)

(Method ((FactoryProcessBrowser AddStateWindow) self swBrowser)
                                                  mct: 1-Jul-86 10:53
  "New method template"
  (push (@ %:stateVariableWindows)
        swBrowser)
  (_@ swBrowser %:myProcessBrowser self))

(Method ((FactoryProcessBrowser Browse) self)     TAL 15-Oct-85 09:16
  "Specialization"
  (_ self PositionBrowser 160 80)
  (_ self Clear)
  (DSPSCROLL 'ON (@ %:window))
  (_ self InitializeState))
```

Page 3

```
(Method ((FactoryProcessBrowser CheckStopButton) self)
                                                  TAL 5-Oct-85 17:15
  "New method template"
  [LET (window menu item itemRegion pos)
    (COND
      ([AND (MOUSESTATE (OR LEFT MIDDLE))
            (@ %:autoScanFlg)
            [EQ (WHICHW LASTMOUSEX LASTMOUSEY)
                (SETQ window (WFROMMENU (SETQ menu (@ %:methodMenu)]
            (INSIDEP (SETQ itemRegion (@ %:stopMenuItemRegion))
                     (SETQ pos (CURSORPOSITION NIL window]
       (FLIPREGION window itemRegion)
       (until [COND
                ((AND (MOUSESTATE UP)
                      (INSIDEP itemRegion (CURSORPOSITION NIL window pos)))
                 (_ self StopProcess)
                 T)
                ((NOT (INSIDEP itemRegion (CURSORPOSITION NIL window pos]
          do T finally (FLIPREGION window itemRegion])

(Method ((FactoryProcessBrowser ClearSVCache) self TypeOnlyFlg)
                                                  mct: 17-Feb-88 12:02
  "New method template"
  (for x in (@ %:stateVariableWindows) do (_ x ClearSVCache TypeOnlyFlg)))

(Method ((FactoryProcessBrowser ComputeDisplayedStateVariables) self)
                                                  mct: 30-Jun-86 11:29
  "Return list of all state variables associated with stateVariableWindows"
  (for svwindow in (@ %:stateVariableWindows) funion (@ svwindow %:properties)))
```

```
(Method ((FactoryProcessBrowser ComputeSVRegion) self varList attachFlg)
                                                        . mct: 20-Jun-86 08.15
  "Compute a region for an inspectw displaying the vars in varList, to be attached at my upper left"
  (LET (iwRegion (font (DEFAULTFONT 'DISPLAY))
           (region (ATTACHEDWINDOWREGION (@ %:window)))
           width height)
    (SETQ width (WIDTHIFWINDOW (IMIN (IPLUS (IMAX (for x in varList maximize (STRINGWIDTH x font NIL))
                                                  16)
                                            10
                                            (STRINGWIDTH "1234" font NIL))
                                     250)))
    (SETQ height (HEIGHTIFWINDOW [IMIN 606 (ITIMES (FONTHEIGHT font)
                                                   (COND
                                                     (varList (LENGTH varList))
                                                     (T 1]
                  T))
    [COND
      [attachFlg (SETQ iwRegion (create REGION
                                        WIDTH _ width
                                        HEIGHT _ height))
            (replace LEFT of iwRegion with (IDIFFERENCE (fetch LEFT of region)
                                                        (fetch WIDTH of iwRegion)))
            (replace BOTTOM of iwRegion with (IDIFFERENCE (fetch PTOP of region)
                                                          (fetch HEIGHT of iwRegion]
      (T (SETQ iwRegion (GETBOXREGION width height NIL NIL NIL "Move box to desired position for display
                        and click left"]
    iwRegion))

(Method ((FactoryProcessBrowser ContentsChanged) self Arg1)
                                                        mct: 17-Nov-87 18:08
  "Specialization"
  NIL)

(Method ((FactoryProcessBrowser ContinueProcess) self)
                                                        . TAL 24-Apr-88 12.24
  "New method template"
  (COND
    ((@ %:autoScanFlg)
     (_ self PrintRunState))
    (T (_ self PrintRunState)))
  (_@ %:autoScanFlg T)
  (_ self StartSimProcess NIL T))
```

Page 4

```
(Method ((FactoryProcessBrowser CreateMethodMenu) self)
                                                        . TAL 5-Oct-85 17:40
  "Specialization"
  [LET (menu stopItem)
    (_Super self CreateMethodMenu)
    (COND
      ([AND (SETQ menu (@ %:methodMenu))
            (SETQ stopItem (FASSOC 'Stop (fetch ITEMS of menu]
       (_@ %:stopMenuItemRegion (MENUITEMREGION stopItem menu))])

(Method ((FactoryProcessBrowser CreateStateDisplay) self)
                                                        . mct: 14-Jan-88 16:57
  "Create a selection menu of state variables from which a display can be built"
  [LET (w)
    (COND
      ([SETQ w (_ self CreateStateMenu '((OK SVOKFN "Construct a state variable display from selected
                                              items")
                                          (ABORT SVAbortFN "Abort collection of state variables for
                                              display")))]
       (MOVEW w])

(Method ((FactoryProcessBrowser CreateStateMenu) self Items)
                                                        . mct: 6-Sep-87 12.12
  "New method template"
  (LET (varwindow)
    [RESETFORM (CURSOR WAITINGCURSOR)
           (COND
             ((SETQ varwindow (_ self CreateMenuWindow (SORT (APPEND (@ |:context:stateVariableNames|)))
                                  (CONCAT (@ |:object:printName|)
                                          ": Select State Variables From Menu")
                                  (create POSITION
                                          XCOORD _ LASTMOUSEX
                                          YCOORD _ LASTMOUSEY)))
              (ATTACHMENU (create MENU
                                  ITEMS _ Items
                                  CENTERFLG _ T
                                  MENUBORDERSIZE _ 1
                                  WHENSELECTEDFN _ (FUNCTION SVTopWhenSelectedFN))
                          varwindow
                          'TOP
                          'JUSTIFY T]
    varwindow))
```

```
(Method ((FactoryProcessBrowser CreateStateWindow) self varList attachFlg)
                                                     Edited 15-Sep-88 22.54 by TAL
  "Create a new folderbrowser window of the set of state variables given. Return window."
  (LET (iw)
    (RESETLST
        (RESETSAVE (CURSOR WAITINGCURSOR))
        (RESETSAVE DontBrowseBrowserGlobalFlg T)           Inhibit the browse method
        (SETQ iw (@ (_ (@ context)
                       SpawnLinkedContext
                       ($ ExamineSVFolderContext)
                       varList)
                    myBrowser)))
    (_ iw BrowseAttached (_ self ComputeSVRegion varList attachFlg))
    (_ self AddStateWindow iw)
    iw))

(Method ((FactoryProcessBrowser Destroy) self)         . TAL 7-Mar-88 16.46
  "Specialization"
  [COND
    ((PROCESSP (@ %:simulationProcess))
     (DEL.PROCESS (@ %:simulationProcess)]
  (_Super self Destroy))
```

Page 5

```
(Method ((FactoryProcessBrowser FastSim) self)         . mcf 14-Jul-86 08:26
  "New method template"
  (_@ %:scanDismissTime (SELECTQ (@ %:scanDismissTime)
                          (1 (printout (@ %:window)
                                       0 "Slow.")
                             1000)
                          (1000 (printout (@ %:window)
                                          0 "Fast.")
                                1)
                          (PROGN (printout (@ %:window)
                                           0 "Fast.")
                                 1))))

(Method ((FactoryProcessBrowser HandleSimulationBreak) self msgs options)
                                                     . mcf 7-Jan-87 17:57
  "New method template"
  (PROG (Pwindow result (Window (@ %:window)))
        (RESETLST
            (SETQ Pwindow SavoirPROMPTWINDOW)
            (CLEARW Pwindow)
            (RESETSAVE (TTYDISPLAYSTREAM Pwindow))
            (RESETSAVE (TTY.PROCESS (THIS.PROCESS)))
            (for x in msgs do (COND
                                ((EQ x T)
                                 (TERPRI Pwindow))
                                (T (PRIN1 x Pwindow)))
               finally (TERPRI Pwindow))
            [SETQ result (ASKUSER NIL NIL [APPLY 'CONCAT (DREVERSE (CONS "? "
                                                        (bind r for x on options
                                                           do (push r (CAR x))
                                                              (COND
                                                                ((CDDR x)
                                                                 (push r ", "))
                                                                ((CDR x)
                                                                 (push r " or ")))
                                                           yield r]
                          [for x in options collect (CADR (FASSOC x '((Abort (Abort " the execution"))
                                                        (Continue (Continue " by
                                                                   skipping this
                                                                   operation"))
                                                        (Retry (Retry " this operation"]
                          NIL NIL '(PROMPTON ()
        (RETURN result)))

(Method ((FactoryProcessBrowser Initialize) self context object)
                                                     . TAL 5-Oct-85 14 35
  "Specialization"
  (_@ %:autoScanEvent (CREATE.EVENT 'AutoScanEvent))
  (_Super self Initialize context object))

(Method ((FactoryProcessBrowser InitializeManually) self)
                                                     mcf: 11-Sep-86 10:47
                                                     New method template
  "(COND ((@ :initializeDone) (printout (@ :window) 0 Done.)) (T (COND ((@ :autoScanFlg) (_ self
  StopProcess))) (_ self InitializeState)))"
  (COND
    ((@ %:autoScanFlg)
     (_ self StopProcess)))
  (_ self InitializeState T))
```

```
(Method ((FactoryProcessBrowser InitializeState) self AlwaysInitFlg)
                                                   TAL 14-Mar-88 12:20
  "Initialize the process and the display thereof"
  (COND
    ((OR AlwaysInitFlg (NOT (@ %:initializeDone)))
     (COND
       ((NOT (@ |:context:resetRequested|))
        (COND
          ((@ %:autoScanFlg)
           (_ self StopProcess)))
        (printout (@ %:window)
                  .TAB0 0 "Init..")))
     (_ (@ %:context)
        InitializeState)
     (_@ %:oldStateVariables NIL)
     (_ self ClearSVCache T)
     (_ self UpdateStateVariableDisplay NIL 'Clear)        (* (for x in (@ %.animationUnits) do (  x Initialize)))
     (printout (@ %:window)
```

Page 6

```
               "Done.")
     (_@ %:initializeDone T))))

(Method ((FactoryProcessBrowser InstallSelection) self)
                                                   , mcf: 2-Jan-87 16.15
  "New method template"
  [LET (mw)
    (COND
      ([SETQ mw (_ self CreateStateMenu '(("OK" SVInstall "Install selected state variables as the default
                                                display")
                                         ("ABORT" SVAbortFN "Abort collection of state variables for
                                                display")))]
       (MOVEW mw])

(Method ((FactoryProcessBrowser OneManualScan) self)
                                                   ; TAL 15-Oct-85 09:25
  "New method template"
  (RESETFORM (CURSOR WAITINGCURSOR)
         (COND
           ((@ %:autoScanFlg)
            (_ self StopProcess)))
         (_ self OneScan)))

(Method ((FactoryProcessBrowser OneScan) self)      , TAL 13-Feb-87 13 05
  "Perform a single scan and update the displays"
  (LET (activity)
    (_@ %:initializeDone NIL)
    (SETQ activity (_ (@ %:context)
                      ScanChart))
    [COND
      ((@ |:context:resetRequested|)                (* What a hack!)
       (_ self InitializeState)
       (SETQ activity (_ (@ %:context)
                         ScanChart)]               (* (_ self UpdateActiveStepHighlights) This is now done in the middle
                                                   of the scan by  ScanChart)
    (_ self UpdateStateVariableDisplay T)
    activity))

(Method ((FactoryProcessBrowser PrintRunState) self)
                                                   , mcf: 14-Jul-86 08:27
  "New method template"
  (SELECTQ (@ %:scanDismissTime)
       (1 (printout (@ %:window)
                   "Fast."))
       (1000 (printout (@ %:window)
                   "Run."))
       (PROGN (printout (@ %:window)
                   "Run."))))

(Method ((FactoryProcessBrowser RemoveStateWindow) self swBrowser)
                                                   , mcf: 17-Feb-88 11 52
  "New method template"
  (change (@ %:stateVariableWindows)
        (REMOVE swBrowser DATUM))
  (_ swBrowser ClearSVCache)
  (_@ swBrowser %:myProcessBrowser NIL))

(Method ((FactoryProcessBrowser SVAbortFN) self window)
                                                   , mcf: 4-Dec-85 22.11
                                                   Method called by create display menu to abort the collection of state
                                                   variables
  (CLOSEW window))

(Method ((FactoryProcessBrowser SVCloseFN) self window)
                                                   mcf: 5-Dec-85 00 12
  "Exit function called from imitation browser viewing state variables"
  (change (@ %:stateVariableWindows)
        (REMOVE window DATUM)))
```

```
(Method ((FactoryProcessBrowser SVExitFN) self window)
                                                          . mct: 5-Dec-85 00:08
  "Exit function called from imitation browser viewing state variables"
  (CLOSEW window))

(Method ((FactoryProcessBrowser SVInstall) self window)
                                                          . mct: 1-Jun-87 15:45
  "Install svs selected from menuwindow as default svs to display"
  [LET (varLst)
    (SETQ varLst (SORT (@ %:mwSelectionLst)))
    (CLOSEW window)
    (AND (NOT (EQUAL varLst (@ |:object:interestingStateVariables|)))
         (_ (@ %:object)
            MarkAsChanged))
    (AND varLst (_@ self |:object:interestingStateVariables| (SORT varLst))])

(Method ((FactoryProcessBrowser SVOKFN) self window)
                                                          . TAL 14-Mar-88 12:35
  "Method called by state variable display menu to construct a new state variable display"
  (LET (varLst)
    (SETQ varLst (@ %:mwSelectionLst))
    (CLOSEW window)
    (_ (@ %:context)
       SpawnLinkedContext
       ($ ExamineSVFolderContext)
       (SORT varLst))))

(Method ((FactoryProcessBrowser ShowAllState) self)
                                                          . TAL 14-Oct-85 04:00
  "New method template"
  (_ self ShowState (@ |:context:stateVariableNames|)))

(Method ((FactoryProcessBrowser ShowSelectedState) self)
                                                          . TAL 14-Oct-85 04:15
  "New method template"
  [LET ((int (@ |:object:interestingStateVariables|)))
    (_ self ShowState (COND
                        (int (FIntersection int (@ |:context:stateVariableNames|)))
                        (T (@ |:context:stateVariableNames|))))])

(Method ((FactoryProcessBrowser ShowState) self varList)
                                                          . mct: 30-Jun-86 13:41
  "Show state variables for entire grafcet"
  (COND
    ([INTERSECTION (@ %:stateVariableWindows)
          (for w in (ALLATTACHEDWINDOWS (@ %:window)) collect (WINDOWPROP w 'LoopsWindow]
     (_ self ToggleStateDisplay)))
  (ATTACHWINDOW (@ (_ self CreateStateWindow varList T)
                   %:window)
        (@ %:window)
        'LEFT
        'TOP))

(Method ((FactoryProcessBrowser StartProcess) self)
                                                          . TAL 24-Apr-88 12:20
  "New method template"
  (PROG NIL
        [COND
          ((NOT (@ |:context:initialConditions|))
           (FLASHWINDOW SavoirPROMPTWINDOW)
           (COND
             ((NOT (MOUSECONFIRM (CONCAT "Reinitialize " (@ |:object:printName|)
                                         "?")
                         NIL SavoirPROMPTWINDOW))
              (printout (@ %:window)
                        0 "Abort.")
              (RETURN]
        (COND
          ((@ %:autoScanFlg)
           (_ self StopProcess)))
        (_ self StartSimProcess T)
        (_ self InitializeState)
        (_@ %:autoScanFlg T)
        (NOTIFY.EVENT (@ %:autoScanEvent))
        (_ self PrintRunState)))
```

```
(Method ((FactoryProcessBrowser StartSimProcess) self restartIfExists notifyIfExists)
                                                          TAL 24-Apr-88 12:38
  "New method template"
  [LET ((proc (@ %:simulationProcess))
        (name (@ |:object:printName|)))
```

```
    (COND
      [(NOT (PROCESSP proc))
       (_@ %:simulationProcess (ADD.PROCESS '(SimulateFactoryProcess .(KWOTE self))
                                           'NAME
                                           (CONCAT "Actor " (@ |:object:printName|)))))]
      (restartIfExists (RESTART.PROCESS proc))
      (notifyIfExists (NOTIFY.EVENT (@ %:autoScanEvent)])
```

```
(Method ((FactoryProcessBrowser StopProcess) self)
                                                            . mcf: 10-Jul-86 11 52
  "New method template"
  (COND
    ((@ %:autoScanFlg)
     (_@ %:autoScanFlg NIL)
     (printout (@ %:window)
          0 "Stop."))
   . (T (printout (@ %:window)
             0 "Stop."))))
```

```
(Method ((FactoryProcessBrowser ToggleStateDisplay) self)
                                                            mcf. 1-Jul-86 12.04
  "New method template" .
  [LET (sd window)
    (COND
      [(AND (@ %:stateVariableWindows)
            [SETQ sd (CAR (FIntersection (@ %:stateVariableWindows)
                                (for w in (ALLATTACHEDWINDOWS (@ %:window))
                                  collect (WINDOWPROP w 'LoopsWindow]
            (SETQ window (@ sd %:window)))
       (DETACHWINDOW window)
       (_ sd AbortBrowser)
       (COND
         ((NOT (@ %:stateVariableWindows))
          (_@ %:oldStateVariables NIL)]
      (T (_ self ShowSelectedState)])
```

```
(Method ((FactoryProcessBrowser UpdateMMIVariableDisplay) self)
                                                            . mcf: 20-Jun-87 13 40
  "New method template"
  [LET (mmiBrowser mmiObj mmiVars currentVars oldVars currentValue)

       (* The kludgery in the conditional uses the fact that the prototyper uses the same window over multiple browsers
       The code needs to determine the whether the mmi is currently displaying the screen that contains the current field)

    (COND
      ([AND (SETQ mmiVars (@ %:mmiStateVariables))
            (SETQ mmiObj (@ |:object:mmi|))      ,
            (ObjectExists? (SETQ mmiObj (SWDereferenceName mmiObj)))
            [ObjectExists? (SETQ mmiBrowser (_ mmiObj CheckPropList 'PROTOTYPERBROWSER)]
            (ObjectExists? (SETQ mmiBrowser (WINDOWPROP (@ mmiBrowser %:oldWindow)
                                                        'LoopsWindow]
       (SETQ currentVars (@ |:context:stateVariables|))
       (bind var field for varLst in mmiVars eachtime (SETQ var (CAR varLst))
                                                      (SETQ field (CDR varLst))
                                                      (SETQ currentValue (CVAR.REF var currentVars))
          when [AND (NUMBERP currentValue)
                    (NEQ currentValue (MKATOM (CAR (@ field %:text)]
          do (_@ field %:text (CONS (MKSTRING currentValue)))
             (AND (EQ (@ mmiBrowser %:screen)
                      (@ field %:screen))
                  (_ mmiBrowser DisplayField field)])
```

```
(Method ((FactoryProcessBrowser UpdateStateVariableDisplay) self incrementalUpdateFlg
                                                                 DontMarkFlg)
                                                            : mcf: 26-Feb-88 17:29
  "New method template"
  (LET (changedVars currentVars oldVars currentValue)
    [COND
      ((AND (@ %:updateSVOn)
            (@ %:stateVariableWindows))
                                     (* (COND ((AND (HARRAYP (SETQ oldVars
                                     (@ %:oldStateVariables))) incrementalUpdateFlg)
                                     (SETQ currentVars (@ |:context:stateVariables|))
                                     (COND ((SETQ changedVars (for var in
                                     (@ %:displayedStateVariables) eachtime
                                     (SETQ currentValue (SVREF var currentVars)) when
                                     (COND ((NOT (ATOM currentValue)) (
                                     (NOT (EQUAL currentValue (SVREF var oldVars)))
                                     (SVSET var currentValue oldVars))) collect var))
                                     (RESETFORM (SETREADTABLE FISPrettyReadtable)
                                     (bind inter for svw in (@ %:stateVariableWindows) do
                                     (COND ((SETQ inter (FIntersection changedVars
                                     (@ svw %:properties))) (_ svw UpdateValueDisplay inter DontMarkFlg))
                                     ((@ svw %:oldChanges) (_ svw UpdateValueDisplay NIL DontMarkFlg))))))
                                     (T (for svw in (@ %:stateVariableWindows) do
                                     (COND ((@ svw %.oldChanges) (_ svw UpdateValueDisplay NIL
                                     DontMarkFlg))))))) (T (RESETFORM (SETREADTABLE FISPrettyReadtable)
                                     (for svw in (@ %.stateVariableWindows) do
                                     (_ svw UpdateValueDisplay (@ svw %.properties) DontMarkFlg)))
                                     (COND ((NOT (HARRAYP (@ %.oldStateVariables)))
                                     (_@ %:oldStateVariables (HASHARRAY
                                     (TIMES 2 (FLENGTH (@ %.displayedStateVariables)))))))
                                     (REHASH (@ |.context:stateVariables|)
                                     (@ %:oldStateVariables)))))
       (for svw in (@ %:stateVariableWindows) do (_ svw UpdateValueDisplay T DontMarkFlg)]
    (_ self UpdateMMIVariableDisplay)))
```

(Method ((GrafcetProcessContext AbortStepInProc) self step procStep activationChanges)
. TAL 7-Oct-87 19.48
. Turn off a step in an aborting process step

```
"No record is kept of active macro steps that aren't in their OUT step, but those in the aborting process
must still have their highlights cleared. This method handles that by recursing on each step's calling
macro step as long as it is in the aborting process. The FMEMB avoids doing this redundantly, but assumes
that the process step processing is done at the beginning of the scan, when nothing else has been put in
DeactivatedSteps. If that is changed then the test must be removed."
[LET* [(super (@ step %:superObject))
       (superChanges (OR (GETHASH super activationChanges)
                         (SHOULDNT]
  (COND
     ((NOT (FMEMB step (fetch DeactivatedSteps of superChanges)))
      (cdremove (@ %:activeSteps)
             step)
      (cdremove (@ %:activeProcessSteps)
             step)
      (push (fetch DeactivatedSteps of superChanges)
            step)                                         (* Cause to be unhighlighted)
      (COND
         ((_ super InProgram? procStep)
          (_ self AbortStepInProc (@ super %:caller)
                 procStep activationChanges)])
```

(Method ((GrafcetProcessContext ActivateStep) self step activationChanges super)
. TAL 9-Oct-87 11.34

```
"Activate the specified step"
[LET* ((super (OR super (@ step %:superObject)))
       (superChanges (OR (GETHASH super activationChanges)
                         (PUTHASH super (create ProgActivationChanges)
                                activationChanges)))
       caller)
  (COND
     [(NEQ (@ step %:stepType)
           'Macro)
      (push (@ %:activatedSteps)
            step)
      (push (fetch ActivatedSteps of superChanges)
            step)
      (_ step EvaluateActivation self)
      (COND
         ((EQ (@ step %:stepNumber)
              'OUT)
          (SETQ caller (@ super %:caller))

(* If the last step of a macro, then the next time around the macro itself is active, for the purposes of checking transitions)

          (push (@ %:activatedSteps)
                caller)
```

Page 10

```
          (push (fetch ActivatedSteps of (GETHASH (@ caller %:superObject)
                                                  activationChanges))
                caller)
          (COND
             ((_ caller InstOf 'GrafcetProcessStep)
              (pushnew (@ %:activeProcessSteps)
                       caller]
     (T (push (fetch ActivatedMacroSteps of superChanges)
              step)
        (COND
           ((_ step InstOf 'GrafcetProcessStep)
            (push (@ %:activeProcessSteps)
                  step)))
        (_ self ActivateStep (@ step %:inStep)
               activationChanges)])
```

(Method ((GrafcetProcessContext ClearAllHighlights) self)
. TAL 7-Mar-88 16:30

```
"New method template"
(for prog in (@ |:object:macroPrograms|) do (_ prog ClearAllHighlights)))
```

(Method ((GrafcetProcessContext DeactivateStep) self step activationChanges super)
. TAL 7-Oct-87 20.08

```
"Deactivate the specified step"
[LET* ((super (OR super (@ step %:superObject)))
       (superChanges (GETHASH super activationChanges)))
  (OR superChanges (SHOULDNT))
  (push (fetch DeactivatedSteps of superChanges)
        step)
  (push (@ %:deactivatedSteps)
        step)
  (COND
     ((NEQ (@ step %:stepType)
           'Macro)
      (_ step EvaluateDeactivation self))
     (T (COND
           ((_ step InstOf 'GrafcetProcessStep)
            (cdremove (@ %:activeProcessSteps)
                   step)))
        (_ self DeactivateStep (@ step %:outStep)
               activationChanges)])
```

```
(Method ((GrafcetProcessContext Exit) self AbortFlg)  . TAL 7-Mar-88 17:01
  "Specialization"
  [LET (process mb (program (@ %:program)))
    (_ self Reset)
    (COND
       ((LISTP ActiveSimulations)
        (PUTASSOC program NIL ActiveSimulations)))
    (COND
       ([AND (for sim in ActiveSimulations never (CDR sim))
             (SETQ process (FIND.PROCESS 'FISBackgroundProcess]
        (SUSPEND.PROCESS process)))
    (COND
       ((AND (NOT (DestroyedObject? program))
             (EQ self (@ program %:processContext)))
        (_@ program %:processContext NIL)))
    [COND
       ((SETQ mb (ObjectExists? (@ %:myBrowser)))
        (for sv in (@ mb %:stateVariableWindows) when (ObjectExists? sv) do (_ sv ShowValues)]
    (_Super self Exit AbortFlg)
    (COND
       ((AND (BOUNDP 'SimulationWindowsOff)
             SimulationWindowsOff)
        (SwitchWindowsOn SimulationWindowsOff)
        (SETQ SimulationWindowsOff NIL])
```

Page 11

```
(Method ((GrafcetProcessContext InitializeState) self)
                                                          , TAL 7-Mar-88 16:55
  "Setup to begin running a program"
  (LET* ((program (@ %:program))
         (svHash (@ %:stateVariables))
         (macroProgs (@ program %:macroPrograms)))
    (_ self Reset)
    (@ program %:allSendStepAList)                        (* Init AList so first mmfs_send doesn t have to)
    (for iv in (@ |::StateIVs|) do (PutValue self iv NIL))
    (COND
       ((NOT (@ %:resetRequested))                        (* (_@ %.stateVariableNames (SORT (for id in
                                                          (@ program %.ids) collect (fetch CCID/ID of id))
                                                          (FUNCTION UALPHORDER))))
        (SETQ FISGlobalClock 0)))
    [COND
       ((HARRAYP svHash)
        (CLRHASH svHash))
       (T (SETQ svHash (_@ %:stateVariables [HASHARRAY (TIMES 2 (FLENGTH (@ %:stateVariableNames)])]
    [COND
       ((HARRAYP (@ %:activationChanges))
        (CLRHASH (@ %:activationChanges)))
       (T (_@ %:activationChanges (HASHARRAY (TIMES 2 (FLENGTH macroProgs)))))]
    (RECLAIM)
    (for m in macroProgs do (_ m InitializeVars svHash))
    (_@ %:initialConditions T)
    (_@ %:resetRequested NIL)
    self))

(Method ((GrafcetProcessContext Reset) self)              TAL 24-Apr-88 20.27
  "Shut down a running grafcet"
  [LET ((program (@ %:object)))
    (change (@ %:cAllocations)
            (CR.CleanupAllocations DATUM))               (* Release any C allocated storage)
    (_ MapNetwork ResetGrafcetProcess program)
    (_ self ClearAllHighlights)
    (COND
       ((ObjectExists? (@ program %:animation))
        (_ (@ program %:animation)
           ResetAnimation)])

(Method ((GrafcetProcessContext ScanChart) self)  . TAL 23-Apr-88 17:50
```

.. Perform a single scan of a Grafcet program  Return T iff there was some activity (step activation or deactivation)

```
  "Each scan currently consists of three parts. First, for each active step, each successor transition is
  evaluated (in order from left to right) . If a successful one is found, the step is deactivated, the
  succeeding step is activated, and the remaining transitions coming from the previously active step are not
  evaluated. Second, the deactivation part of the deactivated steps is evaluated and the activation part of
  the newly activated steps is evaluated. Finally, the continuous part of each active step is evaluated.
  This ordering is probably not right (the continuous should be done first, then the transitions and
  activations and deactivations) but this way the state variable values displayed between scans accurately
  reflect the transitions that will be taken on the next scan. The active step highlights are updated before
  doing the continuous for similar reasons."
  (LET (activatingSteps deactivatingSteps activeSteps (activationChanges (@ %:activationChanges))
            (browser (@ %:myBrowser))
            (activityFlg)
            (\CR.BasePointers (@ %:cAllocations)))
    (DECLARE (SPECVARS \CR.BasePointers))
    (_@ %:activityFlg NIL)
    (_@ %:activatedSteps NIL)
    (_@ %:deactivatedSteps NIL)
    [MAPHASH activationChanges (FUNCTION (LAMBDA (val key)
                                            (replace ActivatedSteps of val with NIL)
                                            (replace DeactivatedSteps of val with NIL)
                                            (replace ActivatedMacroSteps of val with NIL]
```

```
(add FISGlobalClock 1)
[COND
  ((@ %:initialConditions)
   (for step in (SORT (@ |:program:initialSteps|)
                      (FUNCTION GrafcetStepOrder))
      do (_ self ActivateStep step activationChanges NIL))
   (_@ %:initialConditions NIL)
   (SETQ activityFlg T))
  (T (SETQ activatingSteps (_ self ScanProcessSteps activationChanges))
     (SETQ activeSteps (@ %:activeSteps))          (* Must fetch this AFTER calling ScanProcessSteps)
     (for step in activeSteps unless (FMEMB step deactivatingSteps)
        do (bind pSteps anyPrev (firstTrue _ (@ step %:firstTrueFlg)) for trans
                in (@ step %:successors) eachtime (SETQ pSteps (@ trans %:predecessors))
                when (AND (for pred in pSteps always (OR (EQ pred step)
                                                          (FMEMB pred activeSteps)))
```

```
                          (_ trans Evaluate self anyPrev))
              do (pushlist deactivatingSteps pSteps)
                 (pushlist activatingSteps (@ trans %:successors))
                 (AND firstTrue (GO $$OUT))
                 (SETQ anyPrev T))
           (FISRunInterrupts))
     (COND
       ((OR activatingSteps deactivatingSteps)
        (SETQ activityFlg T)
        (for step in (RemoveDuplicates deactivatingSteps T)
           do (_ self DeactivateStep step activationChanges NIL))
        (FISRunInterrupts)
        (for step in (@ %:deactivatedSteps) do (cdremove1 activeSteps step))
        (for step in (RemoveDuplicates activatingSteps T) unless (FMEMB step activeSteps)
           do (_ self ActivateStep step activationChanges NIL))
        (FISRunInterrupts]
(COND
  (activityFlg (_@ %:activeSteps (SETQ activeSteps (NCONC (@ %:activatedSteps)
                                                           activeSteps)))
          (_ self UpdateActiveStepHighlights)))
(for step in activeSteps do (_ step EvaluateContinuous self)
                            (FISRunInterrupts))
(OR activityFlg (@ %:activityFlg))))
```

(Method ((GrafcetProcessContext ScanProcessSteps) self activationChanges)
. TAL 7-Oct-87 19:57

```
.. Check active process steps for abort transitions, abort accordingly and return list of steps to activate due to cleared transitions
(LET (\AbortGrafcetProcessStep aborted activate)
  (DECLARE (SPECVARS \AbortGrafcetProcessStep))
  .. AbortGrafcetProcessStep is set when a transition that calls 'abort_proc' is true.  Any other transitions are ignored
  [for procStep in (@ %:activeProcessSteps)
     do (for trans in (@ procStep %:successors) eachtime (SETQ \AbortGrafcetProcessStep NIL)
           thereis (AND (_ trans Evaluate self NIL)
                        \AbortGrafcetProcessStep)
           thenyield (push aborted procStep)
                 (for step in (@ %:activeSteps) when (_ step InProgram? procStep)
                    do (_ self AbortStepInProc step procStep activationChanges)
                       (pushlist activate (@ trans %:successors))]
  (COND
    ((CDR aborted)
     .. If we aborted more than one process step then it is possible that one was inside another, in which case we need to avoid activating the successors
     .. of the inner one.
     (for step in activate unless (for procStep in aborted thereis (_ step InProgram? procStep))
        collect step))
    (T                                                   . Don't bother checking if fewer than two were aborted
      activate))))
```

(Method ((GrafcetProcessContext SetStateVariable) self varName newValue)
. TAL 21-Sep-85 18:04

```
"Set a register to a value"
(CVAR.SET varName newValue (@ %:stateVariables)))
```

(Method ((GrafcetProcessContext SetupForSimulation) self)
. mct: 23-Nov-87 13.19

```
"One of the InitialActions of the context"
(DECLARE (GLOBALVARS FISCellInterruptTimer FISLastPulseTime))
(LET (process (program (@ %:object)))
  (_@ program %:processContext self)        (* (COND ((NOT (SETQ process (FIND.PROCESS
                                            (QUOTE FISBackgroundProcess)))) (SETQ FISCellInterruptTimer
                                            MIN.SMALLP) (SETQ FISLastPulseTime MIN.SMALLP)
                                            (ADD.PROCESS (QUOTE (FISBackgroundProcess))))
                                            (T (WAKE.PROCESS process))))
  (change ActiveSimulations (MyPutAssoc program self DATUM))))
```

(Method ((GrafcetProcessContext StepActive?) self step)
. TAL 31-Aug-85 17:54

```
"Tests whether specified step is active in this process"
(FMEMB step (@ %:activeSteps)))
```

```
(Method ((GrafcetProcessContext UpdateActiveStepHighlights) self)
                                                                   . TAL 14-Mar-88 18:03
   "turn off the previously active steps, and turn on the currently active ones"
   [MAPHASH (@ activationChanges)
         (FUNCTION (LAMBDA (val key)
                     (LET (ds)
                       [COND
                          ((OR (fetch DeactivatedSteps of val)
                               (fetch ActivatedSteps of val)
                               (fetch ActivatedMacroSteps of val))
                           (AND (SETQ ds (@ key %:displayStream))
                                (NEQ (IMAGESTREAMTYPE ds)
                                     'DISPLAY)
                                (SETQ ds NIL]
                       (for step in (fetch DeactivatedSteps of val) do (_ step Highlight ds 'Off))
                       (for step in (fetch ActivatedSteps of val)
                          do (_ step Highlight ds NIL NIL 'Active))
                       (for step in (fetch ActivatedMacroSteps of val)
                          do (_ step Highlight ds NIL NIL 'Run)])

(Method ((RunActorContext AddingTraceFilter) self Filter) "Default is to do nothing."
   self)

(Method ((RunActorContext ComputeSVNames) self)
                                                                   TAL 7-Mar-88 00:13
   "New method template"
   (SORT (for id in (@ |:program:ids|) collect (fetch CCID/ID of id))
         (FUNCTION UALPHORDER)))

(Method ((RunActorContext RemovingTraceFilter) self) "Default is to do nothing."
   self)

(\UnbatchMethodDefs)

(DEFINEQ

(AbortGrafcetMacroStep
  [LAMBDA NIL
    (DECLARE (USEDFREE \AbortGrafcetProcessStep))           . Edited 5-Jun-88 12:18 by
                                                            . Process' is misused here and elsewhere
    (COND
       ((BOUNDP '\AbortGrafcetProcessStep)
        (SETQ \AbortGrafcetProcessStep T])

(EvaluateLispProgramObject
  [LAMBDA (self ExprOrFunction Process Step Cycle)          . Edited 25-Jun-88 19:02 by lipkis

          (* * Evaluate either an expr or a function with the variables in the process's stateVariables bound to their values.)

    (PROG (tmp /stateVariables\)
          (DECLARE (SPECVARS /stateVariables\))
          (COND
             ((NULL ExprOrFunction)
              (RETURN NIL))
             ((EQ ExprOrFunction T)
              (RETURN T)))
          (SETQ /stateVariables\ (@ Process %:stateVariables))
          (RETURN (COND
                     [(LITATOM ExprOrFunction)
                      (COND
                         ((FNTYP ExprOrFunction)
                          (APPLY* ExprOrFunction self Process Step Cycle))
                         (T (CVAR.REF ExprOrFunction /stateVariables\]
                     ((LISTP ExprOrFunction)
                      (FISEvaluateExpr ExprOrFunction /stateVariables\))
                     (T (HELP "EvaluateLispProgramObject given a non-Expr with no definition: "
                              ExprOrFunction])

(SVCloseFN
  [LAMBDA (window)                                          (* mct%. "14-Dec-85 20:16")
    (LET [(browser (WINDOWPROP window 'Browser]
      (AND browser (NOT (DestroyedObject? browser))
           (_ browser SVCloseFN window)])
```

```
(SVTopWhenSelectedFN
  [LAMBDA (item menu key)                                   (* mct%: "14-Jan-88 16:57")
    (LET* [(window (MAINWINDOW (WFROMMENU menu)))
           (browser (WINDOWPROP window 'Browser]
      (COND
         ((AND browser (NOT (DestroyedObject? browser))
               (CADR item))
          (_! browser (CADR item)
                window))
         (T (SELECTQ (CAR item)
                ((Exit ABORT OK)
                     (CLOSEW window))
                NIL])
```

```
(ExpandSimulationBreak
  [LAMBDA (args)                                                    Edited 10-May-88 16.42 by loops
    '(SELECTQ (LET [(p .(CAR args))
                    (s .(CADR args))
                    (m .(CADDR args]
               (DECLARE (USEDFREE \process\ \step\))
               [SETQ p (COND
                          (p)
                          ((BOUNDP '\process\)
                           (EVALV '\process\]
               [SETQ s (COND
                          (s)
                          ((BOUNDP '\step\)
                           (EVALV '\step\]
               [COND
                  (s (SETQ m (APPEND m (LIST " in step " (@ s %:label)]
               (COND
                  [(AND p (@ p %:myBrowser))
                   (_ (@ p %:myBrowser)
                      HandleSimulationBreak m .(KWOTE (for x in (CADR (CADDDR args))
                                                          collect (CAR x]
                  (T (HELP m)
                     NIL)))
          (\.@ (CADR (CADDDR args)))
          (SHOULDNT])

(FISBackgroundProcess
  [LAMBDA NIL                                                       (* TAL "16-Oct-85 23.16")
    (while T do (BLOCK)
               (FISRunInterrupts T])

(FISEvaluateExpr
  [LAMBDA (expr stateVariables)                                     Edited 25-Jun-88 19 06 by lipkis

    .. No longer used (COND ((LISTP expr) (SELECTQ (CAR expr) (NOT (NOT (FISEvaluateExpr (CADR expr) stateVariables))) (AND (for x in (CDR expr) always
    .. (FISEvaluateExpr x stateVariables))) (OR (for x in (CDR expr) thereis (FISEvaluateExpr x stateVariables))) (SVSETQ (SVSET (CADR expr) (FISEvaluateExpr (CADDR
    .. expr) stateVariables) stateVariables)) (PROGN (bind val for x in (CDR expr) do (SETQ val (FISEvaluateExpr x stateVariables)) yield val))
    .. (\GetReceivedMessageValue (\GetReceivedMessageValue (EVAL (CADR expr)))) (QUOTE (CADR expr)) (APPLY (CAR expr) (for x in (CDR expr) collect
    .. (FISEvaluateExpr x stateVariables))))) ((EQ expr T) T) ((NULL expr) NIL) ((LITATOM expr) (CVAR.REF expr stateVariables)) (T expr))

    (HELP "FISEvaluateExpr called!"])

(FISRunInterrupts
  [LAMBDA (BackgroundFlg)                                           (* TAL "14-Feb-87 11:39")
    (DECLARE (GLOBALVARS FISCellPulser FISCellInterruptFlg FISCellInterruptTimer
                    \PERIODIC.INTERRUPT.FREQUENCY FISLastPulseTime ActiveSimulations FISLastMouseX
                    FISLastMouseY FISLastMouseButtons))
    (COND
       ((AND FISCellPulser FISCellInterruptFlg)
        (SETQ FISCellInterruptFlg NIL)
        (add FISCellInterruptTimer \PERIODIC.INTERRUPT.FREQUENCY)
        (_ FISCellPulser Pulse)
        (SETQ FISLastPulseTime FISCellInterruptTimer)))
    (COND
       ((NOT BackgroundFlg)
        (GETMOUSESTATE)
        [COND
           ((AND (LASTMOUSESTATE (OR LEFT MIDDLE))
                 (OR (NEQ FISLastMouseX LASTMOUSEX)
                     (NEQ FISLastMouseY LASTMOUSEY)
                     (NEQ FISLastMouseButtons LASTMOUSEBUTTONS)))
            (bind simContext for x in ActiveSimulations when (SETQ simContext (CDR x))
               do (_ (@ simContext %:myBrowser)
                     CheckStopButton)]
        (SETQ FISLastMouseX LASTMOUSEX)
        (SETQ FISLastMouseY LASTMOUSEY)
```

```
        (SETQ FISLastMouseButtons LASTMOUSEBUTTONS])

(FLDifference
  [LAMBDA (X Y)                                                     (* TAL "20-Sep-85 12:38")
    (for tmp in X when (NOT (FMEMB tmp Y)) collect tmp])

(FactoryProcessBrowser-ClearSVCache
  [LAMBDA (self varName newValue propName activeVal type)          (* TAL "10-Mar-86 21:55")
                                                                    (* %:displayedStateVariables depends only on %.stateVariableWindows.
    so clear the former's cache when the latter changes)
    (PutValueOnly self 'displayedStateVariables NotSetValue)
    (PutLocalState activeVal newValue self varName propName type])

(GetFISRegions
  [LAMBDA NIL                                                       (* TAL "13-Oct-85 03:18")
    (bind w obj ctx objName ctxClassName while [SETQ w (WINDOWP (PROGN (UNTILMOUSESTATE LEFT)
                                                                       (UNTILMOUSESTATE (NOT LEFT))
                                                                       (WHICHW]
       collect (PROGN (SETQ ctx (@ (WINDOWPROP w 'LoopsWindow)
                                   %:context))
                      (SETQ obj (@ ctx %:object))
                      (SETQ ctxClassName (GetObjectName (Class ctx)))
                      (SETQ objName (GetObjectName obj))
                      (LIST (PRINT (WINDOWPROP w 'TITLE))
                            (WINDOWPROP w 'REGION)
                            ctxClassName
                            (OR objName obj])
```

```
(GrafcetStepOrder
  [LAMBDA (X Y)                                   (* TAL " 8-Jul-85 07 16")
                                                  (* Returns T if step X precedes step Y  based on their step numbers)

        (* * This doesn t take the owning macro step (if any) into account  If sorting is only necessary within each macro step then this is ok.
        but if so, then the semantics are unpredictable)

    (LET ((XN (@ X %:stepNumber))
          (YN (@ Y %:stepNumber)))
      (COND
        ((OR (EQ XN 'IN)
             (EQ YN 'OUT))
         T)
        ((OR (EQ XN 'OUT)
             (EQ YN 'IN))
         NIL)
        (T (ILESSP XN YN])

(SimulateFactoryProcess
  [LAMBDA (factoryProcessBrowser)                 (* TAL "13-Feb-87 15.18")
                                                  (* OLD (bind time while T do (COND
                                                  ((@ factoryProcessBrowser %.autoScanFlg)
                                                  (_ factoryProcessBrowser OneScan) (COND
                                                  ((ILEQ (SETQ time (@ factoryProcessBrowser % scanDismissTime)) 1)
                                                  (BLOCK)) (T (DISMISS time)))) (T (AWAIT EVENT
                                                  (@ factoryProcessBrowser %.autoScanEvent))))))
    (bind MapNetworkSendFlg time declare (SPECVARS MapNetworkSendFlg) while T
       do (SETQ time (@ factoryProcessBrowser %:scanDismissTime))
          (COND
             [(@ factoryProcessBrowser %:autoScanFlg)
              (bind repeatFlg to (COND
                                    ((ILEQ time 2)
                                     FISScanRepeatLimit)
                                    (T 1))
                 do (SETQ repeatFlg (_ factoryProcessBrowser OneScan))
                    (COND
                       (MapNetworkSendFlg (_ MapNetwork ProcessUnsentMessages)
                              (SETQ MapNetworkSendFlg NIL)))
                 repeatwhile (AND repeatFlg (@ factoryProcessBrowser %:autoScanFlg)))
              (COND
                 ((ILEQ time 2)
                  (BLOCK))
                 (T (DISMISS time]
             (T (AWAIT.EVENT (@ factoryProcessBrowser %:autoScanEvent)])
```

Page 16

```
(GetBrowserObjectRegions
  [LAMBDA NIL                                     (* TAL " 7-Sep-85 07:51")
    (bind w while [SETQ w (WINDOWP (PROGN (UNTILMOUSESTATE LEFT)
                                          (UNTILMOUSESTATE (NOT LEFT))
                                          (WHICHW]
       collect (LIST (PRINT (WINDOWPROP w 'TITLE))
                     (WINDOWPROP w 'REGION)
                     (@ (WINDOWPROP w 'LoopsWindow)
                        |:context:object|)])

(USTREQUAL
  [LAMBDA (X Y)                                   (* TAL "11-Oct-85 13.50")
    (EQ 'EQUAL (UALPHORDER X Y])

(\DeviceCommand
  [LAMBDA (process Command Device SVName Value Wait Increment)
                                                  ; Edited 25-Jun-88 19:08 by lipkis
                                                  (* Ensure animation variables have reasonable values)
    (LET (pList devAtom (SVs (@ process %:stateVariables)))
      (COND
        [FISCellAnimationUnit (CVAR.SET SVName NIL SVs)
               [COND
                  (Device (pushlist pList '(Device .(COND
                                                       ((STRINGP Device)
                                                        (MKATOM Device))
                                                       (T Device]
               [COND
                  (Wait [COND
                           ((FLOATP Wait)
                            (SETQ Wait (FIXR Wait]
                        (COND
                           ((NOT (FIXP Wait))
                            (SETQ Wait FISDefaultAnimationWait))
                           ((LESSP Wait 0)
                            (SETQ Wait 0))
                           ((GREATERP Wait FISMaxAnimationWait)
                            (SETQ Wait FISMaxAnimationWait)))
                        (pushlist pList '(Wait .Wait]
               [COND
                  (Increment [COND
                                ((FLOATP Increment)
                                 (SETQ Increment (FIXR Increment]
                         (COND
                            ((NOT (FIXP Increment))
                             (SETQ Increment FISCellDefaultIncrement))
                            ((ILEQ Increment 0)
                             (SETQ Increment 1)))
                         (pushlist pList '(Increment .Increment]
               (_ FISCellAnimationUnit DoCommand Command pList '(CVAR.SET ,SVName .Value .SVs))]
        (T (CVAR.SET SVName Value SVs])
```

```
(\RequestSystemReset
  [LAMBDA (process)                                          (* TAL "11-Oct-85 13 23")
    (_@ process %:resetRequested T)])
)

(RPAQQ ProcessBrowserMenuItems
       ((Initialize InitializeManually "Reset to initial conditions")
        (Start StartProcess "Start the process from initial conditions")
        (Stop StopProcess "Stop the process")
        (Continue ContinueProcess "Continue the process from the current state")
        (One% Scan OneManualScan "Execute a single scan and stop")
        (State ToggleStateDisplay "Display the process's interesting state variables and their values,
              or turn off the display if already there" (SUBITEMS ("Selected Variables" ShowSelectedState
                                                                   "Display the process's interesting
                                                                   state variables and their values")
                                                          ("All Variables" ShowAllState "Display all of
                                                                the process's state variables and
                                                                their values")
                                                          ("Create Display" CreateStateDisplay
                                                                "Create a display of state variables
                                                                selected from a menu")
                                                          ("Set Selection" InstallSelection "Select a
                                                                set of state variables to use in the
                                                                default state variable display")))
        (Fast/Slow FastSim "Make the execution run fast or slow")))

(PUTPROPS SimulationBreak ARGNAMES ((process) (step) msgList actions))
```

```
(DECLARE%: EVAL@COMPILE

(PUTPROPS DeviceCommand MACRO ((Command Device SVName Value Wait Increment)
                               (\DeviceCommand \process\ 'Command Device 'SVName Value Wait Increment)))

(PUTPROPS RequestSystemReset MACRO (NIL (\RequestSystemReset \process\)))

(PUTPROPS SimulationBreak MACRO (X (ExpandSimulationBreak X)))
)

(DECLARE%: EVAL@COMPILE

(RECORD ProgActivationChanges (ActivatedSteps DeactivatedSteps ActivatedMacroSteps))
)

(PUTPROPS FISGlobalClock GLOBALVAR T)

;; FOLLOWING DEFINITIONS EXPORTED

(DECLARE%: DOEVAL@COMPILE DONTCOPY

(GLOBALVARS FISPrettyReadtable ActiveSimulations FactoryProcessStateMenus)
)

;; END EXPORTED DEFINITIONS

(RPAQ? FactoryProcessStateMenus (LIST (CONS 1 2)))

(RPAQ? ActiveSimulations NIL)

(RPAQ? FISScanRepeatLimit 1)

(RPAQ? FISPrettyReadtable (COPYREADTABLE NIL))

(RPAQQ FISDefaultAnimationWait 60)

(RPAQQ FISMaxAnimationWait 3600)

;; FOLLOWING DEFINITIONS EXPORTED

(DECLARE%: DOEVAL@COMPILE DONTCOPY

(GLOBALVARS FISScanRepeatLimit FISDefaultAnimationWait FISMaxAnimationWait)
)

;; END EXPORTED DEFINITIONS

(SETSYNTAX '%# 'OTHER FISPrettyReadtable)

(PUTPROPS GRAFSIM FILETYPE :FAKE-COMPILE-FILE)

(DECLARE%: DONTEVAL@LOAD DOEVAL@COMPILE DONTCOPY COMPILERVARS

(ADDTOVAR NLAMA )

(ADDTOVAR NLAML )

(ADDTOVAR LAMA )
)

(PUTPROPS GRAFSIM COPYRIGHT ("Savoir, Inc." 1985 1986 1987 1988))
```

METHOD INDEX

AnalysisFolderBrowser.ComputeMiddleMethodItems .....6
AnalysisFolderBrowser.EditCProg ....................6
AnalysisFolderBrowser.EditDecls ....................6
AnalysisFolderBrowser.FlashNexus ...................6
AnalysisFolderBrowser.FlashSendTemplate ............6
AnalysisFolderBrowser.FlashStep ....................7
AnalysisFolderBrowser.SpawnBrowser .................7
AnalysisRefDecls.FillIn ............................7
AnalysisReference.BrowserMethodItems ...............8
AnalysisRefMMFS.FillIn .............................7
AnalysisRefMMFSSnd.FillIn ..........................7
AnalysisRefStepProg.FillIn .........................7
AnalysisRefTrans.FillIn ............................8
CFunction.AnalysisScope ............................8
CFunction.ObjectForSearch ..........................8
CFunctionFolder.ProcessNonObjects ..................8
GrafcetAnalysisContext.ComputeSubContextTypes ......8
GrafcetAnalysisContext.FindObject .................8
GrafcetFnAnalysisContext.GetNameOfThing ...........9
GrafcetListMsgsSentContext.ProcessAccessList .......9
GrafcetListMsgsSentContext.SetFolderScope ..........9
GrafcetListXXContext.BuildList ....................9
GrafcetListXXContext.ProcessAccessList ............9
GrafcetListXXContext.SetFolderScope ...............9
GrafcetMsgUsesContext.ApplicableToObject? .........9
GrafcetNexusUsesContext.ApplicableToObject? .......10
GrafcetVarAnalysisContext.GetNameOfThing ..........10
GrafcetVarFlashContext.FlashNode ..................10
GrafcetVarFlashContext.FlashStep ..................10
MsgSendersContext.FindObject ......................10
MsgSendersContext.GetNameOfThing ..................10

CLASS INDEX

AnalysisFolderBrowser ..........1
AnalysisRefDecls ...............1
AnalysisReference ..............2
AnalysisRefFunction ............1
AnalysisRefMMFS ................1
AnalysisRefMMFSRcv .............1
AnalysisRefMMFSSnd .............1
AnalysisRefStepProg ............2
AnalysisRefTrans ...............2
CFunction ......................2
CFunctionFolder ................2
ExamineCFunctionFolderContext ...2
FnCallersContext ...............2
FnDeffersContext ...............2
GrafcetAnalysisContext .........3
GrafcetAnalysisFolder ..........3
GrafcetFnAnalysisContext .......3
GrafcetListFnsCalledContext ....3
GrafcetListFnsContext ..........3
GrafcetListFnsDefinedContext ....3
GrafcetListMsgsSentContext ......3
GrafcetListVarsContext .........3
GrafcetListVarsDeclaredContext ..4
GrafcetListVarsFetchedContext ...4
GrafcetListVarsSetContext .....4
GrafcetListXXContext ...........4
GrafcetMsgAnalysisContext ......4
GrafcetMsgUsesContext ..........4
GrafcetNexusUsesContext ........4
GrafcetProgUsesContext .........4
GrafcetTransUsesContext ........4
GrafcetUsesContext .............5
GrafcetVarAnalysisContext ......5
GrafcetVarFlashContext .........5
MsgSendersContext ..............5
VarDeclersContext ..............5
VarFetchersContext .............5
VarSettersContext ..............5
VarUsersContext ................5

PROPERTY INDEX

CELLTOOL ....................1,10

MACRO INDEX

FISAbbrevString ...............10 changes to: (METHODS GrafcetNexusUsesContext.ApplicableToObject?)

previous date: 17-Aug-88 16:32:13 {DSK}<LISPFILES>FIS>CELLTOOL.;106

Read Table: INTERLISP

Package: IL

;; Copyright (c) 1985, 1986, 1987, 1988 by Savoir, Inc. All rights reserved.

```
(RPAQQ CELLTOOLCOMS
       ((DECLARE%: DONTCOPY (PROP MAKEFILE-ENVIRONMENT CELLTOOL))
        (CLASSES AnalysisFolderBrowser AnalysisRefDecls AnalysisRefFunction AnalysisRefMMFS
               AnalysisRefMMFSRcv AnalysisRefMMFSSnd AnalysisRefStepProg AnalysisRefTrans AnalysisReference
               CFunction CFunctionFolder ExamineCFunctionFolderContext FnCallersContext FnDeffersContext
               GrafcetAnalysisContext GrafcetAnalysisFolder GrafcetFnAnalysisContext
               GrafcetListFnsCalledContext GrafcetListFnsContext GrafcetListFnsDefinedContext
               GrafcetListMsgsSentContext GrafcetListVarsContext GrafcetListVarsDeclaredContext
               GrafcetListVarsFetchedContext GrafcetListVarsSetContext GrafcetListXXContext
               GrafcetMsgAnalysisContext GrafcetMsgUsesContext GrafcetNexusUsesContext GrafcetProgUsesContext
               GrafcetTransUsesContext GrafcetUsesContext GrafcetVarAnalysisContext GrafcetVarFlashContext
               MsgSendersContext VarDeclersContext VarFetchersContext VarSettersContext VarUsersContext)
        (METHODS AnalysisFolderBrowser.ComputeMiddleMethodItems AnalysisFolderBrowser.EditCProg
               AnalysisFolderBrowser.EditDecls AnalysisFolderBrowser.FlashNexus
               AnalysisFolderBrowser.FlashSendTemplate AnalysisFolderBrowser.FlashStep
               AnalysisFolderBrowser.SpawnBrowser AnalysisRefDecls.FillIn AnalysisRefMMFS.FillIn
               AnalysisRefMMFSSnd.FillIn AnalysisRefStepProg.FillIn AnalysisRefTrans.FillIn
               AnalysisReference.BrowserMethodItems CFunction.AnalysisScope CFunction.ObjectForSearch
               CFunctionFolder.ProcessNonObjects GrafcetAnalysisContext.ComputeSubContextTypes
               GrafcetAnalysisContext.FindObject GrafcetFnAnalysisContext.GetNameOfThing
               GrafcetListMsgsSentContext.ProcessAccessList GrafcetListMsgsSentContext.SetFolderScope
               GrafcetListXXContext.BuildList GrafcetListXXContext.ProcessAccessList
               GrafcetListXXContext.SetFolderScope GrafcetMsgUsesContext.ApplicableToObject?
               GrafcetNexusUsesContext.ApplicableToObject? GrafcetVarAnalysisContext.GetNameOfThing
               GrafcetVarFlashContext.FlashNode GrafcetVarFlashContext.FlashStep MsgSendersContext.FindObject
               MsgSendersContext.GetNameOfThing)
        (MACROS FISAbbrevString)
        (PROP FILETYPE CELLTOOL)))
```

```
(DECLARE%: DONTCOPY

(PUTPROPS CELLTOOL MAKEFILE-ENVIRONMENT (:PACKAGE "IL" :READTABLE "INTERLISP" :BASE 10))
)

(DEFCLASS AnalysisFolderBrowser (MetaClass Class Edited%:      (* TAL "29-Nov-87 21 21")
                                     doc "This is the default metaClass for all classes")
       (Supers FolderBrowser)
       (ClassVariables (MiddleMethodItems #.($A ComputeMiddleMethodItems AVSendSelf NIL))))

(DEFCLASS AnalysisRefDecls (MetaClass Class Edited%:          (* TAL "30-Nov-87 00.51")
                                     doc "This is the default metaClass for all classes")
       (Supers AnalysisReference)
       (ClassVariables (BrowserMenuItems (("View Decls" EditDecls "View the first matching occurrence in the
                                     decls.")))
              (BrowseableSubParts NIL)))

(DEFCLASS AnalysisRefFunction (MetaClass Class Edited%:       (* TAL "19-Nov-87 18.46")
                                     doc "This is the default metaClass for all classes")
       (Supers AnalysisRefDecls))

(DEFCLASS AnalysisRefMMFS (MetaClass Class Edited%:           (* TAL "19-Nov-87 18.46")
                                     doc "This is the default metaClass for all classes")
       (Supers AnalysisReference))

(DEFCLASS AnalysisRefMMFSRcv (MetaClass Class Edited%:        (* TAL "29-Nov-87 19:52")
                                     doc "This is the default metaClass for all classes")
       (Supers AnalysisRefMMFS)
       (InstanceVariables (callerType "Rcv template" doc "Step, Trans, Template, Decls, Function")))

(DEFCLASS AnalysisRefMMFSSnd (MetaClass Class Edited%:        (* TAL " 6-Dec-87 20 22")
                                     doc "This is the default metaClass for all classes")
       (Supers AnalysisRefMMFS)
       [ClassVariables (BrowserMenuItems (("View Send Template" FlashSendTemplate "Flash this template in its
                                     definition folder."]
       (InstanceVariables (callerType "Snd template" doc "Step, Trans, Template, Decls, Function")))
```

Page 2

```
(DEFCLASS AnalysisRefStepProg (MetaClass Class Edited%:       (* TAL " 6-Dec-87 19:48")
                                     doc "This is the default metaClass for all classes")
       (Supers AnalysisReference)
       (ClassVariables (BrowserMenuItems (("Flash Step" FlashStep "Flash the step containing this step
                                     program.")
                                     ("View Step Prog" EditCProg "View the text of this step program."))
                                     )
              (BrowseableSubParts NIL))
       (InstanceVariables (info1 NIL doc "Step name")))

(DEFCLASS AnalysisRefTrans (MetaClass Class Edited%:          (* TAL "30-Nov-87 00:31")
                                     doc "This is the default metaClass for all classes")
       (Supers AnalysisReference)
       (ClassVariables (BrowserMenuItems (("Flash Transition" FlashNexus "Flash the selected transition.")))
              (BrowseableSubParts NIL))
       (InstanceVariables (callerType Transition doc "Step, Trans, Template, Decls, Function")))

(DEFCLASS AnalysisReference (MetaClass Class Edited%:         (* TAL "18-Jan-88 12:01")
                                     doc "This is the default metaClass for all classes")
       (Supers ComputerObject)
       (ClassVariables (BrowserMenuItems NIL)
              (BrowseableSubParts NIL)
              (SummaryFields (progName callerType info1)))
       (InstanceVariables (callerType NIL heading "Item" doc "Step, Trans, Template, Decls, Function")
              (progName NIL heading "Macro")
              (info1 NIL heading "Label")
              (inProg NIL doc "points to the macro prog containing the whatever")
              (analObj NIL Editable T doc "Actual object when appropriate")
              (lineNumbers NIL)))

(DEFCLASS CFunction (MetaClass Class Edited%:                 (* TAL "18-Nov-87 17 15")
                                     doc "This is the default metaClass for all classes")
       (Supers ComputerObject)
       (ClassVariables (PrintName "C function")
              (SummaryFields (fnName)))
       (InstanceVariables (fnName NIL)
              (container NIL doc "folder containing me, used to get value")))

(DEFCLASS CFunctionFolder (MetaClass Class Edited%:           (* TAL "18-Nov-87 17 16")
                                     doc "This is the default metaClass for all classes")
       (Supers Folder)
       (ClassVariables (SortCompareFn UALPHORDER))
       (InstanceVariables (elements NIL VR #.($C CFunction))
              (scope NIL doc "main program, when available. Used to get at the process context")))

(DEFCLASS ExamineCFunctionFolderContext (MetaClass Class Edited%:
                                                              (* TAL "22-Nov-87 16 31")
                                     doc "This is the default metaClass for all classes")
       (Supers ExamineFolderContentsContext)
       (ClassVariables (AttachHorizMenu T)
              (SubContexts NIL)
              (LinkedContexts NIL)
              (SubContextTypes (#.($C GrafcetAnalysisContext))))
       (InstanceVariables (object NIL VR #.($C CFunctionFolder))))
```

```
(DEFCLASS FnCallersContext (MetaClass Class Edited%:          (* TAL " 6-Dec-87 18:00")
                                       doc "This is the default metaClass for all classes")
       (Supers GrafcetFnAnalysisContext)
       (ClassVariables (PrintName "Callers")
              (MenuName "Who Can Call")
              (MenuDoc "View list of places in the program where this function can be called.")
              (AccessType Call doc "List or atom to pass to scope's WhoUses! method")
              (AccessString "called" doc "String describing AccessType for use in messages")
              (Prototype #.($& FnCallersContext (NYWO.kga%:.2>> . 214)))))

(DEFCLASS FnDeffersContext (MetaClass Class Edited%:          (* TAL " 6-Dec-87 18:00")
                                       doc "This is the default metaClass for all classes")
       (Supers GrafcetFnAnalysisContext)
       (ClassVariables (PrintName "Definers")
              (MenuName "Who Defines")
              (MenuDoc "Show where this function is defined.")
              (AccessType FnDef doc "List or atom to pass to scope's WhoUses! method")
              (AccessString "defined" doc "String describing AccessType for use in messages")
              (Prototype #.($& FnDeffersContext (NYWO.kga%:.2>> . 215)))))
```

```
(DEFCLASS GrafcetAnalysisContext (MetaClass AbstractClass Edited%:
                                                       (* TAL " 6-Dec-87 18:00")
                                          doc "Abstract classes are placeholders in the inheritance network,
                                          which cannot themselves be instantiated.")
       (Supers ExamineFolderContentsContext)
       (ClassVariables (AttachHorizMenu T doc "Controls appearance of horizontal menu items, defaults on")
              (LinkedContexts NIL)
              (SubContexts NIL)
              (SubContextTypes NIL old #.($A ComputeSubContextTypes AVSendSelf NoUpdatePermitted))
              (ExposedSubContextTypes (#.($C GrafcetVarFlashContext))
                     doc "subcontexts to use when containing program is displayed")
              (NonExposedSubContextTypes (#.($C EditGrafcetContext))
                     doc "subcontexts to use when containing program is not displayed")
              (AccessType NIL doc "List or atom to pass to scope's WhoUses! method")
              (AccessString NIL doc "String describing AccessType for use in messages")
              (DefaultAnalysisMode Flash)
              (Browser #.($C AnalysisFolderBrowser)))
       (InstanceVariables (canCreate NIL)
              (ofThing NIL doc "name of thing we found callers of")))

(DEFCLASS GrafcetAnalysisFolder (MetaClass Class Edited%:     (* TAL " 6-Dec-87 19:39")
                                         doc "This is the default metaClass for all classes")
       (Supers Folder)
       (InstanceVariables (elements NIL VR #.($C AnalysisReference))
              (searchString NIL)
              (accessType NIL)))

(DEFCLASS GrafcetFnAnalysisContext (MetaClass Class Edited%:  (* TAL " 6-Dec-87 15:33")
                                             doc "This is the default metaClass for all classes")
       (Supers GrafcetAnalysisContext)
       (ClassVariables (Prototype #.($& GrafcetFnAnalysisContext (NQWO.kga%:.co@ . 26))))
       (InstanceVariables (object NIL VR #.($C CFunction))))

(DEFCLASS GrafcetListFnsCalledContext (MetaClass Class Edited%:
                                                       (* TAL " 6-Dec-87 15:21")
                                                doc "This is the default metaClass for all classes")
       (Supers GrafcetListFnsContext)
       (ClassVariables (MenuName "Functions Called")
              (MenuDoc "View list of functions called from within selected object.")
              (AccessType Call doc "List or atom to pass to object's GetAccessList method")
              (Prototype #.($& GrafcetListFnsCalledContext (OHWO.kga%:.E@9 . 90)))))

(DEFCLASS GrafcetListFnsContext (MetaClass Class Edited%:     (* TAL "18-Nov-87 17:17")
                                         doc "This is the default metaClass for all classes")
       (Supers GrafcetListXXContext)
       (ClassVariables (ContextToSpawn #.($C ExamineCFunctionFolderContext) doc "Folder context to spawn. It
                              tells us folder type to build")))

(DEFCLASS GrafcetListFnsDefinedContext (MetaClass Class Edited%:
                                                       (* TAL " 6-Dec-87 15:22")
                                                doc "This is the default metaClass for all classes")
       (Supers GrafcetListFnsContext)
       (ClassVariables (MenuName "Functions Defined")
              (MenuDoc "View list of functions defined in selected object.")
              (AccessType FnDef doc "List or atom to pass to object's GetAccessList method")
              (Prototype #.($& GrafcetListFnsDefinedContext (NQWO.kga%:.co@ . 11)))))

(DEFCLASS GrafcetListMsgsSentContext (MetaClass Class Edited%:
                                                       (* TAL " 6-Dec-87 15:23")
                                                doc "This is the default metaClass for all classes")
       (Supers GrafcetListXXContext)
       (ClassVariables (MenuName "Messages Sent")
              (MenuDoc "View list of templates for messages that can be sent within selected object.")
              (AccessType Send doc "List or atom to pass to object's GetAccessList method")
              (ContextToSpawn #.($C ExamineSendableMessageFolderContext) doc "Folder context to spawn. It
                     tells us folder type to build")
              (Prototype #.($& GrafcetListMsgsSentContext (OHWO.kga%:.E@9 . 91)))))
```

```
(DEFCLASS GrafcetListVarsContext (MetaClass Class Edited%:      (* TAL  5-Dec-87 15 28")
                                   doc "This is the default metaClass for all classes")
      (Supers GrafcetListXXContext)
      (ClassVariables (MenuName "Vars Used")
            (MenuDoc "View list of variables set or fetched within selected object.")
            (AccessType (Set Fetch)
                  doc "List or atom to pass to object's GetAccessList method")
            (ContextToSpawn #.($C ExamineSvFolderContext) doc "Folder context to spawn. It tells us folder
                  type to build")
            (Prototype #.($& GrafcetListVarsContext (OHWO.kga%:.E@9 . 92))))))
```

```
(DEFCLASS GrafcetListVarsDeclaredContext (MetaClass Class Edited%:
                                                        (* TAL " 6-Dec-87 15.24")
                                   doc "This is the default metaClass for all classes")
      (Supers GrafcetListVarsContext)
      (ClassVariables (MenuName "Vars Declared")
            (MenuDoc "View list of variables declared in selected object.")
            (AccessType Declare)
            (Prototype #.($& GrafcetListVarsDeclaredContext (NQWO.kga%:.co@ . 12)))))

(DEFCLASS GrafcetListVarsFetchedContext (MetaClass Class Edited%:
                                                        (* TAL " 6-Dec-87 15.25")
                                   doc "This is the default metaClass for all classes")
      (Supers GrafcetListVarsContext)
      (ClassVariables (MenuName "Vars Fetched")
            (MenuDoc "View list of variables whose values are fetched within selected object.")
            (AccessType Fetch)
            (Prototype #.($& GrafcetListVarsFetchedContext (NQWO.kga%:.co@ . 9)))))

(DEFCLASS GrafcetListVarsSetContext (MetaClass Class Edited%:
                                                        (* TAL " 6-Dec-87 15.25")
                                   doc "This is the default metaClass for all classes")
      (Supers GrafcetListVarsContext)
      (ClassVariables (MenuName "Vars Set")
            (MenuDoc "View list of variables whose values are changed within selected object.")
            (AccessType Set)
            (Prototype #.($& GrafcetListVarsSetContext (NQWO.kga%:.co@ . 10)))))

(DEFCLASS GrafcetListXXContext (MetaClass Class Edited%:     (* TAL "22 Nov 87 16.39")
                                   doc "These contexts just build a folder of the desired items (fns.
                                   vars, msgs) and start a folder context on it")
      (Supers DefaultContext)
      (ClassVariables (InitialActions (BuildList))
            (AccessType NIL doc "List or atom to pass to object's GetAccessList method")
            (ContextToSpawn NIL doc "Folder context to spawn. It tells us folder type to build")
            (Browser NIL doc "No browser for this context"))
      (InstanceVariables (accessList NIL)))

(DEFCLASS GrafcetMsgAnalysisContext (MetaClass AbstractClass Edited%:
                                                        (* TAL " 4-Sep 85 05.37")
                                   doc "Abstract classes are placeholders in the inheritance network,
                                   which cannot themselves be instantiated.")
      (Supers GrafcetAnalysisContext)
      (InstanceVariables (object NIL VR #.($C MMFSMessageDefinition))))

(DEFCLASS GrafcetMsgUsesContext (MetaClass Class Edited%:     (* TAL "22-Nov 87 16.26")
                                   doc "This is the default metaClass for all classes")
      (Supers GrafcetUsesContext)
      (ClassVariables (SubItemContexts (#.($C GrafcetListVarsContext) #.($C GrafcetListVarsFetchedContext)
                                        #.($C GrafcetListVarsSetContext)
                                        #.($C GrafcetListFnsCalledContext)
                                        #.($C GrafcetListMsgsSentContext)))
            (Prototype #.($& GrafcetMsgUsesContext (NQWO.kga%:.co@ . 23))))
      (InstanceVariables (object NIL VR #.($C MMFSMessageDefinition))))

(DEFCLASS GrafcetNexusUsesContext (MetaClass Class Edited%:     (* TAL "18-Nov 87 18 32")
                                   doc "This is the default metaClass for all classes")
      (Supers GrafcetUsesContext)
      (ClassVariables (Prototype #.($& GrafcetNexusUsesContext (NQWO.kga%:.co@ . 16))))
      (InstanceVariables (object NIL VR #.($C FIDGrafcetNexus))))

(DEFCLASS GrafcetProgUsesContext (MetaClass Class Edited%:     (* TAL "15 Nov 87 18.29")
                                   doc "This is the default metaClass for all classes")
      (Supers GrafcetUsesContext)
      (ClassVariables (Prototype #.($& GrafcetProgUsesContext (OHWO.kga%:.E@9 . 89))))
      (InstanceVariables (object NIL VR #.($C GrafcetProgram))))

(DEFCLASS GrafcetTransUsesContext (MetaClass Class Edited%:     (* TAL " 3 Dec 87 16 06")
                                   doc "This is the default metaClass for all classes")
      (Supers GrafcetUsesContext)
      (ClassVariables (SubItemContexts (#.($C GrafcetListVarsContext) #.($C GrafcetListVarsFetchedContext)
                                        #.($C GrafcetListVarsSetContext)
                                        #.($C GrafcetListFnsCalledContext)
                                        #.($C GrafcetListMsgsSentContext)))
            (Prototype #.($& GrafcetTransUsesContext (NYWO.kga%:.2>> . 217))))
      (InstanceVariables (object NIL VR #.($C GrafcetTransition))))
```

```
(DEFCLASS GrafcetUsesContext (MetaClass Class Edited%:     (* TAL " 6-Dec-87 15 27")
                                   doc "This is the default metaClass for all classes")
      (Supers DefaultContext)
      (ClassVariables (MenuName "Vars Used")
```

```
            (MenuDoc "View list of variables set or fetched within selected object.
                  Slide out for other options.")
            (SubItemContexts (#,($C GrafcetListVarsContext) #,($C GrafcetListVarsFetchedContext)
                                #,($C GrafcetListVarsSetContext)
                                #,($C GrafcetListVarsDeclaredContext)
                                #,($C GrafcetListFnsCalledContext)
                                #,($C GrafcetListFnsDefinedContext) #,($C GrafcetListMsgsSentContext)))
            (InitialContexts ((#,($C GrafcetListVarsContext) %:object)))
            (Browser NIL)))

(DEFCLASS GrafcetVarAnalysisContext (MetaClass AbstractClass Edited%:
                                                        (* edited%: " 7 Dec-85 20 55")
                                    doc "Abstract classes are placeholders in the inheritance network,
                                    which cannot themselves be instantiated.")
      (Supers GrafcetAnalysisContext)
      (InstanceVariables (object NIL VR #,($C StateVariable))))

(DEFCLASS GrafcetVarFlashContext (MetaClass Class Edited%:     (* mct%: " 2 Dec-85 19.49")
                                 doc "This is the default metaClass for all classes")
      (Supers DefaultContext)
      (ClassVariables (MenuName "Flash Node")
            (MenuDoc "Flash node identified by selected object")
            (InitialActions (FlashNode)
                  doc "Only action taken by this context"))
      (InstanceVariables (object NIL VR #,($C GrafcetAnalysisCaller))))

(DEFCLASS MsgSendersContext (MetaClass Class Edited%:          (* TAL " 6 Dec 87 18 02")
                            doc "This is the default metaClass for all classes")
      (Supers GrafcetMsgAnalysisContext)
      (ClassVariables (PrintName "Senders")
            (MenuName "Who Can Send")
            (MenuDoc "View list of places in the program where this message can be sent.")
            (AccessType Send)
            (AccessString "sent")
            (Prototype #,($& MsgSendersContext (NQWO.kga%:.co@ . 27))))
      (InstanceVariables (object NIL VR #,($C MMFSSendableMessageDefinition))))

(DEFCLASS VarDeclersContext (MetaClass Class Edited%:          (* TAL " 6 Dec 87 18 03")
                            doc "This is the default metaClass for all classes")
      (Supers GrafcetVarAnalysisContext)
      (ClassVariables (PrintName "Declarers")
            (MenuName "Who Declares")
            (MenuDoc "Show where this variable is declared.")
            (AccessType Declare)
            (AccessString "declared")
            (Prototype #,($& VarDeclersContext (NYWO.kga%:.2>> . 220)))))

(DEFCLASS VarFetchersContext (MetaClass Class Edited%:         (* TAL " 6 Dec 87 18 03")
                             doc "This is the default metaClass for all classes")
      (Supers GrafcetVarAnalysisContext)
      (ClassVariables (PrintName "Fetchers")
            (MenuName "Who Can Fetch")
            (MenuDoc "View list of places in the program where this variable's value is used.")
            (AccessType Fetch)
            (AccessString "fetched")
            (Prototype #,($& VarFetchersContext (NQWO.kga%:.co@ . 29)))))

(DEFCLASS VarSettersContext (MetaClass Class Edited%:          (* TAL " 6-Dec-87 18 03")
                            doc "This is the default metaClass for all classes")
      (Supers GrafcetVarAnalysisContext)
      (ClassVariables (PrintName "Setters")
            (MenuName "Who Can Set")
            (MenuDoc "View list of places in the program where this variable's value can be changed.")
            (AccessType Set)
            (AccessString "set")
            (Prototype #,($& VarSettersContext (NQWO.kga%:.co@ . 28)))))

(DEFCLASS VarUsersContext (MetaClass Class Edited%:            (* TAL " 6-Dec 87 18 03")
                          doc "This is the default metaClass for all classes")
      (Supers GrafcetVarAnalysisContext)
      (ClassVariables (PrintName "Users")
            (MenuName "Who Can Use")
            (MenuDoc "View list of places in the program where this variable is set or fetched.")
            (AccessType (Set Fetch))
            (AccessString "used")
            (Prototype #,($& VarUsersContext (NYWO.kga%:.2>> . 221)))))

 \BatchMethodDefs)
```

Page 6

```
(Method ((AnalysisFolderBrowser ComputeMiddleMethodItems) self)
                                                        TAL 29-Nov-87 23:58
   "New method template"
   (LET ((obj (@ %:middleSubObject)))
     (AND (ObjectExists? obj)
          (_ obj BrowserMethodItems))))

(Method ((AnalysisFolderBrowser EditCProg) self item analRef)
                                                        TAL 22-Apr-88 19:25
   "New method template"
   (LET ((obj (@ analRef %:analObj))
         line browser)
```

```
    (COND
       ((SETQ browser (_ self SpawnBrowser obj ($ EditCContext)
                             NIL T))
        (COND
           ((NUMBERP (SETQ line (for x in (@ analRef %:lineNumbers) when (NUMBERP x) smallest x)))
                                                          (* Must use smallest rather than minimize as
                                                          (NUMBERP MAX.INTEGER) is T)
            (_ browser GoToLine line)))
        (_ browser SetSearchString (@ |:object:searchString|))
        (TOTOPW (@ %:window)])

(Method ((AnalysisFolderBrowser EditDecls) self item analRef)
                                                          TAL 22-Apr-88 19 22
  "New method template"
  [LET ((obj (@ analRef %:inProg))
        line browser)
    (COND
       ((SETQ browser (_ self SpawnBrowser obj ($ EditGrafDeclsContext)
                             NIL T))
        (COND
           ((NUMBERP (SETQ line (for x in (@ analRef %:lineNumbers) when (NUMBERP x) smallest x)))
                                                          (* Must use smallest rather than minimize as
                                                          (NUMBERP MAX.INTEGER) is T)
            (_ browser GoToLine line)))
        (_ browser SetSearchString (@ |:object:searchString|))
        (TOTOPW (@ %:window)])

(Method ((AnalysisFolderBrowser FlashNexus) self item analRef nexus)
                                                          Edited 17-Aug 88 16.28 by TAL
  "New method template"
  [LET ((prog (@ analRef inProg))
        (obj (OR nexus (@ analRef analObj)))
        ds)
    (_ self SpawnBrowser prog ($ EditGrafcetContext))
    (COND
       ((SETQ ds (@ prog displayStream))
        (AND (SETQ ds (@ prog displayStream)) (OPENP ds))
        (to 2 do (_ obj Highlight ds 'Flash)
                 (DISMISS 300 NIL T)
                 (_ obj Highlight ds 'Flash)
                 (DISMISS 300 NIL T))
        (TOTOPW (@ window)])

(Method ((AnalysisFolderBrowser FlashSendTemplate) self item analRef)
                                                          TAL 6-Dec-87 20:25
  "New method template"
  [LET ((msg (@ analRef %:analObj))
        folder browser)
    (COND
       [(AND (ObjectExists? msg)
             (SETQ folder (ObjectExists? (@ msg %:container)))
        (COND
           ((SETQ browser (_ self SpawnBrowser folder ($ ExamineSendableMessageFolderContext)))
            (to 2 do (_ browser Highlight msg 'Invert)
                     (DISMISS 300 NIL T)
                     (_ browser Highlight msg 'Invert)     (* Second one should be Off instead of Invert but browser doesn't
                                                          remember state correctly)
                     (DISMISS 300 NIL T))
            (TOTOPW (@ %:window)))
           (FISDebugFlg (SHOULDNT]
       (T (_ self SWPromptPrint "That template no longer exists." NIL 2 NIL 1500)])
                                                                                         Page 7

(Method ((AnalysisFolderBrowser FlashStep) self item analRef)
                                                          TAL 30-Nov-87 00:29
  "New method template"
  (_ self FlashNexus item analRef (@ analRef |:analObj:caller|)))

(Method ((AnalysisFolderBrowser SpawnBrowser) self object contextClass browserKey flash?)
                                                          TAL 30-Nov-87 00.25
  "New method template"
  [LET ([key (OR browserKey (ClassName (@ contextClass |::Browser|)]
        browser context)
    (COND
       ((SETQ browser (CAR (_ object LocateBrowsers key)))
        (COND
           (flash? (_ browser FlashBrowser)))
        browser)
       ((ObjectExists? (SETQ context (_ (@ %:context)
                                        SpawnSubContext contextClass object)))
        (@ context %:myBrowser))
       (T (CAR (_ object LocateBrowsers key)])

(Method ((AnalysisRefDecls FillIn) self prog fnName lines)
                                                          TAL 4 Dec 87 19 29
  "Specialization"
  LET NIL
```

```
(_@ %:inProg prog)
(_@ %:progName (@ prog %:printName))
(_@ %:lineNumbers lines)
(COND
  (fnName (_@ %:info1 fnName)
        (_@ %:callerType "Function"))
  (T (_@ %:callerType "Decls")))
self))
```

(Method ((AnalysisRefMMFS FillIn) self template) TAL 6-Dec-87 19.14

```
"Specialization"
(LET* ((folder (@ template %:container))
       (step (@ folder %:caller))
       (prog (@ step %:superObject)))
  (_@ %:inProg prog)
  (_@ %:progName (@ prog %:printName))
  (_@ %:analObj template)
  (_@ %:info1 (FISAbbrevString (@ template %:data)
                               20))
  self))
```

(Method ((AnalysisRefMMFSSnd FillIn) self template) TAL 6-Dec-87 19.14

```
"Specialization"
(LET* ((folder (@ template %:container))
       (step (@ folder %:caller))
       (prog (@ step %:superObject)))
  (_@ %:inProg prog)
  (_@ %:progName (@ prog %:printName))
  (_@ %:analObj template)
  (_@ %:info1 (COND
                ((NUMBERP (@ template %:templateID))
                 (CONCAT "#" (@ template %:templateID)
                         " "
                         (FISAbbrevString (@ template %:data)
                                          15)))
                (T (FISAbbrevString (@ template %:data)
                                    20))))
  self))
```

(Method ((AnalysisRefStepProg FillIn) self cProg partName lines) TAL 29-Nov-87 21.00

```
"Specialization"
(LET* ((step (@ cProg %:caller))
       (prog (@ step %:superObject)))
  (_@ %:inProg prog)
  (_@ %:progName (@ prog %:printName))
  (_@ %:lineNumbers lines)
  (_@ %:analObj cProg)
  (_@ %:info1 (@ step %:label))
  (_@ %:callerType (SELECTQ partName
                     (activation "Activation")
                     (deactivation "Deactivation")
                     (continuous "Continuous")
```

```
                     (SHOULDNT)))
  self))
```

(Method ((AnalysisRefTrans FillIn) self trans) TAL 6-Dec-87 19:18

```
"Specialization"
(LET ((prog (@ trans %:superObject)))
  (_@ %:inProg prog)
  (_@ %:progName (@ prog %:printName))
  (_@ %:analObj trans)
  (_@ %:info1 (FISAbbrevString (@ trans %:label)
                               20))
  self))
```

(Method ((AnalysisReference BrowserMethodItems) self) TAL 30-Nov-87 00.10

```
"New method template"
(@ |::BrowserMenuItems|))
```

(Method ((CFunction AnalysisScope) self) TAL 5-Dec-87 18.58

```
"New method template"
(@ |:container:scope|))
```

(Method ((CFunction ObjectForSearch) self) TAL 29-Nov-87 18.21

```
"New method template"
(@ %:fnName))
```

(Method ((CFunctionFolder ProcessNonObjects) self objects) TAL 18-Nov-87 17.22

```
"Specialization"
```

```
(bind ele (vr _ (@ |:elements:.VR|)) for x in objects eachtime (SETQ ele (_ vr New))
                                                             (_@ ele %:fnName x)
                                                             (_@ ele %:container self)
   collect ele))
```

(Method ((GrafcetAnalysisContext ComputeSubContextTypes) self)
edited: 7 Dec-85 20:55

```
  "Supply appropriate sub-contexts based on whether or not the containing program is currently visible"
  [LET ((obj (@ |:myBrowser:middleSubObject|))
        ds)
    (COND
      ((AND obj (SETQ ds (@ obj |:inProgUID:displayStream|))
            (OPENP ds))
       (@ |::ExposedSubContextTypes|))
      (T (@ |::NonExposedSubContextTypes|)])
```

(Method ((GrafcetAnalysisContext FindObject) self suppliedObject)
TAL 18-Jan-88 11:42

```
  "suppliedObject is a StateVariable CFunction or template"
  (LET ((scope (_ suppliedObject AnalysisScope))
        (accessType (@ |::AccessType|))
        (searchObj (_ suppliedObject ObjectForSearch))
        folder l)
    (COND
      ((AND scope (SETQ l (_ scope WhoUses! searchObj accessType)))
       (SETQ folder (_ (DEFERREDCONSTANT ($ GrafcetAnalysisFolder))
                       New))
       (_@ folder %:printName (CONCAT (@ |::PrintName|)
                                      " of "
                                      (_ self GetNameOfThing suppliedObject)
                                      " in "
                                      (_ scope QualifiedPrintName)))
       (_@ folder %:elements l)
       (_@ folder %:accessType accessType)
       (_@ folder %:searchString (MKSTRING searchObj))
       folder)
      (T (CLEARW PROMPTWINDOW)
         (PROMPTPRINT (_ self GetNameOfThing suppliedObject)
                " is not "
                (@ |::AccessString|)
                " anywhere in "
                (@ scope %:printName)
                ".")
         (FLASHWINDOW PROMPTWINDOW 2 200)
         NIL))))
```

Page =

(Method ((GrafcetFnAnalysisContext GetNameOfThing) self thing)
TAL 30-Nov-87 00:42

```
  "New method template"
  (@ thing %:fnName))
```

(Method ((GrafcetListMsgsSentContext ProcessAccessList) self folder accessList scope)
TAL 6-Dec-87 18:54
Specialization

```
  "SORT should be done by folder"
  (LET (pos tmplFolder msgTemplate)
    (SORT (for x in accessList collectwhen (COND
                                             ((SETQ pos (STRPOSL [LOADTIMECONSTANT (MAKEBITTABLE
                                                                                    (CHARCODE ((]
                                                                  x NIL NIL T))
                                                (* (SETQ pos (STRPOS "(" x)))
                                              (COND
                                                ((SETQ tmplFolder (FISTemplatesForSender
                                                                    (SUBATOM x 1 (SUB1 pos))
                                                                    NIL scope))
                                                 (_ tmplFolder LookupTemplate (SUBATOM x (ADD1 pos)
                                                                                       -1)))
                                                (T NIL)))
                                             (T (SHOULDNT)
                                                NIL)))
          (FUNCTION MMFSSendTemplateAnalysisCompareFn))))
```

(Method ((GrafcetListMsgsSentContext SetFolderScope) self folder scope)
TAL 5-Dec-87 16:22

```
  "Msg folders don t have scope IV"
  NIL)
```

Method ((GrafcetListXXContext BuildList) self) TAL 17-Jan-88 18:10

```
  "New method template"
  (DECLARE (GLOBALVARS WAITINGCURSOR PROMPTWINDOW))
  [LET ((object (@ %:object))
        accessList ctx folder scope)
    [RESETFORM (CURSOR WAITINGCURSOR)
           (SETQ accessList (_ object GetAccessList (@ |::AccessType|)))]
    (COND
      (accessList (SETQ ctx (@ |::ContextToSpawn|))
           (SETQ scope (_ object MainProgram))
```

```
            (SETQ folder (_ (@ ctx !:object:.VRI)
                            New))
            (_@ folder %:elements (_ self ProcessAccessList folder accessList scope))
            (_ self SetFolderScope folder scope)
            (_@ folder %:printName (CONCAT (@ !::MenuName!)
                                           " in "
                                           (_ object QualifiedPrintName)))
            (_ self SpawnLinkedContext ctx folder))
       (T (CLEARW PROMPTWINDOW)
          (PROMPTPRINT "There are no " (L-CASE (@ !::MenuName!))
                " in "
                (_ object QualifiedPrintName)
                ".")
          (FLASHWINDOW PROMPTWINDOW 2 200])
```

(Method ((GrafcetListXXContext ProcessAccessList) self folder accessList scope)
TAL 6-Dec-87 18:46
New method template

```
  "SORT should be dnoe by folder"
  (_ folder ProcessNonObjects (SORT (APPEND accessList)
                                    (FUNCTION UALPHORDER))))
```

(Method ((GrafcetListXXContext SetFolderScope) self folder scope)
TAL 5 Dec-87 16.20

```
  "New method template"
  (_@ folder %:scope scope))
```

(Method ((GrafcetMsgUsesContext ApplicableToObject?) self object)
TAL 27 Jan 88 20 55

```
  "Specialization"
  (NOT (_ object InstOf' MMFSMessage)))
```

Page 10

(Method ((GrafcetNexusUsesContext ApplicableToObject?) self object)
Edited 12-Sep-88 20:18 by mcf

```
  "Specialization"
  (OR (NOT (ObjectExists? object))
      (AND (@ object label)
           (_ object UsesContextApplicable?))))
```

(Method ((GrafcetVarAnalysisContext GetNameOfThing) self thing)
TAL 7 Sep-85 03:00

```
  "New method template"
  (@ thing %:varName))
```

(Method ((GrafcetVarFlashContext FlashNode) self) mcf 17-Jun-86 07 57

```
  "Flash a node in the spawning browser"
  (LET (obj ms ds stepOrTrans)
    [COND
      ((AND (SETQ obj (@ %:object))
            (SETQ stepOrTrans (@ obj %:stepOrTrans))
            (SETQ ms (@ stepOrTrans %:macroStep))
            (SETQ ds (@ ms %:displayStream))
            (OPENP ds))
       (_ self FlashStep stepOrTrans ds 2 300)              (* Bring caller back to the top)
       (AND (SETQ obj (LISTP (@ %:spawningContexts)))
            (SETQ obj (@ (CAR obj)
                         %:myBrowser))
            (TOTOPW (@ obj %:window)]
    NIL))
```

(Method ((GrafcetVarFlashContext FlashStep) self stepOrTrans displayStream n duration)
mcf 2 Dec-85 19:56

```
  "New method template"
  (to n do (_ stepOrTrans Highlight displayStream 'Flash)
           (DISMISS duration)
           (_ stepOrTrans Highlight displayStream 'Flash)
           (DISMISS duration)))
```

(Method ((MsgSendersContext FindObject) self suppliedObject)
TAL 6-Dec-87 19 42

```
  "Specialization hack to suppress default search string for mmfs sends, as there is no good way to search
  for them"
  (LET ((folder (_Super self FindObject suppliedObject)))
    (COND
      (folder (_@ folder %:searchString NIL)))
    folder))
```

(Method ((MsgSendersContext GetNameOfThing) self thing)
TAL 6 Dec 87 19 44

```
  "New method template"
  (CONCAT (@ thing %:source)
          " template #"
          (@ thing %:templateID)))
```

```
(\UnbatchMethodDefs)

(DECLARE%: EVAL@COMPILE

(PUTPROPS FISAbbrevString MACRO [OPENLAMBDA (string len)
                                   (COND
                                      ((ILEQ (NCHARS string)
                                             len)
                                       string)
                                      (T (CONCAT (SUBSTRING string 1 (IDIFFERENCE len 4))
                                                 " ..."])

)

(PUTPROPS CELLTOOL FILETYPE :FAKE-COMPILE-FILE)

(PUTPROPS CELLTOOL COPYRIGHT ("Savoir, Inc." 1985 1986 1987 1988))
```

FUNCTION INDEX

CreateGrafFOE ..................18
FID.DrawBoxFromLst ............19
FID.PaletteList ................19
FIDRepaintFn ...................19
FOE.PokeProcess ................19
FOEBrowserSHRINKFN .............19
FOEComputeSlope ................19
FOECursorMovedFn ...............20
FOECursorOutFn .................20
FOEFLASH.PROCESS ...............20
FOEPaletteWhenSelectedFn .......20
MakeWithinRange ................21

METHOD INDEX

FOEBrowser.AddObject ...............................2
FOEBrowser.AdjustExtent ............................2
FOEBrowser.AllowAttention ..........................2
FOEBrowser.AllowBoxing .............................3
FOEBrowser.AllowEdit ...............................3
FOEBrowser.AllowEditMenus ..........................3
FOEBrowser.Boxed? ..................................4
FOEBrowser.BoxHighLight ............................3
FOEBrowser.Browse ..................................4
FOEBrowser.CheckForMultipleBrowsers ................4
FOEBrowser.CleanupState ............................4
FOEBrowser.Clear ...................................4
FOEBrowser.ClearAll ................................5
FOEBrowser.ClearBoxHighLight .......................5
FOEBrowser.ClearHighlights .........................5
FOEBrowser.ClearMenuCache ..........................5
FOEBrowser.ClearSelections .........................5
FOEBrowser.Close ...................................5
FOEBrowser.CollectObjects ..........................5
FOEBrowser.ComputeGridSize .........................5
FOEBrowser.CreateSideWindow ........................5
FOEBrowser.Delete ..................................6
FOEBrowser.DeleteObject ............................6
FOEBrowser.DeleteObject1 ...........................7
FOEBrowser.DeSelect ................................6
FOEBrowser.Destroy .................................7
FOEBrowser.DestroySideWindow .......................7
FOEBrowser.DrawAreaBox .............................7
FOEBrowser.DrawConnection ..........................7
FOEBrowser.DrawLine ................................7
FOEBrowser.DrawStraightLink ........................8
FOEBrowser.DrawToStream ............................8
FOEBrowser.EnableEdit ..............................8
FOEBrowser.FindNearestSubObject ....................8
FOEBrowser.FindSelectedSubObject ...................8
FOEBrowser.FindSpaceManually .......................8
FOEBrowser.FlashAttentionPt ........................9
FOEBrowser.GetMoveLinkSelection ....................9
FOEBrowser.GetNewPosition ..........................9
FOEBrowser.GetPaletteItems .........................10
FOEBrowser.GetSelection ............................10
FOEBrowser.GetWithPrompt ...........................11
FOEBrowser.GridJustify .............................11
FOEBrowser.HighLightable? ..........................11
FOEBrowser.Initialize ..............................11
FOEBrowser.Insert ..................................11
FOEBrowser.LabelObject .............................12
FOEBrowser.LeftSelection ...........................12
FOEBrowser.LeftTitleSelection ......................12
FOEBrowser.LinkObject ..............................12
FOEBrowser.LocateObject ............................13
FOEBrowser.MakePaletteMenu .........................13
FOEBrowser.MethodMenuSelection .....................13
FOEBrowser.MiddleSelection .........................14
FOEBrowser.MiddleTitleSelection ....................14
FOEBrowser.MouseDeSelect ...........................14
FOEBrowser.MoveIt ..................................14
FOEBrowser.MoveLink ................................14
FOEBrowser.MoveObject ..............................16
FOEBrowser.Repaint .................................16
FOEBrowser.RepaintFn ...............................16
FOEBrowser.ScrollFn ................................16
FOEBrowser.Select ..................................16
FOEBrowser.SelectAttentionPt .......................17
FOEBrowser.Shape ...................................17
FOEBrowser.SpaceP ..................................17
FOEBrowser.UnDelete ................................18
FOEBrowser.UnDrawLinks .............................18

VARIABLE INDEX

BlankButtonIcon ................21
FISAllowAttentionFlg ...........21
FISAllowBoxingFlg ..............21
FOEShade1 ......................21
PaletteArc .....................21
PaletteEllipse .................21

CLASS INDEX

FOEBrowser .....................1
FOEObject ......................2

PROPERTY INDEX

EDITOR .......... ...........1,21

File created: 25-Jun-88 20:00:40 {POGO:AISNORTH:XEROX}<LIPKIS>FIS>FEDITOR.;160 changes to: (VARS FEDITORCOMS)

previous date: 17-Jun-88 18:10:11 {POGO:AISNORTH:XEROX}<LIPKIS>FIS>FEDITOR.;159

Read Table: INTERLISP

Package: IL

Copyright (c) 1985, 1986, 1987, 1988 by Savoir, Inc. All rights reserved.

```
(RPAQQ FEDITORCOMS
       ((DECLARE%: DONTCOPY (PROP MAKEFILE-ENVIRONMENT FEDITOR))
        (CLASSES FOEBrowser FOEObject)
        (METHODS FOEBrowser.AddObject FOEBrowser.AdjustExtent FOEBrowser.AllowAttention
               FOEBrowser.AllowBoxing FOEBrowser.AllowEdit FOEBrowser.AllowEditMenus FOEBrowser.BoxHighLight
               FOEBrowser.Boxed? FOEBrowser.Browse FOEBrowser.CheckForMultipleBrowsers
               FOEBrowser.CleanupState FOEBrowser.Clear FOEBrowser.ClearAll FOEBrowser.ClearBoxHighLight
               FOEBrowser.ClearHighlights FOEBrowser.ClearMenuCache FOEBrowser.ClearSelections
               FOEBrowser.Close FOEBrowser.CollectObjects FOEBrowser.ComputeGridSize
               FOEBrowser.CreateSideWindow FOEBrowser.DeSelect FOEBrowser.Delete FOEBrowser.DeleteObject
               FOEBrowser.DeleteObject1 FOEBrowser.Destroy FOEBrowser.DestroySideWindow
               FOEBrowser.DrawAreaBox FOEBrowser.DrawConnection FOEBrowser.DrawLine
               FOEBrowser.DrawStraightLink FOEBrowser.DrawToStream FOEBrowser.EnableEdit
               FOEBrowser.FindNearestSubObject FOEBrowser.FindSelectedSubObject FOEBrowser.FindSpaceManually
               FOEBrowser.FlashAttentionPt FOEBrowser.GetMoveLinkSelection FOEBrowser.GetNewPosition
               FOEBrowser.GetPaletteItems FOEBrowser.GetSelection FOEBrowser.GetWithPrompt
               FOEBrowser.GridJustify FOEBrowser.HighLightable? FOEBrowser.Initialize FOEBrowser.Insert
               FOEBrowser.LabelObject FOEBrowser.LeftSelection FOEBrowser.LeftTitleSelection
               FOEBrowser.LinkObject FOEBrowser.LocateObject FOEBrowser.MakePaletteMenu
               FOEBrowser.MethodMenuSelection FOEBrowser.MiddleSelection FOEBrowser.MiddleTitleSelection
               FOEBrowser.MouseDeSelect FOEBrowser.MoveIt FOEBrowser.MoveLink FOEBrowser.MoveObject
               FOEBrowser.Repaint FOEBrowser.RepaintFn FOEBrowser.ScrollFn FOEBrowser.Select
               FOEBrowser.SelectAttentionPt FOEBrowser.Shape FOEBrowser.SpaceP FOEBrowser.UnDelete
               FOEBrowser.UnDrawLinks)
        (FNS CreateGrafFOE FID.DrawBoxFromLst FID.PaletteList FIDRepaintFn FOE.PokeProcess FOEBrowserSHRINKFN
             FOEComputeSlope FOECursorMovedFn FOECursorOutFn FOEFLASH.PROCESS FOEPaletteWhenSelectedFn
             MakeWithinRange)
        (VARS BlankButtonIcon PaletteArc PaletteEllipse)
        (INITVARS (FISAllowAttentionFlg)
               (FISAllowBoxingFlg)
               (FOEShade1 1024))
        (GLOBALVARS FISAllowAttentionFlg FISAllowBoxingFlg)
        (PROP FILETYPE FEDITOR)))

(DECLARE%: DONTCOPY

(PUTPROPS FEDITOR MAKEFILE-ENVIRONMENT (:PACKAGE "IL" :READTABLE "INTERLISP" :BASE 10))
)

(DEFCLASS FOEBrowser (MetaClass Class Edited%:                  (* mcl%. "10-Dec-86 10.44")
                                doc "This is the default metaClass for all classes")
       (Supers FIDBrowser)
       (ClassVariables (Scrollable T)
              (FlashInterval 500 doc "interval in msecs at which attention points are flashed")
              (EditMethodItems #.($A ((Add AddObject "Add an object from the palette") (Delete DeleteObject "D
elete an object from the display") (Move MoveObject "Move position of selected object" (SUBITEMS (Move% Object
 MoveObject "Move position of selected object") (Move% Link MoveLink "Adjust position of selected link flowlin
e"))) (Link LinkObject "Link two selected objects together") (Label LabelObject "Label an object in the displa
y")) UnionSuperValue NoUpdatePermitted))
              (HorizMethodItems
                     #.($A ((Edit EnableEdit "Toggle editing state")) UnionSuperValue NoUpdatePermitted))
              (HighLightBoxBorder 1 doc "width of border drawn around mouse sensitive objects")
              (BoxHLIncrement 2 doc "amount to increment region when object is highlighted")
              (BrowserNames ((T "Editor")))
              (MaxWidth #.($A (PROGN (IDIFFERENCE SCREENWIDTH 68)) EveryFetch NoUpdatePermitted) doc
                     "leave enough room for the action menus"))
       (InstanceVariables (gridSpec #.($A ComputeGridSize AVSendSelf ReplaceMe) doc "basic grid
                                organization")
              (scaleToGrid 1 doc "multiplier to convert from scale to grid size")
              (reShaped T doc "set when window is reshaped")
              (editState NIL doc "temporary flag to serve as toggle for editing functionality")
              (boxFlg NIL doc "Flag controlling the presence of box highlights")
              (boxHighLight NIL doc "current location of a cursor tracking box over selectable items")
              (selectionLst NIL doc "List of object (s) currently selected")
              (selectionOn NIL doc "Flag when selection is available")
              (selectionDepth NIL doc "allowable depth of :highLightLst, set by various editing commands. NIL
                     defaults to 1")
```

```
              (attentionPts NIL doc "Contains object (s) currently selected for attention")
              (currentAttention NIL doc "storage for temporary deactivation")
              (attentionOn NIL doc "Flag when attention is available")
              (flashProcess NIL doc "A process to handle sustained flashing of selected points and objects
                     within a window")
              (menuProcess NIL doc "Process running as a result of a menu selection")
              (contentObjectLst NIL doc "A list of objects and their regions that are currently displayed")
              (linkObjectLst NIL doc "hack for now to have someplace to put links which are handled
                     specially")
              (delObjectLst NIL doc "A list of objects that have been deleted from the content list")
              (paletteItem NIL doc "Item selected from the palette")
              (event NIL doc "an event used as synchronization for input processes")
              (eventActive NIL doc "flg containing event when someone is using it")
              (sideWindowLst NIL doc "List to store windows temporarily attached to the editor - excluding
                     the prompt window")
```

```
            (paletteMenu NIL doc "Place to store menu window while editing")
            (editMenu NIL doc "Place to store menu window while editing")
            (interfereFlg T doc "If off watch for interference when moving objects")
            (cornerPt NIL doc "I")
            (cornersLst NIL doc "hack list of corners to make selectable")
            (cornersOn NIL doc "hack to enable link movement via corners")))

(DEFCLASS FOEObject (MetaClass Class Edited%:                    (* mct " 2-Jul-85 16 28")
                         doc "This is the default metaClass for all classes")
       (Supers Object)
       (InstanceVariables (region #,($A (id region) GetIndirectThroughIV PutIndirectThroughIV) doc "The
                            region on the screen where the object is displayed")
            (id NIL doc "the object itself (may be supplanted by perspectives)")
            (center #,($A (id center) GetIndirectThroughIV PutIndirectThroughIV) doc "The center of the
                  object in screen coords. The object does all its computations from its center")
            (bitMap NIL doc "cache of object's bitmap")
            (subPartsLst NIL doc "Subparts of the object")))

(\BatchMethodDefs)

(Method ((FOEBrowser AddObject) self Object Item)          . mct 11-Jan-88 16.50
   "Insert an object in the browser"
   [LET (PaletteItem (object (AND (Object? Object)
                                  Object)))
     (OR (PROG1 object (_@ self %:paletteItem object))
         (_ self GetWithPrompt "Select item from objects menu"))
     (COND
        ((AND (@ self %:paletteItem)
              (SETQ object (_ (@ self %:paletteItem)
                              New))
              (_ object PermissibleP 'Add))
         (_ object Install (@ self %:object))
         (_ object Draw (@ self %:window))
         (_ self Insert object)
         (_ self AdjustExtent (@ object %:highlightRegion))])

(Method ((FOEBrowser AdjustExtent) self Region)          . mct: 18-Dec-85 13.47
   "Adjust display's Extent property"
   [LET ((extent (@ |:object:rawExtent|)))
     (COND
        ((NOT (SUBREGIONP extent Region))
         (WINDOWPROP (@ %:window)
                'EXTENT
                (EXTENDREGION extent Region])

(Method ((FOEBrowser AllowAttention) self AttnFlg)       . TAL 14-Oct-85 01 44
   "Turn attention on or off"
   (COND
      (AttnFlg (_@ self %:attentionPts (@ self %:currentAttention))
             (_@ self %:attentionOn T))
      (T (_@ self %:attentionOn NIL)
         (_@ self %:currentAttention (@ self %:attentionPts))
         (_@ self %:attentionPts NIL)))
   (FOE.PokeProcess (@ self %:flashProcess)))
```

Page 3

```
(Method ((FOEBrowser AllowBoxing) self Boxing)          . mct: 20-Nov-87 15:52
   "Turn Boxing on or off"
   [LET ((window (@ %:window)))
     (COND
        (Boxing                                             (* Turn it on)
              (WINDOWPROP window 'CURSORMOVEDFN 'FOECursorMovedFn)
              (WINDOWPROP window 'CURSOROUTFN 'FOECursorOutFn)
              (_@ self %:boxFlg T)
              (_ self ClearBoxHighLight))
        (T                                                  (* Turn it off)
           (WINDOWPROP window 'CURSOROUTFN NIL)
           (WINDOWPROP window 'CURSORMOVEDFN NIL)
           (_@ self %:boxFlg NIL)
           (_ self ClearBoxHighLight)])

(Method ((FOEBrowser AllowEdit) self EditFlg)           . mct: 24-Oct-86 13.41
   "Turn some editing aspects on or off"
   (_@ self |:context:editMode| EditFlg)                 . clue in the context
   (AND FISAllowBoxingFlg (_ self AllowBoxing EditFlg))
   (AND FISAllowAttentionFlg (_ self AllowAttention EditFlg))
   (_ self AllowEditMenus EditFlg)
   [COND
      (EditFlg (_ (@ context)
                  DidEdit)
            (WINDOWPROP (@ window)
                   'SCROLLEXTENTUSE
                   +-))
      (T (WINDOWPROP (@ window)
                'SCROLLEXTENTUSE
                LIMIT])
```

```
(Method ((FOEBrowser AllowEditMenus) self editFlg)  mct 10-Dec-86 12:40
  "New method template"
  [LET (ew pw)
    (COND
      [editFlg [COND
                 ((SETQ ew (@ %:editMenu))
                  (ATTACHWINDOW ew (@ %:window)
                         'RIGHT
                         'TOP))
                 (T (SETQ ew (_@ self %:editMenu (_ self CreateEditMethodMenu)))]
             (COND
               ((SETQ pw (@ %:paletteMenu))
                (ATTACHWINDOW pw ew 'BOTTOM 'LEFT))
               (T (_@ self %:paletteMenu (_ self MakePaletteMenu (@ %:object)))]
      (T (_ self CleanupState)
         (COND
           ((SETQ pw (@ %:paletteMenu))
            (DETACHWINDOW pw)
            (CLOSEW pw)))
         (COND
           ((SETQ ew (@ %:editMenu))
            (DETACHWINDOW ew)
            (CLOSEW ew])

(Method ((FOEBrowser BoxHighLight) self x y)  mct 5-Aug-85 00:58
  "Draw a box around any boxable item; erase any old boxes that the cursor has moved away from"
  [AND (@ self %:boxFlg)
       (LET* [BoxHighLight (window (@ self %:window))
                    (x (OR X (LASTMOUSEX window)))
                    (y (OR Y (LASTMOUSEY window]
         (SETQ BoxHighLight (@ self %:boxHighLight))
         (COND
           ((OR (NOT BoxHighLight)
                (COND
                  ((NOT (INSIDEP (@ BoxHighLight %:highlightRegion)
                                 x y))            (* Erase any previous box)
                   (_ self DrawAreaBox (@ BoxHighLight %:highlightRegion)
                          (@ BoxHighLight %:highlightOn?))
                   (_@ self %:boxHighLight NIL)
                   T)))
            (COND
              ((SETQ BoxHighLight (_ self HighLightable? x y))
                                 (* Get region of any boxable item we might be over)
               (_ self DrawAreaBox (@ BoxHighLight %:highlightRegion)
                      (@ BoxHighLight %:highlightOn?))
               (_@ self %:boxHighLight BoxHighLight)])
```

Page 4

```
(Method ((FOEBrowser Boxed?) self XorItem Y)  TAL 4-Jul-85 02:20
  "simple check to see if item is boxed determiner"
  [LET ((BHL (@ %:boxHighLight)))
    (AND BHL (COND
               ((AND Y XorItem)
                (INSIDEP (@ BHL %:region)
                       XorItem Y))
               ((REGIONP XorItem)
                (INSIDEP (@ BHL %:region)
                       (fetch (REGION LEFT) of XorItem)
                       (fetch (REGION BOTTOM) of XorItem)))
               ((Object? XorItem)
                (REGIONSINTERSECTP (@ XorItem %:region)
                       (@ BHL %:region)])

(Method ((FOEBrowser Browse) self context object)  mct 20-Nov-87 15:41
  "Specialization"
  (PROG (Window Region Extent PItems)
        (_@ object %:displayStream (SETQ Window (@ self %:window)))
        (_@ object %:displayEditor self)          (* tell the object who's editing it)
        (SETQ Extent (@ object %:rawExtent))
        (_ self PositionBrowser (fetch WIDTH of Extent)
               (fetch HEIGHT of Extent))
        (_ self Clear)
        (AND (@ context %:permitEdits)
             (@ context %:editMode)
             (_ self MakePaletteMenu object))       (* have the object display itself)
        (DSPRIGHTMARGIN 65000 Window)
        (PreSCROLLW Window (MINUS (fetch LEFT of Extent))
               (MINUS (fetch BOTTOM of Extent)))
        (_ object DrawAll Window)
        (for obj in (@ object %:subObjects) do (_ self Insert obj))
        (_Super )                                (* (_ self SetupScrollFn T))
        (WINDOWPROP Window 'EXTENT Extent)
        (WINDOWADDPROP Window 'SHRINKFN 'FOEBrowserSHRINKFN)
        (WINDOWPROP Window 'REPAINTFN 'FIDRepaintFn)
        (RETURN self)))

(Method ((FOEBrowser CheckForMultipleBrowsers) self object)
                                                   mct 10-Sep-86 12:01
  "Specialization"
  [LET (stream)
    (COND
```

```
((_Super self CheckForMultipleBrowsers object))
((AND (SETQ stream (@ object %:displayStream))
      (OPENP stream)
      (NOT (WINDOWP stream)))
 (_ self SWPromptPrint "Documentation in progress - please wait" T 1 SavoirPROMPTWINDOW)
 'Abort])

(Method ((FOEBrowser CleanupState) self)                    mcf 18-Dec-86 16.15
  "cleanup miscellaneous tasks"
  [COND
    ((@ self editState)
     (_@ self cornerPt NIL)
     (_@ self cornersLst NIL)
     (_@ self cornersOn NIL)
     (_@ self selectionOn NIL)
     (_@ self eventActive NIL)
     (PROG ((process (@ self menuProcess)))
           (_@ self attentionPts NIL)
           (_ self ClearSelections)
           (AND (@ boxFlg)
                (_ self ClearHighlights))
           (COND
             ((AND (PROCESSP process)
                   (NEQ process (THIS.PROCESS)))
              (DEL.PROCESS process)
              (BLOCK)
              (_@ self menuProcess NIL)))
           (REMOVEPROMPTWINDOW (@ window)])

(Method ((FOEBrowser Clear) self)                           mcf 9-Jul-85 21 18
  "Specialize loops window method to take highlighting of various sorts into account"
  (_ self ClearAll)
  _Super ))
```

Page 5

```
(Method ((FOEBrowser ClearAll) self)                        TAL 28-Jul-85 14:00
  "Clear off all random highlights"
  (_ self ClearBoxHighLight)
  (_ self ClearSelections)
  (_ self ClearHighlights))

(Method ((FOEBrowser ClearBoxHighLight) self)               mcf: 19-Jul-85 16:37
  "Clear any box highlight hanging around"
  [PROG ((HL (@ %:boxHighLight)))
        (COND
          (HL (_ self DrawAreaBox (@ HL %:highlightRegion)
                      (@ HL %:highlightOn?))
              (_@ self %:boxHighLight NIL)])

(Method ((FOEBrowser ClearHighlights) self)                 mcf: 1 Aug-85 12.29
  "clear highlights without regard to selection"
  (for obj in (@ self %:contentObjectLst) do (_ obj Highlight (@ self %:window)
                                                          'Off)
     when (@ obj %:highlightOn?)))

(Method ((FOEBrowser ClearMenuCache) self)                  TAL 4-Jul-85 02.21
  "subvert default menu mechanism for loops window"
  NIL)

(Method ((FOEBrowser ClearSelections) self)                 mcf: 24-Oct-86 16.24
  "clear out selection stack"
  [COND
    ((@ boxFlg)
     (_ self ClearBoxHighLight)
     (for obj in (@ self selectionLst) do (_ obj Highlight (@ self window)
                                                       'Off)
        finally (_@ self selectionLst NIL))
     (_ self BoxHighLight (LASTMOUSEX (@ self window))
              (LASTMOUSEY (@ self window)))])

(Method ((FOEBrowser Close) self)                           TAL 11-Aug-85 03.43
  "Specialization"
  [LET (process)
    (COND
      ((PROCESSP (SETQ process (@ self %:flashProcess)))
       (DEL.PROCESS process)))
    (COND
      ((AND (PROCESSP (SETQ process (@ self %:menuProcess)))
            (NEQ process (THIS.PROCESS)))
       (DEL.PROCESS process]
  (_Super self Close))

(Method ((FOEBrowser CollectObjects) self)                  mcf 28-Jul-86 09 14
  "Collect objects to act upon"
  (@ self !:object:subObjects!))
```

```
(Method ((FOEBrowser ComputeGridSize) self)                    mcf 14-Jan-86 17 43
  "Return the current grid size"
  (ITIMES (@ self %:scaleToGrid)
          (@ self !:object:progScale!)))

(Method ((FOEBrowser CreateSideWindow) self Shape Title Side Position)
                                                                TAL 4-Jul-85 02.21
  "create, and for now attach, a window on request"
  (PROG [Lwindow window wregion (Side (OR Side 'LEFT))
                 (Position (OR Position 'TOP]
        (SETQ wregion (WINDOWPROP (@ %:window)
                                  'REGION))
        (SETQ Lwindow (_ ($ Window)
                         New))
        (_@ Lwindow %:title Title)
        (COND
          ((REGIONP Shape)
           (_ Lwindow SetRegion Shape T))
          ((POSITIONP Shape)
           (_ Lwindow SetRegion (CREATEREGION (IDIFFERENCE (fetch (REGION LEFT) of wregion)
                                                           (PLUS (TIMES 2 WBorder)
                                                                 (fetch (POSITION XCOORD) of Shape)))
                                              (fetch (REGION BOTTOM) of wregion)
```

Page 6

```
                                              (fetch (POSITION XCOORD) of Shape)
                                              (fetch (POSITION YCOORD) of Shape))
                T)))
        (_ Lwindow Open)
        (ATTACHWINDOW (SETQ window (@ Lwindow %:window))
                (@ %:window)
                Side Position)
        (SETQ wregion (WINDOWPROP window 'REGION))       (* update the loops knowledge of where the window is)
        (_@ Lwindow %:left (fetch (REGION LEFT) of wregion))
        (_@ Lwindow %:bottom (fetch (REGION BOTTOM) of wregion))
        (push (@ %:sideWindowLst)
              Lwindow)
        (RETURN window)))

(Method ((FOEBrowser DeSelect) self HLObject)                  mcf: 24-Oct-86 14:27
  "deselects an item from the selection stack"
  [AND (@ %:boxFlg)
       (LET ((window (@ %:window))
             (HL HLObject)
             BoxedFlg)
         [OR (AND HL (_ HL InstOf! 'FIDObject))
             (SETQ HL (_ self LocateObject (CONS (LASTMOUSEX window)
                                                 (LASTMOUSEY window))
                         'Inside
                         'selectionLst)]
         (COND
           (HL (COND
                 ((SETQ BoxedFlg (_ self Boxed? HL))
                  (_ self ClearBoxHighLight)))
               (_ HL Highlight window 'Off)
               (change (@ %:selectionLst)
                       (DREMOVE HL DATUM))
               [COND
                 ((AND (SETQ HL (CAR (@ %:selectionLst)))
                       (NEQ (@ HL %:highlightMode)
                            'INVERT))
                  (_ HL Highlight window 'Off)
                  (_ HL Highlight window 'Invert)]
               (COND
                 (BoxedFlg (_ self BoxHighLight (LASTMOUSEX window)
                                  (LASTMOUSEY window))])

(Method ((FOEBrowser Delete) self Item)                        mcf 27-Oct-87 11 38
  "Delete an Item from the editor, and remove its image from the display"
  (PROG ((window (@ self %:window))
         (object Item))
        (COND
          ([OR object (SETQ object (CAR (@ self %:selectionLst)]
           (AND (_ self Boxed? object)
                (_ self ClearBoxHighLight))
           (AND (@ %:boxFlg)
                (_ object Highlight window 'Off))
           (COND
             ((FMEMB object (@ self %:contentObjectLst))
              (change (@ self %:contentObjectLst)
                      (REMOVE object DATUM))
              (_ object Erase window)))
           object))))

(Method ((FOEBrowser DeleteObject) self Object Item)
                                                               mcf 11-Jan-88 16 00
  "New method template"
  [LET [(obj (OR (ObjectExists? Object)
                 (_ self GetSelection "Select Object to Delete")]
```

```
(COND
   ((AND (SETQ obj (_ self LocateObject obj 'ID))
         (_ obj PermissibleP 'Delete))
    (COND
       ((MOUSECONFIRM (CONCAT "Delete " (_ obj GetDescription)
                              "?")
                NIL SavoirPROMPTWINDOW)
        (_ self DeleteObject1 obj)
        obj])
```

Page 7

```
(Method ((FOEBrowser DeleteObject1) self Object)        mct  6-Oct-87 11:55
  "New method template"
  (_ self DeSelect Object)
  (_ self Delete Object)
  (_ Object DeLink 'Both (@ self %:window)
          (@ self |:object:progScale|))
  (_ Object Delete (@ self %:object)))


(Method ((FOEBrowser Destroy) self)        mct  9-Sep-86 16:22
  "Specialization: Added window properties confuse it as the object seems to get destroyed before the window
is closed"
  [LET (Process (WN (@ window)))
    (WINDOWPROP WN 'CURSORMOVEDFN NIL)
    (WINDOWPROP WN 'CURSOROUTFN NIL)
    (COND
       ((PROCESSP (SETQ Process (@ self flashProcess)))
        (DEL.PROCESS Process)))
    (COND
       ((AND (SETQ Process (@ self menuProcess))
             (@ eventActive))
        (_@ self selectionLst NIL)
        (NOTIFY.EVENT (@ event))                   ; cancel event, and block to let it be processed
        (BLOCK 10)))
    (_ self CleanupState)
    (_Super self Destroy)
    (COND
       ((PROCESSP Process)
        (DEL.PROCESS Process])


(Method ((FOEBrowser DestroySideWindow) self Window)
                                                   mct  7 Jul 85 19:00
  "Destroys a subsidiary window"
  [PROG [(Window (COND
                    ((WINDOWP Window)
                     (for lwin in (@ %:sideWindowLst) thereis (EQ (@ lwin %:window)
                                                                  Window)))
                    (Window]
        (COND
           ((AND (Object? Window)
                 (_ Window InstOf! 'Window))
            (DETACHWINDOW (@ Window %:window))
            (change (@ %:sideWindowLst)
                    (DREMOVE Window DATUM))
            (_ Window Destroy)])


(Method ((FOEBrowser DrawAreaBox) self Region HighLighted)
                                                   TAL  4-Jul-85 02:22
                                   Draw a box around a region FOEHighLightBoxBorder bits wide
  "When the region surrounds a highlighted object, stretch the region a little bit"
  (PROG ((region Region))
        [AND HighLighted (SETQ region (GROW/REGION region (@ |::BoxHLIncrement|))]
        (DRAWAREABOX (fetch (REGION LEFT) of region)
               (fetch (REGION BOTTOM) of region)
               (fetch (REGION WIDTH) of region)
               (fetch (REGION HEIGHT) of region)
               (@ |::HighLightBoxBorder|)
               'INVERT
               (@ %:window))))


(Method ((FOEBrowser DrawConnection) self spoint dpoint)
                                                   TAL  4-Jul-85 02:22
  "Draw appropriate connector"
  (_ self DrawLine spoint dpoint))


(Method ((FOEBrowser DrawLine) self spoint dpoint)        mct  7-Jul-85 19:04
  "Draw a straight line on the diplay between two points"
  (DRAWLINE (fetch (POSITION XCOORD) of spoint)
         (fetch (POSITION YCOORD) of spoint)
         (fetch (POSITION XCOORD) of dpoint)
         (fetch (POSITION YCOORD) of dpoint)
         (@ |::LinkWidth|)
         'REPLACE
         (@ self %:window)))
```

```
(Method ((FOEBrowser DrawStraightLink) self SPos OPos)
                                                            mcf 7-Jul-85 19.04
   "Draw a direct link between two nodes"
   (DRAWLINE (CAR SPos)
          (CADR SPos)
          (CAR OPos)
          (CADR OPos)
          (@ |::LinkWidth|)
          'REPLACE
          (@ %:window)))

(Method ((FOEBrowser DrawToStream) self stream)             mcf: 13-Sep-85 15.24
   "simple for now"
   (_ (@ self %:object)
      DrawAll stream))

(Method ((FOEBrowser EnableEdit) self)                      TAL 5-Jul-86 23.48
   "Toggle editing state"
   (LET [(FlipState (NOT (@ self editState)]
     (REMOVEPROMPTWINDOW (@ window))
     (_ self AllowEdit FlipState)
     (_@ self editState FlipState)
     (_@ self title (_ self ConstructTitle NIL (CADR (FASSOC FlipState (@ self |::BrowserNames|)))))
     (_ self Update)))

(Method ((FOEBrowser FindNearestSubObject) self subObjectRegions pos)
                                                            mcf 7-Jul-85 19.07
   "Specialization"
   (OR (_ self LocateObject pos 'Inside 'linkObjectLst)
       (_ self LocateObject pos 'Inside)))

(Method ((FOEBrowser FindSelectedSubObject) self window subObjectRegions)
                                                            mcf 21-Oct-86 10.36
   "New method template"
  .[PROG ((DS (WINDOWPROP window 'DSP))
          BUTTON OLDPOS NOW NEAR)
         (until (LASTMOUSESTATE (OR LEFT MIDDLE)) do (GETMOUSESTATE))
         [SETQ NEAR (_ self FindNearestSubObject subObjectRegions (SETQ OLDPOS (CURSORPOSITION NIL DS)))]
    FLIP
         (AND NOW (FLIPREGION DS (@ NOW %:highlightRegion)))
         (AND NEAR (FLIPREGION DS (@ NEAR %:highlightRegion)))
         (SETQ NOW NEAR)
    LP                                                      (* wait for a button up or move out of region)
         (GETMOUSESTATE)
         (COND
            ((NOT (LASTMOUSESTATE (OR LEFT MIDDLE)))        (* button up, process it)
             [COND
                (NOW (FLIPREGION DS (@ NOW %:highlightRegion)]
                                                            (* NOW node has been selected)
             (RETURN NOW))
            ((AND NIL (NOT (INSIDE? (WINDOWPROP window REGION)
                                LASTMOUSEX LASTMOUSEY)))    (* Try it without this)
                                                            (* outside of region, return)
             (AND NOW (FLIPREGION DS (@ NOW %:highlightRegion)))
             (RETURN))
            ([EQ NOW (SETQ NEAR (_ self FindNearestSubObject subObjectRegions (CURSORPOSITION NIL DS OLDPOS))
                 ]
             (GO LP))
            (T (GO FLIP])

(Method ((FOEBrowser FindSpaceManually) self obj region)
                                                            TAL 2-Aug-85 14 02
   "prompt the user manually to find a space for a given region"
   (bind newregion wregion wborder cregion (window _ (@ self %:window)) first (SETQ wregion
                                                                                 (WINDOWPROP window
                                                                                    'REGION))
                                                                              (SETQ wborder
                                                                                 (WINDOWPROP window
                                                                                    'BORDER))
                                                                              (SETQ cregion (
                                                                                    DSPCLIPPINGREGION
                                                                                    NIL window))
      do (SETQ newregion (SETQ region (GETBOXREGION (fetch (REGION WIDTH) of region)
                                  (fetch (REGION HEIGHT) of region)
                                  (IDIFFERENCE (IPLUS (fetch (REGION LEFT) of region)
                                                      (fetch (REGION LEFT) of wregion)
                                                      wborder)
```

```
                                               (fetch LEFT of cregion))
                                  (IDIFFERENCE (IPLUS (fetch (REGION BOTTOM) of region)
                                                      (fetch (REGION BOTTOM) of wregion)
                                                      wborder)
                                               (fetch BOTTOM of cregion))
                                  window)))
      repeatuntil (_ self SpaceP obj newregion) finally (RETURN newregion)))
```

```
(Method ((FOEBrowser FlashAttentionPt) self It Mode)
                                                    mcf: 9-Jul-85 20.59
  "Flash the selected thing (object or region) in the window"
  [LET ((Process (@ self %:flashProcess)))
    (COND
      ((OR (NOT Process)
           (COND
             ((NOT (PROCESSP Process))
              (DEL.PROCESS Process)
              T)))
       (SETQ Process (ADD.PROCESS '(FOEFLASH.PROCESS ,(@ self %:window)
                                                      ,self)
                                  'RESTARTABLE
                                  'HARDRESET))
       (_@ self %:flashProcess Process))
      ((PROCESSP Process))
      ((RELPROCESSP Process)
       (RESTART.PROCESS Process])

(Method ((FOEBrowser GetMoveLinkSelection) self lst window)
                                                    mcf: 13-Aug-86 14 39
  "New method template"
  (RESETLST
    (RESETSAVE (FID.DrawBoxFromLst lst window 'PAINT)
               (LIST 'FID.DrawBoxFromLst lst window 'ERASE))
    (_ self GetSelection "Select and Move Link Corner")))

(Method ((FOEBrowser GetNewPosition) self Item LimitReg)
                                                    mcf: 5-Dec-86 13.44
  "Find a new home for this object"
  (DECLARE (GLOBALVARS WAITINGCURSOR SMALLCROSSHAIRS))
  [LET (iL iB iW iH adjW adjH image aux cent gridSpec newBot newLeft (limitReg LimitReg)
        (grid (@ %:gridSpec))
        (itemReg (@ Item %:region))
        (w (@ %:window))
        (oldPos (create POSITION))
        iRegion
        (regions (for obj in (@ %:contentObjectLst) when (NEQ obj Item) collect (@ obj %:region)))
        (interfere (@ %:interfereFlg)))
    (RESETLST
      (RESETSAVE (CURSOR WAITINGCURSOR))
      (RESETSAVE (_@ Item |:superObject:quietFlg| T)
                 (LIST 'PutValue (GetValue Item 'superObject)
                       'quietFlg
                       (@ Item |:superObject:quietFlg|)))
      (OR limitReg (SETQ limitReg (DSPCLIPPINGREGION NIL w)))
      (SETQ gridSpec (create REGION
                             LEFT _ 0
                             BOTTOM _ 0
                             WIDTH _ grid
                             HEIGHT _ grid))
      (SETQ iL (fetch LEFT of itemReg))
      (SETQ iB (fetch BOTTOM of itemReg))
      (SETQ iW (fetch WIDTH of itemReg))
      (SETQ iH (fetch HEIGHT of itemReg))
      (SETQ iRegion (create REGION
                            WIDTH _ (IDIFFERENCE (fetch WIDTH of itemReg)
                                                 2)
                            HEIGHT _ (IDIFFERENCE (fetch HEIGHT of itemReg)
                                                  2)))
      [COND
        ((EVENP (IQUOTIENT iW grid))
         (SETQ adjW 0))
        (T (SETQ adjW (LRSH iW 1]                    adjust for centered objects
      [COND
        ((EVENP (IQUOTIENT iH grid))
         (SETQ adjH 0))
        (T (SETQ adjH (LRSH iH 1]
      (SETQ image (DSPCREATE (BITMAPCREATE iW iH)))
      (SETQ cent (FID.ComputeCenter (LIST 0 0 iW iH)))
      (_ Item Draw image (create FIDXform
```

Page 10

```
                                 XTranslation _ (fetch XCOORD of cent)
                                 YTranslation _ (fetch YCOORD of cent)
                                 Scale _ grid))
      (SETQ aux (BITMAPCREATE iW iH))                    get shadow image.
      (BITBLT w iL iB aux 0 0 iW iH 'INPUT 'REPLACE)     return as image only
      (BITBLT image 0 0 w iL iB iW iH 'INPUT 'PAINT)
      (CURSORPOSITION (create POSITION
                              XCOORD _ iL
                              YCOORD _ iB)
                 w oldPos)
      (CURSOR SMALLCROSSHAIRS)
      [bind flg gridX gridY (hgrid _ (LRSH grid 1))
            (lastGridX _ (MYGRIDXCOORD iL gridSpec))
            (lastGridY _ (MYGRIDYCOORD iB gridSpec)) eachtime (GETMOUSESTATE)
         until (AND flg (LASTMOUSESTATE UP))
         do [(SETQ flg (LASTMOUSESTATE LEFT))
             (SETQ oldPos (CURSORPOSITION NIL w oldPos))
             (SETQ gridX (MYGRIDXCOORD (MakeWithinRange (fetch XCOORD of oldPos)
                                                        (fetch LEFT of limitReg)
```

```
                                        (DIFFERENCE (fetch PRIGHT of limitReg)
                                                iW))
                              gridSpec))
        (SETQ gridY (MYGRIDYCOORD (MakeWithinRange (fetch YCOORD of oldPos)
                                        (fetch BOTTOM of limitReg)
                                        (DIFFERENCE (fetch PTOP of limitReg)
                                                iH))
                              gridSpec))
        (COND
           ((OR (NEQ gridX lastGridX)
                (NEQ gridY lastGridY))
            (SETQ newLeft (IPLUS adjW (LEFTOFGRIDCOORD gridX gridSpec)))
            (SETQ newBot (IPLUS adjH (BOTTOMOFGRIDCOORD gridY gridSpec)))
            (replace LEFT of iRegion with (ADD1 newLeft))
            (replace BOTTOM of iRegion with (ADD1 newBot))
            (COND
               ((OR interfere (for r in regions never (REGIONSINTERSECTP r iRegion)))
                (BITBLT aux 0 0 w (IPLUS (LEFTOFGRIDCOORD lastGridX gridSpec)
                                         adjW)
                        (IPLUS (BOTTOMOFGRIDCOORD lastGridY gridSpec)
                               adjH)
                        iW iH 'INPUT 'REPLACE)
                (BITBLT w newLeft newBot aux 0 0 iW iH 'INPUT 'REPLACE)
                (BITBLT image 0 0 w newLeft newBot iW iH 'INPUT 'PAINT)
                (SETQ lastGridX gridX)
                (SETQ lastGridY gridY]
    finally (BITBLT aux 0 0 w (IPLUS (LEFTOFGRIDCOORD lastGridX gridSpec)
                                     adjW)
                    (IPLUS (BOTTOMOFGRIDCOORD lastGridY gridSpec)
                           adjH)
                    iW iH 'INPUT 'REPLACE)
         (COND
            ([ZEROP (SETQ adjW (TIMES grid (LRSH (IQUOTIENT iW grid)
                                                  1]
             (SETQ adjW grid))
            (T adjW))
         (COND
            ([ZEROP (SETQ adjH (TIMES grid (LRSH (IQUOTIENT iH grid)
                                                  1]
             (SETQ adjH grid))
            (T adjH))
         (RETURN (create POSITION
                         XCOORD _ (IPLUS adjW (LEFTOFGRIDCOORD lastGridX gridSpec))
                         YCOORD _ (IPLUS adjH (BOTTOMOFGRIDCOORD lastGridY gridSpec])])
```

```
(Method ((FOEBrowser GetPaletteItems) self fid)        mct 6-Aug-85 22.34
   "get items for palette"
   (for subobj in (@ fid |::PaletteFIDObjects|) collect (FID.PaletteList subobj)))
```

```
(Method ((FOEBrowser GetSelection) self Msg PersistFlg)
                                                       mct 17 Dec 85 16 27
   "Print a request and set up for selection"
   (_ self GetWithPrompt Msg PersistFlg))
```

Page 11

```
(Method ((FOEBrowser GetWithPrompt) self Msg DontClosePromptFlg)
                                                       mct: 6-Oct-87 10:09
   "print a message and wait around for a selection"
   (PROG (pWindow item)

... (RESETLST (COND (Msg (RESETSAVE (SETQ pWindow (GETPROMPTWINDOW (@ window))) '(PROGN (OR DontClosePromptFlg (CLOSEW OLDVALUE))))) (CLEARW
;;; pWindow) (PRIN1 Msg pWindow))) (_@ selectionLst NotSetValue) (_@ self eventActive (@ event)) (AWAIT EVENT (@ event)) (SETQ item (CAR (@ selectionLst))) (_@
;;; self eventActive NIL))

         (RESETLST
             [COND
                (Msg (RESETSAVE (_ self SWPromptPrint Msg)
                                (LIST [FUNCTION (LAMBDA (S)
                                                  (_ S SWPromptPrint "" NIL NIL NIL T)]
                                      self]
             (_@ selectionLst NotSetValue)
             (_@ self eventActive (@ event))
             (AWAIT.EVENT (@ event))
             (SETQ item (CAR (@ selectionLst)))
             (_@ self eventActive NIL))
         (RETURN item)))
```

```
(Method ((FOEBrowser GridJustify) self X Y oregion direction)
                                                       mct: 20-Jan-86 14 32
   "Makes a region around X Y based on the editor's gridSpec"
   (LET (newX newY h halfgrid (w (@ self |:object:progScale|))
            (grid (@ self %:gridSpec)))
     (SETQ h w)
     (SETQ halfgrid (LRSH grid 1))
     [SETQ newX (IPLUS X (COND
                          ((MINUSP X)
                           (IMINUS halfgrid))
                          (halfgrid]
```

```
[SETQ newY (IPLUS Y (COND
                      (direction (SELECTQ direction
                                           (Bottom (IMINUS grid))
                                           (Top (SUB1 grid))
                                           0))
                      ((MINUSP Y)
                       (IMINUS halfgrid))
                      (halfgrid]
(COND
   (oregion (create REGION
                    LEFT _ (IDIFFERENCE (ITIMES (IQUOTIENT newX grid)
                                                 grid)
                                         (LRSH w 1))
                    BOTTOM _ (IDIFFERENCE (ITIMES (IQUOTIENT newY grid)
                                                   grid)
                                           (LRSH h 1))
                    WIDTH _ (ADD1 w)
                    HEIGHT _ (ADD1 h) smashing oregion))
   (T (create REGION
              LEFT _ (IDIFFERENCE (ITIMES (IQUOTIENT newX grid)
                                           grid)
                                   (LRSH w 1))
              BOTTOM _ (IDIFFERENCE (ITIMES (IQUOTIENT newY grid)
                                             grid)
                                     (LRSH h 1))
              WIDTH _ (ADD1 w)
              HEIGHT _ (ADD1 h])
```

```
(Method ((FOEBrowser HighLightable?) self X Y)          . mcf: 9-Jul-85 22.32
  "given x and y see if there is something there to highlight"
  (OR (_ self LocateObject (CONS X Y)
            'Inside)))
```

```
(Method ((FOEBrowser Initialize) self context object)    . mcf. 10-Sep-86 12.01
  "Specialization"
• (_@ self %:event (CREATE.EVENT 'Editor.Event))
  (_Super self Initialize context object))
```

```
(Method ((FOEBrowser Insert) self Object)                 mcf: 29-Jul-85 23 26
  "Insert an existing node into the display"
  (push (@ %:contentObjectLst)
        Object))
```

Page 12

```
(Method ((FOEBrowser LabelObject) self Object Item)  . mcf 12-Jan-88 11.40
  "set the label on an object"
  (DECLARE (GLOBALVARS WAITINGCURSOR))
  [LET (nobj obj label msg str1 str2 xlations)
    (SELECTQ (CAR Item)
         (Rename (SETQ str1 "Select Object to Rename")
                 (SETQ str2 "Enter New Name: "))
         (PROGN (SETQ str1 "Select Object to Label")
                (SETQ str2 "Enter Label: ")))
    (COND
      ((AND (SETQ obj (OR (ObjectExists? Object)
                          (_ self GetSelection str1 T)))
            (_ obj PermissibleP 'Label))
       (SETQ label (_ self SWPromptForString str2 (@ obj %:label)))
       (_ self DeSelect obj)
       [RESETFORM (CURSOR WAITINGCURSOR)
              (COND
                 [(EQ (MKATOM label)
                      (MKATOM (@ obj %:label))]
                 [(AND (NOT (MKATOM label))
                       (_ obj HasContents?))
                  (SETQ msg (CONCAT "Can't clear label of non-empty " (_ obj GetDescription)]
                 [(SETQ msg (_ obj SetLabel label (@ %:window))]
                 (T                              . (for x in (@ object.steps) do (  x CacheFlush))
                   (_ obj ObjectChanged)]
       (AND msg (_ self SWPromptPrint msg NIL T NIL 2000)])
```

```
(Method ((FOEBrowser LeftSelection) self Window)        mcf 24-Oct-86 13 43
  "Select a displayed object using the mouse"
  [PROG [cornerPt obj (Window (OR Window (@ self %:window)]
        (COND
          [(@ self %:cornersOn)
           (AND (SETQ cornerPt (for x bind (pt _ (CONS (LASTMOUSEX Window)
                                                       (LASTMOUSEY Window)))
                                    in (@ self %:cornersLst) thereis (INSIDEP (CAR x)
                                                                             pt)))
                (_@ %:cornerPt cornerPt)
                (AND (@ %:eventActive)
                     (NOTIFY.EVENT (@ %:eventActive)]
          ((@ self %:selectionOn)
           (_ self Select (_ self HighLightable? (LASTMOUSEX Window)
                                                 (LASTMOUSEY Window))
                 window)                                   (* Is selection processing available?)
           )
```

```
([AND (SHIFTDOWNP 'SHIFT)
      (@ self %:editState)
      (SETQ obj (_ self HighLightable? (LASTMOUSEX Window)
                               (LASTMOUSEY Window))]
 (_ self MoveObject obj))
((@ self %:attentionOn)
 (_ self SelectAttentionPt Window))
(T (_Super )])
```

```
(Method ((FOEBrowser LeftTitleSelection) self)          mct 12-Aug-86 09.43
  "cleanup miscellaneous tasks"
  (_ self CleanupState))
```

```
(Method ((FOEBrowser LinkObject) self Object Item)      mct 11-Jan-86 16.06
  "link two nodes together"
  [PROG (source destination label link)
      (COND
        ((AND (AND (SETQ source (_ self GetSelection "Select Source Node"))
                   (_ source PermissibleP 'Link))
              (AND (SETQ destination (_ self GetSelection "Select Destination Node"))
                   (_ destination PermissibleP 'Link))
              (SETQ link (_ source Linkable? NIL destination NIL))
              (SETQ label (_ self SWPromptForString "Enter Label: ")))
         (_ self DeSelect destination)
         (_ link SetLabel label)
         (_ link Install (@ self %:object))
         (_ link Draw (@ self %:window))
         (_ self Insert link)])
```

```
(Method ((FOEBrowser LocateObject) self item key lst)
                                                 , mct: 7 Aug-85 00.55
                                                 , Try and locate object in the editor
  "item may be an object, region or center (?) , and key, if present tells the method how to look throught
  the objects in the editor. Lst (optional) is the IV name of the list to look at."
  [PROG ((Key key)
         (Lst lst))
      [OR Key (SETQ Key (OR (AND (Object? item)
                                 'ID)
                            (AND (REGIONP item)
                                 'Region)
                            (AND (POSITIONP item)
                                 'Center]
      (OR Lst (SETQ Lst 'contentObjectLst))
      (RETURN (for obj in (@ %:!\Lst) thereis (SELECTQ Key
                                                 ((ID id)
                                                  (EQ obj item))
                                                 ((Region region)
                                                  (EQUAL (@ obj %:region)
                                                         item))
                                                 ((Center center)
                                                  (EQUAL (@ obj %:center)
                                                         item))
                                                 ((Intersect intersect)
                                                  (REGIONSINTERSECTP (@ obj %:region)
                                                         item))
                                                 ((Inside inside)
                                                  (INSIDEP (@ obj %:region)
                                                         item))
                                                 NIL])
```

```
(Method ((FOEBrowser MakePaletteMenu) self object menu)
                                                 , mct. 9-Dec-86 14 56
  "New method template"
  [LET (pItems)
    (COND
      ((SETQ pItems (_ self GetPaletteItems object))
       (ATTACHMENU (create MENU
                           ITEMS _ pItems
                           WHENSELECTEDFN _ 'FOEPaletteWhenSelectedFn
                           CENTERFLG _ T
                           MENUCOLUMNS _ 1
                           TITLE _ "Objects")
              (@ %:editMenu)
              'BOTTOM
              'LEFT])
```

```
(Method ((FOEBrowser MethodMenuSelection) self Item Button SubObject Menu)
                                                 mct 15 Oct 87 08.29
  "Specialization"
  [LET (itemName (process (@ self %:menuProcess)))
    (SETQ itemName (COND
                     ((LISTP Item)
                      (CAR Item))
                     (T Item)))

    (* * This kludge protects against the browser becoming a destroyed object when the menu method is sent)
```

```
(COND
   ((OR (EQ 'Abort itemName)
        (EQ 'Exit itemName))
    (_Super self MethodMenuSelection Item Button SubObject))
   (T (COND
        ((AND (PROCESSP process)
              (NEQ process (THIS.PROCESS)))               (* If the last MethodMenu action is still running, kill it)
         (DEL.PROCESS process)
         (BLOCK)                                            (* allow the deleted process time to unwind)
         ))
      (ALLOW.BUTTON.EVENTS)

      (* * If we were invoked by the mouse, make a new mouse process while the method is running)

      (RESETLST
          (RESETSAVE (_@ self %:selectionOn T)
                (LIST [FUNCTION (LAMBDA (self sel)
                                   (OR (DestroyedObject? self)
                                       (_@ self %:selectionOn sel)]
                      self
                      (@ self %:selectionOn)))
          (RESETSAVE NIL (LIST [FUNCTION (LAMBDA (self)
```

```
                                   (OR (DestroyedObject? self)
                                       (_ self ClearSelections)]
                          self))
          [COND
             ((NEQ (CAR Item)
                   'Edit)
              (RESETSAVE (_ self AllowAttention)
                    (LIST [FUNCTION (LAMBDA (self sel)
                                       (OR (DestroyedObject? self)
                                           (_ self AllowAttention sel)]
                          self
                          (@ self %:attentionOn)]
          (_@ self %:menuProcess (THIS.PROCESS))            (* Remember who's running a menu action)
          (_Super self MethodMenuSelection Item Button SubObject)
          (_@ self %:menuProcess NIL))])
```

(Method ((FOEBrowser MiddleSelection) self)    mct: 17-Oct-86 09:18

```
  "Specialization"
  (COND
     ((@ self %:selectionOn)
      (_ self LeftSelection))
     (T (_ self ClearBoxHighLight)
        (_Super self MiddleSelection))))
```

(Method ((FOEBrowser MiddleTitleSelection) self)    mct: 17-Oct-86 09.24

```
  "Specialization"
  (COND
     ((@ self %:selectionOn)
      (_ self LeftTitleSelection))
     (T (_ self ClearBoxHighLight)
        (_Super self MiddleTitleSelection))))
```

(Method ((FOEBrowser MouseDeSelect) self Window)    mct 7-Jul-85 19:28

```
  "DeSelect a selected item via the mouse"
  [PROG [(window (OR Window (@ self %:window)]
        (_ self DeSelect (_ self LocateObject (CONS (LASTMOUSEX window)
                                                    (LASTMOUSEY window))
                                 'Inside
                                 'selectionLst))])
```

(Method ((FOEBrowser MoveIt) self item)    mct: 24-Jul-86 10:52

```
  "move a displayed object. For the moment choose the most recently selected item"
  [PROG [[Item (OR item (CAR (@ %:selectionLst)]
         itemBM oldregion newregion (wregion (WINDOWPROP (@ %:window)
                                                        'REGION]
        (COND
           (Item (SETQ oldregion (@ Item %:region))
                 (_ self Delete Item)
                 (SETQ newregion (_ self GetNewPosition Item))
                 (_ Item ClearRegions)
                 (_@ Item %:center newregion)          (* ((SETQ newregion (_ self FindSpaceManually Item oldregion))
                                                          (_@ Item %:region newregion) (_@ Item %:center
                                                          (FID ComputeCenter newregion))))

                 (_ Item Moved)
                 (_ self UnDelete Item)
                 (_ self Repaint)])
```

(Method ((FOEBrowser MoveLink) self Object Item)    mct 11-Jan-88 16.51

```
  "New method template"
  [LET (links pointlst Object region point link first last pts (scale (@ self |:object:progScale|)))
    (SETQ links (for subObj in (_ self CollectObjects)
                   join (for link in (@ subObj %:linkType)
                           when [AND (_ link InstOf! ($ GrafcetAsynchronousLink))
                                     (CDDR (CAR (@ link %:drawPoints)]
                           collect link)))
```

```
(RESETLST
    (RESETSAVE (_@ self %:cornersLst
                    (INTERSECTION (SETQ pointlst
                                   (for ln pt in links
                                      collect (LIST (PROG2 (SETQ pt (CADAR (@ ln %:drawPoints)))
                                                          (create REGION
                                                                  LEFT _
                                                                  (IDIFFERENCE (fetch XCOORD
                                                                                      of pt)
                                                                         (LRSH scale 1))
                                                                  BOTTOM _
                                                                  (IDIFFERENCE (fetch YCOORD
```

```
                                                                                      of pt)
                                                                         (LRSH scale 1))
                                                                  WIDTH _ (ADD1 scale)
                                                                  HEIGHT _ (ADD1 scale)))
                                                    ln)))
                           pointlst))
        (LIST 'PutValue self 'cornersLst NIL))
(RESETSAVE (_@ self %:cornersOn T)
        (LIST 'PutValue self 'cornersOn NIL))
(_ self GetMoveLinkSelection pointlst (@ %:window))
[COND
   ([AND (SETQ Object (@ self %:cornerPt))
         (SETQ region (_ self FindSpaceManually (SETQ link (CADR Object))
                                  (CAR Object))]
    (SETQ point (FID.ComputeCenter region))
    [SETQ point (FID.ComputeCenter (_ self GridJustify (fetch XCOORD of point)
                                           (fetch YCOORD of point))]
    (SETQ first (CAAR (@ link %:drawPoints)))
    [SETQ last (CAR (LAST (CAR (@ link %:drawPoints)]
    (push pts first)
    [COND
       ((AND (NEQ (fetch XCOORD of first)
                  (fetch XCOORD of point))
             (NEQ (fetch YCOORD of first)
                  (fetch YCOORD of point)))
        (COND
           [(IGREATERP (fetch YCOORD of first)
                  (fetch YCOORD of last))
            (COND
               [(IGREATERP (fetch YCOORD of point)
                      (fetch YCOORD of first))
                (push pts (create POSITION
                                  XCOORD _ (fetch XCOORD of first)
                                  YCOORD _ (fetch YCOORD of point]
               (T (push pts (create POSITION
                                    XCOORD _ (fetch XCOORD of point)
                                    YCOORD _ (fetch YCOORD of first]
           (T (COND
                 [(IGREATERP (fetch YCOORD of point)
                        (fetch YCOORD of first))
                  (push pts (create POSITION
                                    XCOORD _ (fetch XCOORD of point)
                                    YCOORD _ (fetch YCOORD of first]
                 (T (push pts (create POSITION
                                      XCOORD _ (fetch XCOORD of first)
                                      YCOORD _ (fetch YCOORD of point]
    (push pts point)
    [COND
       ((AND (NEQ (fetch XCOORD of last)
                  (fetch XCOORD of point))
             (NEQ (fetch YCOORD of last)
                  (fetch YCOORD of point)))
        (COND
           [(IGREATERP (fetch YCOORD of first)
                  (fetch YCOORD of last))
            (COND
               [(IGREATERP (fetch YCOORD of point)
                      (fetch YCOORD of last))
                (push pts (create POSITION
                                  XCOORD _ (fetch XCOORD of point)
                                  YCOORD _ (fetch YCOORD of last]
               (T (push pts (create POSITION
                                    XCOORD _ (fetch XCOORD of last)
                                    YCOORD _ (fetch YCOORD of point]
           (T (COND
                 [(IGREATERP (fetch YCOORD of point)
                        (fetch YCOORD of last))
                  (push pts (create POSITION
                                    XCOORD _ (fetch XCOORD of last)
                                    YCOORD _ (fetch YCOORD of point]
                 (T (push pts (create POSITION
                                      XCOORD _ (fetch XCOORD of point)
                                      YCOORD _ (fetch YCOORD of last]
    (push pts last)
    (_ link DrawLink (@ %:window)
           NIL
           'ERASE)
    (_@ link %:drawPoints (LIST (DREVERSE pts)))
    (_ link DrawLink (@ %:window))])])
```

```
(Method ((FOEBrowser MoveObject) self Object Item)   . mcf: 22-Feb-88 11 36
   "prompting move function"
   [PROG ((object (AND (Object? Object)
                       Object)))
         (COND
            ((AND [OR object (SETQ object (_ self LocateObject (_ self GetSelection "Select Object to move")
                                                                 'ID)]
                  (_ object PermissibleP 'Move))
             (_ self MoveIt object)
             (_ self DeSelect object)
             (_ self AdjustExtent (@ object %:highlightRegion))])


(Method ((FOEBrowser Repaint) self)                  . mcf: 30-Sep-85 10 10
   "Specialize Loops window Repaint to redraw the current display"
   (PROG ((savelst (@ contentObjectLst))
          (window (@ self window)))
         (RESETLST                                                      . (_Super)
             (RESETSAVE (PutValue self 'contentObjectLst NIL)
                   (LIST [FUNCTION (LAMBDA (obj lst)
                                    (PutValue obj 'contentObjectLst lst]
                         self savelst))
             (RESETSAVE (_ self AllowAttention)
                   (LIST [FUNCTION (LAMBDA (self attn)
                                    (_ self AllowAttention attn)]
                         self
                         (@ self attentionOn)))
             (_ self ClearBoxHighLight)
             (_Super ))
         (_ self BoxHighLight (LASTMOUSEX window)
                (LASTMOUSEY window))))


(Method ((FOEBrowser RepaintFn) self Window Region)  . mcf: 29-Jul-85 20 38
   "Basic scrolling repaint function"
   [for obj in (@ self %:contentObjectLst) do (COND
                                                 ((REGIONSINTERSECTP (@ obj %:highlightRegion)
                                                            Region)
                                                  (_ obj Draw Window)])


(Method ((FOEBrowser ScrollFn) self XDelta YDelta ContinuousFlg)
                                                      . TAL 14-Oct 85 02.31
   "Specialization"
   (RESETLST
      [RESETSAVE (_ self AllowAttention NIL)
           '(PROGN (_ self AllowAttention ,(@ self %:attentionOn))]
      (SCROLLBYREPAINTFN (@ %:window)
           XDelta YDelta ContinuousFlg)))


(Method ((FOEBrowser Select) self HLObject Window)   . mcf 24-Oct-86 14 01
   "Selects current selectable object by invert highlighting"
   [PROG (BoxedFlg (Depth (@ %:selectionDepth))
               (window (OR Window (@ %:window)))
               (HL HLObject))
         (OR Depth (SETQ Depth 1))
         (COND
            [(@ %:boxFlg)
             (COND
                [[OR HL (SETQ HL (_ self Highlightable? (LASTMOUSEX window)
                                            (LASTMOUSEY window))]
                                                               (* remove items if depth has changed)
                 (COND
                    ((SETQ BoxedFlg (_ self Boxed? HL))
                     (_ self ClearBoxHighLight)))
                 [COND
                    ((FMEMB HL (@ %:selectionLst))
                     (_ HL Highlight window 'Off)              (* remove it if it is there)
                     (change (@ %:selectionLst)
                           (DREMOVE HL DATUM]
                 (for obj in (NTH (@ %:selectionLst)
                                  Depth)
                    do (_ obj Highlight window 'Off)           (* trim the selection stack)
                       (change (@ %:selectionLst)
                             (DREMOVE obj DATUM)))             (* clear any invert highlights)
                 (for obj in (@ %:selectionLst) do (_ obj Highlight window 'Off)
                                                   (_ obj Highlight window 'Shade FOEShade1)
                    when (EQ (@ obj %:highlightMode)
                             'Invert))                         (* highlight and push selection on to stack)
                 (_ HL Highlight window 'Invert)
                 (push (@ %:selectionLst)
```

```
                       HL)
                 (AND (@ %:eventActive)
                      (NOTIFY.EVENT (@ %:eventActive)))
                 (AND BoxedFlg (_ self BoxHighLight (LASTMOUSEX window)
                                            (LASTMOUSEY window))]
                (T (_ self ClearSelections)]
            (T (SETQ HL (_ self FindSelectedSubObject window NIL))
               (COND
                  (HL (push (@ %:selectionLst)
                            HL)
                      (AND (@ %:eventActive)
                           (NOTIFY.EVENT (@ %:eventActive)])
```

```
(Method ((FOEBrowser SelectAttentionPt) self window)
                                                        mcf 17-Jan-86 14:01
   "Select something and begin flashing it in the window"
   [PROG (obj oldregion region tmpregion X Y)
         (pop (@ self %:attentionPts))
         (WAKE.PROCESS (@ %:flashProcess))
         (BLOCK 1)
     FLIP
         (AND oldregion (FLIPREGION window oldregion))
         (AND region (FLIPREGION window region))
         (SETQ tmpregion oldregion)
         (SETQ oldregion region)
     LP  (GETMOUSESTATE)
         (COND
            ((NOT (LASTMOUSESTATE LEFT))
             [COND
                (region (FLIPREGION window region)
                       (push (@ self %:attentionPts)
                             region)
                       (_ self FlashAttentionPt region 'INVERT)]
             (RETURN region))
            ((NOT (INSIDE? (WINDOWPROP window 'REGION)
                         LASTMOUSEX LASTMOUSEY))
             (AND region (FLIPREGION window region))
             (RETURN))
            ((EQUAL [COND
                       ((SETQ region (COND
                                        [[AND (SETQ region (_ self GridJustify (SETQ X (LASTMOUSEX window))
                                                                  (SETQ Y (LASTMOUSEY window))
                                                                  tmpregion))
                                              (SETQ obj (_ self LocateObject (FIO.ComputeCenter region)
                                                               'Inside)]
                                         (COND
                                            ([for pts in (@ obj %:connectPts)
                                                thereis (COND
                                                           ((POSITIONP pts)
                                                            (INSIDEP region pts]
                                             region)
                                            (T (SETQ region NIL]
                                        (T (_ self GridJustify X Y tmpregion)]
                    oldregion)
             (GO LP))
            (T (GO FLIP])

(Method ((FOEBrowser Shape) self newRegion)             mcf 7-Jul-85 19:35
   "flag shape as changed"
   (_Super self Shape newRegion)                        (_ self Repaint)
   (_@ self %:reShaped T))

(Method ((FOEBrowser SpaceP) self obj Region)           mcf: 19-Jul-85 15:47
   "See if Region overlaps anything in the editor"
   (NOT (_ self LocateObject Region 'Intersect)))
```

```
(Method ((FOEBrowser UnDelete) self item crock)         mcf: 27-Oct-87 12:53
   "remove item from deleted list and return it to the display"
   [LET (newregion bitmap center)
     [COND
        ([AND (NOT crock)
              (NOT (_ self SpaceP item (@ item %:region))]
         (SETQ newregion (_ self FindSpaceManually item (@ item %:region)))
         (_@ item %:region newregion)
         (_@ item %:center (FIO.ComputeCenter newregion)))
        (T (SETQ newregion (@ item %:region)]
     (pushnew (@ %:contentObjectLst)
            item)
     (COND
        ((SETQ bitmap (@ item %:bitmap))
         (BITBLT bitmap 0 0 (@ %:window)
                (fetch (REGION LEFT) of newregion)
                (fetch (REGION BOTTOM) of newregion)
                (fetch (REGION WIDTH) of newregion)
                (fetch (REGION HEIGHT) of newregion)
                NIL
                'REPLACE))
        (T (SETQ center (@ item %:center))
           (_ item Draw (@ %:window)
                 (create FIDXform
                        XTranslation _ (fetch (POSITION XCOORD) of center)
                        YTranslation _ (fetch (POSITION YCOORD) of center]))

(Method ((FOEBrowser UnDrawLinks) self item LinkSwitch DontRedrawFlg)
                                                        mcf 31-Jul-86 12:36
   "Erase links"
   (LET [(scale (@ !:object:progScale!))
         (stream (@ self %:window))
         (ls (OR LinkSwitch 'Both]
     (_ self ClearBoxHighLight)
```

```
    (SELECTQ ls
        ((Source Both)
            [for pred in (@ item %:predecessors)
               do (for link in (@ pred %:linkType) do (_ link DrawLink stream scale 'ERASE)
                    when (EQ (@ link %:linkDestination)
                             item))
                  (OR DontRedrawFlg (for link in (@ pred %:linkType)
                                        do (_ link DrawLink stream scale)
                                        when (NEQ (@ link %:linkDestination)
                                                  item])
        NIL)
    (SELECTQ ls
        ((Dest Both)
            (for link in (@ item %:linkType) do (_ link DrawLink stream scale 'ERASE))
            [OR DontRedrawFlg (for succ in (@ item %:successors)
                                 do (for pred in (@ succ %:predecessors)
                                       do (for link in (@ pred %:linkType)
                                             do (_ link DrawLink stream scale)
                                             when (NEQ pred item])
        NIL)))

(\UnbatchMethodDefs)

(DEFINEQ
```

(CreateGrafFOE

```
  [LAMBDA (GrafcetMainProgram DontInsistOnNameFlg)            Edited 10-May-88 17 33 by loops
    (LET [(prog (OR GrafcetMainProgram (_ ($ GrafcetMainProgram)
                                          New)]
      [COND
        ((AND (NULL DontInsistOnNameFlg)
              (NULL (@ prog %:name)))
          (bind n do (SETQ n (MKATOM (PROMPTFORWORD "Program name: ")))
             repeatuntil (AND n (NOT ($! n))) finally (_ prog NameObject n)]
      (StartTopLevelContext ($ EditGrafcetContext)
             prog])
```

Page 19

(FID.DrawBoxFromLst

```
  [LAMBDA (Lst Window Mode)                                    (* mcf%: "13-Aug-86 14:25")
    (for x reg in Lst do (SETQ reg (CAR x))
                         (DRAWAREABOX (fetch LEFT of reg)
                                (fetch BOTTOM of reg)
                                (fetch WIDTH of reg)
                                (fetch HEIGHT of reg)
                                1 Mode Window])
```

(FID.PaletteList

```
  [LAMBDA (obj)                                                (* mcf%: " 2-Dec-86 18:27")
    (COND
      [(LISTP obj)
       (NCONC1 (FID.PaletteList (CAR obj))
              (CONS 'SUBITEMS (for subobj in (CDR obj) collect (FID.PaletteList subobj]
      (T (COND
           ([OR (Object? obj)
                (EQ 'Class (ClassName (Class obj]
            (LIST (_Proto obj GetPaletteIcon)
                  obj "Selects object from palette"))
           ((ATOM obj)
            (LIST (_ (EVAL obj)
                     GetPaletteIcon)
                  (EVAL obj)
                  "Selects object from palette"])
```

(FIDRepaintFn

```
  [LAMBDA (Window Region)                                      (* mcf%. "29-Jul-85 18:08")
    (_ (WINDOWPROP Window 'LoopsWindow)
       RepaintFn Window Region])
```

(FOE.PokeProcess

```
  [LAMBDA (process)                                            (* TAL " 2-Aug-85 15:36")
                                                               (* jolt process into taking a look at current flash points)
    (COND
      ((PROCESSP process)
       (WAKE.PROCESS process)
       (BLOCK])
```

(FOEBrowserSHRINKFN

```
  [LAMBDA (Window)                                             (* TAL "13-Oct-85 01 16")
    (PROG (lpw process)
          (COND
            ((SETQ lpw (WINDOWPROP Window 'LoopsWindow))
             (COND
               ((PROCESSP (SETQ process (@ lpw %:flashProcess)))
                (DEL.PROCESS process)))
             (COND
               ((AND (PROCESSP (SETQ process (@ lpw %:menuProcess)))
                     (NEQ process (THIS.PROCESS)))
                (DEL.PROCESS process])
```

FOEComputeSlope

```
(FOEComputeSlope
  [LAMBDA (Src Dest)                                  (* mct%. " 3-Jul-85 18:11")
                                                      (* accept either an object -
                                                      containing a center -
                                                      or a position)
    (PROG ((SPos (OR (AND (Object? Src)
                          (@ Src %:center))
                     Src))
           (DPos (OR (AND (Object? Dest)
                          (@ Dest %:center))
                     Dest)))
          (RETURN (create POSITION
                         XCOORD _ (IDIFFERENCE (fetch (POSITION XCOORD) of DPos)
                                          (fetch (POSITION XCOORD) of SPos))
                         YCOORD _ (IDIFFERENCE (fetch (POSITION YCOORD) of DPos)
                                          (fetch (POSITION YCOORD) of SPos])
```

FOECursorMovedFn

```
(FOECursorMovedFn
  [LAMBDA (WN)                                        (* mct%: "24-Oct-86 13.49")
    (LET [(lw (WINDOWPROP WN 'LoopsWindow]
      (AND lw (@ lw %:boxFlg)
           (_ lw BoxHighLight (LASTMOUSEX WN)
              (LASTMOUSEY WN))])
```

FOECursorOutFn

```
(FOECursorOutFn
  [LAMBDA (WN)                                        (* mct%. "24-Oct-86 13.49")
    (LET [(lw (WINDOWPROP WN 'LoopsWindow]
      (AND lw (@ lw %:boxFlg)
           (_ lw ClearBoxHighLight)])
```

FOEFLASH.PROCESS

```
(FOEFLASH.PROCESS
  [LAMBDA (Window FOEInstance)                        (* mct%. "25-Jul-85 16.21")
    (PROG ((flasher (THIS.PROCESS))
           (interval (@ FOEInstance |::FlashInterval|)))
          (bind flashlst oldflashlst while T do (SETQ flashlst (@ FOEInstance %:attentionPts))
                                              (UNINTERRUPTABLY
                                                  (for flashpoint in (COND
                                                                        ((PROG1 oldflashlst (SETQ
                                                                                              oldflashlst)))
                                                                        (T (SETQ oldflashlst flashlst)))
                                                     do (AND (REGIONP flashpoint)
                                                             (FLIPREGION Window flashpoint))))
                                              (BLOCK interval])
```

FOEPaletteWhenSelectedFn

```
(FOEPaletteWhenSelectedFn
  [LAMBDA (Item Menu Button)                          Edited 17-Jun-88 11 29 by mct
    (LET (eCom itemLst paletteItem process eMenu editor)
      (AND (SETQ editor (WINDOWPROP (MAINWINDOW (WFROMMENU Menu)
                                                T)
                           'LoopsWindow))
           (COND
              [(AND (SETQ eCom (CAR (@ editor editModeCommand)))
                    (EQ eCom 'AddObject)
                    (EQ Button 'MIDDLE))
               (SETQ itemLst (fetch ITEMS of Menu))
               [COND
                  ((SETQ paletteItem (@ editor paletteItem))
                   (for i in itemLst thereis (EQ (CADR i)
                                                 paletteItem)
                      finally (AND $$VAL (SHADEITEM $$VAL Menu WHITESHADE]
               (COND
                  ((AND (NEQ paletteItem (CADR Item))
                        (for i in itemLst thereis (EQ i Item)))
                   (FLIPREGION (WFROMMENU Menu)
                          (MENUITEMREGION Item Menu))
                   (_@ editor paletteItem (CADR Item)))
                  (T (_@ editor paletteItem NIL)]
              ([AND (EQ Button 'MIDDLE)
                    (SETQ paletteItem (for i in (SETQ itemLst (fetch ITEMS of Menu))
                                         thereis (EQ i Item]
               [SETQ eMenu (CAR (WINDOWPROP (@ editor editMenu)
                                       'MENU]
               (_ editor MethodMenuSelection (FASSOC 'Add (fetch ITEMS of eMenu))
                     Button NIL eMenu)
               (FLIPREGION (WFROMMENU Menu)
                      (MENUITEMREGION Item Menu))
               (_@ editor paletteItem (CADR Item)))
              (T (AND eCom (_ editor CleanupState))
                 (SETQ process (@ editor menuProcess))
                 (COND
                    ((AND (PROCESSP process)
                          (NEQ process (THIS.PROCESS)))
                     (DEL.PROCESS process)
                     (BLOCK 50)))
                 (ALLOW.BUTTON.EVENTS)
                 (_@ editor menuProcess (THIS.PROCESS))
                 (_@ editor paletteItem (CADR Item))
                 [SETQ eMenu (CAR (WINDOWPROP (@ editor editMenu)
                                         'MENU]
                 (_ editor MethodMenuSelection (FASSOC 'Add (fetch ITEMS of eMenu))
                       Button
                       (CADR Item))
                 (_@ editor menuProcess NIL)])
```

(MakeWithinRange

```
  [LAMBDA (n low high)                                        (* mcf%: "22-Jul-86 17 20")
    (MIN high (MAX n low))
)
```

(RPAQQ BlankButtonIcon 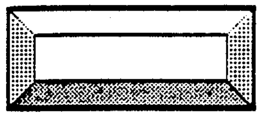 )

(RPAQQ PaletteArc  )

(RPAQQ PaletteEllipse  )

```
(RPAQ? FISAllowAttentionFlg )

(RPAQ? FISAllowBoxingFlg )

(RPAQ? FOEShade1 1024)

(DECLARE%: DOEVAL@COMPILE DONTCOPY

(GLOBALVARS FISAllowAttentionFlg FISAllowBoxingFlg)
)

(PUTPROPS FEDITOR FILETYPE :FAKE-COMPILE-FILE)

(PUTPROPS FEDITOR COPYRIGHT ("Savoir, Inc." 1985 1986 1987 1988))
```

FUNCTION INDEX

AddMenuCursorOutFn .............17
CreateBlockFOE .................18
EditBlockMain ..................18
FID.LocateObjectLoop ...........18
FindAllMMFSProcesses ...........19
FISMultiSelGetSelections .......18
MultiSelWhenSelectedFn .........19

METHOD INDEX

BlockMMFSCom.Initialize ..............................3
BlockProgram.ComputeSteps ............................4
EditBlockEditMMFSCom.ProcessListObject ...............4
EditBlockEditMMFSCom.Start ...........................4
FIDBlockDiagramObject.DeInstall ......................4
FIDBlockGroup.ComputeLabelRegion .....................4
FIDBlockGroup.ComputeRegion ..........................5
FIDBlockGroup.Draw ...................................5
FIDBlockGroup.Moved ..................................5
FIDBlockLink.DrawConnection ..........................5
FIDBlockLink.DrawLink ................................6
FIDBlockObject.ClearLinkCache ........................6
FIDBlockObject.ClearRegions ..........................6
FIDBlockObject.ComputeLabelRegion ....................6
FIDBlockObject.DeInstall .............................6
FIDBlockObject.DeLink ................................7
FIDBlockObject.Draw ..................................7
FIDBlockObject.DrawInnerLabel ........................7
FIDBlockObject.DrawLabel .............................8
FIDBlockObject.DrawStub ..............................8
FIDBlockObject.DrawText ..............................8
FIDBlockObject.Erase .................................8
FIDBlockObject.EraseLabel ............................8
FIDBlockObject.ExtendExtent ..........................8
FIDBlockObject.FindGrafcetProcessName ................8
FIDBlockObject.FindManuallySendableMessages ..........9
FIDBlockObject.FindSpaceManually .....................9
FIDBlockObject.GetCenterFromBottom ...................9
FIDBlockObject.GetCenterFromTop ......................9
FIDBlockObject.GetConnectPoint .......................9
FIDBlockObject.GetGrid ...............................9
FIDBlockObject.GridJustify ..........................10
FIDBlockObject.Install ..............................10
FIDBlockObject.Link .................................10
FIDBlockObject.Moved ................................11
FIDBlockObject.RegionIntersectP .....................11
FIDBlockObject.SetLabel .............................11
FOEBlockBrowser.AddObject ...........................11
FOEBlockBrowser.Browse ..............................11
FOEBlockBrowser.Delete ..............................12
FOEBlockBrowser.ExplainFactorySystem ................12
FOEBlockBrowser.GetHorizMenuItems ...................12
FOEBlockBrowser.GetPaletteItems ....................12
FOEBlockBrowser.LinkObject ..........................12
FOEBlockBrowser.LocateObject ........................12
FOEBlockBrowser.MoveIt ..............................13
FOEBlockBrowser.RunFactorySystem ....................13
FOEBlockBrowser.SetFont .............................13
FOEMMFSBlockEditor.AllowAttention ...................13
FOEMMFSBlockEditor.AutoLinkObjects ..................13
FOEMMFSBlockEditor.BoxHighLight .....................13
FOEMMFSBlockEditor.Browse ...........................14
FOEMMFSBlockEditor.CollectObjects ...................14
FOEMMFSBlockEditor.ConstructMiddleContextItems ......14
FOEMMFSBlockEditor.ConstructTitle ...................14
FOEMMFSBlockEditor.Delete ...........................14
FOEMMFSBlockEditor.ExitBrowser ......................14
FOEMMFSBlockEditor.FindProcess ......................14
FOEMMFSBlockEditor.GetCorrespondents ................14
FOEMMFSBlockEditor.Layout ...........................15
FOEMMFSBlockEditor.LayoutGroup ......................15
FOEMMFSBlockEditor.LayoutGroups .....................16
FOEMMFSBlockEditor.MMFSTrace .........................16
FOEMMFSBlockEditor.UnDelete .........................17
FOEMMFSBlockEditor.UnDrawLinks ......................17

CLASS INDEX

BlockMMFSCom ...........1
BlockProgram ...........1
EditBlockContext .......2
EditBlockEditMMFSCom ...2
FIDBlockDiagramObject ..2
FIDBlockGroup ..........2
FIDBlockLink ...........2
FIDBlockObject .........2
FIDBlockObject1 ........3
FOEBlockBrowser ........3
FOEMMFSBlockEditor .....3

PROPERTY INDEX

FIDBLOCK ............1,19 changes to: (METHODS FOEMMFSBlockEditor.MMFSTrace)

previous date: 2-Aug-88 17:47:00 (POGO:AISNORTH:XEROX)<LIPKIS>FIS>FIDBLOCK.;90

Read Table: INTERLISP

Package: IL

Copyright (c) 1985, 1986, 1987, 1988 by Savoir, Inc.. All rights reserved.

```
(RPAQQ FIDBLOCKCOMS
       ((DECLARE%: DONTCOPY (PROP MAKEFILE-ENVIRONMENT FIDBLOCK))
        (CLASSES BlockMMFSCom BlockProgram EditBlockContext EditBlockEditMMFSCom FIDBlockDiagramObject
               FIDBlockGroup FIDBlockLink FIDBlockObject FIDBlockObject1 FOEBlockBrowser FOEMMFSBlockEditor)
        (METHODS BlockMMFSCom.Initialize BlockProgram.ComputeSteps EditBlockEditMMFSCom.ProcessListObject
               EditBlockEditMMFSCom.Start FIDBlockDiagramObject.DeInstall FIDBlockGroup.ComputeLabelRegion
               FIDBlockGroup.ComputeRegion FIDBlockGroup.Draw FIDBlockGroup.Moved FIDBlockLink.DrawConnection
               FIDBlockLink.DrawLink FIDBlockObject.ClearLinkCache FIDBlockObject.ClearRegions
               FIDBlockObject.ComputeLabelRegion FIDBlockObject.DeInstall FIDBlockObject.DeLink
               FIDBlockObject.Draw FIDBlockObject.DrawInnerLabel FIDBlockObject.DrawLabel
               FIDBlockObject.DrawStub FIDBlockObject.DrawText FIDBlockObject.Erase FIDBlockObject.EraseLabel
               FIDBlockObject.ExtendExtent FIDBlockObject.FindGrafcetProcessName
               FIDBlockObject.FindManuallySendableMessages FIDBlockObject.FindSpaceManually
               FIDBlockObject.GetCenterFromBottom FIDBlockObject.GetCenterFromTop
               FIDBlockObject.GetConnectPoint FIDBlockObject.GetGrid FIDBlockObject.GridJustify
               FIDBlockObject.Install FIDBlockObject.Link FIDBlockObject.Moved
               FIDBlockObject.RegionIntersectP FIDBlockObject.SetLabel FOEBlockBrowser.AddObject
               FOEBlockBrowser.Browse FOEBlockBrowser.Delete FOEBlockBrowser.ExplainFactorySystem
```

```
          FOEBlockBrowser.GetHorizMenuItems FOEBlockBrowser.GetPaletteItems FOEBlockBrowser.LinkObject
          FOEBlockBrowser.LocateObject FOEBlockBrowser.MoveIt FOEBlockBrowser.RunFactorySystem
          FOEBlockBrowser.SetFont FOEMMFSBlockEditor.AllowAttention FOEMMFSBlockEditor.AutoLinkObjects
          FOEMMFSBlockEditor.BoxHighLight FOEMMFSBlockEditor.Browse FOEMMFSBlockEditor.CollectObjects
          FOEMMFSBlockEditor.ConstructMiddleContextItems FOEMMFSBlockEditor.ConstructTitle
          FOEMMFSBlockEditor.Delete FOEMMFSBlockEditor.ExitBrowser FOEMMFSBlockEditor.FindProcess
          FOEMMFSBlockEditor.GetCorrespondents FOEMMFSBlockEditor.Layout FOEMMFSBlockEditor.LayoutGroup
          FOEMMFSBlockEditor.LayoutGroups FOEMMFSBlockEditor.MMFSTrace FOEMMFSBlockEditor.UnDelete
          FOEMMFSBlockEditor.UnDrawLinks)
      (FNS AddMenuCursorOutFn CreateBlockFOE EditBlockMain FID.LocateObjectLoop FISMultiSelGetSelections
          FindAllMMFSProcesses MultiSelWhenSelectedFn)
      (PROP FILETYPE FIDBLOCK)))

(DECLARE%: DONTCOPY

(PUTPROPS FIDBLOCK MAKEFILE-ENVIRONMENT (:PACKAGE "IL" :READTABLE "INTERLISP" :BASE 10))
)

(DEFCLASS BlockMMFSCom (MetaClass Class Edited%:            (* mcl%: "28-Jul 86 10 45")
                         doc "This is the default metaClass for all classes")
    (Supers BlockProgram)
    (ClassVariables (PrintName "Communications Diagram")
          (PaletteFIDObjects NIL))
    (InstanceVariables (dirtyFlg NIL DontSave Any doc "IV added by LIPKIS")
          (groupObjects NIL doc "groups go here")
          (keyname NIL doc "constructed name")))

(DEFCLASS BlockProgram (MetaClass Class Edited%:            (* mcl%: "30-Sep-85 17 24")
                         doc "This is the default metaClass for all classes")
    (Supers GrafcetMainProgram)
    (ClassVariables (Composition (steps)
                         doc "Drawable objects that make up this object")
          (PrintName "Blocker")
          (PaletteFIDObjects (#,($C FIDBlockObject1)))
          (ScaleFactors (Large 18 Medium 12 Small 2 Up 2 Down 2)
                doc "Scale factors for respective size choices"))
    (InstanceVariables (steps #,($A ComputeSteps FFSendSelf ReplaceMe) DontSave Any VR
                         #,($C FIDBlockObject)
                         doc "the top level steps that make up this Grafcet program")
          (progScale 12 doc "new default")))
                                                                                        Page 2
(DEFCLASS EditBlockContext (MetaClass Class Edited%:        (* mcl%: " 6-Oct-86 16:28")
                         doc "This is the default metaClass for all classes")
    (Supers EditGrafcetContext)
    (ClassVariables (Browser #,($C FOEBlockBrowser))
          (SubContextTypes (#,($C EditingContext) #,($C ExamineGrafcetStructureContext)
                         #,($C CellAnimationContext)))
          (LinkedContexts NIL doc "Examine process should only be available for main program. This will
                work for now")
          (Prototype #,($& EditBlockContext (|FQXO.L2[:.@N=| . 15)))))
    (InstanceVariables (object NIL VR #,($C BlockProgram))
          (specialBehavior NIL doc "Should be on DefaultContext")))

(DEFCLASS EditBlockEditMMFSCom (MetaClass Class Edited%:    (* mcl%: "22-Feb-88 13:37")
                         doc "This is the default metaClass for all classes")
    (Supers EditBlockContext)
    (ClassVariables (Browser #,($C FOEMMFSBlockEditor))
          (SubContextTypes (#,($C EditingContext)))
          (MenuName "Edit Communications")
          (MenuDoc "Edit diagram of MAP connections in this cell")
          (Prototype #,($& EditBlockEditMMFSCom (|FQXO.L2[:.@N=| . 2)))))
    (InstanceVariables (object NIL VR #,($C BlockMMFSCom))
          (layout? NIL doc "on if object needs a layout")
          (canCreate NIL)))

[DEFCLASS FIDBlockDiagramObject (MetaClass Class Edited%:   (* mcl%: "26-Jul-86 15:21")
                         doc "This is the default metaClass for all classes")
    (Supers FIDBlockObject)
    (ClassVariables (IconDescription (BoxDraw ((-1 -1 2 2))
                         ConnectPoints
                         (Top (0 . 2)
                              TopEdge
                              (0 . 1)
                              Middle
                              (0 . -1)
                              Bottom
                              (0 . -3)))
                    doc "BoxDraw is a region descriptor, while LineDraw is a list of point to be
                    connected. When combined with a scale factor these descriptors will draw the
                    object around a specified center"))
    (InstanceVariables (InstanceVariables (region #,($A ComputeRegion FFSendSelf ReplaceMe) doc
                                                      (* region is based on subObjects)]

(DEFCLASS FIDBlockGroup (MetaClass Class Edited%:           (* mcl%: "25-Jul-86 07 53")
                         doc "This is the default metaClass for all classes")
    (Supers FIDBlockObject)
    (ClassVariables (IconDescription (BoxDraw ((-1 -1 2 2))
                         ConnectPoints
                         (Top (0 . 1)
                              Middle
                              (0 . -1)
                              Bottom
                              (0 . -2)))
                    doc "BoxDraw is a region descriptor, while LineDraw is a list of point to be
                    connected. When combined with a scale factor these descriptors will draw the
                    object around a specified center"))
    (InstanceVariables (region #,($A ComputeRegion FFSendSelf ReplaceMe) doc "region is based on
                         subObjects")))
```

```
(DEFCLASS FIDBlockLink (MetaClass Class Edited%:           (* mcl%. "24-Jul-86 08.52")
                          doc "This is the default metaClass for all classes")
      (Supers GrafcetAsynchronousLink))

(DEFCLASS FIDBlockObject (MetaClass Class Edited%:          (* mcl%: " 3-Nov-86 15.05")
                          doc "This is the default metaClass for all classes")
      (Supers FIDBoxObject)
      (ClassVariables (PermissibleActionLst (Add Delete Label Link Move))
            (BrowseableSubParts (grafcetProgram manuallySendableMessages deviceSchematic mapCommunication)
                  doc "(grafcetProgram manuallySendableMessages deviceSchematic mapCommunication
                  blockProgram)")
            (Prototype #.($& FIDBlockObject (G+U0.1E+%:.H?7 . 73)) doc "Undocumented CV added by MARK"))
      (InstanceVariables (successors NIL VR #.($C FIDBlockObject))
            (predecessors NIL VR #.($C FIDBlockObject))
            (linkType NIL)
            (labelRegion #.($A ComputeLabelRegion FFSendSelf ReplaceMe) DontSave Any doc "Place where label
                  is drawn")
            (scale #.($A (superObject progScale) GetIndirectThroughIV Noop) DontSave Any doc "Scale at
                  which this object is drawn")
            (innerLabel NIL doc "String to print inside the block")
            (timesw 1 DontSave NIL)
            (grafcetProgram #.($A NIL AVLookupNamedObject NoUpdatePermitted) NamedByIV grafcetProgramName
                  VR #.($C GrafcetProgram) DontSave Any Editable T Editable T)
            (grafcetProgramName NIL)
```

Page 3

```
            (blockProgram NIL Editable T)
            (manuallySendableMessages NIL)
            (deviceSchematic NIL)
            (mapCommunication NIL)
            (processName #.($A FindGrafcetProcessName FFSendSelf NoUpdatePermitted) DontSave Any)
            (subObjects NIL doc "objects I group")
            (groupObject NIL doc "object I participate in")))

(DEFCLASS FIDBlockObject1 (MetaClass Class Edited%:         (* mcl "29-Jul-86 09:25")
                          doc "This is the default metaClass for all classes")
      (Supers FIDBlockObject)
      (ClassVariables (IconDescription (BoxDraw ((-1 -1 2 2))
                                          ConnectPoints
                                          (Top (0 . 1)
                                               TopEdge
                                               (0 . 1)
                                               Middle
                                               (0 . -1)
                                               Bottom
                                               (0 . -2)))
                        doc "BoxDraw is a region descriptor, while LineDraw is a list of point to be
                        connected. When combined with a scale factor these descriptors will draw the
                        object around a specified center")
            (Prototype #.($& FIDBlockObject1 (G+U0.1E+%:.H?7 . 69)))))

(DEFCLASS FOEBlockBrowser (MetaClass Class Edited%:         (* mcl%. "23 Jul-86 16.12")
                          doc "This is the default metaClass for all classes")
      (Supers FOEBrowser)
      [ClassVariables (PrintName NIL doc "disable extra name on these browsers")
            (TopLevelHorizMethodItems ((Deactivate Deactivate "Stop this activity and shrink to an icon")
                                      (Explain ExplainFactorySystem "Point to FCS or GF Cell and push the
                                               middle mouse button to see Observer
                                               facilities, or select Run to watch a simulation of the
                                               Factory System.")
                                      (Run RunFactorySystem "Watch a simulation of the factory system"]
      (InstanceVariables (selectionOn NIL)
            (localEditFlg NIL doc "disable menu presentations")))

(DEFCLASS FOEMMFSBlockEditor (MetaClass Class Edited%:      (* mcl%: "28-Jul-86 10 49")
                          doc "This is the default metaClass for all classes")
      (Supers FOEBlockBrowser)
      [ClassVariables (PrintName                             (* " Communications"))
            (HorizMethodItems ((Exit ExitBrowser "Exit out of this Browser")
                              (Edit EnableEdit "Toggle editing state")
                              ("Trace Messages" MMFSTrace "Trace the MMFS messages flowing between
                                    selected processes")))
            (DirectionMenuItems ((Source 'source "Selected process is source of traced messages")
                                (Destination 'destination "Selected process is destination of traced
                                      messages")
                                (Both 'either "Trace messages to and from selected process")))
            (EditMethodItems ((Move MoveObject "Move position of selected object" (SUBITEMS (Move% Object
                                                                                            MoveObject
                                                                                            'Move position
                                                                                            of selected
                                                                                            object")
                                                                                   (Move% Link
                                                                                        MoveLink
                                                                                        "Adjust
                                                                                        position of
                                                                                        selected
                                                                                        link
                                                                                        flowline"]
      (InstanceVariables (localEditFlg T doc "turn on editing")
            (directionMenu NIL DontSave Any doc "cache of direction menu")))

(\BatchMethodDefs)
```

```
(Method ((BlockMMFSCom Initialize) self)                    . TAL 15-Oct-85 12 41
   "New method template"
   (COND
      ((AND (@ %:dirtyFlg)
            (@ %:displayEditor))
       (_ (@ %:displayEditor)
          Repaint)
       (_@ %:dirtyFlg NIL))))
```

```
(Method ((BlockProgram ComputeSteps) self)                   . mcf: 29-Oct-87 13.46
   "Specialization"
   (bind (vr _ (@ |:steps:.VR|)) for x in (@ %:subObjects) when (_ x InstOf! vr) collect x))

(Method ((EditBlockEditMMFSCom ProcessListObject) self object objectClass elementClass)
                                                             . TAL 10-Jan-88 19.17
   "Specialization"
   (LET ((com (_ objectClass New)))
     [bind group obj for lst in object do (COND
                                             ((CDR lst)
                                              (for proc in (CDR lst)
                                                 first (SETQ group (_ (DEFERREDCONSTANT ($ FIDBlockGroup))
                                                                      New))
                                                       (_@ group %:label (FISDequalifyName (CAR lst)))
                                                       (_@ group %:grafcetProgramName (CAR lst))
                                                       (push (@ com %:subObjects)
                                                             group)
                                                 collect (PROG1 (SETQ obj (_ (DEFERREDCONSTANT ($
                                                                                      FIDBlockDiagramObject
                                                                                        ))
                                                                             New))
                                                                (_@ obj %:grafcetProgramName (CAR proc))
                                                                (_@ obj %:innerLabel (CDR proc))
                                                                (_@ obj %:superObject com)
                                                                (_@ obj %:groupObject group))
                                                 finally (_@ group %:subObjects $$VAL)
                                                         (_@ group %:superObject com)))
                                             (T (SETQ obj (_ (DEFERREDCONSTANT ($ FIDBlockDiagramObject))
                                                             New))
                                                (_@ obj %:grafcetProgramName (CAR lst))
                                                (_@ obj %:innerLabel (CDR lst))
                                                (_@ obj %:superObject com)
                                                (push (@ com %:subObjects)
                                                      obj]
     (_@ com %:keyname (CONCATLIST (FISSeparatedList (SORT (APPEND object)
                                                           T)
                                   FISBrowserMultipleNameSeparator
                                   (CAR X))))
     (_@ self %:layout? T)
     com))

(Method ((EditBlockEditMMFSCom Start) self Object ContextArgs)
                                                             . mcf: 19-Feb-88 15 06
   "Specialization"
   (_@ self %:permitEdits T)                                   always permit editing
   (_Super self Start Object ContextArgs))

(Method ((FIDBlockDiagramObject DeInstall) self superObject)
                                                             . mcf: 28-Jul-86 08.18
   "Specialization"
   (LET (grp)
     [COND
        ((SETQ grp (@ self %:groupObject))
         (change (@ grp %:subObjects)
                 (DREMOVE self DATUM]
     (_Super self DeInstall superObject)))

(Method ((FIDBlockGroup ComputeLabelRegion) self)
                                                             . mcf: 25-Jul-86 15:13
   "Specialization"
   (LET (stregion region stream (label (@ self %:label)))
     (COND
        (label (SETQ stream (@ |:superObject:displayStream|))
               (SETQ stregion (STRINGREGION label stream))
               (SETQ region (@ self %:region))
               (CREATEREGION (IPLUS (fetch (REGION LEFT) of region)
                                    (@ |::WholeShapeBorder|)
                                    5)
                      (IPLUS (fetch TOP of region)
                             (DSPLINEFEED NIL stream))
                      (fetch (REGION WIDTH) of stregion)
                      (fetch (REGION HEIGHT) of stregion])
```

```
(Method ((FIDBlockGroup ComputeRegion) self)                 mcf: 3-Nov-86 15.34
   "New method template"
   (LET (region stream width (scale (@ |:superObject:progScale|))
                (subObjs (@ %:subObjects)))              (* (for sub in (CDR subObjs) first (SETQ region
                                                         (@ (CAR subObjs) %:region)) do (SETQ region
                                                         (UNIONREGIONS region (@ sub %:region)))))
```

```
[for sub in subObjs do (COND
                          [region (SETQ region (UNIONREGIONS region (@ sub %:region)]
                          (T (SETQ region (COPY (@ sub %:region)]
[COND
   ((SETQ stream (@ |:superObject:displayStream|))
    (AND (IGREATERP (SETQ width (STRINGWIDTH (@ self %:label)
                                             (DSPFONT NIL stream)))
                    (fetch WIDTH of region))
         (replace WIDTH of region with (ADD1 (ITIMES (IQUOTIENT width scale)
                                                     scale]
(add (fetch HEIGHT of region)
     scale)                                          (* leave room for label)
(COND
   ((ODDP (IQUOTIENT (fetch WIDTH of region)
                     scale))
    (add (fetch WIDTH of region)
         scale)))
(COND
   ((ODDP (IQUOTIENT (fetch HEIGHT of region)
                     scale))
    (add (fetch HEIGHT of region)
         scale)))
(SETQ region (GROW/REGION region scale))
(_@ self %:center (FID.ComputeCenter region))
(_@ self %:timesW (IQUOTIENT (fetch WIDTH of region)
                             (TIMES scale 2)))
(_@ self %:timesH (IQUOTIENT (fetch HEIGHT of region)
                             (TIMES scale 2)))
region))
```

```
(Method ((FIDBlockGroup Draw) self stream Xform Mode)   . mcf: 25-Jul-86 13.58
                                                        . Specialization
  "(_Super self Draw stream Xform Mode)"
  (_Super self Draw stream Xform Mode)
  (AND (NOT (@ self |:superObject:quietFlg|))
       (for obj in (@ self %:subObjects) do (_ obj Draw stream NIL Mode))))
```

```
(Method ((FIDBlockGroup Moved) self oldC newC)          mcf: 25-Jul-86 16.31
  "Specialization"
  [COND
    ((NOT (EQUAL oldC newC))
     (LET [(xDiff (IDIFFERENCE (fetch XCOORD of newC)
                               (fetch XCOORD of oldC)))
           (yDiff (IDIFFERENCE (fetch YCOORD of newC)
                               (fetch YCOORD of oldC]
       (bind cent for sub in (@ self %:subObjects) do (SETQ cent (@ sub %:center))
                                                    (replace XCOORD of cent
                                                       with (IPLUS (fetch XCOORD of cent)
                                                                   xDiff))
                                                    (replace YCOORD of cent
                                                       with (IPLUS (fetch YCOORD of cent)
                                                                   yDiff))
                                                    (_ sub Moved)]
  (_Super self Moved))
```

```
(Method ((FIDBlockLink DrawConnection) self stream points mode hackFlg SyncFlg)
                                                        mcf: 24-Jul-86 08:53
  "Specialization"
  (_Super self DrawConnection stream points mode hackFlg T))
```

Page 6

```
(Method ((FIDBlockLink DrawLink) self stream scale mode)
                                                        . mcf: 12-Sep-86 12.51
  "Specialization use grafcet links"
  (LET ((source (@ self %:linkSource))
        (dest (@ self %:linkDestination))
        (pts (@ self %:drawPoints)))
   (COND
     ((EQ (fetch YCOORD of (@ source %:center))
          (fetch YCOORD of (@ dest %:center)))
      (_ source DrawStub stream scale 'Top mode)
      (_ dest DrawStub stream scale 'Top mode)
      [COND
        ((NOT pts)
         (SETQ pts (_@ self drawPoints [SETQ pts (LIST (LIST (_ source GetConnectPoint 'Top)
                                                             (_ dest GetConnectPoint 'Top)]
                                     (* (SETQ source (CAAR pts)) (SETQ dest
                                     (CADAR pts)) (DRAWCURVE (LIST source
                                     (create POSITION XCOORD (IPLUS (fetch XCOORD of source)
                                     (IQUOTIENT (IDIFFERENCE (fetch XCOORD of dest)
                                     (fetch XCOORD of source)) 2)) YCOORD
                                     (IPLUS (fetch YCOORD of source) scale)) dest) NIL NIL NIL stream))
      (_Super self DrawLink stream scale mode))
     (T (_ source DrawStub stream scale 'Bottom mode)
        (_ dest DrawStub stream scale 'Top mode)      (* (COND ((NOT pts) (_@ self drawPoints
                                                      (SETQ pts (LIST (LIST (_ source GetConnectPoint
                                                      (QUOTE Bottom)) (_ dest GetConnectPoint
                                                      (QUOTE Top)))))))))
        NIL))
   (_Super self DrawLink stream scale mode)))
```

```
(Method ((FIDBlockObject ClearLinkCache) self)          mcf: 30-Aug-85 16.51
   "Clear cache on links"
   (for link in (@ self %:linkType) do (_@ link drawPoints NIL))
   [for pred in (@ self %:predecessors) do (for link in (@ pred %:linkType)
                                               do (_@ link drawPoints NIL)
                                               when (EQ self (@ link %:linkDestination)))])

(Method ((FIDBlockObject ClearRegions) self)          mcf: 3-Sep-85 15 08
   "New method template"
   (_@ self %:region NotSetValue)
   (_@ self %:highlightRegion NotSetValue)
   (_@ self %:highlightRegions NIL)
   (_@ self %:labelRegion NotSetValue))

(Method ((FIDBlockObject ComputeLabelRegion) self)
                                                      mcf: 30-Sep-85 17 17
   "New method template"
   [LET (stregion region stream (label (@ self %:label)))
     (COND
       (label (SETQ stream (@ |:superObject:displayStream|))
              (SETQ stregion (STRINGREGION label stream))
              (CREATEREGION (IPLUS (fetch (REGION LEFT) of (SETQ region (@ %:highlightRegion)))
                                   (fetch (REGION WIDTH) of region)
                                   (@ |::WholeShapeBorder|))
                     (IPLUS (fetch BOTTOM of region)
                            (IQUOTIENT (DSPLINEFEED NIL stream)
                                       2))
                     (fetch (REGION WIDTH) of stregion)
                     (fetch (REGION HEIGHT) of stregion])

(Method ((FIDBlockObject DeInstall) self superObject)   W Mark 30-Aug-85 15.40
   "Specialization"
   (change (@ superObject %:steps)
        (DREMOVE self DATUM))
   (_Super self DeInstall superObject))
```

Page 7

```
(Method ((FIDBlockObject DeLink) self LinkSwitch stream scale)
                                                      mcf: 12-Aug-86 12:23
   "New method template"
   (LET ((ls (OR LinkSwitch 'Both))
         preds dests)
     (SELECTQ ls
         ((Source Both)
              (for pred in (SETQ preds (@ self %:predecessors))
                 do (change (@ pred %:successors)
                            (DREMOVE self DATUM))
                    (for linkTail on (@ pred %:linkType) when (EQ self (@ (CAR linkTail)
                                                                         %:linkDestination))
                       do (RPLACA linkTail NIL) finally (change (@ pred %:linkType)
                                                               (DREMOVE NIL DATUM)))
                                                      (* new version gets all links to us, should there be any by mistake)
                    )                                 (* (for pred in preds do (_ pred Erase stream)
                                                      (_ pred Draw stream)))
              (_@ self %:predecessors NIL))
         NIL)
     (SELECTQ ls
         ((Dest Both)
              (for succ in (SETQ dests (@ self %:successors)) do (change (@ succ %:predecessors)
                                                                         (DREMOVE self DATUM)))
              (_@ self %:successors NIL)             (* (for succ in dests do (_ succ Erase stream)
                                                      (_ succ Draw stream)))
              (_@ self %:linkType NIL))
         NIL)))

(Method ((FIDBlockObject Draw) self stream Xform Mode)  mcf: 5-Sep-85 19 00
   "Specialization"
   [LET ((center (@ self %:center))
         (xform Xform))
     [COND
       [xform (OR (fetch Scale of xform)
                  (replace Scale of xform with (@ self %:scale)]
       (T (SETQ xform (create FIDXform
                              XTranslation _ (fetch XCOORD of center)
                              YTranslation _ (fetch YCOORD of center)
                              Scale _ (@ self %:scale)]
     (_Super self Draw stream xform Mode)
     (AND (@ %:innerLabel)
          (_ self DrawInnerLabel stream))
     (AND (@ %:label)
          (_ self DrawLabel stream))
     (COND
       ((@ %:linkType)
        (_ self DrawStub stream (fetch Scale of xform))
        (for links in (@ %:linkType) do (_ links DrawLink stream (fetch Scale of xform))])
```

```
(Method ((FIDBlockObject DrawInnerLabel) self stream)
                                                          mct 25-Jul-86 16.46
   "Fit innerlabel inside the box"
   [LET* ((label (@ %:innerLabel))
          region linefeed)
     (COND
        ((AND label (NOT (@ self |:superObject:quietFlg|)))
         (SETQ region (OR (CAR (@ %:highlightRegions))
                          (@ %:region)))
         (COND
            ((AND (IGREATERP (fetch WIDTH of (STRINGREGION label stream))
                             (fetch WIDTH of region))
                  (STRPOS " " label 1))
             (SETQ linefeed (DSPLINEFEED NIL stream))
             (bind (sp1 _ 1)
                   sp2 part (reg _ (CREATEREGION (fetch LEFT of region)
                                                 (IPLUS (fetch HEIGHT of region)
                                                        (fetch BOTTOM of region)
                                                        linefeed)
                                                 (fetch WIDTH of region)
                                                 (IMINUS linefeed)))
                while (SETQ sp2 (STRPOS " " label (ADD1 sp1)))
                do (SETQ part (SUBSTRING label sp1 (SUB1 sp2)))
                   (CENTERPRINTINREGION part reg stream)
                   (replace BOTTOM of reg with (IPLUS (fetch BOTTOM of reg)
                                                      linefeed))
                   (SETQ sp1 sp2)
                finally (CENTERPRINTINREGION (SUBSTRING label sp1 -1)
                                             reg stream)))
            (T (CENTERPRINTINREGION label region stream])
```

Page 3

```
(Method ((FIDBlockObject DrawLabel) self stream label)
                                                          mct 9-Sep-85 17 19
   "Print the label"
   [LET [stregion (label (OR label (@ %:label)]
     (COND
        ((AND label (NOT (@ self |:superObject:quietFlg|)))
         (_ self DrawText stream label (OR (@ %:labelRegion)
                                           (_@ self %:labelRegion (_ self ComputeLabelRegion stream))))])

(Method ((FIDBlockObject DrawStub) self stream scale dir Mode)
                                                          mct: 25-Jul-86 16.51
   "New method template"
   (LET (one two)
     (SELECTQ dir
         (Top (SETQ one (_ self GetConnectPoint 'TopEdge scale))
              (SETQ two (_ self GetConnectPoint 'Top scale)))
         (Bottom (SETQ one (_ self GetConnectPoint 'Middle scale))
                 (SETQ two (_ self GetConnectPoint 'Bottom scale)))
         NIL)
     (AND one two (_ self DrawLine stream one two (@ |::LineWidth|)
                     Mode))))

(Method ((FIDBlockObject DrawText) self stream text region)
                                                          mct 20-Sep-85 17 10
   "Specialization"
   (MOVETO (fetch LEFT of region)
           (fetch BOTTOM of region)
           stream)
   (PRIN3 text stream))

(Method ((FIDBlockObject Erase) self stream)              mct 3 Sep-85 14 08
   "Specialization"
   (_Super self Erase stream)
   (_ self DrawStub stream (@ %:scale)
           'ERASE))

(Method ((FIDBlockObject EraseLabel) self stream)         mct 3-Sep-85 14 56
   "New method template"
   [LET ((region (@ self %:labelRegion)))
     (COND
        (region (BITBLT stream (fetch (REGION LEFT) of region)
                        (fetch (REGION BOTTOM) of region)
                        stream
                        (fetch (REGION LEFT) of region)
                        (fetch (REGION BOTTOM) of region)
                        (fetch (REGION WIDTH) of region)
                        (fetch (REGION HEIGHT) of region)
                        NIL
                        'ERASE)
                (_@ self %:labelRegion NIL)])

(Method ((FIDBlockObject ExtendExtent) self extent)       mct 3-Sep-85 14 56
   "Specialization"
   [COND
      ((@ %:highlightRegion)
       (EXTENDREGION extent (@ %:highlightRegion)]
```

```
(AND (NOT (@ |:superObject:quietFlg|))
     (COND
        ((@ %:labelRegion)
         (EXTENDREGION extent (@ %:labelRegion)|
(for link in (@ %:linkType) do (_ link ExtendExtent extent))
extent)
```

(Method ((FIDBlockObject FindGrafcetProcessName) self)
. TAL 15-Oct-85 12:00

```
"New method template"
[LET ((gProg (@ %:grafcetProgram)))
  (COND
     (gProg (_ gProg FindProcessName)|])
```

(Method ((FIDBlockObject FindManuallySendableMessages) self)
. TAL 14-Nov-87 19.07
. New method template

```
"Obsolete (LET (gProg procName sender) (COND ((AND (SETQ gProg (@ :grafcetProgram)) (SETQ procName (_
gProg FindProcessName)) (SETQ sender (_ gProg FindMMFSProgram procName (QUOTE Send) T))) (@ sender
:sendableMessages))))"
NIL)
```

(Method ((FIDBlockObject FindSpaceManually) self Stream region)
. mct 3-Sep-85 13:45

```
"Specialization"
(_ self GridJustify (_Super self FindSpaceManually Stream region)
       (@ |:superObject:progScale|)))
```

(Method ((FIDBlockObject GetCenterFromBottom) self aregion scale)
. mct: 15-Jan-86 13:21

```
"Given a position, get a position that would draw the object appropriately with its bottom connection on
the position"
[LET [(bottom (LISTGET (LISTGET (@ self |::IconDescription|)
                                'ConnectPoints)
                       'Bottom))
      (scale (OR scale (@ |:superObject:progScale|)))
      (rcenter (COND
                  ((REGIONP aregion)
                   (FID.ComputeCenter aregion))
                  (aregion]
  (create POSITION
        XCOORD _ (IPLUS (fetch (POSITION XCOORD) of rcenter)
                        (TIMES scale (fetch (POSITION XCOORD) of bottom)))
        YCOORD _ (IDIFFERENCE (fetch (POSITION YCOORD) of rcenter)
                        (TIMES scale (fetch (POSITION YCOORD) of bottom])
```

(Method ((FIDBlockObject GetCenterFromTop) self aregion scale)
. mct: 15-Jan-86 13:21

```
"Given a position, get a position that would draw the object appropriately with its top connection on the
position"
[LET ((top (LISTGET (LISTGET (@ self |::IconDescription|)
                             'ConnectPoints)
                    'Top))
      (scale (OR scale (@ |:superObject:progScale|)))
      (rcenter (FID.ComputeCenter aregion)))
  (create POSITION
        XCOORD _ (IDIFFERENCE (fetch (POSITION XCOORD) of rcenter)
                        (TIMES scale (fetch (POSITION XCOORD) of top)))
        YCOORD _ (IDIFFERENCE (fetch (POSITION YCOORD) of rcenter)
                        (TIMES scale (fetch (POSITION YCOORD) of top])
```

(Method ((FIDBlockObject GetConnectPoint) self direction scale center)
. mct 30 Aug 85 15:53
. Retrieve a valid position for a connection from an installed object given a direction

```
(LET [(relpos (LISTGET (LISTGET (@ self |::IconDescription|)
                                'ConnectPoints)
                       direction))
      (center (OR center (@ self %:center)))
      (scale (OR scale (@ |:superObject:progScale|)]
  (FID.ScaleUp relpos scale center)))
```

(Method ((FIDBlockObject GetGrid) self) TAL 11 Mar-86 07:08

```
"Retrieve the grid for this display"
[LET (grid)
  (COND
     ((SETQ grid (@ self |:superObject:displayEditor|))
      (@ grid %:gridSpec)])
```

```
(Method ((FIDBlockObject GridJustify) self place scale direction)
                                                    , TAL 11-Mar-86 07.07
   "justify a region or a position within the grid"
   [LET (X Y pos grid halfgrid)

         (* For now the grid resides in the editor. This may not be correct, but only this method and the Browser's GridJustify method would
         need to be changed)

    (SETQ grid (OR (_ self GetGrid)
                   scale))
    (SETQ halfgrid (SUB1 (LRSH grid 1)))
    [COND
       ((COND
          ((REGIONP place)
           (SETQ pos (FID.ComputeCenter place)))
          ((POSITIONP place)
           (SETQ pos place)))
        [SETQ X (IPLUS (SETQ X (fetch XCOORD of pos))
                       (COND
                          ((MINUSP X)
                           (IMINUS halfgrid))
                          (halfgrid]
        (SETQ Y (IPLUS (SETQ Y (fetch YCOORD of pos))
                       (COND
                          (direction (SELECTQ direction
                                         (Bottom (IMINUS halfgrid))
                                         (Top (SUB1 grid))
                                         0))
                          ((MINUSP Y)
                           (IMINUS halfgrid))
                          (halfgrid]
    (COND
       ((REGIONP place)
        (create REGION
               LEFT _ (IDIFFERENCE (ITIMES (IQUOTIENT X grid)
                                           grid)
                              (LRSH (fetch (REGION WIDTH) of place)
                                    1))
               BOTTOM _ (IDIFFERENCE (ITIMES (IQUOTIENT Y grid)
                                             grid)
                                (LRSH (fetch (REGION HEIGHT) of place)
                                      1))
               WIDTH _ (fetch (REGION WIDTH) of place)
               HEIGHT _ (fetch (REGION HEIGHT) of place)))
       ((POSITIONP place)
        (create POSITION
               XCOORD _ (ITIMES (IQUOTIENT X grid)
                                grid)
               YCOORD _ (ITIMES (IQUOTIENT Y grid)
                                grid)))
       ((NUMBERP place)                          (* (IPLUS place (IDIFFERENCE (LRSH scale 1)
                                                 (REMAINDER (COND ((MINUSP place)
                                                 (SETQ place (IDIFFERENCE scale place)))
                                                 (place)) scale))))

        (ITIMES grid (IQUOTIENT [COND
                                   ((MINUSP place)
                                    (IDIFFERENCE place (LRSH grid 1)))
                                   (T (IPLUS place (LRSH grid 1]
                            grid])

(Method ((FIDBlockObject Install) self containingObject), W Mark 30-Aug-85 15 36
   "Specialization"
   (pushnew (@ containingObject %:steps)
          self)
   (_Super self Install containingObject))

(Method ((FIDBlockObject Link) self stream scale dest)   mcf 28 Jul 86 09 05
   "New method template"
   [LET (link linktype)
     (COND
        ([AND (NOT (FMEMB dest (@ %:successors)))
              (NOT (FMEMB dest (@ %:predecessors)]    (* links are bi-directional, so either way a connection exists)
         (SETQ linktype ($ FIDBlockLink))
         (push (@ %:successors)
               dest)
         (push (@ dest %:predecessors)
               self)
         (push (@ %:linkType)
               (SETQ link (_ linktype New)))
         (_@ link %:linkSource self)
         (_@ link %:linkDestination dest)

         (_ link DrawLink stream scale)])
```

```
(Method ((FIDBlockObject Moved) self)                 , mcf: 25-Jul-86 16:35
                                                      : Specialization
   "Clear cache on links"
   (_ self ClearLinkCache)
   (_ self ClearRegions)
   (_Super self Moved))
```

```
(Method ((FIDBlockObject RegionIntersectP) self region)
                                                        ; mcf 3-Sep-85 14.42
  "New method template"
  [OR (REGIONSINTERSECTP (@ %:region)
            region)
      (LET ((reg (@ %:labelRegion)))
        (AND reg (REGIONSINTERSECTP reg region])

(Method ((FIDBlockObject SetLabel) self label stream) . mcf: 5-Sep-85 12.33
  "give this object a label"
  (_ self EraseLabel stream)
  (_@ self %:label label)
  (_ self DrawLabel stream label))

(Method ((FOEBlockBrowser AddObject) self)              mcf: 10-Dec-86 10.40
  "Insert an object in the browser"
  [LET (PaletteItem Object xform region center objtitle msg timesW timesH scaleflg)
    (_@ self %:paletteItem NIL)
    (_ self GetWithPrompt "Select Palette item to Add")
    (COND
      ((AND (@ self %:paletteItem)
            (SETQ Object (_ (@ self %:paletteItem)
                            New))
            (_ Object PermissibleP 'Add))
       (SETQ xform (create FIDXform))
       (COND
         ([FIXP (SETQ timesW (MKATOM (_ self SWPromptForWord "Enter width scaling:")]
          (_@ Object %:timesW timesW)
          (replace TimesW of xform with timesW)
          (SETQ scaleflg T)))
                                   (* buggy with regard to connection points
                                   (COND ((FIXP (SETQ timesH (MKATOM
                                   (_ self FISPromptForWord "Enter height scaling ")))
                                   (_@ Object %.timesH timesH) (replace TimesH of xform with timesH)
                                   (SETQ scaleflg T))))
       (repeatuntil (SETQ objtitle (_ self SWPromptForWord "Enter object name:")))
       (_@ Object %:innerLabel objtitle)
       (_ Object Install (@ self %:object))
       [COND
         [(SETQ region (CAR (@ %:currentAttention)))
          (SETQ center (_ Object GetCenterFromTop region))
          (replace XTranslation of xform with (fetch (POSITION XCOORD) of center))
          (replace YTranslation of xform with (fetch (POSITION YCOORD) of center))
          (_ Object Draw (@ self %:window)
                 xform)
          (_@ self %:currentAttention (LIST (_ self GridJustify [fetch (POSITION XCOORD)
                                                      of (SETQ center (_ Object
                                                                          GetConnectPoint
                                                                          'Bottom)]
                                   (fetch (POSITION YCOORD) of center))))]
         (T (_ Object Draw (@ self %:window)
                    (AND scaleflg xform))]
       (_ self Insert Object)
       (_ self AdjustExtent (@ Object %:highlightRegion)))
      (T (_ self ClearSelections)])

(Method ((FOEBlockBrowser Browse) self context object)
                                                        . mcf: 23 Jul 86 16.21
  "Specialization"
  (_ self SetFont object (@ object %:progScale)
        (@ %:window))
  (_Super self Browse context object))
```

Page 12

```
(Method ((FOEBlockBrowser Delete) self item)            . mcf: 12-Aug-86 12.13
  "Specialization. Erase all links coming in to object and all links going out of object, and then delete
  (which erases) object"
  (_ self UnDrawLinks item 'Both)
  (for x in (OR (@ item %:subObjects)
                (LIST item))
     do (_ x DeLink 'Both (@ %:window)))
  (_Super self Delete item))

(Method ((FOEBlockBrowser ExplainFactorySystem) self)
                                                        . TAL 13 Oct-85 01 57
  "New method template"
  (PROMPTPRINT "Point to FCS or GF Cell and push the middle mouse button to see Observer
        facilities, or select Run to watch a simulation of the Factory System."))

(Method ((FOEBlockBrowser GetHorizMenuItems) self)
                                                        . TAL 14-Oct-85 00:55
  "Specialization"
  (LET ((menulst (_Super )))
    [COND
      ((NOT (@ %:localEditFlg))
       (SETQ menulst (_ self RemoveItemFromMenu menulst 'Edit)]
    [COND
      ((NOT FISDebugFlg)
       (SETQ menulst (_ self RemoveItemFromMenu menulst 'Scale)]
    menulst))
```

```
(Method ((FOEBlockBrowser GetPaletteItems) self fid)
                                                    mct 8-Sep-85 15:48
  "Specialization"
  (AND (@ %:localEditFlg)
       (_Super self GetPaletteItems fid)))

(Method ((FOEBlockBrowser LinkObject) self Source Dest)
                                                    mct: 28-Jul-86 16:17
  "link two objects together"
  [PROG (link (source Source)
              (destination Dest)
              (stream (@ self %:window))
              (scale (@ self |:object:progScale|)))
        (COND
          ([AND (OR (NOT source)
                    (NOT destination))
                (AND (SETQ source (_ self GetSelection "Select Source"))
                     (_ source PermissibleP 'Link))
                (AND (SETQ destination (_ self GetSelection "Select Destination"))
                     (_ destination PermissibleP 'Link)]
           (_ self DeSelect destination)
           (_ self ClearBoxHighLight)                (* blocks don't have directions)
           ))
        (COND
          ((AND source destination)
           (COND
             ((IGREATERP (fetch YCOORD of (@ destination %:center))
                         (fetch YCOORD of (@ source %:center)))
              (swap source destination)))
           (_ source Link stream scale destination)])

(Method ((FOEBlockBrowser LocateObject) self item key lst)
                                                    mct: 25-Jul-86 12:45
  "To be moved to FOEBrowser after testing"
  [PROG ((Key key)
         (Lst lst))
        [OR Key (SETQ Key (OR (AND (Object? item)
                                   'ID)
                              (AND (REGIONP item)
                                   'Region)
                              (AND (POSITIONP item)
                                   'Center]
        (OR Lst (SETQ Lst 'contentObjectLst))
        (RETURN (FID.LocateObjectLoop item Key (@ %:'\Lst)])
```

Page 10

```
(Method ((FOEBlockBrowser MoveIt) self item)        mct: 28-Jul-86 14:08
  "temporary Specialization"
  [PROG [[Item (OR item (CAR (@ %:selectionLst)]
         itemBM oldregion oldCenter newCenter (wregion (WINDOWPROP (@ %:window)
                                                                    'REGION]
        (COND
          (Item (SETQ oldregion (@ Item %:region))
                (SETQ oldCenter (@ Item %:center))
                (_ self Delete Item)
                [SETQ newCenter (_ self GetNewPosition Item (AND (@ Item %:groupObject)
                                                                 (@ Item |:groupObject:region|)))]
                (_ Item ClearRegions)
                (_@ Item %:center newCenter)
                (_@ Item %:dirty T)
                (_ Item Moved oldCenter newCenter)
                (_ self UnDelete Item)])

(Method ((FOEBlockBrowser RunFactorySystem) self)
                                                    TAL 13-Oct-85 00:44
  "New method template"
  (SELECTQ (@ |:context:specialBehavior|)
      (RunFactorySystem
          (_ self DeactivateOtherTopLevels)
          (_ (@ %:context)
             SpawnLinkedContext
             ($ RunFactorySystemContext)))
      NIL))

(Method ((FOEBlockBrowser SetFont) self object scale window)
                                                    mct: 24-Jul-86 16:47
  "New method template"
  (LET (font)
    (COND
      ([SETQ font (SELECTQ scale
                      ((2 4)
                        (_@ object %:quietFlg T)
                        NIL)
                      ((6 8 10 12 14 16)
                        (SETQ font (CDR (FASSOC scale GrafcetFontLst))))
                      (SETQ font (CDR (FASSOC 'OTHER GrafcetFontLst]
       (_@ object %:quietFlg NIL)
       (DSPFONT font window)))
    font))
```

```
(Method ((FOEMMFSBlockEditor AllowAttention) self AttnFlg)
                                                              mct 24-Jul-86 18:09
   "Specialization"
   self)

(Method ((FOEMMFSBlockEditor AutoLinkObjects) self ObjLst)
                                                              mct  2 Sep-86 11 38
   "New method template"
   (for p in ObjLst do (for lnk l in (_ self GetCorrespondents p) when (AND (SETQ l (_ self FindProcess lnk))
                                                                              (NEQ l p))
                       do (_ self LinkObject p l))))

(Method ((FOEMMFSBlockEditor BoxHighLight) self x y)
                                                              mct: 25-Jul-86 12.49
   "To be moved to FOEBrowser after testing"
   [AND (@ self %:boxFlg)
        (LET* [NewBoxHighLight BoxHighLight (window (@ self %:window))
                  (x (OR X (LASTMOUSEX window)))
                  (y (OR Y (LASTMOUSEY window]
          (SETQ BoxHighLight (@ self %:boxHighLight))
          (COND
             ([OR (NOT BoxHighLight)
                  (COND
                     ((OR (NOT (INSIDEP (@ BoxHighLight %:highlightRegion)
                                        x y))
                          (NEQ (SETQ NewBoxHighLight (_ self HighLightable? x y))
                               BoxHighLight))                 (* Erase any previous box)
                      (_ self DrawAreaBox (@ BoxHighLight %:highlightRegion)
                             (@ BoxHighLight %:highlightOn?))
                      (_@ self %:boxHighLight NIL)
                      T)
                     (NewBoxHighLight (SETQ NewBoxHighLight NIL]
              (COND
```

Page '-

```
                ((OR NewBoxHighLight (SETQ NewBoxHighLight (_ self HighLightable? x y)))
                                                (* Get region of any boxable item we might be over)
                 (_ self DrawAreaBox (@ NewBoxHighLight %:highlightRegion)
                        (@ NewBoxHighLight %:highlightOn?))
                 (_@ self %:boxHighLight NewBoxHighLight)])

(Method ((FOEMMFSBlockEditor Browse) self context object)
                                                              mct: 3-Nov-86 13:10
   "Specialization"
   [COND
      ((@ context %:layout?)
       (_@ object %:displayStream (@ %:window))
       (_ self Layout object (_ self SetFont object (@ object %:progScale)
                                            (@ %:window)))]
   (_Super self Browse context object)
   (COND
      ((@ context %:layout?)
       (_ self AutoLinkObjects (_ self CollectObjects))
       (_@ context %:layout? NIL))))

(Method ((FOEMMFSBlockEditor CollectObjects) self)
                                                              mct: 28-Jul 86 17:05
   "New method template"
   (for x in (@ %:contentObjectLst) join (OR (AND (@ x %:subObjects)
                                                  (COPY (@ x %:subObjects)))
                                             (LIST x))))

(Method ((FOEMMFSBlockEditor ConstructMiddleContextItems) self MiddleSubObject)
                                                              mct 22-Feb-88 14:33
                                                              Specialization
   "hack to prevent odd behavior when main program has been removed from beneath the communication window"
   (AND MiddleSubObject (@ MiddleSubObject %:grafcetProgram)
        (_Super self ConstructMiddleContextItems MiddleSubObject)))

(Method ((FOEMMFSBlockEditor ConstructTitle) self object browsername)
                                                              mct: 28 Jul-86 10 47
   "Specialization"
   (APPLY 'CONCAT (SUBST (OR (@ (OR object (@ self %:object))
                                %:keyname)
                             Nothing)
                         '*
                         (@ self |::PrintName|))))

(Method ((FOEMMFSBlockEditor Delete) self Item)   mct: 26-Jul-86 16 49
   "Specialization"
   (_Super self Delete Item)                          Temporarily, the editor doesn't see subObjects
   [COND
      ((@ Item %:groupObject)
       (_ Item Erase (@ %:window))])
```

```
(Method ((FOEMMFSBlockEditor ExitBrowser) self)   mct: 11 Aug-86 09 11
   "Specialization"
   (_@ |:object:rawExtent| NotSetValue)
   (_Super self ExitBrowser))

(Method ((FOEMMFSBlockEditor FindProcess) self Process Lst)
                                                                    mct: 28-Jul-86 16.03
   "New method template"
   [LET [(lst (OR Lst (@ %:contentObjectLst)]
     (for l in lst thereisval (OR (AND (EQ Process (@ l %:innerLabel))
                                        l)
                                   (AND (@ l %:subObjects)
                                        (_ self FindProcess Process (@ l %:subObjects))])

(Method ((FOEMMFSBlockEditor GetCorrespondents) self Item)
                                                                    mct: 3-Sep-86 13:03
   "New method template"
   [LET (name prg)
     (COND
        ((AND (SETQ name (@ Item %:innerLabel))
              (SETQ prg (@ Item %:grafcetProgram)))          (* (CDR (FASSOC name (OR CurrentCommAssocLst JLCallCommAssocLst
))
         (CDR (FASSOC name (_ prg BuildCommunicationLst (LIST prg))])
                                                                                     Page 15

(Method ((FOEMMFSBlockEditor Layout) self object font)
                                                                    mct 30-Jul-86 12:14
   "New method template"
   (LET (height width prs grps curpos gridSpec (incr (CHARWIDTH 87 font))
            (lf (FONTPROP font 'HEIGHT))
            (scale (@ object %:progScale)))
     (SETQ gridSpec (create REGION
                            LEFT _ 0
                            BOTTOM _ 0
                            WIDTH _ scale
                            HEIGHT _ scale))
     (SETQ height (TIMES lf 3))
     (SETQ curpos (create POSITION
                          XCOORD _ 0
                          YCOORD _ (TIMES lf 2)))
     [for p in (@ object %:subObjects) do (COND
                                             ((_ p InstOf 'FIDBlockGroup)
                                              (push grps p))
                                             (T (push prs p]
     (for p in prs do (SETQ width (STRINGWIDTH (@ p %:innerLabel)
                                               font))
                      (_@ p %:timesW (ADD1 (IQUOTIENT width (ITIMES scale 2))))
                      (AND (IGREATERP (IREMAINDER width (ITIMES scale 2))
                                      scale)
                           (add (@ p %:timesW)
                                1))
                      (replace XCOORD of curpos with (IPLUS (LEFTOFGRIDCOORD (MYGRIDXCOORD
                                                                               (IPLUS incr (LRSH width 1))
                                                                               gridSpec)
                                                                  gridSpec)
                                                              scale))
                      (_@ p %:center curpos)
                      (SETQ curpos (create POSITION
                                           YCOORD _ (BOTTOMOFGRIDCOORD (MYGRIDYCOORD (IPLUS height
                                                                                            (fetch YCOORD
                                                                                               of curpos))
                                                                                     gridSpec)
                                                                       gridSpec)
                                           using curpos)))
     (_ self LayoutGroups grps curpos height gridSpec font)))

(Method ((FOEMMFSBlockEditor LayoutGroup) self Group Curpos GridSpec Font)
                                                                    mct 30-Jul-86 12.15
   "New method template"
   (bind width (curpos _ Curpos)
        (scale _ (fetch WIDTH of GridSpec)) for p in (@ Group %:subObjects)
     do (SETQ width (STRINGWIDTH (@ p %:innerLabel)
                                 Font))
        (_@ p %:timesW (ADD1 (IQUOTIENT width (ITIMES scale 2))))
        (AND (IGREATERP (IREMAINDER width (ITIMES scale 2))
                        scale)
             (add (@ p %:timesW)
                  1))
        (replace XCOORD of curpos with (IPLUS (LEFTOFGRIDCOORD (MYGRIDXCOORD (IPLUS (fetch XCOORD
                                                                                       of curpos)
                                                                                    (fetch WIDTH
                                                                                       of GridSpec)
                                                                                    (LRSH width 1))
                                                                             GridSpec)
                                                               GridSpec)
                                              scale))
        (_@ p %:center curpos)
        (SETQ curpos (create POSITION
                             XCOORD _ (IPLUS (fetch XCOORD of curpos)
```

```
                                        (fetch WIDTH of GridSpec)
                                        width)
                       using curpos))
    finally (RETURN curpos)))
```

Method ((FOEMMFSBlockEditor LayoutGroups) self Groups Curpos Height GridSpec Font)
. mcf: 14-Jan-88 16.43

```
  "New method template"
  [SORT Groups (FUNCTION (LAMBDA (A B)
                          (LET [(LA (LENGTH (@ A %:subObjects)))
                                (LB (LENGTH (@ B %:subObjects))]
                            (COND
                               [(EQ LA LB)
                                (IGREATERP (for s in (@ A %:subObjects)
                                              sum (LENGTH (_ self GetCorrespondents s)))
                                           (for s in (@ B %:subObjects)
                                              sum (LENGTH (_ self GetCorrespondents s)]
                               ((IGREATERP LA LB]
  (bind lastGroup (curpos _ (create POSITION using Curpos))
        (icount _ 0)
        [maxcount _ (MAX 0 (for g in Groups maximize (LENGTH (@ g %:subObjects)] for grp in Groups
     when (@ grp %:subObjects) first (replace XCOORD of curpos with 0)
                                     (replace YCOORD of curpos
                                        with (BOTTOMOFGRIDCOORD (MYGRIDYCOORD (IPLUS Height
                                                                                     (fetch YCOORD
                                                                                        of curpos))
                                                                              GridSpec)
                                                                GridSpec))
     do [SETQ icount (IPLUS icount (LENGTH (@ grp %:subObjects)]
        [COND
           ((IGREATERP icount maxcount)
            (replace YCOORD of curpos with (BOTTOMOFGRIDCOORD (MYGRIDYCOORD (IPLUS (fetch YCOORD
                                                                                      of curpos)
                                                                                   (fetch HEIGHT
                                                                                      of (@ lastGroup
                                                                                            %:region))
                                                                                   (TIMES (fetch WIDTH
                                                                                             of GridSpec)
                                                                                          2))
                                                                            GridSpec)
                                                              GridSpec))
            (replace XCOORD of curpos with 0)
            (SETQ icount (LENGTH (@ grp %:subObjects)]
        (SETQ curpos (_ self LayoutGroup grp curpos GridSpec Font))
     repeateachtime (SETQ lastGroup grp)
          (SETQ curpos (create POSITION
                          XCOORD _ (LEFTOFGRIDCOORD (MYGRIDXCOORD (IPLUS (fetch RIGHT
                                                                            of (@ grp %:region))
                                                                         (TIMES (fetch WIDTH
                                                                                   of GridSpec)
                                                                                2))
                                                                  GridSpec)
                                                    GridSpec)
                          using curpos))))
```

(Method ((FOEMMFSBlockEditor MMFSTrace) self) . Edited 16-Aug-88 17 50 by TAL
. mcf: 18-Dec-86 12 34

```
  "Set up a filter for intercepting MMFS messages to trace"
  [LET (direction src srcProg srcName filter oldFilter corres title grp (window (@ self window)))
    (RESETLST
       [RESETSAVE (GETPROMPTWINDOW window 1 FISPromptWindowFont)
              '(PROGN (CLEARW OLDVALUE)
                      (CLOSEW OLDVALUE]
       (_ self SWPromptPrint "Select process for message tracing")
       (SETQ src (_ self FindSelectedSubObject window)))
    (COND
       (src (SETQ srcProg (_ (@ src grafcetProgram)
                              MainProgram))
            [COND
               ((SETQ title (@ src innerLabel))
                (SETQ srcName (CONS title)))
               ((AND (SETQ grp src)
                     (SETQ src (@ src subObjects)))
                (SETQ srcName (for s in src collect (@ s innerLabel)))
                (SETQ srcName (SORT (FISMultiSelGetSelections srcName 'Select Processes')))
                (COND
                   [srcName (SETQ src (for s in src when (FMEMB (@ s innerLabel)
                                                                srcName)
                                         collect s))
                            (SETQ title (COND
                                           [(CDR srcName)
                                            (CONCAT (OR (@ grp label)
                                                        Nothing)
                                                    (COND
                                                       ((ILESSP (LENGTH srcName)
                                                                (LENGTH (@ grp subObjects)))
```

```
                                        " Sub-Group")
                                      (T " Group"]
                                (T (CAR srcName]
                (T (SETQ src NIL]
        (COND
           (src (SETQ corres (for x inside src join (_ self GetCorrespondents x)))
                (SETQ corres (INTERSECTION corres corres))
                [COND
                   ((CDR corres)
                    (SETQ corres (SORT (FISMultiSelGetSelections corres 'Correspondents]
                (COND
                   (corres (SETQ direction
                             (OR [MENU (OR (@ self directionMenu)
                                           (_@ self directionMenu
                                               (create MENU
                                                       ITEMS _ (@ self DirectionMenuItems)
                                                       CENTERFLG _ T
                                                       CHANGEOFFSETFLG _ T
                                                       TITLE _ 'Direction))]
                                 'either))
                           (SETQ filter (_ ($ MMFSTraceFilter)
                                           New))
                           (_@ filter traceName title)
                           (COND
                              ((NEQ corres 'all)
                               (_@ filter correspondent corres)))
                           (_@ filter %:!\direction srcName)
                           (_@ filter filterProgs (LIST (CONS srcProg srcName)))
                           (COND
                              ((SETQ oldFilter (_ MapNetwork FindTraceFilter filter))
                               (_ (@ oldFilter traceBrowser)
                                  FlashBrowser))
                              (T (_ (@ self context)
                                    SpawnLinkedContext
                                    ($ MMFSTraceContext)
                                    filter)]])
```

(Method ((FOEMMFSBlockEditor UnDelete) self item)
mcf 3-Nov-86 15 24

```
   "Specialization"
   (_Super self UnDelete item T)
   (_ self AutoLinkObjects (_ self CollectObjects)))
```

(Method ((FOEMMFSBlockEditor UnDrawLinks) self item LinkSwitch)
mcf 31-Jul-86 14 21

```
   "Specialization"
   (LET (subs)
     (AND (SETQ subs (@ item %:subObjects))
          (for sub in subs do (_Super self UnDrawLinks sub LinkSwitch T)))
     (_Super self UnDrawLinks item LinkSwitch)))

(\UnbatchMethodDefs)

(DEFINEQ
```

(AddMenuCursorOutFn
(* mct% "18-Dec-86 10.11")

```
  [LAMBDA (W)
    (until (LASTMOUSESTATE (OR LEFT MIDDLE RIGHT)) do (GETMOUSESTATE))
    (COND
       ((INSIDEP (WINDOWPROP W 'REGION)
                 LASTMOUSEX LASTMOUSEY)
        (MENUBUTTONFN W))
       (T (APPLY* [fetch WHENSELECTEDFN of (CAR (WINDOWPROP W 'MENU]
                  'done
                  (CAR (WINDOWPROP W 'MENU))
                  'LEFT])
```

(CreateBlockFOE
Edited 10-May-88 17 33 by loops

```
  [LAMBDA (GrafcetMainProgram DontInsistOnNameFlg)
    (LET [(prog (OR GrafcetMainProgram (_ ($ BlockProgram)
                                          New)]
      [COND
         ((AND (NULL DontInsistOnNameFlg)
               (NULL (@ prog %:name)))
          (bind n do (SETQ n (MKATOM (PROMPTFORWORD "Program name: ")))
             repeatuntil (AND n (NOT ($! n))) finally (_ prog SetName n)]
      (StartTopLevelContext ($ EditBlockComContext)
             prog])
```

(EditBlockMain
Edited 10-May-88 17.32 by loops

```
  [LAMBDA (BlockProgramName Type)
    (LET (prog)
      [SETQ BlockProgramName (OR BlockProgramName (MKATOM (PROMPTFORWORD "Program name: "]
      (COND
         ((SETQ prog (SWDereferenceName BlockProgramName))
          (OR (_ prog InstOf! 'BlockProgram)
              (ERROR BlockProgramName "is not a block program")))
         (T (SETQ prog (_ (SELECTQ Type
```

```
                (Com ($ BlockComProgram))
                (Control ($ BlockControlProgram))
                ((top Top TOP MMFS MMFSEdit)
                     ($ BlockMMFSCom))
                (HELP "Types are Com, Control, & MMFS."))
             New))
       (_ prog NameObject BlockProgramName)))
  (_Proto ($ DefaultContext)
          SpawnLinkedContext
          (SELECTQ Type
               (Com ($ EditBlockComContext))
               (Control ($ EditBlockProgContext))
               (MMFS ($ EditBlockMMFSCom))
               (MMFSEdit ($ EditBlockEditMMFSCom))
               ((top Top TOP)
                    ($ EditBlockContext))
               (HELP "Types are Com, Control, & MMFS."))
          prog)])
```

(FID.LocateObjectLoop

```
  [LAMBDA (item key lst)                                    (* mcf%: "25-Jul-86 13.21")
    (AND item key lst (COND
                         [(bind lst1 val for obj in lst thereisval (AND (SETQ lst1 (@ obj %:subObjects))
                                                                        (FID.LocateObjectLoop item key lst1]
                         (T (for obj in lst thereis (SELECTQ key
                                                         ((ID id)
                                                              (EQ obj item))
                                                         ((Region region)
                                                              (EQUAL (@ obj %:region)
                                                                     item))
                                                         ((Center center)
                                                              (EQUAL (@ obj %:center)
                                                                     item))
                                                         ((Intersect intersect)
                                                              (REGIONSINTERSECTP (@ obj %:region)
                                                                     item))
                                                         ((Inside inside)
                                                              (INSIDEP (@ obj %:region)
                                                                     item))
                                                         NIL])
```

(FISMultiSelGetSelections

```
  [LAMBDA (Items Title)                                     (* mcf%: "18-Dec-86 11 25")
    (LET (mw mwe res)
      (GETMOUSESTATE)
      [SETQ mw (ADDMENU (create MENU
                                ITEMS _ [APPEND Items '((All all]
                                TITLE _ Title
                                CENTERFLG _ T
                                WHENSELECTEDFN _ (FUNCTION MultiSelWhenSelectedFn))
                        NIL
                        (create POSITION
                                XCOORD _ (IDIFFERENCE LASTMOUSEX 50)
                                YCOORD _ (IDIFFERENCE LASTMOUSEY 25]
      (WINDOWPROP mw 'CURSOROUTFN (FUNCTION AddMenuCursorOutFn))
      [WINDOWPROP mw 'DoneEvent (SETQ mwe (CREATE.EVENT 'MultiDone]
      (CURSORPOSITION '(50 . 25)
             mw)
```

```
      (AWAIT.EVENT mwe)
      (SETQ res (WINDOWPROP mw 'Selections))
      (AND (EQ res 'all)
           (SETQ res Items))
      res])
```

(FindAllMMFSProcesses

```
  [LAMBDA (MacProgLst)                                      (* mcf%: "17-Sep-87 16:17")
    (bind sLst rLst for mp in MacProgLst when (PROGN (SETQ sLst (@ mp %:receiveStepAList))
                                                    (SETQ rLst (@ mp %:sendStepAList))
                                                    (OR sLst rLst))
       join (for x in (bind lst for p in (APPEND sLst rLst) do (pushnew lst (CAR p)) yield lst)
               collect (CONS (_ mp GetName)
                             x])
```

(MultiSelWhenSelectedFn

```
  [LAMBDA (Item Menu Key)                                   (* mcf%: "18-Dec-86 11 48")
    (LET (event sel oldsels (w (WFROMMENU Menu)))
      (COND
         ((FMEMB (SETQ sel (COND
                              ((LISTP Item)
                               (CADR Item))
                              (T Item)))
                 '(all abort done))
          (SELECTQ sel
               (all (WINDOWPROP w 'Selections sel))
               (abort (WINDOWPROP w 'Selections NIL))
               NIL)
          (AND (SETQ event (WINDOWPROP w 'DoneEvent))
               (NOTIFY.EVENT event))
```

```
        (WINDOWPROP w 'CURSOROUTFN NIL)
        (CLOSEW w))
      (sel (SETQ oldsels (WINDOWPROP w 'Selections))
           (COND
              ((FMEMB sel oldsels)
               (SETQ oldsels (DREMOVE sel oldsels)))
              (T (push oldsels sel)))
           (WINDOWPROP w 'Selections oldsels)
           (FLIPREGION w (MENUITEMREGION Item Menu])

)

(PUTPROPS FIDBLOCK FILETYPE :FAKE-COMPILE-FILE)

(PUTPROPS FIDBLOCK COPYRIGHT ("Savoir, Inc." 1985 1986 1987 1988))
```

FUNCTION INDEX abort_step.CFN ..................8
CR.SetupStaticQ ..................2
CVAR.REFQ ..................2
CVAR.SETQ ..................2
FISAbortCompile ..................2
FISCompileAll ..................4
FISCompileError ..................4
FISCompileMsg ..................5
FISGetCompileErrorStream ........5
FISStaticAnalysisFromDetail .....3
GetGlobalDeviceStream.CFN .......3
GetGlobalTraceStream.CFN ........3
map_associate.CFN ..................5
map_connected.CFN ..................5
map_deregister.CFN ..................6
map_failed.CFN ..................6
map_opened.CFN ..................6
map_rcvqueExpander ..................7
map_receiveExpander ..................7
map_register.CFN ..................6
map_registered.CFN ..................6
map_registration.CFN ............6
map_registration_failed.CFN .....6
map_release.CFN ..................6
map_respond.CFN ..................5
map_sendExpander ..................8
MMFS.CAnalyze.mmfs_send .........8
mmfs_sendExpander ..................8
\MAPRcvque.CFN ..................7
\MAPReceive.CFN ..................7
\MAPSend.CFN ..................7

MACRO INDEX

CVAR.REF ...............2
CVAR.REFQ ..............2
CVAR.SET ...............2
CVAR.SETQ ..............2
FISInAnalysis? .........2
FISInDetailedAnalysis? .2
flx_dtrace.CFN .........4
flx_fprintf.CFN ........3
flx_fputs.CFN ..........3
flx_printf.CFN .........3
flx_puts.CFN ...........3
flx_trace.CFN ..........3
map_rcvque.CFN .........6
map_receive.CFN ........6
map_send.CFN ...........6
mmfs_send.CFN ..........8

VARIABLE INDEX

CC.Typedefs .....................1
FISCC.GlobalDeviceStream ........3
FISCC.GlobalTraceStream .........3
FISCompileErrorStream ...........5
FISCompileMsgRegion .............5
FISCompileProcess ...............5
FISNullOutputStream .............3

TEMPLATE INDEX

CVAR.REFQ .......................2
CVAR.SETQ .......................2

PROPERTY INDEX

FISCC .........................1,9 changes to: (FNS \MAPSend.CFN map_respond.CFN)
(VARS FISCCCOMS)

previous date: 24-Jun-88 11:03:14 (POGO:AISNORTH:XEROX)<LIPKIS>FIS>FISCC.;34

Read Table: INTERLISP

Package: IL

; Copyright (c) 1986, 1987, 1987, 1988 by Savoir, Inc.. All rights reserved.

```
(RPAQQ FISCCCOMS
       [(DECLARE%: DONTCOPY (PROP MAKEFILE-ENVIRONMENT FISCC))
        [VARS (CC.Typedefs '((bool . char)
                             (character . char]
        (MACROS CVAR.REF CVAR.REFQ CVAR.SET CVAR.SETQ FISInAnalysis? FISInDetailedAnalysis?)
        (TEMPLATES CVAR.REFQ CVAR.SETQ)
        (FILES (FROM CC)
               CC)
                                        ; C accessor fns to avoid macro expansion when interpreting
        (FNS CR.SetupStaticQ CVAR.REFQ CVAR.SETQ FISAbortCompile FISStaticAnalysisFromDetail)
        (COMS
                                        ; FLEXIS C library
              (MACROS flx_printf.CFN flx_fprintf.CFN flx_puts.CFN flx_fputs.CFN))
```

```
(COMS  . Move to FIS and del from FISCOMBINE
      [INITVARS (FISNullOutputStream (OPENSTREAM '(NULL) 'OUTPUT]
      (P (PUTSTREAMPROP FISNullOutputStream 'NULLDEVICE T)
         (PUTSTREAMPROP FISNullOutputStream 'NoUserClose T)))
(COMS  .. C interface to trace streams
      (INITVARS (FISCC.GlobalTraceStream (CR.CreateStreamCPtr FISNullOutputStream))
            (FISCC.GlobalDeviceStream (CR.CreateStreamCPtr FISNullOutputStream)))
      (FNS GetGlobalDeviceStream.CFN GetGlobalTraceStream.CFN)
      (MACROS flx_trace.CFN flx_dtrace.CFN))
[COMS  .. C compile and error handling
      (FNS FISCompileAll FISCompileError FISCompileMsg FISGetCompileErrorStream)
      (INITVARS (FISCompileProcess NIL)
            (FISCompileErrorStream NIL))
      (VARS (FISCompileMsgRegion '(18 0 500 300]
(COMS  .. C callable interface to MapNetwork
      (FNS map_associate.CFN map_respond.CFN map_connected.CFN map_deregister.CFN map_failed.CFN
           map_opened.CFN map_register.CFN map_release.CFN map_registered.CFN map_registration.CFN
           map_registration_failed.CFN)
      (MACROS map_rcvque.CFN map_receive.CFN map_send.CFN)
      (FNS \MAPReceive.CFN \MAPRcvque.CFN \MAPSend.CFN map_rcvqueExpander map_receiveExpander
           map_sendExpander)
      (GLOBALVARS MapNetwork))
[COMS  .. mmfs send macros, analysis
      (MACROS mmfs_send.CFN)
      (FNS mmfs_sendExpander MMFS.CAnalyze.mmfs_send)
      (P (CC.SetTemplate 'mmfs_send NIL NIL 'MMFS.CAnalyze.mmfs_send]
[COMS  .; Special simulation fns
      (FNS abort_step.CFN)
      (P                                              . Temporary until old progs changed
         (MOVD? 'abort_step.CFN 'abort_process.CFN]
[P (SETQ CLISPCHARRAY (MAKEBITTABLE (DREMOVE '_ CLISPCHARS]
(PROP FILETYPE FISCC)
(DECLARE%: DONTEVAL@LOAD DOEVAL@COMPILE DONTCOPY COMPILERVARS (ADDVARS (NLAMA)
                                                                      (NLAML CVAR.SETQ CVAR.REFQ
                                                                             CR.SetupStaticQ)
                                                                      (LAMA])

(DECLARE%: DONTCOPY

(PUTPROPS FISCC MAKEFILE-ENVIRONMENT (:PACKAGE "IL" :READTABLE "INTERLISP" :BASE 10))
)

(RPAQQ CC.Typedefs ((bool . char)
                    (character . char)))

DECLARE%: EVAL@COMPILE
```

```
(PUTPROPS CVAR.REF MACRO ((Var StateVariables)
                          (GETHASH Var (OR StateVariables /stateVariables\))))

(PUTPROPS CVAR.REFQ MACRO ((Var)
                           (GETHASH 'Var /stateVariables\)))

(PUTPROPS CVAR.SET MACRO ((Var Value StateVariables)
                          (PUTHASH Var Value (OR StateVariables /stateVariables\))))

(PUTPROPS CVAR.SETQ MACRO ((Var Value)
                           (PUTHASH 'Var Value /stateVariables\)))

(PUTPROPS FISInAnalysis? MACRO [OPENLAMBDA (item access analysis)
                                      (for x inside access thereis (FMEMB item (CDR (FASSOC x analysis])

(PUTPROPS FISInDetailedAnalysis? MACRO [OPENLAMBDA (item access detailedAnalysis)
                                              (COND
                                                 [(LISTP access)
                                                  (for x inside access
                                                     join (APPEND (CDR (FASSOC item (CDR (FASSOC x
                                                                                                  detailedAnalysis
                                                                                                  ]
                                                 (T (CDR (FASSOC item (CDR (FASSOC access detailedAnalysis])
)

(SETTEMPLATE 'CVAR.REFQ '(EVAL . PPE))

(SETTEMPLATE 'CVAR.SETQ '(SET EVAL . PPE))

(FILESLOAD (FROM CC)
       CC)

. C accessor fns to avoid macro expansion when interpreting

(DEFINEQ
```

(CR.SetupStaticQ

```
  [NLAMBDA (\Var\ \Value\)                                          (* TAL " 9-Aug-86 23.21")

          (* * For use ONLY under EvaluateLispProgramObject, which binds /stateVariables\)

    (DECLARE (USEDFREE /stateVariables\))
    (PUTHASH \Var\ (EVAL \Value\)
           /stateVariables\])
```

(CVAR.REFQ

```
  [NLAMBDA (\Var\)                                                  (* TAL "18-Mar-86 14 02")

          (* * For use ONLY under EvaluateLispProgramObject, which binds /stateVariables\)

    (DECLARE (USEDFREE /stateVariables\))
    (GETHASH \Var\ /stateVariables\])
```

(CVAR.SETQ

```
  [NLAMBDA (\Var\ \Value\)                                          (* TAL " 9-Aug-86 23.21")

          (* * For use ONLY under EvaluateLispProgramObject, which binds /stateVariables\)

    (DECLARE (USEDFREE /stateVariables\))
    (PUTHASH \Var\ (EVAL \Value\)
           /stateVariables\])
```

(FISAbortCompile

```
  [LAMBDA NIL
    (DECLARE (GLOBALVARS FISCompileProcess FISDocumentProcess \FISDocumentationUninterruptable
                    \FISInterruptDocumentation))                       (* mct%. " 3 Mar 87 13 15")
    (LET (Abort)
      (FLASHWINDOW)
      (UNINTERRUPTABLY
          [COND
            ((PROCESSP FISCompileProcess)
             (SETQ Abort T)
             (COND
               [(MOUSECONFIRM "Abort compilation in progress?" "Click left to confirm, otherwise click
                       right." PROMPTWINDOW)
                (COND
                  ((EQ FISCompileProcess (THIS.PROCESS))
                   (RESET))
```

Page 3

```
                  (T (PROCESS.APPLY FISCompileProcess (FUNCTION RESET]
               (T (printout PROMPTWINDOW .TAB0 0 "Not aborted."]
        [COND
          ((PROCESSP FISDocumentProcess)
           (SETQ Abort T)
           (COND
             [(MOUSECONFIRM "Abort documentation in progress?" "Click left to confirm, otherwise click
                     right." PROMPTWINDOW)
              (COND
                ((AND \FISDocumentationUninterruptable)
                 (SETQ \FISInterruptDocumentation T))
                ((EQ FISDocumentProcess (THIS.PROCESS))
                 (RESET))
                (T (PROCESS.APPLY FISDocumentProcess (FUNCTION RESET]
             (T (printout PROMPTWINDOW .TAB0 0 "Not aborted."]
        (COND
          ((NOT Abort)                                      (* (printout PROMPTWINDOW TAB0 0 'No compilation in progress --
                                                            can't abort!"))
           (printout PROMPTWINDOW .TAB0 0 "No compilation or documentation in progress -- can't abort!"))))
      ])
```

(FISStaticAnalysisFromDetail

```
  [LAMBDA (detailedAnalysis)                                        (* TAL "15-Nov-87 16:33")
    (DECLARE (LOCALVARS . T))
    (for accessLst in detailedAnalysis collect (CONS (CAR accessLst)
                                                     (for nameLst in (CDR accessLst)
                                                        collect (CAR nameLst])

)
```

.. FLEXIS C library

```
(DECLARE%: EVAL@COMPILE

(PUTPROPS flx_printf.CFN MACRO (= . fprintf.CFN))

(PUTPROPS flx_fprintf.CFN MACRO (= . fprintf.CFN))

(PUTPROPS flx_puts.CFN MACRO (= . fputs.CFN))

(PUTPROPS flx_fputs.CFN MACRO (= . fputs.CFN))
)
```

Move to FIS and del from FISCOMBINE

```
(RPAQ? FISNullOutputStream (OPENSTREAM '{NULL} 'OUTPUT))

(PUTSTREAMPROP FISNullOutputStream 'NULLDEVICE T)

(PUTSTREAMPROP FISNullOutputStream 'NoUserClose T)

; C interface to trace streams

(RPAQ? FISCC.GlobalTraceStream (CR.CreateStreamCPtr FISNullOutputStream))

(RPAQ? FISCC.GlobalDeviceStream (CR.CreateStreamCPtr FISNullOutputStream))

(DEFINEQ

(GetGlobalDeviceStream.CFN
  [LAMBDA NIL
    (DECLARE (GLOBALVARS FISCC.GlobalDeviceStream))          (* TAL "27-Mar-88 16:25")
    FISCC.GlobalDeviceStream])

(GetGlobalTraceStream.CFN
  [LAMBDA NIL
    (DECLARE (GLOBALVARS FISCC.GlobalTraceStream))           (* TAL "27-Mar-88 16:26")
    FISCC.GlobalTraceStream])
)

(DECLARE%: EVAL@COMPILE

(PUTPROPS flx_trace.CFN MACRO ((control . args)
                               (fprintf.CFN (GetGlobalTraceStream.CFN)
                                      control . args)))
```

Page 2

```
(PUTPROPS flx_dtrace.CFN MACRO ((control . args)
                                (fprintf.CFN (GetGlobalDeviceStream.CFN)
                                       control . args)))
)

;; C compile and error handling

(DEFINEQ

(FISCompileAll
  [LAMBDA (grafProg noCacheFlush)                            (* TAL "20-Oct-87 12:57")
    (LET ((CC.ErrorStream (FUNCTION FISCompileError)))
      (DECLARE (SPECVARS CC.ErrorStream)
             (GLOBALVARS FISCompileProcess))
      (RESETLST
          (RESETSAVE (CURSOR WAITINGCURSOR))
          [RESETSAVE NIL (LIST (FUNCTION (LAMBDA NIL
                                           (SELECTQ RESETSTATE
                                                ((NIL HARDRESET)
                                                     NIL)
                                                (FISCompileMsg (CONCAT "--- Compilation Aborted" " at "
                                                                      (DATE (DATEFORMAT NO.DATE))
                                                                      FISTwoCR FISOneCR]
          (RESETSAVE FISCompileProcess (THIS.PROCESS))
          (RESETSAVE (RESET.INTERRUPTS FISInterrupts T))
          (FISCompileMsg (CONCAT "--- Compiling " (@ grafProg %:printName)
                                " started at "
                                (DATE (DATEFORMAT NO.DATE))
                                FISTwoCR))
          (OR noCacheFlush (_ grafProg CacheFlush!))
          (_ grafProg Compile!)
          (FISCompileMsg (CONCAT "--- Finished " (@ grafProg %:printName)
                                " at "
                                (DATE (DATEFORMAT NO.DATE))
                                FISTwoCR FISOneCR)))])

(FISCompileError
  [LAMBDA (file line m1 m2 m3)                               (* TAL "10-May-87 16:43")
    (DECLARE (USEDFREE FISCompilingObject FISCompilingContainer))
    (LET ((obj FISCompilingObject)
          (fileLine (COND
                      [(AND file (OR (STRINGP file)
                                     (LITATOM file)))
                       (COND
                         (line (CONCAT " near line " line " of " file))
                         (T (CONCAT " (" file ")"]
                      (line (CONCAT " near line " line))
                      (T "")))
          descrip)
      [SETQ descrip (COND
                      ((_ obj InstOf! 'CProgram)
                       (LIST (@ obj %:printName)
                             fileLine))
                      ((_ obj InstOf! 'GrafcetProgram)
                       (LIST (@ obj %:printName)
                             " declarations" fileLine))
```

```
((_ obj InstOf! 'GrafcetTransition)
 (LIST (@ obj |:superObject:printName|)
       " transition: "
       (@ obj %:label)))
[(_ obj InstOf! 'MMFSMessageDefinition)
 (LET ((caller (AND (BOUNDP 'FISCompilingContainer)
                    FISCompilingContainer
                    (@ FISCompilingContainer %:caller)))
       supName)
   (COND
      ((AND caller (SETQ supName (@ caller %:superObject))
            (SETQ supName (@ supName %:printName)))
       (LIST (@ caller %:label)
             (COND
                ((_ obj InstOf! 'MMFSSendableMessageDefinition)
                 " send template in ")
                (T " receive template in "))
             supName ": " (@ obj %:data)))
      (T (LIST "message template: " (@ obj %:data)]
((_ obj InstOf! 'MMFSMessageDefinitionFolder)
 (LET ((caller (@ obj %:caller)))
   (COND
      (caller (LIST (@ caller %:label)
                    " defaults"))
```

```
                    (T (LIST "default send field"]
   (push descrip "Error in ")
   (NCONC1 descrip FISOneCR)
   (NCONC1 descrip "   ")
   (NCONC1 descrip m1)
   [COND
      (m2 (NCONC1 descrip " ")
          (NCONC1 descrip m2)
          (COND
             (m3 (NCONC1 descrip " ")
                 (NCONC1 descrip m3]
   (NCONC1 descrip FISTwoCR)
   (FISCompileMsg (CONCATLIST descrip))
   (ERROR!])
```

(FISCompileMsg

```
  [LAMBDA (string)                                          (* TAL " 4-Sep-86 16:15")
    (LET ((stream (FISGetCompileErrorStream)))
      (TEDIT.INSERT stream string)
      (TEDIT.SHOWSEL stream NIL])
```

(FISGetCompileErrorStream

```
  [LAMBDA NIL                                               (* TAL "27-Mar-88 17:44")
    (DECLARE (GLOBALVARS FISCompileErrorStream))
    (COND
       ([AND FISCompileErrorStream (STREAMP FISCompileErrorStream)
             (NOT (GETSTREAMPROP FISCompileErrorStream 'NULLDEVICE]
        FISCompileErrorStream)
       (T (SETQ FISCompileErrorStream (FISCreateTraceWindow FISCompileMsgRegion "Compile Messages"
                                             [FUNCTION (LAMBDA (w)
                                                          (DECLARE (GLOBALVARS FISCompileErrorStream))
                                                          (SETQ FISCompileErrorStream NIL]
                                             'TEDIT])
)

(RPAQ? FISCompileProcess NIL)

(RPAQ? FISCompileErrorStream NIL)

(RPAQQ FISCompileMsgRegion (18 0 500 300))
```

C callable interface to MapNetwork

```
(DEFINEQ
```

(map_associate.CFN

```
  [LAMBDA (LocalName RemoteName ApplContext)                (* TAL "11-Oct-86 16:46")
    (COND
       ((NULL MapNetwork)
        0)
       (T (_ MapNetwork MapAssociate (CR.LispString LocalName)
                 (CR.LispString RemoteName)
                 (COND
                    (ApplContext (CR.LispString ApplContext)))
                 T)])
```

(map_respond.CFN

```
  [LAMBDA (LocalName RemoteName ApplContext)
    (COND
       ((NULL MapNetwork)
        0)
```

```
(T (_ MapNetwork MapRespond (CR.LispString LocalName)
            (CR.LispString RemoteName)
            (COND
               (ApplContext (CR.LispString ApplContext)))
            T)])
```

(map_connected.CFN

```
[LAMBDA (Conn)                                        (* TAL "13-Oct-86 16:15")
  (map_opened.CFN
   Conn])
```

(map_deregister.CFN

```
[LAMBDA (Name)                                        (* TAL "10-Oct-86 16:52")
  [COND
     (MapNetwork (_ MapNetwork MapDeRegister (CR.LispString Name))]
  0])
```

(map_failed.CFN

```
[LAMBDA (Conn)                                        (* TAL "13-Oct-86 15:28")
  (COND
     ((OR (NOT MapNetwork)
          (LESSP (_ MapNetwork MapConnected? Conn)
                 0))
      1)
     (T 0])
```

(map_opened.CFN

```
[LAMBDA (Conn)                                        (* TAL "13-Oct-86 15:27")
  (COND
     ((AND MapNetwork (GREATERP (_ MapNetwork MapConnected? Conn)
                                0))
      1)
     (T 0])
```

(map_register.CFN

```
[LAMBDA (Name)                                        (* mcf%: "23-Oct-86 12:48")
  (DECLARE (USEDFREE /step\))
  (COND
     (MapNetwork (_ MapNetwork MapRegister (CR.LispString Name)
                            (AND (BOUNDP '/step\)
                                 (ObjectExists? /step\)
                                 (@ /step\ |:superObject:mainProgram|))
                            T)))
  0])
```

(map_release.CFN

```
[LAMBDA (Conn)                                        (* TAL "13-Oct-86 15:24")
  (COND
     (MapNetwork (_ MapNetwork MapRelease Conn T)])
```

(map_registered.CFN

```
[LAMBDA (Name)                                        (* mcf%: "23-Oct-86 16:05")
  (COND
     ((AND MapNetwork (GREATERP (_ MapNetwork MapRegistered? (MKATOM (CR.LispString Name)))
                                0)
           1))
     (T 0])
```

(map_registration.CFN

```
[LAMBDA (Name)                                        (* mcf%: "23-Oct-86 16:05")
  (COND
     [(AND MapNetwork (_ MapNetwork MapRegistered? (MKATOM (CR.LispString Name)))]
     (T -1])
```

(map_registration_failed.CFN

```
[LAMBDA (Name)                                        (* mcf%: "23-Oct-86 16:05")
  (COND
     ((OR (NOT MapNetwork)
          (LESSP (_ MapNetwork MapRegistered? (MKATOM (CR.LispString Name)))
                 0))
      1)
     (T 0])
)
(DECLARE%: EVAL@COMPILE

(PUTPROPS map_rcvque.CFN MACRO (X (map_rcvqueExpander
                                   X)))

(PUTPROPS map_receive.CFN MACRO (X (map_receiveExpander
                                    X)))

(PUTPROPS map_send.CFN MACRO (X (map_sendExpander
                                 X)))
)
```

```
(DEFINEQ

(\MAPReceive.CFN
  [LAMBDA (mapConnection src dst buf len)                          (* TAL "10-Sep-87 15:55")
    (DECLARE (USEDFREE /step\))

          (* Copy contents of first msg on dst receive queue into CPointer buf, remove msg from queue, and return length of data.
          Returns -1 if no msgs on queue.)

    (LET ((msg (_ MapNetwork GetMessage dst /step\ src)))
      (COND
         ((NULL msg)
          -1)
         (T (CR.StoreString buf (@ msg %:rawData)
                   len T])

(\MAPRcvque.CFN
  [LAMBDA (mapConnection dst src)                                  (* TAL "10-Sep-87 15.14")
    (COND
       ((_ MapNetwork MsgWaiting? dst src)
        1)
       (T 0])

(\MAPSend.CFN
  [LAMBDA (mapConnection src dst buf len)                          Edited 24-Jun-88 10.46 by
    (DECLARE (USEDFREE /step\))

          (* Called by expansion of map_send.CFN macro. buf is a CPointer to the bytes to send.)

    (LET ((msg (_ (DEFERREDCONSTANT ($ MapMessage))
                  New)))
      (_@ msg %:rawData (CR.LispString buf len T))
      (_@ msg %:sender /step\)
      (_@ msg %:source src)
      (_@ msg %:destination dst)
      (_ MapNetwork SendMessage msg mapConnection)])

(map_rcvqueExpander
  [LAMBDA (args)                                                   Edited 9-Jun-88 14 21 by mcf
    (LET ((connectionArg (CAR args))
          local remote connectionVar pos)
      [COND
         [(AND (match connectionArg with (%'CR.Static & connectionVar_&@LITATOM))
               (SETQ pos (STRPOS '_ connectionVar))
               (SETQ local (SUBATOM connectionVar 1 (SUB1 pos)))
               (SETQ remote (SUBATOM connectionVar (ADD1 pos)
                                    -1]
         (T (MMFS.ParseError "Illegal arg to map_rcvque" (OR connectionVar connectionArg]
      '(\MAPRcvque.CFN ,connectionArg ,(KWOTE local)
              ,(KWOTE remote)])

(map_receiveExpander
  [LAMBDA (args)                                                   Edited 9-Jun-88 14 22 by mcf
    (LET ((connectionArg (CAR args))
          (buf (CADR args))
          (buflen (CADDR args))
          local remote connectionVar pos)
      [COND
         [(AND (match connectionArg with (%'CR.Static & connectionVar_&@LITATOM))
               (SETQ pos (STRPOS '_ connectionVar))
               (SETQ local (SUBATOM connectionVar 1 (SUB1 pos)))
               (SETQ remote (SUBATOM connectionVar (ADD1 pos)
                                    -1]
         (T (MMFS.ParseError "Illegal arg to map_receive" (OR connectionVar connectionArg]
      '(\MAPReceive.CFN ,connectionArg ,(KWOTE remote)
              ,(KWOTE local)
              ,buf
              ,buflen])
```

```
(map_sendExpander
  [LAMBDA (args)                                                   Edited 9-Jun-88 14 23 by mcf
    (LET ((connectionArg (CAR args))
          (buf (CADR args))
          (len (CADDR args))
          src dst connectionVar pos)
      [COND
         [(AND (match connectionArg with (%'CR.Static & connectionVar_&@LITATOM))
               (SETQ pos (STRPOS '_ connectionVar))
               (SETQ src (SUBATOM connectionVar 1 (SUB1 pos)))
               (SETQ dst (SUBATOM connectionVar (ADD1 pos)
                                 -1]
         (T (MMFS.ParseError "Illegal arg to map_send" (OR connectionVar connectionArg]
      '(\MAPSend.CFN ,connectionArg ,(KWOTE src)
              ,(KWOTE dst)
              ,buf
              ,len])
```

```
)

(DECLARE%: DOEVAL@COMPILE DONTCOPY

(GLOBALVARS MapNetwork)
)

; mmfs send macros, analysis

(DECLARE%: EVAL@COMPILE

(PUTPROPS mmfs_send.CFN MACRO (X (mmfs_sendExpander
                                   X)))
)

(DEFINEQ

(mmfs_sendExpander
  [LAMBDA (args)                                        ; Edited 9-Jun-88 14 24 by mcf
    (LET ((connectionArg (CAR args))
          (templateID (CADR args))
          connectionVar pos)
      [COND
        [(AND (OR (match connectionArg with (%'CR.Static & connectionVar_&@LITATOM))
                  (match connectionArg with (%'CR.Auto & connectionVar_&@LITATOM)))
              (SETQ pos (STRPOS '_ connectionVar]
        (T (MMFS.ParseError "Illegal arg to mmfs_send" (OR connectionVar connectionArg]
      '(\MMFSSend ,connectionArg ,(KWOTE (SUBATOM connectionVar 1 (SUB1 pos)))
             ,templateID])

(MMFS.CAnalyze.mmfs_send
  [LAMBDA (name where form)                             ; Edited 9-Jun-88 14 25 by mcf
    (LET ((varForm (CADR form))
          (numForm (CADDR form))
          connectionVar pos)
      (COND
        ((AND (OR (match varForm with (%'CR.Static & connectionVar_&@LITATOM))
                  (match varForm with (%'CR.Auto & connectionVar_&@LITATOM)))
              (SETQ pos (STRPOS '_ connectionVar)))
         (CC.IDAccess (PACK* (SUBSTRING connectionVar 1 (SUB1 pos))
                             '(
                             (OR (NUMBERP numForm)
                                 'Computed))
                  'Send where])
)

(CC.SetTemplate 'mmfs_send'
       NIL NIL 'MMFS.CAnalyze.mmfs_send)

; Special simulation fns

(DEFINEQ

(abort_step.CFN
  [LAMBDA (bool)                                        (* TAL "10-Jan-88 20.07")
    (COND
      ((NEQ bool 0)
       (AbortGrafcetMacroStep)))
    bool])
)
```

```
; Temporary until old progs changed

(MOVD? 'abort_step.CFN
       'abort_process.CFN)

(SETQ CLISPCHARRAY (MAKEBITTABLE (DREMOVE '_ CLISPCHARS)))

(PUTPROPS FISCC FILETYPE :FAKE-COMPILE-FILE)

(DECLARE%: DONTEVAL@LOAD DOEVAL@COMPILE DONTCOPY COMPILERVARS

(ADDTOVAR NLAMA )

(ADDTOVAR NLAML CVAR.SETQ CVAR.REFQ CR.SetupStaticQ)

(ADDTOVAR LAMA )
)

(PUTPROPS FISCC COPYRIGHT ("Savoir, Inc." 1986 1997 1987 1988))
```

FUNCTION INDEX

CombineMenuWhenSelectedFn ......10
DoExpandFnMethod ...............10
DoIconFnMethod .................10
DoShrinkFnMethod ...............10
FISCreateTraceWindow ...........10
FISInitializeTextStream ........11
FISTWCloseFn ...................11

METHOD INDEX

CombineFactorySystemBrowser.Browse ....2
CombineFactorySystemBrowser.BuildSmallCombinationWindow ....2
CombineFactorySystemBrowser.CheckStopButton ....4
CombineFactorySystemBrowser.ClearSelections ....4
CombineFactorySystemBrowser.ContentsChanged ....4
CombineFactorySystemBrowser.CreateMethodMenu ....4
CombineFactorySystemBrowser.DoShrinkW ....4
CombineFactorySystemBrowser.ExitBrowser ....4
CombineFactorySystemBrowser.ExpandFn ....4
CombineFactorySystemBrowser.GetMaxStringWidth ....5
CombineFactorySystemBrowser.IconFn ....5
CombineFactorySystemBrowser.InitializeTrace ....5
CombineFactorySystemBrowser.LeftSelection ....6
CombineFactorySystemBrowser.MiddleSelection ....6
CombineFactorySystemBrowser.ProcessNameSelection ....6
CombineFactorySystemBrowser.SendToCurrentOnes ....6
CombineFactorySystemBrowser.SendToSelectOne ....6
CombineFactorySystemBrowser.SetSelections ....7
CombineFactorySystemBrowser.ShrinkFn ....7
CombineFactorySystemContext.LocateFactoryProcesses ....7
CombineFactorySystemContext.ProcessContextArgs ....7
CombineGrafcetProcessBrowser.CheckStopButton ....7
CombineGrafcetProcessBrowser.ComputeSVRegion ....7
CombineGrafcetProcessBrowser.Move ....8
CombineGrafcetProcessBrowser.ShowAnimation ....8
CombineGrafcetProcessBrowser.ShowMMI ....8
CombineGrafcetProcessBrowser.ShowState ....8
CombineGrafcetProcessBrowser.ToggleStateDisplay ....8
CombineGrafcetProcessContext.BrowseBrowser? ....8

VARIABLE INDEX

CombineProcessBrowserMenuItems ....9
FISNullOutputStream ....11
FISProcessBitmap ....9
FISProcessNameHelpStr ....9
FISTextStreamPropLst ....11
FISTraceHeight ....11
FISTraceHorizDiff ....11
FISTraceWidth ....11
FISTraceWindowType ....11
GlobalDeviceStream ....11
GlobalTraceStream ....11
NewCombineProcessBrowserMenuItems ....9
OldCombineProcessBrowserMenuItems ....9

CLASS INDEX

CombineFactorySystemBrowser ....1
CombineFactorySystemContext ....2
CombineGrafcetProcessBrowser ....2
CombineGrafcetProcessContext ....2

PROPERTY INDEX

FISCOMBINE ....1,11
FISProcessNameHelpStr ....10 changes to: (VARS FISCOMBINECOMS)

previous date: 13-Jun-88 17:56:34 (POGO:AISNORTH:XEROX)<LIPKIS>FIS>FISCOMBINE.;76

Read Table: INTERLISP

Package: IL

;; Copyright (c) 1986, 1987, 1988 by Savoir, Inc.. All rights reserved.

```
(RPAQQ FISCOMBINECOMS
       ((DECLARE%: DONTCOPY (PROP MAKEFILE-ENVIRONMENT FISCOMBINE))
        (CLASSES CombineFactorySystemBrowser CombineFactorySystemContext CombineGrafcetProcessBrowser
               CombineGrafcetProcessContext)
        (METHODS CombineFactorySystemBrowser.Browse CombineFactorySystemBrowser.BuildSmallCombinationWindow
               CombineFactorySystemBrowser.CheckStopButton CombineFactorySystemBrowser.ClearSelections
               CombineFactorySystemBrowser.ContentsChanged CombineFactorySystemBrowser.CreateMethodMenu
               CombineFactorySystemBrowser.DoShrinkW CombineFactorySystemBrowser.ExitBrowser
               CombineFactorySystemBrowser.ExpandFn CombineFactorySystemBrowser.GetMaxStringWidth
               CombineFactorySystemBrowser.IconFn CombineFactorySystemBrowser.InitializeTrace
               CombineFactorySystemBrowser.LeftSelection CombineFactorySystemBrowser.MiddleSelection
               CombineFactorySystemBrowser.ProcessNameSelection CombineFactorySystemBrowser.SendToCurrentOnes
```

```
        CombineFactorySystemBrowser.SendToSelectOne CombineFactorySystemBrowser.SetSelections
        CombineFactorySystemBrowser.ShrinkFn CombineFactorySystemContext.LocateFactoryProcesses
        CombineFactorySystemContext.ProcessContextArgs CombineGrafcetProcessBrowser.CheckStopButton
        CombineGrafcetProcessBrowser.ComputeSVRegion CombineGrafcetProcessBrowser.Move
        CombineGrafcetProcessBrowser.ShowAnimation CombineGrafcetProcessBrowser.ShowMMI
        CombineGrafcetProcessBrowser.ShowState CombineGrafcetProcessBrowser.ToggleStateDisplay
        CombineGrafcetProcessContext.BrowseBrowser?) .
  (VARS NewCombineProcessBrowserMenuItems OldCombineProcessBrowserMenuItems FISProcessBitmap)
  (VARS (CombineProcessBrowserMenuItems NewCombineProcessBrowserMenuItems)
        (FISProcessNameHelpStr "Toggle selection state - black is selected"))
  (FNS CombineMenuWhenSelectedFn DoExpandFnMethod DoIconFnMethod DoShrinkFnMethod)
  (PROP GLOBALVAR FISProcessNameHelpStr)
  (COMS                                   . Global trace/device windows
        (FNS FISCreateTraceWindow FISInitializeTextStream FISTWCloseFn)
        [INITVARS (FISTraceWindowType 'TEDIT)
              (FISNullOutputStream (OPENSTREAM '{NULL} 'OUTPUT]
        (P (PUTSTREAMPROP FISNullOutputStream 'NULLDEVICE T))
        (INITVARS (GlobalTraceStream FISNullOutputStream)
              (GlobalDeviceStream FISNullOutputStream))
        (VARS [FISTextStreamPropLst '(PROMPTWINDOW DON'T PARALOOKS (LEFTMARGIN 5]
             (FISTraceHeight 150)
             (FISTraceHorizDiff 17)
             (FISTraceWidth 425))
        (EXPORT (GLOBALVARS FISTextStreamPropLst FISTraceWindowType GlobalDeviceStream
                     GlobalTraceStream FISTraceHeight FISTraceHorizDiff FISTraceWidth)))
  (PROP FILETYPE FISCOMBINE)))

(DECLARE%: DONTCOPY

(PUTPROPS FISCOMBINE MAKEFILE-ENVIRONMENT (:PACKAGE "IL" :READTABLE "INTERLISP" :BASE 10))
)

(DEFCLASS CombineFactorySystemBrowser (MetaClass Class Edited%:
                                                          (* TAL "20-Mar-88 13.13")
                                   doc "This is the default metaClass for all classes")
   (Supers Browser)
   (ClassVariables (MinHeight 0)
         (PrintName "Process Execution")
         (MethodItems #,($A (PROGN CombineProcessBrowserMenuItems) EveryFetch NoUpdatePermitted))
         (OldHorizMethodItems
        #,($A ((Deactivate DoShrinkW "Shrink the browser to an Icon")) UnionSuperValue NoUpdatePermitted)
              )
         (BaseIcon #,($A (PROGN FISProcessBitmap) EveryFetch NoUpdatePermitted) doc "icon to start
              from"))
   (InstanceVariables (processLst NIL doc "list of factory processes to be started at one time")
         (processContexts NIL doc "list of contexts started from here")
         (processBrowsers NIL doc "list of browsers started from here")
         (processNames NIL doc "cache of names")
         (activeBrowsers NIL doc "list of currently active process browsers")
         (stopMenuItemRegion NIL doc "tom's hack")
         (bottomW NIL doc "place to attach state windows")
         (menuWindowLst NIL doc "menus & menuwindows cached for selection")
         (lastCommand T doc "last command executed")))
```

```
(DEFCLASS CombineFactorySystemContext (MetaClass Class Edited%:
                                                          (* TAL " 6-Mar-88 23.29")
                                   doc "This is the default metaClass for all classes")
   (Supers DefaultContext)
   (ClassVariables (Browser #,($C CombineFactorySystemBrowser))
         (MenuName "Run Factory System")
         (MenuDoc "Run the factory system associated with this main program")
         (InitialActions (LocateFactoryProcesses)
               doc "Collect associated processes"))
   (InstanceVariables (object NIL VR #,($C GrafcetMainProgram))
         (processLst NIL)))

(DEFCLASS CombineGrafcetProcessBrowser (MetaClass Class Edited%:
                                                          (* mcf%. "23-Jun-86 15:51")
                                   doc "This is the default metaClass for all classes")
   (Supers FactoryProcessBrowser)
   (InstanceVariables (realWidth NIL doc "get around attach window problems for now")
         (combineBrowser NIL doc "he who made me")
         (shrinkVars NIL doc "place to store state variables when window is shrunk")))

(DEFCLASS CombineGrafcetProcessContext (MetaClass Class Edited%:
                                                          (* mcf%. "19-Jun-86 12.36")
                                   doc "This is the default metaClass for all classes")
   (Supers GrafcetProcessContext)
   (ClassVariables (Browser #,($C CombineGrafcetProcessBrowser) doc "slight specialization for
                    combination")
         (DontBrowseBrowserFlg T doc "controls browsing of browser from Start")))

(\BatchMethodDefs)

(Method ((CombineFactorySystemBrowser Browse) self context object)
                                                          TAL  7-Mar 88 01 05
  "Specialization"
  [LET (brwsrs cntxts window)
    (COND
      ((@ %:processLst)
       (RESETLST
           (RESETSAVE (CURSOR WAITINGCURSOR))
```

```
        (_@ self %:processContexts (SETQ cntxts (for p in (@ %:processLst)
                                               collect (_ (@ %:context)
                                                           SpawnLinkedContext
                                                           (DEFERREDCONSTANT ($
                                                                       CombineGrafcetProcessContext
                                                                          ))
                                                           p))))
        (_@ self %:processBrowsers (SETQ brwsrs (for cntxt in (@ %:processContexts)
                                               collect (@ cntxt %:myBrowser)))))
     (_ self BuildSmallCombinationWindow cntxts brwsrs)
     (_@ self %:activeBrowsers brwsrs)
     (for brwsr in brwsrs do (_ brwsr InitializeState)
                             (_@ brwsr %:combineBrowser self))
     (SETQ window (@ %:window))
     (WINDOWADDPROP window 'SHRINKFN (FUNCTION DoShrinkFnMethod)
          T)
     (WINDOWADDPROP window 'EXPANDFN (FUNCTION DoExpandFnMethod))
     (WINDOWPROP window 'ICONFN (FUNCTION DoIconFnMethod)))
    (T (_ self AbortBrowser)]]
```

(Method ((CombineFactorySystemBrowser BuildSmallCombinationWindow) self Cntxts Brwsrs
)
, mct: 14-Jan-88 16.42

```
  "Build a compact display"
  (DECLARE (GLOBALVARS FISWindowTitleFont))
  (LET [names singlewidth fullwidth mw windowlst menuitems menus mWidth wWidth iHeight window
            (pName (@ |::PrintName|))
            (font (DEFAULTFONT 'DISPLAY]
    (_@ processNames [SETQ names (bind Object for cntxt in Cntxts collect (SETQ Object (@ cntxt object))
                                                                    (OR (@ Object printName)
                                                                        (@ Object name)
                                                                        (@ Object |::PrintName|)]])
    (_@ title NIL)
    (SETQ wWidth (STRINGWIDTH "12345678" font))
    [SETQ mWidth (PLUS 10 (MAX 0 (for name in names maximize (STRINGWIDTH name font]
    (SETQ singlewidth (PLUS wWidth mWidth))
    .. The following assumes that font is fixed width and uses NCHARS for efficiency
    (COND
      ((IGREATERP (SETQ fullwidth
                     (IMAX (IPLUS (STRINGWIDTH pName FISWindowTitleFont)
                                  10)
                           (IPLUS [ITIMES (CHARWIDTH (CHARCODE A)
```

Page 2

```
                                          font)
                                   (MAX 0 (for cntxt in Cntxts
                                              maximize (for id in (@ cntxt |:program:ids|)
                                                           maximize (NCHARS (fetch CCID/ID of id]
                            (STRINGWIDTH "1234" font NIL)
                            10)))
                  singlewidth)
        (SETQ mWidth (IDIFFERENCE fullwidth wWidth)))
      (T (SETQ fullwidth singlewidth)))
    (SETQ wWidth (IDIFFERENCE wWidth (LRSH WBorder 1)))
    (SETQ font FISWindowTitleFont)                 . (_ self PositionBrowser fullwidth (IPLUS WBorder (FONTPROP font
                                                   : 'HEIGHT)))
    (_ self PositionBrowser fullwidth (FONTPROP font 'HEIGHT))
    (SETQ window (@ window))
    (SETQ windowlst (from 1 to (LENGTH Brwsrs) first [SETQ iHeight (ABS (IPLUS (TIMES 2 (DSPLINEFEED NIL
                                                                                            window))
                                                                     (FONTPROP (DSPFONT NIL window
                                                                                      )
                                                                               'DESCENT]
                   collect (CREATEW (LIST 0 0 wWidth iHeight)
                                    NIL NIL T)))
    (DSPFONT font window)
    (CENTERPRINTINREGION pName NIL window)
    (FLIPREGION window)
    (SETQ menuitems (for x in names collect (LIST x 'ProcessNameSelection FISProcessNameHelpStr)))
    [SETQ menus (for x in menuitems collect (create MENU
                                                    ITEMS _ (LIST x)
                                                    ITEMWIDTH _ (IPLUS mWidth (TIMES 2 WBorder))
                                                    ITEMHEIGHT _ (IDIFFERENCE iHeight (LRSH WBorder 1))
                                                    MENUCOLUMNS _ 1
                                                    CENTERFLG _ T
                                                    WHENSELECTEDFN _ (FUNCTION CombineMenuWhenSelectedFn]
    (SETQ mw (for x in menus collect (MENUWINDOW x)))
    (_@ self bottomW (CAR (LAST mw)))
    (for w in (CDR mw) first (ATTACHWINDOW (CAR mw)
                                           window
                                           'BOTTOM
                                           'LEFT)
       do (ATTACHWINDOW w (CAR mw)
                 'BOTTOM
                 'LEFT))
    (for x in (_@ self menuWindowLst (for i in menuitems as m in menus as w in mw
                                          collect (LIST w (MENUITEMREGION i m))))
       do (FLIPREGION (CAR x)
                 (CADR x)))
    [for w in mw as b in Brwsrs do (WINDOWPROP w 'myBrowser b)
                                   (WINDOWADDPROP w 'REPAINTFN
                                          (FUNCTION (LAMBDA (window region)
```

```
                    (LET ((brwsr (WINDOWPROP window  myBrowser))
                          cbrwsr)
                      (COND
                        ((AND brwsr (SETQ cbrwsr (@ brwsr combineBrowser)
                                    )
                              (FMEMB brwsr (@ cbrwsr activeBrowsers)))
                          (FLIPREGION window
                                (CADR (FASSOC window (@ cbrwsr
                                                        menuWindowLst
)]
    (for wnd in (CDR windowlst) first (ATTACHWINDOW (CAR windowlst)
                                                   window
                                                   'BOTTOM
                                                   'RIGHT)
       do (ATTACHWINDOW wnd (CAR windowlst)
                 'BOTTOM
                 'RIGHT))
    (for wnd in windowlst as brwsr in Brwsrs do (_@ brwsr window wnd)
                                                (DSPSCROLL 'ON wnd)
                                                .. (WINDOWPROP wnd (QUOTE RIGHTBUTTONFN) (FUNCTION TOTOPW)) (WINDOWPROP wnd
                                                .. (QUOTE PASSTOMAINCOMS) T)
                                                (_@ brwsr title NIL)
                                                (_@ brwsr realWidth fullwidth))
    (OPENW window)
    (for wnd in (CONS window windowlst) do (WINDOWADDPROP wnd 'RESHAPEFN  'DON'T T))))
```

Page 4

```
(Method ((CombineFactorySystemBrowser CheckStopButton) self)
                                                        . mcf: 20-Jun-86 14:32
   "New method template"
   (LET (window menu item itemRegion pos)
     (COND
       ([AND (MOUSESTATE (OR LEFT MIDDLE))
             [EQ (WHICHW LASTMOUSEX LASTMOUSEY)
                 (SETQ window (WFROMMENU (SETQ menu (@ %:methodMenu)]
             (INSIDEP (SETQ itemRegion (@ %:stopMenuItemRegion))
                      (SETQ pos (CURSORPOSITION NIL window]
        (FLIPREGION window itemRegion)
        (until [COND
                 ((AND (MOUSESTATE UP)
                       (INSIDEP itemRegion (CURSORPOSITION NIL window pos)))
                  (for brwsr in (@ %:activeBrowsers) when (@ brwsr %:autoScanFlg)
                     do (_ brwsr StopProcess))
                  T)
                 ((NOT (INSIDEP itemRegion (CURSORPOSITION NIL window pos]
           do T finally (FLIPREGION window itemRegion])

(Method ((CombineFactorySystemBrowser ClearSelections) self brwsr)
                                                        . mcf: 22-Dec-87 17 35
   "New method template"
   [LET ((abrwsrs (@ %:activeBrowsers)))
     [COND
       (abrwsrs (for b in (@ %:processBrowsers) as m in (@ %:menuWindowLst)
                   when (AND (FMEMB b abrwsrs)
                             (OR (NOT brwsr)
                                 (NEQ b brwsr)))
                   do (FLIPREGION (CAR m)
                                  (CADR m]
     (_@ self %:activeBrowsers (AND brwsr (LIST brwsr)))])

(Method ((CombineFactorySystemBrowser ContentsChanged) self Arg1)
                                                        . mcf: 17-Nov-87 18:08
   "Specialization"
   NIL)

(Method ((CombineFactorySystemBrowser CreateMethodMenu) self)
                                                        . mcf: 20-Jun-86 14 28
   "Specialization"
   [LET (menu stopItem)
     (_Super self CreateMethodMenu)
     (COND
       ([AND (SETQ menu (@ %:methodMenu))
             (SETQ stopItem (FASSOC 'Stop (fetch ITEMS of menu]
        (_@ %:stopMenuItemRegion (MENUITEMREGION stopItem menu))])

(Method ((CombineFactorySystemBrowser DoShrinkW) self)
                                                        . mcf 23-Jun-86 17 39
   "New method template"
   (SHRINKW (@ %:window)))

(Method ((CombineFactorySystemBrowser ExitBrowser) self)
                                                        . TAL 20-Mar-88 13:30
   "Specialization"
   (RESETFORM (CURSOR WAITINGCURSOR)
          (LET [(tmp (CAR (ALLATTACHEDWINDOWS (@ %:bottomW)]   (* This should be in the context Exit method)
            (COND
```

```
      ([AND tmp [SETQ tmp (ObjectExists? (WINDOWPROP tmp 'LoopsWindow]
            (SETQ tmp (ObjectExists? (@ tmp %:context))]
         (_ tmp Exit)))
       (for cntxt in (@ %:processContexts) do (_ cntxt Done)]
(_Super self ExitBrowser))
```

(Method ((CombineFactorySystemBrowser ExpandFn) self)
mcf: 23-Jun-86 15 55

```
"New method template"
(bind vars for brwsr in (@ %:processBrowsers) when (SETQ vars (@ brwsr %:shrinkVars)
   do (_ brwsr ShowState vars)
      (_@ brwsr %:shrinkVars NIL)))
```

Page 5

(Method ((CombineFactorySystemBrowser GetMaxStringWidth) self lst font)
mcf: 14-Jan-88 16.40

```
"New method template"
(COND
   [lst (IMAX 0 (for x in (bind (extreme _ 0) for x in lst do (COND
                                                    ((GREATERP (NCHARS x)
                                                              extreme)
                                                     (SETQ $$VAL (CONS x))
                                                     (SETQ extreme (NCHARS x)))
                                                    ((EQ (NCHARS x)
                                                         extreme)
                                                     (push $$VAL x)))
                          yield $$VAL)
                maximize (STRINGWIDTH x font NIL]
   (T 0)))
```

(Method ((CombineFactorySystemBrowser IconFn) self)
mcf: 23-Jun-86 17:22

```
"New method template"
(LET [bw bh nbh (baseIcon (@ !::BaseIcon!))
         (names (@ %:processNames))
         itemwidth itemheight region newIcon dsp (font (DEFAULTFONT 'DISPLAY]
  (SETQ bw (BITMAPWIDTH baseIcon))
  (SETQ bh (BITMAPHEIGHT baseIcon))
  (SETQ font (FONTCOPY font 'WEIGHT 'BOLD))
  [SETQ itemheight (ADD1 (FONTPROP font 'HEIGHT]
  (SETQ itemwidth (IMAX (for name in names maximize (IPLUS 4 (STRINGWIDTH name font NIL)))
                        bw))
  [SETQ newIcon (BITMAPCREATE itemwidth (SETQ nbh (IPLUS bh (TIMES (LENGTH names)
                                                                   itemheight]
  (BITBLT baseIcon 0 0 newIcon 0 (IDIFFERENCE nbh bh)
        bw bh 'INPUT 'REPLACE)
  (SETQ dsp (DSPCREATE newIcon))
  (DSPFONT font dsp)
  (bind region for name in names first (SETQ region (CREATEREGION 0 (IDIFFERENCE nbh bh)
                                                             itemwidth itemheight))
     do (replace BOTTOM of region with (IDIFFERENCE (fetch BOTTOM of region)
                                                    itemheight))
        (CENTERPRINTINREGION name region dsp))
  (FLIPREGION dsp (CREATEREGION 0 0 itemwidth (IDIFFERENCE nbh bh)))
  newIcon))
```

(Method ((CombineFactorySystemBrowser InitializeTrace) self)
TAL 27 Mar-88 18:21

```
"Create or clear global type-out windows. JLTraceStream & JLDeviceStream are crocks to keep from changing
JLCell programs"
[LET NIL
  (DECLARE (GLOBALVARS GlobalTraceStream GlobalDeviceStream JLTraceStream JLDeviceStream
                  FISCC.GlobalTraceStream FISCC.GlobalDeviceStream))
  (COND
     ([AND (STREAMP GlobalTraceStream)
           (NOT (GETSTREAMPROP GlobalTraceStream 'NULLDEVICE]
                                                      (* clear items)
      (FISInitializeTextStream GlobalTraceStream))
     (T [SETQ GlobalTraceStream (SETQ JLTraceStream (FISCreateTraceWindow NIL "Trace Window"
                                                      (FUNCTION (LAMBDA (w)
                                                              (DECLARE (GLOBALVARS
                                                                         GlobalTraceStream
                                                                         JLTraceStream
                                                                      FISCC.GlobalTraceStream
                                                                         FISNullOutputStream
                                                                         ))
                                                              (CR.SmashStreamCPtr
                                                                 FISCC.GlobalTraceStream
                                                                 (SETQ JLTraceStream
                                                                  (SETQ GlobalTraceStream
                                                                   FISNullOutputStream]
        (PUTSTREAMPROP GlobalTraceStream 'NoUserClose T)  (* Prevent C user from closing this stream)
        (CR.SmashStreamCPtr FISCC.GlobalTraceStream GlobalTraceStream)))
  (COND
     ([AND (STREAMP GlobalDeviceStream)
           (NOT (GETSTREAMPROP GlobalDeviceStream 'NULLDEVICE]
                                                      (* clear items)
      (FISInitializeTextStream GlobalDeviceStream))
     (T [SETQ GlobalDeviceStream (SETQ JLDeviceStream (FISCreateTraceWindow NIL 'Device Control'
                                                       (FUNCTION (LAMBDA (w)
                                                               (DECLARE (GLOBALVARS
                                                                          GlobalDeviceStream
                                                                          JLDeviceStream
                                                                      FISCC.GlobalDeviceStream
```

```
                                                  FISNullOutputStream
                                                  ))
                                    (CR.SmashStreamCPtr
                                        FISCC.GlobalDeviceStream
                                        (SETQ JLDeviceStream
                                         (SETQ GlobalDeviceStream
                                          FISNullOutputStream]
        (PUTSTREAMPROP GlobalDeviceStream 'NoUserClose T)
        (CR.SmashStreamCPtr FISCC.GlobalDeviceStream GlobalDeviceStream]))
```

(Method ((CombineFactorySystemBrowser LeftSelection) self)
mct: 22-Dec-87 17 37

```
   "Specialization"
   (_Super self LeftSelection)
   (_ self ClearSelections))
```

(Method ((CombineFactorySystemBrowser MiddleSelection) self)
mct: 22-Dec-87 17:38

```
   "Specialization"
   (_Super self MiddleSelection)
   (_ self SetSelections))
```

(Method ((CombineFactorySystemBrowser ProcessNameSelection) self Item Menu Key MWindow)
mct: 22-Dec-87 17.39

```
   "New method template"
   [LET [abs cntxt brwsr (obj (SWDereferenceName (CAR Item]
     (COND
       ((AND obj (SETQ cntxt (@ obj %:processContext))
             (SETQ brwsr (@ cntxt %:myBrowser)))
        (SETQ abs (@ %:activeBrowsers))
        (COND
           [(AND NIL (@ %:lastCommand))                    (* Disable behavior |12/3/87|)
            (_@ self %:lastCommand NIL)
            (_ self ClearSelections brwsr)
            (AND (NOT (FMEMB brwsr abs))
                 (FLIPREGION MWindow (CADR (FASSOC MWindow (@ %:menuWindowLst)]
           (T (COND
                 ((MEMB brwsr abs)
                  [FLIPREGION MWindow (CADR (FASSOC MWindow (@ %:menuWindowLst)]
                  (change (@ %:activeBrowsers)
                          (REMOVE brwsr DATUM)))
                 (T [FLIPREGION MWindow (CADR (FASSOC MWindow (@ %:menuWindowLst)]
                    (push (@ %:activeBrowsers)
                          brwsr])
```

(Method ((CombineFactorySystemBrowser SendToCurrentOnes) self Item)
mct 9-Jul-86 17 03

```
   "Pass selection on to currently active processes"
   (_@ self %:lastCommand (CAADR Item))
   (for brwsr in (@ %:activeBrowsers) do (_! brwsr (CAADR Item))))
```

(Method ((CombineFactorySystemBrowser SendToSelectOne) self Item)
mct: 4-Aug-87 09:12

```
   "New method template"
   (LET (sel (cmd (CAADR Item))
             (lst (@ %:activeBrowsers)))
     (AND (ZEROP (LENGTH lst))
          (SETQ lst (@ %:processBrowsers)))
     (SETQ lst (SELECTQ cmd
                    (ShowMMI (for x in lst when (@ x |:object:mmi|) collect x))
                    (ShowAnimation
                       (for x in lst when (@ x |:object:animation|) collect x))
                    lst))
     [COND
        [(IGREATERP (LENGTH lst)
                 1)
         (SETQ sel (MENU (create MENU
                               ITEMS _ (for ab in lst collect (LIST (@ ab |:object:printName|)
                                                                    ab "Will select this process"))
                               CENTERFLG _ T
                               WHENSELECTEDFN _ (FUNCTION (LAMBDA (item)
                                                           (CADR item]
        (lst (SETQ sel (CAR lst]
     (AND sel (_@ self %:lastCommand cmd)
          (_! sel cmd))))
```

(Method ((CombineFactorySystemBrowser SetSelections) self)
mct 23-Dec-87 17 45

```
   "New method template"
   (LET [(abrwsrs (@ %:activeBrowsers))
         (pbrwsrs (COPY (@ %:processBrowsers)]
     (for b in pbrwsrs as m in (@ %:menuWindowLst) when (NOT (FMEMB b abrwsrs))
        do (FLIPREGION (CAR m)
                  (CADR m)))
     (_@ self %:activeBrowsers pbrwsrs)))
```

```
(Method ((CombineFactorySystemBrowser ShrinkFn) self)
                                                    . mct: 30-Jun-86 13:39
  "New method template"
  (bind swind for brwsr in (@ %:processBrowsers)
     when [SETQ swind (CAR (INTERSECTION (@ brwsr %:stateVariableWindows)
                                          (for w in (ALLATTACHEDWINDOWS (@ brwsr %:window))
                                             collect (WINDOWPROP w 'LoopsWindow]
     do (_@ brwsr %:shrinkVars (@ swind %:properties))
        (_ brwsr ToggleStateDisplay)))

(Method ((CombineFactorySystemContext LocateFactoryProcesses) self)
                                                    TAL 6-Mar-88 23.45
  "New method template"
  (_@ |:myBrowser:processLst| (bind obj for x in (@ processLst)
                                 when (AND (SETQ obj (OR (AND (Object? x)
                                                              x)
                                                         (SWDereferenceName x)))
                                           (NOT (@ obj %:processContext)))
                                 collect obj)))

(Method ((CombineFactorySystemContext ProcessContextArgs) self ContextArgs)
                                                    . TAL 6-Mar-88 23.29
  "Specialization"
  (_Super self ProcessContextArgs ContextArgs)
  (change (@ processLst)
          (LISTGET ContextArgs 'ProcessList)))

(Method ((CombineGrafcetProcessBrowser CheckStopButton) self)
                                                    . mct: 20-Jun-86 14:33
  "Specialization"
  (_ (@ %:combineBrowser)
     CheckStopButton))

(Method ((CombineGrafcetProcessBrowser ComputeSVRegion) self varList attachFlg)
                                                    mct: 17 Dec-86 10 13
  "Compute a region for a browser displaying the vars in varList, to be attached at my upper left"
  (LET [iwRegion region height width (font (DEFAULTFONT 'DISPLAY]
    (SETQ region (WINDOWPROP (@ |:combineBrowser:bottomW|)
                             'REGION))
    (SETQ width (WIDTHIFWINDOW (@ realWidth)))
    (SETQ height (HEIGHTIFWINDOW [IMIN (IDIFFERENCE (fetch BOTTOM of region)
                                                    51)
                                       (ITIMES (FONTHEIGHT font)
                                               (COND
                                                  (varList (LENGTH varList))
                                                  (T 1]
                                 T))
    [COND
       [attachFlg (SETQ iwRegion (create REGION
                                         WIDTH _ width
                                         HEIGHT _ height
                                         LEFT _ (fetch LEFT of region)
                                         BOTTOM _ (IDIFFERENCE (fetch BOTTOM of region)
                                                               height]
       (T (SETQ iwRegion (GETBOXREGION (IMIN width
                                             (WIDTHIFWINDOW (IMIN (IPLUS (IMAX (for x in varList
                                                                                 maximize (STRINGWIDTH
                                                                                           x font NIL))
                                                                               16)
                                                                         10
                                                                         (STRINGWIDTH "1234" font NIL))
                                                                  250)))
                                       height NIL NIL NIL "Move box to desired position for display and click
                                       left"]
    iwRegion))
```

Page 8

```
(Method ((CombineGrafcetProcessBrowser Move) self POSorX Y)
                                                    . mct: 11-Jul-86 16:31
  "Specialization"
  (_ (@ self %:combineBrowser)
     Move POSorX Y))

(Method ((CombineGrafcetProcessBrowser ShowAnimation) self)
                                                    . mct: 12-Feb-87 14:20
                                                    . New method template
  "This should be replaced by the normal context/browser spawning mechanism soon"
  [LET ((animation (@ |:object:animation|)))
    (COND
       ((ObjectExists? animation)
        (COND
           ((OPENWP (@ animation %:window))
            (FLASHWINDOW (@ animation %:window)
                         2))
           (T (_ animation Browse)]]
```

```
(Method ((CombineGrafcetProcessBrowser ShowMMI) self)
                                                    . mct: 29-Jul-87 10:45
   "New method template"
   [LET ((mmi (@ |:object:mmi|)))
     (COND
        ((ObjectExists? (SWDereferenceName mmi))            (* (AND (BOUNDP (QUOTE DesignerMMIProcess))
                                                            (SETQ DesignerMMIProcess (@ self :object name))))
         (StartEmulation mmi (@ self |:object:name|)]])

(Method ((CombineGrafcetProcessBrowser ShowState) self varList)
                                                    . TAL 20-Mar-88 13 38
   "New method template"
   [LET (wndw svBrowser scope props)
     [COND
        ((SETQ wndw (ALLATTACHEDWINDOWS (@ |:combineBrowser:bottomW|)))
         (SETQ svBrowser (WINDOWPROP (CAR wndw)
                                    'LoopsWindow))
         (SETQ scope (@ svBrowser |:object:scope|))
         (SETQ props (@ svBrowser %:properties))
         (DETACHWINDOW (@ svBrowser %:window))
         (_ (@ svBrowser %:context)
            Exit)                                           (* (_ svBrowser AbortBrowser))
         ]
     (COND
        [(AND scope (EQ scope (@ %:object))
              (EQ (LENGTH props)
                  (LENGTH varList))
              (NOT (FLDifference props varList]
        (T (SETQ wndw (@ (_ self CreateStateWindow varList T)
                         %:window))
           (ATTACHWINDOW wndw (@ |:combineBrowser:bottomW|)
                 'BOTTOM
                 'LEFT]))

(Method ((CombineGrafcetProcessBrowser ToggleStateDisplay) self)
                                                    . mct: 9-Jul-86 12.46
   "Specialization"
   (_ self ShowSelectedState))

(Method ((CombineGrafcetProcessContext BrowseBrowser?) self)
                                                    . TAL 7-Mar-88 15.07
   "Specialization"
   NIL)
```

```
(\UnbatchMethodDefs)
(RPAQQ NewCombineProcessBrowserMenuItems
      ((Initialize (InitializeManually SendToCurrentOnes)
              "Reset to initial conditions"
              (SUBITEMS ("Initialize Trace" InitializeTrace "Initialize (or set up) the Device Control and
                         Trace windows")
                     (Animation (ShowAnimation SendToSelectOne)
                            "Display any animation windows associated with the selected processes")
                     (MMI (ShowMMI SendToSelectOne)
                          "Display any MMI window associated with the selected processes")))
       (Start (StartProcess SendToCurrentOnes)
              "Start the process from initial conditions")
       (Stop (StopProcess SendToCurrentOnes)
             "Stop the process")
       (Continue (ContinueProcess SendToCurrentOnes)
              "Continue the process from the current state")
       (One% Scan (OneManualScan SendToCurrentOnes)
              "Execute a single scan and stop")
       (State (ToggleStateDisplay SendToSelectOne)
              "Display the process's interesting state variables and their values,
              or turn off the display if already there"
              (SUBITEMS ("Selected Variables" (ShowSelectedState SendToSelectOne)
                                "Display the process's interesting state variables and their values")
                     ("All Variables" (ShowAllState SendToSelectOne)
                            "Display all of the process's state variables and their values")
                     ("Create Display" (CreateStateDisplay SendToSelectOne)
                            "Create a display of state variables selected from a menu")
                     ("Set Selection" (InstallSelection SendToSelectOne)
                            "Select a set of state variables to use in the default state variable display"))
              )
       (Fast/Slow (FastSim SendToCurrentOnes)
              "Make the execution run fast or slow")))

(RPAQQ OldCombineProcessBrowserMenuItems
      ((Initialize (InitializeManually SendToCurrentOnes)
              "Reset to initial conditions"
              (SUBITEMS ("Initialize Trace" InitializeTrace "Initialize (or set up) the Device Control and
                         Trace windows")))
       (Start (StartProcess SendToCurrentOnes)
              "Start the process from initial conditions")
       (Stop (StopProcess SendToCurrentOnes)
             "Stop the process")
       (Continue (ContinueProcess SendToCurrentOnes)
              "Continue the process from the current state")
       (One% Scan (OneManualScan SendToCurrentOnes)
              "Execute a single scan and stop")
       (State (ToggleStateDisplay SendToSelectOne)
```

```
                "Display the process's interesting state variables and their values,
                or turn off the display if already there"
                (SUBITEMS ("Selected Variables" (ShowSelectedState SendToSelectOne)
                                "Display the process's interesting state variables and their values")
                        ("All Variables" (ShowAllState SendToSelectOne)
                                "Display all of the process's state variables and their values")
                        ("Create Display" (CreateStateDisplay SendToSelectOne)
                                "Create a display of state variables selected from a menu")
                        ("Set Selection" (InstallSelection SendToSelectOne)
                                "Select a set of state variables to use in the default state variable display"))
                )
        (Fast/Slow (FastSim SendToCurrentOnes)
                "Make the execution run fast or slow")))

(RPAQQ FISProcessBitmap
```

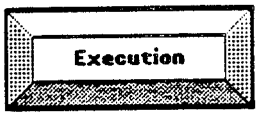

```
)

(RPAQ CombineProcessBrowserMenuItems NewCombineProcessBrowserMenuItems)

(RPAQ FISProcessNameHelpStr "Toggle selection state - black is selected")

(DEFINEQ
```

```
(CombineMenuWhenSelectedFn
  [LAMBDA (Item Menu Key)                                        (* mcf%: "19-Jun-86 16:02")
    (LET (self selector window)
      (AND (SETQ window (WFROMMENU Menu))
           (SETQ self (WINDOWPROP (MAINWINDOW window T)
                                  'LoopsWindow))
           (NOT (DestroyedObject? self))
           (_! self (CADR Item)
                    Item Menu Key window)])

(DoExpandFnMethod
  [LAMBDA (Window)                                               (* mcf%: "23-Jun-86 15:43")
    (LET (lw)
      (AND (SETQ lw (WINDOWPROP Window 'LoopsWindow))
           (_ lw ExpandFn)])

(DoIconFnMethod
  [LAMBDA (Window OldIcon)                                       (* mcf%: "23-Jun-86 16:53")
    (COND
      (OldIcon)
      (T (LET (lw)
           (AND (SETQ lw (WINDOWPROP Window 'LoopsWindow))
                (_ lw IconFn)])

(DoShrinkFnMethod
  [LAMBDA (Window)                                               (* mcf%: "23-Jun-86 15 42")
    (LET (lw)
      (AND (SETQ lw (WINDOWPROP Window 'LoopsWindow))
           (_ lw ShrinkFn)])
)

(PUTPROPS FISProcessNameHelpStr GLOBALVAR T)

;; Global trace/device windows

(DEFINEQ

(FISCreateTraceWindow
  [LAMBDA (Reg Title ExitFn WindowType NoMenu NoWindow WithStream)
                                                                 (* TAL "27-Mar-88 17 57")
    (LET ([reg (OR NoWindow Reg (GETBOXREGION FISTraceWidth (IPLUS FISTraceHeight FISTraceHorizDiff)
                                     LASTMOUSEX LASTMOUSEY NIL (CONCAT "Specify position for " Title]
          w s)
      (COND
         ((NOT NoWindow)
          (SETQ w (CREATEW (create REGION
                                   HEIGHT _ (IDIFFERENCE (fetch HEIGHT of reg)
                                                         FISTraceHorizDiff)
                              using reg)
                           Title))
          (PUTWINDOWPROP w 'FISTraceExitFn ExitFn)))
      (SETQ s (SELECTQ (OR WindowType FISTraceWindowType)
                  ((TEDIT Tedit)
                       (COND
                          ((DEFINEDP 'OPENFastTEXTSTREAM)
                           (OPENFastTEXTSTREAM WithStream w NIL NIL FISTextStreamPropLst))
                          (T (OPENTEXTSTREAM WithStream w NIL NIL FISTextStreamPropLst))))
                  (PROGN (DSPSCROLL 'ON w)
                         w)))
      (OR NoMenu NoWindow (ATTACHMENU (create MENU
                                             ITEMS _ '((Exit FISTWCloseFn "Exit out of this browser")
                                                        (Clear FISInitializeTextStream "Clear the contents of
                                                                 this window"))
```

```
                                CENTERFLG _ T
                                MENUBORDERSIZE _ 1
                                WHENSELECTEDFN _ (FUNCTION SWWhenSelectedFN))
                       w
                       'TOP
                       'JUSTIFY))
   (OR NoWindow (PROGN (WINDOWPROP w 'BUTTONEVENTFN (FUNCTION TOTOPW))
                       (WINDOWPROP w 'RIGHTBUTTONFN NIL)
                       (COND
                          ([NOT (EQUAL reg (WINDOWPROP w 'REGION]
                           (MOVEW w (fetch LEFT of reg)
                                  (fetch BOTTOM of reg]
   s])
```

(FISInitializeTextStream

```
  [LAMBDA (Stream)                                          (* TAL "27-Mar-88 18:21")
    (LET (stream)
      (COND
         [[SETQ stream (OR (TEXTSTREAMP Stream)
                           (AND (WINDOWP Stream)
                                (TEXTSTREAMP (WINDOWPROP Stream 'TEXTSTREAM]
          (TEDIT.DELETE stream 1 (fetch TEXTLEN of (TEXTOBJ stream]
         (T (CLEARW Stream])
```

(FISTWCloseFn

```
  [LAMBDA (w)                                               (* TAL "27-Mar-88 17:55")
    (LET [(exitFn (GETWINDOWPROP w 'FISTraceExitFn]
      (COND
         (exitFn (APPLY* exitFn w)))
      (COND
         ((TEXTSTREAMP (WINDOWPROP w 'TEXTSTREAM))
          (TEDIT.KILL (TEXTSTREAM w)))
         (T (CLEARW w)))
      (CLOSEW w])
)

(RPAQ? FISTraceWindowType 'TEDIT)

(RPAQ? FISNullOutputStream (OPENSTREAM '(NULL) 'OUTPUT))

(PUTSTREAMPROP FISNullOutputStream 'NULLDEVICE T)

(RPAQ? GlobalTraceStream FISNullOutputStream)

(RPAQ? GlobalDeviceStream FISNullOutputStream)

(RPAQQ FISTextStreamPropLst (PROMPTWINDOW DON'T PARALOOKS (LEFTMARGIN 5)))

(RPAQQ FISTraceHeight 150)

(RPAQQ FISTraceHorizDiff 17)

(RPAQQ FISTraceWidth 425)

.. FOLLOWING DEFINITIONS EXPORTED

(DECLARE%: DOEVAL@COMPILE DONTCOPY

(GLOBALVARS FISTextStreamPropLst FISTraceWindowType GlobalDeviceStream GlobalTraceStream FISTraceHeight
       FISTraceHorizDiff FISTraceWidth)
)

.. END EXPORTED DEFINITIONS

(PUTPROPS FISCOMBINE FILETYPE :FAKE-COMPILE-FILE)

(PUTPROPS FISCOMBINE COPYRIGHT ("Savoir, Inc." 1986 1987 1988))
```

FUNCTION INDEX

CopyNameSubInterface ...........10
FISFindAllLeaves ...............11
FISLeafUsers ...................11
FISRplString ...................12
FISSubEdParseError .............12

METHOD INDEX

ExamineCopySubstitutionFormContext.ProcessListObject ..........2
FOECopySubstitutionObject.Initialize ..........2
FOECopySubstitutionObject.Invalid? ..........2
FOECopySubstitutionObject.ProcessNonObjects ..........2
GlobalReplaceAnyContext.ComputeReplacementObjs ..........3
GlobalReplaceBrowser.Browse ..........3
GlobalReplaceBrowser.CheckOpenBrowsers ..........3
GlobalReplaceBrowser.ComputeReplacementObjs ..........3
GlobalReplaceBrowser.Process ..........3
GlobalReplaceBrowser.ProcessCProgram ..........4
GlobalReplaceBrowser.ProcessGrafcetProgram ..........4
GlobalReplaceBrowser.ProcessGrafcetTransition ..........5
GlobalReplaceBrowser.ProcessOne ..........5
GlobalReplaceBrowser.ProcessReceivableDefinition ..........5
GlobalReplaceBrowser.ProcessSendableDefinition ..........6
GlobalReplaceBrowser.UpdateBrowsers ..........6
GlobalReplaceContext.Done ..........6
GlobalReplaceContext.Start ..........7
GlobalReplaceVarContext.ComputeReplacementObjs ..........7
SubstitutionEditor.AbortBrowser ..........7
SubstitutionEditor.Browse ..........7
SubstitutionEditor.ChangeAndValidate ..........8
SubstitutionEditor.CheckNameConflict ..........8
SubstitutionEditor.ConstructString ..........8
SubstitutionEditor.ExitBrowser ..........9
SubstitutionEditor.ProtectField ..........9
SubstitutionEditor.UpdateObject1 ..........9

CLASS INDEX

ExamineCopySubstitutionFormContext ................1
FOECopyMMFSSubstitutionObject ......................1
FOECopySubstitutionObject ..........................1
GlobalReplaceAnyContext ............................1
GlobalReplaceBrowser ..........2
GlobalReplaceContext ..........2
GlobalReplaceVarContext ..........2
SubstitutionEditor ..........2

VARIABLE INDEX

FISGlobalReplaceBrowserHeight .....................10
FISGlobalReplaceBrowserWidth ......................10
FISSubConflictToken ..........10
FISSubstitutionSepr ..........10

PROPERTY INDEX

FISCOPY ..........................................12 changes to: (VARS FISCOPYCOMS)

previous date: 9-Aug-88 15:20:21 (DSK)<LISPFILES>FIS>FISCOPY.;32

Read Table: INTERLISP

Package: INTERLISP

.. Copyright (c) 1987, 1988 by Savoir, Inc. All rights reserved.

```
(RPAQQ FISCOPYCOMS
       ((CLASSES ExamineCopySubstitutionFormContext FOECopySubstitutionObject FOECopyMMFSSubstitutionObject
               GlobalReplaceAnyContext GlobalReplaceBrowser GlobalReplaceContext GlobalReplaceVarContext
               SubstitutionEditor)
        (METHODS ExamineCopySubstitutionFormContext.ProcessListObject FOECopySubstitutionObject.Initialize
               FOECopySubstitutionObject.Invalid? FOECopySubstitutionObject.ProcessNonObjects
               GlobalReplaceAnyContext.ComputeReplacementObjs GlobalReplaceBrowser.Browse
               GlobalReplaceBrowser.CheckOpenBrowsers GlobalReplaceBrowser.ComputeReplacementObjs
               GlobalReplaceBrowser.Process GlobalReplaceBrowser.ProcessCProgram
               GlobalReplaceBrowser.ProcessGrafcetProgram GlobalReplaceBrowser.ProcessGrafcetTransition
               GlobalReplaceBrowser.ProcessOne GlobalReplaceBrowser.ProcessReceivableDefinition
               GlobalReplaceBrowser.ProcessSendableDefinition GlobalReplaceBrowser.UpdateBrowsers
               GlobalReplaceContext.Done GlobalReplaceContext.Start
               GlobalReplaceVarContext.ComputeReplacementObjs SubstitutionEditor.AbortBrowser
               SubstitutionEditor.Browse SubstitutionEditor.ChangeAndValidate
               SubstitutionEditor.CheckNameConflict SubstitutionEditor.ConstructString
               SubstitutionEditor.ExitBrowser SubstitutionEditor.ProtectField
               SubstitutionEditor.UpdateObject1)
```

```
(VARS FISGlobalReplaceBrowserWidth FISGlobalReplaceBrowserHeight FISSubConflictToken
      FISSubstitutionSepr)
 (GLOBALVARS FISGlobalReplaceBrowserWidth FISGlobalReplaceBrowserHeight FISSubConflictToken
      FISSubstitutionSepr FISValidCIdentifierChars FISValidCIdentifierNegBT)
 (FNS CopyNameSubInterface FISFindAllLeaves FISLeafUsers FISRplString FISSubEdParseError)
 (PROP FILETYPE FISCOPY)))

(DEFCLASS ExamineCopySubstitutionFormContext (MetaClass Class Edited%:
                                                   Edited 15-Jun-88 17 04 by mct
                                              )

      (Supers ExamineFormContext)
      (ClassVariables (AttachHorizMenu T)
            (Browser #,($C SubstitutionEditor)))
      (InstanceVariables (object NIL VR #,($C FOECopySubstitutionObject))))

(DEFCLASS FOECopySubstitutionObject (MetaClass Class Edited%:
                                                   Edited 15-Jun-88 17 03 by mct
                                     )

      (Supers WorkstationObject)
      (ClassVariables (DisplayFields (sourcePat destPat macroSDPairString)))
      (InstanceVariables (elements NIL doc "Name substitution pairs")
            (sourceObject NIL doc "Source object for computing printName")
            (destObject NIL doc "Destination object for computing printName")
            (sourcePat NIL heading "Source Pattern" doc "source substitution pattern")
            (destPat NIL heading "Replacement Pattern" doc "destination substitution pattern")
            (macroSDPairString NIL heading "Macro Step Replacements" doc "source -> destination")
            (mmfsSSDPairString NIL heading "MMFS Send Step Replacements" doc "source -> destination")
            (mmfsRSDPairString NIL heading "MMFS Receive Step Replacements" doc "source -> destination")
            (regularSDPairString NIL heading "Regular Step Replacements" doc "source -> destination")))

[DEFCLASS FOECopyMMFSSubstitutionObject (MetaClass Class Edited%:
                                                   Edited 15-Jun-88 17 03 by mct
                                         )

      (Supers FOECopySubstitutionObject)
      (ClassVariables (DisplayFields (sourcePat destPat mmfsSSDPairString mmfsRSDPairString
                                      macroSDPairString]

(DEFCLASS GlobalReplaceAnyContext (MetaClass Class Edited%:   Edited 15-Jun-88 16 57 by mct
                                   )

      (Supers GlobalReplaceContext)
      (ClassVariables (MenuName "Replace Text")
            (MenuDoc "Match and replace text strings in associated C elements")
            (SourceString "Search String: ")
            (DestString "Replacement String: ")))
```

```
(DEFCLASS GlobalReplaceBrowser (MetaClass Class Edited%:     Edited 15-Jun-88 16:59 by mct
                                )

      (Supers Browser)
      (ClassVariables (PrintName "Text Replacement"))
      (InstanceVariables (replacementObjs #,($A ComputeReplacementObjs FFSendSelf ReplaceMe))
            (sourceString NIL doc "Search pattern")
            (destString NIL doc "Replacement pattern")))

(DEFCLASS GlobalReplaceContext (MetaClass Class Edited%:     Edited 15-Jun-88 16:56 by mct
                                )

      (Supers DefaultContext)
      (ClassVariables (AttachHorizMenu T)
            (Browser #,($C GlobalReplaceBrowser)))
      (InstanceVariables (object NIL VR #,($C GrafcetProgram))
            (process NIL doc "A place to run")
            (totalcount 0 doc "Total number of replacements made")))

(DEFCLASS GlobalReplaceVarContext (MetaClass Class Edited%:  Edited 15-Jun-88 16.57 by mct
                                   )

      (Supers GlobalReplaceContext)
      (ClassVariables (MenuName "Replace State Variable")
            (MenuDoc "Replace State Variable with new SV name in associated C elements")
            (SourceString "SV Name: ")
            (DestString "New SV Name: ")))

(DEFCLASS SubstitutionEditor (MetaClass Class Edited%:       Edited 15-Jun-88 16:51 by mct
                              doc "This is the default metaClass for all classes")
      (Supers FormEditor)
      (ClassVariables (HorizMethodItems #,($A ((Abort AbortBrowser "Abort name substitution operation") (Upda
te UpdateObject1 "Store editing changes without closing window")) UnionSuperValue NoUpdatePermitted))
            (PrintName "Substitution Editor"))
      (InstanceVariables (destObject NIL doc "the target object")))

(\BatchMethodDefs)

(Method ((ExamineCopySubstitutionFormContext ProcessListObject) self object folderClass
                                                                  elementClass)
                                                   mct: 9-Oct-87 08.41

   "Specialization"
   (_Super self ProcessListObject object (OR folderClass (@ self |:object:.VR|))
            elementClass))

(Method ((FOECopySubstitutionObject Initialize) self SourceObject DestObject NameLst SourceProgram
                                                  DestName)
                                                   mct 1 Jan-87 14 53

   "New method template"
   (_@ self %:sourceObject SourceObject)
```

```
  (_@ self %:destObject DestObject)
  (_@ self %:elements NameLst)
  (_@ self %:printName (CONCAT (COND
                                 ((ObjectExists? SourceObject)
                                  (_ SourceObject GetDescription))
                                 ((ObjectExists? SourceProgram)
                                  (_ SourceProgram GetName)))
                               " to "
                               (COND
                                  ((ObjectExists? DestObject)
                                   (@ DestObject %:printName))
                                  (T DestName))
                               ": Copy")))
```

(Method ((FOECopySubstitutionObject Invalid?) self)
mct: 22-Oct-87 13.16

```
   "New method template"
   (DECLARE (GLOBALVARS FISSubConflictToken))
   (bind error for element in (@ %:elements) when [SETQ error (for e in (CDR element)
                                                                do (COND
                                                                     ((EQ (CDR e)
                                                                          FISSubConflictToken)
                                                                      (RETURN (CAR e]
      do (RETURN error)))
```

(Method ((FOECopySubstitutionObject ProcessNonObjects) self ObjectLst)
mct 9 Oct 87 08 27

```
   "New method template"
   (for x in ObjectLst collect (CONS x x)))
```

Page 3

(Method ((GlobalReplaceAnyContext ComputeReplacementObjs) self Object)
mct: 3-Nov-87 16.11

```
   "New method template"
   (AND Object (FISFindAllLeaves Object)))
```

(Method ((GlobalReplaceBrowser Browse) self context object)
mct: 19-Jan-88 15.03

```
   "Specialization"
   (DECLARE (GLOBALVARS FISGlobalReplaceBrowserWidth FISGlobalReplaceBrowserHeight))
   (LET (objs)
     (_ self PositionBrowser FISGlobalReplaceBrowserWidth FISGlobalReplaceBrowserHeight)
     (_Super self Browse context object)
     (OPENW (@ %:window))))
```

(Method ((GlobalReplaceBrowser CheckOpenBrowsers) self Objects)
mct: 2-Feb-88 18.46

```
   "New method template"
   (LET (brwsrs msg)
     (COND
       ((AND (SETQ brwsrs (for x in Objects join (_ x LocateBrowsers)))
             (SETQ brwsrs (INTERSECTION brwsrs brwsrs))
             (SETQ brwsrs (for x in brwsrs when (_ x HasChanges?) collect x)))
        [SETQ msg (CONCAT "The " (Plural "editor" (LENGTH brwsrs))
                          " open on: "
                          [CONCATLIST (for x on brwsrs collect (CONCAT (_ (CAR x)
                                                                          ConstructTitle)
                                                                       (OR (AND (CDR x)
                                                                                ", ")
                                                                           Nothing]
                          (COND
                             ((EQ (LENGTH brwsrs)
                                  1)
                              " needs updating.")
                             (T " need updating."]
        (COND
           ((MOUSECONFIRM msg "Click LEFT to update and continue, else RIGHT to abort text replacement")
            (for x in brwsrs do (_ x UpdateObject))
            T)))
       (T T))))
```

(Method ((GlobalReplaceBrowser ComputeReplacementObjs) self)
mct: 3-Nov-87 16.07

```
   "New method template"
   (_ (@ self %:context)
      ComputeReplacementObjs
      (ObjectExists? (@ %:object))))
```

(Method ((GlobalReplaceBrowser Process) self NoConfirm?)
mct 20-Nov-87 11.48

```
   "New method template"
   (LET (objs oldStr newStr noConfirm? (key (_ self ClassName))
            (context (@ %:context)))
     [COND
       ([MKATOM (_@ self %:sourceString (SETQ oldStr (_ self SWPromptForString (@ context |::SourceString|))
                                         ))]
        (_@ self %:destString (SETQ newStr (_ self SWPromptForString (@ context |::DestString|))))
        (SETQ noConfirm? (OR NoConfirm? (SELECTQ (MKATOM (_ self SWPromptForWord "Confirm replacements? "
                                                                              'Yes T))
```

```
                                          ((N NO No no n)
                                            T)
                                          NIL]
    (_ self SWPromptPrint "Searching...")
    [COND
      ((AND oldStr (SETQ objs (@ %:replacementObjs))
            (_ self CheckOpenBrowsers objs))
       (for obj in objs when (ObjectExists? obj) do (_ self SWPromptPrint "Searching...")
                                                    (_ obj ModifyPropList key self 'Browser self)
                                                    (COND
                                                      ((_ obj InstOf! 'GrafcetProgram)
                                                       (_ self ProcessGrafcetProgram obj oldStr newStr
                                                             context noConfirm?))
                                                      ((_ obj InstOf 'CProgram)
                                                       (_ self ProcessCProgram obj oldStr newStr context
                                                             noConfirm?))
                                                      ((_ obj InstOf 'GrafcetTransition)
                                                       (_ self ProcessGrafcetTransition obj oldStr newStr
                                                             context noConfirm?))
                                                      ((_ obj InstOf 'MMFSSendableMessageDefinition)
```

Page 4

```
                                                       (_ self ProcessSendableDefinition obj oldStr newStr
                                                             context noConfirm?))
                                                      ((_ obj InstOf 'MMFSReceivableMessageDefinition)
                                                       (_ self ProcessReceivableDefinition obj oldStr
                                                             newStr context noConfirm?))
                                                      (T (_ self SWPromptPrint (CONCAT "Text replacement
                                                                                 in unknown object:
                                                                                 (ClassName obj))
                                                                 NIL T NIL 1500)))
                                                    (_ obj ModifyPropList key NIL 'Browser self T)]
    (ADD.PROCESS '(SEND %. self ExitBrowser)])

(Method ((GlobalReplaceBrowser ProcessCProgram) self Object OldStr NewStr Context NoConfirm?)
                                                                          mct. 12-Nov-87 14:32
  "New method template"
  [LET (text)
    (COND
      ((SETQ text (_ self ProcessOne (@ Object %:printName)
                         (@ Object %:text)
                         OldStr NewStr Object Context NoConfirm?))
       (_@ Object %:text text)
       (_ Object ObjectChanged T)
       (_ self UpdateBrowsers Object)])

(Method ((GlobalReplaceBrowser ProcessGrafcetProgram) self Object OldStr NewStr Context
                                                              NoConfirm?)
                                                                          mct 31-Dec-87 12 29
  "New method template"
  [LET (folder text)
    [COND
      ((AND (SETQ text (@ Object %:cDecls))
            (NEQ 0 (NCHARS text))
            (SETQ text (_ self ProcessOne (CONCAT (@ Object %:printName)
                                                  " C Decls")
                              text OldStr NewStr Object Context NoConfirm?)))
       (_@ Object %:cDecls text)
       (_ Object ObjectChanged T)
       (_ self UpdateBrowsers Object 'CEDITOR)]
    (COND
      ([AND (_ Object InstOf! 'GrafcetMainProgram)
            (SETQ folder (ObjectExists? (@ Object %:mapAssociations)]
       (bind cFlg lcFlg for x in (@ folder %:elements)
          do (SETQ lcFlg NIL)
             [COND
               ((AND (SETQ text (@ x %:connectionVariable))
                     (NEQ 0 (NCHARS text)))
                (SETQ text (MKSTRING text))
                (COND
                  ((SETQ text (_ self ProcessOne (CONCAT (@ Object %:printName)
                                                         " Connection Variable")
                                     text OldStr NewStr Object Context NoConfirm?))
                   (_@ x %:connectionVariable (MKATOM text))
                   (SETQ lcFlg T)
                   (SETQ cFlg T]
             [COND
               ((AND (SETQ text (@ x %:local))
                     (NEQ 0 (NCHARS text)))
                (SETQ text (MKSTRING text))
                (COND
                  ((SETQ text (_ self ProcessOne (CONCAT (@ Object %:printName)
                                                         " Local Variable")
                                     text OldStr NewStr Object Context NoConfirm?))
                   (_@ x %:local (MKATOM text))
                   (SETQ lcFlg T)
                   (SETQ cFlg T]
             [COND
               ((AND (SETQ text (@ x %:remote))
                     (NEQ 0 (NCHARS text)))
                (SETQ text (MKSTRING text))
                (COND
```

```
((SETQ text (_ self ProcessOne (CONCAT (@ Object %:printName)
                                       " Remote Variable")
                       text OldStr NewStr Object Context NoConfirm?))
 (_@ x %:remote (MKATOM text))
 (SETQ lcFlg T)
 (SETQ cFlg T]
(COND
 (lcFlg (_ self UpdateBrowsers folder NIL x)))
finally (COND
 (cFlg (_ Object ObjectChanged T)]]
```

(Method ((GlobalReplaceBrowser ProcessGrafcetTransition) self Object OldStr NewStr Context NoConfirm?)

mcf 30-Dec-87 15 52

```
"New method template"
[LET (changeFlg text)
  (COND
    ((SETQ text (_ self ProcessOne (CONCAT (@ Object |:superObject:printName|)
                                           " Transition Label")
                     (@ Object %:label)
                     OldStr NewStr Object Context NoConfirm?))

      (* * (_ Object SetLabel text) cheat, so that the update will erase the label correctly)

      (_@ Object %:label text)
      (SETQ changeFlg T)))
  (COND
    ((AND (SETQ text (@ Object %:abbreviation))
          (SETQ text (_ self ProcessOne (CONCAT (@ Object |:superObject:printName|)
                                                " Transition Abbreviation")
                          text OldStr NewStr Object Context NoConfirm?)))

      (* * (_ Object SetLabel text) cheat, so that the update will erase the label correctly)

      (_@ Object %:abbreviation text)
      (SETQ changeFlg T)))
  (COND
    (changeFlg (_ self UpdateBrowsers Object NIL Object)

      (* * Still cheating, make sure its current now, in case we change it again)

           (_@ Object %:labelRegion NotSetValue)
           (@ Object %:labelRegion)
           (_ Object ObjectChanged T)])
```

(Method ((GlobalReplaceBrowser ProcessOne) self Title String Old New Object Context NoConfirm?)

mcf 28-Dec-87 14 03

```
"New method template"
(COND
  ((STRPOS Old String)
   (LET (stream newString cnt (string (MKSTRING String))
                (new (OR New ""))
                (context (OR Context (@ %:context)))
                (bName (@ |::PrintName|))
                (window (@ %:window)))
     (DECLARE (USEDFREE TotalCount))
     (_@ self %:title (CONCAT (OR (AND Title (CONCAT Title " "))
                                   Nothing)
                              bName))
     (_ self Update)
     (SETQ stream (OPENTEXTSTREAM string window))
     (TEDIT.SETSEL stream 1 (NCHARS string)
          'LEFT)
     [SETQ newString (COND
                       ((EQ 0 (SETQ cnt (TEDIT.SUBSTITUTE stream Old new (NOT NoConfirm?)
                                                          NIL)))
                        NIL)
                       (T (change (@ context %:totalcount)
                                  (IPLUS DATUM cnt))
                          (COERCETEXTOBJ stream 'STRINGP]
     (CLOSEF stream)
     newString))))
```

(Method ((GlobalReplaceBrowser ProcessReceivableDefinition) self Object OldStr NewStr Context NoConfirm?)

mcf 31 Dec-87 11 56

```
"New method template"
[LET (changeFlg temp text (mp (@ |:object:mainProgram|)))
  (COND
    ((SETQ text (_ self ProcessOne (CONCAT (@ Object %:destination)
                                           " Receive Template Fields")
                     (@ Object %:data)
                     OldStr NewStr Object Context NoConfirm?))
     (_@ Object %:data text)
     (SETQ changeFlg T)))
  (COND
    ((SETQ text (_ self ProcessOne (CONCAT (@ Object %:destination)
                                           " Receive Template Effect")
                     (@ Object %:action)
```

```
                    OldStr NewStr Object Context NoConfirm?))
      (_@ Object %:action text)
      (SETQ changeFlg T)))
   (COND
     ((SETQ text (_ self ProcessOne (CONCAT (@ Object %:destination)
                                             " Receive Template Comment")
                    (@ Object %:comment)
                    OldStr NewStr Object Context NoConfirm?))
      (_@ Object %:comment text)
      (SETQ changeFlg T)))
   (COND
     ((SETQ text (_ self ProcessOne (CONCAT (@ Object %:destination)
                                             " Receive Template Source")
                    (@ Object %:source)
                    OldStr NewStr Object Context NoConfirm?))
      (_@ Object %:source (MKATOM text))
      (SETQ changeFlg T)))
   (COND
     (changeFlg (_ (FISTemplatesForReceiver (@ Object %:destination)
                    NIL mp)
                 ObjectChanged T)
          (_ self UpdateBrowsers Object)
          (AND [SETQ temp (CADR (FASSOC (@ Object %:destination)
                                        (@ mp %:allReceiveStepAList)]
               (SETQ temp (@ temp %:receivableTemplates))
               (_ self UpdateBrowsers temp NIL Object)])
```

(Method ((GlobalReplaceBrowser ProcessSendableDefinition) self Object OldStr NewStr Context NoConfirm?)
mcf 31 Dec 87 12 31

```
  "New method template"
  [LET (changeFlg temp text (mp (@ |:object:mainProgram|)))
   (COND
     ((SETQ text (_ self ProcessOne (CONCAT (@ Object %:source)
                                             " Send Template Fields")
                    (@ Object %:data)
                    OldStr NewStr Object Context NoConfirm?))
      (_@ Object %:data text)
      (SETQ changeFlg T)))
   (COND
     ((SETQ text (_ self ProcessOne (CONCAT (@ Object %:source)
                                             " Send Template Destination")
                    (@ Object %:destination)
                    OldStr NewStr Object Context NoConfirm?))
      (_@ Object %:destination (MKATOM text))
      (SETQ changeFlg T)))
   (COND
     ((SETQ text (_ self ProcessOne (CONCAT (@ Object %:source)
                                             " Send Template Comment")
                    (@ Object %:comment)
                    OldStr NewStr Object Context NoConfirm?))
      (_@ Object %:comment text)
      (SETQ changeFlg T)))
   (COND
     (changeFlg (_ (FISTemplatesForSender (@ Object %:source)
                    NIL mp)
                 ObjectChanged T)
          (_ self UpdateBrowsers Object)
          (AND [SETQ temp (CADR (FASSOC (@ Object %:source)
                                        (@ mp %:allSendStepAList)]
               (SETQ temp (@ temp %:sendableTemplates))
               (_ self UpdateBrowsers temp NIL Object)])
```

(Method ((GlobalReplaceBrowser UpdateBrowsers) self Object BrowserType Arg1)
mcf: 12-Nov-87 14 52

```
  "New method template"
  (for x in (_ Object LocateBrowsers BrowserType) when (NEQ x self) do (_ x ContentsChanged Arg1)))
```

(Method ((GlobalReplaceContext Done) self) mcf 10-Nov-87 12 17

```
  "Specialization"
  (DEL.PROCESS (@ %:process))
  (_Super self Done))
```

(Method ((GlobalReplaceContext Start) self Object ContextArgs)
mcf: 19-Feb-88 15.02

```
  "Specialization"
  (_Super self Start Object ContextArgs)
  [AND (ObjectExists? self)
       (_@ %:process (ADD.PROCESS '(SEND %. (@ %:myBrowser)
                                          Process)
                      'NAME
                      'GlobalReplace))])
```

(Method ((GlobalReplaceVarContext ComputeReplacementObjs) self Object)
mcf: 3-Nov-87 16:11

```
  "New method template"
  (LET ((ss (@ |:myBrowser:sourceString|)))
    (AND Object ss (FISLeafUsers Object ss))))
```

```
(Method ((SubstitutionEditor AbortBrowser) self)                    mct: 15-Oct-87 11.18
  "Specialization"
  (_@ |:object:elements| 'Abort)                                    notify caller of abort
  (_ self ExitBrowser 'Abort))

(Method ((SubstitutionEditor Browse) self context object)
                                                                    mct 23-Dec-87 17 44
   "Specialization"
   (DECLARE (GLOBALVARS FISSubstitutionSepr))
   (LET (macros mmfsS mmfsR (elements (@ object %:elements)))
     [COND
       ((SETQ macros (CDR (FASSOC 'Macro elements)))
        (_ self CheckNameConflict macros 'Macro)
        (_@ object macroSDPairString (_ self ConstructString macros))]
     [COND
       ((SETQ mmfsS (CDR (FASSOC 'MMFSSend elements)))
        (_ self CheckNameConflict mmfsS 'MMFSSend)
        (_@ object mmfsSSDPairString (_ self ConstructString mmfsS))]
     [COND
       ((SETQ mmfsR (CDR (FASSOC 'MMFSReceive elements)))
        (_ self CheckNameConflict mmfsR 'MMFSReceive)
        (_@ object mmfsRSDPairString (_ self ConstructString mmfsR))]
     (_@ height (_ self GetNewHeight [TIMES (FONTPROP DEFAULTFONT 'HEIGHT)
                                        (IPLUS 1 (LENGTH mmfsR)
                                               (LENGTH mmfsS)
                                               (LENGTH macros)
                                               (TIMES 2 (LENGTH (@ object |::DisplayFields|)))]))
     (_@ width (_ self GetNewWidth
                   (IMAX [IPLUS (STRINGWIDTH "          " DEFAULTFONT)
                                (STRINGWIDTH FISSubstitutionSepr DEFAULTFONT)
                                (TIMES 2 (IPLUS (STRINGWIDTH (bind maxlen len str for x
                                                                in (APPEND macros mmfsR)
                                                                do (SETQ len (NCHARS (CAR x)))
                                                                   [COND
                                                                     ((OR (NULL maxlen)
                                                                          (IGREATERP len maxlen))
                                                                      (SETQ maxlen len)
                                                                      (SETQ str (CAR x)]
                                                                yield str)
                                                          DEFAULTFONT]
                         (@ width))))
     (_Super self Browse context object)
     (TEXTPROP (WTextStream? (@ window))
            'FISTITLE NIL)
     [COND
       (mmfsS (_ self ProtectField mmfsR 'mmfsSSDPairString)]
     [COND
       (mmfsR (_ self ProtectField mmfsR 'mmfsRSDPairString)]
     [COND
       (macros (_ self ProtectField macros 'macroSDPairString)]
     (_ self SetSelection 'sourcePat))).
```

```
(Method ((SubstitutionEditor ChangeAndValidate) self Elements StringIV Type NoSubFlg)
                                                                    mct 5-Jan-87 16.31
   "New method template"
   (DECLARE (GLOBALVARS FISSubConflictToken))
   [LET (changeFlg parse parseLst sPat dPat newSD (object (@ object)))
     (SETQ newSD (@ object %:!\StringIV))
     (SETQ sPat (@ object sourcePat))
     (SETQ dPat (OR (@ object destPat)
                    ""))
     [SETQ parse (CC.SimpleTokenParse (OPENSTRINGSTREAM (\ThinString newSD]

     .. Kill the EOF at the end

     (AND (LISTP parse)
          (RPLACD (NLEFT parse 2)
                  NIL))

     .. Convert parse to a list of conses

     [SETQ parseLst (bind frst rest while parse collect (match parse with (frst_&
                                                                           %'-> rest_$))
                                        (PROG1 (COND
                                                 ((AND rest (NEQ (CADR rest)
                                                                 '->))
                                                  (SETQ parse (CDR rest))
                                                  (CONS frst (CAR rest)))
                                                 (rest (SETQ parse rest)
                                                       (CONS frst frst))
                                                 (T (SETQ parse (CDR parse))
                                                    NIL))
                                               (SETQ rest]

     .. Check for manual changes, and force update if there are any

     (bind new for e in Elements when (AND (SETQ new (FASSOC (CAR e)
                                                             parseLst))
                                           (NEQ (CDR e)
                                                (CDR new)))
        do (SETQ changeFlg T))

     .. Do the specified replacement

     [COND
       (NoSubFlg)
```

```
        (sPat (for p in parseLst when (LISTP p) do (RPLACD p (COND
                                                                ((EQ (CDR p)
                                                                     FISSubConflictToken)
                                                                 (FISRplString (CAR p)
                                                                     sPat dPat T))
                                                                (T (FISRplString (CDR p)
                                                                       sPat dPat T]
      Validate the names and replace invalid ones
      (_ self CheckNameConflict parseLst Type)
      Update NIL and construct new display string
      (bind new for e in Elements when (AND (SETQ new (FASSOC (CAR e)
                                                              parseLst))
                                            (NEQ (CDR e)
                                                 (CDR new)))
         do (RPLACD e (CDR new))
            (SETQ changeFlg T))
      (COND
         (changeFlg (_@ |:object:!\StringIV| (_ self ConstructString Elements))
                (_ self SetFieldFromObject StringIV)
                (_ self ProtectField Elements StringIV)]))
```

(Method ((SubstitutionEditor CheckNameConflict) self NameLst Type)

mct 1 Jan-87 13 58

```
   "New method template"
   (DECLARE (GLOBALVARS FISSubConflictToken))
   [LET [(destObj (ObjectExists? (@ self |:object:destObject|)]
     (for p in NameLst when (LISTP p) do (COND
                                            ((AND destObj (_ destObj NameConflict? (CDR p)
                                                                   Type))
                                             (RPLACD p FISSubConflictToken))
                                            ((for q in NameLst when (LISTP q)
                                                thereis (EQ (CDR p)
                                                            (CDR q))
                                                yield (NEQ p q))
                                             (RPLACD p FISSubConflictToken]])
```

Page 9

(Method ((SubstitutionEditor ConstructString) self Lst)

mct: 22-Oct-87 14.07

```
   "New method template"
   (DECLARE (GLOBALVARS FISSubstitutionSepr))
   (bind (str _ "") for x in Lst do (SETQ str (CONCAT str (CHARACTER (CHARCODE CR))
                                                   (CAR x)
                                                   (CHARACTER (CHARCODE TAB))
                                                   FISSubstitutionSepr
                                                   (CDR x)))
      yield str))
```

(Method ((SubstitutionEditor ExitBrowser) self AbortFlg)

Edited 9-Aug-88 15:08 by mct

```
   "Specialization:  AbortFlg is a kludge so we can edit/update/abort with the same method"
   [LET (invalid)
     (COND
        ((EQ AbortFlg 'Abort)
         (_Super self ExitBrowser))
        ((_ self UpdateObject1 NIL NIL T)
         (COND
           ((SETQ invalid (_ (@ self object)
                              Invalid?))
            (_ self SWPromptPrint (CONCAT "ERROR: " invalid " substitution invalid")
                   NIL T NIL 2000))
           (T (_Super self ExitBrowser)]))
```

(Method ((SubstitutionEditor ProtectField) self Elements StringIV)

mct 28 Oct-87 09.57

```
   "New method template"
   (_ self SetSelection StringIV)
   (bind pos prev (len _ (NCHARS FISSubstitutionSepr))
         (stream _ (WTextStream? (@ %:window))) for x in Elements
      when (AND [COND
                   (pos (SETQ prev (IPLUS (TEDIT.FIND stream (CONSTANT (CHARACTER (CHARCODE CR)))
                                                   pos)
                                          1)))
                   (T (SETQ prev (GETFILEPTR stream]
                (SETQ pos (TEDIT.FIND stream FISSubstitutionSepr prev)))
      do (add pos len)                              (* (TEDIT LOOKS stream (QUOTE (PROTECTED ON))
                                                    (SUB1 prev) (IDIFFERENCE pos prev)))
         (\TEDIT.CHANGE.LOOKS stream '(PROTECTED ON)
                (SUB1 prev)
                (IDIFFERENCE pos prev))))
```

(Method ((SubstitutionEditor UpdateObject1) self SubObject Item NoSubFlg)

Edited 9 Aug 88 15 08 by mct
mct 22 Mar 88 10 39

```
   "Specialization"
   [LET (condition elements macros mmfsS mmfsR sIV temp)
     (_ self UpdateObject)
     (COND
        ((SETQ elements (@ |:object:elements|))
```

```
(RESETLST
    (RESETSAVE CC.ErrorStream (FUNCTION FISSubEdParseError))
    (CONDITIONS:HANDLER-CASE (PROGN (COND
                                        ((SETQ mmfsS (CDR (FASSOC 'MMFSSend elements)))
                                         (SETQ sIV 'mmfsSSDPairString)
                                         (_ self ChangeAndValidate mmfsS sIV 'MMFSSend NoSubFlg)))
                                    (COND
                                        ((SETQ mmfsR (CDR (FASSOC 'MMFSReceive elements)))
                                         (SETQ sIV 'mmfsRSDPairString)
                                         (_ self ChangeAndValidate mmfsR sIV 'MMFSReceive NoSubFlg)))
                                    (COND
                                        ((SETQ macros (CDR (FASSOC 'Macro elements)))
                                         (SETQ sIV 'macroSDPairString)
                                         (_ self ChangeAndValidate macros sIV 'Macro NoSubFlg)))
                                    (_ self SetSelection 'sourcePat)

                                    .. confirm with T if everything checked

                                    T)
           (FIS-SUBPARSE-ERROR (condition)
                  (COND
                     ((SETQ temp (NUMBERP (FIS-SUBPARSE-ERROR-POS condition)))
                      (_ self SetSelection sIV temp)))
                  (_ self SWPromptPrint (CONCAT "ERROR: " (FIS-SUBPARSE-ERROR-MESSAGE condition)
                                                (COND
                                                   ((SETQ temp (FIS-SUBPARSE-ERROR-MESSAGE1 condition
                                                                                              ))
                                                    (CONCAT " " temp))
                                                                                          Page 10

                                                    (T "")))
                        NIL T NIL 2000)

                  . return NIL if error occurred

                  NIL)))])

(\UnbatchMethodDefs)

(RPAQQ FISGlobalReplaceBrowserWidth 400)

(RPAQQ FISGlobalReplaceBrowserHeight 250)

(RPAQQ FISSubConflictToken ?)

(RPAQQ FISSubstitutionSepr " -> ")

(DECLARE%: DOEVAL@COMPILE DONTCOPY

(GLOBALVARS FISGlobalReplaceBrowserWidth FISGlobalReplaceBrowserHeight FISSubConflictToken
       FISSubstitutionSepr FISValidCIdentifierChars FISValidCIdentifierNegBT)
)

(DEFINEQ
```

(CopyNameSubInterface

```
  [LAMBDA (self SourceObject DestObject XLations SourceProgram DestName)
                                                                  Edited 3-Aug 88 16:41 by mcl

    .. SourceObject and DestObject are passed in when copying a macro step  SourceProgram and DestName are passed in when copying a main program

    (LET (brwsr context mNames mmfsSNames mmfsRNames newNames obj omNames omQNames ommfsSNames ommfsRNames
                prg xlations)
      (SETQ xlations (OR XLations (create FISNameTranslations)))
      [COND
         [(SETQ prg (ObjectExists? SourceProgram))
          (SETQ omQNames (_ prg FindAllMacroSteps))
          (SETQ omNames (for x in omQNames collect (FISDequalifyName x]
         [[SETQ prg (AND SourceObject (ObjectExists? (@ SourceObject macroProgram)]
          (SETQ omQNames (CONS (_ prg GetName)
                               (_ prg FindAllMacroSteps)))
          (SETQ omNames (for x in omQNames collect (FISDequalifyName x]
         ([SETQ omNames (AND SourceObject (MKATOM (@ SourceObject label))]
          (SETQ omQNames (FISQualifyName SourceObject omNames]
      [COND
         (prg (SETQ ommfsSNames (for x in (_ prg ComputeS/RStepALists 'Send) collect (CAR x)))
              (SETQ ommfsRNames (for x in (_ prg ComputeS/RStepALists 'Receive) collect (CAR x]
      (COND
         ((OR omNames ommfsSNames ommfsRNames)
          [COND
             ((OR ommfsSNames ommfsRNames)
              (SETQ obj (_ (DEFERREDCONSTANT ($ FOECopyMMFSSubstitutionObject))
                           New)))
             (T (SETQ obj (_ (DEFERREDCONSTANT ($ FOECopySubstitutionObject))
                           New)]
          (_ obj Initialize SourceObject DestObject [LIST (CONS 'Macro (for x inside omNames
                                                                             collect (CONS x x)))
                                                           (CONS 'MMFSSend (for x inside ommfsSNames
                                                                                 collect (CONS x x)))
                                                           (CONS 'MMFSReceive (for x inside ommfsRNames
                                                                                    collect (CONS x x]
                SourceProgram DestName)
          (SETQ context (_ (@ context)
                           SpawnSubContext
                           (DEFERREDCONSTANT ($ ExamineCopySubstitutionFormContext))
                           obj))
          (until (SETQ newNames (@ self nameSubstitutionAList)) do (DISMISS 1000))
          (_@ self nameSubstitutionAList NIL)                      crock! give the subcontext time to exit
          (DISMISS 1000)))
```

```
(RESETFORM (CURSOR WAITINGCURSOR)
       (COND
          ((NEQ newNames 'Abort)
           (SETQ mNames (CDR (FASSOC 'Macro newNames)))
           (SETQ mmfsSNames (CDR (FASSOC 'MMFSSend newNames)))
           (SETQ mmfsRNames (CDR (FASSOC 'MMFSReceive newNames)))

           . Recompute names in case source object has changed beneath us

           [COND
              [(SETQ prg (ObjectExists? SourceProgram))
               (SETQ omQNames (_ prg FindAllMacroSteps))
               (SETQ omNames (for x in omQNames collect (FISDequalifyName x]
              [[SETQ prg (AND SourceObject (ObjectExists? (@ SourceObject macroProgram)]
               (SETQ omQNames (CONS (_ prg GetName)
                                    (_ prg FindAllMacroSteps)))
```

```
               (SETQ omNames (for x in omQNames collect (FISDequalifyName x]
              ([SETQ omNames (AND SourceObject (MKATOM (@ SourceObject label)]
               (SETQ omQNames (FISQualifyName SourceObject omNames]
           [COND
              (prg (SETQ ommfsSNames (for x in (_ prg ComputeS/RStepALists 'Send)
                                           collect (CAR x)))
                   (SETQ ommfsRNames (for x in (_ prg ComputeS/RStepALists 'Receive)
                                           collect (CAR x]
           (COND
              ([AND (OR (NOT omNames)
                        (for x inside omNames always (FASSOC x mNames)))
                    (OR (NOT ommfsSNames)
                        (for x inside ommfsSNames always (FASSOC x mmfsSNames)))
                    (OR (NOT ommfsRNames)
                        (for x inside ommfsRNames always (FASSOC x mmfsRNames]
               (replace MMFSSSteps of xlations with mmfsSNames)
               (replace MMFSRSteps of xlations with mmfsRNames)
               (replace MacroSteps of xlations with mNames)
               [replace MacroPrograms of xlations
                  with (for x inside omQNames collect (CONS x (FISQualifyName
                                                               DestObject
                                                               (CDR (FASSOC (FISDequalifyName x)
                                                                            mNames))
                                                               DestName]
               xlations)
              (T (_ self SWPromptPrint "ERROR: Source object has changed" NIL T NIL 2000)
                 NIL])
```

(FISFindAllLeaves

Edited 1 Aug 88 10:41 by mcf

```
  [LAMBDA (prog)
    (LET (macLst res)
      [COND
         ((AND prog (ObjectExists? prog)
               (_ prog InstOf! 'GrafcetProgram))
          (bind prg for mac in (_ prog FindAllMacroPrograms)
             do (push res mac)
                (pushlist res (@ mac transitions))
                (for x in (@ mac steps) do (COND
                                              ((_ x InstOf! 'GrafcetRegularStep)
                                               (for part in '(activation continuous deactivation)
                                                  when (SETQ prg (GetValue x part))
                                                  do (push res prg)))
                                              [(_ x InstOf 'GrafcetReceiveStep)
                                               (pushlist res (AND (@ x receivableTemplates)
                                                                  (@ x |:receivableTemplates:elements|]
                                              [(_ x InstOf 'GrafcetSendStep)
                                               (pushlist res (AND (@ x sendableTemplates)
                                                                  (@ x |:sendableTemplates:elements|]
                                              ((_ x InstOf' 'GrafcetTaskStep)
                                               (COND
                                                  ((SETQ prg (@ x task))
                                                   (push res prg]
      res])
```

(FISLeafUsers (* TAL "17-Dec-86 11:56")

```
  [LAMBDA (prog var)
    (LET ([nodes (UNION (_ prog WhoUses var 'testableVars)
                        (_ prog WhoUses var 'settableVars)]
          res)
      [for node in nodes do (COND
                               ((_ node InstOf 'GrafcetReceiveStep)
                                (for x in (AND (@ node %:receivableTemplates)
                                               (@ node |:receivableTemplates:elements|))
                                   when (OR (FMEMB var (@ x %:settableVars))
                                            (FMEMB var (@ x %:testableVars)))
                                   do (push res x)))
                               ((_ node InstOf 'GrafcetSendStep)
                                (for x in (AND (@ node %:sendableTemplates)
                                               (@ node |:sendableTemplates:elements|))
                                   when (FMEMB var (@ x %:testableVars)) do (push res x)))
                               ((_ node InstOf 'GrafcetRegularStep)
                                (bind x for part in '(activation continuous deactivation)
                                   when [AND (SETQ x (GetValue node part))
                                             (OR (FMEMB var (@ x %:settableVars))
                                                 (FMEMB var (@ x %:testableVars)]
                                   do (push res x)))
                               (T (push res node]
      res])
```

```
(FISRplString
  [LAMBDA (Str SrcPat DestPat AtomFlg)                    (* mcl%: "21-Oct-87 16.42")
    (LET (pos (newStr Str))
      [COND
        ((SETQ pos (STRPOS SrcPat Str))
         (SETQ newStr (CONCAT (OR (SUBSTRING Str 1 (SUB1 pos))
                                  Nothing)
                              DestPat
                              (OR (SUBSTRING Str (PLUS pos (NCHARS SrcPat))
                                             -1)
                                  Nothing]
      (COND
        (AtomFlg (MKATOM newStr))
        (T newStr])

(FISSubEdParseError
  [LAMBDA (File Line M1 M2 M3)                            . Edited 5-Aug-88 11:00 by mcl
    . (Signal 'IIIParse (CONS (GETFILEPTR File) M1))
    (SIGNAL 'FIS-SUBPARSE-ERROR :MESSAGE M1 :MESSAGE1 M2 :MESSAGE2 M3])
)

(PUTPROPS FISCOPY FILETYPE :FAKE-COMPILE-FILE)

(PUTPROPS FISCOPY COPYRIGHT ("Savoir, Inc." 1987 1988))
```

FUNCTION INDEX

FISChangeOrientation ............8
FISDocDocumentAll ...............2
FISDocDocumentOne ...............3
FISDocGetDocumentStream .........4
FISDocIndexEntry ................4
FISDocInitDocumentStream ........4
FISDocOpenDocumentStream ........4
FISDocPrintEntry ................5
FISDocPrintHeader ...............8
FISDocPrintHierarchy ............5
FISDocPrintIndex ................6
FISDocPrintTC ...................7
FISTurnPage .....................8
PrintWMFSFolder .................8

VARIABLE INDEX

FISAllowDocumentFlg .............2
FISDefaultDocumentationDevice ...2
FISDocCCodeFont .................2
FISDocCHeaderFont ...............2
FISDocCompressFlg ...............2
FISDocFromLeft ..................2
FISDocFromRight .................2
FISDocFromTop ...................2
FISDocHeaderFont ................2
FISDocIndentString ..............2
FISDocIndexHeaderString .........2
FISDocLandscapeChartFlg .........2
FISDocLandscapeFlg ..............2
FISDocLocalFlg ..................2
FISDocMinLinesLeft ..............2
FISDocWMFSPartOrientation .......2
FISDocShrinkChartFlg ............2
FISDocTCHeaderString ............2
FISDocumentProcess ..............2
FISDocWaitFlg ...................2
FISPrintHierarchyFlg ............1
GrafFonts .......................2
\FISDocumentationUninterruptable 2
\FISInterruptDocumentation ......2

PROPERTY INDEX

FISDOC ........................1,9

ADVICE INDEX (PUTWINDOWPROP :IN SHOWGRAPH) ...9

RECORD INDEX

GrafDocIndexEntry ...............9 changes to: (RECORDS GrafDocIndexEntry)
(VARS FISDOCCOMS)
(FNS FISDocDocumentAll FISDocIndexEntry FISDocPrintIndex FISDocPrintTC)

previous date: 29-Jun-88 15:04:52 {DSK}<LISPFILES>FIS>FISDOC.;49

Read Table: INTERLISP

Package: IL

; Copyright (c) 1986, 1987, 1997 1988 by Savoir, Inc.. All rights reserved.

```
(RPAQQ FISDOCCOMS
       ((DECLARE%: DONTCOPY (PROP MAKEFILE-ENVIRONMENT FISDOC))
        (VARS (FISPrintHierarchyFlg T)
              (FISDocLandscapeFlg NIL)
              (FISDocWMFSPartOrientation 'LANDSCAPE)
              (FISDocWaitFlg NIL)
              [GrafFonts '((TITAN 12 MRR)
                           (TITAN 12 MRR 90)
                           (HELVETICA 6 MRR)
                           (HELVETICA 6 MRR 90)
                           (HELVETICA 8 BRR)
                           (HELVETICA 8 BRR 90)
                           (HELVETICA 10 BRR)
                           (HELVETICA 10 BRR 90)
                           (HELVETICA 12 BRR)
                           (HELVETICA 12 BRR 90]
              (FISDocHeaderFont '(HELVETICA 12 BOLD))
              (FISDocCHeaderFont '(HELVETICA 10 BOLD))
              (FISDocCCodeFont '(TITAN 12))
              (FISDocIndentString "abcde")
              (FISDocIndexHeaderString "Index")
              (FISDocTCHeaderString "Table of Contents"))
        (INITVARS (FISDocLocalFlg NIL)
               (FISDocCompressFlg T)
               (FISDocMinLinesLeft 5)
               (FISDocFromTop 36)
               (FISDocFromLeft 36)
               (FISDocFromRight 36)
               (FISAllowDocumentFlg T)
               (FISDocumentProcess)
               (FISDocLandscapeChartFlg T)
               (FISDocShrinkChartFlg NIL)
               (\FISInterruptDocumentation)
               (\FISDocumentationUninterruptable)
               (FISDefaultDocumentationDevice '{RS232}.4045XLP))
        (GLOBALVARS \FISDocumentationUninterruptable \FISInterruptDocumentation FISPrintHierarchyFlg
```

```
        FISAllowDocumentFlg FISDefaultDocumentationDevice FISDocCCodeFont FISDocCHeaderFont
        FISDocCompressFlg FISDocFromLeft FISDocFromRight FISDocFromTop FISDocHeaderFont
        FISDocIndentString FISDocIndexHeaderString FISDocLandscapeFlg FISDocLandscapeChartFlg
        FISDocLocalFlg FISDocMWFSPartOrientation FISDocShrinkChartFlg FISDocTCHeaderString
        FISDocumentProcess FISDocWaitFlg)
  (FNS FISDocDocumentAll FISDocDocumentOne FISDocOpenDocumentStream FISDocGetDocumentStream
       FISDocIndexEntry FISDocInitDocumentStream FISDocPrintEntry FISDocPrintHierarchy FISDocPrintIndex
       FISDocPrintTC FISTurnPage FISChangeOrientation FISDocPrintHeader PrintMWFSFolder)
  (P (AND (BOUNDP '\ASCIITOISO)
          (ARRAYP \ASCIITOISO)
          (SETA \ASCIITOISO 95 95))

     .. Preload font metric files if you can

     (for x in GrafFonts do (FONTCREATE x NIL NIL NIL '4045XLP T))

     .. Additional font metric files used by tedit windows. etc

     (FONTCREATE 'GACHA 10 'MRR)
     (FONTCREATE 'GACHA 10 'BRR))
  (RECORDS GrafDocIndexEntry)
  (ADVISE PUTWINDOWPROP-IN-SHOWGRAPH)
  (PROP FILETYPE FISDOC)))

(DECLARE%: DONTCOPY

(PUTPROPS FISDOC MAKEFILE-ENVIRONMENT (:PACKAGE "IL" :READTABLE "INTERLISP" :BASE 10))
)
```

```
(RPAQQ FISPrintHierarchyFlg T)

(RPAQQ FISDocLandscapeFlg NIL)

(RPAQQ FISDocMWFSPartOrientation LANDSCAPE)

(RPAQQ FISDocWaitFlg NIL)

(RPAQQ GrafFonts
       ((TITAN 12 MRR)
        (TITAN 12 MRR 90)
        (HELVETICA 6 MRR)
        (HELVETICA 6 MRR 90)
        (HELVETICA 8 BRR)
        (HELVETICA 8 BRR 90)
        (HELVETICA 10 BRR)
        (HELVETICA 10 BRR 90)
        (HELVETICA 12 BRR)
        (HELVETICA 12 BRR 90)))

(RPAQQ FISDocHeaderFont (HELVETICA 12 BOLD))

(RPAQQ FISDocCHeaderFont (HELVETICA 10 BOLD))

(RPAQQ FISDocCCodeFont (TITAN 12))

(RPAQ FISDocIndentString "abcde")

(RPAQ FISDocIndexHeaderString "Index")

(RPAQ FISDocTCHeaderString "Table of Contents")

(RPAQ? FISDocLocalFlg NIL)

(RPAQ? FISDocCompressFlg T)

(RPAQ? FISDocMinLinesLeft 5)

(RPAQ? FISDocFromTop 36)

(RPAQ? FISDocFromLeft 36)

(RPAQ? FISDocFromRight 36)

(RPAQ? FISAllowDocumentFlg T)

(RPAQ? FISDocumentProcess )

(RPAQ? FISDocLandscapeChartFlg T)

(RPAQ? FISDocShrinkChartFlg NIL)

(RPAQ? \FISInterruptDocumentation )

(RPAQ? \FISDocumentationUninterruptable )

(RPAQ? FISDefaultDocumentationDevice '(RS232).4045XLP)

(DECLARE%: DOEVAL@COMPILE DONTCOPY

(GLOBALVARS \FISDocumentationUninterruptable \FISInterruptDocumentation FISPrintHierarchyFlg
       FISAllowDocumentFlg FISDefaultDocumentationDevice FISDocCCodeFont FISDocCHeaderFont FISDocCompressFlg
       FISDocFromLeft FISDocFromRight FISDocFromTop FISDocHeaderFont FISDocIndentString
       FISDocIndexHeaderString FISDocLandscapeFlg FISDocLandscapeChartFlg FISDocLocalFlg
       FISDocMWFSPartOrientation FISDocShrinkChartFlg FISDocTCHeaderString FISDocumentProcess FISDocWaitFlg)
)

(DEFINEQ
```

```
(FISDocDocumentAll
  [LAMBDA (Object AlphOrderFlg FileObj)                    Edited 2-Aug-88 10 46 by mcf
    (DECLARE (GLOBALVARS FISDocumentProcess \FISInterruptDocumentation \FISDocumentationUninterruptable))
    (LET (nodelst localFile localStream remoteFile index indexLst hierfile)
      [SETQ nodelst (for o inside Object collect (for x in (_ o FindAllMacroPrograms)
                                                  collect (COND
                                                            ((type? SWNameReference x)
                                                             (SWDereferenceName x))
                                                            (T x]
      [COND
        (AlphOrderFlg (for olst in nodelst do (SORT olst (FUNCTION (LAMBDA (A B)
                                                                    (ALPHORDER (@ A printName)
                                                                               (@ B printName)]
      (RESETLST
          (RESETSAVE \FISInterruptDocumentation NIL)                              Page 3


          (RESETSAVE \FISDocumentationUninterruptable NIL)
          (RESETSAVE FISDocumentProcess (THIS.PROCESS))
          [RESETSAVE NIL (LIST (FUNCTION (LAMBDA NIL
                                          (SELECTQ RESETSTATE
                                               ((NIL HARDRESET)
                                                    NIL)
                                               (printout SavoirPROMPTWINDOW T "--- Documentation Aborted"
                                                         " at " (DATE (DATEFORMAT NO.DATE))
                                                         T]
          (SETQ remoteFile (FISDocGetDocumentStream FileObj))
          [SETQ localStream (FISDocOpenDocumentStream (COND
                                                        (FISDocLocalFlg (SETQ localFile (PACKFILENAME
                                                                                          'HOST
                                                                                          'CORE
                                                                                          'DEVICE NIL
                                                                                          'DIRECTORY NIL
                                                                                          'EXTENSION
                                                                                          '4045XLP
                                                                                          'BODY remoteFile)))
                                                        (T remoteFile]
          [RESETSAVE NIL '(PROGN [AND (OPENP ,(KWOTE localStream))
                                     (CLOSEF ,(KWOTE localStream]
                                (AND ,(KWOTE localFile)
                                     (DELFILE ,(KWOTE localFile]
          (printout SavoirPROMPTWINDOW T)
          [COND
            (localStream (for olst in nodelst do (SETQ indexLst NIL)
                                                (FISDocInitDocumentStream localStream (@ (CAR olst)
                                                                                         printName))
                                                (AND FISPrintHierarchyFlg (FISDocPrintHierarchy
                                                                           (CAR olst)
                                                                           localStream))
                                                (for x in olst do [change indexLst (NCONC1 DATUM
                                                                                        (SETQ index
                                                                                         (create
                                                                                          GrafDocIndexEntry
                                                                                          ]
                                                                  (printout SavoirPROMPTWINDOW .TAB0 0
                                                                            "Documenting " (@ x printName)
                                                                            " ... ")
                                                                  (_ x Document localStream index)
                                                                  (printout SavoirPROMPTWINDOW " done"))
                                                (FISDocPrintIndex localStream indexLst)
                                                (FISDocPrintTC localStream indexLst]
          (CLOSEF localStream)
          (COND
            (FISDocLocalFlg (printout SavoirPROMPTWINDOW .TAB0 0 "Copying documentation to " remoteFile)
                    (COPYFILE localFile remoteFile))))
      (COND
        (localStream (printout SavoirPROMPTWINDOW .TAB0 0 "Documentation done")
               (FLASHWINDOW SavoirPROMPTWINDOW])

(FISDocDocumentOne
  [LAMBDA (Object File FileObj HierarchyOnlyFlg)              (* mcf%. 7-Oct-87 11 39")
    (DECLARE (GLOBALVARS FISDocumentProcess))
    (LET (name (file File))
      (RESETLST
          (RESETSAVE FISDocumentProcess (THIS.PROCESS))
          [RESETSAVE NIL (LIST (FUNCTION (LAMBDA NIL
                                          (SELECTQ RESETSTATE
                                               ((NIL HARDRESET)
                                                    NIL)
                                               (printout SavoirPROMPTWINDOW T "--- Documentation Aborted"
                                                         " at " (DATE (DATEFORMAT NO.DATE))
                                                         T]
          [RESETSAVE NIL '(AND file (CLOSEF file]
          (COND
            ([OR (AND file (OPENP file))
                 (AND (SETQ file (FISDocGetDocumentStream FileObj))
                      (SETQ file (FISDocOpenDocumentStream file]
             (for o inside Object do (SETQ name (@ o %:printName))
                                    (FISDocInitDocumentStream file name)
                                    (printout SavoirPROMPTWINDOW .TAB0 0 "Documenting " name " ... ")
                                    (COND
                                      (HierarchyOnlyFlg (FISDocPrintHierarchy o file))
                                      (T (_ o Document file)))
                                    (printout SavoirPROMPTWINDOW " done" T))
             file))))])
```

(FISDocOpenDocumentStream

```
  [LAMBDA (File Name)                                    (* mct%: "20-Feb-87 10:48")
    (LET (stream)
      (COND
        (File [SETQ stream (OPENIMAGESTREAM File '4045XLP (COND
                                                              (FISDocLandscapeFlg '(LANDSCAPE T))
                                                              (T '(PORTRAIT T]

              (FISDocInitDocumentStream stream Name)
              stream])
```

(FISDocGetDocumentStream

```
  [LAMBDA (Object Window)                                (* mct%: "19-Feb-87 16.01")
    (LET ((obj Object)
          (win Window))
      (COND
        (obj (_ obj SWPromptForString "Destination file name: " FISDefaultDocumentationDevice NIL 3 win))
        (T (_Proto (DEFERREDCONSTANT ($ GrafcetStructureBrowser))
                   SWPromptForString "Destination file name: " FISDefaultDocumentationDevice NIL 3
                   (OR win SavoirPROMPTWINDOW))])
```

(FISDocIndexEntry

```
  [LAMBDA (Stream Index Field Value)                     . Edited 2-Aug-88 10 48 by mct
    (LET (pageNo value)
      [AND Stream (SETQ pageNo (STREAMPROP Stream 'PAGENUMBER]
      (SETQ value (CONS Value pageNo))
      (AND Index (SELECTQ Field
                          (GrafProg (replace GrafProg of Index with value))
                          (GrafDecls (replace GrafDecls of Index with value))
                          (GrafAct (change (fetch GrafAct of Index)
                                           (NCONC1 DATUM value)))
                          (GrafCont (change (fetch GrafCont of Index)
                                            (NCONC1 DATUM value)))
                          (GrafDeAct (change (fetch GrafDeAct of Index)
                                             (NCONC1 DATUM value)))
                          (GrafSend (change (fetch GrafSend of Index)
                                            (NCONC1 DATUM value)))
                          (GrafRecv (change (fetch GrafRecv of Index)
                                            (NCONC1 DATUM value)))
                          (GrafTaskProg (change (fetch GrafTaskProg of Index)
                                                (NCONC1 DATUM value)))
                          (GrafTaskParam
                               (change (fetch GrafTaskParam of Index)
                                       (NCONC1 DATUM value)))
                          (GrafProcParam
                               (change (fetch GrafProcParam of Index)
                                       (NCONC1 DATUM value)))
                          NIL])
```

(FISDocInitDocumentStream

```
  [LAMBDA (Stream Name)                                  (* mct%. "20-Feb-87 12 11")
    (LET (clip sc)
      (SETQ clip (DSPCLIPPINGREGION NIL Stream))
      (SETQ sc (DSPSCALE NIL Stream))
      (DSPFONT '(HELVETICA 10 BOLD)
             Stream)
      (DSPLEFTMARGIN (FIXR (TIMES FISDocFromLeft sc))
             Stream)
      (DSPRIGHTMARGIN (IDIFFERENCE (fetch PRIGHT of clip)
                                   (FIXR (TIMES FISDocFromRight sc)))
             Stream)
      (DSPTOPMARGIN (IDIFFERENCE (fetch PTOP of clip)
                                 (FIXR (TIMES FISDocFromTop sc)))
             Stream)
      (DSPBOTTOMMARGIN (FIXR (TIMES FISDocFromTop sc))
             Stream)
      (STREAMPROP Stream 'HEADING NIL)
      (STREAMPROP Stream 'PAGENUMBER NIL)
      (DSPNEWPAGE Stream)
      (STREAMPROP Stream 'HEADING (CONCAT (OR (AND Name (CONCAT Name " Docementation"))
                                              "Grafcet Documentation")

                                          (DATE)))
      (STREAMPROP Stream 'HEADINGFONT (FONTCREATE FISDocHeaderFont NIL NIL NIL '4045XLP))
      (STREAMPROP Stream 'PAGENUMBER 0)
      (STREAMPROP Stream 'PAGESTRING 'Page% |)
```

(FISDocPrintEntry

```
  [LAMBDA (Stream Items Indent Right)                    (* mct%: " 1-Dec-86 10:19")
    (LET [dotwidth (indent (OR Indent (DSPLEFTMARGIN NIL Stream]
      (SETQ dotwidth (STRINGWIDTH "." Stream))
      (bind tleft tright for i in Items do (DSPXPOSITION indent Stream)
                                           (printout Stream (CAR i))
                                           (SETQ tleft (IPLUS indent (STRINGWIDTH (CAR i)
                                                                                   Stream)
                                                              dotwidth))
                                           [SETQ tright (IDIFFERENCE Right (IPLUS dotwidth
                                                                                  (STRINGWIDTH (CDR i)
                                                                                               Stream]
                                           (DSPXPOSITION tleft Stream)
                                           (from 1 to (IQUOTIENT (IDIFFERENCE tright (IPLUS tleft dotwidth))
                                                                 dotwidth)
                                              do (printout Stream "."))
                                           (DSPXPOSITION tright Stream)
                                           (printout Stream (CDR i)
                                                  T])
```

```
(FISDocPrintHierarchy
  [LAMBDA (Object Stream)                                          (* mcf%. "23-Oct-87 12:33")
    (AND Object Stream (LET [clip scale name nodelst graph oldHead pos str dspBM BM WIDTH HEIGHT REGION
                              (GSB (DEFERREDCONSTANT ($ GrafcetStructureBrowser]
                         (STREAMPROP Stream 'PAGENUMBER NIL)
                         (SETQ oldHead (STREAMPROP Stream 'HEADING NIL))
                         (SETQ nodelst (_Proto GSB GetNodeList (CONS Object)))
                         (SETQ graph (LAYOUTGRAPH nodelst (CONS Object)
                                                  (@ GSB %:graphFormat)))
                         (SETQ REGION (GRAPHREGION graph))

        (* fudge factors on WIDTH and HEIGHT required because the scaledbitblt in the 4045 code blows it unless the bitmap is bigger than it
        needs to be)

                         (replace WIDTH of REGION with (IPLUS (fetch WIDTH of REGION)
                                                              (TIMES WBorder 2)
                                                              2))
                         (replace HEIGHT of REGION with (IPLUS (fetch HEIGHT of REGION)
                                                               (TIMES WBorder 2)
                                                               6))
                         (SETQ BM (BITMAPCREATE (fetch WIDTH of REGION)
                                         (fetch HEIGHT of REGION)))
                         [DISPLAYGRAPH graph (SETQ dspBM (DSPCREATE BM))
                               NIL
                               (SETQ pos (create POSITION
                                                 XCOORD _ (ABS (fetch LEFT of REGION))
                                                 YCOORD _ (ADD1 (ABS (fetch BOTTOM of REGION]
                         (for node in nodelst when [NOT (OR (AND (ObjectExists? (CAR node))
                                                                 (CAR node))
                                                            (SWDereferenceName (CAR node]
                            do (RESET/NODE/BORDER node 1 dspBM graph pos))
                         [COND
                            (REGION (SETQ WIDTH (fetch WIDTH of REGION))
                                   (SETQ HEIGHT (fetch HEIGHT of REGION)))
                            (T (SETQ WIDTH (BITMAPWIDTH BM))
                               (SETQ HEIGHT (BITMAPHEIGHT BM]
                         (FISTurnPage Stream 'PORTRAIT)
                         (SETQ clip (DSPCLIPPINGREGION NIL Stream))
                         (for old scale in '(4 2 1) until (AND (ILEQ (TIMES WIDTH scale)
                                                                     (fetch WIDTH of clip))
                                                               (ILEQ (TIMES HEIGHT scale)
                                                                     (fetch HEIGHT of clip)))
                            do T)
                         (COND
                            ((AND (EQ scale 1)
                                  (IGREATERP WIDTH HEIGHT))
                             (FISTurnPage Stream 'LANDSCAPE)
                             (SETQ clip (DSPCLIPPINGREGION NIL Stream))
                             (for old scale in '(4 2 1) until (AND (ILEQ (TIMES WIDTH scale)
                                                                         (fetch WIDTH of clip))
                                                                   (ILEQ (TIMES HEIGHT scale)
                                                                         (fetch HEIGHT of clip)))
                                do T)))
                         (DSPFONT FISDocHeaderFont Stream)
                         (SETQ str (CONCAT "Documentation for " (@ Object %:printName)
                                          " hierarchy"))
                         (DSPXPOSITION (IDIFFERENCE (IPLUS (DSPLEFTMARGIN NIL Stream)
                                                           (LRSH (IDIFFERENCE (DSPRIGHTMARGIN NIL Stream)
                                                                              (DSPLEFTMARGIN NIL Stream))
                                                                 1))
                                              (LRSH (STRINGWIDTH str Stream)                              Page 6

                                                    1))
                               Stream)
                         (printout Stream str T)
                         (SCALEDBITBLT BM 0 0 Stream (MAX 0 (IQUOTIENT (DIFFERENCE (fetch WIDTH of clip)
                                                                                   (TIMES WIDTH scale))
                                                                       2))
                               (MAX 0 (IQUOTIENT (DIFFERENCE (fetch HEIGHT of clip)
                                                             (TIMES HEIGHT scale))
                                                 2))
                               WIDTH HEIGHT NIL NIL NIL NIL scale)
                         (STREAMPROP Stream 'PAGENUMBER 0)
                         (STREAMPROP Stream 'HEADING oldHead)
                         name])

(FISDocPrintIndex
  [LAMBDA (Stream IndexLst)                                        . Edited 2-Aug-88 11:07 by mcf
    (LET (left right dotwidth indent iwidth width gps cdecls cpa cpc cpd mts mtr pprm tprg tprm (turnPageFlg
                                                                                                T))
      (DECLARE (SPECVARS turnPageFlg))
      (STREAMPROP Stream 'PAGENUMBER 0)
      (STREAMPROP Stream 'PAGESTRING 'Index% )
      (FISTurnPage Stream 'PORTRAIT)
      (SETQ left (DSPLEFTMARGIN NIL Stream))
      (SETQ right (DSPRIGHTMARGIN NIL Stream))
      (DSPFONT FISDocHeaderFont Stream)
      (SETQ width (STRINGWIDTH FISDocIndexHeaderString Stream))
      (printout Stream T)
      (DSPXPOSITION (IDIFFERENCE (IPLUS left (LRSH (IDIFFERENCE right left)
                                                   1))
                               (LRSH width 1))
            Stream)
      (printout Stream FISDocIndexHeaderString T T)
```

```
(DSPFONT FISDocHeaderFont Stream)
(SETQ dotwidth (STRINGWIDTH "." Stream))
(SETQ iwidth (STRINGWIDTH FISDocIndentString Stream))
(SETQ indent (IPLUS left iwidth))
[bind item for i in IndexLst do [COND
                                   ((SETQ item (fetch GrafProg of i))
                                    (change gps (NCONC1 DATUM item]
                                [COND
                                   ((SETQ item (fetch GrafDecls of i))
                                    (change cdecls (NCONC1 DATUM item]
                                [COND
                                   ((SETQ item (fetch GrafAct of i))
                                    (change cpa (NCONC DATUM item]
                                [COND
                                   ((SETQ item (fetch GrafCont of i))
                                    (change cpc (NCONC DATUM item]
                                [COND
                                   ((SETQ item (fetch GrafDeAct of i))
                                    (change cpd (NCONC DATUM item]
                                [COND
                                   ((SETQ item (fetch GrafSend of i))
                                    (change mts (NCONC DATUM item]
                                [COND
                                   ((SETQ item (fetch GrafRecv of i))
                                    (change mtr (NCONC DATUM item]
                                [COND
                                   ((SETQ item (fetch GrafTaskProg of i))
                                    (change tprg (NCONC DATUM item]
                                [COND
                                   ((SETQ item (fetch GrafTaskParam of i))
                                    (change tprm (NCONC DATUM item]
                                (COND
                                   ((SETQ item (fetch GrafProcParam of i))
                                    (change pprm (NCONC DATUM item]
(COND
   (cdecls (printout Stream "C Declarations:" T T)
           (FISDocPrintEntry Stream (SORT cdecls (FUNCTION UALPHORDERCAR))
                   indent right)
           (TERPRI Stream)))
[COND
   ((OR cpa cpc cpd)
    (printout Stream "Step Programs:" T T)
    (COND
       (cpa (DSPXPOSITION indent Stream)
            (printout Stream "Activation Programs:" T T)
            (FISDocPrintEntry Stream (SORT cpa (FUNCTION UALPHORDERCAR))
                    (IPLUS indent iwidth)
                    right)
            (TERPRI Stream)))
    (COND
       (cpc (DSPXPOSITION indent Stream)
            (printout Stream "Continuous Programs:" T T)
            (FISDocPrintEntry Stream (SORT cpc (FUNCTION UALPHORDERCAR))
                    (IPLUS indent iwidth)
                    right)
            (TERPRI Stream)))
    (COND
       (cpd (DSPXPOSITION indent Stream)
            (printout Stream "De-Activation Programs:" T T)
            (FISDocPrintEntry Stream (SORT cpd (FUNCTION UALPHORDERCAR))
                    (IPLUS indent iwidth)
                    right)
            (TERPRI Stream]
(COND
   (gps (printout Stream "Grafcet Programs:" T T)
        (FISDocPrintEntry Stream (SORT gps (FUNCTION UALPHORDERCAR))
                indent right)
        (TERPRI Stream)))
[COND
   ((OR tprg tprm)
    (printout Stream "Task Step Information:" T T)
    (COND
       (tprg (DSPXPOSITION indent Stream)
             (printout Stream "Task Programs:" T T)
             (FISDocPrintEntry Stream (SORT tprg (FUNCTION UALPHORDERCAR))
                     (IPLUS indent iwidth)
                     right)
             (TERPRI Stream)))
    (COND
       (tprm (DSPXPOSITION indent Stream)
             (printout Stream "Task Parameters:" T T)
             (FISDocPrintEntry Stream (SORT tprm (FUNCTION UALPHORDERCAR))
                     (IPLUS indent iwidth)
                     right)
             (TERPRI Stream]
(COND
   (pprm (printout Stream "Process Step Information:" T T)
         (DSPXPOSITION indent Stream)
         (printout Stream "Process Parameters:" T T)
         (FISDocPrintEntry Stream (SORT pprm (FUNCTION UALPHORDERCAR))
                 (IPLUS indent iwidth)
                 right)
         (TERPRI Stream)))
(COND
   ((OR mts mtr)
    (printout Stream "Message Templates:" T T)
    (COND
       (mts (DSPXPOSITION indent Stream)
```

Page 7

```
        (printout Stream "Sendable Templates:" T T)
        (FISDocPrintEntry Stream (SORT mts (FUNCTION UALPHORDERCAR))
               (IPLUS indent iwidth)
               right)
        (TERPRI Stream)))
  (COND
     (mtr (DSPXPOSITION indent Stream)
        (printout Stream "Receivable Templates:" T T)
        (FISDocPrintEntry Stream (SORT mtr (FUNCTION UALPHORDERCAR))
               (IPLUS indent iwidth)
               right)
        (TERPRI Stream])
```

(FISDocPrintTC

```
 [LAMBDA (Stream IndexLst)                                    Edited 2-Aug-88 11:09 by mcf
   (LET (left right dotwidth width (turnPageFlg T))
     (DECLARE (SPECVARS turnPageFlg)
            (GLOBALVARS FISDocHeaderFont FISDocTCHeaderString FISDocCHeaderFont))
     (STREAMPROP Stream 'PAGENUMBER NIL)
     (FISTurnPage Stream 'PORTRAIT)
     (SETQ left (DSPLEFTMARGIN NIL Stream))
     (SETQ right (DSPRIGHTMARGIN NIL Stream))
     (DSPFONT FISDocHeaderFont Stream)
     (SETQ width (STRINGWIDTH FISDocTCHeaderString Stream))
     (printout Stream T T T)
     (DSPXPOSITION (IDIFFERENCE (IPLUS left (LRSH (IDIFFERENCE right left)
                                                  1))
                          (LRSH width 1))
            Stream)
     (printout Stream FISDocTCHeaderString T T)
     (DSPFONT FISDocCHeaderFont Stream)
     (SETQ dotwidth (STRINGWIDTH "." Stream))
```

Page 3

```
     (FISDocPrintEntry Stream (for i in IndexLst collect (fetch GrafProg of i))
            left right])
```

(FISTurnPage

```
 [LAMBDA (Stream Orient)                                       Edited 5-Jun-88 12:21 by
   (DECLARE (USEDFREE turnPageFlg))
   (COND
      ((FISChangeOrientation Stream Orient)
       (SETQ turnPageFlg NIL))
      (turnPageFlg (DSPNEWPAGE Stream)
             (SETQ turnPageFlg NIL])
```

(FISChangeOrientation

```
 [LAMBDA (Stream Orient noNewPageFlg)                          (* mcf%. "18-Nov-86 17:18")
   (COND
      ((AND (IMAGESTREAMTYPEP Stream '4045XLP)
            (NEQ (GETFILEINFO Stream 'ORIENTATION)
                 Orient))
       (LET (clip sc top head page)
         (SETQ head (STREAMPROP Stream 'HEADING NIL))
         (SETQ page (STREAMPROP Stream 'PAGENUMBER NIL))
         (SETQ sc (DSPSCALE NIL Stream))
         (SETFILEINFO Stream 'ORIENTATION Orient)
         (SETQ clip (DSPCLIPPINGREGION NIL Stream))
         (DSPLEFTMARGIN (FIXR (TIMES FISDocFromLeft sc))
                Stream)
         (DSPRIGHTMARGIN (IDIFFERENCE (fetch PRIGHT of clip)
                                (FIXR (TIMES FISDocFromRight sc)))
                Stream)
         (DSPTOPMARGIN (IDIFFERENCE (fetch PTOP of clip)
                              (FIXR (TIMES FISDocFromTop sc)))
                Stream)
         (DSPBOTTOMMARGIN (FIXR (TIMES FISDocFromTop sc))
                Stream)
         (STREAMPROP Stream 'HEADING head)
         (STREAMPROP Stream 'PAGENUMBER page)
         (OR noNewPageFlg (DSPNEWPAGE Stream))
         T])
```

(FISDocPrintHeader

```
 [LAMBDA (Stream Text)                                         (* mcf%. "25-Nov-86 16:33")
   (LET (oldFont newFont)
     (DSPRESET Stream)
     (SETQ oldFont (DSPFONT NIL Stream))
     (SETQ newFont (DSPFONT FISDocHeaderFont Stream))
     (DSPYPOSITION (DIFFERENCE (DSPTOPMARGIN NIL Stream)
                         (IPLUS (TIMES 2 (FONTHEIGHT newFont))
                                (FONTDESCENT newFont)))
            Stream)
     (printout Stream Text T T)
     (DSPFONT oldFont Stream])
```

(PrintMMFSFolder

```
 [LAMBDA (folder stream)                                       Edited 5-Jun-88 12:53 by

   ; Compute the layout positions of the elements

   (LET (anObj charWid fields headings tabStops totalWidth tempStream widths (elements (@ folder %:elements)
                                                                                       )
               (font (DSPFONT NIL stream))
```

```
            (lineLength (LINELENGTH NIL stream))
            (columnSpace 4))
    (SETQ charwid (CHARWIDTH (CHARCODE A)
                             stream))
    (RESETLST
        [RESETSAVE (SETQ tempStream (OPENSTREAM "(CORE)FOLD.TMP" 'BOTH 'NEW))
              '(PROGN (COND
                        ((AND tempStream (OPENP tempStream))
                         (SETFILEPTR tempStream 0)
                         (COPYBYTES tempStream stream)
                         (DELFILE (CLOSEF tempStream]
        (LINELENGTH MAX.SMALLP tempStream)
        (SETQ anObj (OR (CAR elements)
                        (_ (@ folder |:elements:.VR|)
                           Prototype)))                    Get a typical element
        (SETQ fields (OR (@ folder |::SummaryFields|)
                         (@ anObj |::SummaryFields|)))     Names of I V s that make up summary
        (SETQ headings (bind tmp for field in fields collect (OR (ValueIfSet (@ anObj |:!\field:.heading|))
                                                                 (ValueIfSet (@ anObj |:!\field: heading|))
                                                                 "")))                          Page 9
                                                           heading for each column is heading prop of I V
        (COND
           ((for x in headings always (STREQUAL x ""))
            (SETQ headings NIL)))
        [SETQ widths (bind val for field in fields
                     collect [SETQ val (for x in elements maximize (NCHARS (OR (@ x %:!\field)
                                                                                ""]
                             (COND
                                ((LISTP (@ anObj %:!\field))
                                 (IDIFFERENCE val 2))
                                (T val]
        [AND headings (SETQ widths (for w in widths as h in headings collect (IMAX w (NCHARS h]
        [bind wideCol over while (PROGN (SETQ totalWidth (for x in widths sum (ADD1 x)))
                                        (SETQ over (DIFFERENCE totalWidth lineLength))
                                        (IGREATERP over 0))
           do (SETQ wideCol (for x on widths largest (CAR x)))
              (change (CAR wideCol)
                      (MAX (DIFFERENCE DATUM over)
                           (FIX (TIMES DATUM 0.6]
        [SETQ columnSpace (IMIN columnSpace (ADD1 (IQUOTIENT (DIFFERENCE lineLength totalWidth)
                                                             (LENGTH widths]
        (SETQ tabStops (bind (column _ 0) for w in widths eachtime (add column (IPLUS columnSpace w))
                          collect column))
        (push tabStops 0)                                  The first tab stop is always the left margin
        (COND
           (headings (for h in headings as t in tabStops do (printout tempStream .TAB t h))
                  (printout tempStream T T)))
        (bind val vals for subObject in elements
           do [SETQ vals (for field in fields as width in widths
                            collect (COND
                                       ((SETQ val (@ subObject %:!\field))
                                        (COND
                                           ((EQ 1 (NCHARS val))
                                            (LIST val))
                                           (T (BREAK.MSG.INTO.LINES val font (TIMES charwid width]
              (while (for v in vals thereis v) do (for vt on vals as t in tabStops
                                                     when (SETQ val (pop (CAR vt)))
                                                     do (TAB t 0 tempStream)
                                                        (printout tempStream val)))

              .. (bind val for field in fields as t in tabStops when (SETQ val (@ subObject !\field)) do (TAB t 0 tempStream) (COND ((LISTP val) (for item on
              .. val do (printout tempStream (CAR item)) (COND ((CDR item) (printout tempStream SP 1))))) (T (printout tempStream val))))

              (TERPRI tempStream)))])

)

(AND (BOUNDP '\ASCIITOISO)
     (ARRAYP \ASCIITOISO)
     (SETA \ASCIITOISO 95 95))

 . Preload font metric files if you can

(for x in GrafFonts do (FONTCREATE x NIL NIL NIL '4045XLP T))

 . Additional font metric files used by tedit windows. etc.

(FONTCREATE 'GACHA 10 'MRR)

(FONTCREATE 'GACHA 10 'BRR)

(DECLARE%: EVAL@COMPILE

(RECORD GrafDocIndexEntry (GrafProg GrafDecls GrafCProgs GrafTemplates GrafTasks GrafProcParam)
        (RECORD GrafCProgs (GrafAct GrafCont GrafDeAct))
        (RECORD GrafTemplates (GrafSend GrafRecv))
        (RECORD GrafTasks (GrafTaskProg GrafTaskParam)))
)

[XCL:REINSTALL-ADVICE  (PUTWINDOWPROP :IN SHOWGRAPH)
        :BEFORE
        '((:LAST (AND (EQ PROP 'HARDCOPYFN)
                      (SETQ VALUE NIL]

(READVISE (PUTWINDOWPROP :IN SHOWGRAPH))

(PUTPROPS FISDOC FILETYPE :FAKE-COMPILE-FILE)

(PUTPROPS FISDOC COPYRIGHT ("Savoir, Inc." 1986 1987 1997 1988))
```

FUNCTION INDEX

FISSetUpBackArrows ..............................2

VARIABLE INDEX

BA.GACHA10 .............1
BA.GACHA10BRR ..........1
BA.GACHA12 .............1
BA.GACHA8 ..............1
BA.HELVETICA10 .........1
BA.HELVETICA10BIR ......1
BA.HELVETICA10BRR ......1
BA.HELVETICA12 .........2
BA.HELVETICA12BRR ......2
BA.HELVETICA5 ..........2
BA.HELVETICA7 ..........2
BA.HELVETICA8 ..........2
BA.HELVETICA8BRR .......2
BA.MODERN8BIR ..........2
FISBackArrowBMLst ......1
FISBackArrowFixLst .....1

PROPERTY INDEX

FISFONTHACK ..........1,2

```
   changes to:  (VARS FISFONTHACKCOMS)
previous date:  10-May-88 18:47:27  (DSK)<LISPFILES>FIS>FISFONTHACK.;6
   Read Table:  INTERLISP
      Package:  IL
```

.. Copyright (c) 1988, 1988 by Savoir, Inc.. All rights reserved.

```
(RPAQQ FISFONTHACKCOMS
       ((DECLARE%: DONTCOPY (PROP MAKEFILE-ENVIRONMENT FISFONTHACK))
        [VARS [FISBackArrowFixLst '((HELVETICA 5)
                                    (HELVETICA 7)
                                    (HELVETICA 8)
                                    (HELVETICA 8 BRR)
                                    (HELVETICA 10)
                                    (HELVETICA 10 BRR)
                                    (HELVETICA 10 BIR)
                                    (HELVETICA 12)
                                    (HELVETICA 12 BRR)
                                    (GACHA 8)
                                    (GACHA 10)
                                    (GACHA 10 BRR)
                                    (GACHA 12)
                                    (MODERN 8 BIR]
              (FISBackArrowBMLst '(BA.HELVETICA5 BA.HELVETICA7 BA.HELVETICA8 BA.HELVETICA8BRR BA.HELVETICA10
                                         BA.HELVETICA10BRR BA.HELVETICA10BIR BA.HELVETICA12 BA.HELVETICA12BRR
                                         BA.GACHA8 BA.GACHA10 BA.GACHA10BRR BA.GACHA12 BA.MODERN8BIR]
        (VARS BA.GACHA10 BA.GACHA10BRR BA.GACHA12 BA.GACHA8 BA.HELVETICA10 BA.HELVETICA10BIR
              BA.HELVETICA10BRR BA.HELVETICA12 BA.HELVETICA12BRR BA.HELVETICA8 BA.HELVETICA8BRR BA.MODERN8BIR
              BA.HELVETICA7 BA.HELVETICA5)
        (FNS FISSetUpBackArrows)
        (PROP FILETYPE FISFONTHACK)))

(DECLARE%: DONTCOPY

(PUTPROPS FISFONTHACK MAKEFILE-ENVIRONMENT (:PACKAGE "IL" :READTABLE "INTERLISP" :BASE 10))
)

(RPAQQ FISBackArrowFixLst
       ((HELVETICA 5)
        (HELVETICA 7)
        (HELVETICA 8)
        (HELVETICA 8 BRR)
        (HELVETICA 10)
        (HELVETICA 10 BRR)
        (HELVETICA 10 BIR)
        (HELVETICA 12)
        (HELVETICA 12 BRR)
        (GACHA 8)
        (GACHA 10)
        (GACHA 10 BRR)
        (GACHA 12)
        (MODERN 8 BIR)))

(RPAQQ FISBackArrowBMLst (BA.HELVETICA5 BA.HELVETICA7 BA.HELVETICA8 BA.HELVETICA8BRR BA.HELVETICA10
                              BA.HELVETICA10BRR BA.HELVETICA10BIR BA.HELVETICA12 BA.HELVETICA12BRR
                              BA.GACHA8 BA.GACHA10 BA.GACHA10BRR BA.GACHA12 BA.MODERN8BIR))

(RPAQQ BA.GACHA10 _ )

(RPAQQ BA.GACHA10BRR _ )
```

```
(RPAQQ BA.GACHA12 _)

(RPAQQ BA.GACHA8 _)

(RPAQQ BA.HELVETICA10 _)

(RPAQQ BA.HELVETICA10BIR _)

(RPAQQ BA.HELVETICA10BRR _)

(RPAQQ BA.HELVETICA12 _)

(RPAQQ BA.HELVETICA12BRR _)

(RPAQQ BA.HELVETICA8 _)

(RPAQQ BA.HELVETICA8BRR _)

(RPAQQ BA.MODERN8BIR _)

(RPAQQ BA.HELVETICA7 _)

(RPAQQ BA.HELVETICA5 _)

(DEFINEQ

(FISSetUpBackArrows
  [LAMBDA (UndoFlg)                                          (* TAL "10-Jan-88 18:48")
    (bind fnt bm oldbm for fntlst in FISBackArrowFixLst when (SETQ fnt (FONTCREATE fntlst NIL NIL NIL NIL T))
       do (SETQ bm (PACK (CONS 'BA. fntlst)))
          (COND
             (UndoFlg (AND (SETQ oldbm (GETPROP bm 'OldBM))
                           (PUTCHARBITMAP 95 fnt oldbm)))
             (T (OR (GETPROP bm 'OldBM)
                    (PUTPROP bm 'OldBM (GETCHARBITMAP 95 fnt)))
                (PUTCHARBITMAP 95 fnt (EVAL bm])
)

(PUTPROPS FISFONTHACK FILETYPE :FAKE-COMPILE-FILE)

(PUTPROPS FISFONTHACK COPYRIGHT ("Savoir, Inc." 1986 1988))
```

FUNCTION INDEX

FISSyntaxCheckAll ..................................2
StartModuleTopLevel ..................................2

METHOD INDEX

ModuleFolder.ProcessNonObjects .....................3
ModuleFolderBrowser.Browse ..........................3
ModuleFolderBrowser.CleanupKills ....................3
ModuleFolderBrowser.ClearSelections .................3
ModuleFolderBrowser.CreateNewElement ................3
ModuleFolderBrowser.DoCommand .......................4
ModuleFolderBrowser.DoMiddleChoice ..................4
ModuleFolderBrowser.ElementChanged ..................4
ModuleFolderBrowser.FISTLAnimation ..................4
ModuleFolderBrowser.FISTLCheckGrafcetSyntax ........5
ModuleFolderBrowser.FISTLComm .......................5
ModuleFolderBrowser.FISTLCompile ....................6
ModuleFolderBrowser.FISTLCopy .......................6
ModuleFolderBrowser.FISTLCreate .....................6
ModuleFolderBrowser.FISTLDocAll .....................7
ModuleFolderBrowser.FISTLDocAlph ....................7
ModuleFolderBrowser.FISTLDocHierarchy ...............7
ModuleFolderBrowser.FISTLDocOne .....................7
ModuleFolderBrowser.FISTLDownload ...................7
ModuleFolderBrowser.FISTLGateConfig .................7
ModuleFolderBrowser.FISTLGateReset ..................7
ModuleFolderBrowser.FISTLHierarchy ..................7
ModuleFolderBrowser.FISTLLibraryStep ................7
ModuleFolderBrowser.FISTLManualMMFS .................8
ModuleFolderBrowser.FISTLNetworkStatus .............8
ModuleFolderBrowser.FISTLRemoteExec ................8
ModuleFolderBrowser.FISTLRename ....................8
ModuleFolderBrowser.FISTLSave ......................9
ModuleFolderBrowser.FISTLSaveCompile ...............10
ModuleFolderBrowser.FISTLSimulation ................10
ModuleFolderBrowser.FISTLTrim ......................10
ModuleFolderBrowser.FISTLUnLoad ....................11
ModuleFolderBrowser.FISTLView ......................11
ModuleFolderBrowser.FISTLViewDecls .................11
ModuleFolderBrowser.FISTLViewMapAssoc ..............11
ModuleFolderBrowser.GetGatewayUBNumber .............12
ModuleFolderBrowser.GetNewFile .....................12
ModuleFolderBrowser.LeftSelection ..................12
ModuleFolderBrowser.LeftTitleSelection .............12
ModuleFolderBrowser.MiddleTitleSelection ...........12
ModuleFolderBrowser.PositionBrowser ................12
ModuleFolderBrowser.Repaint ........................12
ModuleFolderBrowser.SelectionMethod ................13
ModuleFolderBrowser.SetSelections ..................13
ModuleFolderBrowser.SmashFile ......................13
ModuleFolderElement.ComputeObject ..................13
ModuleFolderElement.LocateFile .....................13
TopLevelModuleContext.ContextReturned ..............13

VARIABLE INDEX

FISGatewayUBNumber ..............2
FISGlobalModuleLst ..............2
FISMakefilesOptions ............14
FISModuleTLMethodItems .........14
NewFISModuleTLMethodItems ......14

CLASS INDEX

ModuleFolder ...........1
ModuleFolderBrowser ....1
ModuleFolderElement ....2
TopLevelModuleContext ..2

PROPERTY INDEX

FISGatewayUBNumber .....2
FISGlobalModuleLst .....2
FISMODULETL .........1,14 changes to: (METHODS ModuleFolderBrowser.FISTLLibraryStep ModuleFolderBrowser.FISTLCreate)
(VARS FISMODULETLCOMS)

previous date: 5-Sep-88 16:36:56 {DSK}<LISPFILES>FIS>FISMODULETL.;112

Read Table: INTERLISP

Package: IL

;; Copyright (c) 1986, 1987, 1987, 1988 by Savoir, Inc.. All rights reserved.

```
(RPAQQ FISMODULETLCOMS
       ((DECLARE%: DONTCOPY (PROP MAKEFILE-ENVIRONMENT FISMODULETL))
        (CLASSES ModuleFolder ModuleFolderBrowser ModuleFolderElement TopLevelModuleContext)
        (INITVARS (FISGlobalModuleLst)
               (FISGatewayUBNumber))
        (PROP GLOBALVAR FISGatewayUBNumber FISGlobalModuleLst)
        (FNS FISSyntaxCheckAll StartModuleTopLevel)
        (METHODS ModuleFolder.ProcessNonObjects ModuleFolderBrowser.Browse ModuleFolderBrowser.CleanupKills
               ModuleFolderBrowser.ClearSelections ModuleFolderBrowser.CreateNewElement
               ModuleFolderBrowser.DoCommand ModuleFolderBrowser.DoMiddleChoice
               ModuleFolderBrowser.ElementChanged ModuleFolderBrowser.FISTLAnimation
               ModuleFolderBrowser.FISTLCheckGrafcetSyntax ModuleFolderBrowser.FISTLComm
               ModuleFolderBrowser.FISTLCompile ModuleFolderBrowser.FISTLCopy ModuleFolderBrowser.FISTLCreate
               ModuleFolderBrowser.FISTLDocAll ModuleFolderBrowser.FISTLDocAlph
               ModuleFolderBrowser.FISTLDocHierarchy ModuleFolderBrowser.FISTLDocOne
               ModuleFolderBrowser.FISTLDownload ModuleFolderBrowser.FISTLGateConfig
               ModuleFolderBrowser.FISTLGateReset ModuleFolderBrowser.FISTLHierarchy
               ModuleFolderBrowser.FISTLLibraryStep ModuleFolderBrowser.FISTLManualMMFS
               ModuleFolderBrowser.FISTLNetworkStatus ModuleFolderBrowser.FISTLRemoteExec
               ModuleFolderBrowser.FISTLRename ModuleFolderBrowser.FISTLSave
               ModuleFolderBrowser.FISTLSaveCompile ModuleFolderBrowser.FISTLSimulation
               ModuleFolderBrowser.FISTLTrim ModuleFolderBrowser.FISTLUnLoad ModuleFolderBrowser.FISTLView
               ModuleFolderBrowser.FISTLViewDecls ModuleFolderBrowser.FISTLViewMapAssoc
               ModuleFolderBrowser.GetGatewayUBNumber ModuleFolderBrowser.GetNewFile
               ModuleFolderBrowser.LeftSelection ModuleFolderBrowser.LeftTitleSelection
```

```
            ModuleFolderBrowser.MiddleTitleSelection ModuleFolderBrowser.PositionBrowser
            ModuleFolderBrowser.Repaint ModuleFolderBrowser.SelectionMethod
            ModuleFolderBrowser.SetSelections ModuleFolderBrowser.SmashFile
            ModuleFolderElement.ComputeObject ModuleFolderElement.LocateFile
            TopLevelModuleContext.ContextReturned)
        [VARS NewFISModuleTLMethodItems (FISModuleTLMethodItems NewFISModuleTLMethodItems)
            (FISMakefilesOptions '(NEW FAST]
        (GLOBALVARS FISMakefilesOptions)
        (PROP FILETYPE FISMODULETL)))

(DECLARE%: DONTCOPY

(PUTPROPS FISMODULETL MAKEFILE-ENVIRONMENT (:PACKAGE "IL" :READTABLE "INTERLISP" :BASE 10))
)

(DEFCLASS ModuleFolder (MetaClass Class Edited%:          (* mct%: " 7-Jul-86 16.59")
                              doc "This is the default metaClass for all classes")
        (Supers Folder)
        (ClassVariables (SummaryFields (padding moduleName processName))
            (SortCompareFn NIL))
        (InstanceVariables (elements NIL VR #,($C ModuleFolderElement))))

(DEFCLASS ModuleFolderBrowser (MetaClass Class Edited%:          (* mct%: "27-Jan-88 15.24")
                                   doc "This is the default metaClass for all classes")
        (Supers FolderBrowser)
        (ClassVariables (PrintName "Process Directory")
            (MinSeparatorFields 4 doc "Separators drawn only if at least this many fields")
            (MethodItems #,($A (PROGN FISModuleTLMethodItems) EveryFetch NoUpdatePermitted)))
        (InstanceVariables (selections NIL doc "list of selected sub objects")
            (lastCommand NIL doc "Command flg - influences selection behavior")
            (commCache NIL doc "temporary cache on communication objects")
            (nameSubstitutionAList NIL doc "Names returned from the substitution browser")))
```

Page 2

```
(DEFCLASS ModuleFolderElement (MetaClass Class Edited%:          (* mct%: "28-Oct-87 08:49")
                                   doc "This is the default metaClass for all classes")
        (Supers ComputerObject)
        (ClassVariables (PrintName NIL)
            (Prototype #,($& ModuleFolderElement (GFVO.08Z%:.AI? . 870))))
        (InstanceVariables (padding NIL doc "extra space")
            (moduleName NIL doc "name of module as stored on object")
            (module #,($A ComputeObject AVSendSelf NoUpdatePermitted) doc "module object")
            (processName NIL doc "name of module as stored on object")
            (process #,($A ComputeObject AVSendSelf NoUpdatePermitted) doc "module object")
            (group NIL doc "group I'm a part of")
            (grouped NIL doc "objects in the group")
            (fileName #,($A LocateFile FFSendSelf ReplaceMe) doc "my home")))

(DEFCLASS TopLevelModuleContext (MetaClass Class Edited%:          (* mct%: " 3-Jul-86 07 56")
                                     doc "This is the default metaClass for all classes")
        (Supers ExamineFolderContentsContext)
        (ClassVariables (LinkedContexts NIL)
            (LinkedContextTypes NIL)
            (ChoiceContexts NIL)
            (SubContexts NIL)
            (SubContextTypes NIL)
            (Browser #,($C ModuleFolderBrowser)))
        (InstanceVariables (object NIL VR #,($C ModuleFolder))))

(RPAQ? FISGlobalModuleLst )

(RPAQ? FISGatewayU8Number )

(PUTPROPS FISGatewayU8Number GLOBALVAR T)

(PUTPROPS FISGlobalModuleLst GLOBALVAR T)

(DEFINEQ
```

(FISSyntaxCheckAll

```
  [LAMBDA (grafProg)                                       Edited 5-Jun-88 12.51 by
    (RESETLST
        (RESETSAVE (CURSOR WAITINGCURSOR))
        [RESETSAVE NIL (LIST (FUNCTION (LAMBDA NIL
                                  (SELECTQ RESETSTATE
                                      ((NIL HARDRESET)
                                          NIL)
                                      (FISCompileMsg (CONCAT "--- Syntax Check Aborted" " at "
                                                         (DATE (DATEFORMAT NO.DATE))
                                                         FISTwoCR FISOneCR]
        (RESETSAVE FISCompileProcess (THIS.PROCESS))
        (RESETSAVE (RESET.INTERRUPTS FISInterrupts T))
        (FISCompileMsg (CONCAT "--- Syntax Checking of " (@ grafProg %:printName)
                           " started at "
                           (DATE (DATEFORMAT NO.DATE))
                           FISTwoCR))
        (_ grafProg Lint! (FISGetCompileErrorStream))
        (FISCompileMsg (CONCAT "--- Finished " (@ grafProg %:printName)
                           " at "
                           (DATE (DATEFORMAT NO.DATE))
                           FISTwoCR FISOneCR)))])
```

(StartModuleTopLevel

```
  [LAMBDA (ModuleLst)                                      (* mct%. "29-Apr-88 15 43")
    (DECLARE (GLOBALVARS FISFirstQualVersion FISGlobalModuleLst FISOneCR FISQualifierRenameHack
                 FISVersionNumber))
    (LET (gramps modules)
```

```
(COND
   ((AND (NOT ModuleLst)
         FISGlobalModuleLst
         (MOUSECONFIRM (CONCAT FISOneCR "Recompute?")
                 "click LEFT to recompute, else RIGHT"))
     (SETQ FISGlobalModuleLst NIL)))
[COND
   [(NOT (SETQ modules (OR ModuleLst FISGlobalModuleLst)))
    (RESETLST
         (RESETSAVE (CURSOR WAITINGCURSOR))
         [SETQ gramps (for gmp in (_ ($ GrafcetMainProgram)
                                     AllInstances)
                      collect gmp when (AND (@ gmp %:printName)
                                            (NEQ gmp ($ SimpleInitialMainTemplate))
                                            (NEQ gmp ($ SimpleSendReceiveMainTemplate]
         [for gmp in gramps do (COND
                                  ((LESSP (@ gmp %:version)
                                          FISFirstQualVersion)
                                                                    (* Must add qualifiers to all named objects)
                                   (RESETVARS ((FISQualifierRenameHack T))
                                              (_ gmp CacheFlush!))
                                   (_ gmp QualifyCacheFlush!)
                                   (_@ gmp %:version FISVersionNumber))
                                  (T (_ gmp CacheFlush!))]]
     (SETQ modules (for gmp in gramps collect (_ gmp GetName)]
    (modules                                                        (* Protect against spurious names: it happened in an unexplained
                                                                    fashion at least once.)
           (SETQ modules (for x in modules when (SWDereferenceName x) collect x]
  (SETQ FISGlobalModuleLst modules)
  (StartTopLevelContext ($ TopLevelModuleContext)
        modules
        (LIST 'IgnoreEdit T])
```

Page 3

```
)

(\BatchMethodDefs)
```

(Method ((ModuleFolder ProcessNonObjects) self objects)
. mcf: 28-Oct-87 08:38

```
  "Specialization"
  [LET ((vr (@ |:elements:.VR|)))
    (SETQ objects (SORT objects))
    (for mod in (bind md for x in objects eachtime (SETQ md (_ vr New))
                                                        (* (_@ md %.module (SWDereferenceName x)))
                                          (_@ md %:moduleName x)
                    collect md)
       join (CONS mod (COPY (_@ mod %:grouped [SORT (bind pr prg for proc in (@ mod |:module:steps|)
                                                    when (AND (EQ (@ proc %:stepType)
                                                                  'Macro)
                                                              (SETQ prg (@ proc %:macroProgram)))
                                                    collect (PROG1 (SETQ pr (_ vr New))
                                                                   (_@ pr %:processName (@ prg %:printName))
                                                                   (* (_@ pr %.process prg))
                                                                   (_@ pr %:group mod)))
                                              (FUNCTION (LAMBDA (A B)
                                                          (AND A B (UALPHORDER (@ A %:processName)
                                                                              (@ B %:processName)]])]))
```

(Method ((ModuleFolderBrowser Browse) self context object)
. mcf: 7-Jul-86 15.09

```
  "Specialization"
  (DSPFONT BIGFONT (@ window))
  (_Super self Browse context object))
```

(Method ((ModuleFolderBrowser CleanupKills) self) mcf: 28-Oct-87 07:33

```
  "New method template"
  (DECLARE (GLOBALVARS FISGlobalDeletedObjectLst))
  (for x in FISGlobalDeletedObjectLst when (ObjectExists? (SETQ x (CDR x))) do (_ x Kill!)
     finally (SETQ FISGlobalDeletedObjectLst NIL)))
```

(Method ((ModuleFolderBrowser ClearSelections) self)
mcf: 7-Jul-86 09:56

```
  "New method template"
  (for sel in (@ %:selections) do (_ self Highlight sel 'Invert) finally (_@ self %:selections NIL)))
```

(Method ((ModuleFolderBrowser CreateNewElement) self Obj ObjName)
mcf: 28-Oct-87 08.40

```
  "New method template"
  (LET (ele)
    (SETQ ele (_ (@ |:object:elements:.VR|)
                 New))
    (_@ ele %:moduleName ObjName)                        (* (_@ ele %.module Obj))
    ele))
```

Page 4

(Method ((ModuleFolderBrowser DoCommand) self Item)
. Edited 25-Aug-88 18.04 by
: mcf: 29-Apr-88 15:57

```
  "New method template"
  [LET (subsels (command (CAADR Item))
               (selections (REVERSE (@ %:selections)))
               (msg "Select object(s) from directory first")).
```

```
(SETQ selections (for x in selections when (ObjectExists? (OR (@ x module)
                                                               (@ x process)))
                      collect x))
(COND
   ((EQ (@ lastCommand)
        'FISTLCopy)
    (_ self SWPromptPrint "Copy in progress: Exit or Abort Copy first" T 1 SavoirPROMPTWINDOW))
   (T (_@ self lastCommand command)
      [SELECTQ command
           ((FISTLHierarchy FISTLSave FISTLSaveCompile FISTLSimulation FISTLRemoteExec FISTLView
                  FISTLDocAll FISTLDocAlph FISTLDocOne FISTLDocHierarchy)
               (COND
                  (selections (SETQ msg NIL)
                         (_! self command selections))))
           ((FISTLCompile FISTLCheckGrafcetSyntax FISTLCopy FISTLRename FISTLTrim FISTLDownload)
               [COND
                  (selections (SETQ msg NIL)
                         (for sel in selections do (_! self command sel))])
           (FISTLCommunication
               (COND
                  (selections (SETQ msg NIL)
                         (_ self FISTLComm))))
           ((FISTLCreate FISTLManualMMFS FISTLAnimation FISTLLibraryStep)
               (SETQ msg NIL)
               (_! self command))
           ((FISTLUnLoad FISTLViewMapAssoc)
               [COND
                  ((SETQ subsels (for s in selections when (@ s module) collect s))
                   (SETQ msg NIL)
                   (_! self command selections))
                  (T (SETQ msg (COND
                                  (selections "Select only top level processes")
                                  (T "Select process(es) from directory first"])
           (COND
              (selections (SETQ msg NIL)

                  .. ((FISTLCompile FISTLCheckGrafcetSyntax FISTLCopy FISTLRename FISTLTrim FISTLDownload) (COND (selections (SETQ msg
                  .. NIL) (for sel in selections do (_! self command sel)))))

                  (for sel in selections do (_! self command sel)]
      (COND
         (msg (_@ self lastCommand NIL)
              (_ self SWPromptPrint msg T 1 SavoirPROMPTWINDOW)])
```

(Method ((ModuleFolderBrowser DoMiddleChoice) self subObject)
mct: 7-Jul-86 10:04

```
"Specialization"
(_ self SelectionMethod subObject))
```

(Method ((ModuleFolderBrowser ElementChanged) self element)
mct. 24-Jul-86 17.28

```
"Specialization"
(COND
   [(AND (Object? element)
         (_ element InstOf! 'BlockProgram)]
   (T (_Super self ElementChanged element))))
```

(Method ((ModuleFolderBrowser FISTLAnimation) self AnimationName InstantFlg)
Edited 25-Aug-88 17.54 by
mct 17-Jun-88 16.47

```
"Temporary interface into the animation routines"
(DECLARE (GLOBALVARS SavoirPROMPTWINDOW))
[LET (an name (con (@ self context))
        (w SavoirPROMPTWINDOW))
  [COND
     ((SETQ name (OR AnimationName (_ self SWPromptForWord "Animation Name: " NIL NIL NIL w)))
      (COND
         [(AND InstantFlg (COND
                             ((EQ InstantFlg T)
                              (SETQ an (FISGetAPObj name)))
                             (T (SETQ an (FISGetAPObj name InstantFlg]
         ((SETQ an (FISGetAPObj name T)))
         ((MOUSECONFIRM (CONCAT "Create new animation: " name "?")
```

```
                 NIL w)
          (SETQ an (_ (DEFERREDCONSTANT ($ FLXAPanelObject))
                      New))
          (_ an NameObject (FISMakeAPObjName name))
          (_@ an mainPanel (AP.MakeSuperPanel name NIL NIL 0 0 0 0))
          (UNMARKASCHANGED (FISMakeAPObjName name)
                 'INSTANCES]
  (COND
     ((ObjectExists? an)
      (_ con SpawnSubContext (DEFERREDCONSTANT ($ FISEditmationContext))
             an))
     (T (_ self SWPromptPrint "No animation created/edited" NIL NIL w)])
```

(Method ((ModuleFolderBrowser FISTLCheckGrafcetSyntax) self Sel)
mct: 3-Dec-86 17.10

```
"New method template"
(LET [(thing (OR (@ Sel %:module)
                 (@ Sel %:process)]
  (FISSyntaxCheckAll thing)))
```

```
(Method ((ModuleFolderBrowser FISTLComm) self)                    ; TAL 10-Jan-88 18.55
  "New method template"
  (RESETLST
      (RESETSAVE (CURSOR WAITINGCURSOR))
      (LET (mods procs lst obj)
        [for sel in (@ %:selections) do (COND
                                          ((@ sel %:module)
                                           (push mods sel))
                                          (T (push procs sel]
                                                          (* slice out any overlap)
         (AND mods procs (SETQ procs (for p in procs when (for m in mods never (_ (@ p %:process)
                                                                                  InProgram?
                                                                                  (@ m %:module)))
                                        collect p)))
         [COND
           (mods (SETQ mods (bind pList for m in mods when (SETQ pList (FindAllMMFSProcesses (@ m
                                                                          |:module:macroPrograms|
)))
                              collect (CONS (_ (@ m %:module)
                                               GetName)
                                            pList]     (* (COND (procs (SETQ procs (bind pList pName for p in procs when
                                                       (SETQ pList (for pr in (_ (@ p %.process) FindAllMacroPrograms) when
                                                       (SETQ pName (_ pr FindProcessName)) collect
                                                       (CONS (@ pr %.printName) pName))) collect
                                                       (CONS (@ p process.printName) pList))))))
         [COND
           (procs (SETQ procs (bind pList for p in procs when (SETQ pList (FindAllMMFSProcesses
                                                                           (_ (@ p %:process)
                                                                              FindAllMacroPrograms)))
                                collect (CONS (_ (@ p %:process)
                                                 GetName)
                                              pList]
         (COND
           ((SETQ lst (APPEND mods procs))
            (COND
              ((AND (SETQ obj (SASSOC (CONCATLIST (FISSeparatedList (SORT lst T)
                                                                    FISBrowserMultipleNameSeparator
                                                                    (CAR X)))
                                      (@ %:commCache)))
                    (MOUSECONFIRM (CONCAT FISOneCR "Recompute?")
                                  "click LEFT to recompute, else RIGHT"))
               (cdremove (@ %:commCache)
                         obj)
               (SETQ obj NIL)))
            (_ (@ %:context)
               SpawnLinkedContext
               (DEFERREDCONSTANT ($ EditBlockEditMMFSCom))
               (OR (CDR obj)
                   lst)))
           (T (_ self SWPromptPrint (CONCAT "No communications possible with "
                                            (OR (@ (CAR (@ %:selections))
                                                   %:moduleName)
                                                (@ (CAR (@ %:selections))
                                                   %:processName)))
                 T 1 SavoirPROMPTWINDOW)]))
```

```
(Method ((ModuleFolderBrowser FISTLCompile) self Sel)
                                                                  ; mcf: 3-Dec-86 16.46
  "New method template"
  (LET [(thing (OR (@ Sel %:module)
                   (@ Sel %:process)]
    (FISCompileAll thing)))
```

```
(Method ((ModuleFolderBrowser FISTLCopy) self Sel)
                                                                  ; mcf: 12-Apr-88 11.23
  "New method template"
  (RESETLST
     [RESETSAVE NIL '(COND
                       ((ObjectExists? .self)
                        (PutValue .self 'lastCommand NIL]
     (LET (prg oldName newName msg xlations)
       (COND
         [(SETQ prg (@ Sel %:module))
          (SETQ oldName (@ Sel %:moduleName))
          (while [AND (SETQ newName (_ self SWPromptForWord (CONCAT "Copy " oldName " to: ")
                                       NIL T NIL SavoirPROMPTWINDOW))
                      (OR (SETQ msg (_ prg NameConflict? newName 'Main))
                          (SETQ msg (_ prg NameConflict? newName 'Macro)]
             do (_ self SWPromptPrint (CONCAT newName " " msg)
                   T 1 SavoirPROMPTWINDOW)
                (DISMISS 2000 NIL T))
          (COND
            ((AND newName (SETQ xlations (CopyNameSubInterface self NIL NIL (create FISNameTranslations)
                                                               prg newName)))
             (_ self SWPromptPrint (CONCAT "Copying " oldName " to " newName)
                T NIL SavoirPROMPTWINDOW)
             (RESETSAVE (CURSOR WAITINGCURSOR))
             (for o in (FISGetNamedParts prg) first (replace Qualifier of xlations with newName)
                                                    (replace MacroSteps of xlations
                                                       with (CONS (CONS oldName newName)
                                                                  (fetch MacroSteps of xlations)))
                do (_ o SWCopyDeep xlations))
             (_ (SWDereferenceName newName)
                CacheFlush!)
             (FISToggleTopLevel)
```

```
        (NCONC1 FISGlobalModuleLst newName)
        (FISToggleTopLevel FISGlobalModuleLst]
    ((SETQ prg (@ Sel %:process))
     (_ self SWPromptPrint (CONCAT "ERROR: " (@ Sel %:processName)
                                   " is not a top level process")
            T 1 SavoirPROMPTWINDOW)
     (DISMISS 2000 NIL T)))
  (CLEARW SavoirPROMPTWINDOW))))
```

```
(Method ((ModuleFolderBrowser FISTLCreate) self MainProgramName)
                                                  ; Edited 7-Sep-88 16 51 by mct
                                                  mct 4-Nov-86 17 04
  "New method template"
  (DECLARE (GLOBALVARS FISGlobalModuleLst))
  [LET (result file name prg temp (w SavoirPROMPTWINDOW))
    (COND
      [(SETQ name (OR MainProgramName (_ self SWPromptForWord "Process Name: " NIL T NIL w)))
       (COND
         ((SETQ temp (SWDereferenceName name))
          (_ self SWPromptPrint "Name already in use" NIL NIL w))
         ((SETQ temp (_Proto ($ GrafcetMainProgram)
                             NameConflict? name 'Main))
          (_ self SWPromptPrint (CONCAT name " " temp)
                 NIL NIL w))
         (T (SETQ prg (_ ($ SimpleInitialMainTemplate)
                         CopyDeep))
            (PutValueOnly prg 'name NotSetValue)
            (_@ prg objectIdentifier NIL)
            (_ prg NameObject name)
            (push FISGlobalModuleLst name)          Put it on global cache
            (_ self AppendElement (_ self CreateNewElement prg name))
            (_ self GetNewFile name)
            (SETQ result (_ (@ self context)
                            SpawnSubContext
                            (DEFERREDCONSTANT ($ EditGrafcetContext))
                            prg))
            (AND (ObjectExists? result)
                 (SETQ result (@ result myBrowser))
                 (_ result EnableEdit))]
      (T (_ self SWPromptPrint "no process created" NIL NIL w)])
```

Page 7

```
(Method ((ModuleFolderBrowser FISTLDocAll) self Selections)
                                                  ; mct: 14-Oct-87 10.44
  "New method template"
  [LET [(selections (OR Selections (@ self %:selections))]
    (FISDocDocumentAll (for sel in selections collect (OR (@ sel %:module)
                                                          (@ sel %:process)])
```

```
(Method ((ModuleFolderBrowser FISTLDocAlph) self Selections)
                                                  ; mct: 14-Oct-87 10:45
  "New method template"
  (LET [(selections (OR Selections (@ self %:selections))]
    (FISDocDocumentAll (for sel in selections collect (OR (@ sel %:module)
                                                          (@ sel %:process)))
           T)))
```

```
(Method ((ModuleFolderBrowser FISTLDocHierarchy) self Selections)
                                                  ; mct: 14-Oct-87 10.47
  "New method template"
  (LET [(selections (OR Selections (@ self %:selections))]
    (FISDocDocumentOne (for sel in selections collect (OR (@ sel %:module)
                                                          (@ sel %:process)))
           NIL NIL T)))
```

```
(Method ((ModuleFolderBrowser FISTLDocOne) self Sel Selections)
                                                  ; mct 14-Oct-87 10 46
  "New method template"
  [LET [(selections (OR Selections (@ self %:selections))]
    (FISDocDocumentOne (for sel in selections collect (OR (@ sel %:module)
                                                          (@ sel %:process)])
```

```
(Method ((ModuleFolderBrowser FISTLDownload) self sel)
                                                  ; TAL 24-Apr-88 19.58
  "New method template"
  [COND
    ((DEFINEDP 'P3.TLDownload)
     (P3.TLDownload (OR (@ sel %:module)
                        (@ sel %:process)])
```

```
(Method ((ModuleFolderBrowser FISTLGateConfig) self)
                                                  ; mct 24-Sep-86 18.45
  "New method template"
  (_ (@ %:context)
     SpawnSubContext
     (DEFERREDCONSTANT ($ ExamineMapNetworkContext))
     MapNetwork))
```

```
(Method ((ModuleFolderBrowser FISTLGateReset) self)
                                                  mct 1-Oct-86 13 04
  "New method template"
  (AND MapNetwork (_ MapNetwork MapReset)))
```

(Method ((ModuleFolderBrowser FISTLHierarchy) self Selections)
. mct: 14-Oct-87 10 34

```
"New method template"
[LET [(con (@ self %:context))
      (selections (OR Selections (@ self %:selections)]
  (_ con SpawnSubContext (DEFERREDCONSTANT ($ ExamineGrafcetStructureContext))
       (for sel in selections collect (OR (@ sel %:module)
                                          (@ sel %:process))))])
```

(Method ((ModuleFolderBrowser FISTLLibraryStep) self LibraryStepName)
. Edited 21-Sep-88 14 47 by mct

```
"Temporary interface into the library step routines"
(FISLibraryStepInterface LibraryStepName (@ self context)))
```

(Method ((ModuleFolderBrowser FISTLManualMMFS) self MMFSProcessName)
. mct: 13-Oct-87 11:15

```
"New method template"
[LET (file name prg (w SavoirPROMPTWINDOW))
  (COND
     ([OR (NOT MapNetwork)
          (NOT (FIND.PROCESS 'FISNetworkProcess]
      (FISInit)))
  (AND MapNetwork (until (FIXP (@ MapNetwork %:defaultGateway)) do (_ self GetGatewayUBNumber)))
  (COND
     [(SETQ name (OR MMFSProcessName (_ self SWPromptForWord "MMFS Process Name: " NIL T NIL w)))
      (COND
         (NIL (SETQ prg (SWDereferenceName name))
              (_ self SWPromptPrint "Name already in use" NIL NIL w))
         (T (SETQ prg (_ ($ SimpleSendReceiveMainTemplate)
                         CopyDeep))
            (PutValueOnly prg 'name NotSetValue)
            (_@ prg %:objectIdentifier NIL)
            (for x in (@ prg %:subObjects) do (_ x SetLabel1 name))
            (_@ (RESETLST
                   (RESETSAVE FISPermitEdits NIL)
                   (_ (@ self %:context)
                      SpawnSubContext
                      (DEFERREDCONSTANT ($ ManualMMFSContext))
                      prg))
                %:permitEdits T)]
     (T (_ self SWPromptPrint "ERROR: MMFS process name required" NIL NIL w)]])
```

(Method ((ModuleFolderBrowser FISTLNetworkStatus) self)
. mct. 14-Nov-86 11 36

```
"New method template"
(OR (ObjectExists? MapNetworkStatus)
    (SETQ MapNetworkStatus (_ (DEFERREDCONSTANT ($ NetworkStatusForm))
                              New)))
(_ (@ %:context)
   SpawnSubContext
   (DEFERREDCONSTANT ($ NetworkStatusContext))
   MapNetworkStatus))
```

(Method ((ModuleFolderBrowser FISTLRemoteExec) self Selections)
. TAL 7-Mar-88 01 36

```
"New method template"
[LET [consist (selections (OR Selections (@ self %:selections)]
  [SETQ consist (bind selObj for sel in selections collect (SETQ selObj (OR (@ sel %:module)
                                                                            (@ sel %:process)))
                                                           (COND
                                                              ((_ selObj InstOf 'GrafcetMainProgram)
                                                               selObj)
                                                              (T (@ selObj %:mainProgram)]
  (COND
     ((SETQ consist (INTERSECTION consist consist))
      (_ (@ self %:context)
         SpawnSubContext
         ($ CombineRemoteSystemContext)
         (CAR consist)
         NIL NIL NIL NIL '(ProcessList ,consist))]])
```

(Method ((ModuleFolderBrowser FISTLRename) self Sel)
. mct: 29-Feb-88 14 07

```
"New method template"
(DECLARE (GLOBALVARS FISOneCR))
(LET (temp prg oldName newName type)
  [COND
     ((SETQ prg (@ Sel %:module))
      (SETQ oldName (@ Sel %:moduleName))
      (SETQ type 'Main))
     ((SETQ prg (@ Sel %:process))
      (SETQ oldName (@ Sel %:processName))
      (SETQ type 'Macro]
  [COND
     ((_ prg CheckPropList 'COMBINEGRAFCETPROCESSBROWSER)
      (_ self SWPromptPrint (CONCAT "Unable to Rename: " (@ prg %:printName)
                                    FISOneCR "Execution in progress")
            NIL T SavoirPROMPTWINDOW)
      (DISMISS 2000 NIL T))
     (T (while (AND (SETQ newName (_ self SWPromptForWord (CONCAT "Enter new name for " oldName ": ")
                                     NIL T NIL SavoirPROMPTWINDOW))
                    (_ prg NameConflict? newName type))
          do (_ self SWPromptPrint (CONCAT newName " conflicts with existing " type " program")
```

```
                    T 1 SavoirPROMPTWINDOW)
              (DISMISS 2000 NIL T]
  [COND
    (newName (_ self SWPromptPrint (CONCAT "Renaming " oldName " to " newName)
                    T NIL SavoirPROMPTWINDOW)
          (RESETLST
              (RESETSAVE (CURSOR WAITINGCURSOR))
              (SELECTQ type
                  (Main (COND
                            ((EQ (U-CASE oldName)
                                 (SETQ temp (@ Sel %:fileName)))
                             (_ self SmashFile temp)
                             (_@ Sel %:fileName NotSetValue)))
                        (_ prg Rename NIL newName)
                        (COND
                            ((SETQ temp (FMEMB oldName FISGlobalModuleLst))
                             (RPLACA temp newName)))
                        [COND
                            ((SETQ temp (_ (@ prg %:mainProgram)
                                           CheckPropList
                                           'GRAFCETSTRUCTUREBROWSER))
                             (AND temp (for h in temp do (_ (CADR h)
                                                             Recompute)]
                        (COND
                            ((GETPROPLIST (SETQ temp (U-CASE newName)))
                             (_ self SmashFile temp)))
                        (_@ Sel %:moduleName newName))
                  (Macro (_@ Sel %:processName newName)
                         (COND
                             ((SETQ temp (@ prg %:caller))
                              (_ temp SetLabel newName NIL))
                             (T (_ prg Rename NIL newName))))
                  NIL)
              (FISToggleTopLevel)
              (FISToggleTopLevel FISGlobalModuleLst))]
    (CLEARW SavoirPROMPTWINDOW)))
```

(Method ((ModuleFolderBrowser FISTLSave) self Selections)
. Edited 1-Sep-88 12.33 by mcf

```
  "10/1 v2.19 Removed ADDTOFILE of orphans and rebuild COMS each time"
  (DECLARE (GLOBALVARS FISMakefilesOptions FISOneCR FISVersionNumber))
  (LET [filename files orphans selfiles sels (w SavoirPROMPTWINDOW)
           (selections (OR Selections (@ self selections)]
    [SETQ sels (for sel in selections collect (OR (AND (@ sel module)
                                                        sel)
                                                   (@ sel group)]
    (SETQ sels (INTERSECTION sels sels))
    (RESETLST
        (RESETSAVE (CURSOR WAITINGCURSOR))
        (_ self CleanupKills)
        [SETQ selfiles (for sel in sels collect (_ (@ sel module)
                                                   CacheFlush!)
                                                (COND
                                                   ((@ sel fileName))
                                                   (T [SETQ filename (U-CASE (_ self GetNewFile
                                                                               (@ sel moduleName))]
                                                      (AND filename (_@ sel fileName filename)]
        (UPDATEFILES)

        .. filter out files that haven't changed

        (SETQ files (for fil in selfiles when (CDR (GETPROP fil 'FILE)) collect fil))
        (SETQ orphans (FILEPKGCHANGES 'INSTANCES))
        [SETQ files (UNION files (bind ann fil prg for sel in sels when (SETQ prg (@ sel module))
                                   join (bind used for annie in orphans
                                            when (AND (SETQ ann (SWDereferenceName annie))
                                                      (_ ann Understands 'InProgram?)
                                                      (_ ann InProgram? prg))
                                            collect (push used annie)
                                                    (AND (SETQ fil (@ sel fileName))
                                                         (OR T (ADDTOFILE annie 'INSTANCES fil))
                                                         fil)
                                            finally (SETQ orphans (LDIFFERENCE orphans used]
        (COND
          ((SETQ selfiles (LDIFFERENCE selfiles files))
           (SETQ selfiles (INTERSECTION selfiles selfiles))
           (_ self SWPromptPrint (CONCAT (COND
                                           ((IGREATERP (LENGTH selfiles)
                                                       1)
                                            "Files: ")
                                           (T "File: "))
                                         (SUBSTRING (CONCAT selfiles)
                                                    2 -2)
                                         " unchanged")
                 NIL NIL w)
           (TERPRI w)))
        [COND
          ((SETQ files (REMOVE NIL (INTERSECTION files files)))
           (SETQ sels (bind f prg for x in sels when (FMEMB (SETQ f (@ x fileName))
                                                             files)
                        collect (SETQ prg (@ x module))
                                (_@ prg version FISVersionNumber)
                                [SET (FILECOMS (U-CASE f))
                                     (CONS (CONS 'INSTANCES (for y in (FISGetNamedParts prg)
                                                               collect (_ y GetName))]
                                (CONS f prg)))
```

```
(_ self SWPromptPrint "Saving: " T NIL w)
(ALLOW.BUTTON.EVENTS)
(RESETSAVE (TTYDISPLAYSTREAM w))
(RESETSAVE (TTY.PROCESS (THIS.PROCESS)))
(RESETSAVE COPYRIGHTFLG NIL)                    (MAKEFILES FISMakefilesOptions files)
(bind p for x in files do (_ self SWPromptPrint (COND
                                                   (p (CONCAT ", " x))
                                                   (T x))
                                   'NOCR NIL w)
                          (MAKEFILE x FISMakefilesOptions)
                          (AND (SETQ p (CDR (FASSOC x sels)))
                               (FISShrink p T])
(_ self SWPromptPrint "Done" T 1 w)))
```

(Method ((ModuleFolderBrowser FISTLSaveCompile) self Selections)
mct 30-Dec-87 17 08

```
"New method template"
(_ self FISTLSave Selections)
(for s in Selections do (_ self FISTLCompile s)))
```

(Method ((ModuleFolderBrowser FISTLSimulation) self Selections)
TAL 6-Mar-88 23:40

```
"New method template"
[LET [consist (selections (OR Selections (@ self %:selections)]
  [SETQ consist (bind selObj for sel in selections collect (SETQ selObj (OR (@ sel %:module)
                                                                          (@ sel %:process)))
                                                            (COND
                                                              ((_ selObj InstOf 'GrafcetMainProgram)
                                                               selObj)
                                                              (T (@ selObj %:mainProgram)]
                                                            (* (bind (con (@ self %.context)) for sel in
                                                            (INTERSECTION consist consist) do (_ con SpawnSubContext
                                                            (DEFERREDCONSTANT ($ CombineFactorySystemContext)) sel)))
  (COND
    ((SETQ consist (INTERSECTION consist consist))
     (_ (@ self %:context)
        SpawnSubContext
        (DEFERREDCONSTANT ($ CombineFactorySystemContext))
        (CAR consist)
        NIL NIL NIL NIL '(ProcessList ,consist))])
```

(Method ((ModuleFolderBrowser FISTLTrim) self Sel)
TAL 10-Jan-88 18:57

```
"New method template"
[LET [numb (fil (OR (@ Sel %:moduleName)
                    (@ Sel %:processName)]
  (AND fil (NUMBERP (SETQ numb (_ self SWPromptForWord (CONCAT "Number of " fil " versions to keep? ")
                                  1 T NIL SavoirPROMPTWINDOW)))
       (RESETLST
          (RESETSAVE (TTYDISPLAYSTREAM SavoirPROMPTWINDOW))
          (RESETSAVE (TTY.PROCESS (THIS.PROCESS)))
          (TRIMTO fil numb))])
```

Page 11

(Method ((ModuleFolderBrowser FISTLUnLoad) self Selections)
TAL 16-Mar-88 12:40

```
"New method template"
[LET [killed msg (selections (OR Selections (@ self %:selections)]
  (RESETLST
     (RESETSAVE (CURSOR WAITINGCURSOR))
     (SETQ selections (for sel in selections when (AND (@ sel %:module)
                                                       (MOUSECONFIRM (CONCAT "Remove " (@ sel
                                                                                          %:moduleName
)
                                                                             "?")
                                                                     NIL SavoirPROMPTWINDOW))
                         collect sel))
     [bind file mod for sel in selections do (SETQ mod (@ sel %:module))
                                             (SETQ file (@ sel %:fileName))
                                             (COND
                                               ((_ mod CheckPropList 'COMBINEGRAFCETPROCESSBROWSER)
                                                (_ self SWPromptPrint (CONCAT "Unable to Remove: "
                                                                              (@ mod %:printName)
                                                                              FISOneCR "Execution in
                                                                              progress")
                                                   NIL T SavoirPROMPTWINDOW))
                                               ((SETQ msg (_ mod Kill!))
                                                (TERPRI SavoirPROMPTWINDOW)
                                                (_ self SWPromptPrint (CONCAT "Unable to Remove: " msg)
                                                   NIL T SavoirPROMPTWINDOW))
                                               (T (SETQ killed T)
                                                  (COND
                                                    (file (_ self SmashFile file)])
  (COND
    (killed (FISToggleTopLevel)
            (FISToggleTopLevel FISGlobalModuleLst])
```

(Method ((ModuleFolderBrowser FISTLView) self Selections)
mct 14-Oct-87 10 43

```
"New method template"
[LET [(con (@ self context))
      (selections (OR Selections (@ self selections))]
  (for sel in selections do (_ con SpawnSubContext (DEFERREDCONSTANT ($ EditGrafcetContext))
                                   (OR (@ sel module)
                                       (@ sel process)))])
```

```
(Method ((ModuleFolderBrowser FISTLViewDecls) self Sel)
                                                        . mcf 29-Apr-88 14 29
  "New method template"
  (LET [(temp (OR (@ Sel %:module)
                  (@ Sel %:process)]
    (COND
      ((@ temp %:cDecls))
      ((NOT (MOUSECONFIRM (CONCAT "Create C Decls for " (OR (@ Sel %:moduleName)
                                                            (@ Sel %:processName)
                                                            "Selection")
                                  "?")
                          NIL SavoirPROMPTWINDOW T))
        (SETQ temp NIL)))
    (AND temp (_ (@ %:context)
                 SpawnSubContext
                 ($ EditGrafDeclsContext)
                 temp))))

(Method ((ModuleFolderBrowser FISTLViewMapAssoc) self Selections)
                                                        . mct: 29-Apr-88 15.57
  "New method template"
  [bind mod folder for x in Selections when (SETQ mod (@ x %:module))
    do (COND
         ((COND
            ((SETQ folder (@ mod %:mapAssociations)))
            ((MOUSECONFIRM (CONCAT "Create MAP Associations for " (@ x %:moduleName)
                                   "?")
                           NIL SavoirPROMPTWINDOW T)))
          (_ (@ %:context)
             SpawnSubContext
             ($ ExamineMapAssociationsFolderContext)
             folder mod 'mapAssociations)])
```
Page 42
```
(Method ((ModuleFolderBrowser GetGatewayUBNumber) self)
                                                        . mcf 19-Nov-86 13:07
  "New method template"
  [LET (gn (w SavoirPROMPTWINDOW))
    (SETQ gn (AND MapNetwork (@ MapNetwork %:defaultGateway)))
    (COND
      ((FIXP (SETQ gn (_ self SWPromptForWord "UB number: " gn T NIL w)))
       (_@ MapNetwork %:defaultGateway gn))
      (T (_ self SWPromptPrint "ERROR: Integer required" NIL NIL w)])

(Method ((ModuleFolderBrowser GetNewFile) self Name)
                                                        . TAL 10-Jan-86 18:58
  "New method template"
  (LET (file (w SavoirPROMPTWINDOW))
    [COND
      ((AND Name (SETQ file (_ self SWPromptForWord (CONCAT "Associate " Name " with which file? ")
                                                    Name T NIL w)))
        (NLSETQ (RESETLST
                  (RESETSAVE (TTYDISPLAYSTREAM w))
                  (RESETSAVE (TTY.PROCESS (THIS.PROCESS)))
                  (RESETSAVE NOSPELLFLG 'Programs)
                  (ADDTOFILE Name 'INSTANCES file))]
    file))

(Method ((ModuleFolderBrowser LeftSelection) self)
                                                        . mct: 7-Jul-86 09.50
  "Specialization"
  (_ self SelectionMethod))

(Method ((ModuleFolderBrowser LeftTitleSelection) self)
                                                        . mct: 7-Jul-86 10:39
  "Specialization"
  (_ self ClearSelections))

(Method ((ModuleFolderBrowser MiddleTitleSelection) self)
                                                        . mct: 13-Apr-88 12:36
                                                        . Specialization
  "(_Super self MiddleTitleSelection)"
  (_ self SetSelections))

(Method ((ModuleFolderBrowser PositionBrowser) self width height Left Bottom)
                                                        mct: 15-Nov-87 14:31
  "Specialization"
  (LET (pr ptop (left Left)
          (bottom Bottom))
    [COND
      ((AND (NOT (OR left bottom))
            width height)
        (SETQ pr (WINDOWPROP SavoirPROMPTWINDOW 'REGION))
        (SETQ ptop (bind (top  0) tem for reg in (CONS pr (for w in (ALLATTACHEDWINDOWS SavoirPROMPTWINDOW) collect (WINDOWPROP w (QUOTE
        REGION)))) do (SETQ [redacted]VAL reg) (SETQ top tem) when (IGREATERP (SETQ tem (fetch PTOP of reg)) top) finally (RETURN (fetch PTOP of [redacted]VAL))))
        (SETQ left (fetch LEFT of pr))
        [AND (ZEROP height)
             (SETQ height (FONTHEIGHT (DSPFONT NIL (@ window)]
        (SETQ bottom (IDIFFERENCE (fetch BOTTOM of pr)
                                  (HEIGHTIFWINDOW height T)))
```

```
        (COND
           ((ILESSP bottom 0)
            (add height bottom)
            (SETQ bottom 0]
    (_Super self PositionBrowser width height left bottom)))

(Method ((ModuleFolderBrowser Repaint) self region appendFlg)
                                                          mcf: 14-Jul-86 15.42

   "Specialization"
   [COND
      ((_Super self Repaint region appendFlg)
       (for sel in (@ %:selections) do (_ self Highlight sel 'Invert)])
                                                                              Page 13

(Method ((ModuleFolderBrowser SelectionMethod) self SubObj)
                                                          mcf: 17-Dec-86 12.16

   "New method template"
   [LET (subObj (window (@ %:window)))                (* (COND ((@ %.lastCommand) (_@ self %.lastCommand NIL)
                                                          (_ self ClearSelections))))
     (SETQ subObj (OR SubObj (_ self FindSelectedSubObject window NIL)))
     (COND
        ([AND subObj (NOT (FMEMB subObj (@ %:selections)]
         (push (@ %:selections)
               subObj)
         (_ self Highlight subObj 'Invert))
        (T (change (@ %:selections)
                   (DREMOVE subObj DATUM))
           (_ self Highlight subObj 'Invert)])

(Method ((ModuleFolderBrowser SetSelections) self)
                                                          mcf: 13-Apr-86 12:43

   "New method template"
   (_ self ClearSelections)
   (for x in (@ %:elements) when (@ x %:moduleName) do (_ self SelectionMethod x)))

(Method ((ModuleFolderBrowser SmashFile) self File)
                                                          mcf: 15-Jan-86 14:09

   "New method template"
   [COND
      (File (SMASHFILECOMS File)
            (UNMARKASCHANGED (FILECOMS File)
                   'VARS)
            (for x in '(FILE FILECHANGES FILEMAP FILEDATES) do (REMPROP File x))
            (UNMARKASCHANGED File 'VARS)
            (SETQ FILELST (DREMOVE File FILELST])

(Method ((ModuleFolderElement ComputeObject) self VarName PropName)
                                                          mcf: 30-Oct-87 12:38

   "New method template"
   (SWDereferenceName (SELECTQ VarName
                          (module (@ self %:moduleName))
                          (process [COND
                                      ((@ self %:group)
                                       (FISQualifyName NIL (@ self %:processName)
                                              (@ self |:group:moduleName|)])
                          NIL)))

(Method ((ModuleFolderElement LocateFile) self)      mcf: 16-Jul-86 12.05
   "New method template"
   (CAR (WHEREIS (OR (@ %:moduleName)
                     (@ %:processName))
               'INSTANCES)))

(Method ((TopLevelModuleContext ContextReturned) self returningContext spawningRelation object
                                                          edited container container[V)
                                                          mcf: 29-Apr-88 15:47

   "Specialization"
   (LET [(brwsr (ObjectExists? (@ %:myBrowser)]
     (COND
        [(AND (_ returningContext InstOf! 'EditBlockContext)
              brwsr
              (change (@ brwsr %:commCache)
                      (PUTSASSOC (@ object %:keyname)
                             object DATUM]
        ((AND (ObjectExists? object)
              (_ object InstOf! 'FOECopySubstitutionObject)
              brwsr
              (EQ (@ brwsr %:lastCommand)
                  'FISTLCopy))
         (_@ brwsr %:nameSubstitutionAList (@ object %:elements)))
        (T))
     (_Super )))

(\UnbatchMethodDefs)
```

```
(RPAQQ NewFISModuleTLMethodItems
       [(View (FISTLView DoCommand)
              "View the Grafcet Program(s)"
              (SUBITEMS (View (FISTLView DoCommand)
                              "View the Grafcet Program(s)")
                     ("View C Decls" (FISTLViewDecls DoCommand)
                            "View the selected programs' C declarations")
                     ("View MAP Associations" (FISTLViewMapAssoc DoCommand)
                            "View communication properties of the MAP Associations of selected process(es)"))
              )
        (Hierarchy (FISTLHierarchy DoCommand)
               "Bring up a hierarchy display for each selected item")
        (Communication (FISTLCommunication DoCommand)
               "Bring up a communications window on the selected processes")
        ("MAP Network" FISTLNetworkStatus "Examine the status of the MAP network" (SUBITEMS
                                                                                    ("MAP Network"
                                                                                           FISTLNetworkStatus
                                                                                           "Examine the status
                                                                                           of the MAP
                                                                                           network")
                                                                                    ("Network Configuration"
                                                                                     FISTLGateConfig
                                                                                     "Examine or change the
                                                                                     Network Configuration
                                                                                     defaults")
                                                                                    ("Manual Interface"
                                                                                     (FISTLManualMMFS
                                                                                          DoCommand)
                                                                                     "Bring up an interface
                                                                                     for sending and receiving
                                                                                     MMFS messages manually")
                                                                                    ("Reset Network"
                                                                                           FISTLGateReset
                                                                                           "Reset the MAP
                                                                                           Network connection
                                                                                           to the gateway")
        (Execute (FISTLSimulation DoCommand)
               "Execute the selected processes")
        (Compile (FISTLCompile DoCommand)
               "Compile the selected processes"
               (SUBITEMS (Compile (FISTLCompile DoCommand)
                                "Compile the selected processes")
                      ("Check Grafcet Syntax" (FISTLCheckGrafcetSyntax DoCommand)
                             "Check the Grafcet syntax of the selected processes without compiling")))
        (Create (FISTLCreate DoCommand)
               "Create a new process")
        (Copy (FISTLCopy DoCommand)
              "Copy selected object(s)"
              (SUBITEMS (Copy (FISTLCopy DoCommand)
                              "Copy selected object(s)")
                     (Rename (FISTLRename DoCommand)
                            "Rename selected object(s)")))
        (Save (FISTLSave DoCommand)
              "Save selected objects on associated files"
              (SUBITEMS (Save (FISTLSave DoCommand)
                              "Save selected objects on associated files")
                     ("Save and Compile" (FISTLSaveCompile DoCommand)
                            "Save and then compile selected objects")
                     (Remove (FISTLUnLoad DoCommand)
                            "Remove the selected process(es) from the system")))
        (Document (FISTLDocAll DoCommand)
               "Document the selected object(s) and its sub-objects"
               (SUBITEMS ("Document All" (FISTLDocAll DoCommand)
                                "Document the selected object(s) and its sub-objects")
                      ("Document One" (FISTLDocOne DoCommand)
                             "Document the selected object(s)")
                      ("Document Hierarchy" (FISTLDocHierarchy DoCommand)
                             "Document only the hierarchy of the selected object(s)")
                      ("Document Alphabetically" (FISTLDocAlph DoCommand)
                             "Document this portion of hierarchy in alphabetical order"])

(RPAQ FISModuleTLMethodItems NewFISModuleTLMethodItems)

(RPAQQ FISMakefilesOptions (NEW FAST))

(DECLARE%: DOEVAL@COMPILE DONTCOPY

(GLOBALVARS FISMakefilesOptions)
)

(PUTPROPS FISMODULETL FILETYPE :FAKE-COMPILE-FILE)
```

```
(PUTPROPS FISMODULETL COPYRIGHT ("Savoir, Inc." 1986 1997 1987 1988))
```

FUNCTION INDEX

ConfirmLogout ..........3 FISDequalifyName .......2 FISQualified ...........2 MoveFIS ................1
FISCleanupProcess ......1 FISMenuSubset ..........1 FISQualifyName .........2

VARIABLE INDEX

FISBrowserMultipleNameSeparator .2 FISMiddleItemPrecedence .........3 FISQualifierRenameHack ..........2
FISLogoutLock ..................3 FISNameQSepr ....................2

MACRO INDEX

FISSeparatedList ................2 PreScrollYPos ...................2

PROPERTY INDEX

FISUTIL .......................1,4

ADVICE INDEX

(PROVIDE.PROMPTING.WINDOW :IN \LOGIN.READ) .........3 changes to: (VARS FISUTILCOMS)

previous date: 15-Jun-88 18:15:01 (POGO:AISNORTH:XEROX)<LIPKIS>FIS>FISUTIL.;21

Read Table: INTERLISP

Package: IL

;; Copyright (c) 1987, 1988 by Savoir, Inc.. All rights reserved.

```
(RPAQQ FISUTILCOMS
       ((DECLARE%: DONTCOPY (PROP MAKEFILE-ENVIRONMENT FISUTIL))
        (FNS FISCleanupProcess FISMenuSubset MoveFIS)
        (COMS
             ;; Name qualification support.

              (FNS FISDequalifyName FISQualified FISQualifyName)
              (VARS (FISNameQSepr ";")
                    (FISQualifierRenameHack NIL))
              (EXPORT (GLOBALVARS FISNameQSepr FISQualifierRenameHack)))
        (COMS (FUNCTIONS FISSeparatedList PreScrollYPos)
              (VARS (FISBrowserMultipleNameSeparator " & "))
              (EXPORT (GLOBALVARS FISBrowserMultipleNameSeparator)))
        (COMS
             ;; Logout and Login support

              (FNS ConfirmLogout)
              (VARS (FISLogoutLock NIL))
              (ADVISE PROVIDE.PROMPTING.WINDOW-IN-\LOGIN.READ)
                                                          UNDOC
              )
        (COMS (VARS FISMiddleItemPrecedence)
              (P (SWSetupMiddleItemHash FISMiddleItemPrecedence)))
        (PROP FILETYPE FISUTIL)))

(DECLARE%: DONTCOPY

(PUTPROPS FISUTIL MAKEFILE-ENVIRONMENT (:PACKAGE "IL" :READTABLE "INTERLISP" :BASE 10))
)

(DEFINEQ

(FISCleanupProcess
  [LAMBDA (Processes)                                    (* mcf%. "14-Jan-88 13:05")
    (DECLARE (GLOBALVARS ActiveSimulations FISOneCR))
    (LET ((cfsb 'COMBINEFACTORYSYSTEMBROWSER)
          (cgpb 'COMBINEGRAFCETPROCESSBROWSER))
      (bind browser process for x inside Processes when [SETQ process (OR (ObjectExists? x)
                                                                           (AND (ATOM x)
                                                                                (SWDereferenceName x]
         do (AND (SETQ browser (_ process CheckPropList cfsb))
                 (_ process ModifyPropList cfsb NIL 'BROWSER browser T))
            (AND (SETQ browser (_ process CheckPropList cgpb))
                 (_ process ModifyPropList cgpb NIL 'BROWSER browser T))
            (_@ process %:processContext NIL)
            (AND (LISTP ActiveSimulations)
                 (PUTASSOC process NIL ActiveSimulations))
            (PROMPTPRINT (_ process GetName)
                   " cleared" FISOneCR])
```

```
(FISMenuSubset                                         (* TAL "22-Jun-86 14 02")
  [LAMBDA (Commands)
    (for x in Commands collectwhen (FASSOC x WindowMenuCommands])

(MoveFIS                                               (* TAL "8-Oct-85 12.28")
  [LAMBDA (ToHost (Files))
    (COPYFILES (for x in (OR (Files) FISFiles) collect (PACKFILENAME 'BODY x 'BODY '.*;))
           (PACKFILENAME 'HOST ToHost 'BODY '<LISPFILES>FIS>)
           '(>A ALLVERSIONS])
```

```
;; Name qualification support.

(DEFINEQ

(FISDequalifyName                                      (* mct%: "24-Sep-87 10:56")
  [LAMBDA (Name BothFlg QualFlg)
    (DECLARE (GLOBALVARS FISNameQSepr))
    (LET (pos)
      (COND
        [(SETQ pos (STRPOS FISNameQSepr Name))
         (COND
           [BothFlg (MKATOM (CONCAT (SUBSTRING Name 1 (SUB1 pos))
                                    " "
                                    (SUBSTRING Name (ADD1 pos]
           (QualFlg (SUBATOM Name 1 (SUB1 pos)))
           (T (SUBATOM Name (ADD1 pos]
        (T Name])

(FISQualified                                          (* mct "31-Dec-87 12:50")
  [LAMBDA (self)
    (DECLARE (GLOBALVARS FISNameQSepr))
    (LET ((name (@ self %:name)))
      (AND name (STRPOS FISNameQSepr name])

(FISQualifyName                                        (* mct%. "23-Sep-87 15:56")
  [LAMBDA (self Name QualName)
    (DECLARE (GLOBALVARS FISNameQSepr))
    (LET [(qual (OR QualName (_ self NameQualifier)]
      (COND
        (qual (PACK* qual FISNameQSepr Name))
        (T Name])
)

(RPAQ FISNameQSepr ":")

(RPAQQ FISQualifierRenameHack NIL)

;; FOLLOWING DEFINITIONS EXPORTED

(DECLARE%: DOEVAL@COMPILE DONTCOPY

(GLOBALVARS FISNameQSepr FISQualifierRenameHack)
)

;; END EXPORTED DEFINITIONS

(DEFMACRO FISSeparatedList (List Separator &OPTIONAL (ItemExprOfX 'X))
   '[bind X for tail on ,List eachtime (SETQ X (CAR tail)) join (COND
                                                                  ((CDR tail)
                                                                   (LIST ,ItemExprOfX ,Separator))
                                                                  (T (LIST ,ItemExprOfX])

(DEFMACRO PreScrollYPos (self &OPTIONAL stream (adjust 0 adjust-P))
   '[LET NIL
      (DECLARE (GLOBALVARS FISWindowTitleFont))
      (DIFFERENCE [PLUS [WindowBottomY ,(OR (AND stream)
                                             '(@ ,self window)]
                        (DIFFERENCE (@ ,self height)
                               (HEIGHTIFWINDOW (FONTHEIGHT FISWindowTitleFont]
             ,(COND
                (adjust-P (COND
                            (adjust)
                            (T 0)))
                (T '(fetch PTOP of (@ ,self extent)])

(RPAQ FISBrowserMultipleNameSeparator " & ")

;; FOLLOWING DEFINITIONS EXPORTED

(DECLARE%: DOEVAL@COMPILE DONTCOPY
```

```
(GLOBALVARS FISBrowserMultipleNameSeparator)
)
;; END EXPORTED DEFINITIONS

;; Logout and Login support

(DEFINEQ
```

```
(ConfirmLogout                                                    (* TAL " 4-Mar-88 12:37")
  [LAMBDA NIL
    (DECLARE (GLOBALVARS FISLogoutLock))
    (COND
       [(EQ \VMEM.PURE.LIMIT T)                                   (* UNDOC T iff VMEM PURE.STATE is on and SAVEVM has already been
done)
        (TERPRI SavoirPROMPTWINDOW)
        (COND
           ((MOUSECONFIRM "Logout (and lose current vmem)?" NIL SavoirPROMPTWINDOW)
            (LOGOUT T]
       [(NULL FISLogoutLock)
        (RESETLST
            (RESETSAVE FISLogoutLock T)
            (TERPRI SavoirPROMPTWINDOW)
            (COND
               ((MOUSECONFIRM "Logout?" NIL SavoirPROMPTWINDOW)
                (SavoirCopyright)
                (RESETSAVE GREETDATES NIL)
                (LOGOUT))))]
       (T (printout SavoirPROMPTWINDOW T T "You must finish the login procedure currently in progress" T
                 "before logging out." T)
          (FLASHWINDOW SavoirPROMPTWINDOW 3])
)

(RPAQQ FISLogoutLock NIL)

[XCL:REINSTALL-ADVICE '(PROVIDE.PROMPTING.WINDOW :IN \LOGIN.READ)
       :BEFORE
       '((:LAST (SETQ TITLE "User Name Prompter"]

(READVISE (PROVIDE.PROMPTING.WINDOW :IN \LOGIN.READ))

.. UNDOC

(RPAQQ FISMiddleItemPrecedence
       ((110 Examine)
        (110 "Examine Program")
        (110 "View Program")
        (119 "Show label")
        (120 "Create Macro Step")
        (120 "Edit Transition Label")
        (120 "View C Decls")
        (120 "Create C Program (activation)")
        (120 "Examine Program (activation)")
        (121 "Create C Program (continuous)")
        (121 "Examine Program (continuous)")
        (122 "Create C Program (deactivation)")
        (122 "Examine Program (deactivation)")
        (130 "View MAP Associations")
        (130 "View Receive Templates")
        (130 "View Send Templates")
        (131 "View Send Parameters")
        (132 "View Receive Parameters")
        (135 "View Template Defaults")
        (140 "View Program Structure")
        (150 "View MAP Association")
        (150 "View Message Template")
        (210 "Set to Value")
        (210 "Set to Character")
        (210 "Set to String")
        (210 "Set to True")
        (210 "Set to False")
        (310 "Change Type")
        (320 "Replace State Variable")
        (320 "Replace Text")
        (410 Document)
        (410 "Documentation")
        (507 Add)
        (508 Change)
        (509 Copy)
        (510 Delete)
        (520 "Delete Program (activation)")
        (521 "Delete Program (continuous)")
        (522 "Delete Program (deactivation)")
        (610 "Flash Node")
        (610 "Flash Step")
        (610 "Flash Transition")
        (620 "View Decls")
        (620 "View Send Template")
        (620 "View Step Prog")
        (650 "Who Can Use")
        (651 "Who Can Call")
        (651 "Who Can Send")
        (651 "Who Can Fetch")
        (652 "Who Can Set")
        (652 "Who Defines")
        (653 "Who Declares")
        (690 "Vars Used")))

(SWSetupMiddleItemHash FISMiddleItemPrecedence)

(PUTPROPS FISUTIL FILETYPE :FAKE-COMPILE-FILE)

(PUTPROPS FISUTIL COPYRIGHT ("Savoir, Inc." 1987 1988))
```

FUNCTION INDEX

| | | | |
|---|---|---|---|
| GEMS.Abort ............4 | GEMS.Open ..............5 | tReg ..................12 | \GEMS.FindChan .........9 |
| GEMS.Associate .........4 | GEMS.Register ..........6 | \GEMS.AbortChan ........7 | \GEMS.GetAsciz .........9 |
| GEMS.AssociateResponse .4 | GEMS.Release ...........6 | \GEMS.AbortRegChan .....7 | \GEMS.MsgIn ...........10 |
| GEMS.ChannelOpen? ......4 | GEMS.ReleaseResponse ...6 | \GEMS.ChanAction .......7 | \GEMS.NextRef .........10 |
| GEMS.Close .............5 | GEMS.Send ..............6 | \GEMS.ChanTrans ........8 | \GEMS.Receive .........10 |
| GEMS.CloseAll ..........5 | GEMS.SendString ........7 | \GEMS.Cleanup ..........8 | \GEMS.SendMsg .........11 |
| GEMS.ConnectionOpen? ...5 | GEMS.TestRcv ..........13 | \GEMS.CloseChan ........9 | \GEMS.SetupHeader .....11 |
| GEMS.Deregister ........5 | tAss ..................12 | \GEMS.ConnFromStream ...9 | \GEMS.Strlen ..........11 |
| GEMS.ForceOut ..........5 | tOpen .................12 | \GEMS.Error ............9 | |

VARIABLE INDEX

| | | | |
|---|---|---|---|
| GEMS.AllGateConns .....12 | GEMS.ForceFlg .........11 | GEMS.StateTable ........2 | PRETTYEQUIVLST ........12 |
| GEMS.DefaultHost ......11 | GEMS.LastMsg ..........13 | GEMS.TestChans ........13 | \GEMS.BufferSize ......11 |
| GEMS.ErrorBreak .......11 | GEMS.Msgs .............13 | GEMSCommandCodes .......3 | \GEMS.HeaderLen .......11 |
| GEMS.ErrorStream ......11 | GEMS.ServerSocket .....11 | GEMSSubCommands ........3 | \GEMS.MaxData .........11 |

CONSTANT INDEX

| | | | | | |
|---|---|---|---|---|---|
| GEMSABRT ......3 | GEMSASSOC .....3 | GEMSDEREG .....3 | GEMSREG .......3 | GEMSRELOK .....3 | GEMSReqRef ....4 |
| GEMSABRTIND ...3 | GEMSASSOK .....3 | GEMSDone ......4 | GEMSREL .......3 | GEMSRELRESP ...3 | GEMSSEND ......3 |
| GEMSASSIND ....3 | GEMSASSRESP ...3 | GEMSRECV ......3 | GEMSRELIND ....3 | GEMSReq .......4 | |

MACRO INDEX

| | | |
|---|---|---|
| ByteSwap .......................12 | \GEMS.ChannelOpen? .............12 | \GEMS.Decode ..................12 |
| GEMS.Win .......................12 | \GEMS.ConnectionOpen? ..........12 | \GEMS.OutLock .................12 |

RECORD INDEX

| | | | |
|---|---|---|---|
| GEMSChan ...............1 | GEMSConn ...............2 | GEMSHeader .............2 | GEMSMsg ................2 |

PROPERTY INDEX

GEMS ................1,13 changes to: (VARS GEMSCOMS)

previous date: 9-Jun-88 11:33:51 (POGO:AISNORTH:XEROX)<LOOPSCORE>SAVOIR>FIS>GEMS.;29

Read Table: INTERLISP

Package: IL

;; Copyright (c) 1986, 1988 by Savoir, Inc. All rights reserved.

```
(RPAQQ GEMSCOMS
       ((DECLARE%: DONTCOPY (PROP MAKEFILE-ENVIRONMENT GEMS))
        (FILES (SYSLOAD FROM U8)
               U8SPP)
        (RECORDS GEMSChan GEMSConn GEMSHeader GEMSMsg)
        (VARS GEMS.StateTable GEMSCommandCodes GEMSSubCommands)
        (CONSTANTS * (PROGN GEMSCommandCodes))
        (CONSTANTS * (PROGN GEMSSubCommands))
        (FNS GEMS.Abort GEMS.Associate GEMS.AssociateResponse GEMS.ChannelOpen? GEMS.Close GEMS.CloseAll
             GEMS.ConnectionOpen? GEMS.Deregister GEMS.ForceOut GEMS.Open GEMS.Register GEMS.Release
             GEMS.ReleaseResponse GEMS.Send GEMS.SendString \GEMS.AbortChan \GEMS.AbortRegChan
             \GEMS.ChanAction \GEMS.ChanTrans \GEMS.Cleanup \GEMS.CloseChan \GEMS.ConnFromStream \GEMS.Error
             \GEMS.FindChan \GEMS.GetAsciz \GEMS.MsgIn \GEMS.NextRef \GEMS.Receive \GEMS.SendMsg
             \GEMS.SetupHeader \GEMS.Strlen)
        (VARS (GEMS.ServerSocket 34048)
              (\GEMS.BufferSize 1024)
              (\GEMS.HeaderLen 10)
              (\GEMS.MaxData (DIFFERENCE \GEMS.BufferSize \GEMS.HeaderLen)))
        (INITVARS (GEMS.ForceFlg T)
               (GEMS.DefaultHost (U8ToNSAddr 4979))
               (GEMS.ErrorBreak NIL)
               (GEMS.ErrorStream PROMPTWINDOW)
               (GEMS.AllGateConns NIL))
        (GLOBALVARS GEMS.DefaultHost GEMS.ServerSocket GEMS.StateTable \GEMS.BufferSize \GEMS.HeaderLen
               \GEMS.MaxData GEMS.GateConn GEMS.AllGateConns GEMS.ForceFlg GEMS.ErrorBreak GEMS.ErrorStream
               GEMSCommandCodes GEMSSubCommands)
        (ALISTS (PRETTYEQUIVLST \GEMS.OutLock))
        (DECLARE%: EVAL@COMPILE DONTCOPY (COMS (MACROS ByteSwap \GEMS.ChannelOpen? \GEMS.ConnectionOpen?
                                                      GEMS.Win \GEMS.Decode)
                                               (FUNCTIONS \GEMS.OutLock)))
```

```
        (COMS (* Test fns)
              (FNS tOpen tReg tAss GEMS.TestRcv)
              (INITVARS (GEMS.Msgs NIL)
                     (GEMS.LastMsg NIL)
                     (GEMS.TestChans NIL))
              (GLOBALVARS GEMS.Msgs GEMS.LastMsg GEMS.TestChans))
        (PROP FILETYPE GEMS)))

(DECLARE%: DONTCOPY

(PUTPROPS GEMS MAKEFILE-ENVIRONMENT (:PACKAGE "IL" :READTABLE "INTERLISP" :BASE 10))
)

(FILESLOAD (SYSLOAD FROM UB)
       UBSPP)

(DECLARE%: EVAL@COMPILE

(RECORD GEMSChan

         (* Maintains state of a MAP channel open through a GEMS gateway
         Created and returned by GEMSAssociate, and whenever an ASSIND is received for a registered name )

      (GEMSChanNum                              (* Channel number supplied by gateway
                                                Must be first, so can FASSOC)
           GEMSChanState                        (* State of channel (Assoc, Open, Release, Closed, RegPend RegFail
                                                Reg))
           GEMSLocalID                          (* Name of local process (string))
           GEMSRemoteID                         (* Name of connected process (string))
           GEMSInputFn                          (* Function applied to (GEMSChan GEMSMsg) when message received
                                                on this channel)
           )
      (SYNONYM GEMSChanNum (GEMSChanRef))
      (HASHLINK GEMSChan (GEMSConn GEMSChanConnHash 20)   (* Gateway connection for this channel
                                                Hashlink avoids circular structure )
           ))
```

Page. 2

```
(RECORD GEMSConn

         (* Maintains info about a connection to a GEMS gateway. A single GEMS connection is used for one or more MAP connections through
         the same gateway)

      (GEMSChannels                             (* List of GEMSChans open or pending through this gateway connection)
              GEMSInStr                         (* Input side of SPP stream)
              GEMSOutStr                        (* Output side of SPP stream)
              GEMSInBuf                         (* Buffer for received messages)
              GEMSOutBuf                        (* Buffer for sending messages)
              GEMSOutLock                       (* Monitorlock on output buffer)
              GEMSReg                           (* List of GEMSChans for registered names.
                                                Not used for open channels.)
              GEMSLastRef                       (* The GEMSRef of the most recent GEMS message sent to this
                                                gateway)
              GEMSGate                          (* Ethernet address of this gateway)
              GEMSProc                          (* Process handling input on this connection)
              GEMSCloseFn                       (* Fn to be applied to GEMSConn when it is closed)
              GEMSErrorFn                       (* Fn to be applied to (GEMSConn GEMSChan String) when error occurs
              on connection)
              ))

(BLOCKRECORD GEMSHeader

         (* Common header for all GEMS messages. Generally used to access the beginning of the send or receive buffer of a GEMSConn,
         where messages are normally assembled or disassembled. The   X fields are stored byte swapped to agree with the PC.
         The accessfns reverse them on store and fetch.)

       ((GEMSHdrLengthX WORD)                   (* Length in bytes of GEMS message, including header )
        (GEMSHdrCmd BYTE)                       (* Command code)
        (GEMSHdrSubCmd BYTE)                    (* SubCommand code)
        (GEMSHdrChannelX WORD)                  (* Identifies a particular MAP channel
                                                Generated by gateway when a MAP connection is opened )
        (GEMSHdrRefX WORD)                      (* Unique reference to identify a particular GEMS message
                                                Usage is currently inconsistent )
        (GEMSHdrResultX WORD)                   (* Result code. 0 = success, non-zero codes come from CASE/MAP
                                                and are undocumented.)
        (GEMSHdrDataStart WORD)                 (* Start of data, if any  Must be word aligned.)
        )
       (ACCESSFNS GEMSHeader ((GEMSHdrContents (LOCF (fetch GEMSHdrDataStart of DATUM)))
                              (GEMSHdrLength (ByteSwap (fetch GEMSHdrLengthX of DATUM))
                                     (PROGN (replace GEMSHdrLengthX of DATUM with (ByteSwap NEWVALUE))
                                            NEWVALUE))
                              (GEMSHdrChannel (ByteSwap (fetch GEMSHdrChannelX of DATUM))
                                     (PROGN (replace GEMSHdrChannelX of DATUM with (ByteSwap NEWVALUE))
                                            NEWVALUE))
                              (GEMSHdrRef (ByteSwap (fetch GEMSHdrRefX of DATUM))
                                     (PROGN (replace GEMSHdrRefX of DATUM with (ByteSwap NEWVALUE))
                                            NEWVALUE))
                              (GEMSHdrResult (ByteSwap (fetch GEMSHdrResultX of DATUM))
                                     (PROGN (replace GEMSHdrResultX of DATUM with (ByteSwap NEWVALUE))
                                            NEWVALUE]

(RECORD GEMSMsg (GEMSCmd GEMSSubCmd GEMSChannel GEMSRef GEMSResult GEMSData GEMSUserData))
)

(DECLARE%: EVAL@COMPILE
```

```
(GLOBALVARS GEMSChanConnHash)
)

(SETUPHASHARRAY 'GEMSChanConnHash 20)

(RPAQQ GEMS.StateTable
       [(GEMSREG (Req (T RegPend AddReg))
               (Done (RegPend Reg NIL))
               (DoneError (RegPend Closed RemoveReg)))
        (GEMSDEREG (Req (T DeregPend NIL))
               (Done (DeregPend Closed RemoveReg))
               (DoneError (DeregPend DeregFail RemoveReg)))
        (GEMSABRT (Req (T AbortPend NIL))
               (Done (AbortPend Closed RemoveChan))
               (DoneError (AbortPend AbortPend NIL))
               (* Should eventually add something like (Req (RegPend Closed RemoveReg)
                                                            (Reg Closed RemoveReg)
                                                            (DeregPend Reg NIL))

                  both here and in GEMSABRTIND))
        (GEMSABRTIND (Req (T Closed RemoveChan)))
        (GEMSASSOC (Req (T Assoc AddChan))
               (* Gateway doesn't send Assoc done)
               (DoneError (Assoc Closed RemoveChan)))
        [GEMSASSIND (Req (T AssocInd (AddChan AssResp]
```

Page 3

```
        (GEMSASSRESP (Req (T OpenPend NIL))
               (Done (OpenPend Open NIL))
               (ReqError (T Closed RemoveChan))
               (DoneError (OpenPend Closed InternalAbort)))
        (GEMSASSOK (Req (Assoc Open SetChanNum))
               (ReqError (Assoc Closed RemoveChan)))
        (GEMSREL (Req (T Release NIL))
               (DoneError (Release ReleaseFail InternalAbort)))
        (GEMSRELIND (Req (Open RelInd (RelResp))
                         (T NIL Abort)))
        (GEMSRELRESP (Req (T ClosedPend NIL))
               (Done (ClosedPend Closed RemoveChan))
               (DoneError (T Closed InternalAbort)))
        (GEMSRELOK (Req (Release Closed RemoveChan))
               (ReqError (Release Open NIL])

(RPAQQ GEMSCommandCodes
       ((GEMSREG 1)
        (GEMSDEREG 2)
        (GEMSSEND 3)
        (GEMSRECV 4)
        (GEMSABRT 5)
        (GEMSABRTIND 6)
        (GEMSASSOC 8)
        (GEMSASSIND 9)
        (GEMSASSRESP 10)
        (GEMSASSOK 11)
        (GEMSREL 12)
        (GEMSRELIND 13)
        (GEMSRELRESP 14)
        (GEMSRELOK 15)))

(RPAQQ GEMSSubCommands ((GEMSReq 0)
                        (GEMSDone 1)
                        (GEMSReqRef 2)))

(DECLARE%: EVAL@COMPILE

(RPAQQ GEMSREG 1)

(RPAQQ GEMSDEREG 2)

(RPAQQ GEMSSEND 3)

(RPAQQ GEMSRECV 4)

(RPAQQ GEMSABRT 5)

(RPAQQ GEMSABRTIND 6)

(RPAQQ GEMSASSOC 8)

(RPAQQ GEMSASSIND 9)

(RPAQQ GEMSASSRESP 10)

(RPAQQ GEMSASSOK 11)

(RPAQQ GEMSREL 12)

(RPAQQ GEMSRELIND 13)

(RPAQQ GEMSRELRESP 14)

(RPAQQ GEMSRELOK 15)
```

```
(CONSTANTS (GEMSREG 1)
       (GEMSDEREG 2)
       (GEMSSEND 3)
       (GEMSRECV 4)
       (GEMSABRT 5)
       (GEMSABRTIND 6)
       (GEMSASSOC 8)
       (GEMSASSIND 9)
       (GEMSASSRESP 10)
       (GEMSASSOK 11)
       (GEMSREL 12)
       (GEMSRELIND 13)
       (GEMSRELRESP 14)
       (GEMSRELOK 15))
```

```
(DECLARE%: EVAL@COMPILE

(RPAQQ GEMSReq 0)

(RPAQQ GEMSDone 1)

(RPAQQ GEMSReqRef 2)

(CONSTANTS (GEMSReq 0)
       (GEMSDone 1)
       (GEMSReqRef 2))
)

(DEFINEQ
```

(GEMS.Abort

```
  [LAMBDA (chan result)                                   (* TAL "13-Oct-86 17:22")
    (LET ((conn (fetch GEMSConn of chan)))
      (COND
         ((\GEMS.OutLock conn
             (SELECTQ (fetch GEMSChanState of chan)
                                              (* Don't have a channel number yet, abort by ref number)
                 (Assoc
                        (\GEMS.SetupHeader conn 0 GEMSABRT GEMSReqRef 0 (MINUS (fetch GEMSChanRef of chan))
                               0))
                 (\GEMS.SetupHeader conn 0 GEMSABRT GEMSReq (fetch GEMSChanNum of chan)
                        0 0))
             (\GEMS.SendMsg conn chan))
           chan)
          (T (\GEMS.CloseChan chan conn)
             NIL])
```

(GEMS.Associate

```
  [LAMBDA (MyName HisName ApplContext InputFn GEMSConn)        (* TAL "13-Oct-86 16.45")
    (LET* ((conn (OR GEMSConn GEMS.GateConn))
           (MyName (MKSTRING MyName))
           (HisName (MKSTRING HisName))
           (chan (create GEMSChan
                        GEMSConn _ conn
                        GEMSLocalID _ MyName
                        GEMSRemoteID _ HisName
                        GEMSInputFn _ InputFn))
           (CntxtName (COND
                        (ApplContext (MKSTRING ApplContext))
                        (T "")))
           (myLen (NCHARS MyName))
           (hisLen (NCHARS HisName))
           (cntxtLen (NCHARS CntxtName))
           buf)
      (\GEMS.OutLock conn
        (SETQ buf (\GEMS.SetupHeader conn (PLUS myLen hisLen cntxtLen 3)
                         GEMSASSOC GEMSReq 0 (\GEMS.NextRef conn)
                         0))
        (bind (off _ 0) for x in (LIST MyName HisName CntxtName) as len in (LIST myLen hisLen cntxtLen)
           do (\PUTBASESTRING (fetch GEMSHdrContents of buf)
                     off x NIL)
              (\PUTBASEBYTE (fetch GEMSHdrContents of buf)
                     (add off len)
                     0)
              (add off 1))
        (\GEMS.SendMsg conn chan)
        chan])
```

(GEMS.AssociateResponse

```
  [LAMBDA (chan result)                                   (* TAL " 8-Oct-86 19:08")
    (LET ((conn (fetch GEMSConn of chan)))
      (\GEMS.OutLock conn
        (\GEMS.SetupHeader conn 0 GEMSASSRESP GEMSReq (fetch GEMSChanNum of chan)
               0 0 (OR (SMALLP result)
                       0))
        (\GEMS.SendMsg conn chan)
        chan])
```

(GEMS.ChannelOpen?

```
  [LAMBDA (chan)                                          (* TAL " 1 Oct-86 19.04")
    (\GEMS.ChannelOpen? chan])
```

```
(GEMS.Close                                              (* TAL "18-Nov-86 05:56")
  [LAMBDA (GEMSConn ErrorMsg)                            (* This might went to wait until all pending activity has ceased.)
    (LET ((conn (OR GEMSConn GEMS.GateConn)))
      (AND conn (\GEMS.Cleanup conn ErrorMsg])

(GEMS.CloseAll                                           (* TAL " 1-Oct-86 19:31")
  [LAMBDA NIL
    (for conn in GEMS.AllGateConns do (GEMS.Close conn])

(GEMS.ConnectionOpen?                                    (* TAL " 1-Oct-86 19:05")
  [LAMBDA (conn)
    (\GEMS.ConnectionOpen? conn])

(GEMS.Deregister                                         (* TAL "20-Jan-88 16:09")
  [LAMBDA (NameOrChan GEMSConn)                          (* (LET* ((conn (OR GEMSConn GEMS GateConn))
                                                         (name (MKSTRING MyName)) (chan (for x in
                                                         (fetch GEMSReg of conn) thereis (AND
                                                         (EQ (fetch GEMSChanState of x) (QUOTE Reg))
                                                         (STREQUAL name (fetch GEMSLocalID of x)))))
                                                         (len (NCHARS name)) buf) (\GEMS OutLock conn
                                                         (SETQ buf (\GEMS.SetupHeader conn (ADD1 len) GEMSDEREG GEMSReq
    0 (\GEMS NextRef conn) 0)) (\PUTBASESTRING (fetch GEMSHdrContents of buf) 0 name NIL) (\PUTBASEBYTE (fetch GEMSHdrContents of buf) len 0)
                                                         (\GEMS.SendMsg conn chan) (OR chan T))))
    (LET (conn name chan len buf)
      [COND
         [(OR (STRINGP NameOrChan)
              (LITATOM NameOrChan))
          (SETQ name (MKSTRING NameOrChan))
          (SETQ conn (OR GEMSConn GEMS.GateConn))
          (SETQ chan (for x in (fetch GEMSReg of conn) thereis (AND (EQ (fetch GEMSChanState of x)
                                                                        'Reg)
                                                                    (STREQUAL name (fetch GEMSLocalID
                                                                                     of x]

         (T (SETQ chan NameOrChan)
            (SETQ name (fetch GEMSLocalID of chan))
            (SETQ conn (fetch GEMSConn of chan]
      (SETQ len (NCHARS name))
      (\GEMS.OutLock conn
        (SETQ buf (\GEMS.SetupHeader conn (ADD1 len)
                         GEMSDEREG GEMSReq 0 (\GEMS.NextRef conn)
                         0))
        (\PUTBASESTRING (fetch GEMSHdrContents of buf)
               0 name NIL)
        (\PUTBASEBYTE (fetch GEMSHdrContents of buf)
               len 0)
        (\GEMS.SendMsg conn chan)
        (OR chan T])

(GEMS.ForceOut                                           (* TAL "19-Jul-86 16:29")
  [LAMBDA (conn)
    (LET ((conn (OR conn GEMS.GateConn)))
      (FORCEOUTPUT (fetch GEMSOutStr of conn])

(GEMS.Open                                               Edited 10-May-88 16:49 by loops
  [LAMBDA (GateAddr Props)                               (* Establishes a GEMS connection with the specified gateway, returning
    a GEMSConn.)
    (PROG ((conn (create GEMSConn))
           (host (OR GateAddr GEMS.DefaultHost))
           inStr soc)
          (COND
             ((NOT (SETQ inStr (SPP.OPEN host GEMS.ServerSocket T NIL)))
              (\GEMS.Error NIL NIL (CONCAT "Can't open gateway connection to " host))
              (RETURN NIL)))
          [SETFILEINFO inStr 'ENDOFSTREAMOP (FUNCTION (LAMBDA (stream)
                                                          0]
          [SPP.OTHERPROP inStr 'NORESPONSEFN (FUNCTION (LAMBDA (con stream time)
                                                          (\GEMS.Error (\GEMS.ConnFromStream stream)
                                                                 NIL "Gateway not responding" 'TIMEOUT]
          (change (fetch GEMSInStr of conn)
                 inStr)
          (change (fetch GEMSOutStr of conn)
                 (SPPOUTPUTSTREAM inStr))
          (change (fetch GEMSInBuf of conn)
                 (\ALLOCBLOCK (IQUOTIENT (ADD1 \GEMS.BufferSize)
                                     2)
```

```
                        0))
          (change (fetch GEMSOutBuf of conn)
                 (\ALLOCBLOCK (IQUOTIENT (ADD1 \GEMS.BufferSize)
                                     2)
                        0))
          (change (fetch GEMSOutLock of conn)
                 (CREATE.MONITORLOCK 'GEMSOutput))
          (change (fetch GEMSLastRef of conn)
                 0)
          (change (fetch GEMSGate of conn)
                 host)
```

```
        (change (fetch GEMSProc of conn)
                (ADD.PROCESS '(\GEMS.Receive .(KWOTE conn))
                        'AFTEREXIT
                        'DELETE))
        (for pTail on Props by (CDDR pTail) do (SELECTQ (CAR pTail)
                                                   (CLOSEFN (change (fetch GEMSCloseFn of conn)
                                                                    (CADR pTail)))
                                                   (ERRORFN (change (fetch GEMSErrorFn of conn)
                                                                    (CADR pTail)))
                                                   NIL))
        (SETQ GEMS.GateConn conn)
        (push GEMS.AllGateConns conn)
        (RETURN conn])
```

(GEMS.Register

```
  [LAMBDA (MyName InputFn GEMSConn)                              (* TAL "20-Jan-88 16.11")
    (LET* ((conn (OR GEMSConn GEMS.GateConn))
           (name (MKSTRING MyName))
           (chan (create GEMSChan
                         GEMSConn _ conn
                         GEMSLocalID _ name
                         GEMSInputFn _ InputFn))
           (len (NCHARS name))
           buf)
      (\GEMS.OutLock conn
        (SETQ buf (\GEMS.SetupHeader conn (ADD1 len)
                         GEMSREG GEMSReq 0 (\GEMS.NextRef conn)
                         0))
        (\PUTBASESTRING (fetch GEMSHdrContents of buf)
               0 name NIL)
        (\PUTBASEBYTE (fetch GEMSHdrContents of buf)
               len 0)
        (\GEMS.SendMsg conn chan)
        chan])
```

(GEMS.Release

```
  [LAMBDA (chan result)                                          (* TAL " 8-Oct-86 19:13")
    (LET ((conn (fetch GEMSConn of chan)))
      (\GEMS.OutLock conn
        (\GEMS.SetupHeader conn 0 GEMSREL GEMSReq (fetch GEMSChanNum of chan)
               0 0)
        (\GEMS.SendMsg conn chan)
        chan])
```

(GEMS.ReleaseResponse

```
  [LAMBDA (chan result)                                          (* TAL " 8-Oct-86 19:12")
    (LET ((conn (fetch GEMSConn of chan)))
      (\GEMS.OutLock conn
        (\GEMS.SetupHeader conn 0 GEMSRELRESP GEMSReq (fetch GEMSChanNum of chan)
               0 0)
        (\GEMS.SendMsg conn chan)
        chan])
```

(GEMS.Send

```
  [LAMBDA (chan base off len)                                    (* TAL "13-Oct-86 18:06")
    (COND
       ((GREATERP len \GEMS.MaxData)
        (ERROR "GEMS message too long" len)
        NIL)
       ((\GEMS.ChannelOpen? chan)
        (LET ((conn (fetch GEMSConn of chan))
              buf)
          (\GEMS.OutLock conn
            (SETQ buf (\GEMS.SetupHeader conn len GEMSSEND GEMSReq (fetch GEMSChanNum of chan)
                             0 0))
            (\MOVEBYTES base off (fetch GEMSHdrContents of buf)
                   0 len)
```

```
            (\GEMS.SendMsg conn chan)
            chan)))
       (T (ERROR "GEMS channel not open" chan)
          NIL])
```

(GEMS.SendString

```
  [LAMBDA (chan string)                                          (* TAL "13-Oct-86 18:06")
    (LET ((len (NCHARS string)))
      (COND
         ((GREATERP len \GEMS.MaxData)
          (ERROR "GEMS message too long" len)
          NIL)
         ((\GEMS.ChannelOpen? chan)
          (LET ((conn (fetch GEMSConn of chan))
                buf)
            (\GEMS.OutLock conn
              (SETQ buf (\GEMS.SetupHeader conn len GEMSSEND GEMSReq (fetch GEMSChanNum of chan)
                               0 0))
              (\PUTBASESTRING (fetch GEMSHdrContents of buf)
                     0 string NIL)
```

```
            (\GEMS.SendMsg conn chan)
            chan)))
        (T (ERROR "GEMS channel not open" chan)
           NIL])
```

(\GEMS.AbortChan

```
  [LAMBDA (chan conn)                                   (* TAL " 3-Oct-86 17:30")
                                                        (* Simulate receipt of ABRTIND on channel)
    (LET ((msg (create GEMSMsg
                       GEMSCmd _ 'GEMSABRTIND
                       GEMSSubCmd _ 'GEMSReq
                       GEMSResult _ 0))
          (inputFn (fetch GEMSInputFn of chan)))
      (replace GEMSChannel of msg with (fetch GEMSChanNum of chan))
      (\GEMS.CloseChan chan conn)
      (COND
         (inputFn (APPLY* inputFn chan msg])
```

(\GEMS.AbortRegChan

```
  [LAMBDA (chan conn)                                   (* TAL "18-Nov-86 08:00")
                                                        (* Simulate receipt of ABRTIND on channel)
    (LET ((msg (create GEMSMsg
                       GEMSCmd _ 'GEMSABRTIND
                       GEMSSubCmd _ 'GEMSReq
                       GEMSResult _ 0))
          (inputFn (fetch GEMSInputFn of chan)))
      (replace GEMSChannel of msg with (fetch GEMSChanNum of chan))
      (\GEMS.ChanTrans chan conn 'GEMSABRTIND 'GEMSReq 0)
      (COND
         (inputFn (APPLY* inputFn chan msg])
```

(\GEMS.ChanAction

```
  [LAMBDA (action chan conn other)                      (* TAL "20-Jan-88 16:13")
    (SELECTQ action
        (AddReg (push (fetch GEMSReg of conn)
                      chan))
        (RemoveReg (change (fetch GEMSReg of conn)
                           (SafeDRemove chan DATUM))
                   (change (fetch GEMSConn of chan)
                           NIL))
        (AddChan (push (fetch GEMSChannels of conn)
                       chan))
        (RemoveChan (\GEMS.CloseChan chan conn))
        (AssResp (GEMS.AssociateResponse chan 0))
        (RelResp (GEMS.ReleaseResponse chan 0))
        (Abort (GEMS.Abort chan 0))
        (InternalAbort
            (\GEMS.AbortChan chan conn))
        (SetChanNum (change (fetch GEMSChanNum of chan)
                            other))
        (SHOULDNT action])
```

(\GEMS.ChanTrans

```
  [LAMBDA (Chan Conn Cmd SubCmd Result Other)           ; Edited 7-Jun-88 17:10 by mct
    (LET* ([cmd (COND
                   ((LITATOM Cmd)
                    Cmd)
                   (T (\GEMS.Decode Cmd GEMSCommandCodes]
           [subCmd (COND
                      ((LITATOM SubCmd)
                       SubCmd)
                      (T (\GEMS.Decode SubCmd GEMSSubCommands]
           (curState (fetch GEMSChanState of Chan))
           (res (OR Result 0))
           (code (SELECTQ subCmd
                     ((GEMSReq GEMSReqRef)
                          (COND
                             ((EQ 0 res)
                              'Req)
                             (T 'ReqError)))
                     (GEMSDone (COND
                                  ((EQ 0 res)
                                   'Done)
                                  (T 'DoneError)))
                     (SHOULDNT)))
           trans)
      (COND
         ([SETQ trans (AND (SETQ trans (CDR (FASSOC cmd GEMS.StateTable)))
                           (SETQ trans (CDR (FASSOC code trans)))
                           (for x in trans thereis (OR (EQ T (CAR x))
                                                       (EQ curState (CAR x]
          [COND
             ((CADR trans)
              (replace GEMSChanState of Chan with (CADR trans]
          (for action inside (CADDR trans) do (\GEMS.ChanAction action Chan Conn Other])
```

(\GEMS.Cleanup

```
  [LAMBDA (conn msg)                                    ; Edited 7-Jun-88 17:07 by mct
    (LET (proc)
```

```
(WITH.MONITOR (fetch GEMSOutLock of conn)
    [COND
      ((\GEMS.ConnectionOpen? conn)
        (CLOSEF (fetch GEMSInStr of conn]
    (change (fetch GEMSInStr of conn)
          NIL)
    (change (fetch GEMSOutStr of conn)
          NIL)
    (change (fetch GEMSInBuf of conn)
          NIL)
    (change (fetch GEMSOutBuf of conn)
          NIL)                                          . Send an abort to all map channels open on this connection
    (for chan in (fetch GEMSChannels of conn) do
                                                 .. This will remove the channel from GEMSChannels (carefully, so as not to fuck up the
                                                 . iteration over GEMSChannels)
                                                     (\GEMS.AbortChan chan conn))
    (change (fetch GEMSChannels of conn)
          NIL)
    (for chan in (fetch GEMSReg of conn) do (\GEMS.AbortRegChan chan conn))
    (change (fetch GEMSReg of conn)
          NIL)
    (COND
      ((EQ conn GEMS.GateConn)
        (SETQ GEMS.GateConn NIL)))
    (cdremove GEMS.AllGateConns conn)
    (COND
      ((fetch GEMSCloseFn of conn)
        (APPLY* (PROG1 (fetch GEMSCloseFn of conn)      . Avoid calling CloseFn repetitively
                  (change (fetch GEMSCloseFn of conn)
                        NIL))
              conn msg)))
    (COND
      ((PROCESSP (SETQ proc (fetch GEMSProc of conn)))
        (change (fetch GEMSProc of conn)
              NIL)
        (DEL.PROCESS proc)                              . THIS MUST BE DONE LAST, as we may have been called by the receive
                                                        . process!
        ))))])
```

Page 9

(\GEMS.CloseChan

```
  [LAMBDA (chan conn)                                   (* TAL " 1-Oct-86 00:34")
                                                        (* Mark the channel closed and remove it from the GEMSConn)
    (change (fetch GEMSChanState of chan)
          'Closed)
    (change (fetch GEMSChannels of (OR conn (fetch GEMSConn of chan)))
          (SafeDRemove chan DATUM))
    (change (fetch GEMSConn of chan)
          NIL)
    chan])
```

(\GEMS.ConnFromStream

```
  [LAMBDA (Stream)                                      (* TAL "18-Nov-86 05.06")
    (for conn in GEMS.AllGateConns thereis (OR (EQ Stream (fetch GEMSInStr of conn))
                                               (EQ Stream (fetch GEMSOutStr of conn])
```

(\GEMS.Error

```
  [LAMBDA (conn chan msg warning)                       (* TAL "18-Nov-86 05:10")
    (COND
      ((AND conn (fetch GEMSErrorFn of conn))
        (APPLY* (fetch GEMSErrorFn of conn)
              conn chan msg warning))
      (GEMS.ErrorBreak (ERROR msg))
      (T (printout (OR GEMS.ErrorStream T)
              msg T])
```

(\GEMS.FindChan

```
  [LAMBDA (conn msg cmd chanNum)                        (* TAL "18-Nov-86 05.17")
    (SELECTQ cmd
        ((GEMSASSOC GEMSASSOK GEMSREG GEMSDEREG)
          (COND
            [(FASSOC (MINUS (fetch GEMSRef of msg))
                    (SELECTQ cmd
                        ((GEMSASSOC GEMSASSOK)
                          (fetch GEMSChannels of conn))
                        ((GEMSREG GEMSDEREG)
                          (fetch GEMSReg of conn))
                        (SHOULDNT]
            (T (\GEMS.Error conn NIL (CONCAT "Received unsolicited " cmd " for channel ref " chanNum)
                      T)
                NIL)))
        (GEMSASSIND (LET ((me (CADR (fetch GEMSData of msg)))
                          chan)
                      (COND
                        ([SETQ chan (for x in (fetch GEMSReg of conn)
                                       thereis (STREQUAL me (fetch GEMSLocalID of x]
                         (SETQ chan (create GEMSChan
                                          GEMSChanNum _ chanNum
                                          GEMSLocalID _ me (*)
                                          GEMSRemoteID _ (CAR (fetch GEMSData of msg))
                                          GEMSInputFn _ (fetch GEMSInputFn of chan)))
```

```
                    (replace GEMSConn of chan with conn)
                    chan)
                   (T (\GEMS.Error conn NIL (CONCAT "Received Assoc Indicate for unknown name: " me))
                      NIL))))
        (COND
           [(AND (NEQ 0 (fetch GEMSRef of msg))
                 (FASSOC (MINUS (fetch GEMSRef of msg))
                         (fetch GEMSChannels of conn]
           ((FASSOC chanNum (fetch GEMSChannels of conn)))
           (T (\GEMS.Error conn NIL (CONCAT "Received " cmd " for unknown channel: " chanNum)
                    T)
              NIL])
```

(\GEMS.GetAsciz

```
  [LAMBDA (base offset maxOffset)                              (* TAL "19-Jul-86 13.31")
    (\GETBASESTRING base offset (\GEMS.Strlen base offset maxOffset])
```

(\GEMS.MsgIn

```
  [LAMBDA (conn msg)                                           (* TAL "18-Nov-86 06.08")
    (LET ((cmd (fetch GEMSCmd of msg))
          (subCmd (fetch GEMSSubCmd of msg))
          (chanNum (fetch GEMSChannel of msg))
          fn chan)
      (SETQ chan (\GEMS.FindChan conn msg cmd chanNum))
      (COND
        (chan (\GEMS.ChanTrans chan conn cmd subCmd (fetch GEMSResult of msg)
                    chanNum)
              (SETQ fn (fetch GEMSInputFn of chan))
              (COND
                 (fn (NLSETQ (APPLY* fn chan msg])
```

(\GEMS.NextRef

```
  [LAMBDA (conn)                                               (* TAL " 9-Oct-86 16.50")
                                                               (* (change (fetch GEMSLastRef of conn)
                                                               (LOGAND 65535 (ADD1 DATUM))))
    (LET [(next (LOGAND 65535 (ADD1 (fetch GEMSLastRef of conn]
      (COND
         ((EQ 0 next)
          (add next 1)))
      (replace GEMSLastRef of conn with next])
```

(\GEMS.Receive

```
  [LAMBDA (conn)                                               Edited 9-Jun-88 10.52 by mcf
    (PROG ((str (fetch GEMSInStr of conn))
           (buf (fetch GEMSInBuf of conn))
           len msg cmd result him)
          (RESETSAVE NIL (LIST (FUNCTION \GEMS.Cleanup)
                               conn))
          (COND
             ((NOT (\BLOCKDATAP buf))
              (\GEMS.Cleanup conn "GEMS input buffer smashed.")
              (SHOULDNT)))
          (NLSETQ (while (\GEMS.ConnectionOpen? conn)
                     do (\BINS str buf 0 2)
                        (SETQ len (fetch GEMSHdrLength of buf))
                        (COND
                           ((EQ len 0)                        . This is currently the normal indication of a close
                            (\GEMS.Cleanup conn NIL)          . THIS WILL NOT RETURN, as :GEMS.Cleanup kills the receive process.
                                                              ; which is us.
                            (SHOULDNT))
                           ((OR (ILESSP len \GEMS.HeaderLen)
                                (IGREATERP len \GEMS.BufferSize))
                            (\GEMS.Cleanup conn (CONCAT "Received GEMS message with illegal length: " len))
                            (SHOULDNT)))
                        (\BINS str buf 2 (DIFFERENCE len 2))
                        (COND
                           ((ODDP len)                        . GEMS msgs are always rounded up to even bytes
                            (BIN str)))
                        (SETQ cmd (fetch GEMSHdrCmd of buf))
                        (SETQ result (fetch GEMSHdrResult of buf))
                        (SETQ msg (create GEMSMsg
                                         GEMSCmd _ (\GEMS.Decode cmd GEMSCommandCodes)
                                         GEMSSubCmd _ (\GEMS.Decode (fetch GEMSHdrSubCmd of buf)
                                                             GEMSSubCommands)
                                         GEMSChannel _ (fetch GEMSHdrChannel of buf)
                                         GEMSRef _ (fetch GEMSHdrRef of buf)
                                         GEMSResult _ result))
                        [COND
                           ((EQ result 0)
                            (SELECTC cmd
                                (GEMSASSIND (SETQ him (\GEMS.GetAsciz (fetch GEMSHdrContents of buf)
                                                             0))
                                      [change (fetch GEMSData of msg)
                                             (LIST him (\GEMS.GetAsciz (fetch GEMSHdrContents
                                                                              of buf)
                                                              (ADD1 (NCHARS him])
                                (GEMSRECV (change (fetch GEMSData of msg)
                                                 (\GETBASESTRING (fetch GEMSHdrContents of buf)
                                                        0
                                                        (DIFFERENCE len \GEMS.HeaderLen))))
```

```
                NIL))
           ((GREATERP len \GEMS.HeaderLen)
            (change (fetch GEMSData of msg)
                    (\GEMS.GetAsciz (fetch GEMSHdrContents of buf)
                                    0]
         (\GEMS.MsgIn conn msg])
```

(\GEMS.SendMsg

```
  [LAMBDA (conn chan)                                          (* TAL "13-Oct-86 16:42")
    (LET ((stream (fetch GEMSOutStr of conn))
          (buf (fetch GEMSOutBuf of conn))
          len)
      (COND
         ((OR (NULL stream)
              (NULL buf))
          (\GEMS.Error conn chan "GEMS connection closed in \GEMS.SendMsg")
          (ERROR!)))
      (SETQ len (fetch GEMSHdrLength of buf))
      (\BOUTS stream buf 0 len)
      (COND
         ((ODDP len)                                           (* Make sure next msg is word aligned)
          (BOUT stream 0)))
      (COND
         (GEMS.ForceFlg (FORCEOUTPUT stream)))
      (COND
         (chan [COND
                  ((NEQ 0 (fetch GEMSHdrRef of buf))
                   (replace GEMSChanRef of chan with (MINUS (fetch GEMSHdrRef of buf]
               (\GEMS.ChanTrans chan conn (fetch GEMSHdrCmd of buf)
                      (fetch GEMSHdrSubCmd of buf)
                      (fetch GEMSHdrResult of buf)
                      NIL])
```

(\GEMS.SetupHeader

```
  [LAMBDA (conn dataLen cmd subCmd chanNum ref result)         (* TAL "13-Oct-86 17 59")

          (* * Sets up the GEMS header in the output buffer of conn, and returns the buffer
          dataLen should be the number of data bytes (excluding the header) that will be added, or 0 if not yet known )

    (LET (buf)
      [COND
         ([OR (NULL conn)
              (NULL (SETQ buf (fetch GEMSOutBuf of conn]
          (while T do (SHOULDNT "GEMS gateway connection not open")))
         ((GREATERP dataLen \GEMS.MaxData)
          (while T do (SHOULDNT "GEMS message too long"]
      (change (fetch GEMSHdrLength of buf)
              (PLUS dataLen \GEMS.HeaderLen))
      (change (fetch GEMSHdrCmd of buf)
              cmd)
      (change (fetch GEMSHdrSubCmd of buf)
              (OR subCmd GEMSReq))
      (change (fetch GEMSHdrChannel of buf)
              (OR (NUMBERP chanNum)
                  0))
      (change (fetch GEMSHdrRef of buf)
              (OR (NUMBERP ref)
                  0))
      (change (fetch GEMSHdrResult of buf)
              (OR (NUMBERP result)
                  0))
      buf])
```

(\GEMS.Strlen

```
  [LAMBDA (base offset maxOffset)                              Edited 9-Jun-88 10:53 by mcf
    (for i from offset to (OR maxOffset \GEMS.MaxData) thereis (EQ 0 (\GETBASEBYTE base i))
       thenyield (DIFFERENCE i offset) elseyield (MAX 0 (DIFFERENCE (OR maxOffset \GEMS.MaxData)
                                                                    offset])
)

(RPAQQ GEMS.ServerSocket 34048)

(RPAQQ \GEMS.BufferSize 1024)

(RPAQQ \GEMS.HeaderLen 10)

(RPAQ \GEMS.MaxData (DIFFERENCE \GEMS.BufferSize \GEMS.HeaderLen))

(RPAQ? GEMS.ForceFlg T)

(RPAQ? GEMS.DefaultHost (UBToNSAddr 4979))

(RPAQ? GEMS.ErrorBreak NIL)

(RPAQ? GEMS.ErrorStream PROMPTWINDOW)
```

```
(RPAQ? GEMS.AllGateConns NIL)

(DECLARE%: DOEVAL@COMPILE DONTCOPY

(GLOBALVARS GEMS.DefaultHost GEMS.ServerSocket GEMS.StateTable \GEMS.BufferSize \GEMS.HeaderLen \GEMS.MaxData
       GEMS.GateConn GEMS.AllGateConns GEMS.ForceFlg GEMS.ErrorBreak GEMS.ErrorStream GEMSCommandCodes
       GEMSSubCommands)
)

(ADDTOVAR PRETTYEQUIVLST (\GEMS.OutLock . LAMBDA))

(DECLARE%: EVAL@COMPILE DONTCOPY

(DECLARE%: EVAL@COMPILE

(PUTPROPS ByteSwap MACRO (OPENLAMBDA (word)
                                (LOGOR (LLSH (LOGAND word 255)
                                             8)
                                       (LOGAND (LRSH word 8)
                                               255))))

(PUTPROPS \GEMS.ChannelOpen? MACRO ((chan)
                                    (EQ (fetch GEMSChanState of chan)
                                        'Open)))

(PUTPROPS \GEMS.ConnectionOpen? MACRO [OPENLAMBDA (conn)
                                              (AND conn (SPP.OPENP (fetch GEMSInStr of conn])

(PUTPROPS GEMS.Win MACRO (OPENLAMBDA (stream)
                                (LOGOR (LLSH (BIN stream)
                                             8)
                                       (BIN stream))))

(PUTPROPS \GEMS.Decode MACRO (OPENLAMBDA (code cmds)
                                    (for x in cmds thereis (EQ code (CADR x)) thenyield (CAR x) elseyield
                                                                                                code)))

)
(DEFMACRO \GEMS.OutLock (conn &REST forms)
   '[COND
      ((\GEMS.ConnectionOpen? ,conn)
       (CAR (NLSETQ (WITH.MONITOR (fetch GEMSOutLock of ,conn)
                           (COND
                              ((NULL (\GEMS.ConnectionOpen? ,conn))
                               (ERROR!))
                              (T ,@forms)))])
)

          (* * Test fns)

(DEFINEQ

(tOpen
  [LAMBDA NIL                                              (* TAL "21-Jul-86 16:32")
    (printout T "FOO = " (SETQ FOO (GEMS.Open)))
    Nothing])

(tReg
  [LAMBDA NIL                                              (* TAL "25-Jul-86 12:40")
    (GEMS.Register "Harpo" 'GEMS.TestRcv)
    (SETQ BAR NIL)
    Nothing])

(tAss
  [LAMBDA NIL                                              (* TAL " 9-Oct-86 16:52")
    [printout T "BAZ = " (SETQ BAZ (GEMS.Associate "Zeppo" "Harpo" "Fredonia" (FUNCTION GEMS.TestRcv]
    Nothing])
```

```
(GEMS.TestRcv
  [LAMBDA (chan msg)                                       (* TAL " 9-Oct-86 16:52")
    (printout T "Chan " (fetch GEMSChanNum of chan).
           ", " msg T)
    (push GEMS.Msgs msg)
    (SETQ GEMS.LastMsg msg)
    (SELECTQ (fetch GEMSCmd of msg)
         (GEMSASSIND (push GEMS.TestChans chan))
         NIL])
)

(RPAQ? GEMS.Msgs NIL)

(RPAQ? GEMS.LastMsg NIL)

(RPAQ? GEMS.TestChans NIL)

(DECLARE%: DOEVAL@COMPILE DONTCOPY

(GLOBALVARS GEMS.Msgs GEMS.LastMsg GEMS.TestChans)
)

(PUTPROPS GEMS FILETYPE :BCOMPL)

(PUTPROPS GEMS COPYRIGHT ("Savoir, Inc." 1986 1988))
```

FUNCTION INDEX

FID.ComputeInitialPos ..........19
FISGetGrafcetObjectFromBrowser .20
FISGetNamedParts ..............20
FISSortByStepNumber ...........20
FOEFontNameFromFont ...........20
GetSelectedBrowser ............20
GraphGraf .....................20

METHOD INDEX

FOEGrafcetBrowser.AddObject .....2
FOEGrafcetBrowser.AddObject1 .....3
FOEGrafcetBrowser.AutoLink .....3
FOEGrafcetBrowser.Browse .....3
FOEGrafcetBrowser.ChangeFont .....3
FOEGrafcetBrowser.ChangeType .....4
FOEGrafcetBrowser.CheckGrafcetSyntax .....4
FOEGrafcetBrowser.CleanupState .....4
FOEGrafcetBrowser.Compile .....4
FOEGrafcetBrowser.ContentsChanged .....5
FOEGrafcetBrowser.CopyObject .....5
FOEGrafcetBrowser.CopyObject1 .....5
FOEGrafcetBrowser.CopyObjectMacro .....5
FOEGrafcetBrowser.CopyObjectStep .....5
FOEGrafcetBrowser.CurrentFont .....6
FOEGrafcetBrowser.DefaultFont .....6
FOEGrafcetBrowser.DelAct .....6
FOEGrafcetBrowser.DelCon .....6
FOEGrafcetBrowser.DelDeAct .....6
FOEGrafcetBrowser.Delete .....6
FOEGrafcetBrowser.DeleteObject .....6
FOEGrafcetBrowser.DeleteProgram .....7
FOEGrafcetBrowser.DoLinkObject .....7
FOEGrafcetBrowser.EditDecls .....7
FOEGrafcetBrowser.ExitBrowser .....7
FOEGrafcetBrowser.GetContainerWithPrompt .....7
FOEGrafcetBrowser.GetReduceHorizMenuItems .....7
FOEGrafcetBrowser.LeftSelection .....8
FOEGrafcetBrowser.LinkObject .....8
FOEGrafcetBrowser.LinkObjectRemote .....8
FOEGrafcetBrowser.MarkObject .....8
FOEGrafcetBrowser.MethodMenuSelection .....8
FOEGrafcetBrowser.MiddleItemPredicate .....9
FOEGrafcetBrowser.MoveIt .....9
FOEGrafcetBrowser.MoveObject .....9
FOEGrafcetBrowser.NewFont .....10
FOEGrafcetBrowser.NumberStep .....10
FOEGrafcetBrowser.PositionObject .....10
FOEGrafcetBrowser.RepaintFn .....11
FOEGrafcetBrowser.Scale .....11
FOEGrafcetBrowser.ScaleIt .....11
FOEGrafcetBrowser.SetAllTrue .....12
FOEGrafcetBrowser.SetDefaultFont .....12
FOEGrafcetBrowser.SetFirstTrue .....12
FOEGrafcetBrowser.SetFont .....12
FOEGrafcetBrowser.SetObjectAbbreviation .....12
FOEGrafcetBrowser.SetTitle .....13
FOEGrafcetBrowser.ShapeToFit .....13
FOEGrafcetBrowser.ShiftPoint .....13
FOEGrafcetBrowser.ShowLabel .....13
FOEGrafcetBrowser.ShowValue .....14
FOEGrafcetBrowser.SpaceP .....14
FOEGrafcetBrowser.TitleObject .....14
FOEGrafcetBrowser.TransferObject .....14
FOEGrafcetBrowser.UnDelete .....15
FOEGrafcetBrowser.UndeleteObject .....15
FOEGrafcetBrowser.UnLinkDest .....15
FOEGrafcetBrowser.UnLinkObject .....15
FOEGrafcetBrowser.UnLinkSource .....15
FOEGrafcetBrowser.UnLinkSourceDest .....15
GrafcetStructureBrowser.Browse .....15
GrafcetStructureBrowser.CheckForMultipleBrowsers ..16
GrafcetStructureBrowser.ConstructTitle .....16
GrafcetStructureBrowser.DeleteObject .....16
GrafcetStructureBrowser.Destroy .....16
GrafcetStructureBrowser.DocumentAll .....16
GrafcetStructureBrowser.DocumentAlph .....16
GrafcetStructureBrowser.DocumentHierarchy .....17
GrafcetStructureBrowser.DocumentOne .....17
GrafcetStructureBrowser.FindSelectedSubObject .....17
GrafcetStructureBrowser.GetLabel .....17
GrafcetStructureBrowser.GetSubs .....17
GrafcetStructureBrowser.HighlightNode .....17
GrafcetStructureBrowser.MiddleItemPredicate .....17
GrafcetStructureBrowser.ObjNamePair .....18
GrafcetStructureBrowser.Recompute .....18
GrafcetStructureBrowser.Show .....18
GrafcetStructureBrowser.TitleSelection .....19

VARIABLE INDEX

FISDefaultShowLabelWidth .....21
FISGlobalDeletedObjectLst .....21
FISShowLabelFontSize .....21
FOEGrafcetBrowserEditMethodItems .....21
GrafcetFontLst .....21

CLASS INDEX

FOEGrafcetBrowser .....2
GrafcetStructureBrowser .....2

PROPERTY INDEX

GRAFBROWSER .....1,21

RECORD INDEX

FISNameTranslations .....20 changes to: (VARS GRAFBROWSERCOMS)

previous date: 5-Sep-88 17:00:43 {DSK}<LISPFILES2>FIS>GRAFBROWSER.;171

Read Table: INTERLISP

Package: IL

;; Copyright (c) 1985, 1986, 1987, 1997, 1988 by Savoir, Inc.. All rights reserved.

```
(RPAQQ GRAFBROWSERCOMS
       ((DECLARE%: DONTCOPY (PROP MAKEFILE-ENVIRONMENT GRAFBROWSER))
```

```
(CLASSES FOEGrafcetBrowser GrafcetStructureBrowser)
(METHODS FOEGrafcetBrowser.AddObject FOEGrafcetBrowser.AddObject1 FOEGrafcetBrowser.AutoLink
       FOEGrafcetBrowser.Browse FOEGrafcetBrowser.ChangeFont FOEGrafcetBrowser.ChangeType
       FOEGrafcetBrowser.CheckGrafcetSyntax FOEGrafcetBrowser.CleanupState FOEGrafcetBrowser.Compile
       FOEGrafcetBrowser.ContentsChanged FOEGrafcetBrowser.CopyObject FOEGrafcetBrowser.CopyObject1
       FOEGrafcetBrowser.CopyObjectMacro FOEGrafcetBrowser.CopyObjectStep
       FOEGrafcetBrowser.CurrentFont FOEGrafcetBrowser.DefaultFont FOEGrafcetBrowser.DelAct
       FOEGrafcetBrowser.DelCon FOEGrafcetBrowser.DelDeAct FOEGrafcetBrowser.Delete
       FOEGrafcetBrowser.DeleteObject FOEGrafcetBrowser.DeleteProgram FOEGrafcetBrowser.DoLinkObject
       FOEGrafcetBrowser.EditDecls FOEGrafcetBrowser.ExitBrowser
       FOEGrafcetBrowser.GetContainerWithPrompt FOEGrafcetBrowser.GetReduceHorizMenuItems
       FOEGrafcetBrowser.LeftSelection FOEGrafcetBrowser.LinkObject
       FOEGrafcetBrowser.LinkObjectRemote FOEGrafcetBrowser.MarkObject
       FOEGrafcetBrowser.MethodMenuSelection FOEGrafcetBrowser.MiddleItemPredicate
       FOEGrafcetBrowser.MoveIt FOEGrafcetBrowser.MoveObject FOEGrafcetBrowser.NewFont
       FOEGrafcetBrowser.NumberStep FOEGrafcetBrowser.PositionObject FOEGrafcetBrowser.RepaintFn
       FOEGrafcetBrowser.Scale FOEGrafcetBrowser.ScaleIt FOEGrafcetBrowser.SetAllTrue
       FOEGrafcetBrowser.SetDefaultFont FOEGrafcetBrowser.SetFirstTrue FOEGrafcetBrowser.SetFont
       FOEGrafcetBrowser.SetObjectAbbreviation FOEGrafcetBrowser.SetTitle
       FOEGrafcetBrowser.ShapeToFit FOEGrafcetBrowser.ShiftPoint FOEGrafcetBrowser.ShowLabel
       FOEGrafcetBrowser.ShowValue FOEGrafcetBrowser.SpaceP FOEGrafcetBrowser.TitleObject
       FOEGrafcetBrowser.TransferObject FOEGrafcetBrowser.UnDelete FOEGrafcetBrowser.UnLinkDest
       FOEGrafcetBrowser.UnLinkObject FOEGrafcetBrowser.UnLinkSource
       FOEGrafcetBrowser.UnLinkSourceDest FOEGrafcetBrowser.UndeleteObject
       GrafcetStructureBrowser.Browse GrafcetStructureBrowser.CheckForMultipleBrowsers
       GrafcetStructureBrowser.ConstructTitle GrafcetStructureBrowser.DeleteObject
       GrafcetStructureBrowser.Destroy GrafcetStructureBrowser.DocumentAll
       GrafcetStructureBrowser.DocumentAlph GrafcetStructureBrowser.DocumentHierarchy
       GrafcetStructureBrowser.DocumentOne GrafcetStructureBrowser.FindSelectedSubObject
       GrafcetStructureBrowser.GetLabel GrafcetStructureBrowser.GetSubs
       GrafcetStructureBrowser.HighlightNode GrafcetStructureBrowser.MiddleItemPredicate
       GrafcetStructureBrowser.ObjNamePair GrafcetStructureBrowser.Recompute
       GrafcetStructureBrowser.Show GrafcetStructureBrowser.TitleSelection)
 (FNS FID.ComputeInitialPos FISGetNamedParts FISSortByStepNumber FISGetGrafcetObjectFromBrowser
      FOEFontNameFromFont GetSelectedBrowser GraphGraf)
 (RECORDS FISNameTranslations)
 (VARS FOEGrafcetBrowserEditMethodItems (FISGlobalDeletedObjectLst)
      [GrafcetFontLst (LIST [CONS 6 (FONTCREATE '(HELVETICA 5]
                            [CONS 8 (FONTCREATE '(HELVETICA 7]
                            [CONS 10 (FONTCREATE '(HELVETICA 8 BOLD]
                            [CONS 12 (FONTCREATE '(HELVETICA 8 BOLD]
                            [CONS 14 (FONTCREATE '(HELVETICA 10 BOLD]
                            [CONS 16 (FONTCREATE '(HELVETICA 10 BOLD]
                            (CONS 'OTHER (FONTCREATE '(HELVETICA 12 BOLD]
      (FISDefaultShowLabelWidth 150))
 (INITVARS (FISShowLabelFontSize 'OTHER))
 (GLOBALVARS GrafcetFontLst)
 (PROP FILETYPE GRAFBROWSER)))

(DECLARE%: DONTCOPY

(PUTPROPS GRAFBROWSER MAKEFILE-ENVIRONMENT (:PACKAGE "IL" :READTABLE "INTERLISP" :BASE 10))
)
```

```
(DEFCLASS FOEGrafcetBrowser (MetaClass Class Edited%:        (* mct " 7-Jan-87 16:16")
                                doc "This is the default metaClass for all classes")
   (Supers FOEBrowser)
   (ClassVariables (EditMethodItems
                     #.($A (PROGN FOEGrafcetBrowserEditMethodItems) EveryFetch NoUpdatePermitted))
          (HorizMethodItems #.($A ((Scale Scale "Scale object up in size" (SUBITEMS (Scale% Up Scale "Scal
e object up in size" (SUBITEMS (x2 Scale "Double scale-up factor") (x3 Scale "Triple scale-up factor"))) (Scal
e% Down Scale "Scale object down in size" (SUBITEMS (x/2 Scale "Double scale-down factor") (x/3 Scale "Triple
scale-down factor"))) (Reduce% Menu ModifyMethodMenu "Reduce number of menu items displayed") (Change% Font Ch
angeFont "Change the font for step and transition labels" (SUBITEMS (Change% Font ChangeFont "Change the font
for step and transition labels") (Current% Font CurrentFont "Display the characteristics of the current font")
 (Default% Font DefaultFont "Use the default font for this scale") (Set% Default SetDefaultFont "Make the curr
ent font the default for the current scale")))))) UnionSuperValue NoUpdatePermitted))
          (ReduceHorizMethodItems #.($A ((Scale Scale "Scale object up in size" (SUBITEMS (Scale% Up Scale
 "Scale object up in size" (SUBITEMS (x2 Scale "Double scale-up factor") (x3 Scale "Triple scale-up factor")))
 (Scale% Down Scale "Scale object down in size" (SUBITEMS (x/2 Scale "Double scale-down factor") (x/3 Scale "T
riple scale-down factor"))) (Expand% Menu ModifyMethodMenu "Expand menu to full item set")))) UnionSuperValue
NoUpdatePermitted))
          (MiddleMethodItems (("Delete Program (activation)" (DelAct activation)
                                   "Delete activation program")
                              ("Delete Program (continuous)" (DelCon continuous)
                                   "Delete continuous program")
                              ("Delete Program (deactivation)" (DelDeAct deactivation)
                                   "Delete deactivation program")
                              ("Show label" ShowLabel "Show full transition label")
                              ("Change Type" ChangeType "Toggle between Macro and Abortable Macro step
                                   type")))
          (RightButtonItems #.($A (ShapeToFit) UnionSuperValue NoUpdatePermitted))
          (ShiftRightButtonItems #.($A (ShapeToFit) UnionSuperValue NoUpdatePermitted))
          (StickyEditCommands (AddObject DeleteObject LabelObject LinkObject MoveObject)))
   (InstanceVariables (interfereFlg NIL doc "If off watch for interference when moving objects")
          (dontRepaintFlg NIL doc "special flag for repainting when scaling")
          (editModeCommand NIL doc "Current sticky edit mode (command . menuItem)")
          (editCommand NIL doc "Current command")
          (nameSubstitutionALst NIL doc "Names returned from the substitution browser")))
```

```
(DEFCLASS GrafcetStructureBrowser (MetaClass Class Edited%:   (* mcf%: "26-Jan-88 15.09")
                                   doc "This is the default metaClass for all classes")
       (Supers LatticeBrowserBrowser)
       (ClassVariables (HorizMethodItems
       #,($A ((Recompute Recompute "Recompute hierarchical relationships")) UnionSuperValue NoUpdatePermitted)
                   )
              (PrintName "Hierarchical Structure" doc "Undocumented CV added by LIPKIS")
              (MiddleMethodItems #,($A ((Document DocumentAll "Document this portion of hierarchy" (SUBITEMS (
"Document All" DocumentAll "Document this portion of hierarchy") ("Document One" DocumentOne "Document this ob
ject") ("Document Hierarchy " DocumentHierarchy "Document the hierarchy graph only") ("Document Alphabetically
" DocumentAlph "Document this portion of hierarchy in alphabetical order")))) UnionSuperValue NoUpdatePermitte
d))
              (Prototype #,($& GrafcetStructureBrowser .(|OJVO.L2[:.jb8| . 23)) doc "Undocumented CV added by
                   FEBER"))
       (InstanceVariables (graphFormat (REVERSE/DAUGHTERS))
              (nonexistentMacros NIL)))

(\BatchMethodDefs)

(Method ((FOEGrafcetBrowser AddObject) self Object)
                                                       . mcf: 16-Feb-88 10 21
   "Insert an object in the browser"
   [LET (stepn (object (ObjectExists? Object))
             (w (@ window)))
     (OR object (_ self GetWithPrompt "Select item from objects menu"))
     (COND
        [(AND (OR object (SETQ object (@ self paletteItem)))
              (COND
                 ((EQ 'Class (ClassName (Class object)))
                  (SETQ object (_ object New)))
                 ((ObjectExists? object)
                  (SETQ object (_ object CopyDeep))
                  (_ object UnSetName)))
              (_ object PermissibleP 'Add))
         (COND
            ([AND (_ object InstOf! 'GrafcetRegularStep)
                  (SETQ stepn (@ object stepNumber))
                  (OR (EQ stepn 'IN)
                      (EQ stepn 'OUT))
                  (NOT (_ object ValidStepNumber? stepn (@ object)))]
             (_ self SWPromptPrint (CONCAT "ERROR: Only 1 " stepn " step permitted")
                     NIL T NIL 2000))
            (T (_ self AddObject1 object)
               (OR (@ object label)
                   (bind label msg while (NOT label)                                      Page 3

                      do (SETQ label (_ self SWPromptForString "Enter label: "))
                         (COND
                            ((SETQ msg (_ object SetLabel label NIL (@ object)))
                             (_ self SWPromptPrint msg NIL T NIL 2000)
                                                           . hack to permit NIL label
                             (SETQ label NIL))
                            (T (SETQ label T)))
                      finally (_@ object labelRegion NotSetValue)
                              (_ object CacheFlush)))
               (_ object Draw w)]
        (T (_ self ClearSelections)])

(Method ((FOEGrafcetBrowser AddObject1) self Object)
                                                       . mcf: 15-Feb-88 14:08
   "New method template"
   [COND
      ([AND (_ Object InstOf! 'GrafcetStep)
            (NOT (_ Object ValidStepNumber? (@ Object stepNumber)
                        (@ object))]
       (_@ Object stepNumber (ADD1 (@ self |:object:numberCache|)))]
   (_ Object Install (@ self object))
   (_ self PositionObject Object)
   (_ self Insert Object)
   (_ self AutoLink Object)
   (_ self AdjustExtent (@ Object highlightRegion))
   (_ Object Draw (@ window)))

(Method ((FOEGrafcetBrowser AutoLink) self object)   mcf: 17-Oct-86 14 02
   "New method template"
   (LET ((top (LISTGET (@ object %:connectPts)
                       'Top))
         (bot (LISTGET (@ object %:connectPts)
                       'Bottom))
         (stream (@ self %:window))
         (scale (@ self |:object:progScale|)))

         (* Because transitions allow linking to transitions (indirect kludge) we must explicitly avoid automatically linking two objects of same
         type)

     (for obj otop obot in (@ self %:contentObjectLst) when (NEQ (Class object)
                                                                 (Class obj))

        do (SETQ otop (LISTGET (@ obj %:connectPts)
                               'Top))
           (SETQ obot (LISTGET (@ obj %:connectPts)
                               'Bottom))
```

```
          (COND
             ((AND (EQUAL top obot)
                   (NOT (_ obj Linkable? stream scale object)))
              (_ obj Link stream scale object)
              (SETQ top NIL))
             ((AND (EQUAL bot otop)
                   (NOT (_ object Linkable? stream scale obj)))
              (_ object Link stream scale obj)
              (SETQ bot NIL)))
       while (OR top bot))))
```

(Method ((FOEGrafcetBrowser Browse) self context object)
mcf 14-Aug-85 05.23

```
   "Specialization"
   (_ self SetFont object (@ object %:progScale)
         (@ %:window))
   (_Super self Browse context object))
```

(Method ((FOEGrafcetBrowser ChangeFont) self) TAL 24-Apr 86 17 58

```
   "New method template"
   [LET* ((window (@ %:window))
          (wReg (WINDOWREGION window))
          (mPos (create POSITION
                        XCOORD _ (fetch LEFT of wReg)
                        YCOORD _ (fetch TOP of wReg)))
          (newFamily (MENU (DEFERREDCONSTANT (create MENU
                                                 ITEMS _ TEDIT.KNOWN.FONTS
                                                 TITLE _ "Font:"
                                                 CENTERFLG _ T))
                           mPos))
          (newFace (SELECTQ (MENU TEDIT.FACE.MENU mPos)
                         (Regular 'MRR)
                         (Bold 'BRR)

                         (Italic 'MIR)
                         (Bold% Italic 'BIR)
                         NIL))
          (newSize (MENU TEDIT.SIZE.MENU mPos))
          (oldFont (DSPFONT NIL window))
          newFont)
     (COND
        ((OR newFamily newFace newSize)
         (COND
            ((SETQ newFont (FONTCREATE (OR newFamily (FONTPROP oldFont 'FAMILY))
                                   (OR newSize (FONTPROP oldFont 'SIZE))
                                   (OR newFace (FONTPROP oldFont 'FACE))
                                   NIL
                                   'DISPLAY T))
             (_ self NewFont newFont)
             (_ self CurrentFont))
            (T (_ self SWPromptPrint "Font not found.")])
```

Page 4

(Method ((FOEGrafcetBrowser ChangeType) self Item Object)
mcf: 22-Dec-87 18 00

```
   "New method template"
   (_ Object ChangeType)
   (_ Object Erase (@ %:window))
   (_ Object Draw (@ %:window)))
```

(Method ((FOEGrafcetBrowser CheckGrafcetSyntax) self)
mcf 1-Jan-87 16 15

```
   "New method template"
   (_ self SWPromptPrint "Checking Syntax ...")
   (RESETFORM (CURSOR WAITINGCURSOR)
         (_ (@ %:object)
            Lint)
         (_ self SWPromptPrint "  Done." 'NOCR)))
```

(Method ((FOEGrafcetBrowser CleanupState) self) mcf: 15-Oct-87 11 01

```
   "Specialization"
   (LET (menuWindow oldItem)
     (COND
        ((@ editState)
         (_@ editCommand NIL)
         (_@ nameSubstitutionAList NIL)
         [COND
            ((AND (SETQ menuWindow (@ editMenu))
                  (SETQ oldItem (@ editModeCommand)))

             (SHADEITEM (CADR oldItem) (CAR (WINDOWPROP menuWindow MENU)) WHITESHADE)

             (FLIPREGION menuWindow (MENUITEMREGION (CADR oldItem)
                                          (CAR (WINDOWPROP menuWindow 'MENU]
         (_@ editModeCommand NIL)
         (_ self SetTitle)
         [AND (EQ (CAR oldItem)
                  'AddObject)
              (SETQ menuWindow (@ paletteMenu))
              (SETQ oldItem (@ paletteItem))
```

```
            (SETQ oldItem (for i in [fetch ITEMS of (CAR (WINDOWPROP menuWindow 'MENU]
                                thereis (EQ (CADR i)
                                            oldItem)))

            .. (SHADEITEM oldItem (CAR (WINDOWPROP menuWindow 'MENU)) WHITESHADE)

            (FLIPREGION menuWindow (MENUITEMREGION oldItem (CAR (WINDOWPROP menuWindow 'MENU]
        (_@ paletteItem NIL)))
    (_Super self CleanupState)))
```

(Method ((FOEGrafcetBrowser Compile) self) . mcf 1-Jan-87 15 59

```
  "New method template"
  [LET ((CC.ErrorStream (FUNCTION FISCompileError)))
    (DECLARE (SPECVARS CC.ErrorStream))
    (_ self SWPromptPrint "Compiling ...")
    (RESETFORM (CURSOR WAITINGCURSOR)
           (_ (@ %:object)
              Lint)
           (COND
              ((_ (@ %:object)
                  CompileTransitions)
               (_ self SWPromptPrint "  OK." 'NOCR))
              (T (_ self SWPromptPrint "  Failed." 'NOCR]])
```

Page 5

(Method ((FOEGrafcetBrowser ContentsChanged) self Arg1) . mcf: 11-Nov-87 14.56

```
  "Specialization"
  [LET (w)
    (COND
       ((AND Arg1 (FMEMB Arg1 (@ %:contentObjectLst)))
        (SETQ w (@ %:window))
        (_ Arg1 Erase w)
        (_ Arg1 Draw w))
       (T (_Super self ContentsChanged Arg1)])
```

(Method ((FOEGrafcetBrowser CopyObject) self Object Item) . mcf: 15-Feb-88 14:38

```
  "New method template"
  (LET (label olabel obj dobj msg (xlations (create FISNameTranslations)))
    [COND
       [(AND (SETQ obj (OR (ObjectExists? Object)
                           (_ self GetSelection "Select Object to Copy" T)))
             (OR (_ obj PermissibleP 'Copy)
                 (SETQ obj NIL))
             (SETQ dobj (_ self GetContainerWithPrompt "Select destintion for object")))
        (_ self DeSelect obj)
        (replace Qualifier of xlations with (FISDequalifyName (_ dobj GetName)
                                                             NIL T))

        (COND
           ((_ obj InstOf! 'GrafcetStep)
            (SELECTQ (@ obj %:stepType)
                 (Macro (_ self CopyObjectMacro obj dobj xlations))
                 (InitialStep (COND
                                 ((_ dobj InstOf! 'GrafcetMainProgram)
                                  (_ self CopyObjectStep obj dobj xlations))
                                 (T (SETQ msg "Initial step destination must be a Main Program"))))
                 (_ self CopyObjectStep obj dobj xlations)))
           (T (_ self CopyObject1 obj dobj xlations)]
       (T (SETQ msg (COND
                       (obj "Illegal destintion for Copy")
                       (T "Illegal source for Copy"]
    (_@ self %:editCommand NIL)
    (AND msg (_ self SWPromptPrint (CONCAT "ERROR: " msg)
                  NIL T NIL 2000))))
```

(Method ((FOEGrafcetBrowser CopyObject1) self SourceObject DestObject XLations) . mcf: 20-Oct-87 15 54

```
  "New method template"
  [LET (dspEditor newObj mainObj)
    (COND
       ((SETQ dspEditor (ObjectExists? (@ DestObject displayEditor)))
        (SETQ newObj (_ SourceObject SWCopyDeep XLations))
        (for o in (FISGetNamedParts SourceObject) do (_ o SWCopyDeep XLations))
        (_ dspEditor AddObject1 newObj)
        (_ newObj CacheFlush!)
        (_ DestObject CacheFlush)
        (COND
           ((AND (SETQ mainObj (ObjectExists? (@ DestObject mainProgram)))
                 (NEQ mainObj DestObject))
            (_ mainObj CacheFlush)])
```

(Method ((FOEGrafcetBrowser CopyObjectMacro) self SourceObject DestObject XLations) . mcf 1-Jan-87 14:27

```
  "New method template"
  [LET (xlations)
    (COND
       ((SETQ xlations (CopyNameSubInterface self SourceObject DestObject XLations))
        (_ self CopyObject1 SourceObject DestObject xlations)])
```

```
(Method ((FOEGrafcetBrowser CopyObjectStep) self SourceObject DestObject XLations)
                                                        ; mct: 1-Apr-88 13:42
   "New method template"
   [LET (label olabel msg)
     (AND [SETQ label (SETQ olabel (MKATOM (@ SourceObject label)]
          (_ SourceObject NameConflict? label DestObject T)
          (SETQ label NIL))
     [until (AND (SETQ label (MKATOM (_ self SWPromptForString "Enter Label: " label)))
                 (NOT (SETQ msg (_ SourceObject NameConflict? label DestObject T)]
        do (COND
              (label (SETQ label NIL)
                     (_ self SWPromptPrint msg NIL T NIL 2000))
              (T (RETURN]
```

```
     (COND
        (label (RESETFORM (CURSOR WAITINGCURSOR)
                   (SELECTQ (@ SourceObject stepType)
                        ((Regular Task Process InitialStep)
                             (replace RegularSteps of XLations with (CONS (CONS olabel label)))
                             [replace MacroSteps of XLations
                                with (CONS (CONS (FISDequalifyName (_ (@ SourceObject superObject)
                                                                       GetName))
                                                 (FISDequalifyName (_ DestObject GetName)])
                        (MMFS [COND
                                 [(_ SourceObject InstOf! 'GrafcetSendStep)
                                  (replace MMFSSSteps of XLations with (CONS (CONS olabel label]
                                 (T (replace MMFSRSteps of XLations with (CONS (CONS olabel label])
                        NIL)
                   (_ self CopyObject1 SourceObject DestObject XLations)])

(Method ((FOEGrafcetBrowser CurrentFont) self)       ; TAL 24-Apr-86 14:49
   "New method template"
   (_ self SWPromptPrint [CONCAT "Current font is " (FOEFontNameFromFont (DSPFONT NIL (@ %:window)])))

(Method ((FOEGrafcetBrowser DefaultFont) self)       ; TAL 24-Apr-86 14:29
   "New method template"
   (_ self SetFont (@ %:object)
         (@ |:object:progScale|)
         (@ %:window))
   (_ self NewFont)
   (_ self CurrentFont))

(Method ((FOEGrafcetBrowser DelAct) self Item Object)
                                                        ; mct: 21-Jul-86 14:54
   "New method template"
   (_ self DeleteProgram Object 'activation))

(Method ((FOEGrafcetBrowser DelCon) self Item Object)
                                                        ; mct: 21-Jul-86 14:54
   "New method template"
   (_ self DeleteProgram Object 'continuous))

(Method ((FOEGrafcetBrowser DelDeAct) self Item Object)
                                                        ; mct: 21-Jul-86 14:55
   "New method template"
   (_ self DeleteProgram Object 'deactivation))

(Method ((FOEGrafcetBrowser Delete) self Item)       mct: 27-Oct-87 12:14
   "Specialization. Erase all links coming in to object and all links going out of object. and then delete
   (which erases) object"
   (_ self UnDrawLinks Item 'Both)
   (_Super self Delete Item)
   (_@ |:object:rawExtent| NotSetValue))

(Method ((FOEGrafcetBrowser DeleteObject) self Object)
                                                        ; mct: 28-Oct-87 08:24
   "Specialization"
   (DECLARE (GLOBALVARS FISGlobalDeletedObjectLst))
   [LET (oldDel obj)
     (COND
        ((SETQ obj (_Super self DeleteObject Object))
         (RESETLST
              (RESETSAVE (CURSOR WAITINGCURSOR))
              (COND
                 ((SETQ oldDel (@ self %:delObjectLst))
                  (push FISGlobalDeletedObjectLst oldDel)))
              (for x in (FISGetNamedParts obj) do (_ x RemoveBrowsers))
              (_ obj Rename! NIL (GENSYM))
              (_@ self %:delObjectLst (CONS (_ (@ self %:object)
                                                NameQualifier)
                                            obj)))])
```

```
(Method ((FOEGrafcetBrowser DeleteProgram) self Object objIV)
                                                        . TAL 4-Sep-86 18:08
   "New method template"
   (AND (MOUSECONFIRM (CONCAT FISOneCR "Delete " objIV "?")
              NIL SavoirPROMPTWINDOW)
        (_ Object DeleteProgram objIV (@ %:window))))

(Method ((FOEGrafcetBrowser DoLinkObject) self Source Type)
                                                        . mcf: 15-Oct-87 09:33
   "link two objects together"
   [PROG (source destination link msg (stream (@ self %:window))
               (scale (@ self |:object:progScale|)))
         (COND
            ([AND (AND (SETQ source (OR (AND (ObjectExists? Source)
                                            Source)
                                       (_ self GetSelection "Select Source" T)))
                      (_ source PermissibleP 'Link))
                 (AND (SETQ destination (_ self GetSelection "Select Destination"))
                      (_ destination PermissibleP 'Link))
                 (NOT (SETQ msg (_ source Linkable? stream scale destination Type)]
             (_ self DeSelect destination)
             (_ self ClearBoxHighLight)
             (_ source Link stream scale destination Type))
            (T                                      (* (COND (msg (_ self SWPromptPrint msg))
                                                       (T (_ self SWPromptPrint "ERROR. Objects not Linkable"))))
               (_ self SWPromptPrint (OR msg "ERROR: Objects not Linkable")
                      NIL T NIL 2000)])

(Method ((FOEGrafcetBrowser EditDecls) self)            TAL 3 Jul-86 07 24
   "New method template"
   (_ (@ %:context)
      SpawnSubContext
      ($ EditGrafDeclsContext)
      (@ %:object)))

(Method ((FOEGrafcetBrowser ExitBrowser) self)           . mcf: 20-Nov-87 11 11
   "Specialization"
   (DECLARE (GLOBALVARS FISGlobalDeletedObjectLst))
   (LET (kobj)
     [RESETFORM (CURSOR WAITINGCURSOR)
            (COND
               ([AND (SETQ kobj (OR (@ self %:delObjectLst)
                                    (pop FISGlobalDeletedObjectLst)))
                     (ObjectExists? (SETQ kobj (CDR kobj]
                (_ kobj Kill!))]
     (_Super self ExitBrowser)))

(Method ((FOEGrafcetBrowser GetContainerWithPrompt) self Msg DontClosePromptFlg)
                                                        mcf: 1 Nov-87 13 37
   "New method template"
   (DECLARE (GLOBALVARS MOUSECONFIRMWAIT))
   (LET (pWindow)
     (RESETLST
        (COND
           (Msg [RESETSAVE (SETQ pWindow (GETPROMPTWINDOW (@ %:window)))
                       '(PROGN (OR DontClosePromptFlg (CLOSEW OLDVALUE]
                (CLEARW pWindow)
                (PRIN1 Msg pWindow)))
        (DISMISS MOUSECONFIRMWAIT NIL T)
        (FISGetGrafcetObjectFromBrowser))))

(Method ((FOEGrafcetBrowser GetReduceHorizMenuItems) self)
                                                        mcf: 2 Dec-85 21 25
   "Specialization"
   [LIST (LIST 'Menu 'Noop "Slide out for menu items" (CONS 'SUBITEMS (APPEND (_ self RemoveItemFromMenu
                                                                               (_Super self
                                                                                GetReduceHorizMenuItems
)
                                                                               'Scale)
                                                                  (@ |::ReduceHorizMethodItems|)'
```

```
(Method ((FOEGrafcetBrowser LeftSelection) self Window)
                                                        . mcf: 10-Dec-86 14:52
   "Specialization"
   [LET [obj process (command (@ editModeCommand))
             (window (OR Window (@ self window))]
     (COND
        [(AND command (NOT (@ selectionOn)))
         (COND
            ([SETQ obj (COND
                          ((EQ (CAR command)
                               'AddObject)
                           (@ paletteItem))
                          (T (_ self FindSelectedSubObject window NIL)]
```

```
        (SETQ process (@ self menuProcess))
        (COND
           ((AND (PROCESSP process)
                 (NEQ process (THIS.PROCESS)))
            (DEL.PROCESS process)
            (BLOCK)))
        (_@ self menuProcess (THIS.PROCESS))
        (ALLOW.BUTTON.EVENTS)
        (AND (EQ (CAR command)
                 'LinkObject)
             (_@ selectionOn T))
        (_! self (CAR command)
                 obj)
        (_@ self menuProcess NIL)
        (_@ self selectionOn NIL)]
    (T (_Super self LeftSelection window)])
```

(Method ((FOEGrafcetBrowser LinkObject) self Source)
mcf: 9-Dec-86 13:59

```
  "Specialization"
  (_ self DoLinkObject Source))
```

(Method ((FOEGrafcetBrowser LinkObjectRemote) self Object Item)
mcf 11-Jan-88 16:05

```
  "New method template"
  (_ self DoLinkObject NIL (DEFERREDCONSTANT ($ GrafcetRemoteLink))))
```

(Method ((FOEGrafcetBrowser MarkObject) self Item SubObject)
mcf: 18-Dec-86 15:38

```
  "Tell the object that it is changed"
  (_ (@ object)
     MarkAsChanged
     'CHANGED)
  (AND Item (_! self (CAADR Item)
                SubObject)))
```

(Method ((FOEGrafcetBrowser MethodMenuSelection) self Item Button SubObject Menu)
mcf: 6-Apr-88 16:08

```
  "Specialization"
  (LET (editMenu oldItem item itemName reg (editWindow (@ editMenu)))
    [AND editWindow (SETQ editMenu (CAR (WINDOWPROP editWindow 'MENU]
    (OR [COND
          ((EQ Menu editMenu)
           (SETQ oldItem (@ editModeCommand))
           (_ self CleanupState)
           (SETQ item (OR (AND (LISTP Item)
                               (CADR Item))
                          Item))
           (SETQ itemName (OR (AND (LISTP item)
                                   (CAR item))
                              item))
           (_@ self editCommand itemName)
           (COND
              ((EQ Button 'MIDDLE)
               (COND
                  ((NEQ itemName (CAR oldItem))
                   (COND
                      ((AND (FMEMB itemName (@ |::StickyEditCommands|))
                            (SETQ reg (MENUITEMREGION Item editMenu)))
                       (AND (LISTP item)
                            (_! self (CADR item)))
                       (FLIPREGION editWindow reg)
                       (_@ editModeCommand (LIST itemName Item))
                       (_ self SetTitle)
                       T)))
```

```
              (T]
        (_Super self MethodMenuSelection Item Button SubObject Menu))))
```

(Method ((FOEGrafcetBrowser MiddleItemPredicate) self SubObject Item Selector)
mcf: 22-Dec-87 18:02

```
  "Specialization"
  (COND
     ([AND (LISTP Selector)
           (FMEMB (CADR Selector)
                  '(activation continuous deactivation]
      (AND (@ |:context:permitEdits|)
           (_ SubObject InstOf! 'GrafcetRegularStep)
           (GetValue SubObject (CADR Selector))
           (_Super self MiddleItemPredicate SubObject Item Selector)))
     [(EQ Selector 'ShowLabel)
      (COND
         ((AND (_ SubObject InstOf! 'GrafcetTransition)
               (@ SubObject %:abbreviation))
          (_Super self MiddleItemPredicate SubObject Item Selector)]
```

```
[(EQ Selector 'ChangeType)
 (COND
    ((_ SubObject InstOf! 'GrafcetMacroStep)
     (_Super self MiddleItemPredicate SubObject Item Selector)]
[NIL (_ SubObject InstOf! 'GrafcetTransition)
     (COND
        [(SELECTQ Selector
               (ShowLabel (@ SubObject %:abbreviation))
               (ShowValue (_ (@ SubObject |:superObject:mainProgram|)
                             LocateBrowsers ~
                             'COMBINEGRAFCETPROCESSBROWSER))
               T)
         (_Super self MiddleItemPredicate SubObject Item Selector)]
  (T (_Super self MiddleItemPredicate SubObject Item Selector))))
```

(Method ((FOEGrafcetBrowser MoveIt) self item) mcf 10-Dec-86 16:38

```
  "temporary Specialization"
  [PROG [[Item (OR item (CAR (@ %:selectionLst)]
         itemBM oldregion newregion (wregion (WINDOWPROP (@ %:window)
                                                          'REGION]

       (COND
          (Item (SETQ oldregion (@ Item %:region))
                (_ self Delete Item)
                (SETQ newregion (_ self GetNewPosition Item))
                (_ Item ClearRegions)
                (_@ Item %:center newregion)
                (_@ Item %:dirty T)
                (_ Item Moved)
                (_ self UnDelete Item T)])
```

(Method ((FOEGrafcetBrowser MoveObject) self Object) mcf 7 Oct-86 13:20

```
   "Specialization prompting move function"
   [LET (tempPos Attn CurAttn (object (AND (Object? Object)
                                           Object)))

     (COND
       ((AND [OR object (SETQ object (_ self LocateObject (_ self GetSelection "Select Object to move")
                                                          'ID)]
             (_ object PermissibleP 'Move))

        (* If there is an attention point on this object. be sure to bring it with us)

        [COND
           ((SETQ CurAttn (CAR (@ self %:currentAttention)))
            (for pts bind (attention _ (FID.ComputeCenter CurAttn)) on (@ object %:connectPts)
               by (CDDR pts) thereis (COND
                                         ((EQUAL (CADR pts)
                                                 attention)
                                          (SETQ Attn (CAR pts]
        (_ self DeSelect object)
        (_ self MoveIt object)
        (_ self AdjustExtent (@ object %:highlightRegion))
        (COND
           [Attn (_@ self %:currentAttention (LIST (_ self GridJustify (fetch XCOORD
                                                                        of (SETQ tempPos
                                                                               (_ object GetConnectPoint Attn)
                                                                               ))
                                                   (fetch YCOORD of tempPos))))]
           (CurAttn (INTERSECTREGIONS CurAttn (@ object %:region))
                    (_@ self %:currentAttention NIL)])
```

Page 1?

(Method ((FOEGrafcetBrowser NewFont) self newFont) TAL 24-Apr-86 15:03

```
  "New method template"
  (LET* ((Window (@ window))
         (object (@ object))
         (clip (DSPCLIPPINGREGION NIL Window))
         raw)
    (for obj in (@ object subObjects) do (_@ obj dirty T)
                                         (_ obj ClearRegions))
    (DSPFONT newFont Window)
    (PutValueOnly object 'rawExtent NotSetValue)
    (WINDOWPROP Window 'EXTENT (SETQ raw (@ object rawExtent)))
    (_@ self width (WIDTHIFWINDOW (fetch WIDTH of raw)))
    (_@ self height (HEIGHTIFWINDOW (fetch HEIGHT of raw)
                     T))
    (CLEARW Window)
    (PreSCROLLW Window (IDIFFERENCE (fetch LEFT of clip)
                                    (fetch LEFT of raw))
          (IDIFFERENCE (fetch BOTTOM of clip)
                 (fetch BOTTOM of raw)))
    (_ self Update)
    (_ self AfterMoveFn Window)
    (_ object DrawAll Window)))
```

(Method ((FOEGrafcetBrowser NumberStep) self Object Item)
mct 2-Feb-88 19.00

```
"New method template"
[LET (stepn obj)
  (COND
    ((AND (SETQ obj (_ self GetSelection "Select step" T))
          (_ obj PermissibleP 'Number))
     [do (SETQ stepn (_ self SWPromptForWord "Enter step number: "))
        repeatuntil (OR (NOT stepn)
                        (SETQ stepn (_ obj ValidStepNumber? stepn (@ %:object))]
     (_ self DeSelect obj)
     [COND
        (stepn (_ obj EraseStepNumber (@ %:window))
               (_@ obj %:stepNumber stepn)
               (_ obj Install (@ %:object))
               (_ obj DrawStepNumber (@ %:window))
               (SORT (@ |:object:steps|)
                     (FUNCTION FISSortByStepNumber]
     NIL)
    (T (_ self SWPromptPrint "Number Grafcet Steps only" NIL T NIL 2000)])
```

(Method ((FOEGrafcetBrowser PositionObject) self Object)
mct: 5-Oct-87 17 39

```
"New method template"
(LET (offPos region (w (@ %:window)))
  (SETQ offPos (CADR (_ Object GetShape)))
  (GETMOUSESTATE)
  (SETQ region (_ self GridJustify (LASTMOUSEX w)
                      (LASTMOUSEY w)))
  [COND
     ((IGREATERP (fetch HEIGHT of offPos)
              (fetch HEIGHT of region))
      (change (fetch BOTTOM of region)
             (IDIFFERENCE DATUM (LRSH (IDIFFERENCE (fetch HEIGHT of offPos)
                                                   (fetch HEIGHT of region))
                                      1)))
      [COND
         ((IGREATERP (fetch WIDTH of offPos)
                  (fetch WIDTH of region))
          (change (fetch LEFT of region)
                 (IDIFFERENCE DATUM (LRSH (IDIFFERENCE (fetch WIDTH of offPos)
                                                       (fetch WIDTH of region))
                                          1)))
          (replace WIDTH of region with (fetch WIDTH of offPos]
      (replace HEIGHT of region with (fetch HEIGHT of offPos]
  [SETQ offPos (FID.ComputeCenter (FID.ComputeInitialPos region (DSPCLIPPINGREGION NIL w)
                                         (@ self |:object:progScale|)
                                         (for x in (@ self %:contentObjectLst)
                                            when (NEQ x Object) collect (@ x %:region)]
  (_@ Object %:center offPos)
  (_@ Object %:region NotSetValue)
  (_ self MoveIt Object)))
```

(Method ((FOEGrafcetBrowser RepaintFn) self Window Region)
mct: 8-Nov-86 15:30

```
"Specialization"
[OR (@ %:dontRepaintFlg)
    (for obj reg in (@ self %:contentObjectLst)
       do (COND
             ((REGIONSINTERSECTP (@ obj %:region)
                     Region)
              (_ obj Draw Window))
             ((_ obj RegionIntersectP Region)
              (_ obj Draw Window))
             (T (for link in (@ obj %:linkType) do (_ link DrawLink Window)
                   when (for linkpoints in (@ link %:drawPoints)
                           thereis (for p2 (p1 _ (CAR linkpoints)) in (CDR linkpoints)
                                      thereis (PROG1 (INTERSECT/REGIONP/LBWH (COND
                                                                              ((IGREATERP (fetch XCOORD
                                                                                                 of p2)
                                                                                          (fetch XCOORD
                                                                                                 of p1))
                                                                               (fetch XCOORD
                                                                                      of p1))
                                                                              (T (fetch XCOORD
                                                                                        of p2)))
                                                                  (COND
                                                                     ((IGREATERP (fetch YCOORD of p2)
                                                                                 (fetch YCOORD of p1))
                                                                      (fetch YCOORD of p1))
                                                                     (T (fetch YCOORD of p2)))
                                                                  (ABS (IDIFFERENCE (fetch XCOORD of p1)
                                                                                    (fetch XCOORD of p2)))
                                                                  (ABS (IDIFFERENCE (fetch YCOORD of p1)
                                                                                    (fetch YCOORD of p2)))
                                                                  Region)
                                                 (SETQ p1 p2])
```

```
(Method ((FOEGrafcetBrowser Scale) self Item)                    . mct  3-Dec-86 14 21
   "Scale the object around"
   [LET* [w wreg newfactor (oldfactor (@ self |:object:progScale|))
            (factorlst (@ self |:object::ScaleFactors|))
            (Up (LISTGET factorlst 'Up))
            (Down (LISTGET factorlst 'Down]
     (COND
       ((SELECTQ (CAR Item)
             ((Scale Scale% Up)
                 (SETQ newfactor (IPLUS Up oldfactor)))
             (Scale% Down (SETQ newfactor (IDIFFERENCE oldfactor Down)))
             (x2 (SETQ newfactor (IPLUS oldfactor (ITIMES Up 2))))
             (x3 (SETQ newfactor (IPLUS oldfactor (ITIMES Up 3))))
             (x/2 (SETQ newfactor (IDIFFERENCE oldfactor (ITIMES Down 2))))
             (x/3 (SETQ newfactor (IDIFFERENCE oldfactor (ITIMES Down 3))))
             NIL)
        (_ self ScaleIt oldfactor newfactor)
        (COND
           ([AND (SETQ w (@ self %:window))
                 (NOT (INTERSECTREGIONS WHOLESCREEN (SETQ wreg (WINDOWPROP w 'REGION]
            (MOVEW w (COND
                       ((MINUSP (fetch LEFT of wreg))
                        0)
                       (T (fetch LEFT of wreg)))
                  (COND
                     ((MINUSP (fetch BOTTOM of wreg))
                      0)
                     (T (fetch BOTTOM of wreg])

(Method ((FOEGrafcetBrowser ScaleIt) self OldScale NewScale)
                                                                 . mct: 17-Jul 87 14 23
   "Change display size of object"
   [LET (clip minscale raw palMenu (window (@ window))
              (object (@ object)))
     (COND
       ((ILESSP NewScale (SETQ minscale (@ object |::MinScale|)))
        (SETQ NewScale minscale)))
     (COND
       ((NEQ OldScale NewScale)
        (_ object ScaleIt OldScale NewScale)
        (COND
           (window (REMOVEPROMPTWINDOW window)
                   (AND (@ editState)
                        (SETQ palMenu (@ paletteMenu))
                        (DETACHWINDOW palMenu))
```

Page 1?

```
                   (SETQ clip (DSPCLIPPINGREGION NIL window))
                   (_ self SetFont object NewScale window)
                   (SETQ raw (@ object rawExtent))
                   (WINDOWPROP window 'EXTENT raw)
                   (_@ self width (_ self GetNewWidth (fetch WIDTH of raw)))
                   (_@ self height (_ self GetNewHeight (fetch HEIGHT of raw)))
                   (CLEARW window)
                   (PreSCROLLW window (IDIFFERENCE (fetch LEFT of clip)
                                                   (fetch LEFT of raw))
                         (IDIFFERENCE (fetch BOTTOM of clip)
                                (fetch BOTTOM of raw)))
                   (RESETLST
                      (RESETSAVE (PutValue self 'dontRepaintFlg T)
                             '(PutValue .self dontRepaintFlg NIL))
                      (_ self Update))
                   (_ self AfterMoveFn window)
                   (_ object DrawAll window)
                   (AND palMenu (ATTACHWINDOW palMenu (@ editMenu)
                                    'BOTTOM
                                    'LEFT])

(Method ((FOEGrafcetBrowser SetAllTrue) self Object Item)
                                                                 . mct 11-Jan-88 16.47
   "New method template"
   [LET (obj)
     (COND
       ((AND (SETQ obj (_ self GetSelection "Select step"))
             (_ obj InstOf! 'GrafcetStep))
        (_@ obj %:firstTrueFlg NIL)
        (_ self DeSelect obj)
        (_ self Repaint)])

(Method ((FOEGrafcetBrowser SetDefaultFont) self): TAL 24-Apr-86 14 52
   "New method template"
   [LET [(font (DSPFONT NIL (@ %:window)]
     (PUTASSOC (@ |:object:progScale|)
            font GrafcetFontLst)
     (_ self SWPromptPrint (CONCAT "Default font for this scale is now " (FOEFontNameFromFont font)))])

(Method ((FOEGrafcetBrowser SetFirstTrue) self Object Item)
                                                                 . mct 11-Jan-88 16.46
   "New method template"
   [LET (obj)
     (COND
```

```
((AND (SETQ obj (_ self GetSelection "Select step"))
      (_ obj InstOf! 'GrafcetStep))
 (_@ obj %:firstTrueFlg T)
 (_ self DeSelect obj)
 (_ self Repaint)])
```

(Method ((FOEGrafcetBrowser SetFont) self object scale window)
. TAL 24-Apr-86 13:13

```
"New method template"
[LET (font)
  (COND
    ([SETQ font (SELECTQ scale
                   ((2 4)
                      (_@ object %:quietFlg T)
                      NIL)
                   (SETQ font (OR (CDR (FASSOC scale GrafcetFontLst))
                                  (CDR (FASSOC 'OTHER GrafcetFontLst]
     (_@ object %:quietFlg NIL)
     (DSPFONT font window])
```

(Method ((FOEGrafcetBrowser SetObjectAbbreviation) self Object Item)
. mct 11-Jan-88 16.47

```
"New method template"
[LET (object label msg)
  (COND
    [(AND (SETQ object (_ self GetSelection "Select transition to abbreviate" T))
          (_ object PermissibleP 'Abbreviate))
     [AND (SETQ label (_ self SWPromptForString "Enter Abbreviation: " (COND
                                                                        ((SETQ label (@ object
                                                                          %:abbreviation
))
                                                                          (SUBSTRING label 2 -2))))]
                                                  (* (_ self ClearBoxHighLight))
```

Page 13

```
     (_ self DeSelect object)                     (* (_ self Repaint))
     (COND
       ((SETQ msg (_ object SetAbbreviation label (@ %:window)))
        (_ self SWPromptPrint msg NIL T NIL 2000))
       (T (_ object ObjectChanged)]
    (T (_ self SWPromptPrint "Abbreviate transition labels only" NIL T NIL 2000)])
```

(Method ((FOEGrafcetBrowser SetTitle) self NewTitle); Edited 1-Sep-88 19:23 by mct
. mct: 23-Jul-87 07:33

```
"New method template"
(LET [(editMode (@ editModeCommand))
      (editName (CADR (FASSOC (@ editState)
                              (@ self BrowserNames)]
  (_@ self title (_ self ConstructTitle NIL [COND
                                               ((OR editMode editName)
                                                (CONCAT (OR editName "")
                                                        (OR (AND editMode (CONCAT ": " (CAADR editMode)
                                                                                  " Mode"))
                                                            ""]))
  (_ self Update)))
```

(Method ((FOEGrafcetBrowser ShapeToFit) self) . mct: 21-Apr-88 16.31

```
"New method template"
[LET (extent palMenu clip (window (@ %:window)))
  (COND
    ((SETQ extent (@ %:object))
     (_@ extent %:rawExtent NotSetValue)
     (SETQ extent (@ extent %:rawExtent))
     (AND (@ %:editState)
          (SETQ palMenu (@ %:paletteMenu))
          (DETACHWINDOW palMenu))
     (_ self PositionBrowser (fetch WIDTH of extent)
           (fetch HEIGHT of extent))
     (WINDOWPROP window 'EXTENT extent)
     (SETQ clip (DSPCLIPPINGREGION NIL window))
     (SCROLLW window (IDIFFERENCE (fetch LEFT of clip)
                                  (fetch LEFT of extent))
           (IDIFFERENCE (fetch BOTTOM of clip)
                        (fetch BOTTOM of extent)))
     (AND palMenu (ATTACHWINDOW palMenu (@ %:editMenu)
                                'BOTTOM
                                'LEFT])
```

(Method ((FOEGrafcetBrowser ShiftPoint) self point oldscale newscale)
mct: 13-Aug-85 21 45

```
"New method template"
[create POSITION
      XCOORD _ (ITIMES (LRSH newscale 1)
                       (IQUOTIENT (fetch XCOORD of point)
                                  (LRSH oldscale 1)))
      YCOORD _ (ITIMES (LRSH newscale 1)
                       (IQUOTIENT (fetch YCOORD of point)
                                  (LRSH oldscale 1])
```

```
(Method ((FOEGrafcetBrowser ShowLabel) self Item Object)
                                                          mcf: 18-Nov-87 11:06

   "New method template"
   (DECLARE (GLOBALVARS FISShowLabelFontSize FISDefaultShowLabelWidth GrafcetFontLst))
   [LET [bm brwsr ds height width value (xincr 2)
          (font (OR (AND FISShowLabelFontSize (CDR (FASSOC FISShowLabelFontSize GrafcetFontLst)))
                    (DSPFONT NIL (@ %:window))]
     (SELECTQ (CAR Item)
          (ShowLabel (SETQ value (@ Object %:label)))
          (ShowValue (SETQ brwsr (_ (@ Object |:superObject:mainProgram|)
                                   LocateBrowsers
                                   'COMBINEGRAFCETPROCESSBROWSER))
                    [COND
                       ((SETQ brwsr (CAR brwsr))
                        (SETQ value (OR (_ Object Evaluate (@ brwsr %:context))
                                        0])
          NIL)
     (COND
        ((AND value)
         (COND
            ((IGREATERP (SETQ width (STRINGWIDTH value font))
                        FISDefaultShowLabelWidth)
             (SETQ height (TIMES (FONTHEIGHT font)
                                 (IPLUS (IQUOTIENT width FISDefaultShowLabelWidth)
```

Page 14

```
                                        2)))
             (SETQ width FISDefaultShowLabelWidth))
            (T (SETQ height (FONTHEIGHT font))
               (add width xincr)))
         (SETQ bm (BITMAPCREATE width height))
         (SETQ ds (DSPCREATE bm))
         (DSPFONT font ds)
         (DSPRIGHTMARGIN width ds)
         (DSPLEFTMARGIN xincr ds)
         (MOVETO xincr (IDIFFERENCE height (FONTASCENT font))
                 ds)
         (PRIN1 value ds)
         (MENU (create MENU
                       ITEMS _ (LIST (LIST bm NIL Nothing])

(Method ((FOEGrafcetBrowser ShowValue) self Item Object)
                                                          ; mcf: 18-Nov-87 11:01
   "New method template"
   (_ self ShowLabel Item Object))

(Method ((FOEGrafcetBrowser SpaceP) self obj Region)
                                                          , mcf: 19-Jul-85 16:08
   "Let the object handle space verification"
   (_ obj SpaceP Region))

(Method ((FOEGrafcetBrowser TitleObject) self)          mcf: 17-Dec-85 16:21
   "Name that object"
   [LET ((obj (@ self %:object))
         title)
     (COND
        ((SETQ title (_ self SWPromptForWord "Enter Title"))
         (_ obj SetName title)])

(Method ((FOEGrafcetBrowser TransferObject) self Object Item)
                                                          , mcf: 15-Feb-88 14:38
   "New method template"
   (LET (obj newName de dobj dname msg)
     [COND
        [(AND (SETQ obj (OR (AND (ObjectExists? Object)
                                 Object)
                            (_ self GetSelection "Select Object to Transfer" T)))
              (OR (_ obj PermissibleP 'Transfer)
                  (SETQ obj NIL))
              (SETQ dobj (_ self GetContainerWithPrompt "Select destintion for object")))
         (_ self DeSelect obj)
         (RESETFORM (CURSOR WAITINGCURSOR)
                (COND
                   [[AND (_ obj Transferable? dobj)
                         (NOT (FMEMB dobj (FISGetNamedParts obj]
                    (COND
                       ([AND (NEQ dobj (@ obj %:superObject))
                             (SETQ de (ObjectExists? (@ dobj %:displayEditor)]
                        (_ self DeleteObject1 obj)
                        (SETQ dname (_ dobj GetName))
                        (_ obj Rename! NIL (FISDequalifyName dname NIL T)
                               (FISDequalifyName dname))
                        (_ de AddObject1 obj)
                        (_ obj CacheFlush!)]
                   (T (COND
                         ([AND (_ obj InstOf! 'GrafcetInitialStep)
                               (NOT (_ dobj InstOf! 'GrafcetMainProgram)]
                          (SETQ msg "Initial step destination must be a Main Program"))
                         (T (SETQ msg "Name conflict at destination"]
```

```
        (T (SETQ msg (COND
                       (obj "Illegal destintion for Transfer")
                       (T "Illegal source for Transfer"]
    (AND msg (_ self SWPromptPrint (CONCAT 'ERROR: " msg)
                    NIL T NIL 2000))))
```

```
(Method ((FOEGrafcetBrowser UnDelete) self item)     , mcf: 13-Aug-85 20.20
  "Specialization"
  (_Super self UnDelete item T)
  [LET ((scale (@ !:object:progScale!))
        (stream (@ self %:window)))
    (for pred in (@ item %:predecessors) do (for link in (@ pred %:linkType)
                                               do (_ link DrawLink stream scale)
                                               when (EQ (@ link %:linkDestination)
                                                        item])

(Method ((FOEGrafcetBrowser UnLinkDest) self Object Item)
                                                      , mcf 11-Jan-88 16.46
  "New method template"
  (_ self UnLinkObject 'Dest))

(Method ((FOEGrafcetBrowser UnLinkObject) self LinkSwitch)
                                                      , mcf: 14-Jan-86 14:39
  "Removes links from an object, but leaves it in the display"
  [LET (object (stream (@ self %:window)))
    (COND
      ((SETQ object (_ self GetSelection "Select Object"))
       (_ self DeSelect object)
       (_ self ClearBoxHighLight)
       (_ self UnDrawLinks object LinkSwitch)
       (_ object DeLink LinkSwitch stream (@ self !:object:progScale!))
       (_ object Erase stream)
       (_ object Draw stream)
       (_ self BoxHighLight)])

(Method ((FOEGrafcetBrowser UnLinkSource) self Object Item)
                                                      , mcf: 20-Jan-88 12.37
  "New method template"
  (_ self UnLinkObject 'Source))

(Method ((FOEGrafcetBrowser UnLinkSourceDest) self Object Item)
                                                      , mcf 11-Jan-88 16:45
  "New method template"
  (_ self UnLinkObject 'Both))

(Method ((FOEGrafcetBrowser UndeleteObject) self)
                                                      , mcf: 27-Oct-87 13.20
  "New method template"
  (LET [msg (obj (@ self %:object))
            (oldObj (CDR (@ self %:delObjectLst)]
    (RESETLST
        (RESETSAVE (CURSOR WAITINGCURSOR))
        (COND
           [(ObjectExists? oldObj)
            (COND
               ((_ oldObj Transferable? obj)
                (_@ self %:delObjectLst NotSetValue)
                (_ oldObj Rename! NIL (_ obj NameQualifier))
                (_ self AddObject1 oldObj)
                (_ oldObj CacheFlush!))
               (T (SETQ msg "Name conflict undeleting object"]
           (T (SETQ msg "No object to undelete"))))
    (AND msg (_ self SWPromptPrint (CONCAT "ERROR: " msg)
                    NIL T NIL 2000))))

(Method ((GrafcetStructureBrowser Browse) self context object)
                                                      , mcf 29-Jul-86 17 28
  "Specialization"
  (_@ startingList [OR (LISTP object)
                       (LIST (COND
                               ((type? SWNameReference object))
                               ((_ object InstOf! 'SWNamedObject)
                                (SWCreateNameReference (@ object objectIdentifier)))
                               (T object]))
  (_Super self Browse))
```

```
(Method ((GrafcetStructureBrowser CheckForMultipleBrowsers) self Object)
                                                      mcf: 10-Sep-86 11:48
                                                      , Specialization
  "(_Super self CheckForMultipleBrowsers object)"
  [LET (graf (key (_ self ClassName))
             (object Object))
    (COND
      [(for obj in object thereisval (COND
```

```
                          ((AND (SETQ graf (_ obj CheckPropList key))
                                (SETQ graf (SASSOC object graf))
                                (SETQ graf (CADR graf))
                                (NOT (DestroyedObject? graf)))
                           (_ graf FlashBrowser)
                           'Abort]
        (T (for obj in object do (_ obj ModifyPropList key (CONS (LIST object self)
                                                        (_ obj CheckPropList key)))])
```

(Method ((GrafcetStructureBrowser ConstructTitle) self object browsername)
. TAL 17-Jan-88 17:56

```
  "Specialization"
  (DECLARE (GLOBALVARS FISBrowserMultipleNameSeparator))
  (COND
    [(LISTP object)
```

```
(* (CONCAT (PACK (for obj on (SORT
(COPY object) (FUNCTION (LAMBDA (A B)
(ALPHORDER (@ A %.printName) (@ B %.printName))))) collect
(COND ((IGREATERP (LENGTH obj) 1)
(PACK* (@ (CAR obj) %.printName) ","))
(T (@ (CAR obj) %.printName))))) " " (OR browsername
(@ self |..PrintName|))))
(* (CONCATLIST (NCONC (FISSeparatedList
(SORT (APPEND object) (FUNCTION (LAMBDA
(A B) (UALPHORDER (@ A %.printName)
(@ B %.printName))))) FISBrowserMultipleNameSeparator
(@ X %.printName)) (LIST " " (OR browsername
(@ self | PrintName|))))))
```

```
      (CONCATLIST (NCONC (FISSeparatedList [SORT (APPEND object)
                                                 (FUNCTION (LAMBDA (A B)
                                                   (UALPHORDER (_ A QualifiedPrintName)
                                                               (_ B QualifiedPrintName)]
                                  FISBrowserMultipleNameSeparator
                                  (_ X QualifiedPrintName))
                              (LIST " " (OR browsername (@ self |::PrintName|)]
    (T (_Super self ConstructTitle object browsername))))
```

(Method ((GrafcetStructureBrowser DeleteObject) self Object)
. mcf: 24-Aug-87 10.08

```
  "New method template"
  (change (@ self %:startingList)
          (DREMOVE Object DATUM))
  (change (@ self %:object)
          (DREMOVE Object DATUM))
  (COND
    ((@ self %:startingList)
     (_ self Recompute))
    (T (_ self ExitBrowser)))
  self)
```

(Method ((GrafcetStructureBrowser Destroy) self) . mcf: 26-Dec-86 15.33

```
  "Specialization"
  (bind (key _ (_ self ClassName))
        pList for obj in (@ %:object) when (AND (ObjectExists? obj)
                                                (SETQ pList (_ obj CheckPropList key)))
     do (_ obj ModifyPropList key (DREMOVE (SASSOC (@ %:object)
                                                   pList)
                                           pList)))
  (_Super self Destroy))
```

(Method ((GrafcetStructureBrowser DocumentAll) self Cmd Object AlphOrderFlg)
. mcf: 19-Feb-87 17 00

```
  "New method template"
  (FISDocDocumentAll Object AlphOrderFlg self))
```

(Method ((GrafcetStructureBrowser DocumentAlph) self Cmd Object)
. mcf 19-Feb-87 17 03

```
  "New method template"
  (FISDocDocumentAll Object T self))
```

(Method ((GrafcetStructureBrowser DocumentHierarchy) self Cmd Object File)
. mcf: 7-Oct-87 11 47

```
  "New method template"
  (FISDocDocumentOne Object File self T))
```

(Method ((GrafcetStructureBrowser DocumentOne) self Cmd Object File)
. mcf: 20-Feb-97 11 54

```
  "New method template"
  (FISDocDocumentOne Object File self))
```

(Method ((GrafcetStructureBrowser FindSelectedSubObject) self window filterFn)
. mcf: 29-Sep-87 17 05

```
  "Specialization"
  (LET ((obj (_Super self FindSelectedSubObject window filterFn)))
    (OR (ObjectExists? obj)
        (SWDereferenceName obj))))
```

```
(Method ((GrafcetStructureBrowser GetLabel) self object)
                                                    mcf: 13-Oct-87 10.26
   "Specialization"
   [LET [(obj (OR (AND (type? SWNameReference object)
                       (SWDereferenceName object))
                  (ObjectExists? object]
     (COND
        (obj (@ obj %:printName))
        ((type? SWNameReference object)
         (FISDequalifyName (CADR object)))
        ((FISDequalifyName object])

(Method ((GrafcetStructureBrowser GetSubs) self object)
                                                    mcf 30-Jul-86 13.52
   "Specialization"
   (COND
      ((OR (SWDereferenceName object)
           (Object? object))
       (for x in (_ object ComputeLocalMacroSteps) collect (SWCreateNameReference x)))
      ((NOT (MEMBER object (@ nonexistentMacros)))
       (push (@ nonexistentMacros)
             object)
       NIL)))

(Method ((GrafcetStructureBrowser HighlightNode) self object width shade)
                                                    TAL 10-Mar-86 18:08
   "highlight a node by surronding it with a shaded box"
   (LET [(node (SASSOC object (fetch GRAPHNODES of (WINDOWPROP (@ window)
                                                               'GRAPH]
     (AND node (RESET/NODE/BORDER node (COND
                                          (shade (LIST width shade))
                                          (T width))
                   (@ window))
          T)))

(Method ((GrafcetStructureBrowser MiddleItemPredicate) self subObject item selector)
                                                    mcf: 26-Aug-86 16.02
   "Specialization"
   (AND (SELECTQ selector
             ((DocumentAll DocumentOne)
                 FISAllowDocumentFlg)
             T)
        [OR (Object? subObject)
            (AND (type? SWNameReference subObject)
                 (SETQ subObject (SWDereferenceName subObject]
        (_Super self MiddleItemPredicate subObject item selector)))
```

Page 18

```
(Method ((GrafcetStructureBrowser ObjNamePair) self objOrName)
                                                    TAL 10-Mar-86 17 45
   "Make a pair (object . objName) where objName is label to be used in browser"
   [PROG (obj name)
         (if (LITATOM objOrName)
             then (SETQ objOrName (GetObjectRec objOrName)))
         (if (NULL objOrName)
             then (RETURN NIL)
           else (SETQ obj objOrName)
                (SETQ name (_ self GetDisplayLabel objOrName)))
         (RETURN (if (AND NIL (_ obj InstOf! 'DestroyedObject))
                     then NIL
                   elseif [AND (@ goodList)
                               (NOT (MEMBER obj (@ goodList)]
                     then NIL
                   elseif (MEMBER obj (@ badList))
                     then NIL
                   else (CONS obj name)))
         [COND
            ((LITATOM objOrName)
             (SETQ name objOrName)                (* assume this is the name of the object.
                                                  RETURN NIL if it is not.)
             (OR (SETQ obj (GetObjectRec objOrName))
                 (RETURN NIL))
             (RETURN (CONS obj objOrName)))
            (T                                    (* Assume it is an object)
               (SETQ obj objOrName)
               (SETQ name (_ self GetDisplayLabel objOrName)]
         (RETURN (COND
                    ((_ obj InstOf! 'DestroyedObject)
                     NIL)
                    ([AND (@ goodList)
                          (NOT (FMEMB obj (@ goodList)]
                     NIL)
                    ((FMEMB obj (@ badList))
                     NIL)
                    (T (CONS obj name])
```

```
(Method ((GrafcetStructureBrowser Recompute) self dontResnapeFlg)
                                                        mct: 29-Apr-86 16:53
  "Specialization"
  [LET ((newTitle (_ self ConstructTitle (@ self %:object)))
        (w (@ %:window)))
    (AND (FISShrunkP w)
         (EXPANDW w))                          (* EXPANDW Prevents nested recomputes, and a breakwindow, when
                                                  the hierarchy has been shrunk)
    (_@ self |:menus:.objectLabels| NIL)
    (_Super self Recompute dontResnapeFlg)
    (COND
      ((NOT (EQUAL (@ %:title)
                   newTitle))
       (_@ self %:title newTitle)
       (_ self Update)])

(Method ((GrafcetStructureBrowser Show) self browseList windowOrTitle goodList)
                                                        TAL 10-Mar-86 18:14
  "this browser can have objects that aren't really objects. Suppress the GetObjectRec calls."
  (PROG (NODELST window)
        [COND
          ((WINDOWP windowOrTitle)
           (SETQ window windowOrTitle)
           (_@ window windowOrTitle))
          (windowOrTitle (_@ title windowOrTitle))
          (T (SETQ window (@ window)]           (* window should be invert so that links etc
                                                   can be erased)
        (DSPOPERATION 'INVERT window)
        [COND
          ((AND browseList (NLISTP browseList))
           (SETQ browseList (LIST browseList]
        (_@ startingList (APPEND browseList))
        (AND goodList (_@ goodList (APPEND goodList)))
        (_@ %:nonexistentMacros NIL)
        (COND
          ([AND (@ startingList)
                (SETQ NODELST (_ self GetNodeList (@ startingList)
                                                  (@ goodList)))]
           (WINDOWPROP (_@ window (SHOWGRAPH (LAYOUTGRAPH NODELST (TreeRoots NODELST)
                                                          (@ graphFormat)
                                                          (@ browseFont))
                                             window NIL NIL (@ topAlign)))
```

```
                       'TITLE
                       (@ title))               (* kludge%: because GRAPHER adds its own COPYBUTTONEVENTFN)
           (WINDOWPROP (@ window)
                       'COPYBUTTONEVENTFN NIL)
           (for x in (@ %:nonexistentMacros) do (_ self HighlightNode x (@ |::BoxLineWidth|)))]
          (T (_ self Clear)))
        (RETURN)))

(Method ((GrafcetStructureBrowser TitleSelection) self)
                                                        ; mct: 17-Jun-86 13:40
  "Decode TitleSelection into LeftTitleSelection or MiddleTitleSelection"
  (COND
    ((LASTMOUSESTATE MIDDLE)
     (_ self MiddleTitleSelection))
    (T (_ self LeftTitleSelection))))

(\UnbatchMethodDefs)

(DEFINEQ

(FID.ComputeInitialPos
  [LAMBDA (Region withinRegion Scale IRegions)  (* mct%: " 5-Dec-86 13.35")
    (LET (oldregion region)
      (SETQ region Region)
      [until (SUBREGIONP withinRegion region) do (COND
                                                   ((IGREATERP (fetch PRIGHT of region)
                                                               (fetch PRIGHT of withinRegion))
                                                    (change (fetch LEFT of region)
                                                            (IDIFFERENCE DATUM Scale)))
                                                   ((ILESSP (fetch LEFT of region)
                                                            (fetch LEFT of withinRegion))
                                                    (change (fetch LEFT of region)
                                                            (IPLUS DATUM Scale)))
                                                   ((IGREATERP (fetch PTOP of region)
                                                               (fetch PTOP of withinRegion))
                                                    (change (fetch BOTTOM of region)
                                                            (IDIFFERENCE DATUM Scale)))
                                                   ((ILESSP (fetch BOTTOM of region)
                                                            (fetch BOTTOM of withinRegion))
                                                    (change (fetch BOTTOM of region)
                                                            (IPLUS DATUM Scale]
      (change (fetch HEIGHT of region)
              (IDIFFERENCE DATUM 2))
      (change (fetch BOTTOM of region)
              (ADD1 DATUM))
```

```
(change (fetch WIDTH of region)
        (IDIFFERENCE DATUM 2))
(change (fetch LEFT of region)
        (ADD1 DATUM))
(SETQ oldregion (APPEND region))
[AND IRegions (bind giveup (shiftX _ (IMINUS Scale))
                    shiftY until (OR giveup (for r in IRegions never (REGIONSINTERSECTP r region)))
                 do (COND
                        [(AND shiftX (MINUSP shiftX))
                         (change (fetch LEFT of region)
                                 (IPLUS DATUM shiftX))
                         (COND
                            ((ILESSP (fetch LEFT of region)
                                     (fetch LEFT of withinRegion))
                             (SETQ shiftX Scale)
                             (replace LEFT of region with (fetch LEFT of oldregion]
                        [shiftX (change (fetch LEFT of region)
                                        (IPLUS DATUM shiftX))
                                (COND
                                   ((IGREATERP (fetch PRIGHT of region)
                                               (fetch PRIGHT of withinRegion))
                                    (SETQ shiftX NIL)
                                    (SETQ shiftY (IMINUS Scale))
                                    (replace LEFT of region with (fetch LEFT of oldregion]
                        [(AND shiftY (MINUSP shiftY))
                         (change (fetch BOTTOM of region)
                                 (IPLUS DATUM shiftY))
                         (COND
                            ((ILESSP (fetch BOTTOM of region)
                                     (fetch BOTTOM of withinRegion))
                             (SETQ shiftY Scale)
                             (replace BOTTOM of region with (fetch BOTTOM of oldregion]
                        (shiftY (change (fetch BOTTOM of region)
                                        (IPLUS DATUM shiftY))
                                (COND
                                   ((IGREATERP (fetch PTOP of region)
```

```
                                               (fetch PTOP of withinRegion))
                                    (SETQ giveup T)
                                    (SETQ region oldregion]
(change (fetch HEIGHT of region)
        (IPLUS DATUM 2))
(change (fetch BOTTOM of region)
        (SUB1 DATUM))
(change (fetch WIDTH of region)
        (IPLUS DATUM 2))
(change (fetch LEFT of region)
        (SUB1 DATUM))
region])
```

(FISGetNamedParts

```
  [LAMBDA (Object Type)                                          (* mcf%. "19-Oct-87 12:51")
    (LET [(partLst (CONS))
          (obj (OR (ObjectExists? Object)
                   (SWDereferenceName Object]
      (_ obj SendToParts NIL 'GetNamedParts partLst Type)
      (DREVERSE (CDR partLst])
```

(FISSortByStepNumber

```
  [LAMBDA (s1 s2)                                                (* mcf%. "23-Oct-87 12:25")
    (IGREATERP (OR (NUMBERP (@ s2 %:stepNumber))
                   0)
           (OR (NUMBERP (@ s1 %:stepNumber))
               0])
```

(FISGetGrafcetObjectFromBrowser

```
  [LAMBDA NIL                                                    (* mcf%. "29-Oct-87 12:04")
    (LET (w)
      (COND
         ((ObjectExists? (SETQ w (GetSelectedBrowser)))
          (COND
             ((_ w InstOf! 'GrafcetStructureBrowser)
              (GetSelectedSubObject (@ w %:window)))
             ((_ w InstOf! 'FOEGrafcetBrowser)
              (@ w %:object)])
```

(FOEFontNameFromFont

```
  [LAMBDA (Font)                                                 (* TAL "24-Apr-86 15:40")
    (CONCAT (FONTPROP Font 'FAMILY)
            " "
            (FONTPROP Font 'SIZE)
            [COND
               ((EQ (FONTPROP Font 'WEIGHT)
                    'MEDIUM)
                "")
               (T (CONCAT " " (FONTPROP Font 'WEIGHT]
            (COND
               ((EQ (FONTPROP Font 'SLOPE)
                    'REGULAR)
```

```
"")
(T (CONCAT " " (FONTPROP Font 'SLOPE])
```

(GetSelectedBrowser (* mcl% " 1-Oct-87 11:58")

```
[LAMBDA ([window])
  (LET [(w (OR (window) (PROGN (until (MOUSESTATE (NOT UP)) yield (WHICHW]
    (COND
      (w (WINDOWPROP w 'LoopsWindow])
```

(GraphGraf (* mcl% "15-Jul-86 11:03")

```
[LAMBDA (Name)
  (StartTopLevelContext ($ ExamineGrafcetStructureContext)
         (SWDereferenceName Name])
)
(DECLARE%: EVAL@COMPILE
(RECORD FISNameTranslations (Qualifier MacroPrograms MacroSteps RegularSteps MMFSSSteps MMFSRSteps))
```

Page 2"

```
(RPAQQ FOEGrafcetBrowserEditMethodItems
     [(Add (AddObject MarkObject)
           "Add an object from the palette")
      (Delete (DeleteObject MarkObject)
             "Delete an object from the display"
             (SUBITEMS (Delete (DeleteObject MarkObject)
                               "Delete an object from the display")
                    (Undelete (UndeleteObject MarkObject)
                           "Undo the most recent deletion")))
      (Move (MoveObject MarkObject)
            "Move position of selected object"
            (SUBITEMS (Move% Object (MoveObject MarkObject)
                              "Move position of selected object")
                   (Move% Link (MoveLink MarkObject)
                          "Adjust position of selected link flowline")))
      (Link (LinkObject MarkObject)
            "Link two selected objects together"
            (SUBITEMS (Link (LinkObject MarkObject)
                              "Link two selected objects together")
                   ("Remote Link" (LinkObjectRemote MarkObject)
                          "Use remote link to link two object together")
                   (UnLink% Object (UnLinkSourceDest MarkObject)
                          "Remove links to and from selected object"
                          (SUBITEMS (|UnLink From Both *| (UnLinkSourceDest MarkObject)
                                            "Remove links to and from selected object")
                                 (|UnLink From Source| (UnLinkSource MarkObject)
                                        "Remove links to selected object")
                                 (|UnLink From Dest| (UnLinkDest MarkObject)
                                        "Remove links from selected object")))
                   ("First true trans." (SetFirstTrue MarkObject)
                          "Cause a step to clear only the first (leftmost) transition that is true")
                   ("All true trans." (SetAllTrue MarkObject)
                          "Cause a step to clear all transitions that are true")))
      (Label (LabelObject MarkObject)
             "Label an object in the display"
             (SUBITEMS (Label (LabelObject MarkObject)
                               "Label an object in the display")
                    ("Abbreviate label" (SetObjectAbbreviation MarkObject)
                           "Enter an abbreviated form of the label for the object")
                    ("Number Step" (NumberStep MarkObject)
                           "Change the step number of a step or macro step")))
      (Copy (CopyObject MarkObject)
            "Copy an object to another program"
            (SUBITEMS (Copy (CopyObject MarkObject)
                              "Copy an object to another program")
                   (Rename (LabelObject MarkObject)
                          "Rename an object in the display")
                   (Transfer (TransferObject MarkObject)
                          "Transfer an object to another program"))).
      (Decls EditDecls "Edit the C declarations for this grafcet")
      (Compile Compile "Compile this grafcet program" (SUBITEMS (Compile Compile "Compile this grafcet
                                                                        program")
                                                               ("Check Grafcet Syntax" CheckGrafcetSyntax
                                                                     "Check Grafcet syntax without
                                                                     compiling"])

(RPAQQ FISGlobalDeletedObjectLst NIL)

(RPAQ GrafcetFontLst
      [LIST [CONS 6 (FONTCREATE '(HELVETICA 5]
            [CONS 8 (FONTCREATE '(HELVETICA 7]
            [CONS 10 (FONTCREATE '(HELVETICA 8 BOLD]
            [CONS 12 (FONTCREATE '(HELVETICA 8 BOLD]
            [CONS 14 (FONTCREATE '(HELVETICA 10 BOLD]
            [CONS 16 (FONTCREATE '(HELVETICA 10 BOLD]
            (CONS 'OTHER (FONTCREATE '(HELVETICA 12 BOLD])
```

```
(RPAQQ FISDefaultShowLabelWidth 150)

(RPAQ? FISShowLabelFontSize 'OTHER)

(DECLARE%: DOEVAL@COMPILE DONTCOPY

(GLOBALVARS GrafcetFontLst)
)

(PUTPROPS GRAFBROWSER FILETYPE :FAKE-COMPILE-FILE)

(PUTPROPS GRAFBROWSER COPYRIGHT ("Savoir, Inc." 1985 1986 1987 1997 1988))
```

---

FUNCTION INDEX

FISTemplatesForReceiver 8 FISTemplatesForSender ..8 UnionIntoList ..........8 UnionStaticAnalysis ....8

---

METHOD INDEX

FactoryProgram.GetNamedParts ........................2
GrafcetMMFSStep.CacheFlush ..........................2
GrafcetMMFSStep.Compile .............................2
GrafcetMMFSStep.ComputeFolderName ...................2
GrafcetMMFSStep.ComputeStaticAnalysis ...............3
GrafcetMMFSStep.DocumentPart ........................3
GrafcetMMFSStep.DrawChar ............................3
GrafcetMMFSStep.GetNamedParts .......................3
GrafcetMMFSStep.HasContents? ........................3
GrafcetMMFSStep.Kill ................................4
GrafcetMMFSStep.QualifyCacheFlush ...................4
GrafcetMMFSStep.SetLabel1 ...........................4
GrafcetMMFSStep.WhoUses .............................4
GrafcetReceiveStep.DeInstall ........................4
GrafcetReceiveStep.Draw .............................4
GrafcetReceiveStep.EvaluateActivation ...............4
GrafcetReceiveStep.EvaluateContinuous ...............4
GrafcetReceiveStep.EvaluateDeactivation .............5
GrafcetReceiveStep.GetDescription ...................5
GrafcetReceiveStep.GetFolder ........................5
GrafcetReceiveStep.Install ..........................5
GrafcetReceiveStep.InterpretMessage .................5
GrafcetReceiveStep.NameConflict? ....................5
GrafcetReceiveStep.Rename ...........................5
GrafcetReceiveStep.SWCopyMade .......................6
GrafcetReceiveStep.TemplateForReceivedMessage .......6
GrafcetSendStep.ComputeCorrespondents ...............6
GrafcetSendStep.DeInstall ...........................6
GrafcetSendStep.Draw ................................6
GrafcetSendStep.EvaluateActivation ..................6
GrafcetSendStep.EvaluateContinuous ..................6
GrafcetSendStep.EvaluateDeactivation ................6
GrafcetSendStep.GetDescription ......................6
GrafcetSendStep.GetFolder ...........................6
GrafcetSendStep.Install .............................6
GrafcetSendStep.LookupSendableMessageTemplate .......7
GrafcetSendStep.NameConflict? .......................7
GrafcetSendStep.Rename ..............................7
GrafcetSendStep.SWCopyMade ..........................7
NonGrafcetProgram.Compile ...........................7
NonGrafcetProgram.Destroy ...........................7
NonGrafcetProgram.InProgram? ........................7

---

VARIABLE INDEX

FISForceReanalyzeFlg ..............................8
GrafcetFont .......................................8
GrafcetReceiveStepPaletteBM .......................8
GrafcetSendStepPaletteBM ..........................8

---

CLASS INDEX

FactoryProgram ....1 GrafcetMMFSStep ...1 GrafcetReceiveStep 2 GrafcetSendStep ...2 NonGrafcetProgram .2

---

PROPERTY INDEX

GRAFCET .........1,9

---

RECORD INDEX

StaticAnalysis ....9

---

```
     changes to:  (CLASSES GrafcetSendStep GrafcetReceiveStep)
                  (VARS GRAFCETCOMS)

  previous date:  28-Jun-88 10:08:04  (DSK)<LISPFILES>FIS>GRAFCET.;196

     Read Table:  INTERLISP

        Package:  IL
```

Copyright (c) 1985, 1986, 1987, 1988 by Savoir, Inc.. All rights reserved.

```
(RPAQQ GRAFCETCOMS
       [(DECLARE%: DONTCOPY (PROP MAKEFILE-ENVIRONMENT GRAFCET))
        (CLASSES FactoryProgram GrafcetMMFSStep GrafcetReceiveStep GrafcetSendStep NonGrafcetProgram)
        (METHODS FactoryProgram.GetNamedParts GrafcetMMFSStep.CacheFlush GrafcetMMFSStep.Compile
               GrafcetMMFSStep.ComputeFolderName GrafcetMMFSStep.ComputeStaticAnalysis
               GrafcetMMFSStep.DocumentPart GrafcetMMFSStep.DrawChar GrafcetMMFSStep.GetNamedParts
               GrafcetMMFSStep.HasContents? GrafcetMMFSStep.Kill GrafcetMMFSStep.QualifyCacheFlush
```

```
            GrafcetMMFSStep.SetLabel1 GrafcetMMFSStep.WhoUses GrafcetReceiveStep.DeInstall
            GrafcetReceiveStep.Draw GrafcetReceiveStep.EvaluateActivation
            GrafcetReceiveStep.EvaluateContinuous GrafcetReceiveStep.EvaluateDeactivation
            GrafcetReceiveStep.GetDescription GrafcetReceiveStep.GetFolder GrafcetReceiveStep.Install
            GrafcetReceiveStep.InterpretMessage GrafcetReceiveStep.NameConflict? GrafcetReceiveStep.Rename
            GrafcetReceiveStep.SWCopyMade GrafcetReceiveStep.TemplateForReceivedMessage
            GrafcetSendStep.ComputeCorrespondents GrafcetSendStep.DeInstall GrafcetSendStep.Draw
            GrafcetSendStep.EvaluateActivation GrafcetSendStep.EvaluateContinuous
            GrafcetSendStep.EvaluateDeactivation GrafcetSendStep.GetDescription GrafcetSendStep.GetFolder
            GrafcetSendStep.Install GrafcetSendStep.LookupSendableMessageTemplate
            GrafcetSendStep.NameConflict? GrafcetSendStep.Rename GrafcetSendStep.SWCopyMade
            NonGrafcetProgram.Compile NonGrafcetProgram.Destroy NonGrafcetProgram.InProgram?)
        (FNS FISTemplatesForReceiver FISTemplatesForSender UnionIntoList UnionStaticAnalysis)
        [VARS GrafcetReceiveStepPaletteBM GrafcetSendStepPaletteBM (FISForceReanalyzeFlg NIL)
              (GrafcetFont (FONTCREATE '(HELVETICA 8 BOLD]
        (GLOBALVARS FISForceReanalyzeFlg)
        (RECORDS StaticAnalysis)
        (PROP FILETYPE GRAFCET)
        (DECLARE%: DONTEVAL@LOAD DOEVAL@COMPILE DONTCOPY COMPILERVARS (ADDVARS (NLAMA)
                                                                              (NLAML)
                                                                              (LAMA])

(DECLARE%: DONTCOPY

(PUTPROPS GRAFCET MAKEFILE-ENVIRONMENT (:PACKAGE "IL" :READTABLE "INTERLISP" :BASE 10))
)

(DEFCLASS FactoryProgram (MetaClass AbstractClass Edited%:      (* mcf%. "24-Nov-87 15:31")
                                    doc "Abstract classes are placeholders in the inheritance network, which
                                    cannot themselves be instantiated.")
       (Supers AbstractObject)
       (InstanceVariables (staticAnalysis NIL DontSave Any)))

(DEFCLASS GrafcetMMFSStep (MetaClass AbstractClass Edited%:     (* mcf%. "24-Nov-87 15:32")
                                     doc "Abstract classes are placeholders in the inheritance network, which
                                     cannot themselves be instantiated.")
       (Supers GrafcetStep)
       [ClassVariables (IconDescription (BoxDraw ((-1 -1 2 2))
                                                 LineDraw
                                                 (((0 . 2)
                                                   (0 . 1))
                                                  ((0 . -1)
                                                   (0 . -2)))
                                                 ConnectPoints
                                                 (Top (0 . 2)
                                                      Bottom
                                                      (0 . -2]
       (InstanceVariables (stepType #,($A MMFS FFCache ReplaceMe) DontSave Any doc "One of Regular, Macro or
                                     Initial")
              (folderName #,($A ComputeFolderName AVSendSelf NoUpdatePermitted) DontSave Any)))
```

```
(DEFCLASS GrafcetReceiveStep (MetaClass Class Edited%:         . Edited 5-Aug-88 10:16 by mcf
                                        doc "This is the default metaClass for all classes")
       (Supers GrafcetMMFSStep)
       (ClassVariables (FolderExtension ReceivableTemplates)
              (BrowseableSubParts (receivableTemplates))
              (BackPointerIVs (receivableTemplates))
              (CachedIVs #,($A (receivableTemplates) UnionSuperValue NoUpdatePermitted))
              (DisplayFields (singleShot))
              (DocumentationParts (receivableTemplates)
                     doc "Parts of me that can be documented")
              (PaletteIcon #,($A (PROGN GrafcetReceiveStepPaletteBM) EveryFetch NoUpdatePermitted))
              (Prototype #,($& GrafcetReceiveStep (MHVO.kga%:.6K5 . 1040))))
       (InstanceVariables (receivableTemplates #,($A NIL FFLookupNamedObject NoUpdatePermitted) NamedByIV
                                     folderName Editable T VR #,($C MMFSReceivableDefFolder) DontSave Any doc
                                     "Receivable message template folder")
              (singleShot #,($A NIL FFCache ReplaceMe) heading "One message per scan" TeditType Atom)))

(DEFCLASS GrafcetSendStep (MetaClass Class Edited%:            . Edited 5-Aug-88 10:17 by mcf
                                     doc "This is the default metaClass for all classes")
       (Supers GrafcetMMFSStep)
       (ClassVariables (FolderExtension SendableTemplates)
              (BrowseableSubParts (sendableTemplates))
              (BackPointerIVs (sendableTemplates))
              (CachedIVs #,($A (sendableTemplates) UnionSuperValue NoUpdatePermitted))
              (DocumentationParts (sendableTemplates)
                     doc "Parts of me that can be documented")
              (PaletteIcon #,($A (PROGN GrafcetSendStepPaletteBM) EveryFetch NoUpdatePermitted))
              (Prototype #,($& GrafcetSendStep (MHVO.kga%:.6K5 . 1041))))
       (InstanceVariables (sendableTemplates #,($A NIL FFLookupNamedObject NoUpdatePermitted) NamedByIV
                                     folderName Editable T VR #,($C MMFSSendableDefFolder) DontSave Any doc
                                     "Sendable message template folder")
              (lastTN 0 doc "Transaction number of last message constructed")))

(DEFCLASS NonGrafcetProgram (MetaClass AbstractClass Edited%:
                                                               (* TAL " 7-Mar-88 14:31")
                                       doc "Abstract classes are placeholders in the inheritance network, which
                                       cannot themselves be instantiated.")
       (Supers FactoryProgram)
       (InstanceVariables (step NIL doc "the grafcet step I belong to")
              (functionName NIL doc "Name of the function")
              (detailedAnalysis NIL DontSave Any doc "AList of usages and names and line numbers")))

(\BatchMethodDefs)
```

```
(Method ((FactoryProgram GetNamedParts) self PartLst PartType)
                                                        mct: 7-Oct-87 13 17
  "New method template"
  (OR PartType (SETQ PartLst (NCONC1 PartLst self))))

(Method ((GrafcetMMFSStep CacheFlush) self)             TAL 20-Nov-87 12 35
  "Make sure folder elements have their backpointers filled in"
  [LET (folder)
    (_Super self CacheFlush)
    (COND
      ((SETQ folder (_ self GetFolder))                 (* Dont get folder until after normal CacheFlush)
       (for ele in (@ folder %:elements) unless (EQ folder (@ ele %:container))
          do (_@ ele %:container folder)]))

(Method ((GrafcetMMFSStep Compile) self)                TAL 4-Sep-86 10.57
  "Compile all the templates in the folder"
  [LET ((folder (_ self GetFolder)))
    (COND
      (folder (_ folder CompileTemplates)]])

(Method ((GrafcetMMFSStep ComputeFolderName) self)
                                                        mct: 18-Sep-87 12.50
                                                        New method template
  "FISQualifierRenameHack is bound when processing a mainProgram written before name qualification was
  enforced"
  [LET ((name (@ %:label)))
    [AND name (SETQ name (PACK* name "." (@ |::FolderExtension|)]
    (COND
      (FISQualifierRenameHack name)
      (name (FISQualifyName self name])
```

Page 3

```
(Method ((GrafcetMMFSStep ComputeStaticAnalysis) self)
                                                        TAL 20-Nov-87 12.20
  "New method template"
  (LET ((folder (_ self GetFolder))
        analysis)
    [COND
      (folder (for template in (@ folder %:elements) do (change analysis (UnionStaticAnalysis DATUM
                                                                       (@ template
                                                                          %:staticAnalysis]

    analysis))

(Method ((GrafcetMMFSStep DocumentPart) self Stream PartIV Index)
                                                        mct: 20-May-87 13.54
  "Specialization"
  (LET (part lineLen orient wid)
    (SELECTQ PartIV
      ((receivableTemplates sendableTemplates)
        (COND
          ((AND (SETQ part (GetValue self PartIV))
                (_ part InstOf! 'Folder)
                (@ part %:elements))
           (FISTurnPage Stream FISDocMMFSPartOrientation)
                                                        (* Removed RESETLST around SELECTQ :2/19/87!
                                                        (COND ((GREATERP (DSPRIGHTMARGIN NIL Stream)
                                                        (SETQ wid (fetch WIDTH of (DSPCLIPPINGREGION NIL Stream)))
                                                        (RESETSAVE (DSPRIGHTMARGIN (IDIFFERENCE wid 150) Stream)
                                                        (LIST (FUNCTION (LAMBDA NIL (DSPRIGHTMARGIN OLDVALUE Stream)
)))
           (AND Index (FISDocIndexEntry Stream Index (SELECTQ PartIV
                                                        (receivableTemplates
                                                          'GrafRecv)
                                                        (sendableTemplates
                                                          'GrafSend)
                                                        NIL)
                            (@ %:label)))
           (printout Stream .FONT FISDocCHeaderFont (@ %:label)
                  %..
                  (SELECTQ PartIV
                     (receivableTemplates
                        "Receivable Message Templates: ")
                     (sendableTemplates
                        "Sendable Message Templates: ")
                     "")
                  T)
           (DSPFONT FISDocCCodeFont Stream)
           (PrintMMFSFolder part Stream)
           (TERPRI Stream)                              (* (LINELENGTH lineLen Stream))
           (TERPRI Stream)
           NIL)))
      NIL)))

(Method ((GrafcetMMFSStep DrawChar) self Stream Char)
                                                        mct 3 Apr 87 11 18
```

```
"New method template"
(LET (oldop)
  [COND
    ((@ %:highlightOn?)
      (SETQ oldop (DSPOPERATION 'INVERT Stream]
  (CENTERPRINTINREGION Char (@ %:region)
        Stream)
  (AND oldop (DSPOPERATION oldop Stream))))
```

(Method ((GrafcetMMFSStep GetNamedParts) self PartLst PartType)
mct 7-Oct-87 12:30

```
"Specialization"
[LET ((fold (_ self GetFolder)))
  (COND
    ([AND fold (OR (NOT PartType)
                   (EQ PartType 'MMFS]
     (SETQ PartLst (NCONC1 PartLst fold])
```

(Method ((GrafcetMMFSStep HasContents?) self) mct 11-Jan-88 17:46

```
"Specialization"
(LET ((fold (_ self GetFolder)))
  (AND fold (@ fold %:elements)
       T)))
```

Page 4

(Method ((GrafcetMMFSStep Kill) self) TAL 20-Nov-87 12:15

```
"Specialization"
(LET ((folder (_ self GetFolder)))
  (COND
    ((ObjectExists? folder)
     (_ folder Kill)))
  (_Super self Kill)))
```

(Method ((GrafcetMMFSStep QualifyCacheFlush) self)
TAL 20-Nov-87 12:13

```
"Specialization"
(LET ((folder (_ self GetFolder)))
  (COND
    ((ObjectExists? folder)
     (_ folder QualifyCacheFlush)))
  (_Super self QualifyCacheFlush)))
```

(Method ((GrafcetMMFSStep SetLabel1) self Label Stream)
mct 12-Jan-88 12:33
Specialization

```
"When setting the label to nothing, remove any contents"
(OR Label (bind o for x in (@ |::BrowseableSubParts|) when (SETQ o (ObjectExists? (@ self %:!\x)))
            do (_@ self %:!\x NotSetValue)
               (_ o Kill)))
(_Super self SetLabel1 Label Stream))
```

(Method ((GrafcetMMFSStep WhoUses) self item access)
TAL 29-Nov-87 19:43

```
"Specialization"
[LET (folder)
  (COND
    ((AND (FISInAnalysis? item access (@ %:staticAnalysis))
          (SETQ folder (_ self GetFolder)))
     (for template in (@ folder %:elements) join (APPEND (_ template WhoUses item access)])
```

(Method ((GrafcetReceiveStep DeInstall) self SuperObject)
mct: 2-Oct-87 10:02

```
"Specialization"
(LET [(superObject (OR SuperObject (@ %:superObject)]
  (_Super self DeInstall superObject)
  (_@ superObject %:receiveStepAList NotSetValue)
  (_@ superObject |:mainProgram:allReceiveStepAList| NotSetValue)))
```

(Method ((GrafcetReceiveStep Draw) self Stream Xform Mode)
mct: 3-Apr-87 11:05

```
"Specialization"
(_Super self Draw Stream Xform Mode)
(_ self DrawChar Stream "R"))
```

(Method ((GrafcetReceiveStep EvaluateActivation) self \process\)
TAL 7-Mar-86 20:16

```
"Specialization"
(LET ((\step\ self))
  (DECLARE (SPECVARS \process\ \step\))
  (_ MapNetwork Listen (_ self GetStepName)
         self)))
```

```
(Method ((GrafcetReceiveStep EvaluateContinuous) self \process\)
                                                  TAL 18 Feb-88 19 23
   "Specialization"
   [LET ((\step\ self))
     (DECLARE (SPECVARS \process\ \step\)
           (GLOBALVARS YesAtoms))
     (bind msg flg (stepName _ (_ self GetStepName)) while (SETQ msg (_ MapNetwork GetMessage stepName self))
        do (_@ msg %:receiveTime FISGlobalClock)
           (_ self InterpretMessage msg \process\)
           (COND
              (flg)
              ((YesAtom? (@ %:singleShot))
               (RETURN))
              (T (SETQ flg T])
```

Page 5

```
(Method ((GrafcetReceiveStep EvaluateDeactivation) self \process\)
                                                  TAL 6-Mar-86 08:03
   "Do we want to cancel the listen when we are deactivated?"
   (LET ((\step\ self))
     (DECLARE (SPECVARS \process\ \step\))          (* (_ MapNetwork CancelListen (@ %:receiverName) self))
     NIL))

(Method ((GrafcetReceiveStep GetDescription) self)
                                                  mct: 27-Oct-87 17 11
                                                  Specialization
   "(_Super self GetDescription)"
   (CONCAT "Receive Step " (OR (@ self %:label)
                               (_ self GetStepNumber))))

(Method ((GrafcetReceiveStep GetFolder) self)      TAL 2-Aug-86 21 09
   "New method template"
   (@ %:receivableTemplates))

(Method ((GrafcetReceiveStep Install) self superObject)
                                                  mct: 2-Oct-87 09.35
   "Specialization"
   (_Super self Install superObject)
   (_@ superObject %:receiveStepAList NotSetValue)
   (_@ superObject !:mainProgram:allReceiveStepAList! NotSetValue))

(Method ((GrafcetReceiveStep InterpretMessage) self msg process)
                                                  TAL 13-Feb-87 14:47
   "New method template"
   [PROG ((sVs (@ process %:stateVariables))
          template)
     TRY (COND
           ((SETQ template (_ self TemplateForReceivedMessage msg sVs))
            (_ template ReceiveMessage msg process self sVs)
            (_@ process %:activityFlg T))
           (T (SimulationBreak process self (LIST (@ %:label)
                                                  " receiver has no template for message from "
                                                  (@ msg %:source))
                     '((Abort (RETURN))
                       (Continue (RETURN))
                       (Retry (GO TRY])

(Method ((GrafcetReceiveStep NameConflict?) self Name SuperObj CopyFlg)
                                                  mct: 21-Oct-87 11 16
   "Specialization"
   [LET [mp (sObj (OR SuperObj (@ %:superObject)]
     (COND
        ((_Super self NameConflict? Name SuperObj)
         (_ self NameConflictMsg T))
        ([AND sObj (SETQ mp (@ sObj %:mainProgram))
              (FASSOC (MKATOM Name)
                      (@ mp %:allReceiveStepAList))
              (OR CopyFlg (NEQ mp (@ !:superObject:mainProgram!]
         (_ self NameConflictMsg)])

(Method ((GrafcetReceiveStep Rename) self QualName ProgName StepName)
                                                  mct: 16-Nov-87 16.45
   "Specialization"
   [LET (newName stepName (oldName (MKATOM (@ %:label)))
             (temps (@ %:receivableTemplates)))
     (COND
        ((_Super self Rename QualName ProgName StepName))
        (T (SETQ newName (@ %:folderName))
           (AND QualName (SETQ newName (FISQualifyName self (FISDequalifyName newName)
                                                       QualName)))
           (COND
              (temps (_ temps ChangeName newName)
                     (COND
                        (StepName (SETQ stepName (MKATOM StepName))
                                  (for e in (@ temps %:elements) when (EQ (@ e %:destination)
                                                                          oldName)
                                     do (_@ e %:destination stepName)
                                        (for b in (_ e LocateBrowsers) do (_ b ObjectChanged destination)]]
```

```
(Method ((GrafcetReceiveStep SWCopyMade) self XLations)
                                                    mct 23-Oct-87 18.07
  "Specialization"
  (_ self SWCopyMade1 (fetch MMFSRSteps of XLations)))

(Method ((GrafcetReceiveStep TemplateForReceivedMessage) self msg sVs)
                                                    TAL 6-Aug-86 16:22
  "New method template"
  [LET ((templates (@ %:receivableTemplates)))
    (COND
      (templates (_ templates FindMatchingTemplate msg sVs)])

(Method ((GrafcetSendStep ComputeCorrespondents) self)
                                                    mct: 10-Oct-86 15:46
  "New method template"
  (COND
    ((@ self %:sendableTemplates)
     (bind cList for msg in (@ self |:sendableTemplates:elements|) do (pushnew cList (@ msg %:destination))
        yield cList))))

(Method ((GrafcetSendStep DeInstall) self SuperObject)
                                                    mct: 2-Oct-87 10:01
  "Specialization"
  (LET [(superObject (OR SuperObject (@ %:superObject)]
    (_Super self DeInstall superObject)
    (_@ superObject %:sendStepAList NotSetValue)
    (_@ superObject |:mainProgram:allSendStepAList| NotSetValue)))

(Method ((GrafcetSendStep Draw) self Stream Xform Mode)
                                                    mct: 3-Apr-87 11 32
  "Specialization"
  (_Super self Draw Stream Xform Mode)              (_ self DrawText Stream S (@ region))
  (_ self DrawChar Stream "S"))

(Method ((GrafcetSendStep EvaluateActivation) self process)
                                                    TAL 6-Mar-86 07 53
  "Do nothing at activation"
  NIL)

(Method ((GrafcetSendStep EvaluateContinuous) self process)
                                                    TAL 6 Mar 86 07 55
  "Eventually this will handle retransmission of messages"
  NIL)

(Method ((GrafcetSendStep EvaluateDeactivation) self process)
                                                    TAL 6-Mar-86 07 55
  "Do nothing at deactivation"
  NIL)

(Method ((GrafcetSendStep GetDescription) self)     mct: 27-Oct-87 17 11
                                                    Specialization
  "(_Super self GetDescription)"
  (CONCAT "Send Step " (OR (@ self %:label)
                          (_ self GetStepNumber))))

(Method ((GrafcetSendStep GetFolder) self)          TAL 2-Aug-86 21 09
  "New method template"
  (@ %:sendableTemplates))

(Method ((GrafcetSendStep Install) self superObject)    mct: 2 Oct-87 10 01
  "Specialization"
  (_Super self Install superObject)
  (_@ superObject %:sendStepAList NotSetValue)
  (_@ superObject |:mainProgram:allSendStepAList| NotSetValue))
```

```
(Method ((GrafcetSendStep LookupSendableMessageTemplate) self templateID)
                                                    TAL 14-Nov-87 19:08
                                                    New method template
  "Obsolete I hope (LET ((folder (@ :sendableMessages))) (COND (folder (_ folder LookupTemplate
  templateID))))"
  (SHOULDNT))

(Method ((GrafcetSendStep NameConflict?) self Name SuperObj CopyFlg)
                                                    mct: 21-Oct-87 11.16
  "Specialization"
  [LET [mp (sObj (OR SuperObj (@ %:superObject)]
    (COND
      ((_Super self NameConflict? Name SuperObj)
       (_ self NameConflictMsg T))
      ([AND sObj (SETQ mp (@ sObj %:mainProgram))
            (FASSOC (MKATOM Name)
```

```
                  (@ mp %:allSendStepAList))
             (OR CopyFlg (NEQ mp (@ |:superObject:mainProgram|))]
          (_ self NameConflictMsg)])

(Method ((GrafcetSendStep Rename) self QualName ProgName StepName)
                                                                   mct: 16-Nov-87 16 45
   "Specialization"
   [LET (newName stepName (oldName (MKATOM (@ %:label)))
             (temps (@ %:sendableTemplates)))
     (COND
        ((_Super self Rename QualName ProgName StepName))
        (T (SETQ newName (@ %:folderName))
           (AND QualName (SETQ newName (FISQualifyName self (FISDequalifyName newName)
                                                         QualName)))
           (COND
              (temps (_ temps ChangeName newName)
                     (COND
                        (StepName (SETQ stepName (MKATOM StepName))
                                (for e in (@ temps %:elements) when (EQ (@ e %:source)
                                                                        oldName)
                                   do (_@ e %:source stepName)
                                      (for b in (_ e LocateBrowsers) do (_ b ObjectChanged 'source)])

(Method ((GrafcetSendStep SWCopyMade) self XLations)
                                                                   mct: 23-Oct-87 18 07
   "Specialization"
   (_ self SWCopyMade1 (fetch MMFSSSteps of XLations)))

(Method ((NonGrafcetProgram Compile) self)                        TAL 7-Jul-86 04 56
   "Compile does nothing by default"
   self)

(Method ((NonGrafcetProgram Destroy) self)                        mct 8-Aug-86 15.09
   "Specialization"
   (LET ((func (@ %:functionName)))
     (AND func (HASDEF func 'FNS)
          (DELDEF func 'FNS))
     (_Super self Destroy)))

(Method ((NonGrafcetProgram InProgram?) self program)
                                                                   TAL 8-Oct-85 23.25
   "True if self is part of the specified program"
   (OR (EQ self program)
       (_ (@ %:step)
          InProgram? program)))

(\UnbatchMethodDefs)

(DEFINEQ
```

Page 8

```
(FISTemplatesForReceiver
  [LAMBDA (Name Step Super)                                  (* mct%: " 9-Nov-87 12:27")

          (* * Returns the MMFS templates for the named receiver)

          (* * (SWDereferenceName (PACK* Name (QUOTE %.) (@ (_ (■ GrafcetReceiveStep) Prototype) |:FolderExtension|))))

    (LET (folder mp)
      (AND [OR [AND (ObjectExists? Super)
                    (SETQ mp (ObjectExists? (@ Super %:mainProgram)]
               (AND (ObjectExists? Step)
                    (SETQ mp (ObjectExists? (@ Step |:superObject:mainProgram|)]
           [SETQ folder (CADR (FASSOC Name (@ mp %:allReceiveStepAList)]
           (@ folder %:receivableTemplates)])

(FISTemplatesForSender
  [LAMBDA (Name Step Super)                                  (* mct%: " 9-Nov-87 12.27")

          (* * Returns the MMFS templates for the named sender)

          (* * (SWDereferenceName (PACK* Name (QUOTE %.) (@ (_ (■ GrafcetSendStep) Prototype) |:FolderExtension|))))

    (LET (folder mp)
      (AND [OR [AND (ObjectExists? Super)
                    (SETQ mp (ObjectExists? (@ Super %:mainProgram)]
               (AND (ObjectExists? Step)
                    (SETQ mp (ObjectExists? (@ Step |:superObject:mainProgram|)]
           [SETQ folder (CADR (FASSOC Name (@ mp %:allSendStepAList)]
           (@ folder %:sendableTemplates)])

(UnionIntoList
  [LAMBDA (modifyList toIncludeElementsOfList)               (* TAL "13-Aug-85 07 24")
    (for x in toIncludeElementsOfList do (pushnew modifyList x))
    modifyList])
```

```
(UnionStaticAnalysis
  [LAMBDA (modifyAnalysis toIncludeAnalysis)                    (* TAL "15-Nov-87 16 18")

          (* Merge the entries on the AList toIncludeAnalysis into the AList modifyAnalysis and return the result
          The merge is usually destructive, but is not guaranteed to be, so the returned value must be used.)
                                                  (* (change (fetch SettableVars of modifyAnalysis)
                                                  (UnionIntoList DATUM (fetch SettableVars of toIncludeAnalysis)))
                                                  (change (fetch TestableVars of modifyAnalysis)
                                                  (UnionIntoList DATUM (fetch TestableVars of toIncludeAnalysis)))
                                                  (change (fetch SendableMessages of modifyAnalysis)
                                                  (UnionIntoList DATUM (fetch SendableMessages of toIncludeAnalysis)))
                                                  (change (fetch ReceivableMessages of modifyAnalysis)
                                                  (UnionIntoList DATUM (fetch ReceivableMessages of toIncludeAnalysis)))
    modifyAnalysis)
    (LET (modLst)
      (COND
        ((NULL modifyAnalysis)
         (COPY toIncludeAnalysis))
        (T [for accessLst in toIncludeAnalysis do (COND
                                                    ((SETQ modLst (FASSOC (CAR accessLst)
                                                                          modifyAnalysis))
                                                     (for item in (CDR accessLst)
                                                        unless (FMEMB item (CDR modLst))
                                                        do (push (CDR modLst)
                                                                 item)))
                                                    (T (push modifyAnalysis (APPEND accessLst]
           modifyAnalysis])
)

(RPAQQ GrafcetReceiveStepPalette8M '        )
```

```
(RPAQQ GrafcetSendStepPalette8M        )
```

```
(RPAQQ FISForceReanalyzeFlg NIL)

(RPAQ GrafcetFont (FONTCREATE '(HELVETICA 8 BOLD)))
```

```
(DECLARE%: DOEVAL@COMPILE DONTCOPY

(GLOBALVARS FISForceReanalyzeFlg)
)

(DECLARE%: EVAL@COMPILE

(RECORD StaticAnalysis (SettableVars TestableVars SendableMessages ReceivableMessages))
)

(PUTPROPS GRAFCET FILETYPE :FAKE-COMPILE-FILE)

(DECLARE%: DONTEVAL@LOAD DOEVAL@COMPILE DONTCOPY COMPILERVARS

(ADDTOVAR NLAMA )

(ADDTOVAR NLAML )

(ADDTOVAR LAMA )
)

(PUTPROPS GRAFCET COPYRIGHT ("Savoir, Inc." 1985 1986 1987 1988))
```

FUNCTION INDEX

CEditor.TAB8.FMTSPEC ..............................8

METHOD INDEX

CEditor.AbortEdit ...............2
CEditor.AppendToRing ............3
CEditor.Browse ..................3
CEditor.Compile .................3
CEditor.ContentsChanged .........3
CEditor.DisplayText .............3
CEditor.ExitBrowser .............4
CEditor.GoToLine ................4
CEditor.RestoreText .............4
CEditor.SetSearchString .........4
CEditor.UpdateObject ............4
CProgram.Compile ................5
CProgram.Evaluate ...............5
CProgram.GetFunctionName ........5
CProgram.GetMyPrintName .........5
CProgram.GetNamedParts ..........6
CProgram.InProgram? .............6
CProgram.Kill ...................6
CProgram.NameQualifier ..........6
CProgram.OldInstance ............6
CProgram.PrintNameQualifier .....6
CProgram.QualifyCacheFlush ......6
CProgram.Rename .................7
CProgram.SWCopyMade .............7
CProgram.WhoUses ................7
EditCContext.CompileObj .........7
EditCContext.CreateObject .......8
EditCContext.TextChanged ........8
EditGrafDeclsContext.CompileObj .8
EditGrafDeclsContext.TextChanged 8

CLASS INDEX

CEditor ..........................1
CProgram ........................1
CreateCContext ..................2
EditCContext ....................2
EditGrafDeclsContext ............2

VARIABLE INDEX

CEditorPWindowDismissTime .......8
FISCompileStepProgFlg ...........8

PROPERTY INDEX

GRAFCETC ......................1,8

ADVICE INDEX

FONTSET .........................8 changes to: (METHODS CProgram.PrintNameQualifier)

previous date: 5-Sep-88 16:56:33 {DSK}<LISPFILES>FIS>GRAFCETC.;61

Read Table: INTERLISP

Package: IL

;; Copyright (c) 1986, 1987, 1988 by Savoir, Inc.. All rights reserved.

```
(RPAQQ GRAFCETCCOMS
       ((DECLARE%: DONTCOPY (PROP MAKEFILE-ENVIRONMENT GRAFCETC))
        (CLASSES CEditor CProgram CreateCContext EditCContext EditGrafDeclsContext)
        (METHODS CEditor.AbortEdit CEditor.AppendToRing CEditor.Browse CEditor.Compile
               CEditor.ContentsChanged CEditor.DisplayText CEditor.ExitBrowser CEditor.GoToLine
               CEditor.RestoreText CEditor.SetSearchString CEditor.UpdateObject CProgram.Compile
               CProgram.Evaluate CProgram.GetFunctionName CProgram.GetMyPrintName CProgram.GetNamedParts
               CProgram.InProgram? CProgram.Kill CProgram.NameQualifier CProgram.OldInstance
               CProgram.PrintNameQualifier CProgram.QualifyCacheFlush CProgram.Rename CProgram.SWCopyMade
               CProgram.WhoUses EditCContext.CompileObj EditCContext.CreateObject EditCContext.TextChanged
               EditGrafDeclsContext.CompileObj EditGrafDeclsContext.TextChanged)
        (COMS (FNS CEditor.TAB8.FMTSPEC)
              (P (CEditor.TAB8.FMTSPEC))
              (ADVISE FONTSET))
        (INITVARS (CEditorPWindowDismissTime 1500))
        (VARS (FISCompileStepProgFlg T))
        (GLOBALVARS FISCompileStepProgFlg)
        (PROP FILETYPE GRAFCETC)))

(DECLARE%: DONTCOPY

(PUTPROPS GRAFCETC MAKEFILE-ENVIRONMENT (:PACKAGE "IL" :READTABLE "INTERLISP" :BASE 10))
)

(DEFCLASS CEditor (MetaClass Class Edited%:                    . Edited 29-Jun-88 02:30 by lipkis
                          doc "This is the default metaClass for all classes")
       (Supers TEditBrowser)
       (ClassVariables (PrintName #,($A (context PrintName NIL CV) GetIndirectThroughIV NoUpdatePermitted))
              [HorizMethodItems ((Exit ExitBrowser "Store changes (if any) and exit browser.")
                                 (Update UpdateObject "Store editing changes without exiting browser.")
                                 (Compile Compile "Store changes (if any) and compile.")
                                 (Revert RestoreText "Revert to previous version of text.  If repeated,
                                        cycles through
                                        several previous versions, including current version."
                                        (SUBITEMS (Revert RestoreText "Revert to previous version of text.
                                                         If repeated, cycles through
                                                         several previous versions, including current
                                                         version.")
                                                  (Abort AbortEdit "Undo all changes made since browser was
                                                         started, and exit."]
              (TEditMenuItems ((Put 'Plain-Text "Stores the text on a file")
                               (Include 'Include "Inserts text from a file at the caret")
                               (Find 'Find "Searches for a string")
                               (Substitute 'Substitute "Substitutes one string for another within the
                                      selected text")
                               ("Go to line" 'FormEditorGoToLine "Moves caret to specified line")))
              (NSaves 3 doc "Length of save ring"))
       (InstanceVariables (width 280)
              (height 212)
              (textIV NIL doc "Holds name of object's IV where text is stored. Fetched from context.")
              (origText NIL doc "Saved when first update is made")
              (saveRing NIL doc "List of up to NSaves previous versions of text")
              (recentRestore NIL doc "Tested and set by Restore, cleared by Update, etc.")))
```

```
(DEFCLASS CProgram (MetaClass Class Edited%:                    Edited 29-Jun-88 02.30 by lipkis
                        doc "This is the default metaClass for all classes")
       (Supers SWNamedObject NonGrafcetProgram)
       (ClassVariables (CachedIVs (printName functionName))
              (AnalysisCallerClass #,($C AnalysisRefStepProg)))
       (InstanceVariables (printName #,($A GetMyPrintName FFSendSelf ReplaceMe) DontSave Any doc 'AV on
                              SWNamedObject doesn't currently allow replacement")
              (functionName #,($A GetFunctionName FFSendSelf ReplaceMe) DontSave Any doc 'AV inserted to
                     assist in copy/rename")
              (text NIL)))
```

```
(DEFCLASS CreateCContext (MetaClass Class Edited%:               Edited 29-Jun-88 02:29 by lipkis
                        doc "This is the default metaClass for all classes")
       (Supers CreationContext EditCContext)
       (ClassVariables (MenuName ("Create C Program" ("Create C Program (" * ")")))
              (MenuDoc "Create and edit a C program")
              (Prototype #,($& CreateCContext (SFX0.1Y%:.L12.03< . 1545)) doc
                                                         (* CV added by FEBER)))
       (InstanceVariables (doesCreate T)))

(DEFCLASS EditCContext (MetaClass Class Edited%:                 Edited 29-Jun-88 02:29 by lipkis
                        doc "This is the default metaClass for all classes")
       (Supers EditingContext DefaultContext)
       (ClassVariables (AttachHorizMenu T)
              (MenuName ("Examine Program" ("Examine Program (" * ")")))
              (MenuDoc "View the specified program")
              (Browser #,($C CEditor))
              (PrintName NIL)
              (Prototype #,($& EditCContext (SFX0.1Y%:.L12.03< . 1546)) doc
                                                         (* CV added by FEBER)))
       (InstanceVariables (object NIL VR #,($C CProgram))
              (textIV text doc "Name of IV where object's text string is stored")))

(DEFCLASS EditGrafDeclsContext (MetaClass Class Edited%:         Edited 29-Jun-88 02.29 by lipkis
                        doc "This is the default metaClass for all classes")
       (Supers DefaultContext)
       (ClassVariables (MenuName "View C Decls")
              (MenuDoc "View this program's C declarations")
              (AttachHorizMenu T)
              (Browser #,($C CEditor))
              (PrintName                                 (* " C Declarations ")))
       (InstanceVariables (object NIL VR #,($C GrafcetProgram))
              (textIV cDecls doc "Name of IV where object's text string is stored")
              (stepProgFlg NIL doc "Tell CEditor not to look for fn header to protect")
              (canCreate NIL)
              (browserPrintName                          (* " C Declarations")]

(\BatchMethodDefs)


(Method ((CEditor AbortEdit) self)                         TAL 13-Jan-88 16:55
   "New method template"
   [LET ((stream (WTextStream? (@ %:window)))
         (context (@ %:context))
         (origText (@ %:origText)))
     (DECLARE (GLOBALVARS CEditorPWindowDismissTime))
     (COND
        ((NULL stream)
         (_ self SWPromptPrint "Can't: System Error."))
        ((AND (NULL origText)
              (NOT (TEDIT.STREAMCHANGEDP stream)))        (* No editing was done, don't bother confirming
                                                          See comment below about ExitBrowser)
         (_ self ExitBrowser))
        ((MOUSECONFIRM NIL "Click LEFT to confirm abort." (LET [(pWindow (_ self SWGetPromptWindow
                                                                         (@ %:window))]
                                                          (CLEARW pWindow)
                                                          pWindow))
         (COND
            ([AND origText (NOT (EQUAL origText (OR (GetValue (@ %:object)
                                                        (@ context %:textIV))
                                                  (ALLOCSTRING 0]

         (* If object is different than original, restore it and tell it it needs to be compiled)

             (PutValue (@ %:object)
                    (@ context %:textIV)
                    origText)
             (_ context TextChanged)))

         (* We don't really want to do ExitBrowser as it first does UpdateObject, but the check for empty step progs is also there and we do
         want that (The empty prog check should be elsewhere, probably on RegularStep) For now, mark the stream not changed so that the
         update won't do anything )

         (TEDIT.STREAMCHANGEDP stream T)
         (_ self ExitBrowser)])
```

```
(Method ((CEditor AppendToRing) self text)                 TAL 10-Jan-88 22.05
   "New method template"
   (LET ((nSaves (@ |::NSaves|)))
     (COND
```

```
        ((ILESSP (LENGTH (@ %:saveRing))
                nSaves)
         (cnconc1 (@ %:saveRing)
                text))
        (T (change (CAR (LAST (@ %:saveRing)))
                   text)))
    text))
```

```
(Method ((CEditor Browse) self context object)                    . mcl: 6-Jul-87 15.11
   "Specialization"
   (LET ((options '(PARALOOKS [TABS .(CONS (ITIMES 8 (CHARWIDTH (CHARCODE A)
                                                               DEFAULTFONT]
                         PROMPTWINDOW DON'T NOTITLE T QUITFN T))
         (pos 1)
         stream window text w/h w h hdrEnd end)
     (SETQ text (GetValue object (@ context %:textIV)))
     (SETQ stream (OPENTEXTSTREAM text NIL NIL NIL options))
     (replace (TEXTOBJ TXTFILE) of (TEXTOBJ stream) with NIL) . UNDOC
     (SETQ w/h (TextStreamWidth/Height stream 60))
     [SETQ w (TIMES (CHARWIDTH (CHARCODE A)
                               DEFAULTFONT)
                    (MAX 30 (MIN 80 (PLUS 5 (CAR w/h]
     [SETQ h (TIMES (FONTHEIGHT DEFAULTFONT)
                    (MAX 4 (MIN 40 (PLUS 3 (CDR w/h]
     (_ self PositionBrowser w h)
     (SETQ window (@ %:window))
     (SETQ end (fetch TEXTLEN of (TEXTOBJ stream)))          . This takes too long on huge decls  (TEDIT PARALOOKS stream (QUOTE
                                                               (LEFTMARGIN 5)) 1 end)

     .. (COND ((AND (@ context  stepProgFlg) (SETQ hdrEnd (TEDIT FIND stream  {' 1))) (TEDIT LOOKS stream (QUOTE (PROTECTED ON)) 1 hdrEnd) (TEDIT LOOKS
     .. stream (QUOTE (SELECTPOINT ON)) hdrEnd 1) (TEDIT LOOKS stream (QUOTE (PROTECTED ON)) (SUB1 end) 2) (COND ((EQ (SWTEDIT GETCHARCODE stream
     .. (ADD1 hdrEnd)) (CHARCODE CR)) (SETQ pos (PLUS 2 hdrEnd))) (T (SETQ pos (ADD1 hdrEnd)))) (pushlist options (QUOTE (SELFN FormEditorSelFn)))))

     .. Warning: To hide the function name and braces, it does not work to just make them invisible, as COERCETEXTOBJ will not include them in the result string

     [COND
       [(@ context %:permitEdits)
        (TEDIT stream window NIL '(SEL .pos .@options]
       (T (OPENTEXTSTREAM stream window NIL NIL '(READONLY T LEAVETTY T SEL DON'T .@options]
     (TEDIT.STREAMCHANGEDP stream T)
     (_ self SetupTEditWindow window NIL)))
```

```
(Method ((CEditor Compile) self)                                  . mcl  1 Jan-87 16.12
   "New method template"
   [LET ((CC.ErrorStream (FUNCTION FISCompileError)))
     (DECLARE (SPECVARS CC.ErrorStream))
     (_ self SWPromptPrint "Compiling ...")
     (_ self UpdateObject)
     (COND
       ((_ (@ %:context)
           CompileObj)
        (_ self SWPromptPrint "  OK." 'NOCR))
       (T (_ self SWPromptPrint "  Failed." 'NOCR))])
```

```
(Method ((CEditor ContentsChanged) self Arg1)                     TAL 13-Jan-88 16 36
                                                                  . Redisplay buffer from object, turn off change mark
   "(_Super self ContentsChanged Arg1)"
   (_ self DisplayText NIL NIL T T)
   (_@ %:recentRestore NIL))
```

```
(Method ((CEditor DisplayText) self Stream Text DontSetSelFlg ClearChangeMark)
                                                                  . TAL 13 Jan-88 16 34
   "New method template"
   [LET [[stream (OR Stream (WTextStream? (@ %:window)]
         (text (OR Text (OR (GetValue (@ %:object)
                                      (@ |:context:textIV|))
                            (ALLOCSTRING 0]
     (COND
       ((STREAMP stream)
        (TEDIT.DELETE stream 1 (fetch TEXTLEN of (TEXTOBJ stream)))
        (TEDIT.INSERT stream text NIL NIL T)
        (OR DontSetSelFlg (TEDIT.SETSEL stream 1 0 'LEFT))
        (AND ClearChangeMark (TEDIT.STREAMCHANGEDP stream T])
```

```
(Method ((CEditor ExitBrowser) self)                              . mcl: 7-Jul-87 14:16
   "Specialization"
   [LET (step val (obj (@ %:object))
              (textIV (@ |:context:textIV|))
              (containerIV (@ |:context:containerIV|)))
     (_Super self ExitBrowser)
     (COND
       ((AND obj (_ obj InstOf 'CProgram))
        (OR (AND (SETQ val (GetValue obj textIV))
                 (NOT (EQUAL val "")))
            (COND
              ((ObjectExists? (SETQ step (@ obj %:caller)))
               (_ step DeleteProgram containerIV)])
```

```
(Method ((CEditor GoToLine) self line)                    . TAL 5-Nov-87 11.22
   "Highlight specified line in window, return NIL iff couldn't"
   (LET [(stream (WTextStream? (@ %:window)]
     (AND stream (FormEditorGoToLine stream line T))))

(Method ((CEditor RestoreText) self)                      . TAL 13-Jan-88 16.44
   "New method template"
   (DECLARE (GLOBALVARS CEditorPWindowDismissTime))
   [LET ((stream (WTextStream? (@ %:window)))
         (context (@ %:context))
         tmp)
     (COND
        ((NULL stream)
         (_ self SWPromptPrint "Can't: System Error."))
        [(AND (NOT (@ %:recentRestore))
              (TEDIT.STREAMCHANGEDP stream))      (* Changes have been made since last update, so previous version is in object)
         (_ self AppendToRing (\ThinString (COERCETEXTOBJ stream 'STRINGP)))
         (_ self DisplayText stream NIL NIL T)    (* Buffer now agrees with obj, so no change mark)
         (COND
            ((@ %:origText)
             (_ self SWPromptPrint "Restored to last update." NIL NIL NIL CEditorPWindowDismissTime))
            (T (_ self SWPromptPrint "Restored to original." NIL NIL NIL CEditorPWindowDismissTime)]
        ((SETQ tmp (pop (@ %:saveRing)))

         (* Either no changes since last update or last update has already been restored, so get previous version from ring, save current buffer
         at end of ring)

         (_ self AppendToRing (\ThinString (COERCETEXTOBJ stream 'STRINGP)))
         (_ self DisplayText stream tmp)          (* Don't turn off change mark, as buffer now differs from obj)
         (_@ %:recentRestore T)
         (_ self SWPromptPrint "Buffer restored." NIL NIL NIL CEditorPWindowDismissTime))
        (T (_ self SWPromptPrint "Can't, nothing to restore." NIL NIL NIL CEditorPWindowDismissTime)])

(Method ((CEditor SetSearchString) self string)           TAL 3-Dec-87 18.48
   "New method template"
   (WINDOWPROP (@ %:window)
         'TEDIT.LAST.FIND.STRING string))

(Method ((CEditor UpdateObject) self)                     . TAL 13-Jan-88 16.37
   "Update the object if any editing was done"
   [LET ((stream (WTextStream? (@ %:window)))
         (context (@ %:context))
         objText tmp)
     (COND
        ((NULL stream)
         (_ self SWPromptPrint "Can't: System Error."))
        ((TEDIT.STREAMCHANGEDP stream)
         (SETQ objText (OR (GetValue (@ %:object)
                                     (@ context %:textIV))
                           (ALLOCSTRING 0)))
         (COND
            ((NULL (@ %:origText))                (* Save original text if we haven't yet)
             (_@ %:origText objText)))
         (push (@ %:saveRing)
               objText)                           (* Push previous version on save ring)
         (COND
            ([CDR (SETQ tmp (NTH (@ %:saveRing)
                                 (@ |::NSaves|))]  (* Trim ring to max length)
             (change (CDR tmp)
                     NIL)))
         [PutValue (@ %:object)
                (@ context %:textIV)
                (\ThinString (COERCETEXTOBJ stream 'STRINGP]
```

Page 5

```
         (_@ %:recentRestore NIL)                 (* Used by Restore)
         (_ context TextChanged)
         (TEDIT.STREAMCHANGEDP stream T])

(Method ((CProgram Compile) self)                         . TAL 6-Dec-87 16.37
   "Return non NIL iff compile succeeds"
   (LET ((text (@ %:text))
         (caller (@ %:caller))
         (fnName (@ %:functionName))
         (FISCompilingObject self)
         cName parentEnv resultEnv anal)
     (DECLARE (SPECVARS FISCompilingObject))
     (SETQ cName (SUBATOM fnName 1 -5))           (* strip off "CFN" Must be atom for analysis lookup)
     (COND
        ([AND (STRINGP text)
              caller
              (SETQ parentEnv (_ (@ caller %:superObject)
                                 GetCompileEnv))
              (SETQ resultEnv (CAR (NLSETQ (CC.CompileString (CONCAT cName "().(" text ")")
                                                             (COND
                                                                (FISCompileStepProgFlg
                                                                      (* OcomFile = 0 means compile with no file)
                                                                   0)
                                                                (T NIL))
```

```
                                 parentEnv
                                 '(QUIET T]
    (_@ %:staticAnalysis (FISStaticAnalysisFromDetail (_@ %:detailedAnalysis (CCEnv.Analysis resultEnv
                                                                                          cName))))
    T)
   (T                                              (* do we want to clear these if compile fails?
                                                   (@ %.staticAnalysis (_@ %.detailedAnalysis NIL)))
     NIL))))

(Method ((CProgram Evaluate) self process step cycle)      TAL 29-Jul-86 02.43
  "Evaluate a lisp program in the specified process"
  (DECLARE (GLOBALVARS TREATASCLISPFLG CLISPFLG NOSPELLFLG DWIMESSGAG CLISPHELPFLG)
        (LOCALVARS . T))
  [LET ((fn (@ %:functionName)))
    (COND
      ((EXPRP fn)
       (RESETVARS ((TREATASCLISPFLG T)
                   (CLISPFLG T)
                   (NOSPELLFLG T)
                   (DWIMESSGAG T)
                   (CLISPHELPFLG NIL))
                  (FISEvaluateProgram self fn process step cycle)))
      ((DEFINEDP fn)
       (FISEvaluateProgram self fn process step cycle])

(Method ((CProgram GetFunctionName) self)                  mct: 12-Oct-87 09 44
  "New method template"
  (LET [ncc (name (OR (CONCAT (_ self GetPrintName))
                      (SHOULDNT]
    [for i from 1 to (NCHARS name) do (COND
                                        ((OR (EQ (SETQ ncc (NTHCHARCODE name i))
                                                 (CHARCODE %.))
                                             (EQ ncc (CHARCODE ;)))
                                         (RPLCHARCODE name i (CHARCODE _]
    (PACK* name '.CFN)))

(Method ((CProgram GetMyPrintName) self)
  "Make print name agree with C function name, i.e., _'s rather than .'s"
  "When (if) CProgram is changed to not be a SWNamedObject, _Super must go"
  (LET (name pos (fnName (@ %:functionName)))
    (COND
      ((AND [SETQ name (COND
                         ((AND fnName (SETQ pos (STRPOS ".CFN" fnName)))
                          (SUBSTRING fnName 1 (SUB1 pos)))
                         (T (_ self GetPrintName)]
            (SETQ pos (STRPOS "_" name)))
       (SUBATOM name (ADD1 pos)))
      (T name))))
```

Page 6

```
(Method ((CProgram GetNamedParts) self PartLst PartType)
                                                           mct: 7-Oct-87 13:16
  "Specialization"
  [COND
    ((OR (NOT PartType)
         (EQ PartType 'CProgram))
     (SETQ PartLst (NCONC1 PartLst self])

(Method ((CProgram InProgram?) self program)               mct 31-Dec-87 13.29
  "Specialization"
  (LET ((caller (@ %:caller)))
    (AND (ObjectExists? caller)
         (_ caller InProgram? program))))

(Method ((CProgram Kill) self)                             mct: 24-Aug-87 13.11
  "Specialization"
  (LET ((fn (@ %:functionName)))
    (AND (DEFINEDP fn)
         (PUTD fn NIL))
    (_Super self Kill)))

(Method ((CProgram NameQualifier) self)                    Edited 5-Sep-88 15 33 by mct
                                                           mct: 9-Sep-87 15 19
  "New method template"
  (_ (@ self caller)
     NameQualifier))

(Method ((CProgram OldInstance) self)                      mct 11 Sep-87 16 07
                                                           Get rid of the void at the beginning of each step prog
  (LET [chgflg (text (@ %:text))
               (name (OR (CONCAT (_ self GetName))
                         (SHOULDNT]
    (_Super self OldInstance)

     (* Strip function name and bracketing squiggles, as well as the void, from the beginning of old step programs)
```

```
(COND
  ((EQ 1 (STRPOS "void " text NIL NIL T))
   (change text (SUBSTRING DATUM 6 -1))
   (SETQ cngflg T)))
[for i from 1 to (NCHARS name) do (COND
                                    ((OR (EQ (NTHCHARCODE name i)
                                             (CHARCODE %.))
                                         (EQ (NTHCHARCODE name i)
                                             (CHARCODE :)))
                                     (RPLCHARCODE name i (CHARCODE _]

[COND
  ((AND (EQ 1 (STRPOS name text NIL NIL T))
        (EQ (NTHCHARCODE text (ADD1 (NCHARS name)))
            (CHARCODE %()))
   [change text (SUBSTRING DATUM (ADD1 (STRPOS "(" text))
                           (SUB1 (STRPOS ")" text NIL NIL NIL NIL T]
   (SETQ cngflg T)
   (COND
     ((EQ (NTHCHARCODE text 1)
          (CHARCODE CR))                (* Remove unnecessary carriage return  if present)
      (change text (SUBSTRING DATUM 2]
 (AND cngflg (_@ %:text text))))

(Method ((CProgram PrintNameQualifier) self)          . Edited  7-Sep-88 12.00 by mcf
  "Method documentation"
  (_ (@ self caller)
     PrintNameQualifier))

(Method ((CProgram QualifyCacheFlush) self)           . mcf: 17 Sep 87 11 53
  "Specialization"
  [COND
    ((FISQualified self))
    (T (_ self ChangeName (FISQualifyName self (_ self GetName]))))
```

Page 7

```
(Method ((CProgram Rename) self QualName ProgName StepName)
                                                      . mcf: 23-Sep-87 16.41
  "New method template"
  (DECLARE (GLOBALVARS FISNameQSepr))
  [LET (newName ppos qpos obj (oldFn (@ %:functionName))
          (oldName (_ self GetName)))
    (COND
      ((AND oldName (OR QualName ProgName StepName))
       (SETQ qpos (STRPOS FISNameQSepr oldName))
       (SETQ ppos (STRPOS "." oldName))
       [SETQ newName (PACK* (OR QualName (SUBSTRING oldName 1 (SUB1 qpos)))
                            FISNameQSepr
                            (OR ProgName (SUBSTRING oldName (ADD1 qpos)
                                                    (SUB1 ppos)))
                            "."
                            [OR StepName (SUBSTRING oldName (ADD1 ppos)
                                                    (SUB1 (STRPOS "." oldName NIL NIL NIL NIL NIL T]
                            (SUBSTRING oldName (STRPOS "." oldName NIL NIL NIL NIL T]
       (COND
         ((SWDereferenceName newName)           (* target named object already exists)
          (AND (NOT (EQUAL oldName newName))
               (printout SavoirPROMPTWINDOW T "Unable to rename " (FISDequalifyName oldName)
                         " to "
                         (FISDequalifyName newName)
                         T "Target object already exists" T)))
         (T (_@ self %:printName NotSetValue)
            (_@ self %:functionName NotSetValue)
            (_ self ChangeName newName)

       (* * Can't save the compiled definition, as containing object (s) have not been renamed yet)

            (COND
              ((DEFINEDP oldFn)
               (PUTD oldFn NIL])

(Method ((CProgram SWCopyMade) self XLations)         . mcf. 21-Oct-87 16 04
                                                      . Specialization
  "(_Super self SWCopyMade XLations)"
  [LET (pos1 pos2 macroName stepName newName rest fullName (id (@ self %:objectIdentifier))
         (dotSepr "."))
    (COND
      (id (SETQ fullName (fetch SWIDPrimaryName of id))
          (SETQ pos1 (STRPOS dotSepr fullName))
          [SETQ macroName (FISDequalifyName (SUBATOM fullName 1 (SUB1 pos1]
          (SETQ pos2 (STRPOS dotSepr fullName (ADD1 pos1)))
          (SETQ stepName (SUBATOM fullName (ADD1 pos1)
                                  (SUB1 pos2)))
          (SETQ rest (SUBATOM fullName (ADD1 pos2)
                              -1))
```

```
(SETQ newName (PACK* (OR (CDR (FASSOC macroName (fetch MacroSteps of XLations)))
                         macroName)
                     dotSepr
                     (OR (CDR (FASSOC stepName (fetch RegularSteps of XLations)))
                         stepName)
                     dotSepr rest))
[SETQ newName (FISQualifyName NIL newName (OR (fetch Qualifier of XLations)
                                              (FISDequalifyName fullName NIL T]
(_@ self %:objectIdentifier (create SWObjectIdentifier
                                    SWIDPrimaryName _ newName copying id))])
```

```
(Method ((CProgram WhoUses) self item access partName)
                                                   TAL 6-Dec-87 16 40
   "New method template"
   [LET ((1 (FISInDetailedAnalysis? item access (@ %:detailedAnalysis)))
         refObj)
     (COND
       (1 (SETQ refObj (_ (@ |::AnalysisCallerClass|)
                          New))
          (_ refObj FillIn self partName 1)
          (LIST refObj])
```

```
(Method ((EditCContext CompileObj) self)           TAL 1 Nov-87 18 46
   "New method template"
   (_ (@ %:object)
      Compile))
```

```
(Method ((EditCContext CreateObject) self suppliedObject)
                                                   mcf: 12-Oct-87 09:44
   "Specialization"
   (DECLARE (GLOBALVARS FILEPKGFLG))
   (LET (name ncc (obj (_Super )))
     (OR obj (SHOULDNT))
     (SETQ name (OR (CONCAT (_ obj GetName))
                    (SHOULDNT)))
     [for i from 1 to (NCHARS name) do (COND
                                          ((OR (EQ (SETQ ncc (NTHCHARCODE name i))
                                                   (CHARCODE %.))
                                               (EQ ncc (CHARCODE ;)))
                                           (RPLCHARCODE name i (CHARCODE _]
                                                   (* (PutValue obj (@ %:textIV) (CONCAT name "() {
                                                   }
                                                   ")))
                                                   (* (_@ obj %:text (CONCAT "void " name "() {
                                                   }
                                                   ")))
     (_@ obj %:functionName (PACK* name '.CFN))
     obj))
```

```
(Method ((EditCContext TextChanged) self)          TAL 10-Nov-87 12:59
   "Tell macro prog it needs to be recompiled"
   (_ (@ %:object)
      ObjectChanged T))
```

```
(Method ((EditGrafDeclsContext CompileObj) self)   TAL 1-Nov-87 18:50
   "Compile item on browser just wants to compile decls"
   (_ (@ %:object)
      CompileDecls))
```

```
(Method ((EditGrafDeclsContext TextChanged) self)  TAL 10-Nov-87 12:59
   "Tell macro prog it needs to be recompiled"
   (_ (@ %:object)
      NeedRecompile)
   (_ (@ %:object)
      ObjectChanged T))

(\UnbatchMethodDefs)

(DEFINEQ

(CEditor.TAB8.FMTSPEC
  [LAMBDA (font)                                   (* TAL "22-Apr-88 17 06")
    (DECLARE (GLOBALVARS DEFAULTFONT TEDIT.DEFAULT.FMTSPEC))
    (replace (FMTSPEC TABSPEC) of TEDIT.DEFAULT.FMTSPEC with (CONS (ITIMES 8 (CHARWIDTH (CHARCODE A)
                                                                                    (OR (FONTP font)
                                                                                        DEFAULTFONT])
)

(CEditor.TAB8.FMTSPEC)

[XCL:REINSTALL-ADVICE 'FONTSET :AFTER '((:LAST (CEditor.TAB8.FMTSPEC]

(READVISE FONTSET)

(RPAQ? CEditorPWindowDismissTime 1500)

(RPAQQ FISCompileStepProgFlg T)
```

```
(DECLARE%: DOEVAL@COMPILE DONTCOPY

(GLOBALVARS FISCompileStepProgFlg)
)

(PUTPROPS GRAFCETC FILETYPE :FAKE-COMPILE-FILE)

(PUTPROPS GRAFCETC COPYRIGHT ("Savoir, Inc." 1986 1987 1988))
```

---

METHOD INDEX

CreateGrafcetMacroContext.CreateObject ........................................ 2
CreateGrafcetMacroContext.Start ........................................ 2
EditGrafcetContext.ContextReturned ........................................ 2
ExamineGrafcetStructureContext.ComputeSubContextTypes ........................................ 2
ExamineGrafcetStructureContext.ContextExited ........................................ 3
ExamineGrafcetStructureContext.ContextReturned ........................................ 3
ExamineGrafcetStructureContext.FindObject ........................................ 3
ExamineGrafcetStructureContext.ProcessListObject ........................................ 3

---

CLASS INDEX

CreateGrafcetMacroContext ..........................1
EditGrafcetContext ..........................1
ExamineGrafcetStructureContext ..........................2
ExamineTransitionContext ..........................2

---

PROPERTY INDEX

GRAFCONTEXT ....................................1,3

--- changes to: (VARS GRAFCONTEXTCOMS)

previous date: 6-Jun-88 12:44:39 {DSK}<LISPFILES>FIS>GRAFCONTEXT.;36

Read Table: INTERLISP

Package: IL

;; Copyright (c) 1985, 1986, 1987 1988 by Savoir, Inc. All rights reserved.

```
(RPAQQ GRAFCONTEXTCOMS
       ((DECLARE%: DONTCOPY (PROP MAKEFILE-ENVIRONMENT GRAFCONTEXT))
                                                          ; File created by FEBER
        (CLASSES CreateGrafcetMacroContext EditGrafcetContext ExamineGrafcetStructureContext
               ExamineTransitionContext)
        (METHODS CreateGrafcetMacroContext.CreateObject CreateGrafcetMacroContext.Start
               EditGrafcetContext.ContextReturned ExamineGrafcetStructureContext.ComputeSubContextTypes
               ExamineGrafcetStructureContext.ContextExited ExamineGrafcetStructureContext.ContextReturned
               ExamineGrafcetStructureContext.FindObject ExamineGrafcetStructureContext.ProcessListObject)
        (FNS)
        (VARS)
        (INSTANCES)
        (PROP FILETYPE GRAFCONTEXT)))

(DECLARE%: DONTCOPY

(PUTPROPS GRAFCONTEXT MAKEFILE-ENVIRONMENT (:PACKAGE "IL" :READTABLE "INTERLISP" :BASE 10))
)

; File created by FEBER

(DEFCLASS CreateGrafcetMacroContext (MetaClass Class Edited%:
                                                          (* TAL "28-Sep-86 23:08")
                                    doc "This is the default metaClass for all classes")
       (Supers EditGrafcetContext)
       (ClassVariables (MenuName "Create Macro Step")
              (MenuDoc "Create and edit a definition for this macro step")
              (Prototype #,($& CreateGrafcetMacroContext (|FQXO.L2[:.@N=| . 16)))))
       (InstanceVariables (object NIL VR #,($C GrafcetMacroProgram))
              (doesCreate T)))

(DEFCLASS EditGrafcetContext (MetaClass Class Edited%:        (* TAL " 3-Dec-87 16:47")
                             doc "This is the default metaClass for all classes")
```

```
       (Supers EditingContext DefaultContext)
       (ClassVariables (Browser #,($C FOEGrafcetBrowser))
              (SubContextTypes (#,($C EditingContext) #,($C ExamineFolderContentsContext)
                                #,($C ExamineFormContext)
                                #,($C GrafcetNexusUsesContext))

                     old
                     (#,($C DefaultContext)))
              (MenuName "View Program")
              (MenuDoc "View a Grafcet Program")
              (LinkedContexts NIL doc "Examine process should only be available for main program. This will
                     work for now")
              (TextFont GrafcetFont doc "font to use")
              (Prototype #,($& EditGrafcetContext (|NCWO.L2[:.OF8| . 12))))
       (InstanceVariables (object NIL VR #,($C GrafcetProgram))
              (specialBehavior NIL doc "Should be on DefaultContext") .
              (canCreate T)))

(DEFCLASS ExamineGrafcetStructureContext (MetaClass Class Edited%:
                                          (* mcl%. "24-Nov-87 14 08")
                                          doc "This is the default metaClass for all classes")
       (Supers DefaultContext Object)
       (ClassVariables (Browser #,($C GrafcetStructureBrowser))
              (SubContextTypes #,($A ComputeSubContextTypes AVSendSelf NoUpdatePermitted))
              (NormalSubContextTypes (#,($C EditingContext) #,($C EditGrafDeclsContext)
                                      #,($C ExamineFolderContentsContext)
                                      #,($C GrafcetUsesContext) #,($C GlobalReplaceAnyContext)))
              (MenuName "View Program Structure")
              (MenuDoc "Examine the hierarchical structure of Macro Steps in the program.")
              (Prototype #,($& ExamineGrafcetStructureContext (NYWO.kga%:.2>> . 222))))
       (InstanceVariables (object NIL VR #,($C GrafcetProgram))
              (replacementcount NIL doc "hack")))

                                                                                      Page 2

(DEFCLASS ExamineTransitionContext (MetaClass Class Edited%: (* mcl%: "11-Dec-86 10:12")
                                    doc "This is the default metaClass for all classes")
       (Supers ExamineFormContext)
       (ClassVariables (AttachHorizMenu T)
              (MenuName "Edit Transition Label")
              (MenuDoc "Edit this transitions label and abbreviation information")
              (Prototype #,($& ExamineTransitionContext (|NFWO.L2[:.OH=| . 194))))
       (InstanceVariables (object NIL VR #,($C GrafcetTransition))))

(\BatchMethodDefs)

(Method ((CreateGrafcetMacroContext CreateObject) self)
                                                   , TAL 3-Jul 86 09:04
   "Specialization"
   [LET (newObj newID container)
     (COND
        ((SETQ newObj (_ ($ SimpleInOutMacroTemplate)
                         CopyDeep))
         (PutValueOnly newObj 'name NotSetValue)
         (_@ %:edited 'Create)
         (_@ newObj %:objectIdentifier NIL)
         [COND
           ((SETQ newID (@ %:newObjectID))
            (_ newObj NameObject newID)
            (COND
              ((SETQ container (@ %:objectContainer))
               (_ container CacheFlush)]
         newObj)
        (T (_Super self CreateObject)])

(Method ((CreateGrafcetMacroContext Start) self Object ContextArgs)
                                                   mcl: 19-Feb-88 15 04
                                                   Specialization
   "Automatically enter edit mode on creation"
   (LET (brwsr (result (_Super self Start Object ContextArgs)))
     (AND (ObjectExists? result)
          (SETQ brwsr (@ result %:myBrowser))
          (_ brwsr EnableEdit))
     result))

(Method ((EditGrafcetContext ContextReturned) self returningContext spawningRelation object
                                                   edited container containerIV)
                                                   mcl: 18-Nov-87 13 09
   "Specialization"
   (LET (brwsr)
     [COND
       ((SETQ brwsr (ObjectExists? (@ %:myBrowser)]
     [COND
       ((ObjectExists? object)
        (COND
          [(AND edited (_ object InstOf 'GrafcetTransition)
                (@ object %:superObject))
           (COND
             (brwsr (_ object EraseLabel (@ brwsr %:window))
                    (_ object DrawLabel (@ brwsr %:window)))
             (T (_@ object %:labelRegion NotSetValue)]
```

```
    ((AND (_ object InstOf! 'FOECopySubstitutionObject)
          brwsr
          (EQ (@ brwsr %:editCommand)
              'CopyObject))
     (_@ brwsr %:nameSubstitutionALst (@ object %:elements))]
  (_Super self ContextReturned returningContext spawningRelation object edited container containerIV)))
```

(Method ((ExamineGrafcetStructureContext ComputeSubContextTypes) self)
mcf 16-Dec-86 09 17

```
  "New method template"
  (LET ((obj (@ |:myBrowser:middleSubObject|))
        (classes (@ |::NormalSubContextTypes|))
        decls)
    (COND
      ((AND obj (SETQ obj (OR (AND (ObjectExists? obj)
                                   obj)
                              (SWDereferenceName obj)))
            (_ obj InstOf! 'GrafcetProgram)
            (STRINGP (SETQ decls (@ obj %:cDecls)))
            (NEQ 0 (NCHARS decls)))
       classes)
      (T (REMOVE ($ EditGrafDeclsContext)
                 classes])
```

(Method ((ExamineGrafcetStructureContext ContextExited) self)
mcf: 17-Nov-87 18:14

```
  "Specialization"
  (LET (tcount)
    (COND
      ((SETQ tcount (@ %:replacementcount))
       (_@ %:replacementcount NIL)
       (TOTOPW (@ |:myBrowser:window|))
       (_ (@ %:myBrowser)
          SWPromptPrint
          (CONCAT tcount " " (Plural "Replacement" tcount)
                  " made")
          NIL NIL NIL 2000)))
    (_Super self ContextExited)))
```

(Method ((ExamineGrafcetStructureContext ContextReturned) self returningContext spawningRelation object edited container containerIV)
mcf: 4-Nov-87 15.58

```
  "Specialization"
  [COND
    ((_ returningContext InstOf! 'GlobalReplaceContext)
     (_@ %:replacementcount (@ returningContext %:totalcount))]
  (_Super self ContextReturned returningContext spawningRelation object edited container containerIV))
```

(Method ((ExamineGrafcetStructureContext FindObject) self suppliedObject)
mcf 7-Sep-85 00:59

```
  "Specialization"
  (COND
    ((AND (NULL suppliedObject)
          (EQ (@ %:spawningRelation)
              'Linked))
     (DEFERREDCONSTANT ($ CCP)))                 (* This is a kludge for 11th hour demo)
    (T (_Super self FindObject suppliedObject))))
```

(Method ((ExamineGrafcetStructureContext ProcessListObject) self object folderClass elementClass)
mcf: 6-Aug-86 10.54
Specialization

```
  "(_Super self ProcessListObject object folderClass elementClass)"
  object)

(\UnbatchMethodDefs)

(PUTPROPS GRAFCONTEXT FILETYPE :FAKE-COMPILE-FILE)

(PUTPROPS GRAFCONTEXT COPYRIGHT ("Savoir, Inc." 1985 1986 1987 1988))
```

FUNCTION INDEX

ADDASSOC ........................14
AVUpdateAssoc ...................17
AVUpdateMisc ....................17
AVUpdateReg .....................17
FISMapGetAssocNum ..............15
FISNetworkProcess ..............15
MapNetworkCloseFn ..............15
MapNetworkErrorFn ..............15
MapNetworkInputFn ..............15
NetworkStatus.StatusOn? ........17
\CloseMap ......................15

METHOD INDEX

MapAssociationFolderElement.MsgClass ...............4
MapAssociationsFolderBrowser.AddAssociation ........4
MapMessage.FromProgram? ............................4
MapMessage.GenerateAsciiHex ........................4
MapMessage.MatchFilter? ............................4
MapNetwork.AddTraceFilter ..........................4
MapNetwork.CancelListen ............................4
MapNetwork.DeliverMessage ..........................5
MapNetwork.FillInReceiver ..........................5
MapNetwork.FindMapApplication ......................5
MapNetwork.FindMapAssociationSpec ..................5
MapNetwork.FindTraceFilter .........................5
MapNetwork.GetMessage ..............................5
MapNetwork.InitializeTraceBrowsers .................6
MapNetwork.Listen ..................................6
MapNetwork.MapAbort ................................6
MapNetwork.MapAssociate ............................6
MapNetwork.MapClearQueue ...........................7
MapNetwork.MapConnected? ...........................8
MapNetwork.MapDeRegister ...........................8
MapNetwork.MapGetConnection ........................8
MapNetwork.MapNetworkCloseFn ........................8
MapNetwork.MapNetworkErrorFn ........................9
MapNetwork.MapNetworkInputFn ........................9
MapNetwork.MapRegister ............................10
MapNetwork.MapRegistered? .........................10
MapNetwork.MapRegistrations .......................11
MapNetwork.MapRelease .............................11
MapNetwork.MapReset ...............................11
MapNetwork.MapRespond .............................11
MapNetwork.MsgWaiting? ............................12
MapNetwork.NSAddrFromSpec .........................12
MapNetwork.Process ................................12
MapNetwork.ProcessUnsentMessages ..................12
MapNetwork.PushStatusMsg ..........................13
MapNetwork.RemoveTraceFilter ......................13
MapNetwork.ResetGrafcetProcess ....................13
MapNetwork.ResetMapProcess ........................14
MapNetwork.SendMessage ............................14
MMFSTraceContext.Exit ..............................3
MMFSTraceContext.FindObject ........................3
MMFSTraceContext.StartTrace ........................3
MMFSTraceContext.StopTrace .........................3
MMFSTraceFilter.SameFilter? ........................4

VARIABLE INDEX

FISDoneMsgString .................................15
FISMapAnimationIncrement .........................15
FISMapExternalAtomLst ............................15
FISSentMsgString .................................15
GEMSCommandInterpretations .......................16
MapAssociationFolderElementAllFields .............17
MapAssociationFolderElementFields ................17
MapAssociationFolderElementSomeFields ............17
MapNetwork .......................................16
MapNetworkStatus .................................16
MapNetworkStatusMsgTraceLimit ....................16
YesAtoms .........................................16

CLASS INDEX

ExamineMapAssociationContext .......................1
ExamineMapAssociationsFolderContext ................2
ExamineMapNetworkContext ...........................2
MapAssociationFolder ...............................2
MapAssociationFolderElement ........................2
MapAssociationsFolderBrowser .......................3
MapMessage .........................................3
MapNetwork .........................................3
MMFSTraceContext ...................................2
MMFSTraceFilter ....................................2
MMSMessage .........................................2

MACRO INDEX

ExternalMapAssoc? ..............16
LocalMapProcess? ...............16
YesAtom? .......................16

RECORD INDEX

MAPAssociation .................16
MAPManualMsg ...................16
MAPRegistration ................16

PROPERTY INDEX

MapAnimationUnit ...............15
MAPNETWORK ...................1,17

INSTANCE INDEX

MapAssociationFolderElement ....17

```
   changes to:  (CLASSES MMFSTraceFilter)
                (METHODS MapNetwork.RemoveTraceFilter MapNetwork.AddTraceFilter)

previous date:  27-Jun-88 17:43:09  {DSK}<LISPFILES>FIS>MAPNETWORK.;133

   Read Table:  INTERLISP

      Package:  IL
```

.. Copyright (c) 1985, 1986, 1987, 1988 by Savoir, Inc.. All rights reserved.

```
(RPAQQ MAPNETWORKCOMS
       ((DECLARE%: DONTCOPY (PROP MAKEFILE-ENVIRONMENT MAPNETWORK))
        (CLASSES ExamineMapAssociationContext ExamineMapAssociationsFolderContext ExamineMapNetworkContext
               MMFSTraceContext MMFSTraceFilter MMSMessage MapAssociationFolder MapAssociationFolderElement
               MapAssociationsFolderBrowser MapMessage MapNetwork)
        (METHODS MMFSTraceContext.Exit MMFSTraceContext.FindObject MMFSTraceContext.StartTrace
               MMFSTraceContext.StopTrace MMFSTraceFilter.SameFilter? MapAssociationFolderElement.MsgClass
               MapAssociationsFolderBrowser.AddAssociation MapMessage.FromProgram?
               MapMessage.GenerateAsciiHex MapMessage.MatchFilter? MapNetwork.AddTraceFilter
               MapNetwork.CancelListen MapNetwork.DeliverMessage MapNetwork.FillInReceiver
               MapNetwork.FindMapApplication MapNetwork.FindMapAssociationSpec MapNetwork.FindTraceFilter
               MapNetwork.GetMessage MapNetwork.InitializeTraceBrowsers MapNetwork.Listen MapNetwork.MapAbort
               MapNetwork.MapAssociate MapNetwork.MapClearQueue MapNetwork.MapConnected?
               MapNetwork.MapDeRegister MapNetwork.MapGetConnection MapNetwork.MapNetworkCloseFn
               MapNetwork.MapNetworkErrorFn MapNetwork.MapNetworkInputFn MapNetwork.MapRegister
               MapNetwork.MapRegistered? MapNetwork.MapRegistrations MapNetwork.MapRelease
               MapNetwork.MapReset MapNetwork.MapRespond MapNetwork.MsgWaiting? MapNetwork.NSAddrFromSpec
               MapNetwork.Process MapNetwork.ProcessUnsentMessages MapNetwork.PushStatusMsg
               MapNetwork.RemoveTraceFilter MapNetwork.ResetGrafcetProcess MapNetwork.ResetMapProcess
               MapNetwork.SendMessage)
        (FNS ADDASSOC FISMapGetAssocNum FISNetworkProcess MapNetworkCloseFn MapNetworkErrorFn
             MapNetworkInputFn \CloseMap)
        (PROP GLOBALVAR MapAnimationUnit)
        (VARS FISDoneMsgString FISMapAnimationIncrement FISMapExternalAtomLst FISSentMsgString
              GEMSCommandInterpretations YesAtoms)
        (INITVARS (MapNetwork)
               (MapNetworkStatusMsgTraceLimit 30))
        (EXPORT (GLOBALVARS GEMSCommandInterpretations FISMapAnimationIncrement FISDoneMsgString
                       FISSentMsgString MapNetwork MapNetworkStatusMsgTraceLimit YesAtoms)
               (RECORDS MAPAssociation MAPManualMsg MAPRegistration)
               (MACROS YesAtom? ExternalMapAssoc? LocalMapProcess?))
        (COMS (* Hooks into NetworkStatus Browser)
              (INITVARS (MapNetworkStatus))
              (EXPORT (GLOBALVARS MapNetworkStatus))
              (FNS AVUpdateAssoc AVUpdateMisc AVUpdateReg NetworkStatus.StatusOn?))
        (INSTANCES FISDefaultMapAssociationSpec)
        (COMS (VARS MapAssociationFolderElementAllFields MapAssociationFolderElementSomeFields (
                                                                   MapAssociationFolderElementFields

                                                               MapAssociationFolderElementAllFields
                                                                              )))
        (PROP FILETYPE MAPNETWORK)))

(DECLARE%: DONTCOPY

(PUTPROPS MAPNETWORK MAKEFILE-ENVIRONMENT (:PACKAGE "IL" :READTABLE "INTERLISP" :BASE 10))
)

(DEFCLASS ExamineMapAssociationContext (MetaClass Class Edited%:
                                                          (* mcf%: "10-Oct-86 10:16")
                                             doc "This is the default metaClass for all classes")
       (Supers ExamineFormContext)
       (ClassVariables (AttachHorizMenu T)
              (MenuName "View MAP Association")
              (MenuDoc "View this association in detail")
              (Prototype #,($& ExamineMapAssociationContext (JUXO.kga%:.iO< . 12))))
       (InstanceVariables (object NIL VR #,($C MapAssociationFolderElement))))
```

```
(DEFCLASS ExamineMapAssociationsFolderContext (MetaClass Class Edited%:
                                                          (* mcf%: "10-Oct-86 10:36")
                                             doc "This is the default metaClass for all classes")
       (Supers ExamineFolderContentsContext)
       (ClassVariables (AttachHorizMenu T)
              (Browser #,($C MapAssociationsFolderBrowser))
              (MenuName "View MAP Associations")
              (MenuDoc "View communication properties of the MAP Associations")
              (LinkedContexts NIL)
              (SubContextTypes (#,($C ExamineFormContext)))
              (Prototype #,($& ExamineMapAssociationsFolderContext (JUXO.kga%:.iO< . 13))))
       (InstanceVariables (object NIL VR #,($C MapAssociationFolder))))

(DEFCLASS ExamineMapNetworkContext (MetaClass Class Edited%:  (* mcf%: "24-Sep-86 18:55")
                                    doc "This is the default metaClass for all classes")
       (Supers ExamineFormContext)
       (ClassVariables (AttachHorizMenu T))
       (InstanceVariables (object NIL VR #,($C MapNetwork))))
```

```
(DEFCLASS MMFSTraceContext (MetaClass Class Edited%:          (* TAL "12-Oct-85 21:12")
                                   doc "This is the default metaClass for all classes")
        (Supers DefaultContext)
        (ClassVariables (SubContexts NIL)
               (LinkedContexts NIL)
               (Browser #,($C TraceFolderBrowser))
               (AttachHorizMenu T))
        (InstanceVariables (object NIL VR #,($C MMFSTraceFolder))
               (filter NIL)))

(DEFCLASS MMFSTraceFilter (MetaClass Class Edited%:          , Edited 2-Aug-88 17:30 by mcf
                                   doc "This is the default metaClass for all classes")
        (Supers ComputerObject)
        (ClassVariables (TitleIVs (source destination either)
                               doc "fields used by specialized construct title"))
        (InstanceVariables (source NIL Title " (Source)" doc "trace must match source on sending")
               (destination NIL Title " (Destination)" doc "trace must match destination on receiving")
               (either NIL Title " (Both)" doc "trace can match either destination or source")
               (correspondent NIL doc "the other party in the communication")
               (traceBrowser NIL)
               (traceName NIL)
               (filterProgs NIL doc "AList mapping main program to src or dst names within it")))

(DEFCLASS MMSMessage (MetaClass Class Edited%:          (* TAL " 4-May-87 12:31")
                           doc "This is the default metaClass for all classes")
        (Supers MapMessage))

(DEFCLASS MapAssociationFolder (MetaClass Class Edited%:          (* TAL "27-Jan-88 16:20")
                                   doc "This is the default metaClass for all classes")
        (Supers Folder)
        (ClassVariables (PrintName "MAP Associations")
               (SortCompareFn NIL)
               (AllowDeletion T doc "default doesn't permit deletion"))
        (InstanceVariables (elements NIL VR #,($C MapAssociationFolderElement))))

(DEFCLASS MapAssociationFolderElement (MetaClass Class Edited%:
                                                          ; Edited 27-Jun-88 17:41 by lipkis
                                        doc "This is the default metaClass for all classes")
        (Supers ComputerObject)
        (ClassVariables (PrintName "MAP Association")
               (MsgClasses ((MMFS #,($C MMFSMessage))
                            (RAW #,($C MapMessage))
                            (T #,($C MMFSMessage)))
                      doc "Used by MsgClass method")
               (SummaryFields #,($A (PROGN MapAssociationFolderElementFields) EveryFetch NoUpdatePermitted))
               (DisplayFields #,($A (PROGN MapAssociationFolderElementFields) EveryFetch NoUpdatePermitted))
               (Prototype #,($& MapAssociationFolderElement (|NXVO.L2[:.gS?| . 7))))
        (InstanceVariables (local NIL heading Local TeditType Atom doc "MAP process name on this end")
               (remote NIL heading Remote TeditType Atom doc "MAP process name on remote end")
               (applicationContext NIL heading Context TeditType String doc "process context, whatever that
                      is")
               (localAKA NIL heading "Local-AKA" TeditType Atom doc "The externally visible name of the local
                      process")
               (connectionVariable NIL heading "C-Variable" TeditType Atom doc "name of the variable used to
                      hold the result of the call to Association")
               (externalFlg NIL heading External? TeditType Atom doc "If Yes, then remote process is
                      external")
               (msgType MMFS heading "Msg-Type" TeditType Atom doc "specifies type of messages sent over this
                      association, as specified in MsgClasses CV")
               (autoAssoc NIL heading "Auto?" TeditType Atom doc "NYI")
               (gateway NIL heading "Gtwy" TeditType Atom doc "Alternate gateway addr for this assoc/reg")
               (netType MAP heading "Net" TeditType Atom doc "NetworkType (MAP, IMS, etc.)")))
```

Page 3

```
(DEFCLASS MapAssociationsFolderBrowser (MetaClass Class Edited%:
                                                          (* mcf%: " 9-Oct-86 14:01")
                                        doc "This is the default metaClass for all classes")
        (Supers GrafcetFolderBrowser)
        (ClassVariables (HorizMethodItems
           #,($A ((Add AddAssociation "Create and edit a new association")) UnionSuperValue NoUpdatePermitted)
                       )))

(DEFCLASS MapMessage (MetaClass Class Edited%:          (* TAL " 4-May-87 12:35")
                           doc "All actual messages transmitted in the system are instances of this.
                           Specialized for particular protocols (MMFS, MMS)")
        (Supers CommunicationObject)
        (InstanceVariables (source NIL heading Src)
               (destination NIL heading Dst)
               (sender NIL doc "the object that sent this message (for now, a step)")
               (receiver NIL doc "the object that received this message (for now, a step)")
               (sendTime NIL doc "Timestamp when sent")
               (receiveTime NIL doc "Timestamp when received")
               (asciiHex #,($A GenerateAsciiHex FFSendSelf ReplaceMe) DontSave Any doc "Ascii representation
                      of rawData")
               (rawData NIL DontSave Any doc "Lisp string containing raw bytes of message")))

(DEFCLASS MapNetwork (MetaClass Class Edited%:          (* TAL "21-Jan-88 12:00")
                           doc "This is the default metaClass for all classes")
        (Supers ComputerObject)
        (ClassVariables (PrintName "Map Network Configuration")
               (DisplayFields (defaultGateway mapTimeout)))
```

```
(InstanceVariables (networkEvent NIL doc "An EVENT posted when the network process should do
                           something")
        (networkMonitor NIL doc "A MONITORLOCK to protect accesses to fields in the network")
        (connectionAList NIL doc "AList mapping connection name (<DEST>) to a MMFSReceiveStep")
        (unsentMessages NIL doc "List of messages not yet in transit")
        (inTransmission NIL doc "messages being transmitted by animation")
        (transmittedMsgs NIL doc "AList of receiver name and messages that have been transmitted to
              it")
        (traceFilters NIL)
        (defaultGateway #,($A 4979 NIL AVUpdateMisc) heading "UB Address" TeditType Atom)
        (mapTimeout #,($A 60000 NIL AVUpdateMisc) heading "Map Timeout" TeditType Read)
        (connections NIL doc "GEMS connections currently open")
        (registrations #,($A NIL NIL AVUpdateReg) doc "List of current registrations")
        (associations #,($A NIL NIL AVUpdateAssoc) doc "current associations")
        (nextAssociationNumber #,($A 1 FISMapGetAssocNum NIL) doc "get next available association
              number")
        (manualMessages NIL doc "queue of messages destined for the manual MMFS interface")
        (statusMsgs NIL doc "queue of status messages")
        (statusMsgCount NIL doc "count of status messages")
        (statusUpdateFlg NIL doc "update status if T")))

(\BatchMethodDefs)

(Method ((MMFSTraceContext Exit) self AbortFlg)          TAL 12-Oct-85 19:05
   "Specialization"
   (_ self StopTrace)
   (_Super self Exit AbortFlg))

(Method ((MMFSTraceContext FindObject) self suppliedObject)
                                                          TAL 12-Oct-85 21:14
   "Specialization"
   (LET (folder)
     (_@ %:filter suppliedObject)
     (SETQ folder (_ ($ MMFSTraceFolder)
                     New))
     (_@ folder %:printName (CONCAT (@ suppliedObject %:traceName)
                                    " Message Trace"))
     folder))

(Method ((MMFSTraceContext StartTrace) self)             TAL 12-Oct-85 18:13
   "New method template"
   (LET ((filter (@ %:filter)))
     (_@ filter %:traceBrowser (@ %:myBrowser))
     (_ MapNetwork AddTraceFilter filter)))

(Method ((MMFSTraceContext StopTrace) self)              TAL 12-Oct-85 18:12
   "New method template"
   (_ MapNetwork RemoveTraceFilter (@ %:filter)))
```

```
(Method ((MMFSTraceFilter SameFilter?) self filter)  mct: 18-Dec-86 12:34
   "Test for equality of filters"
   (AND (EQUAL (@ %:source)
               (@ filter %:source))
        (EQUAL (@ %:destination)
               (@ filter %:destination))
        (EQUAL (@ %:either)
               (@ filter %:either))
        (EQUAL (@ %:correspondent)
               (@ filter %:correspondent))))

(Method ((MapAssociationFolderElement MsgClass) self msgClass)
                                                          TAL 6-Mar-86 19:56
   "New method template"
   (bind (type _ (OR msgClass (@ %:msgType))) for x in (@ |::MsgClasses|)
      thereis (OR (STRING-EQUAL type (CAR x))
                  (EQ T (CAR x)))
      thenyield (CADR x)))

(Method ((MapAssociationsFolderBrowser AddAssociation) self)
                                                          mct: 10-Oct-86 10:43
   "New method template"
   (_ (@ %:context)
      SpawnLinkedContext
      (DEFERREDCONSTANT ($ ExamineMapAssociationContext))))

(Method ((MapMessage FromProgram?) self program)    TAL 4-May-87 12:19
   "New method template"
   [LET ((sender (@ %:sender)))
     (COND
        (sender (_ sender InProgram? program))
        (T (EQ (@ %:source)
               (_ program FindProcessName)])
```

```
(Method ((MapMessage GenerateAsciiHex) self)        TAL 4-May-87 12.27
   "New method template"
   (HexToAsciiString (@ %:rawData)))

(Method ((MapMessage MatchFilter?) self filter src/dst)
                                                    TAL 8-May-87 12 14

   Tracing only works for MMFS messages, so for now we suppress it in the general case by having this always return NIL
   "(LET (s/d (corres (@ filter :correspondent))) (SELECTQ src/dst (Source (AND (OR (NOT corres) (FMEMB (@
   :destination) corres)) (AND (SETQ s/d (@ :source)) (FMEMB s/d (OR (@ filter :source) (@ filter
   :either)))))) (Destination (AND (OR (NOT corres) (FMEMB (@ :source) corres)) (AND (SETQ s/d (@
   :destination)) (FMEMB s/d (OR (@ filter :destination) (@ filter :either)))))) NIL))"
   NIL)

(Method ((MapNetwork AddTraceFilter) self filter)   TAL 12-Oct 85 18 06
   "New method template"
   (push (@ self traceFilters)
         filter)
   (bind ctx for x in (@ filter filterProgs) when [AND (ObjectExists? (CAR x))
                                                       (SETQ ctx (ObjectExists? (@ (CAR x)
                                                                                   processContext)]
      do (_ ctx AddingTraceFilter filter)))

(Method ((MapNetwork CancelListen) self receiverName receiver)
                                                    TAL 1-Sep-85 03.40
   "cancels a Listen"
   (PROG [(entry (FASSOC receiverName (@ %:connectionAList)]
         [COND
            ((NEQ (CDR entry)
                  receiver)
             (SimulationBreak NIL NIL (LIST "Attempt to disconnect a different " receiverName " listener")
                    '((Abort (RETURN))
                      (Continue NIL]
         (change (@ %:connectionAList)
                 (DREMOVE entry DATUM))))
                                                                                        Page 5

(Method ((MapNetwork DeliverMessage) self msg)      TAL 10-Oct-85 20:00
                                                    Actually delivers a message to a receiver. Not to be called by users
   "Though :receiveTime is set here, it may be set again by the receiver when he actually processes the
   message"
   (_@ msg %:receiveTime FISGlobalClock)
   (ADDASSOC (@ msg %:destination)
          msg
          (@ %:transmittedMsgs)
          NIL))

(Method ((MapNetwork FillInReceiver) self msg)      TAL 4-May-87 10:57
   "Fills in the :receiver field if necessary"
   [COND
      ((@ msg %:receiver))
      (T (_@ msg %:receiver (CDR (FASSOC (@ msg %:destination)
                                        (@ %:connectionAList)))))])

(Method ((MapNetwork FindMapApplication) self LocalName RemoteName Obj)
                                                    mcf: 15-Oct-86 07 49
   "New method template"
   (LET (element)
     (COND
        ([AND LocalName RemoteName (ObjectExists? Obj)
              (_ Obj InstOf 'GrafcetMainProgram)
              (SETQ element (@ Obj %:mapAssociations))
              (SETQ element (@ element %:elements))
              (SETQ element (for e in element thereis (AND (EQ LocalName (@ e %:local))
                                                          (EQ RemoteName (@ e %:remote))]
         (@ element %:applicationContext))
        (T ""))))

(Method ((MapNetwork FindMapAssociationSpec) self obj localName remoteName noDefault)
                                                    TAL 21-Jan-88 14 26
   "Returns the MapAssociationFolderElement matching localName and remoteName. If remoteName is not supplied,
   returns a list of all elements matching localName"
   [LET (folder)
     (COND
        [[OR (NOT (ObjectExists? obj))
             (NOT (_ obj InstOf 'GrafcetMainProgram))
             (NULL (SETQ folder (@ obj %:mapAssociations)]
         (COND
            (noDefault NIL)
            (remoteName ($ FISDefaultMapAssociationSpec))
            (T (LIST ($ FISDefaultMapAssociationSpec]
        [(AND localName remoteName)
         (COND
            [(for e in (@ folder %:elements) thereis (AND (EQ remoteName (@ e %:remote))
                                                          (EQ localName (@ e %:local)]
            (noDefault NIL)
            (T ($ FISDefaultMapAssociationSpec]
        (localName (COND
                      ((for e in (@ folder %:elements) when (EQ localName (@ e %:local)) collect e))
                      (noDefault NIL)
                      (T (LIST ($ FISDefaultMapAssociationSpec])
```

```
(Method ((MapNetwork FindTraceFilter) self filter)    mcf: 18-Dec-85 12.34
  "Return any match to currently installed filters"
  (for currentFilter in (@ %:traceFilters) thereis (_ filter SameFilter? currentFilter)))
```

```
(Method ((MapNetwork GetMessage) self destination receiver source)
                                                    TAL 11-Sep-87 16.09
   "Return the next message for the destination, if any. If source is specified, only considers msgs from
   him"
   (LET ((queue (FASSOC destination (@ %:transmittedMsgs)))
         msg)
     [COND
        [source (for tail on queue while (CDR tail) thereis (EQ source (@ (CADR tail)
                                                                         %:source))
                    thenyield (SETQ msg (pop (CDR tail]
        ((CDR queue)
         (SETQ msg (pop (CDR queue]
     (COND
        (msg (_@ msg %:receiver receiver)
             (for filter in (@ %:traceFilters) when (_ msg MatchFilter? filter 'Destination)
                do (_ (@ filter %:traceBrowser)
                      AddToTrace msg))
             msg))))
```

Page 6

```
(Method ((MapNetwork InitializeTraceBrowsers) self Program)
                                                    mcf: 14-Jul-86 11.19
   "New method template"
   [LET ((clst (@ %:connectionAList)))
     (for fil in (@ %:traceFilters) do (bind addr addrlst for i in '(source destination either correspondent)
                                         when (AND (SETQ addr (@ fil %:!\i))
                                                   (NOT (FMEMB addr addrlst)))
                                         do (push addrlst addr)
                                            (COND
                                               ((SETQ addr (CDR (FASSOC addr clst)))
                                                (AND (_ addr InProgram? Program)
                                                     (_ (@ fil %:traceBrowser)
                                                        ClearFolder)])
```

```
(Method ((MapNetwork Listen) self receiverName receiver)
                                                    TAL 7-Mar-86 19:11
   "Annouce the presence of a server listening for messages. IV"
   [PROG (oldReceiver)
         [COND
            ((AND [SETQ oldReceiver (CDR (FASSOC receiverName (@ %:connectionAList)]
                  (NEQ oldReceiver receiver))
             (SimulationBreak NIL NIL (LIST "Duplicate " receiverName " receiver")
                    '((Abort (RETURN))
                      (Continue NIL]
         (COND
            ((@ %:connectionAList)
             (PUTASSOC receiverName receiver (@ %:connectionAList)))
            (T (_@ %:connectionAList (CONS (CONS receiverName receiver))))])
```

```
(Method ((MapNetwork MapAbort) self Id)           TAL 21-Jan-88 12.10
                                                  Abort external associations
   "This needs to abort the other side if not external"
   [LET [(msg FISDoneMsgString)
         (association (FASSOC Id (@ %:associations)]
     (COND
        (association (change (@ %:associations)
                             (SafeDRemove association DATUM))
               (AND (ExternalMapAssoc? association)
                    (GEMS.Abort (fetch MAPAssocChan of association))
                    (SETQ msg FISSentMsgString))
               (_ self PushStatusMsg (fetch MAPAssocLocal of association)
                      (fetch MAPAssocRemote of association)
                      'GEMSABRT msg T)])
```

```
(Method ((MapNetwork MapAssociate) self Local Remote Application DontWaitFlg Gateway MsgClassHack)
                                                    TAL 6-Mar-88 19.58
   "New method template"
   (LET ((local (MKATOM Local))
         (remote (MKATOM Remote))
         chan id reg1 reg2 localObj remoteObj myAsc hisAsc msg assSpec rVal conn)
     [SETQ rVal (COND
                   ([NOT (SETQ reg1 (FASSOC local (@ %:registrations)]
                                    (* If not reg, return neg assoc id that will always look like failure)
                    (SETQ msg (CONCAT local " not registered"))
                    -1)
                   ([SETQ myAsc (for a in (@ %:associations) thereis (AND (EQ local (fetch MAPAssocLocal
                                                                                   of a))
                                                                      (EQ remote (fetch MAPAssocRemote
                                                                                    of a))
                                                                      (SETQ id (fetch MAPAssocID
                                                                                  of a]
```

```
(COND
   ((OR (EQ 'Internal (SETQ chan (fetch MAPAssocChan of myAsc)))
        (NEQ 'Closed (fetch GEMSChanState of chan)))
    (SETQ msg "already exists")
    id)
   (T (cdremove (@ %:associations)
             myAsc)
      -1)))
(T (SETQ assSpec (_ self FindMapAssociationSpec (SETQ localObj (fetch MAPEventObject
                                                                          of reg1))
                        local remote))
   (_ self MapClearQueue local remote)
   (SETQ myAsc (create MAPAssociation
                       MAPAssocID _ (SETQ id (@ %:nextAssociationNumber))
                       MAPAssocNames _ (LIST local remote)
                       MAPAssocLocalAKA _ (@ assSpec %:localAKA)
                       MAPAssocEventObject _ localObj
                       MAPAssocMsgClass _ (_ assSpec MsgClass MsgClassHack)))
   (COND
      ((AND (NOT DesignerOnlyFlg)
            (YesAtom? (@ assSpec %:externalFlg)))
       (COND
          [(AND [SETQ conn (_ self MapGetConnection (OR Gateway (@ assSpec %:gateway)))]
                (SETQ chan (GEMS.Associate (OR (@ assSpec %:localAKA)
                                               local)
                                remote
                                (OR Application (@ assSpec %:applicationContext))
                                (FUNCTION MapNetworkInputFn)
                                conn)))
           (SETQ msg FISSentMsgString)
           (replace MAPAssocChan of myAsc with chan)
           (push (@ %:associations)
                 myAsc)
           (COND
              (DontWaitFlg id)
              (T (_ self PushStatusMsg local remote 'GEMSASSOC msg T)
                 (during (@ %:mapTimeout) timerUnits 'MILLISECONDS
                    until (FMEMB (fetch GEMSChanState of chan)
                                 '(Open Closed))
                    do (BLOCK 100))
                 (SELECTQ (fetch GEMSChanState of chan)
                      (Open (SETQ msg FISDoneMsgString)
                            id)
                      (Closed (cdremove (@ %:associations)
                                        myAsc)
                              (SETQ msg "failed")
                              -1)
                      (PROGN (cdremove (@ %:associations)
                                       myAsc)
                             (GEMS.Abort chan)
                             (SETQ msg "aborted")
                             -1]
          (T                                          (* Couldn't talk to gateway)
             (SETQ msg "failed")
             -1)))
      ((SETQ reg2 (FASSOC remote (@ %:registrations)))
       (SETQ msg FISDoneMsgString)
       (SETQ remoteObj (fetch MAPEventObject of reg2))
       (replace MAPAssocChan of myAsc with 'Internal)
       (push (@ %:associations)
             myAsc)
       (_ self MapClearQueue remote local)
       (SETQ hisAsc (create MAPAssociation
                            MAPAssocID _ (@ %:nextAssociationNumber)
                            MAPAssocNames _ (LIST remote local)
                            MAPAssocChan _ 'Internal
                            MAPAssocEventObject _ remoteObj
                            MAPAssocMsgClass _ (_ assSpec MsgClass MsgClassHack)))
       (push (@ %:associations)
             hisAsc)
       (COND
          ((ObjectExists? remoteObj)
           (_ remoteObj MessageReceive (fetch MAPAssocID of hisAsc)
                  'Association remote local)))
       id)
      (T                                              (* Remote not registered)
         (SETQ msg "failed")
         -1]
(_ self PushStatusMsg local remote 'GEMSASSOC msg T)
rVal))
```

Page 7

(Method ((MapNetwork MapClearQueue) self Local Remote)
mcf: 14-Oct-86 09 35

```
"New method template"
[LET [(queue (FASSOC Local (@ %:transmittedMsgs))]
  (COND
     ((AND Local Remote)                              (* concerned with associations here)
      (AND (CDR queue)
           (change (CDR queue)
                   (for msg in DATUM unless (AND (EQ Local (@ msg %:destination))
                                                 (EQ Remote (@ msg %:source)))
                      collect msg)))
      (change (@ %:unsentMessages)
              (for msg in DATUM unless (AND (EQ Local (@ msg %:source))
                                            (EQ Remote (@ msg %:destination)))
                 collect msg)))
     (Local                                           (* concerned with registrations here)
```

```
            (AND (CDR queue)
                 (RPLACD queue))
            (change (@ %:unsentMessages)
                    (for msg in DATUM unless (EQ Local (@ msg %:source)) collect msg])
```

(Method ((MapNetwork MapConnected?) self Id) . TAL 14-Oct-86 21:43

```
  "current states are 0 -> pending, 1 -> Open, -1 -> Closed - assuming error"
  (LET (associate)
    (COND
      ((AND (NUMBERP Id)
            (MINUSP Id))                    (* Associate returns neg. id if local party not registered)
       -1)
      ((SETQ associate (FASSOC Id (@ %:associations)))
       (COND
         ((ExternalMapAssoc? associate)
          (SELECTQ (fetch GEMSChanState of (fetch MAPAssocChan of associate))
                   (Open 1)
                   (Closed -1)
                   0))
         (T 1)))
      (T 0))))
```

(Method ((MapNetwork MapDeRegister) self Name) . TAL 21-Jan-88 12:22

```
  "De-Register from the map network"
  [LET (cReg (msg FISDoneMsgString)
             (name (MKATOM Name)))
    (COND
      ((SETQ cReg (FASSOC name (@ %:registrations)))
       (change (@ %:registrations)
               (SafeDRemove cReg DATUM))
       (AND (ExternalMapAssoc? cReg)
            (GEMS.Deregister (fetch MAPChannel of cReg))
            (SETQ msg FISSentMsgString))
       (_ self MapClearQueue (fetch MAPName of cReg))
       (_ self PushStatusMsg name NIL 'GEMSDEREG msg T)])
```

(Method ((MapNetwork MapGetConnection) self Gateway) . TAL 23-Jan-88 16:38

```
  "Return the GEMS connection to the specified gateway, or open one if none"
  [LET ([gate (_ self NSAddrFromSpec (OR Gateway (@ %:defaultGateway)))]
        conn ent)
    (COND
      ((AND [SETQ conn (CDR (FASSOC gate (@ %:connections)]
            (GEMS.ConnectionOpen? conn))
       conn)
      (T (WITH.MONITOR (@ %:networkMonitor)
           (COND
             ((AND [SETQ conn (CDR (SETQ ent (FASSOC gate (@ %:connections)]
                   (GEMS.ConnectionOpen? conn))
              conn)
             ([SETQ conn (GEMS.Open gate '(CLOSEFN MapNetworkCloseFn ERRORFN MapNetworkErrorFn]
              [COND
                (ent (change (CDR ent)
                             conn))
                (T (push (@ %:connections)
                         (CONS gate conn]
              conn)))])
```

(Method ((MapNetwork MapNetworkCloseFn) self Conn Msg) . TAL 21-Jan-88 13.40

```
  "New method template"
  (AND Msg (PROMPTPRINT Msg))
  (for x in (@ %:connections) when (EQ Conn (CDR x)) do (change (CDR x)
                                                                 NIL))
```

.. If we paid attention to the register abort sent by GEMS when connection closes, we wouldn't have to do following

```
  (bind obj for reg in (@ %:registrations) when (ObjectExists? (SETQ obj (fetch MAPEventObject of reg)))
     do (_ obj MessageReceive NIL 'Close (fetch MAPName of reg))))
```

(Method ((MapNetwork MapNetworkErrorFn) self Conn Chan Msg Warning) . mcf: 1-Dec-86 17:39.

```
  "New method template"
  (COND
    ((OR (NOT Warning)
         (EQ Warning 'TIMEOUT)
         FISDebugFlg)                       (* (printout SavoirPROMPTWINDOW TAB0 0 Msg T))
     (_ self PushStatusMsg (AND Chan (fetch GEMSLocalID of Chan))
              (AND Chan (fetch GEMSRemoteID of Chan))
              NIL Msg T))))
```

(Method ((MapNetwork MapNetworkInputFn) self Chan Msg) . TAL 21-Jan-88 14:49

```
  "New method template"
  (LET [associate cmd obj id regs msg assSpec (updateFlg T)
              (local (MKATOM (fetch GEMSLocalID of Chan)))
              (remote (MKATOM (fetch GEMSRemoteID of Chan]
```

```
(SELECTQ (fetch GEMSSubCmd of Msg)
    ((GEMSReq)                                   (* any other value represents a confirmation or error)
        [COND
          ([SETQ associate (for a in (@ %:associations)
                              thereis (AND (EQ (fetch MAPAssocChan of a)
                                               Chan)
                                           (EQ local (fetch MAPAssocLocal of a))
                                           (EQ remote (fetch MAPAssocRemote of a]
           (SETQ obj (fetch MAPAssocEventObject of associate))
           (SETQ id (fetch MAPAssocID of associate]
        [COND
          ((SELECTQ (SETQ cmd (fetch GEMSCmd of Msg))
               ((GEMSASSIND)
                   [COND
                     ([AND (NOT associate)
                           (SETQ regs (FASSOC local (@ %:registrations)]
                      (_ self MapClearQueue local remote)
                      (SETQ obj (fetch MAPEventObject of regs))
                      (SETQ assSpec (_ self FindMapAssociationSpec obj local remote))
                      (SETQ id (@ %:nextAssociationNumber))
                      (push (@ %:associations)
                            (create MAPAssociation
                                    MAPAssocID _ id
                                    MAPAssocNames _ (LIST local remote)
                                    MAPAssocChan _ Chan
                                    MAPAssocEventObject _ obj
                                    MAPAssocMsgClass _ (_ assSpec MsgClass)))
                      (SETQ cmd 'Association])
               ((GEMSABRTIND GEMSRELIND)
                   [COND
                     (associate (cdremove (@ %:associations)
                                          associate)
                           (SETQ cmd (SELECTQ cmd
                                         (GEMSABRTIND 'Abort)
                                         (GEMSRELIND 'Release)
                                         NIL])
               (GEMSRECV (SETQ updateFlg NIL)
                         (LET ((msg (_ (COND
                                         (associate (fetch MAPAssocMsgClass of associate))
                                         (T ($ MMFSMessage)))
                                       New)))
                           (_@ msg %:source remote)
                           (_@ msg %:destination local)
                           (_@ msg %:rawData (fetch GEMSData of Msg))
                           (_ self DeliverMessage msg)
                           (SETQ cmd 'Receive)))
               NIL)
           (COND
             ((ObjectExists? obj)
              (replace GEMSUserData of Msg
                 with (create MAPManualMsg
                              MAPMMId _ id
                              MAPMMCmd _ cmd
                              MAPMMLocal _ local
                              MAPMMRemote _ remote
                              MAPMMObject _ obj))
              (push (@ %:manualMessages)
                    Msg])
    NIL)
(COND
  ([SELECTQ (fetch GEMSResult of Msg)
        (0                                       (* No error)
          (AND (NOT (FMEMB (fetch GEMSCmd of Msg)
                           '(GEMSSEND GEMSRECV]
```

Page 10

```
                (SETQ msg "received")))
      (SETQ msg (CONCAT "ERROR: " (OR (STRINGP (fetch GEMSData of Msg))
                                      (CONCAT "Code " (fetch GEMSResult of Msg]
   (_ self PushStatusMsg local remote (fetch GEMSCmd of Msg)
         msg updateFlg)))
(NOTIFY.EVENT (@ %:networkEvent))))
```

```
(Method ((MapNetwork MapRegister) self Name Obj DontWaitFlg Gateway)
                                                      . TAL 27-Jan-88 16:17
  "Register name if not already registered"
  (LET (chan conn reg rVal assSpec (msg "failed")
          (name (MKATOM Name)))
    [COND
      ((SETQ reg (FASSOC name (@ %:registrations)))
       (COND
         ((OR (LocalMapProcess? reg)
              (EQ (fetch GEMSChanState of (fetch MAPChannel of reg))
                  'Open))
          (SETQ msg "already exists"))
         (T (cdremove (@ %:registrations)
                   reg)
          . (SETQ reg NIL]
    (SETQ assSpec (_ self FindMapAssociationSpec Obj name NIL))
    (SETQ assSpec (OR (for x in assSpec thereis (YesAtom? (@ x %:externalFlg)))
                      (CAR assSpec)))
```

```
(SETQ rVal (COND
             (reg (SETQ msg "already exists")
                  T)
             [(COND
                ([OR DesignerOnlyFlg (NOT (YesAtom? (@ assSpec %:externalFlg)]
                 (SETQ chan 'Internal)
                 (SETQ msg FISDoneMsgString)
                 (push (@ %:registrations)
                       (create MAPRegistration
                               MAPName _ name
                               MAPChannel _ chan
                               MAPEventObject _ Obj)))
                ((AND [SETQ conn (_ self MapGetConnection (OR Gateway (@ assSpec %:gateway)))]
                      (SETQ chan (GEMS.Register name (FUNCTION MapNetworkInputFn)
                                                conn)))
                 (SETQ msg FISSentMsgString)
                 (SETQ reg (create MAPRegistration
                                   MAPName _ name
                                   MAPChannel _ chan
                                   MAPEventObject _ Obj))
                 (push (@ %:registrations)
                       reg)
                 (COND
                   (DontWaitFlg reg)
                   (T (_ self PushStatusMsg name NIL 'GEMSREG msg T)
                      (during (@ %:mapTimeout) timerUnits 'MILLISECONDS
                         until (FMEMB (fetch GEMSChanState of chan)
                                      '(Reg Closed DeregFail))
                         do (BLOCK 100))
                      (SELECTQ (fetch GEMSChanState of chan)
                         (Reg (SETQ msg FISDoneMsgString)
                              reg)
                         (PROGN (cdremove (@ %:registrations)
                                          reg)
                                (SETQ msg "failed")
                                NIL]
             (T (_ self MapNetworkErrorFn conn chan (CONCAT "Registration failed for " name))
                NIL)))
  (_ self PushStatusMsg name NIL 'GEMSREG msg T)
  rVal))
```

(Method ((MapNetwork MapRegistered?) self Name) , mcf: 23-Oct-86 09:53

```
  "Check if name is currently registered"
  (LET (reg)
    (COND
      [(SETQ reg (FASSOC Name (@ %:registrations)))
       (COND
         ((LocalMapProcess? reg)
          1)
         (T (SELECTQ (fetch GEMSChanState of (fetch MAPChannel of reg))
                (Reg 1)
                ((Closed DeregFail)
                    -1)
                0]
      (T -1))))
```

(Method ((MapNetwork MapRegistrations) self) , mcf: 26-Sep-86 09:43

```
  "Return a list of names of currently registered processes"
  (for reg in (@ %:registrations) collect (fetch MAPName of reg)))
```

(Method ((MapNetwork MapRelease) self Id DontWaitFlg) , TAL 21-Jan-88 14:36

```
  "New method template"
  [LET [chan (msg FISDoneMsgString)
             (associate (FASSOC Id (@ %:associations)]
    (COND
      (associate (change (@ %:associations)
                         (SafeDRemove associate DATUM))
           [COND
             [[AND (ExternalMapAssoc? associate)
                   (GEMS.Release (SETQ chan (fetch MAPAssocChan of associate]
              (SETQ msg FISSentMsgString)
              (COND
                ((NOT DontWaitFlg)
                 (_ self PushStatusMsg (fetch MAPAssocLocal of associate)
                        (fetch MAPAssocRemote of associate)
                        'GEMSREL msg T)
                 (during (@ %:mapTimeout) timerUnits 'MILLISECONDS
                    until (EQ (fetch GEMSChanState of chan)
                              'Closed)
                    do (BLOCK 100))
                 (COND
                   ((NEQ (fetch GEMSChanState of chan)
                         'Closed)
                    (SETQ msg "aborted")
                    (GEMS.Abort chan))
                   (T (SETQ msg FISDoneMsgString]
```

```
([SETQ associate (for x in (@ %:associations)
                      thereis (AND (EQ (fetch MAPAssocLocal of x)
                                       (fetch MAPAssocRemote of associate))
                                   (EQ (fetch MAPAssocRemote of x)
                                       (fetch MAPAssocLocal of associate]
  (OR (ExternalMapAssoc? associate)
      (change (@ %:associations)
              (SafeDRemove associate DATUM]
  (_ self MapClearQueue (fetch MAPAssocLocal of associate)
      (fetch MAPAssocRemote of associate))
  (_ self PushStatusMsg (fetch MAPAssocLocal of associate)
      (fetch MAPAssocRemote of associate)
      'GEMSREL msg T)])
```

```
(Method ((MapNetwork MapReset) self)                    TAL 21-Jan-88 14:41
  "New method template"
  (LET NIL
    (WITH.MONITOR (@ %:networkMonitor)
       [for x in (@ %:connections) do (COND
                                        ((AND (CDR x)
                                              (GEMS.ConnectionOpen? (CDR x)))
                                         (GEMS.Close (CDR x))
                                         (change (CDR x)
                                                 NIL])     (* (_@ MapNetwork %:connections NotSetValue))
    (_@ MapNetwork %:registrations NotSetValue)
    (_@ MapNetwork %:associations NotSetValue)))
```

```
(Method ((MapNetwork MapRespond) self Local Remote Application DontWaitFlg) "Method
  documentation"
  [LET ((local (MKATOM Local))
        (remote (MKATOM Remote))
        chan reg ass assSpec)
    (COND
      ([NOT (SETQ reg (FASSOC local (@ registrations)]      . If not reg, return assoc id that will always look like failure
       -1)
      ((for a in (@ associations) do [COND
                                       ((AND (EQ local (fetch MAPAssocLocal of a))
                                             (EQ remote (fetch MAPAssocRemote of a)))
                                                             . Found existing assoc
                                        (COND
                                          ((AND (NEQ (SETQ chan (fetch MAPAssocChan of a))
                                                     'Internal)
                                                (EQ (fetch GEMSChanState of chan)
                                                    'Closed))
                                           .. But it's closed. Delete it and keep looking. Does this happen?
```

Page 12

```
                                           (cdremove (@ associations)
                                                     a))
                                          (T                 . If already open return existing id.
                                            (RETURN (fetch MAPAssocID of a]
          finally                                            ; Didn't find one, fall through
                  (RETURN NIL)))
      (T (SETQ assSpec (_ self FindMapAssociationSpec (fetch MAPEventObject of reg)
                           local remote))
         (COND
           ((AND (NOT DesignerOnlyFlg)
                 (YesAtom? (@ assSpec externalFlg))
                 (EQ (U-CASE (@ assSpec netType))
                     'IMS))                                  . If this is an external IMS connection, respond must do associate
            (_ self MapAssociate local remote Application DontWaitFlg NIL NIL))
           (T                                                . Else return 0 which looks non open and will get replaced with actual
                                                             . id when assocind is received
            ])
```

```
(Method ((MapNetwork MsgWaiting?) self destination source)
                                                             . TAL 10-Sep-87 15:53
  "True if any messages waiting for destination. If source is specified, only considers msgs from him"
  (LET [(queue (FASSOC destination (@ %:transmittedMsgs)]
    (COND
      [source (for msg in (CDR queue) thereis (EQ source (@ msg %:source)]
      ((CDR queue)
       T))))
```

```
(Method ((MapNetwork NSAddrFromSpec) self gateSpec)
                                                             . TAL 21-Jan-88 13.24
  .. Translate gateway address spec into NS address. If spec is number it is treated as the decimal number printed on UB boards. If it contains #'s it is treated as
  .. a three part octal NS address and canonicalized. If two numbers separated by slash it is treated as decimal UB number and decimal socket
  "Addr is always returned as an atom so can be used as assoc key."
  [LET ((sepr "/")
        host socket pos)
    (COND
      ((FIXP gateSpec)
       (UBToNSAddr gateSpec))
      ([AND (SETQ pos (STRPOS sepr gateSpec))
            [FIXP (SETQ host (SUBATOM gateSpec 1 (SUB1 pos]
            (FIXP (SETQ socket (SUBATOM gateSpec (ADD1 pos)
                                        -1]
       (UBToNSAddr host socket))
      (T                                                     (* UNDOC)
        (MKATOM (\PARSE.NSADDRESSCONSTANT gateSpec])
```

```
(Method ((MapNetwork Process) self)                          . TAL 13-Feb-87 10 03
  "Runs when the MapNetwork event gets notified"
  [LET (obj)
    (COND
      ((@ %:unsentMessages)
       (_ self ProcessUnsentMessages)))
    (bind msg obj ud while [AND (SETQ msg (pop (@ %:manualMessages)))
                                (SETQ ud (fetch GEMSUserData of msg))
                                (ObjectExists? (SETQ obj (fetch MAPMMObject of ud]
       do (_ obj MessageReceive (fetch MAPMMId of ud)
                 (fetch MAPMMCmd of ud)
                 (fetch MAPMMLocal of ud)
                 (fetch MAPMMRemote of ud)))
    (COND
      ((AND (@ %:statusUpdateFlg)
            (SETQ obj (NetworkStatus.StatusOn?)))
       (_@ %:statusUpdateFlg NIL)
       (_ obj UpdateNetworkStatus)])

(Method ((MapNetwork ProcessUnsentMessages) self)
                                                             . TAL 13-Feb-87 10 03
  "Actually sends the messages"
  (bind msg waiting inTransmission while (SETQ msg (pop (@ %:unsentMessages)))
     do [COND
          [(OR [bind (dest _ (@ msg %:destination))
                     (src _ (@ msg %:source)) for x in (@ %:associations)
                  thereis (AND (EQ src (fetch MAPAssocRemote of x))
                               (EQ dest (fetch MAPAssocLocal of x]
               (FASSOC (@ msg %:destination)
                       (@ %:connectionAList)))
           (COND
             (FISMapAnimationUnit (_ FISMapAnimationUnit MoveMessage '(Key .msg Increment
```

Page 13

```
                                                      .FISMapAnimationIncrement)
                                     '(Send .self DeliverMessage .msg))
                (change inTransmission (NCONC1 DATUM msg)))
             (T (_ self DeliverMessage msg)]
          (T (change waiting (NCONC1 DATUM msg]
   finally (_@ %:unsentMessages waiting)
           (change (@ %:inTransmission)
                   (NCONC DATUM inTransmission))))

(Method ((MapNetwork PushStatusMsg) self Local Remote Cmd Msg UpdateFlg)
                                                             ; mcf: 24-Nov-86 18:45
  "New method template"
  (DECLARE (GLOBALVARS MapNetworkStatusMsgTraceLimit))
  [LET (msgCount trunk)
    (COND
      ((AND MapNetworkStatus)
       [change (@ %:statusMsgs)
               (NCONC1 DATUM (CONCAT (DATE (DATEFORMAT NO.DATE))
                                     " "
                                     (COND
                                       ((AND Local Remote)
                                        (CONCAT Local "/" Remote))
                                       (Local)
                                       (Remote)
                                       (T Nothing))
                                     ": "
                                     (OR (CADR (FASSOC Cmd GEMSCommandInterpretations))
                                         Cmd Nothing)
                                     " "
                                     (OR Msg Nothing]
       [SETQ msgCount (change (@ %:statusMsgCount)
                              (ADD1 (OR DATUM 0]
       (COND
         ((AND MapNetworkStatusMsgTraceLimit (IGREATERP msgCount MapNetworkStatusMsgTraceLimit))
          [change (@ %:statusMsgs)
                  (NTH DATUM (ADD1 (IDIFFERENCE msgCount MapNetworkStatusMsgTraceLimit]
          (_@ %:statusMsgCount MapNetworkStatusMsgTraceLimit)))
       (AND UpdateFlg (_@ %:statusUpdateFlg T))
       (NOTIFY.EVENT (@ %:networkEvent)])

(Method ((MapNetwork RemoveTraceFilter) self filter)
                                                             . TAL 12-Oct-85 18.04
  "New method template"
  (change (@ self traceFilters)
          (DREMOVE filter DATUM))
  (bind ctx for x in (@ filter filterProgs) when [AND (ObjectExists? (CAR x))
                                                      (SETQ ctx (ObjectExists? (@ (CAR x)
                                                                                  processContext)]
     do (_ ctx RemovingTraceFilter filter)))

(Method ((MapNetwork ResetGrafcetProcess) self program)
                                                             . mcf: 13-Oct-86 13.12
  "Delete any pending messages from the process, and make its receivers not listening anymore"
  (LET NIL

       (* * Delete any unsent messages addressed to the resetting process)
```

```
(change (@ %:unsentMessages)
       (for msg in DATUM unless (_ msg FromProgram? program) collect msg))

     (* * Stop the transmission of any animated messages addressed to the process)

(change (@ %:inTransmission)
       (bind msg for msgTail on DATUM eachtime (SETQ msg (CAR msgTail))
          do (COND
                ((_ msg FromProgram? program)
                 (AND FISMapAnimationUnit (_ FISMapAnimationUnit CancelMsg msg))
                 (RPLACA msgTail NIL)))
          yield (DREMOVE NIL DATUM)))

     (* * Remove any undelivered messages addressed to the process)

(for rQueue in (@ %:transmittedMsgs) when (LISTP (CDR rQueue))
   do (bind msg for msgTail on (CDR rQueue) eachtime (SETQ msg (CAR msgTail))
         when (_ msg FromProgram? program) do (RPLACA msgTail NIL) finally (DREMOVE NIL rQueue)))

     (* * Abort all map connections/registrations established here)

(_ self ResetMapProcess program)
```

```
     (* * Clear message trace displays)

(_ self InitializeTraceBrowsers program)

     (* * Cancel the listen of any receiver in the process)

(for pair in (@ %:connectionAList) when (AND (CDR pair)
                                             (_ (CDR pair)
                                                InProgram? program))
   do (RPLACD pair NIL))))

(Method ((MapNetwork ResetMapProcess) self program)
                                                          , TAL 21-Jan-88 14:43
   "New method template"
   (for a in (@ %:associations) when (EQ program (fetch MAPAssocEventObject of a))
      do (_ self MapAbort (fetch MAPAssocID of a)))
   (for reg in (@ %:registrations) when (EQ program (fetch MAPEventObject of reg))
      do (_ self MapDeRegister (fetch MAPName of reg)))      ; (COND ((NOT (@ :registrations)) (_ self MapReset)))
   NIL)

(Method ((MapNetwork SendMessage) self msg Id)    , TAL 4-May-87 12:59
   "Used by clients to send a message. The message's :sender should be filled in already, and if :receiver is
   not filled in, it will be looked up from the :destination name."
   (PROG (associate chan)
         (DECLARE (USEDFREE /process\ /step\ MapNetworkSendFlg))
         (_@ msg %:sendTime FISGlobalClock)
    RETRY
         [COND
            ((AND Id (SETQ associate (FASSOC Id (@ %:associations)))
                  (ExternalMapAssoc? associate))                 (* make sure we're on the network)
             (SETQ chan (fetch MAPAssocChan of associate))
             [COND
                ((NEQ (fetch GEMSChanState of chan)
                      'Open)
                 (SimulationBreak (AND (BOUNDP '/process\)
                                       /process\)
                        (AND (BOUNDP '/step\)
                             /step\)
                        (LIST "Association between " (fetch GEMSLocalID of chan)
                              " & "
                              (fetch GEMSRemoteID of chan)
                              " not open")
                        '((Abort (RETURN))
                          (Continue (RETURN))
                          (Retry (GO RETRY]
             (GEMS.SendString chan (@ msg %:rawData)))
            (T (cnconc1 (@ %:unsentMessages)
                      msg)
               (COND
                  ((BOUNDP 'MapNetworkSendFlg)                  (* GRAFSIM binds this and calls ProcessUnsentMessages if it gets set
                                                                during scan)
                   (SETQ MapNetworkSendFlg T))
                  (T (NOTIFY.EVENT (@ %:networkEvent)]
         (for filter in (@ %:traceFilters) when (_ msg MatchFilter? filter 'Source)
            do (_ (@ filter %:traceBrowser)
                  AddToTrace msg))
    msg))

(\UnpatchMethodDefs)

(DEFINEQ
```

(ADDASSOC

```
  [LAMBDA (KEY NEW ALST FLG)                                   (* TAL "15-OCT-83 15.21")

          (* Like ADDPROP  If FLG is T, NEW is CONSed onto the beginning of the old value, otherwise NCONC1ed onto the end )

    (PROG [(X (OR (LISTP ALST)
                  (ERRORX (LIST 4 ALST]
           (DECLARE (LOCALVARS . T))
      LP  (COND
             ((EQ (CAR (OR (LISTP (CAR X))
                           (GO NEXT)))
                  KEY)
              (COND
                 [FLG (FRPLACD (CAR X)
                               (CONS NEW (CDAR X]
                 (T (NCONC1 (CAR X)
                            NEW)))
```

Page 15

```
              (RETURN NEW)))
      NEXT
          [SETQ X (OR (LISTP (CDR X))
                      (PROGN [FRPLACD X (LIST (CONS KEY (LIST NEW]
                             (RETURN NEW]
          (GO LP])
```

(FISMapGetAssocNum

```
  [LAMBDA (self varName localSt propName activeVal type)      (* TAL "11 May-87 16:35")

          (* This is a getFn. The value of this getFn is returned as the value of the enclosing GetValue.)

    (LET ((newValue localSt)
          (associates (@ %:associations)))
      [until (AND (NEQ newValue 0)
                  (NOT (FASSOC newValue associates)))
         do (SETQ newValue (LOGAND 65535 (ADD1 newValue]
      (PutLocalState activeVal (LOGAND 65535 (ADD1 newValue))
             self varName propName type)
      newValue])
```

(FISNetworkProcess

```
  [LAMBDA NIL                                                  . Edited 10-May-88 17 34 by loops
    (LET (event)
      (OR MapNetwork (SETQ MapNetwork (_ ($ MapNetwork)
                                         New)))
      [OR (SETQ event (@ MapNetwork %:networkEvent))
          (_@ MapNetwork %:networkEvent (SETQ event (CREATE.EVENT 'MapNetwork)))]
      [OR (@ MapNetwork %:networkMonitor)
          (_@ MapNetwork %:networkMonitor (CREATE.MONITORLOCK 'MapNetwork))]

      .. Initialize the AList to be not NIL so ADDASSOC won't die, and to look like an AList for the inspector, but make sure the dummy entry's CDR is not a list
      .. so it won't look like a real queue of messages.

      [OR (@ MapNetwork %:transmittedMsgs)
          (_@ MapNetwork %:transmittedMsgs (LIST (CONS 'Dummy 'Entry)))]
      (while T do (AWAIT.EVENT event 30000)                   . wakeup once in a while just in case
                  (_ MapNetwork Process))])
```

(MapNetworkCloseFn

```
  [LAMBDA (Conn Msg)                                           (* mcl%. " 2-Oct-86 15.17")
    (_ MapNetwork MapNetworkCloseFn Conn Msg)])
```

(MapNetworkErrorFn

```
  [LAMBDA (Conn Chan Msg Warning)                              (* mcl%. "18-Nov-86 10 02")
    (_ MapNetwork MapNetworkErrorFn Conn Chan Msg Warning)])
```

(MapNetworkInputFn

```
  [LAMBDA (Chan Msg)                                           (* mcl%: "26-Sep-86 15 11")
    (AND MapNetwork (_ MapNetwork MapNetworkInputFn Chan Msg)])
```

(\CloseMap

```
  [LAMBDA NIL                                                  (* TAL "21-Jan-88 14 51")
                                                               (* Not used?)
    (_ MapNetwork ResetMap)])

)

(PUTPROPS MapAnimationUnit GLOBALVAR T)

(RPAQQ FISDoneMsgString "done")

(RPAQQ FISMapAnimationIncrement 10)

(RPAQQ FISMapExternalAtomLst (Y y Yes yes YES T t))

(RPAQQ FISSentMsgString "sent")
```

```
(RPAQQ GEMSCommandInterpretations
       ((GEMSREG Registration)
        (GEMSDEREG De-Registration)
        (GEMSSEND Send)
        (GEMSRECV Receive)
        (GEMSABRT Abort)
        (GEMSABRTIND "Abort Indication")
        (GEMSASSOC Association)
        (GEMSASSOK "Association OK")
        (GEMSASSRESP "Association Response")
        (GEMSASSIND "Association Indication")
        (GEMSREL Release)
        (GEMSRELIND "Release Indication")
        (GEMSRELRESP "Release Response")
        (GEMSRELOK "Release OK")))

(RPAQQ YesAtoms (Y y Yes yes YES T t))

(RPAQ? MapNetwork )

(RPAQ? MapNetworkStatusMsgTraceLimit 30)

.. FOLLOWING DEFINITIONS EXPORTED

(DECLARE%: DOEVAL@COMPILE DONTCOPY

(GLOBALVARS GEMSCommandInterpretations FISMapAnimationIncrement FISDoneMsgString FISSentMsgString MapNetwork
       MapNetworkStatusMsgTraceLimit YesAtoms)
)

(DECLARE%: EVAL@COMPILE

(RECORD MAPAssociation (MAPAssocID MAPAssocChan MAPAssocNames MAPAssocEventObject MAPAssocMsgClass
                              MAPAssocLocalAKA)
       [ACCESSFNS ((MAPAssocLocal (CAR (fetch (MAPAssociation MAPAssocNames) of DATUM)))
                   (MAPAssocRemote (CADR (fetch (MAPAssociation MAPAssocNames) of DATUM]

          (* MAPAssocChan must be second to correspond to MAPChannel in the record MAPResistration so the LocalMapProcess? macro will
          work)

       )

(RECORD MAPManualMsg (MAPMMObject MAPMMId MAPMMCmd MAPMMLocal MAPMMRemote))

(RECORD MAPRegistration (MAPName MAPChannel MAPEventObject))
)

(DECLARE%: EVAL@COMPILE

(PUTPROPS YesAtom? MACRO (OPENLAMBDA (atom)
                            (FMEMB atom YesAtoms)))

(PUTPROPS ExternalMapAssoc? MACRO [OPENLAMBDA (association)
                                   (AND association (NOT (LocalMapProcess? association])

(PUTPROPS LocalMapProcess? MACRO [OPENLAMBDA (AssocOrReg)

          (* applicable to both MAPAssociation and MAPRegistration as the channel fields are in the same relative positions)

                                 (AND AssocOrReg (EQ 'Internal (fetch MAPAssocChan of AssocOrReg])
)

.. END EXPORTED DEFINITIONS

          (* * Hooks into NetworkStatus Browser)

(RPAQ? MapNetworkStatus )

.. FOLLOWING DEFINITIONS EXPORTED

(DECLARE%: DOEVAL@COMPILE DONTCOPY

(GLOBALVARS MapNetworkStatus)
)
```

```
.. END EXPORTED DEFINITIONS

(DEFINEQ

(AVUpdateAssoc
  [LAMBDA (self varName newValue propName activeVal type)      (* mcf%: "15-Nov-86 14:55")

          (* This is a putFn. ***NOTE*** The value of this function will be returned as the value of any enclosing PutValue.
          This usually means that you want to return the value returned by PutLocalState.)

    (PROG1 (PutLocalState activeVal newValue self varName propName type)
       (_@ self statusUpdateFlg T)
       (NOTIFY.EVENT (@ %:networkEvent))))])
```

```
(AVUpdateMisc
  [LAMBDA (self varName newValue propName activeVal type)     (* mcf%: "14-Nov-86 13:50")

          (* This is a putFn ***NOTE*** The value of this function will be returned as the value of any enclosing PutValue
          This usually means that you want to return the value returned by PutLocalState.)

    (LET (obj)
      (PROG1 (PutLocalState activeVal newValue self varName propName type)
          (COND
             ((SETQ obj (NetworkStatus.StatusOn?))
              (_ obj UpdateMisc))))])

(AVUpdateReg
  [LAMBDA (self varName newValue propName activeVal type)     (* mcf%: "15-Nov-86 14:56")

          (* This is a putFn ***NOTE*** The value of this function will be returned as the value of any enclosing PutValue
          This usually means that you want to return the value returned by PutLocalState.)

    (PROG1 (PutLocalState activeVal newValue self varName propName type)
        (_@ self statusUpdateFlg T)
        (NOTIFY.EVENT (@ %:networkEvent)))])

(NetworkStatus.StatusOn?
  [LAMBDA NIL                                                 (* mcf%: "13-Nov-86 11:18")
    (LET (obj)
      (AND MapNetworkStatus [ObjectExists? (SETQ obj (_ MapNetworkStatus CheckPropList 'NETWORKFORMEDITOR)]
           obj])

)

(DEFINST MapAssociationFolderElement (FISDefaultMapAssociationSpec (ULWO.kga%:.J7; . 1))
       (name #.($A FISDefaultMapAssociationSpec NIL RememberName))
       (externalFlg Y))

(RPAQQ MapAssociationFolderElementAllFields (local remote applicationContext connectionVariable msgType
                                             autoAssoc externalFlg gateway))

(RPAQQ MapAssociationFolderElementSomeFields (local remote applicationContext connectionVariable msgType))

(RPAQ MapAssociationFolderElementFields MapAssociationFolderElementAllFields)

(PUTPROPS MAPNETWORK FILETYPE :FAKE-COMPILE-FILE)

(PUTPROPS MAPNETWORK COPYRIGHT ("Savoir, Inc." 1985 1986 1987 1988))
```

FUNCTION INDEX

ConvertTemplates ....28
FISEvaluateProgram ....12
MMFS.ArrayData? ....16
MMFS.BuildMsgFields ....5
MMFS.BuildOneField ....6
MMFS.CIdentifierType ....16
MMFS.ConstantLength ....12
MMFS.DescFromCode1 ....14
MMFS.DescFromID ....14
MMFS.EncodedByteLength ....12
MMFS.FetchArrayVar ....17
MMFS.FetchString ....16
MMFS.FetchVar ....16
MMFS.FieldLen ....13
MMFS.FieldsToString ....10
MMFS.FindMatchingTemplate ....13
MMFS.FixpToString ....17
MMFS.FunctionCode ....14
MMFS.InField ....9
MMFS.InFields ....9
MMFS.InFixp ....9
MMFS.InLength ....9
MMFS.InString ....9
MMFS.IntegralData? ....16
MMFS.MatchFields? ....6
MMFS.MatchOneField? ....7
MMFS.OutField ....10
MMFS.OutFields ....10
MMFS.OutFixp ....10
MMFS.OutString ....11
MMFS.ParseError ....5
MMFS.ParseFieldContents ....4
MMFS.ParseFields ....3
MMFS.ParseStream ....4
MMFS.PrintField ....11
MMFS.PrintFields ....11
MMFS.PrintHex ....11
MMFS.PrintStreamData ....12
MMFS.RcvFields ....7
MMFS.RcvOneField ....5
MMFS.ScalarData? ....16
MMFS.ScalarValue ....8
MMFS.SetupIDHash ....14
MMFS.SetupIDHash1 ....15
MMFS.SignedData? ....16
MMFS.StoreArrayVar ....17
MMFS.StoreString ....17
MMFS.StoreVar ....17
MMFS.StringToFixp ....17
MMFS.TemplateFieldLen ....5
MMFS.VarLength ....16
MMFSMessageDefinitionCompareFn ....13
MMFSSendTemplateAnalysisCompareFn ....13
\MMFSSend ....13

METHOD INDEX

BeAnFCSContext.FindObject ....27
CreateMMFSReceivable.CreateObject ....20
CreateMMFSSendable.CreateObject ....20
MMFSMessage.ConstructMsg ....21
MMFSMessage.GenerateRawData ....21
MMFSMessage.MatchFilter? ....21
MMFSMessage.ParseRawData ....21
MMFSMessage.Print ....22
MMFSMessageDefinition.AnalysisScope ....22
MMFSMessageDefinition.GetAccessList ....22
MMFSMessageDefinition.MainProgram ....22
MMFSMessageDefinition.MatchTemplate? ....22
MMFSMessageDefinition.ObjectForSearch ....22
MMFSMessageDefinition.UnparseDataField ....22
MMFSMessageDefinition.WhoUses ....23
MMFSReceivableDefFolder.CompileTemplates ....23
MMFSReceivableDefFolder.FindMatchingTemplate ....23
MMFSReceivableDefFolder.GetPrintName ....23
MMFSReceivableDefFolder.InProgram? ....23
MMFSReceivableDefFolder.MainProgram ....23
MMFSReceivableDefFolder.NameQualifier ....23
MMFSReceivableDefFolder.PrintNameQualifier ....23
MMFSReceivableDefFolder.QualifyCacheFlush ....23
MMFSReceivableDefFolder.SWCopyMade ....24
MMFSReceivableMessageDefinition.CompileTemplate ....24
MMFSReceivableMessageDefinition.ComputePrintName ....24
MMFSReceivableMessageDefinition.ReceiveMessage ....25
MMFSSendableDefFolder.CompileTemplates ....25
MMFSSendableDefFolder.GetPrintName ....25
MMFSSendableDefFolder.InProgram? ....25
MMFSSendableDefFolder.LookupTemplate ....25
MMFSSendableDefFolder.MainProgram ....25
MMFSSendableDefFolder.NameQualifier ....25
MMFSSendableDefFolder.PrintNameQualifier ....26
MMFSSendableDefFolder.QualifyCacheFlush ....26
MMFSSendableDefFolder.SWCopyMade ....26
MMFSSendableMessageDefinition.CompileTemplate ....26
MMFSSendableMessageDefinition.ComputePrintName ....27
SendMMFSMessageContext.SendMMFSMessage ....28

CLASS INDEX

BeAnFCSContext ....27
CreateMMFSReceivable ....17
CreateMMFSSendable ....18
ExamineMMFSFolderFormContext ....18
ExamineMMFSMessageDefinitionContext ....18
ExamineMMFSMessageFolderContext ....18
ExamineMMFSReceivableMessageDefinitionContext ....18
ExamineMMFSSendableMessageDefinitionContext ....18
ExamineReceivableFolderFormContext ....18
ExamineReceivableMessageFolderContext ....18
ExamineReceiveStepFormContext ....18
ExamineSendableFolderFormContext ....18
ExamineSendableMessageFolderContext ....19
MMFSManuallySendableFolder ....27
MMFSMessage ....19
MMFSMessageDefinition ....19
MMFSMessageDefinitionFolder ....19
MMFSReceivableDefFolder ....19
MMFSReceivableFolder ....19
MMFSReceivableMessageDefinition ....19
MMFSSendableDefFolder ....20
MMFSSendableFolder ....20
MMFSSendableMessageDefinition ....20
SendMMFSMessageContext ....27

PROPERTY INDEX

MMFS ....2,28

RECORD INDEX

MMFSField ....................2
MMFSFieldTemplate ..............2
MMFSIDCode ....................13
MMFSIDDesc .....................2
MMFSIDMnemonic .................13
MMFSParameterDescription .......27
MMFSStreamFieldTemplate ........2
MMFSTemplateData ...............2

VARIABLE INDEX

MMFS.DSPrintLimit .....17
MMFS.UnknownCodes .....15
MMFS.UnknownIDs .......15
MMFSGroupers ..........15
MMFSIDCodeConstants ...15
MMFSInitialGroupers ...15
MMFSProceduralControls 15

CONSTANT INDEX

MMFS.StringStreamLength .........2
MMFSIDCode80 ...................15
MMFSIDCodeDS ...................15
MMFSIDCodeDC ...................15
MMFSIDCodeTN ...................15

MACRO INDEX

MMFS.DescFromCode ..............14 changes to: (METHODS MMFSReceivableDefFolder.NameQualifier MMFSReceivableDefFolder.PrintNameQualifier MMFSSendableDefFolder.NameQualifier MMFSSendableDefFolder.PrintNameQualifier)
(VARS MMFSCOMS)

previous date: 10-Aug-88 17:09:02 {DSK}<LISPFILES>FIS>MMFS.;86

Read Table: INTERLISP

Package: IL

;; Copyright (c) 1986, 1987, 1988 by Savoir, Inc.. All rights reserved.

```
(RPAQQ MMFSCOMS
       ((DECLARE%: DONTCOPY (PROP MAKEFILE-ENVIRONMENT MMFS))
        (RECORDS MMFSField MMFSFieldTemplate MMFSIDDesc MMFSStreamFieldTemplate MMFSTemplateData)
        (COMS (GLOBALVARS MMFS.TempStringStream)
              (CONSTANTS (MMFS.StringStreamLength 1024))
              (RESOURCES MMFS.StringStream))
        (FNS)
                                                        ; Template parsing
        (FNS MMFS.ParseFields MMFS.ParseFieldContents MMFS.ParseStream MMFS.ParseError MMFS.TemplateFieldLen)
                                                        ; Msg contruction, reception
        (FNS MMFS.BuildMsgFields MMFS.BuildOneField MMFS.MatchFields? MMFS.MatchOneField? MMFS.RcvFields
             MMFS.RcvOneField MMFS.ScalarValue)
                                                        ; Raw data formatting
        (FNS MMFS.InFields MMFS.InField MMFS.InFixp MMFS.InLength MMFS.InString MMFS.FieldsToString
             MMFS.OutFields MMFS.OutField MMFS.OutFixp MMFS.OutString)
                                                        ; Msg printing
        (FNS MMFS.PrintFields MMFS.PrintField MMFS.PrintHex MMFS.PrintStreamData)
                                                        ; Miscellaneous
        (FNS FISEvaluateProgram MMFS.ConstantLength MMFS.EncodedByteLength MMFS.FieldLen
             MMFS.FindMatchingTemplate MMFSMessageDefinitionCompareFn MMFSSendTemplateAnalysisCompareFn
             \MMFSSend)
        (COMS (* Field descriptors)
              (RECORDS MMFSIDCode MMFSIDMnemonic)
              (MACROS MMFS.DescFromCode)
              (FNS MMFS.DescFromCode1 MMFS.DescFromID MMFS.FunctionCode MMFS.SetupIDHasn MMFS.SetupIDHasn1)
              (INITVARS (MMFS.UnknownIDs NIL)
                     (MMFS.UnknownCodes NIL))
              (VARS MMFSProceduralControls MMFSGroupers MMFSInitialGroupers)
              (CONSTANTS * MMFSIDCodeConstants)
              (FILES MMFSDEFS)
              (GLOBALVARS MMFSIDDescrs MMFSGroupers MMFSInitialGrouperCodes MMFSProceduralControls
                     MMFS.UnknownIDs MMFS.UnknownCodes)
              (P (MMFS.SetupIDHasn)))
        (COMS (* Interface to C runtime, etc.)
              (FNS MMFS.ArrayData? MMFS.CIdentifierType MMFS.IntegralData? MMFS.ScalarData? MMFS.SignedData?
                   MMFS.VarLength)
              (FNS MMFS.FetchString MMFS.FetchVar MMFS.FetchArrayVar MMFS.StoreArrayVar MMFS.StoreVar
                   MMFS.StoreString MMFS.FixpToString MMFS.StringToFixp))
        [COMS (INITVARS (MMFS.DSPrintLimit 30))
              (GLOBALVARS MMFS.DSPrintLimit)
              (APPENDVARS (SWGlobalParameters (MMFS<DS>PrintLimit MMFS.DSPrintLimit NUMBERP "Maximum number
                                                  of bytes to print from <DS> fields"]
        (COMS (* * Message, template and folder objects)
              (CLASSES CreateMMFSReceivable CreateMMFSSendable ExamineMMFSFolderFormContext
                     ExamineMMFSMessageDefinitionContext ExamineMMFSMessageFolderContext
                     ExamineMMFSReceivableMessageDefinitionContext
                     ExamineMMFSSendableMessageDefinitionContext ExamineReceivableFolderFormContext
                     ExamineReceivableMessageFolderContext ExamineReceiveStepFormContext
                     ExamineSendableFolderFormContext ExamineSendableMessageFolderContext MMFSMessage
```

```
                WMFSMessageDefinition WMFSMessageDefinitionFolder WMFSReceivableDefFolder
                WMFSReceivableFolder WMFSReceivableMessageDefinition WMFSSendableDefFolder
                WMFSSendableFolder WMFSSendableMessageDefinition)
            (METHODS CreateWMFSReceivable.CreateObject CreateWMFSSendable.CreateObject
                WMFSMessage.ConstructMsg WMFSMessage.GenerateRawData WMFSMessage.MatchFilter?
                WMFSMessage.ParseRawData WMFSMessage.Print WMFSMessageDefinition.AnalysisScope
                WMFSMessageDefinition.GetAccessList WMFSMessageDefinition.MainProgram
                WMFSMessageDefinition.MatchTemplate? WMFSMessageDefinition.ObjectForSearch
                WMFSMessageDefinition.UnparseDataField WMFSMessageDefinition.WhoUses
                WMFSReceivableDefFolder.CompileTemplates WMFSReceivableDefFolder.FindMatchingTemplate
                WMFSReceivableDefFolder.GetPrintName WMFSReceivableDefFolder.InProgram?
                WMFSReceivableDefFolder.MainProgram WMFSReceivableDefFolder.NameQualifier
                WMFSReceivableDefFolder.PrintNameQualifier WMFSReceivableDefFolder.QualifyCacheFlush
                WMFSReceivableDefFolder.SWCopyMade WMFSReceivableMessageDefinition.CompileTemplate
                WMFSReceivableMessageDefinition.ComputePrintName
                WMFSReceivableMessageDefinition.ReceiveMessage WMFSSendableDefFolder.CompileTemplates
                                                                                    Page 2

                WMFSSendableDefFolder.GetPrintName WMFSSendableDefFolder.InProgram?
                WMFSSendableDefFolder.LookupTemplate WMFSSendableDefFolder.MainProgram
                WMFSSendableDefFolder.NameQualifier WMFSSendableDefFolder.PrintNameQualifier
                WMFSSendableDefFolder.QualifyCacheFlush WMFSSendableDefFolder.SWCopyMade
                WMFSSendableMessageDefinition.CompileTemplate
                WMFSSendableMessageDefinition.ComputePrintName))
        (COMS (* Obsolete)
              (RECORDS WMFSParameterDescription)
              (CLASSES BeAnFCSContext WMFSManuallySendableFolder SendWMFSMessageContext)
              (METHODS BeAnFCSContext.FindObject SendWMFSMessageContext.SendWMFSMessage)
              (FNS ConvertTemplates))
        (PROP FILETYPE WMFS)))

(DECLARE%: DONTCOPY

(PUTPROPS WMFS MAKEFILE-ENVIRONMENT (:PACKAGE "IL" :READTABLE "INTERLISP" :BASE 10))
)

(DECLARE%: EVAL@COMPILE

(RECORD WMFSField (WMFSFieldID WMFSFieldData WMFSFieldLen . WMFSFieldStreamData))

(RECORD WMFSFieldTemplate (WMFSFieldID WMFSFieldData WMFSFieldLen WMFSFieldOpt WMFSFieldRpt WMFSFieldStream
                                                                               . WMFSFieldStreamHack)
       )

(RECORD WMFSIDDesc (WMFSIDName WMFSIDContentType WMFSIDEncoding . WMFSIDFunctionCodes))

(RECORD WMFSStreamFieldTemplate (WMFSStreamFieldData WMFSStreamFieldLen))

(RECORD WMFSTemplateData (WMFSTemplateDataName WMFSTemplateDataType)
       (TYPE? LISTP))
)

(DECLARE%: DOEVAL@COMPILE DONTCOPY

(GLOBALVARS WMFS.TempStringStream)
)

(DECLARE%: EVAL@COMPILE

(RPAQQ WMFS.StringStreamLength 1024)

(CONSTANTS (WMFS.StringStreamLength 1024))
)

(DECLARE%: EVAL@COMPILE

[PUTDEF 'WMFS.StringStream 'RESOURCES '(NEW (LET ((str (ALLOCSTRING WMFS.StringStreamLength)))
                                                  (CONS (OPENSTRINGSTREAM str 'OUTPUT)
                                                        str))
                                            FREE
                                            (SETQ WMFS.TempStringStream (PROG1 . ARGS))
                                            GET
                                            (COND (WMFS.TempStringStream (LET ((X WMFS.TempStringStream))
                                                                             (SETQ WMFS.TempStringStream NIL
                                                                                   )
                                                                             (SETFILEPTR (CAR X)
                                                                                    0)
                                                                             (\RESETSTRINGSTREAM
                                                                              (CAR X))
                                                                             X))
                                                  (T (NEWRESOURCE WMFS.StringStream)))
                                            INIT
                                            (SETQ WMFS.TempStringStream NIL]
)

; Template parsing

(DEFINEQ
```

```
(MMFS.ParseFields
  [LAMBDA (string ccEnv)                                              . Edited 9-Jun-88 14:32 by mcf
    (LET ((tokens (CC.SimpleTokenParse (OPENSTRINGSTREAM (\ThinString string))
                        ccEnv))
          f rest rpt rptFlg opt sOpt optVar id len content idDesc stream field)
      (while (AND tokens (NEQ (CAR tokens)
                              'EOF))
         collect [SETQ rpt (SETQ rptFlg (SETQ id (SETQ len NIL]
               (SETQ opt (SETQ content NIL))
               [OR (match tokens with (%' < !f_$
                                        %' > rest_$))
                   (SETQ rptFlg (match tokens with (%' %( rpt_&
                                                    %' < !f_$
                                                    %' > %' %) rest_$)))
                   (SETQ sOpt (match tokens with (%' %[ optVar_&
                                                  %' < !f_$
                                                  %' > %' %] rest_$)))
                   (SETQ opt (match tokens with (%' %[ %' < !f_$
                                                 %' > %' %] rest_$)))
                   (MMFS.ParseError "Syntax error in template field near: " (CONCATLIST (LDIFF tokens
                                                                                                 (LAST tokens]
               (SETQ tokens rest)
               [OR (match f with (id_&
                                  %'> $))
                   (match f with (id_&
                                  |':| len_&
                                  %':\ content_$
                                  %'> $))
                   (match f with (id_&
                                  |':| content_$
                                  %'> $))
                   (MMFS.ParseError "Syntax error in template field near: " (CONCATLIST
                                                                               (CONS '< (LDIFF f (LAST f]
               (COND
                  ([NOT (SETQ idDesc (COND
                                        ((NUMBERP id)
                                         (MMFS.DescFromCode id))
                                        (T (MMFS.DescFromID id]
                   (MMFS.ParseError "Unknown MMFS field ID: " id)))
               (SETQ field (create MMFSFieldTemplate
                                  MMFSFieldID _ (fetch MMFSIDEncoding of idDesc)))
               (COND
                  ((NUMBERP (fetch MMFSIDContentType of idDesc))
                   [COND
                      ((OR content len)
                       (MMFS.ParseError (CONCAT "MMFS function code (" id ") cannot be used with length or
                                                contents: ")
                              (CONCATLIST (CONS '< (LDIFF f rest]
                   (replace MMFSFieldData of field with (fetch MMFSIDContentType of idDesc))
                                                              . Must fix this if there are ever function codes with longer contents
                   (replace MMFSFieldLen of field with 1))
                  (content (replace MMFSFieldData of field with (MMFS.ParseFieldContents content ccEnv))
                         (replace MMFSFieldLen of field with (MMFS.TemplateFieldLen len (fetch MMFSFieldData
                                                                                               of field)
                                                                    rptFlg ccEnv)))
                  (len                                        . Must be allowed for, e.g. <TN 82.>
                       .. (MMFS.ParseError MMFS field has length but no content: (CONCATLIST (CONS (QUOTE <) (LDIFF f rest))))
                       (replace MMFSFieldLen of field with (MMFS.TemplateFieldLen len NIL NIL ccEnv))
                       (replace MMFSFieldData of field with NIL))
                  (T                                          . MMFSFieldLen is currently assumed to be numeric. MMFSFieldData
                                                              . can and should be NIL in this case
                     (replace MMFSFieldLen of field with 1)))
               [COND
                  ((NOT (WithinRange? (fetch MMFSFieldLen of field)
                               -127 127))                     . Explicit length > 127 specified
                   (MMFS.ParseError "MMFS field has contents longer than 127 bytes: "
                          (CONCATLIST (CONS '< (LDIFF f rest]
               (COND
                  (sOpt (replace MMFSFieldOpt of field with (MMFS.ParseFieldContents (LIST optVar)
                                                                   ccEnv)))
                  (opt (replace MMFSFieldOpt of field with T)))
               [COND
                  (rptFlg (replace MMFSFieldRpt of field with (COND
                                                                 (rpt (MMFS.ParseFieldContents (LIST rpt)
                                                                             ccEnv))
                                                                 (T T]
               (SELECTQ id
                   (DS [OR (match tokens with (%'<< !stream_$
                                                %'>> rest_$))
                           (match tokens with (%'<< !stream_$
                                                %'>> rest_$))
```

```
                           (MMFS.ParseError "Syntax error in MMFS data stream: " (CONCATLIST
                                                                                   (LDIFF rest (LAST rest]
                       (SETQ tokens rest)
                       (replace MMFSFieldStream of field with (MMFS.ParseStream stream ccEnv))
                       (COND
                          ((NULL (fetch MMFSFieldData of field))
                           [replace MMFSFieldData of field with (for x in (fetch MMFSFieldStream of field)
                                                                   sum (IABS (fetch MMFSStreamFieldLen
                                                                                of x]
```

```
                (replace MMFSFieldStreamHack of field with T)
                                                    . Horrible hack to inform downloader that we derived content value
                )))
            NIL)
        field])
```

(MMFS.ParseFieldContents

```
[LAMBDA (content ccEnv)                                         (* TAL "14-Oct-86 15 41")
  (LET ((x content)
        op)
    [COND
      ((FMEMB (CAR x)
              '(+ -))
        (SETQ op (pop x]
    (COND
      ((AND (NOT (CDR x))
            (NUMBERP (CAR x)))
        (SELECTQ op
            (- (MINUS (CAR x)))
            (CAR x)))
      ((AND (NOT (CDR content))
            (STRINGP (CAR content)))
        (CAR content))
      ((AND (NOT (CDR content))
            (LITATOM (CAR content)))
        (create MMFSTemplateData
               MMFSTemplateDataName _ (CAR content)
               MMFSTemplateDataType _ (MMFS.CIdentifierType (CAR content)
                                                     ccEnv)))
      ((EVERY content (FUNCTION NUMBERP))
        (bind (str _ (ALLOCSTRING (LENGTH content)
                          NIL NIL NIL))
           for x in content as i from 1 do (RPLCHARCODE str i (LOGAND x 255)) yield str))
      (T (MMFS.ParseError "Syntax error in template field: " (CONCATLIST content])
```

(MMFS.ParseStream

```
[LAMBDA (stream ccEnv)                                          . Edited 9-Jun-88 14 33 by mct
  (bind len data strest sField while (AND stream (NEQ (CAR stream)
                                                     '>>))
     collect (SETQ len (SETQ data NIL))
           (match stream with (%', stream_$))
           (OR (match stream with (len_&
                                   %': data_$
                                   !strest_
                                   (*ANY* %', %'>>)
                                   $))
               (match stream with (data_$
                                   !strest_
                                   (*ANY* %', %'>>)
                                   $))
               (MMFS.ParseError "Syntax error in MMFS data stream: " (CONCATLIST stream)))
           (SETQ sField (create MMFSStreamFieldTemplate
                           MMFSStreamFieldData _ (MMFS.ParseFieldContents data ccEnv)))
           (replace MMFSStreamFieldLen of sField with (MMFS.TemplateFieldLen len (fetch MMFSStreamFieldData
                                                                                  of sField)
                                                       NIL ccEnv))
           (SETQ stream strest)
           sField])
```

(MMFS.ParseError

```
[LAMBDA (x y)                                                   . Edited 10-May-88 16.46 by loops
  (DECLARE (USEDFREE CC.ErrorStream))
  (LET ((ErrorStream CC.ErrorStream))
    (COND
      ((OR (NULL ErrorStream)
           (OPENP ErrorStream 'OUTPUT))
        (printout ErrorStream "ERROR: " x %, (OR y "")
               T)
        (ERROR x y))
      ((AND ErrorStream (NEQ ErrorStream T)
            (DEFINEDP ErrorStream))
        (APPLY* ErrorStream NIL NIL x y NIL))
      (T (ERROR x y])
```

(MMFS.TemplateFieldLen

```
[LAMBDA (len data rptFlg ccEnv)                                 (* TAL "11-Dec-86 11:22")
  [COND
    ((AND rptFlg (type? MMFSTemplateData data)
          (NOT (MMFS.ArrayData? data)))
      (MMFS.ParseError "MMFS iterated field used with a non-array: " (fetch MMFSTemplateDataName
                                                                         of data]
  (COND
    [(FIXP len)
      (COND
        ((GREATERP len 128)
          (add len -128)))
```

```
(COND
   ((EQ 0 len)
    (MMFS.ParseError "MMFS field has 0 length"))
   (T (MINUS len]
((FLOATP len)
 (MMFS.ParseError "MMFS field has non integral length"))
((AND len ccEnv)
 (OR (MMFS.IntegralData? (MMFS.ParseFieldContents (LIST len)
                                                  ccEnv))
     (MMFS.ParseError "MMFS field has non integral length")))
((OR (STRINGP data)
     (NUMBERP data))
 (MMFS.ConstantLength data))
(data (MMFS.VarLength data rptFlg))
(T 1])

)
```

. Msg contruction, reception

```
(DEFINEQ
```

(MMFS.BuildMsgFields

```
 [LAMBDA (tFields sVs)                                    (* TAL "11-Dec-86 18:29")

        (* Given a list of send template fields, builds the list of actual message fields with values filled in.)

   (LET (fields grp)
     (SETQ fields (bind (fTconc _ (LIST NIL))
                        opt rpt for tF in tFields do [COND
                                                       [(SETQ opt (fetch MMFSFieldOpt of tF))
                                                        (COND
                                                          ((NEQ 0 (MMFS.ScalarValue opt))
                                                           (TCONC fTconc (MMFS.BuildOneField tF sVs NIL]
                                                       [(SETQ rpt (fetch MMFSFieldRpt of tF))
                                                        (for i from 0 to (SUB1 (MMFS.ScalarValue rpt))
                                                           do (TCONC fTconc (MMFS.BuildOneField tF sVs i]
                                                       (T (TCONC fTconc (MMFS.BuildOneField tF sVs NIL]
                     yield (CAR fTconc)))
     fields])
```

Page 6

(MMFS.BuildOneField

```
 [LAMBDA (tF sVs i)                                       Edited 10-Aug-88 17:04 by mcl
   (LET* ((id (fetch MMFSFieldID of tF))
          (field (create MMFSField
                         MMFSFieldID _ id))
          (idDesc (MMFS.DescFromCode id))
          (contentType (fetch MMFSIDContentType of idDesc))
          (tData (fetch MMFSFieldData of tF))
          len data explicitLen)
     (SETQ len (MMFS.ScalarValue (fetch MMFSFieldLen of tF)))
     [COND
       ((SETQ explicitLen (MINUSP len))
        (SETQ len (MINUS len]
     (COND
       ((OR (NUMBERP tData)
            (STRINGP tData))
        (SETQ data tData))
       (tData (SELECTQ contentType
                  ((Code UI SI 80)
                       [SETQ data (COND
                                    (i (MMFS.FetchArrayVar tData sVs i))
                                    (T (MMFS.FetchVar tData sVs])
                  (CH (SETQ data (MMFS.FetchString tData sVs len))
                      (SETQ len (COND
                                  ((STRINGP data)
                                   (NCHARS data))
                                  (T 1)))
                      (COND
                        ((EQ len 0)
                         (SETQ data (ALLOCSTRING 1 0))
                         (SETQ len 1))))
                  (UD (SETQ data (MMFS.FetchString tData sVs len T)))
                  (ERROR (fetch MMFSIDName of idDesc)
                         " MMFS field ID is not supported yet.")))
       (T (SETQ data NIL)))
     (replace MMFSFieldData of field with data)
     (replace MMFSFieldLen of field with len)
     (SELECTC id
         (MMFSIDCodeDS [replace MMFSFieldStreamData of field
                          with (CONCATLIST (bind sData for x in (fetch MMFSFieldStream of tF)
                                              eachtime (SETQ sData (fetch MMFSStreamFieldData of x))
                                              collect (COND
                                                        ((type? MMFSTemplateData sData)
                                                         (MMFS.FetchString sData sVs
                                                                (IABS (fetch MMFSStreamFieldLen
                                                                             of x))
                                                                T))
                                                        ((FIXP sData)
                                                         (MMFS.FixpToString sData
                                                                (IABS (fetch MMFSStreamFieldLen
                                                                             of x))
```

```
        T))
      ((STRINGP sData))
      (T (ERROR "Illegal stream field" sData])
      NIL)
   field])
```

(MMFS.MatchFields?

```
[LAMBDA (mFields tFields sVs)                              . Edited 7 Jun-88 17 01 by mcf
  (PROG (values grpF tnF rpt opt gotOpt)
        (DECLARE (SPECVARS values))
        (SETQ grpF (pop mFields))
        (SETQ tnF (pop mFields))
        [COND
           ((FMEMB (fetch MMFSFieldID of (CAR tFields))
                   MMFSInitialGrouperCodes)
            (OR (MMFS.MatchOneField? grpF (pop tFields)
                       sVs NIL)
                (GO FAIL]
        [COND
           ((EQ (fetch MMFSFieldID of (CAR tFields))
                MMFSIDCodeTN)
            (OR (MMFS.MatchOneField? tnF (pop tFields)
                       sVs NIL)
                (GO FAIL]
        [for tF in tFields do (COND
                                ((SETQ rpt (fetch MMFSFieldRpt of tF))
                                 (SETQ rpt (OR (NUMBERP rpt)
                                               (CDR (FASSOC (fetch MMFSTemplateDataName of rpt)
                                                            values))
                                               (MMFS.FetchVar rpt sVs)))
```

Page 7

```
                                 (for i from 0 to (SUB1 rpt) always (MMFS.MatchOneField?
                                                                      (OR (pop mFields)
                                                                          (GO FAIL))
                                                                      tF sVs i)
                                    elseyield (GO FAIL)))
                                ((SETQ opt (fetch MMFSFieldOpt of tF))
                                 (COND
                                    ((AND mFields (MMFS.MatchOneField? (CAR mFields)
                                                         tF sVs NIL))
                                     (pop mFields)
                                     (SETQ gotOpt 1))
                                    (T (SETQ gotOpt 0)))
                                 .. (COND ((type? MMFSTemplateData opt) (push values (CONS (fetch MMFSTemplateDataName of opt)
                                 .. gotOpt))))

                                 )
                                ((MMFS.MatchOneField? (OR (pop mFields)
                                                          (GO FAIL))
                                        tF sVs NIL))
                                (T (GO FAIL]
        (RETURN (NULL mFields))                           . Match if we've both run out of fields
   FAIL
        (RETURN NIL])
```

(MMFS.MatchOneField?

```
[LAMBDA (mF tF sVs i)                                      (* TAL "12-Dec-86 10 50")
  (LET ((tData (fetch MMFSFieldData of tF))
        (mData (fetch MMFSFieldData of mF)))
    (DECLARE (USEDFREE values))
    (COND
      ((NEQ (fetch MMFSFieldID of tF)
            (fetch MMFSFieldID of mF))
       NIL)
      ((EQ tData mData)
       T)
      ((NULL tData)                                        (* Always matches if template data is empty)
       T)
      ((type? MMFSTemplateData tData)                      (* Variable always matches. Remember value in case needed to expand
       iterations later in match)
       [COND
          ((AND (NULL i)
                (NUMBERP mData))
           (push values (CONS (fetch MMFSTemplateDataName of tData)
                              mData]
       T)
      [(EQ (fetch MMFSFieldID of mF)
           MMFSIDCodeB0)                                   (* Booleans match if both zero or both nonzero)
       (OR (EQ tData mData)
           (AND (NUMBERP tData)
                (NEQ tData 0)
                (NEQ mData 0]
      (T (EQUAL tData mData])
```

(MMFS.RcvFields

```
[LAMBDA (MessageFields TemplateFields sVs)                 (* TAL "14-Dec-86 20.41")
  (LET ((mFields MessageFields)
        (tFields TemplateFields)
        grpF tnF TN rpt opt values)
```

```
(DECLARE (SPECVARS values))
(SETQ grpF (pop mFields))
(SETQ tnF (pop mFields))
(SETQ TN (fetch MMFSFieldData of tnF))
(COND
   ((FMEMB (fetch MMFSFieldID of (CAR tFields))
           MMFSInitialGrouperCodes)
    (MMFS.RcvOneField grpF (pop tFields)
           sVs NIL)))
(COND
   ((EQ (fetch MMFSFieldID of (CAR tFields))
        MMFSIDCodeTN)
    (MMFS.RcvOneField tnF (pop tFields)
           sVs NIL)))
[for tF in tFields do (COND
                         ((SETQ rpt (fetch MMFSFieldRpt of tF))
                          (SETQ rpt (MMFS.ScalarValue rpt sVs))
                          (for i from 0 to (SUB1 rpt) do (MMFS.RcvOneField (OR (pop mFields)
                                                                                (SHOULDNT))
                                                                            tF sVs i)))
                         [(SETQ opt (fetch MMFSFieldOpt of tF))
                          (COND
```

```
                         [(AND mFields (MMFS.MatchOneField? (CAR mFields)
                                                             tF sVs NIL))
                          (MMFS.RcvOneField (pop mFields)
                                  tF sVs NIL)
                          (COND
                             ((type? MMFSTemplateData opt)
                              (MMFS.StoreVar opt sVs 1]
                         ((type? MMFSTemplateData opt)
                          (MMFS.StoreVar opt sVs 0]
                      (T (MMFS.RcvOneField (OR (pop mFields)
                                               (SHOULDNT))
                                tF sVs NIL]
TN])
```

(MMFS.RcvOneField_

```
[LAMBDA (mF tF sVs i)                                    (* TAL "11-Dec-86 17.01")
  (LET* ((code (fetch MMFSFieldID of tF))
         (idDesc (MMFS.DescFromCode code))
         (contentType (fetch MMFSIDContentType of idDesc))
         (tData (fetch MMFSFieldData of tF))
         (mData (fetch MMFSFieldData of mF))
         (tLen (fetch MMFSFieldLen of tF))
         (mLen (fetch MMFSFieldLen of mF))
         (strptr (CONSTANT (ALLOCSTRING 0)))
         explicitLen)
    [COND
       ((type? MMFSTemplateData tLen)
        (MMFS.StoreVar tLen sVs mLen))
       ((SETQ explicitLen (MINUSP tLen))
        (SETQ tLen (MINUS tLen]
    [COND
       ((type? MMFSTemplateData tData)
        (SELECTQ contentType
             ((Code UI SI BD)
                  (COND
                     (i (MMFS.StoreArrayVar tData sVs mData i))
                     (T (MMFS.StoreVar tData sVs mData))))
             (CH (MMFS.StoreString tData sVs (MIN tLen (ADD1 mLen))
                        mData NIL))
             (UD (MMFS.StoreString tData sVs (MIN tLen mLen)
                        mData T))
             (ERROR (fetch MMFSIDName of idDesc)
                    " MMFS field ID is not supported yet."]
    (SELECTC code
         (MMFSIDCodeDS (bind (end _ 0)
                             (str _ (fetch MMFSFieldStreamData of mF))
                             beg len for x in (fetch MMFSFieldStream of tF)
                        eachtime (SETQ beg (ADD1 end))
                              [SETQ end (PLUS beg -1 (SETQ len (IABS (fetch MMFSStreamFieldLen
                                                                           of x]
                        when (type? MMFSTemplateData (fetch MMFSStreamFieldData of x))
                        do (MMFS.StoreString (fetch MMFSStreamFieldData of x)
                                  sVs len (OR (SUBSTRING str beg end strptr)
                                              "")
                                  T)))
         NIL])
```

(MMFS.ScalarValue

```
[LAMBDA (x sVs)                                          (* TAL "29-Jul-86 22.55")
                                                         (* This probably wants to be a macro too)
  (OR (NUMBERP x)
      (MMFS.FetchVar x sVs])
)
```

Raw data formatting

```
(DEFINEQ
```

(MMFS.InFields

```
[LAMBDA (source nBytes)                                (* TAL "12-Dec-86 13:13")
  (LET ((src (FVEC.Create source nBytes NIL (FVEC.ConstantBox)))
        grouper lastByte)
    (SETQ grouper (MMFS.InField src))
    (SETQ lastByte (COND
                     ((EQ (fetch MMFSFieldID of grouper)
                          MMFSIDCodeOC)                (* (COND ((GREATERP lastByte (FVEC Len src))
                                                       (Signal (QUOTE IllMsg) "Count in OC exceeds message length"))))
                      (PLUS (fetch MMFSFieldData of grouper)
                            (FVEC.Idx src)))
                     (T nBytes)))
    (CONS grouper (while (LESSP (FVEC.Idx src)
                                lastByte)
                    collect (MMFS.InField src])
```

(MMFS.InField

```
[LAMBDA (srcVec)                                       (* TAL "12-Dec-86 13:14")
  (LET (fld len id idDesc content fcDesc)
    (SETQ id (MMFS.InFixp srcVec (MMFS.InLength srcVec)
                NIL))
    (SETQ idDesc (MMFS.DescFromCode id))
    (SETQ len (MMFS.InLength srcVec))
    (SELECTQ (fetch MMFSIDContentType of idDesc)
        ((Code UI 80)
            (SETQ content (MMFS.InFixp srcVec len NIL)))
        ((CH U0)
            (SETQ content (MMFS.InString srcVec len)))
        (SI (SETQ content (MMFS.InFixp srcVec len T)))
        (SETQ content (MMFS.InString srcVec len)))
    (SETQ fld (create MMFSField
                 MMFSFieldID _ id
                 MMFSFieldData _ content
                 MMFSFieldLen _ len))
    (SELECTC id
        (MMFSIDCodeOS (replace MMFSFieldStreamData of fld with (MMFS.InString srcVec content)))
        NIL)
    fld])
```

(MMFS.InFixp

```
[LAMBDA (FVec Len Signed)                              (* TAL "23-Sep-86 19:05")
  (LET [(val (COND
               ((AND Signed (GREATERP (FVEC.Get FVec)
                                      127))
                -1)
               (T 0]
    [for i from 1 to Len do (SETQ val (LOGOR (LSH val 8)
                                             (FVEC.Get++ FVec]
    (COND
      ((GREATERP val MAX.FIXP)
       MAX.FIXP)
      ((LESSP val MIN.FIXP)
       MIN.FIXP)
      (T val])
```

(MMFS.InLength

```
[LAMBDA (FVec)                                         (* TAL "23-Sep-86 20:36")
  (LET ((x (FVEC.Get FVec)))
    (COND
      ((LESSP x 128)
       1)
      ((EQ x 128)
       (Signal 'IllMsg "Message contains illegal length octet (80)"))
      (T (DIFFERENCE (FVEC.Get++ FVec)
                     128])
```

MMFS.InString

```
[LAMBDA (FVec Len)                                     (* TAL "24-Sep-86 12:47")
  (FVEC.GetString FVec Len])
```

(MMFS.FieldsToString

```
[LAMBDA (Fields)                                       (* TAL "12-Dec-86 11:58")
  (LET ((grp (CAR Fields))
        nBytes string)
    [SETQ nBytes (COND
                   ((EQ (fetch MMFSFieldID of grp)
                        MMFSIDCodeOC)
                    (PLUS (fetch MMFSFieldData of grp)
                          (MMFS.FieldLen grp)))
                   (T (for f in Fields sum (MMFS.FieldLen f]
    (SETQ string (ALLOCSTRING nBytes))
    (MMFS.OutFields Fields string nBytes)
    string])
```

(MMFS.OutFields

```
[LAMBDA (fields dest nBytes)                              (* TAL "28-Sep-86 21.19")
  (LET [(dst (FVEC.Create dest nBytes NIL (FVEC.ConstantBox]
    (for f in fields do (MMFS.OutField f dst))
    dest])
```

(MMFS.OutField

```
[LAMBDA (field dstVec)                                    (* TAL "11-Dec-86 17 01")
  (LET ((id (fetch MMFSFieldID of field))
        (len (fetch MMFSFieldLen of field))
        (content (fetch MMFSFieldData of field))
        idDesc cType)
    (SETQ idDesc (MMFS.DescFromCode id))
    (SETQ cType (fetch MMFSIDContentType of idDesc))
    (MMFS.OutFixp dstVec id NIL NIL)
    [SELECTQ cType
        ((Code UI 80)
            (MMFS.OutFixp dstVec content len NIL))
        (SI (MMFS.OutFixp dstVec content len T))
        (CH (COND
              ((STRINGP content)                          (* I think its always a string here)
               (MMFS.OutString dstVec content len (CHARCODE SP)))
              (T (MMFS.OutFixp dstVec content len NIL))))
        (UD (COND
              ((STRINGP content)                          (* I think its always a string here)
               (MMFS.OutString dstVec content len 0))
              (T (MMFS.OutFixp dstVec content len NIL))))
        (COND
          ((NUMBERP cType)                                (* Never happens?)
           (MMFS.OutFixp dstVec cType len NIL))
          ((STRINGP content)
           (MMFS.OutString dstVec content len))
          ((FIXP content)
           (MMFS.OutFixp dstVec content len NIL]
    (SELECTC id
        (MMFSIDCodeOS (FVEC.PutString dstVec (fetch MMFSFieldStreamData of field)
                             content))
        NIL])
```

(MMFS.OutFixp

```
[LAMBDA (FVec Val Len Signed)                             (* TAL "28-Sep-86 21:26")
  (LET ((len (OR Len (MMFS.ConstantLength Val)))
        (val Val)
        newIdx)
    [COND
      ((OR (NEQ len 1)
           (GREATERP val 127)
           (AND Signed (MINUSP val)))
       (FVEC.Put++ FVec (LOGOR len 128]
    [FVEC.Idx FVec (SETQ newIdx (PLUS len (FVEC.Idx FVec]
    [FRPTQ len (FVEC.--Put FVec (LOGAND val 255))
        (COND
          (Signed (SETQ val (RSH val 8)))
          (T (SETQ val (LRSH val 8]
    (FVEC.Idx FVec newIdx])
```

(MMFS.OutString

```
[LAMBDA (FVec String Len Pad)                             (* TAL "28-Sep-86 21:17")
  (LET [(len (OR Len (NCHARS String]
    [COND
      ((OR (NEQ len 1)
           (GREATERP (NTHCHARCODE String 1)
                     127))
       (FVEC.Put++ FVec (LOGOR 128 len]
    (FVEC.PutString FVec String Len Pad])
```

)

.. Msg printing (DEFINEQ

(MMFS.PrintFields

```
[LAMBDA (fields stream)                                   (* TAL " 6-Aug-86 20:42")
  (for x on fields do (MMFS.PrintField (CAR x)
                                       stream NIL)
                      (AND (CDR x)
                           (SPACES 1 stream])
```

(MMFS.PrintField

```
[LAMBDA (field strm templateFlg)                          (* TAL "12-Dec-86 11 59")
  (LET* ((id (fetch MMFSFieldID of field))
         (data (fetch MMFSFieldData of field))
         (len (fetch MMFSFieldLen of field))
         (idDesc (MMFS.DescFromCode id))
         (idName (fetch MMFSIDName of idDesc))
         (fnCode (MMFS.FunctionCode field idDesc)))
```

```
(printout strm '<)
(COND
   (fnCode (printout strm fnCode '>))
   (T (COND
          ((NUMBERP idName)
           (MMFS.PrintHex idName strm))
          (idName (printout strm idName))
          (T (SHOULDNT)))
      [COND
          (data (printout strm '%:)
                (SELECTQ (fetch MMFSIDContentType of idDesc)
                      ((Code 80)
                          (MMFS.PrintHex data strm))
                      ((UI SI)
                          [COND
                              ((AND len (NEQ len 1))
                               (MMFS.PrintHex (PLUS len 128)
                                      strm)
                               (printout strm ':]
                          (MMFS.PrintHex data strm))
                      (CH (printout strm '%" (OR (STRINGP data)
                                                   (FCHARACTER data))
                                  '%"))
                      (UO (MMFS.PrintStreamData (OR (STRINGP data)
                                                      (MMFS.FixpToString data len))
                                 strm NIL))
                      (MMFS.PrintHex data strm]
      (printout strm '>)
      (SELECTC id
          (MMFSIDCodeOS (PRIN1 "<<" strm)
                        (MMFS.PrintStreamData (fetch MMFSFieldStreamData of field)
                               strm MMFS.OSPrintLimit)
                        (PRIN1 ">>" strm))
          NIL])
```

(MMFS.PrintHex

```
[LAMBDA (num stream)                                   (* TAL " 6-Aug-86 20:24")
  (printout stream |.I1.16| num])
```

Page 12

(MMFS.PrintStreamData

```
[LAMBDA (data strm maxBytes)                           (* TAL "12-Dec-86 12:05")
  (bind (max _ (NUMBERP maxBytes)) for i from 1 to (NCHARS data)
     do (COND
           ((NEQ i 1)
            (SPACES 1 strm)))
        (COND
           ((AND max (GREATERP i max))
            (PRIN1 "..." strm)
            (RETURN)))
        (printout strm |.I1.16| (OR (NTHCHARCODE data i)
                                     0])

)
```

.. Miscellaneous

```
(DEFINEQ
```

(FISEvaluateProgram

```
[LAMBDA (self ExprOrFunction /process\ /step\ /cycle\)      . Edited 25-Jun-88 18:54 by ligkis
```

... Evaluate either an expr or a function with the variables in the process's stateVariables bound to their values.

```
  (PROG (/stateVariables\)
        (DECLARE (SPECVARS /stateVariables\ /process\ /step\ /cycle\))
        (COND
           ((NULL ExprOrFunction)
            (RETURN NIL))
           ((EQ ExprOrFunction T)
            (RETURN T)))
        (SETQ /stateVariables\ (@ /process\ %:stateVariables))
        (RETURN (COND
                   [(LITATOM ExprOrFunction)
                    (COND
                       ((DEFINEDP ExprOrFunction)
                        (APPLY* ExprOrFunction self /process\ /step\ /cycle\))
                       (T (CVAR.REF ExprOrFunction /stateVariables\]
                   ((LISTP ExprOrFunction)
                    (EVAL ExprOrFunction))
                   (T (HELP "FISEvaluateProgram given a non-Expr with no definition: " ExprOrFunction])
```

(MMFS.ConstantLength

```
[LAMBDA (constant)                                     (* TAL " 3-Sep-86 13.48")
  (COND
     [(NUMBERP constant)
      (COND
         ((WithinRange? constant -256 255)
          1)
         ((WithinRange? constant -65536 65535)
```

```
        2)
       ((WithinRange? constant -4294967296 4294967295)
        4)
       (T (IQUOTIENT (PLUS 7 (INTEGERLENGTH constant))
                 8]
    ((STRINGP constant)
     (NCHARS constant))
    (T (MMFS.ParseError "Illegal constant in template: " constant])
```

(MMFS.EncodedByteLength

```
  [LAMBDA (Val Len)                                        (* TAL "12-Dec-86 12:17")
    (LET [(len (OR Len (MMFS.ConstantLength Val]
      (COND
        ([OR (NEQ len 1)
             (COND
               ((FIXP Val)
                (OR (GREATERP Val 127)
                    (MINUSP Val)))
               ((STRINGP Val)
                (GREATERP (NTHCHARCODE Val 1)
                          127]
         (ADD1 len))
        (T len])
```

Page 13

(MMFS.FieldLen

```
  [LAMBDA (field)                                          (* TAL "11-Dec-86 17:01")

        (* Returns the number of bytes in the encoded representation of the field, taking into account any necessary length bytes.)

    (LET ((id (fetch MMFSFieldID of field))
          content len)
      (SETQ content (OR (fetch MMFSFieldData of field)
                        0))
      [SETQ len (PLUS (MMFS.EncodedByteLength id NIL)
                      (MMFS.EncodedByteLength content (fetch MMFSFieldLen of field]
      (SELECTC id
          (MMFSIDCodeDS (add len content))
          NIL)
      len])
```

(MMFS.FindMatchingTemplate

```
  [LAMBDA (msg templates sVs)                              (* TAL "16-Oct-86 13:06")
    (OR sVs (HELP "You forgot to pass sVs to MMFS.FindMatchingTemplate"))
    (LET ((msgData (@ msg %:dataDescription))
          (src (@ msg %:source))
          (dst (@ msg %:destination)))
      (for template in templates thereis (AND (EQ src (@ template %:source))
                                              (EQ dst (@ template %:destination))
                                              (MMFS.MatchFields? msgData (@ template %:dataDescription)
                                                     sVs])
```

(MMFSMessageDefinitionCompareFn

```
  [LAMBDA (X Y)                                            Edited 7-Jun-88 17:02 by mct
    (bind res for field in '(source destination) thereis (NEQ (SETQ res (UALPHORDER (GetValue X field)
                                                                                     (GetValue Y field)))
                                                              'EQUAL)

       thenyield res elseyield T])
```

(MMFSSendTemplateAnalysisCompareFn

```
  [LAMBDA (X Y)                                            Edited 7-Jun-88 17:02 by mct
    (bind res for field in '(source destination templateID) thereis (NEQ (SETQ res (UALPHORDER (GetValue
                                                                                                  X field)
                                                                                               (GetValue Y field))

                                                                         )
                                                                         'EQUAL)

       thenyield res elseyield T])
```

(\MMFSSend

```
  [LAMBDA (mapConnection senderName templateID)            Edited 10-May-88 17:32 by loops
    (DECLARE (USEDFREE /process\ /step\))
    (PROG (folder msg msgTemplate errMsg tn)
      TRY [COND
            ((SETQ errMsg (COND
                            ((NOT (SETQ folder (FISTemplatesForSender senderName /step\)))
                             (LIST "Couldn't find " senderName " sender"))
                            ((NOT (SETQ msgTemplate (_ folder LookupTemplate templateID)))
                             (LIST "Couldn't find template " templateID " in " senderName " sender"))
                            (T NIL)))
             (SimulationBreak /process\ /step\ errMsg '((Abort (RETURN 0))
                                                        (Continue (RETURN 0))
                                                        (Retry (GO TRY]
          (SETQ msg (_ ($ MMFSMessage)
                       New))
          (SETQ tn (_ msg ConstructMsg msgTemplate (@ /process\ %:stateVariables)
                      /step\
                      (@ folder %:caller)))
          (_@ msg %:sender /step\)
          (_ MapNetwork SendMessage msg mapConnection)
          (RETURN tn])
```

```
)

        (* * Field descriptors)

(DECLARE%: EVAL@COMPILE

(HASHLINK MMFSIDCode (MMFSIDCodeDesc MMFSIDDescrHash 200))

(HASHLINK MMFSIDMnemonic (MMFSIDMnemonicDesc MMFSIDDescrHash 200))
)
```

```
(DECLARE%: EVAL@COMPILE

(GLOBALVARS MMFSIDDescrHash)
)

(SETUPHASHARRAY 'MMFSIDDescrHash 200)

(DECLARE%: EVAL@COMPILE

(GLOBALVARS MMFSIDDescrHash)
)

(SETUPHASHARRAY 'MMFSIDDescrHash 200)

(DECLARE%: EVAL@COMPILE

(PUTPROPS MMFS.DescFromCode MACRO (OPENLAMBDA (Code)
                                       (OR (fetch MMFSIDCodeDesc of Code)
                                           (MMFS.DescFromCode1 Code))))
)

(DEFINEQ
```

(MMFS.DescFromCode1

```
  [LAMBDA (Code)                                   (* TAL "12-Dec-86 12:22")
                                                   (* Called by MMFS.DescFromCode macro if no desc found)
    (LET ((desc (fetch MMFSIDCodeDesc of Code)))
      (COND
         (desc)
         (T (pushnew MMFS.UnknownCodes Code)
            (create MMFSIDDesc
                    MMFSIDName _ Code
                    MMFSIDContentType _ 'UI
                    MMFSIDEncoding _ Code])
```

(MMFS.DescFromID

```
  [LAMBDA (ID)                                     (* TAL " 1-Oct-86 17:20")
    (LET ((desc (fetch MMFSIDMnemonicDesc of ID)))
      (COND
         (desc)
         (T NIL)
         (T (pushnew MMFS.UnknownIDs ID)
            (create MMFSIDDesc
                    MMFSIDName _ ID
                    MMFSIDContentType _ 'UI
                    MMFSIDEncoding _ 254])
```

(MMFS.FunctionCode

```
  [LAMBDA (field IDDesc)                           (* TAL "11-Dec-86 14:03")
    (LET ([idDesc (OR IDDesc (MMFS.DescFromCode (fetch MMFSFieldID of field]
          fcDesc)
      (SELECTQ (fetch MMFSIDContentType of idDesc)
           (Code (COND
                    ([SETQ fcDesc (CDR (FASSOC (fetch MMFSFieldData of field)
                                               (fetch MMFSIDFunctionCodes of idDesc]
                     (fetch MMFSIDName of fcDesc))))
           NIL])
```

(MMFS.SetupIDHash

```
  [LAMBDA (OtherIDDescrs)                          (* TAL "20-Jan-88 14:03")
                                                   (* Initialize the mappings from MMFS field id mnemonics and codes to
    the descriptions)                              (* Descrs are short lists, copy them to avoid bloating GC hash)
    (LET NIL
      (CLRHASH MMFSIDDescrHash)
      (MMFS.SetupIDHash1 MMFSIDDescrs)
      (AND (LISTP OtherIDDescrs)
           (MMFS.SetupIDHash1 OtherIDDescrs))
      [SETQ MMFSInitialGrouperCodes (for x in MMFSInitialGroupers collect (fetch MMFSIDEncoding
                                                                               of (MMFS.DescFromID x]
      NIL])
```

```
(MMFS.SetupIDHash1
  [LAMBDA (Descrs)                                          (* TAL "21-Jan-88 19:54")
    (bind name code content tmp pDesc for desc in Descrs eachtime (SETQ name (fetch MMFSIDName of desc))
                                                              (SETQ code (fetch MMFSIDEncoding of desc))
                                                              (SETQ content (fetch MMFSIDContentType
                                                                                   of desc))
       when (AND name (NEQ (CAR desc)
                           '*))
       do [COND
            ((AND (SETQ tmp (fetch MMFSIDMnemonicDesc of name))
                  (NOT (EQUAL tmp desc)))                   (* name already defined)
             (ERROR "Duplicate definitions for MMFS ID name:" (LIST name tmp 'vs. desc)))
            (T (replace MMFSIDMnemonicDesc of name with (APPEND desc]
          (COND
            [(FIXP content)
             (COND
               ((NOT (SETQ pDesc (fetch MMFSIDCodeDesc of code)))
                (ERROR "Parent ID of MMFS function code not defined" desc))
               ((AND [SETQ tmp (CDR (FASSOC content (fetch MMFSIDFunctionCodes of pDesc]
                     (NOT (EQUAL tmp desc)))
                (ERROR "Duplicate definitions for MMFS function code:" (LIST content tmp 'vs. desc)))
               (T (change (fetch MMFSIDFunctionCodes of pDesc)
                          (MyPutAssoc content (APPEND desc)
                                      DATUM]
            (T (COND
                 ([AND (SETQ tmp (fetch MMFSIDCodeDesc of code))
                       (OR (NEQ name (fetch MMFSIDName of tmp))
                           (NEQ content (fetch MMFSIDContentType of tmp]
                                                            (* ID code already defined)
                  (ERROR "Duplicate names for MMFS ID code:" (LIST code tmp 'vs. desc)))
                 (T (replace MMFSIDCodeDesc of code with (APPEND desc])
)

(RPAQ? MMFS.UnknownIDs NIL)

(RPAQ? MMFS.UnknownCodes NIL)

(RPAQQ MMFSProceduralControls (CRQ CMD FRS DRS NRS UDI UDR ABO))

(RPAQQ MMFSGroupers (OC GC PG POP CC))

(RPAQQ MMFSInitialGroupers (OC GC POP))

(RPAQQ MMFSIDCodeConstants ((MMFSIDCodeOC 1)
                            (MMFSIDCodeTN 31)
                            (MMFSIDCodeOS 5)
                            (MMFSIDCodeBO 20)))

(DECLARE%: EVAL@COMPILE

(RPAQQ MMFSIDCodeOC 1)

(RPAQQ MMFSIDCodeTN 31)

(RPAQQ MMFSIDCodeOS 5)

(RPAQQ MMFSIDCodeBO 20)

(CONSTANTS (MMFSIDCodeOC 1)
       (MMFSIDCodeTN 31)
       (MMFSIDCodeOS 5)
       (MMFSIDCodeBO 20))
)

(FILESLOAD MMFSDEFS)

(DECLARE%: DOEVAL@COMPILE DONTCOPY

(GLOBALVARS MMFSIDDescrs MMFSGroupers MMFSInitialGrouperCodes MMFSProceduralControls MMFS.UnknownIDs
       MMFS.UnknownCodes)

 MMFS.SetupIDHash)
```

```
          (* * Interface to C runtime, etc.)

(DEFINEQ

(MMFS.ArrayData?
  [LAMBDA (mmfsTemplateData)                                (* TAL "31-Jul-86 18:28")
    (EQ (fetch CCType/Type of (fetch MMFSTemplateDataType of mmfsTemplateData))
        'array])

(MMFS.CIdentifierType
  [LAMBDA (Name CCEnv)                                      (* TAL "10-Aug-87 18:32")
    (LET [(id (OR (CCEnv.LookupID Name CCEnv)
                  (MMFS.ParseError "Undeclared identifier: " Name]
      (fetch CCID/Type of id]))
```

(MMFS.IntegralData?

```
[LAMBDA (data)                                          (* TAL "31-Jul-86 19:05")
  (COND
     ((type? MMFSTemplateData data)
      (AND (CC.IntegralType? (fetch MMFSTemplateDataType of data))
           data))
     (T (FIXP data])
```

(MMFS.ScalarData?

```
[LAMBDA (mmfsTemplateData)                              (* TAL "22-Oct-86 17 27")
  (NOT (FMEMB (fetch CCType/Type of (fetch MMFSTemplateDataType of mmfsTemplateData))
              '(array pointer struct union])
```

(MMFS.SignedData?

```
[LAMBDA (data)                                          (* TAL "29-Jul-87 14.49")
  (COND
     ((type? MMFSTemplateData data)
      (SELECTQ (fetch CCType/Type of (fetch MMFSTemplateDataType of data))
           ((char ushort uint ulong)
              NIL)
           data))
     ((NUMBERP data)
      (MINUSP data])
```

(MMFS.VarLength

```
[LAMBDA (MMFSTemplateData subTypeFlg)                   (* TAL "22-Oct-86 17 36")
  (LET ((ccType (fetch MMFSTemplateDataType of MMFSTemplateData)))
    (COND
       ((OR subTypeFlg (CC.PointerType? ccType))
        (CC.TypeSize (fetch CCType/SubType of ccType)))
       (T (CC.TypeSize ccType])

)

(DEFINEQ
```

(MMFS.FetchString

```
[LAMBDA (tData sVs len ignoreNull)                      (* TAL "22-Oct-86 17:28")
                                                        (* Return a lisp string with either the contents of an array or integer)
  (COND
     [(type? MMFSTemplateData tData)
      (LET ((val (MMFS.FetchVar tData sVs)))
        (COND
           ((NOT (MMFS.ScalarData? tData))
            (CR.LispString val len ignoreNull))
           ((MMFS.IntegralData? tData)
            (MMFS.FixpToString val len (MMFS.SignedData? tData)))
           (T (ERROR "Variable is not correct type for template" (fetch MMFSTemplateDataName of tData]
     (T (COND
           ((FIXP tData)
            (MMFS.FixpToString tData len (MINUSP tData)))
           (T (ERROR "Variable is not correct type for template" tData])
```

MMFS.FetchVar

```
[LAMBDA (tData sVs)                                     (* TAL " 2-Aug-86 13 24")
  (CR.Fetch (fetch MMFSTemplateDataName of tData)
         (fetch MMFSTemplateDataType of tData)
         sVs])
```

MMFS.FetchArrayVar

```
[LAMBDA (tData sVs index)                               Edited 9-Jun-88 14:43 by mcf
  (CR.ArrayFetch (fetch MMFSTemplateDataName of tData)
         (fetch MMFSTemplateDataType of tData)
         sVs index])
```

(MMFS.StoreArrayVar

```
[LAMBDA (tData sVs val index)                           (* TAL " 4-Aug-86 16:34")
  (CR.ArrayStore (fetch MMFSTemplateDataName of tData)
         (fetch MMFSTemplateDataType of tData)
         sVs val index])
```

(MMFS.StoreVar

```
[LAMBDA (tData sVs val)                                 (* TAL " 2-Aug-86 13:33")
  (CR.Store (fetch MMFSTemplateDataName of tData)
         (fetch MMFSTemplateDataType of tData)
         sVs val])
```

(MMFS.StoreString

```
[LAMBDA (tData sVs len string dontNullTerminate)        (* TAL "22-Oct-86 17 28")
                                                        (* Store the contents of a string into either a C array or scalar var)
  (LET (val)
    (COND
       ((NOT (MMFS.ScalarData? tData))
        (CR.StoreString (MMFS.FetchVar tData sVs)
               string len dontNullTerminate))
```

```
[(MMFS.IntegralData? tData)
 (MMFS.StoreVar tData sVs (MMFS.StringToFixp string len (MMFS.SignedData? tData]
(T (ERROR "Variable is not correct type for template" (fetch MMFSTemplateDataName of tData])
```

(MMFS.FixpToString

```
[LAMBDA (Val Len Signed)                                      (* TAL " 3-Aug-86 21 37")
  (LET ((str (ALLOCSTRING Len 0 NIL NIL)))
    [for i from Len to 1 by -1 do (RPLCHARCODE str i (LOGAND Val 255))
                                  (COND
                                     (Signed (SETQ Val (RSH Val 8)))
                                     (T (SETQ Val (LRSH Val 8]
    str])
```

(MMFS.StringToFixp

```
[LAMBDA (String Len Signed)                                   (* TAL " 5-Aug-86 20.10")
  (LET [(val (COND
               ((AND Signed (GREATERP (NTHCHARCODE String 1)
                                      127))
                -1)
               (T 0]
    [for i from 1 to (OR Len (NCHARS String)) do (SETQ val (LOGOR (LSH val 8)
                                                                  (NTHCHARCODE String i]
    (COND
       ((GREATERP val MAX.FIXP)
        MAX.FIXP)
       ((LESSP val MIN.FIXP)
        MIN.FIXP)
       (T val])
)

(RPAQ? MMFS.DSPrintLimit 30)

(DECLARE%: DOEVAL@COMPILE DONTCOPY

(GLOBALVARS MMFS.DSPrintLimit)
)

(APPENDTOVAR SWGlobalParameters (MMFS<DS>PrintLimit MMFS.DSPrintLimit NUMBERP "Maximum number of bytes to
                                 print from <DS> fields"))


        (* * Message, template and folder objects)

(DEFCLASS CreateMMFSReceivable (MetaClass Class Edited%:      (* TAL "13-Dec-86 22.04")
                                doc "This is the default metaClass for all classes")
    (Supers ExamineMMFSReceivableMessageDefinitionContext)
    (ClassVariables (MenuName "Add Message Template")
        (MenuDoc "Create and edit a new receivable message template"))
    (InstanceVariables (doesCreate T)))
```

Page 18

```
(DEFCLASS CreateMMFSSendable (MetaClass Class Edited%:        (* TAL "13-Dec-86 22.05")
                              doc "This is the default metaClass for all classes")
    (Supers ExamineMMFSSendableMessageDefinitionContext)
    (ClassVariables (MenuName "Add Message Template")
        (MenuDoc "Create and edit a new sendable message template"))
    (InstanceVariables (doesCreate T)))

(DEFCLASS ExamineMMFSFolderFormContext (MetaClass Class Edited%:
                                                              (* TAL "25-Sep-86 17.33")
                                        doc "This is the default metaClass for all classes")
    (Supers ExamineFormContext))

(DEFCLASS ExamineMMFSMessageDefinitionContext (MetaClass Class Edited%:
                                                              (* TAL "13-Dec-86 22:02")
                                               doc "This is the default metaClass for all classes")
    (Supers ExamineFormContext)
    (ClassVariables (AttachHorizMenu T)
        (MenuName "View Message Template")
        (MenuDoc "View this template in detail")))

(DEFCLASS ExamineMMFSMessageFolderContext (MetaClass Class Edited%:
                                                              . Edited 29-Jun-88 02:23 by lipkis
                                           doc "This is the default metaClass for all classes")
    (Supers ExamineFolderContentsContext)
    (ClassVariables (AttachHorizMenu T)
        (Browser #,($C TemplateFolderBrowser))
        (SubContextTypes (#,($C ExamineFormContext) #,($C GrafcetMsgAnalysisContext)
                          #,($C GrafcetUsesContext)))
        (LinkedContexts NIL)
        (SubContexts NIL))
    (InstanceVariables (canCreate T)
        (object NIL VR #,($C MMFSMessageDefinitionFolder))))

(DEFCLASS ExamineMMFSReceivableMessageDefinitionContext (MetaClass Class Edited%:
                                                              Edited 29-Jun-88 02:24 by lipkis
                                                              doc "This is the default metaClass for all
                                                              classes")
    (Supers ExamineMMFSMessageDefinitionContext)
    (InstanceVariables (object NIL VR #,($C MMFSReceivableMessageDefinition))))
```

```
(DEFCLASS ExamineMMFSSendableMessageDefinitionContext (MetaClass Class Edited%:
                                                                 . Edited 29-Jun-88 02:24 by lipkis
                                                                 doc "This is the default metaClass for all
                                                                 classes")
       (Supers ExamineMMFSMessageDefinitionContext)
       (InstanceVariables (object NIL VR #,($C MMFSSendableMess...efinition))))

(DEFCLASS ExamineReceivableFolderFormContext (MetaClass Class Edited%:
                                                                 . Edited 29-Jun-88 02.24 by lipkis
                                                       doc "This is the default metaClass for all classes")
       (Supers ExamineMMFSFolderFormContext)
       (ClassVariables (AttachHorizMenu T)
              (MenuName "View Template Defaults")
              (MenuDoc "View the default properties common to all these receive templates."))
       (InstanceVariables (object NIL VR #,($C MMFSReceivableDefFolder))))

(DEFCLASS ExamineReceivableMessageFolderContext (MetaClass Class Edited%:
                                                                 . Edited 29-Jun-88 02.23 by lipkis
                                                          doc "This is the default metaClass for all classes")
       (Supers ExamineMMFSMessageFolderContext)
       (ClassVariables (MenuName "View Receive Templates")
              (MenuDoc "View the MMFS templates for messages this step can receive."))
       (InstanceVariables (object NIL VR #,($C MMFSReceivableFolder))))

(DEFCLASS ExamineReceiveStepFormContext (MetaClass Class Edited%:
                                                                 . Edited 29-Jun-88 02:22 by lipkis
                                                   doc "This is the default metaClass for all classes")
       (Supers ExamineFormContext)
       (ClassVariables (AttachHorizMenu T)
              (MenuName "View Receive Parameters")
              (MenuDoc "View the paramters that control the behavior of this receive step."))
       (InstanceVariables (object NIL VR #,($C GrafcetReceiveStep))))

(DEFCLASS ExamineSendableFolderFormContext (MetaClass Class Edited%:
                                                                 . Edited 29-Jun-88 02.25 by lipkis
                                                      doc "This is the default metaClass for all classes")
       (Supers ExamineMMFSFolderFormContext)
       (ClassVariables (AttachHorizMenu T)
              (MenuName "View Template Defaults")
              (MenuDoc "View the default properties common to all these send templates."))
       (InstanceVariables (object NIL VR #,($C MMFSSendableDefFolder))))
```

```
(DEFCLASS ExamineSendableMessageFolderContext (MetaClass Class Edited%:
                                                                 . Edited 29-Jun-88 02:23 by lipkis
                                                        doc "This is the default metaClass for all classes")
       (Supers ExamineMMFSMessageFolderContext)
       (ClassVariables (MenuName "View Send Templates")
              (MenuDoc "View the MMFS send templates contained here."))
       (InstanceVariables (object NIL VR #,($C MMFSSendableFolder))))

(DEFCLASS MMFSMessage (MetaClass Class Edited%:              . Edited 29-Jun-88 02:16 by lipkis
                              doc "This is the default metaClass for all classes")
       (Supers MapMessage MMFSMessageDefinition)
       (ClassVariables (PrintName "MMFS Message")
              (CopyFromTemplateFields (source destination comment))
              (SummaryFields (source destination data comment))
              (DisplayFields (source destination data)))
       (InstanceVariables (data #,($A UnparseDataField FFSendSelf ReplaceMe) DontSave Any doc "Printed
                              representation of MMFS fields")
              (dataDescription #,($A ParseRawData FFSendSelf ReplaceMe) DontSave Any doc "List of MMFSFields.
                     Stored directly into outgoing msgs, generated from raw data in msgs coming from outside
                     world")
              (rawData #,($A GenerateRawData FFSendSelf ReplaceMe) DontSave Any doc "String of raw bytes.
                     Stored directly in msgs from outside world, generated by AV when msg sent to outside
                     world")))

(DEFCLASS MMFSMessageDefinition (MetaClass AbstractClass Edited%:
                                                                 . Edited 29-Jun-88 02.20 by lipkis
                                          doc "Abstract classes are placeholders in the inheritance network,
                                          which cannot themselves be instantiated.")
       (Supers CommunicationObject)
       (ClassVariables (SummaryFields (source destination data comment))
              (DisplayFields (source destination data comment))
              (PrintName "Message Template")
              (AnalysisCallerClass #,($C AnalysisRefMMFS)))
       (InstanceVariables (container NIL DontSave Any doc "Definition folder that I am in (NOT analysis
                              folder)")
              (source NIL heading Src TeditType Atom)
              (destination NIL heading Dst TeditType Atom)
              (data NIL heading Fields TeditType String)
              (comment NIL heading Comment)))

(DEFCLASS MMFSMessageDefinitionFolder (MetaClass Class Edited%:
                                                                 . Edited 29-Jun-88 02.18 by lipkis
                                                doc "This is the default metaClass for all classes")
       (Supers Folder)
       (ClassVariables (SortCompareFn MMFSMessageDefinitionCompareFn))
       (InstanceVariables (elements NIL VR #,($C MMFSMessageDefinition))))

(DEFCLASS MMFSReceivableDefFolder (MetaClass Class Edited%:   Edited 29-Jun-88 02.19 by lipkis
                                          doc "This is the default metaClass for all classes")
       (Supers SWNamedObject MMFSReceivableFolder)
```

```
        (ClassVariables (SummaryFields (source data comment action))
                (DisplayFields (defaultSource))
                (FolderHorizMethodItems ((Add (#,($C CreateMMFSReceivable) AddTemplate)
                                                "Create and edit a new message template")
                                          (Compile CompileTemplate "Compile message templates")))
                (AllowDeletion T doc "default doesn't permit deletion"))
        (InstanceVariables (elements NIL VR #,($C MMFSReceivableMessageDefinition))
                (defaultSource NIL heading "Default Source" TeditType Atom)))

(DEFCLASS MMFSReceivableFolder (MetaClass Class Edited%:       . Edited 29-Jun-88 02:18 by lipkis
                                          doc "This is the default metaClass for all classes")
        (Supers MMFSMessageDefinitionFolder)
        (InstanceVariables (elements NIL VR #,($C MMFSReceivableMessageDefinition))))

(DEFCLASS MMFSReceivableMessageDefinition (MetaClass Class Edited%:
                                                        . Edited 29-Jun-88 02:21 by lipkis
                                                 doc "This is the default metaClass for all classes")
        (Supers MMFSMessageDefinition)
        (ClassVariables (PrintName "Receivable Template")
                (SummaryFields (source destination data comment action))
                (DisplayFields (source destination data comment action))
                (AnalysisCallerClass #,($C AnalysisRefMMFSRcv)))
        (InstanceVariables (action NIL heading Effect TeditType String)
                (lispAction NIL DontSave Any)
                (data NIL)
                (dataDescription NIL DontSave Any doc "parsed form of data")
                (printName #,($A ComputePrintName AVSendSelf NoUpdatePermitted) DontSave Any)
                (staticAnalysis NIL DontSave Any)))

                                                                                    Page 2C

(DEFCLASS MMFSSendableDefFolder (MetaClass Class Edited%:      . Edited 29-Jun-88 02:19 by lipkis
                                          doc "This is the default metaClass for all classes")
        (Supers SWNamedObject MMFSSendableFolder)
        (ClassVariables (SummaryFields (templateID destination data comment))
                (DisplayFields (defaultDestination defaultGrouper defaultTN))
                (FolderHorizMethodItems ((Add (#,($C CreateMMFSSendable) AddTemplate)
                                                "Create and edit a new message template")
                                          (Compile CompileTemplate "Compile message templates")))
                (AllowDeletion T doc "default doesn't permit deletion"))
        (InstanceVariables (elements NIL VR #,($C MMFSSendableMessageDefinition))
                (defaultGrouper "<OC:0x82;>" heading "Default Grouper" TeditType String)
                (defaultTN "<TN:0x82;>" heading "Default TN" TeditType String)
                (defaultDestination NIL heading "Default Destination" TeditType Atom)))

(DEFCLASS MMFSSendableFolder (MetaClass Class Edited%:         . Edited 29-Jun-88 02:19 by lipkis
                                     doc "This is the default metaClass for all classes")
        (Supers MMFSMessageDefinitionFolder)
        (InstanceVariables (elements NIL VR #,($C MMFSSendableMessageDefinition))))

(DEFCLASS MMFSSendableMessageDefinition (MetaClass Class Edited%:
                                                        . Edited 29-Jun-88 02:21 by lipkis
                                               doc "This is the default metaClass for all classes")
        (Supers MMFSMessageDefinition)
        (ClassVariables (PrintName "Sendable Template")
                (SummaryFields (templateID source destination data comment))
                (DisplayFields (templateID source destination data comment))
                (AnalysisCallerClass #,($C AnalysisRefMMFSSnd)))
        (InstanceVariables (templateID NIL heading Msg# TeditType Read)
                (data NIL)
                (dataDescription NIL DontSave Any doc "parsed form of data")
                (printName #,($A ComputePrintName AVSendSelf NoUpdatePermitted) DontSave Any)
                (staticAnalysis NIL DontSave Any)))

(\BatchMethodDefs)

(Method ((CreateMMFSReceivable CreateObject) self)
                                                                . TAL 10-Jan-88 19:12
   "Put the receiver name in newly created receive templates"
   (LET ((obj (_Super self CreateObject))
         spawner folder caller label)
     [COND
        ((AND obj (SETQ spawner (CAR (@ %:spawningContexts)))
              (_ spawner InstOf! 'ExamineMMFSMessageFolderContext)
              (SETQ folder (@ spawner %:object)))
         (_@ obj %:container folder)
         [COND
            ((AND (SETQ caller (@ folder %:caller))
                  (SETQ label (@ caller %:label)))
             (_@ obj %:destination (MKATOM label)))]
         (COND
            ((@ folder %:defaultSource)
             (_@ obj %:source (@ folder %:defaultSource)))]
     obj))

(Method ((CreateMMFSSendable CreateObject) self)
                                                                . TAL 10-Jan-88 19:12
   "Put the sender name in newly created send templates"
   (LET ((obj (_Super self CreateObject))
         spawner folder caller label)
```

```
  [COND
     ((AND obj (SETQ spawner (CAR (@ %:spawningContexts)))
           (_ spawner InstOf! 'ExamineMMFSMessageFolderContext)
           (SETQ folder (@ spawner %:object)))
      (_@ obj %:container folder)
      [COND
        ((AND (SETQ caller (@ folder %:caller))
              (SETQ label (@ caller %:label)))
         (_@ obj %:source (MKATOM label))]
      (COND
        ((@ folder %:defaultDestination)
         (_@ obj %:destination (@ folder %:defaultDestination))]
  obj))
```

Page 2`

(Method ((MMFSMessage ConstructMsg) self template svHash step sendStep) TAL 11-Dec-86 18.25

```
  "Fills in a MMFSMessage from a template, looking up any necessary variable values in the specified
  process, and returns the transaction number (<TN>) of the message."
  (LET ((tn 0)
        fields grpF tnF pcF len)
    (for iv in (@ |::CopyFromTemplateFields|) do (PutValue self iv (GetValue template iv)))
    (SETQ fields (MMFS.BuildMsgFields (@ template %:dataDescription)
                                      svHash))
    (SETQ grpF (CAR fields))
    (SETQ tnF (CADR fields))
    (SETQ pcF (CADDR fields))
    (SELECTC (fetch MMFSFieldID of tnF)
         (MMFSIDCodeTN [COND
                         [(SETQ tn (FIXP (fetch MMFSFieldData of tnF]
                         (T (replace MMFSFieldData of tnF with (SETQ tn (LOGAND (@ sendStep %:lastTN)
                                                                                 65535)))
                            (change (@ sendStep %:lastTN)
                                    (LOGAND 65535 (ADD1 tn])
         NIL)
    (SELECTC (fetch MMFSFieldID of grpF)
         (MMFSIDCodeOC [COND
                         ((OR T (NULL (fetch MMFSFieldData of grpF)))
                          [change (fetch MMFSFieldData of grpF)
                                  (SETQ len (for fld in (CDR fields) sum (MMFS.FieldLen fld]
                          (change (fetch MMFSFieldLen of grpF)
                                  (IMAX DATUM (MMFS.ConstantLength len])
         NIL)
    (_@ %:dataDescription fields)
    tn))
```

(Method ((MMFSMessage GenerateRawData) self) TAL 29-Sep-86 11 45

```
  "New method template"
  (LET ((fields (@ %:dataDescription))
        rawData errMsg)
    (SETQ rawData (enable UnknownID => (goto UnknownID)
                          TooLong => (goto TooLong)
                          (MMFS.FieldsToString fields)
                          UnknownID -> (SETQ errMsg (CONCAT "Unknown MMFS ID: " $SignalArg$))
                          TooLong -> "Message longer than maximum"))
    (COND
      (errMsg (_@ %:comment errMsg)
              NIL)
      (T rawData))))
```

(Method ((MMFSMessage MatchFilter?) self filter src/dst) TAL 8-May-87 12 06

```
  "New method template"
  (LET (s/d (corres (@ filter %:correspondent)))
    (SELECTQ src/dst
         (Source [AND (OR (NOT corres)
                          (FMEMB (@ %:destination)
                                 corres))
                      (AND (SETQ s/d (@ %:source))
                           (FMEMB s/d (OR (@ filter %:source)
                                          (@ filter %:either)])
         (Destination [AND (OR (NOT corres)
                               (FMEMB (@ %:source)
                                      corres))
                           (AND (SETQ s/d (@ %:destination))
                                (FMEMB s/d (OR (@ filter %:destination)
                                               (@ filter %:either)])
         NIL)))
```

(Method ((MMFSMessage ParseRawData) self) TAL 24-Sep-86 19 38

```
  "New method template"
  (LET ((rawData (@ %:rawData))
        fields errMsg)
    (SETQ fields (enable IllMsg => (goto IllMsg)
                         IllBounds => (goto IllBounds)
                         (MMFS.InFields rawData (NCHARS rawData))
                         IllMsg -> (SETQ errMsg (CONCAT "Illegal MMFS message: " (OR (STRINGP $SignalArg$)
                                                                                      "")))
                         IllBounds -> (SETQ errMsg "Illegal MMFS message: unparseable")))
```

```
    (COND
       (errMsg (_@ %:comment errMsg)
              (_@ %:data (HexToAsciiString rawData))
              NIL)
       (T fields))))
```

(Method ((MMFSMessage Print) self file) . TAL 10-Mar-86 11:05

```
  "New method template"
  (printout file "From " (@ %:source)
        " ("
        (COND
           ((@ %:sender)
            (@ |:sender:label|))
           (T ""))
        ") To "
        (@ %:destination)
        ": "
        (@ %:msgType)
        ","
        (@ :msgID)
        "#"
        [COND
           ((@ %:data)
            (PRIN1 ", Data = ")
            (for x in (@ %:data) do (PRIN1 x)
                                    (PRIN1 " "]
        T))
```

(Method ((MMFSMessageDefinition AnalysisScope) self) TAL 5-Dec-87 18:59

```
  "New method template"
  (_ self MainProgram))
```

(Method ((MMFSMessageDefinition GetAccessList) self access) . TAL 18-Nov-87 12:10

```
  "New method template"
  [LET ((anal (@ %:staticAnalysis)))
    (for x inside access funion (CDR (FASSOC x anal])
```

(Method ((MMFSMessageDefinition MainProgram) self) . TAL 20-Nov-87 14:51

```
  "New method template"
  [LET ((container (@ %:container)))
    (COND
       ((AND (ObjectExists? container))
        (_ container MainProgram)])
```

(Method ((MMFSMessageDefinition MatchTemplate?) self withTemplate) TAL 3-Aug-86 18.07 . Return T if I match withTemplate

```
  "(for x in (@ ::TemplateMatchFields) always (EQ (GetValue self x) (GetValue withTemplate x))) - Used to be
  this, which is not discriminating enough. Sure seems like the only time a template matches another is when
  they are the same template, so EQ should suffice."
  (EQ self withTemplate))
```

(Method ((MMFSMessageDefinition ObjectForSearch) self) . TAL 5-Dec-87 19.03

```
  "New method template"
  (PACK* (@ %:source)
         '(
         (@ %:templateID)))
```

(Method ((MMFSMessageDefinition UnparseDataField) self) TAL 1-Dec-86 12:29

```
  "New method template"
  [WITH-RESOURCE (MMFS.StringStream)
    (MMFS.PrintFields (@ %:dataDescription)
          (CAR MMFS.StringStream))
    (CONCAT (SUBSTRING (CDR MMFS.StringStream)
                 1
                 (GETFILEPTR (CAR MMFS.StringStream])
```

(Method ((MMFSMessageDefinition WhoUses) self item access) : TAL 29-Nov-87 19:45

```
  "New method template"
  [LET (refObj)
    (COND
       ((FISInAnalysis? item access (@ %:staticAnalysis))
        (SETQ refObj (_ (@ |::AnalysisCallerClass|)
                        New))
        (_ refObj FillIn self)
        (LIST refObj])
```

```
(Method ((MMFSReceivableDefFolder CompileTemplates) self)
                                                        TAL 22-Nov-87 15:39
   "New method template"
   (LET ((FISCompilingContainer self)
         (ok T)
         caller cEnv)
     (DECLARE (SPECVARS FISCompilingContainer FISCompilingObject))
     (COND
       ((AND (SETQ caller (@ %:caller))
             (SETQ cEnv (_ (@ caller %:superObject)
                           GetCompileEnv)))
        (bind FISCompilingObject for x in (@ %:elements) do (SETQ ok (AND (NLSETQ (_ (SETQ
                                                                                FISCompilingObject x)
                                                                             CompileTemplate cEnv
                                                                             caller))
                                                                     ok)))
        ok)
       (T                                       (* If couldn't get super env return NIL to indicate failure)
          NIL))))
```

```
(Method ((MMFSReceivableDefFolder FindMatchingTemplate) self msg sVs)
                                                        TAL 22-Nov-87 15:37
   "Return the template that matches msg, if any"
   (MMFS.FindMatchingTemplate msg (@ %:elements)
         sVs))
```

```
(Method ((MMFSReceivableDefFolder GetPrintName) self)
                                                        mcf: 22-Sep-87 11 29
   "Specialization"
   (FISDequalifyName (_Super self GetPrintName)))
```

```
(Method ((MMFSReceivableDefFolder InProgram?) self program)
                                                        mcf 31-Dec-87 13 26
   "T if I am in the program. This method should be higher up"
   (LET ((caller (@ %:caller)))
     (AND (ObjectExists? caller)
          (_ caller InProgram? program))))
```

```
(Method ((MMFSReceivableDefFolder MainProgram) self)
                                                        TAL 20-Nov-87 16:07
   "New method template"
   (_ (@ %:caller)
      MainProgram))
```

```
(Method ((MMFSReceivableDefFolder NameQualifier) self)
                                                        Edited 5-Sep-88 15:32 by mcf
                                                        mcf: 9-Sep-87 15.44
   "New method template"
   (_ (@ self caller)
      NameQualifier))
```

```
(Method ((MMFSReceivableDefFolder PrintNameQualifier) self)
                                                        Edited 5-Sep-88 15.32 by mcf
   "Method documentation"
   (_ (@ self caller)
      PrintNameQualifier))
```

```
(Method ((MMFSReceivableDefFolder QualifyCacheFlush) self)
                                                        mcf: 17-Sep-87 11 53
   "Specialization"
   [COND
     ((FISQualified self))
     (T (_ self ChangeName (FISQualifyName self (_ self GetName]))
```

```
(Method ((MMFSReceivableDefFolder SWCopyMade) self XLations)
                                                        mcf: 16-Dec-87 16:57
                                                        Specialization
   "(_Super self SWCopyMade XLations)"
   [LET (pos1 mmfsName newmmfs newName rest fullName (id (@ self %:objectIdentifier))
              (dotSepr "."))
     (COND
       (id (SETQ fullName (fetch SWIDPrimaryName of id))
           (SETQ mmfsName (FISDequalifyName fullName))
           (SETQ pos1 (STRPOS dotSepr mmfsName))
           (SETQ rest (SUBATOM mmfsName (ADD1 pos1)
                              -1))
           (SETQ mmfsName (SUBATOM mmfsName 1 (SUB1 pos1)))
           [SETQ newmmfs (CDR (FASSOC mmfsName (fetch MMFSRSteps of XLations]
           [SETQ newName (FISQualifyName NIL (PACK* (OR newmmfs mmfsName)
                                                    dotSepr rest)
                             (OR (fetch Qualifier of XLations)
                                 (FISDequalifyName fullName NIL T]
```

```
        (_@ self %:objectIdentifier (create SWObjectIdentifier
                                        SWIDPrimaryName _ newName copying id))
        (COND
           (newmmfs (for e in (@ self %:elements) when (EQ (@ e %:destination)
                                                           mmfsName)
                       do (_@ e %:destination newmmfs)])
```

(Method ((MMFSReceivableMessageDefinition CompileTemplate) self cEnv Step)
TAL 15-Nov-87 16:52

```
   "Parse the fields and compute the testable and settable vars"
   [LET ((data (@ %:data))
         (action (@ %:action))
         resultEnv rcvForm fields settable testable analysis)
     [COND
        (data (SETQ fields (MMFS.ParseFields data cEnv]
     (_@ %:dataDescription fields)
     [COND
        ((AND action (NEQ 0 (NCHARS action)))
         (SETQ resultEnv (CC.CompileExprString (CONCAT "(" action ")")
                                cEnv NIL))
         (SETQ rcvForm (CCEnv.ExprCode resultEnv))
         (SETQ analysis (FISStaticAnalysisFromDetail (CCEnv.ExprAnalysis resultEnv]
     (_@ %:lispAction (CC.SimplifyForm rcvForm))
     [bind tmp for field in fields do [COND
                                         ((type? MMFSTemplateData (SETQ tmp (fetch MMFSFieldLen of field)))
                                          (pushnew settable (fetch MMFSTemplateDataName of tmp]
                                       [COND
                                         ((type? MMFSTemplateData (SETQ tmp (fetch MMFSFieldData of field)))
                                          (pushnew settable (fetch MMFSTemplateDataName of tmp]
                                       [COND
                                         ((type? MMFSTemplateData (SETQ tmp (fetch MMFSFieldOpt of field)))
                                          (pushnew settable (fetch MMFSTemplateDataName of tmp]
                                       [COND
                                         ((type? MMFSTemplateData (SETQ tmp (fetch MMFSFieldRot of field)))
                                          (pushnew testable (fetch MMFSTemplateDataName of tmp]
                                       (for x in (fetch MMFSFieldStream of field)
                                          when (type? MMFSTemplateData (SETQ tmp (fetch MMFSStreamFieldData
                                                                                    of x)))
                                          do (pushnew settable (fetch MMFSTemplateDataName of tmp]
     (_@ %:staticAnalysis (UnionStaticAnalysis analysis (LIST (CONS 'Fetch testable)
                                                              (CONS 'Set settable))))])
```

(Method ((MMFSReceivableMessageDefinition ComputePrintName) self)
mcf: 12-Nov-87 10:55

```
   "New method template"
   (LET ((name (@ %:destination)))
     (CONCAT (COND
                (name (CONCAT name " "))
                (T Nothing))
             (@ |::PrintName|))))
```

(Method ((MMFSReceivableMessageDefinition ReceiveMessage) self msg process step sVs)
TAL 11-Dec-86 12:55

```
   "New method template"
   [LET (action)
     (MMFS.RcvFields (@ msg %:dataDescription)
            (@ %:dataDescription)
            sVs)
     (COND
        ((SETQ action (@ %:lispAction))
         (FISEvaluateProgram self action process step 'Continuous])
```

(Method ((MMFSSendableDefFolder CompileTemplates) self)
TAL 22-Nov-87 15:38

```
   "Specialization"
   (LET ((FISCompilingContainer self)
         (ok T)
         caller cEnv grp grpF tn tnF)
     (DECLARE (SPECVARS FISCompilingContainer FISCompilingObject))
     (COND
        ((AND (SETQ caller (@ %:caller))
              (SETQ cEnv (_ (@ caller %:superObject)
                             GetCompileEnv)))
         (SETQ FISCompilingObject self)
         [COND
            ((SETQ grp (@ %:defaultGrouper))
             (SETQ grpF (CAR (NLSETQ (MMFS.ParseFields grp cEnv]
         [COND
            ((SETQ tn (@ %:defaultTN))
             (SETQ tnF (CAR (NLSETQ (MMFS.ParseFields tn cEnv]
         (COND
            ((OR (AND grp (NOT grpF))
                 (AND tn (NOT tnF)))
             (FISCompileMsg "Error(s) in default send fields, templates not compiled.
                   
                  ")
```

```
        NIL)
       (T (SETQ grpF (CAR grpF))
          (SETQ tnF (CAR tnF))
          (bind FISCompilingObject for x in (@ %:elements)
             do (SETQ ok (AND (NLSETQ (_ (SETQ FISCompilingObject x)
                                          CompileTemplate cEnv grpF tnF))
                              ok)))
          ok)))
    (T                                        (* If couldn't get super env return NIL to indicate failure)
      NIL))))
```

(Method ((MMFSSendableDefFolder GetPrintName) self)
, mct: 22-Sep-87 11 30

```
  "Specialization"
  (FISDequalifyName (_Super self GetPrintName)))
```

(Method ((MMFSSendableDefFolder InProgram?) self program)
, mct 31-Dec-87 13.26

```
  "T if I am in the program. This method should be higher up"
  (LET ((caller (@ %:caller)))
    (AND (ObjectExists? caller)
         (_ caller InProgram? program))))
```

(Method ((MMFSSendableDefFolder LookupTemplate) self templateID)
, TAL 22-Nov-87 15 38

```
  "New method template"
  (for template in (@ %:elements) thereis (EQUAL templateID (@ template %:templateID))))
```

(Method ((MMFSSendableDefFolder MainProgram) self)
, TAL 20-Nov-87 16.07

```
  "New method template"
  (_ (@ %:caller)
     MainProgram))
```

(Method ((MMFSSendableDefFolder NameQualifier) self)
Edited 5-Sep-88 15 31 by mct
mct: 9-Sep-87 15 44

```
  "New method template"
  (_ (@ self caller)
     NameQualifier))
```

(Method ((MMFSSendableDefFolder PrintNameQualifier) self)
, Edited 5-Sep-88 15:31 by mct

```
  "Method documentation"
  (_ (@ self caller)
     PrintNameQualifier))
```

(Method ((MMFSSendableDefFolder QualifyCacheFlush) self)
, mct: 17-Sep-87 11.53

```
  "Specialization"
  [COND
     ((FISQualified self))
     (T (_ self ChangeName (FISQualifyName self (_ self GetName)))])
```

(Method ((MMFSSendableDefFolder SWCopyMade) self XLations)
, mct: 16-Dec-87 16:56
; Specialization

```
  "(_Super self SWCopyMade XLations)"
  [LET (pos1 mmfsName newmmfs newName rest fullName (id (@ self %:objectIdentifier))
             (dotSepr "."))
    (COND
       (id (SETQ fullName (fetch SWIDPrimaryName of id))
           (SETQ mmfsName (FISDequalifyName fullName))
           (SETQ pos1 (STRPOS dotSepr mmfsName))
           (SETQ rest (SUBATOM mmfsName (ADD1 pos1)
                               -1))
           (SETQ mmfsName (SUBATOM mmfsName 1 (SUB1 pos1)))
           [SETQ newmmfs (CDR (FASSOC mmfsName (fetch MMFSSSteps of XLations]
           [SETQ newName (FISQualifyName NIL (PACK* (OR newmmfs mmfsName)
                                                     dotSepr rest)
                                 (OR (fetch Qualifier of XLations)
                                     (FISDequalifyName fullName NIL T]
           (_@ self %:objectIdentifier (create SWObjectIdentifier
                                               SWIDPrimaryName _ newName copying id))
           (COND
              (newmmfs (for e in (@ self %:elements) when (EQ (@ e %:source)
                                                              mmfsName)
                          do (_@ e %:source newmmfs)])
```

```
(Method ((MMFSSendableMessageDefinition CompileTemplate) self cEnv defaultGrouper
                                                                 defaultTN)
                                                    ; TAL 15-Nov-87 16.06
   "Parse the fields and compute the testableVars"
   [LET ((data (@ %:data))
         fields grp testable)
     [SETQ fields (COND
                    (data (MMFS.ParseFields data cEnv]
     [COND
        ((AND defaultGrouper (NOT (FMEMB (fetch MMFSFieldID of (CAR fields))
                                         MMFSInitialGrouperCodes)))
                                        (* If first field is not a grouper, add the default)
         (SETQ grp defaultGrouper))
        (T                              (* If there is a grouper, save it and look for TN)
           (SETQ grp (pop fields]
     (COND
        ((AND defaultTN (NEQ (fetch MMFSFieldID of (CAR fields))
                             MMFSIDCodeTN))        (* If no TN, add default)
         (push fields defaultTN)))
     (push fields grp)
     (_@ %:dataDescription fields)
     [bind tmp for field in fields do [COND
                                         ((type? MMFSTemplateData (SETQ tmp (fetch MMFSFieldData of field)))
                                          (pushnew testable (fetch MMFSTemplateDataName of tmp]
                                       [COND
                                         ((type? MMFSTemplateData (SETQ tmp (fetch MMFSFieldRpt of field)))
                                          (pushnew testable (fetch MMFSTemplateDataName of tmp]
                                       [COND
                                         ((type? MMFSTemplateData (SETQ tmp (fetch MMFSFieldOpt of field)))
                                          (pushnew testable (fetch MMFSTemplateDataName of tmp]
                                       (for x in (fetch MMFSFieldStream of field)
                                          when (type? MMFSTemplateData (SETQ tmp (fetch MMFSStreamFieldData
                                                                                       of x)))
                                          do (pushnew testable (fetch MMFSTemplateDataName of tmp]
     (_@ %:staticAnalysis [COND
                            (testable (LIST (CONS 'Fetch testable])])
```

```
(Method ((MMFSSendableMessageDefinition ComputePrintName) self)
                                                    ; TAL 4-Dec-87 20:09
   "New method template"
   [LET ((name (@ %:source)))
     (COND
        (name (CONCAT name " " (@ |::PrintName|)
                      " #"
                      (OR (@ %:templateID)
                          "?")))
        (T (CONCAT (@ |::PrintName|)
                   " #"
                   (OR (@ %:templateID)
                       "?"])

(\UnbatchMethodDefs)

          (* * Obsolete)

(DECLARE%: EVAL@COMPILE

(RECORD MMFSParameterDescription (MMFSParameterName MMFSParameterValue MMFSParameterType MMFSParameterLength)
                                        (* MMFSParameterName must be first, as lists of these are ASSOCed to
        find an entry)
        )
)

(DEFCLASS BeAnFCSContext (MetaClass Class Edited%:          ; Edited 29-Jun-88 02:17 by lipkis
                                    doc "This is the default metaClass for all classes")
       (Supers DefaultContext)
       (ClassVariables (MenuName "Be the FCS")
              (MenuDoc "Allows manual sending of FCS messages to the cell")
              (SubContexts NIL)
              (LinkedContexts NIL)
              (Browser #,($C FolderBrowser))
              (AttachHorizMenu T)
              (SubContextTypes (#,($C SendMMFSMessageContext)))
              (AttachHorizMenu T))
       (InstanceVariables (object NIL VR #,($C MMFSSendableFolder))))

[DEFCLASS MMFSManuallySendableFolder (MetaClass Class Edited%:
                                                    (* TAL "12-Oct-85 18:32")
                                           doc "This is the default metaClass for all classes")
       (Supers MMFSSendableFolder)
       (ClassVariables (SummaryFields (destination msgType msgID data comment]

(DEFCLASS SendMMFSMessageContext (MetaClass Class Edited%:      ; Edited 29-Jun-88 02.16 by lipkis
                                        doc "This is the default metaClass for all classes")
       (Supers DefaultContext)
       (ClassVariables (MenuName "Send Message")
              (MenuDoc "Send the message defined by the selected template")
              (InitialActions (SendMMFSMessage))
              (Browser NIL))
       (InstanceVariables (object NIL VR #,($C MMFSSendableMessageDefinition))))

(\BatchMethodDefs)
```

(Method ((BeAnFCSContext FindObject) self suppliedObject)
```
                                                        . TAL 12-Oct-85 18:41
   "Specialization"
   (LET (newObj (obj (_Super self FindObject suppliedObject)))
     (COND
        (obj (SETQ newObj (_ ($ MMFSManuallySendableFolder)
                             New))
             (_@ newObj %:elements (@ obj %:elements))
             (_@ newObj %:printName "FCS Interface")
             newObj))))
```

(Method ((SendMMFSMessageContext SendMMFSMessage) self)
```
                                                        . mct: 4-Dec-85 22:27
   "New method template"
   (PROG (template msg propList browser)
         (COND
            ((NULL (SETQ template (@ %:object)))
             (RETURN)))
         (SETQ msg (_ ($ MMFSMessage)
                      New))
         (SETQ browser (@ (CAR (@ %:spawningContexts))
                          %:myBrowser))
         [SETQ propList (bind prompt for param in (@ template %:dataDescription) while browser
                         eachtime (SETQ prompt (CONCAT "Enter value for " (fetch MMFSParameterName
                                                                                 of param)
                                                       ": "))
                         join (LIST (fetch MMFSParameterName of param)
                                    (OR (fetch MMFSParameterValue of param)
                                        (SELECTQ (fetch MMFSParameterType of param)
                                            ((NIL <AS>)
                                              (OR (_ browser PromptForString prompt)
                                                  ""))
                                            ((<UI> <SI>)
                                              (_ browser PromptForWord prompt))
                                            (_ browser PromptForWord prompt)]
         (COND
            ((NOT browser)
             (RETURN)))
         (_ msg FillInMsg template (@ template %:source)
                (@ template %:destination)
                propList)
         (_ MapNetwork SendMessage msg)
         (_ browser ClearPromptWindow)
         (_ browser PromptPrint "Message Sent")
         (DISMISS 1000)
         (_ browser ClosePromptWindow)))

(\UnbatchMethodDefs)

(DEFINEQ
```

(ConvertTemplates
```
  [LAMBDA (folder)                                        (* TAL "25-Jul-86 14:23")
    (for x in (@ folder %:elements) do [COND
                                          ((_ x HasIV 'msgType)
                                           (change (@ x %:data)
                                                   (CONCAT (@ x %:msgType)
                                                           " "
                                                           (@ x %:msgID)
                                                           (COND
                                                              ((LISTP (@ x %:data))
                                                               (CONCAT " " (SUBSTRING (MKSTRING (@ x %:data)
                                                                                                T)
                                                                                      2 -2)))
                                                              ((@ x %:data)
                                                               (CONCAT " " (@ x %:data)))
                                                              (T ""]
                                           (_ x DeleteIV 'msgType)
                                           (_ x DeleteIV 'msgID))
                                          ([AND (@ x %:data)
                                                (NOT (STRINGP (@ x %:data)]
                                           (change (@ x %:data)
                                                   (MKSTRING (@ x %:data)
                                                             T]
                                       (COND
                                          ((_ x HasIV 'action)
                                           (change (@ x %:action)
                                                   (@ x %:action)])
)

(PUTPROPS MMFS FILETYPE :FAKE-COMPILE-FILE)

(PUTPROPS MMFS COPYRIGHT ("Savoir, Inc." 1986 1987 1988))
```

VARIABLE INDEX

MMFSIDDescrs ......................................1

PROPERTY INDEX

MMFSDEFS ..........................................1 changes to: (VARS MMFSDEFSCOMS)
(PROPS (MMFSDEFS MAKEFILE-ENVIRONMENT))

previous date: 10-May-88 18:51:53 {POGO:AISNORTH:XEROX}<LOOPSCORE>SAVOIR>FIS>MMFSDEFS.;10

Read Table: INTERLISP

Package: IL

Base: 10

;; Copyright (c) 1986, 1987, 1988 by Savoir, Inc.. All rights reserved.

```
(RPAQQ MMFSDEFSCOMS ((PROP MAKEFILE-ENVIRONMENT MMFSDEFS)
                     (VARS MMFSIDDescrs)))

(PUTPROPS MMFSDEFS MAKEFILE-ENVIRONMENT (:PACKAGE "IL" :READTABLE "INTERLISP" :BASE #x10))

(RPAQQ MMFSIDDescrs
       ((* Entries of the form (<name> Code <num>)
           are IDs that have defined function code mnemonics. Function codes for any particular id encoding
           <num> are of the form (<fcname> <content> <num>)
           and must appear after the parent id.)
        (OC UI 1)
        (GC UI 2)
        (PG Code 3)
        (POP 0 3)
        (PCL #x7F 3)
        (CC Code 4)
        (DS UI 5)
        (FA UD 7)
        (LA CH 8)
        (OF UI #xA)
        (CT UI #xB)
        (RC UI #xC)
        (DQ Code #xD)
        (MSK 1 #xD)
        (PRO 2 #xD)
        (SCA 3 #xD)
        (UNI 4 #xD)
        (REK 5 #xD)
        (DN CH 9)
        (DE Code #xE)
        (SCG 1 #xE)
        (SCL 2 #xE)
        (AON 3 #xE)
        (DDN 4 #xE)
        (GDN 5 #xE)
        (BS BS #x12)
        (UD UD #x13)
        (BO BO #x14)
        (CB CB #x11)
        (UI UI #x15)
        (SI SI #x16)
        (BD BD #x17)
        (FP FP #x18)
        (CH CH #x19)
        (DF Code #x28)
        (BCL 1 #x28)
        (BIN 2 #x28)
        (CSD 3 #x28)
        (DSP 4 #x28)
        (GES 5 #x28)
        (NAP 6 #x28)
        (FLM 7 #x28)
        (INS 8 #x28)
        (PLT 9 #x28)
        (RBT #xA #x28)
        (TST #xB #x28)
        (CBF #x11 #x28)
        (BSF #x12 #x28)
        (UDF #x13 #x28)
        (BOF #x14 #x28)
        (UIF #x15 #x28)
        (SIF #x16 #x28)
        (BDF #x17 #x28)
```

```
(FPF #x18 #x28)
(CHF #x19 #x28)
(NUL #x1F #x28)
(DA UD #x21)
(SA UD #x22)
(CN UI #x23)
(MN UI #x1C)
(MP UI #x35)
(TP UD #x31)
(SP UD #x32)
(SB UD #x33)
(TS UD #x34)
(AK Code #x37)
(ACK 1 #x37)
(NAK 2 #x37)
(MC Code #x36)
(SCN 1 #x36)
(GCN 2 #x36)
(SML 3 #x36)
(GML 4 #x36)
(SMG 5 #x36)
(GMG 6 #x36)
(SCX 7 #x36)
(GCX 8 #x36)
(SPV 9 #x36)
(GPV #xA #x36)
(GCL #x8 #x36)
(DD Code #x10)
(DDR 1 #x10)
(DLP 2 #x10)
(DMA 3 #x10)
(DMT 4 #x10)
(DPP 5 #x10)
(DSC 6 #x10)
(SD Code #x1E)
(SDR 1 #x1E)
(SKB 2 #x1E)
(SMA 3 #x1E)
(SMT 4 #x1E)
(SPR 5 #x1E)
(FQ Code #x26)
(NAM 1 #x26)
(SOF 2 #x26)
(SFS 3 #x26)
(ALF 4 #x26)
(OLN 5 #x26)
(NWN 6 #x26)
(FN UI #x28)
(PC Code #x20)
(* Procedural controls)
(CRQ 1 #x20)
(CMD 8 #x20)
(DRS 2 #x20)
(FRS 3 #x20)
(NRS 4 #x20)
(ABO 5 #x20)
(UDI 6 #x20)
(UDR 7 #x20)
(TN UI #x1F)
(NN UI #x38)
(DI UI #x27)
(XF CH #x3C)
(ES CH #x3D)
(ER Code #x3E)
(TPS 0 #x3E)
(DEM 1 #x3E)
(DNA 2 #x3E)
(DPA 3 #x3E)
(CMA 4 #x3E)
(CPA 5 #x3E)
(FO Code #x25)
(XMT 1 #x25)
(SEL 2 #x25)
(DIR 3 #x25)
(ACT 4 #x25)
(GET 5 #x25)
(QUE 6 #x25)
(CLO 7 #x25)
(DEL 8 #x25)
(REN 9 #x25)
(OPE #xA #x25)
(SF Code #x29)
```

```
(STA 1 #x29)
(IDN 2 #x29)
(QRY 3 #x29)
(NTV 4 #x29)
(MSG 5 #x29)
(RSD 7 #x29)
(SYN 8 #x29)
(AL UI #x2A)
(I1 Code #x24)
```

```
(ACP 1 #x24)
(AXI 3 #x24)
(AXO 4 #x24)
(BAK 5 #x24)
(BLD 6 #x24)
(BLK 7 #x24)
(CAR 8 #x24)
(CCP 9 #x24)
(CLP #xA #x24)
(CTR #xB #x24)
(CYC #xC #x24)
(EXC #xD #x24)
(FDH #xE #x24)
(FRL #xF #x24)
(FRO #x10 #x24)
(FXC #x11 #x24)
(GRZ #x12 #x24)
(LDP #x13 #x24)
(LFT #x14 #x24)
(LWR #x15 #x24)
(MIR #x16 #x24)
(OSP #x17 #x24)
(PLN #x18 #x24)
(PRT #x19 #x24)
(REF #x1A #x24)
(ROT #x1B #x24)
(SCF #x1C #x24)
(SSL #x1D #x24)
(SSO #x1E #x24)
(TLD #x1F #x24)
(TOF #x20 #x24)
(UCP #x21 #x24)
(ULP #x22 #x24)
(UNT #x23 #x24)
(ZCC #x24 #x24)
(ZFC #x25 #x24)
(ZTO #x26 #x24)
(I2 Code #x41)
(REA 1 #x41)
(WRI 2 #x41)
(EUL 3 #x41)
(RUL 4 #x41)
(XUL 5 #x41)
(IUL 6 #x41)
(CUL 7 #x41)
(EDL 8 #x41)
(WDL 9 #x41)
(XDL #xA #x41)
(IDL #xB #x41)
(CDL #xC #x41)
(STR #xD #x41)
(STP #xE #x41)
(CM45 Code #x45)
(CAL 1 #x45)
(CM46 Code #x46)
(SP0 0 #x46)
(SP1 1 #x46)
(SP2 2 #x46)
(SP3 3 #x46)
(CM47 Code #x47)
(CLR 0 #x47)
(CON 1 #x47)
(CST 2 #x47)
(US00 Code #xFF00)
(US01 Code #xFF01)
(US02 Code #xFF02)
(US03 Code #xFF03)
(US04 Code #xFF04)
(US05 Code #xFF05)
(US06 Code #xFF06)
(US07 Code #xFF07)
(US08 Code #xFF08)
(US09 Code #xFF09)
```

```
(US0A Code #xFF0A)
(US0B Code #xFF0B)
(US0C Code #xFF0C)
(US0D Code #xFF0D)
(US0E Code #xFF0E)
(US0F Code #xFF0F)
(US10 Code #xFF10)
(US11 Code #xFF11)
(US12 Code #xFF12)
(US13 Code #xFF13)
(US14 Code #xFF14)
(US15 Code #xFF15)
(US16 Code #xFF16)
(US17 Code #xFF17)
(US18 Code #xFF18)
(US19 Code #xFF19)
(US1A Code #xFF1A)
(US1B Code #xFF1B)
(US1C Code #xFF1C)
```

(US1D Code #xFF1D)
(US1E Code #xFF1E)
(US1F Code #xFF1F)
(US20 Code #xFF20)
(US21 Code #xFF21)
(US22 Code #xFF22)
(US23 Code #xFF23)
(US24 Code #xFF24)
(US25 Code #xFF25)
(US26 Code #xFF26)
(US27 Code #xFF27)
(US28 Code #xFF28)
(US29 Code #xFF29)
(US2A Code #xFF2A)
(US2B Code #xFF2B)
(US2C Code #xFF2C)
(US2D Code #xFF2D)
(US2E Code #xFF2E)
(US2F Code #xFF2F)
(US30 Code #xFF30)
(US31 Code #xFF31)
(US32 Code #xFF32)
(US33 Code #xFF33)
(US34 Code #xFF34)
(US35 Code #xFF35)
(US36 Code #xFF36)
(US37 Code #xFF37)
(US38 Code #xFF38)
(US39 Code #xFF39)
(US3A Code #xFF3A)
(US3B Code #xFF3B)
(US3C Code #xFF3C)
(US3D Code #xFF3D)
(US3E Code #xFF3E)
(US3F Code #xFF3F)
(US40 Code #xFF40)
(US41 Code #xFF41)
(US42 Code #xFF42)
(US43 Code #xFF43)
(US44 Code #xFF44)
(US45 Code #xFF45)
(US46 Code #xFF46)
(US47 Code #xFF47)
(US48 Code #xFF48)
(US49 Code #xFF49)
(US4A Code #xFF4A)
(US4B Code #xFF4B)
(US4C Code #xFF4C)
(US4D Code #xFF4D)
(US4E Code #xFF4E)
(US4F Code #xFF4F)
(US50 Code #xFF50)
(US51 Code #xFF51)
(US52 Code #xFF52)
(US53 Code #xFF53)
(US54 Code #xFF54)
(US55 Code #xFF55)
(US56 Code #xFF56)
(US57 Code #xFF57)
(US58 Code #xFF58)
(US59 Code #xFF59)
(US5A Code #xFF5A)
(US5B Code #xFF5B)

(US5C Code #xFF5C)
(US5D Code #xFF5D)
(US5E Code #xFF5E)
(US5F Code #xFF5F)
(US60 Code #xFF60)
(US61 Code #xFF61)
(US62 Code #xFF62)
(US63 Code #xFF63)
(US64 Code #xFF64)
(US65 Code #xFF65)
(US66 Code #xFF66)
(US67 Code #xFF67)
(US68 Code #xFF68)
(US69 Code #xFF69)
(US6A Code #xFF6A)
(US6B Code #xFF6B)
(US6C Code #xFF6C)
(US6D Code #xFF6D)
(US6E Code #xFF6E)
(US6F Code #xFF6F)
(US70 Code #xFF70)
(US71 Code #xFF71)
(US72 Code #xFF72)
(US73 Code #xFF73)
(US74 Code #xFF74)
(US75 Code #xFF75)
(US76 Code #xFF76)
(US77 Code #xFF77)
(US78 Code #xFF78)
(US79 Code #xFF79)

```
(US7A Code #xFF7A)
(US7B Code #xFF7B)
(US7C Code #xFF7C)
(US7D Code #xFF7D)
(US7E Code #xFF7E)
(US7F Code #xFF7F)
(US80 Code #xFF80)
(US81 Code #xFF81)
(US82 Code #xFF82)
(US83 Code #xFF83)
(US84 Code #xFF84)
(US85 Code #xFF85)
(US86 Code #xFF86)
(US87 Code #xFF87)
(US88 Code #xFF88)
(US89 Code #xFF89)
(US8A Code #xFF8A)
(US8B Code #xFF8B)
(US8C Code #xFF8C)
(US8D Code #xFF8D)
(US8E Code #xFF8E)
(US8F Code #xFF8F)
(US90 Code #xFF90)
(US91 Code #xFF91)
(US92 Code #xFF92)
(US93 Code #xFF93)
(US94 Code #xFF94)
(US95 Code #xFF95)
(US96 Code #xFF96)
(US97 Code #xFF97)
(US98 Code #xFF98)
(US99 Code #xFF99)
(US9A Code #xFF9A)
(US9B Code #xFF9B)
(US9C Code #xFF9C)
(US9D Code #xFF9D)
(US9E Code #xFF9E)
(US9F Code #xFF9F)
(USA0 Code #xFFA0)
(USA1 Code #xFFA1)
(USA2 Code #xFFA2)
(USA3 Code #xFFA3)
(USA4 Code #xFFA4)
(USA5 Code #xFFA5)
(USA6 Code #xFFA6)
(USA7 Code #xFFA7)
(USA8 Code #xFFA8)
(USA9 Code #xFFA9)
(USAA Code #xFFAA)
(USAB Code #xFFAB)
(USAC Code #xFFAC)
(USAD Code #xFFAD)
```

```
(USAE Code #xFFAE)
(USAF Code #xFFAF)
(USB0 Code #xFFB0)
(USB1 Code #xFFB1)
(USB2 Code #xFFB2)
(USB3 Code #xFFB3)
(USB4 Code #xFFB4)
(USB5 Code #xFFB5)
(USB6 Code #xFFB6)
(USB7 Code #xFFB7)
(USB8 Code #xFFB8)
(USB9 Code #xFFB9)
(USBA Code #xFFBA)
(USBB Code #xFFBB)
(USBC Code #xFFBC)
(USBD Code #xFFBD)
(USBE Code #xFFBE)
(USBF Code #xFFBF)
(USC0 Code #xFFC0)
(USC1 Code #xFFC1)
(USC2 Code #xFFC2)
(USC3 Code #xFFC3)
(USC4 Code #xFFC4)
(USC5 Code #xFFC5)
(USC6 Code #xFFC6)
(USC7 Code #xFFC7)
(USC8 Code #xFFC8)
(USC9 Code #xFFC9)
(USCA Code #xFFCA)
(USCB Code #xFFCB)
(USCC Code #xFFCC)
(USCD Code #xFFCD)
(USCE Code #xFFCE)
(USCF Code #xFFCF)
(USD0 Code #xFFD0)
(USD1 Code #xFFD1)
(USD2 Code #xFFD2)
(USD3 Code #xFFD3)
(USD4 Code #xFFD4)
(USD5 Code #xFFD5)
(USD6 Code #xFFD6)
```

```
(USD7 Code #xFFD7)
(USD8 Code #xFFD8)
(USD9 Code #xFFD9)
(USDA Code #xFFDA)
(USDB Code #xFFDB)
(USDC Code #xFFDC)
(USDD Code #xFFDD)
(USDE Code #xFFDE)
(USDF Code #xFFDF)
(USE0 Code #xFFE0)
(USE1 Code #xFFE1)
(USE2 Code #xFFE2)
(USE3 Code #xFFE3)
(USE4 Code #xFFE4)
(USE5 Code #xFFE5)
(USE6 Code #xFFE6)
(USE7 Code #xFFE7)
(USE8 Code #xFFE8)
(USE9 Code #xFFE9)
(USEA Code #xFFEA)
(USEB Code #xFFEB)
(USEC Code #xFFEC)
(USED Code #xFFED)
(USEE Code #xFFEE)
(USEF Code #xFFEF)
(USF0 Code #xFFF0)
(USF1 Code #xFFF1)
(USF2 Code #xFFF2)
(USF3 Code #xFFF3)
(USF4 Code #xFFF4)
(USF5 Code #xFFF5)
(USF6 Code #xFFF6)
(USF7 Code #xFFF7)
(USF8 Code #xFFF8)
(USF9 Code #xFFF9)
(USFA Code #xFFFA)
(USFB Code #xFFFB)
(USFC Code #xFFFC)
(USFD Code #xFFFD)
(USFE Code #xFFFE)
(USFF Code #xFFFF)
```

```
(* * FCS user defined function codes for US01)
(CADP #x40 #xFF01)
(CAPR #xC #xFF01)
(CARJ #x21 #xFF01)
(CBEX #x10 #xFF01)
(CBNR #x1C #xFF01)
(CBRC #x2B #xFF01)
(CCAD #x2A #xFF01)
(CCAN 3 #xFF01)
(CCAU #x2E #xFF01)
(CCDA #x33 #xFF01)
(CCDK #x37 #xFF01)
(CCDP #x34 #xFF01)
(CCDQ #x35 #xFF01)
(CCDT #x36 #xFF01)
(CCHC #x23 #xFF01)
(CCNO 4 #xFF01)
(CCOV #x18 #xFF01)
(CCPA #x2D #xFF01)
(CCPK #x46 #xFF01)
(CCPP #x38 #xFF01)
(CCPQ #x39 #xFF01)
(CCPT #x3A #xFF01)
(CCPR 5 #xFF01)
(CCQU 6 #xFF01)
(CCSC #x8 #xFF01)
(CCYD #x29 #xFF01)
(CDMD #x30 #xFF01)
(CIN0 #x3B #xFF01)
(CIN1 #x3C #xFF01)
(CIN2 #x3D #xFF01)
(CIN3 #x3E #xFF01)
(CIN4 #x3F #xFF01)
(CIN5 #x41 #xFF01)
(CIN6 #x42 #xFF01)
(CIN7 #x43 #xFF01)
(CIN8 #x44 #xFF01)
(CIN9 #x45 #xFF01)
(CINI 2 #xFF01)
(CINQ #x1F #xFF01)
(CINR #xE #xFF01)
(CINT #xD #xFF01)
(CIPR #x20 #xFF01)
(CIQS 7 #xFF01)
(CIQC #xA #xFF01)
(CITR #x24 #xFF01)
(CITS #x22 #xFF01)
(CMSC #x1A #xFF01)
(CPFN 8 #xFF01)
(CPRJ 9 #xFF01)
(CPIQ #x1E #xFF01)
(CPTR #x10 #xFF01)
(CPTS #x11 #xFF01)
```

```
(CPVA #x31 #xFF01)
(CQMA #x12 #xFF01)
(CQPR #x13 #xFF01)
(CRES #xF #xFF01)
(CRSB #x2C #xFF01)
(CRST 1 #xFF01)
(CSCH #x14 #xFF01)
(CSES #x19 #xFF01)
(CSET #x15 #xFF01)
(CTLC #x32 #xFF01)
(CTLR #x17 #xFF01)
(CTRL #x26 #xFF01)
(CTRU #x25 #xFF01)
(CTSC #x16 #xFF01)
(CTTD #x28 #xFF01)
(CTTQ #x2F #xFF01)
(CTTR #x18 #xFF01)
(CTUN #x27 #xFF01)
(** FCS user defined function codes for US03)
(FCON 1 #xFF03)
(FINV 2 #xFF03)
(FIVT 4 #xFF03)
(FRST 3 #xFF03)
(* * FCS user defined function codes for US05)
(SCPL 1 #xFF05)
(SCRN 4 #xFF05)
(SREQ 2 #xFF05)
(SREP 3 #xFF05)
(* Savoir defined CAPS function codes for US60)
```

```
(CYST 1 #xFF60)
(CSTD 2 #xFF60)
(MREC 3 #xFF60)
(MCPL 4 #xFF60)
(RQPF 5 #xFF60)
(PRTF 6 #xFF60)
(DVAL 7 #xFF60)
(CYCS 8 #xFF60)
(SCYC 9 #xFF60)
(TLCH #xA #xFF60)
(CHTL #xB #xFF60)
(RPPP #xC #xFF60)
(PTDL #xD #xFF60)
(FTLE #xE #xFF60)
(REST #xF #xFF60)
(RDSR #x10 #xFF60)
(SMRQ #x11 #xFF60)
(CNCL #x12 #xFF60)
(CMCC #x13 #xFF60)
(EMCC #x14 #xFF60)
(CAGV #x15 #xFF60)
(EAGV #x16 #xFF60)
(HOME #x17 #xFF60)
(CCNT #x18 #xFF60)
(CYSP #x19 #xFF60)
(PCSP #x1A #xFF60)
(CTAR #x1B #xFF60)
(MREQ #x1C #xFF60)
(CTTA #x1D #xFF60)
(CYCC #x1E #xFF60)
(RTCM #x1F #xFF60)
(CLBD #x20 #xFF60)
(RQTT #x21 #xFF60)
(RTCH #x22 #xFF60)
(PRTT #x23 #xFF60)
(TLCS #x24 #xFF60)
(RQPT #x25 #xFF60)
(RTPR #x26 #xFF60)
(PTDV #x27 #xFF60)
(RPPD #x28 #xFF60)
(FALT #x29 #xFF60)
(ALCL #x2A #xFF60)
(RSAK #x2B #xFF60)
(DSPR #x2C #xFF60)
(MDST #x2D #xFF60)
(MCCY #x2E #xFF60)
(AGVC #x2F #xFF60)
(ESPD #x30 #xFF60)
(CSPD #x31 #xFF60)
(HMED #x32 #xFF60)
(PCSD #x33 #xFF60)
(ESTP #x34 #xFF60)
(CALB #x35 #xFF60)
(TTDL #x36 #xFF60)
(CONT #x37 #xFF60)
(STLC #x38 #xFF60)
(PDVA #x39 #xFF60)
(SELD #x3A #xFF60)
(DNRY #x3B #xFF60)
(DNLC #x3C #xFF60)
(MAST #x3D #xFF60)
(ISTP #x3E #xFF60)
(DATA #x3F #xFF60)
```

```
(IOFS #x40 #xFF60)
(SIOF #x41 #xFF60)
(CWOL #x42 #xFF60)
(ABTO #x43 #xFF60)
(TRWO #x44 #xFF60)
(CDGO #x45 #xFF60)
(NWPT #x46 #xFF60)
(ONLD #x47 #xFF60)
(CDGD #x48 #xFF60)
(CWAL #x49 #xFF60)
(* Function codes used by kitting cell)
(KKPT 1 #xFF61)
(KBNO 2 #xFF61)
(KPIL 3 #xFF61)
(KPST 4 #xFF61)
(KPTP 7 #xFF61)
(KPUP 8 #xFF61)
(KDPP 9 #xFF61)
(KRQT 1 #xFF62)
```

```
(KTSK 2 #xFF62)
(KPAV 3 #xFF62)
(KGPT 4 #xFF62)
(KBLD 5 #xFF62)
(KINS 6 #xFF62)
(KDMP 7 #xFF62)
(KPKT 8 #xFF62)
(KPUT 9 #xFF62)
(KMKT #xA #xFF62)
(KCHN #xB #xFF62)
(KPRK #xC #xFF62)
(KGRK #xD #xFF62)
(KSTG #x20 #xFF62)
(KPRG #x21 #xFF62)
(KPRD #x22 #xFF62)
(KMOV #x23 #xFF62)
(KGTB #x24 #xFF62)
(KWPT #x25 #xFF62)
(KFIN #x26 #xFF62)
(KMCL #x50 #xFF62)
(KPTR #x51 #xFF62)
(KGTR #x52 #xFF62)
(KSLD #x53 #xFF62)
(KKTP #x54 #xFF62)
(KPNT 1 #xFF63)
(KRNT 2 #xFF63)
(KGNT 3 #xFF63)
(KSTC 4 #xFF63)
(KDNT 5 #xFF63)
(KDTY 6 #xFF63)
(KFGT 7 #xFF63)
(KBRC 8 #xFF63)
(KNSC 9 #xFF63)
(KBRA #xA #xFF63)
(* KPAL #xB #xFF63)
(KTAV #xC #xFF63)
(* KPAL #x41 #xFF63)
(KRKT #x42 #xFF63)
(KLAS #x43 #xFF63)
(KNCF #x44 #xFF63)
(* KSTA #x45 #xFF63)
(KDEQ #x46 #xFF63)
(KCFG #x47 #xFF63)
(KPIX 0 #xFF64)
(KRSL 1 #xFF64)
(KNDL 2 #xFF64)
(KSHL 3 #xFF64)
(KRST 4 #xFF64)
(KRSK 5 #xFF64)
(KIPF 6 #xFF64)
(KDNL 7 #xFF64)
(KSDC #xA #xFF64)
(KMBD #xB #xFF64)
(KTYP #x40 #xFF64)
(KNMP #x41 #xFF64)
(KRKL #x42 #xFF64)
(KHSP #x43 #xFF64)
(KSTP #x44 #xFF64)
(KSTA #x45 #xFF64)
(KPRM #x46 #xFF64)
(KPTM #x47 #xFF64)))

(PUTPROPS MMFSDEFS COPYRIGHT ("Savoir, Inc." #x7C2 #x7C3 #x7C4))
```

FUNCTION INDEX

FISMMFSManUpdateTitle ..............................7

METHOD INDEX

FOEManualMMFSBrowser.Browse ........................2
FOEManualMMFSBrowser.BuildAssociationMenu ..........2
FOEManualMMFSBrowser.ConstructTitle ................2
FOEManualMMFSBrowser.Destroy .......................2
FOEManualMMFSBrowser.FindSRStep ....................3
FOEManualMMFSBrowser.MessageReceive ................6
FOEManualMMFSBrowser.MethodMenuSelection ...........6
FOEManualMMFSBrowser.MMFSManAbort ..................3
FOEManualMMFSBrowser.MMFSManAssociate ..............3
FOEManualMMFSBrowser.MMFSManDeRegister .............3
FOEManualMMFSBrowser.MMFSManRegister ...............4
FOEManualMMFSBrowser.MMFSManRelease ................4
FOEManualMMFSBrowser.MMFSManSaveTemplates ..........4
FOEManualMMFSBrowser.MMFSManSend ...................4
FOEManualMMFSBrowser.MMFSManSetGateway .............5
FOEManualMMFSBrowser.MMFSManSetName ................5
FOEManualMMFSBrowser.MMFSManSetTran ................5
FOEManualMMFSBrowser.MMFSManTrace ..................5
FOEManualMMFSBrowser.MMWhenSelected ................6
FOEManualMMFSBrowser.SelCommand ....................6

INSTANCE INDEX

GrafcetMainProgram ..............1
GrafcetReceiveStep ..............1
GrafcetSendStep .................2

VARIABLE INDEX

FISManualMMFSMethodItems ........6
FISMMFSManGatewayFlg ............6

CLASS INDEX

FOEManualMMFSBrowser ............1
ManualMMFSContext ...............1

PROPERTY INDEX

MMFSINTERFACE .................1,7 changes to: (INSTANCES SimpleSendReceiveMainTemplate)
(VARS MMFSINTERFACECOMS)

previous date: 5-Jun-88 14:10:23 {DSK}<LISPFILES>FIS>MMFSINTERFACE.;42

Read Table: INTERLISP

Package: IL

Copyright (c) 1986, 1987, 1988 by savoir. All rights reserved.

```
(RPAQQ MMFSINTERFACECOMS
       ((DECLARE%: DONTCOPY (PROP MAKEFILE-ENVIRONMENT MMFSINTERFACE))
        (CLASSES FOEManualMMFSBrowser ManualMMFSContext)
        (INSTANCES SimpleSendReceiveMainTemplate)
        (METHODS FOEManualMMFSBrowser.Browse FOEManualMMFSBrowser.BuildAssociationMenu
               FOEManualMMFSBrowser.ConstructTitle FOEManualMMFSBrowser.Destroy
               FOEManualMMFSBrowser.FindSRStep FOEManualMMFSBrowser.MMFSManAbort
               FOEManualMMFSBrowser.MMFSManAssociate FOEManualMMFSBrowser.MMFSManDeRegister
               FOEManualMMFSBrowser.MMFSManRegister FOEManualMMFSBrowser.MMFSManRelease
               FOEManualMMFSBrowser.MMFSManSaveTemplates FOEManualMMFSBrowser.MMFSManSend
               FOEManualMMFSBrowser.MMFSManSetGateway FOEManualMMFSBrowser.MMFSManSetName
               FOEManualMMFSBrowser.MMFSManSetTran FOEManualMMFSBrowser.MMFSManTrace
               FOEManualMMFSBrowser.MMWhenSelected FOEManualMMFSBrowser.MessageReceive
               FOEManualMMFSBrowser.MethodMenuSelection FOEManualMMFSBrowser.SelCommand)
        (INITVARS (FISMMFSManGatewayFlg T))
        (GLOBALVARS FISMMFSManGatewayFlg)
        (VARS FISManualMMFSMethodItems)
        (FNS FISMMFSManUpdateTitle)
        (PROP FILETYPE MMFSINTERFACE)))

(DECLARE%: DONTCOPY

(PUTPROPS MMFSINTERFACE MAKEFILE-ENVIRONMENT (:PACKAGE "IL" :READTABLE "INTERLISP" :BASE 10))
)

(DEFCLASS FOEManualMMFSBrowser (MetaClass Class Edited%:       (* TAL "21-Jan-88 14:54")
                                          doc "This is the default metaClass for all classes")
       (Supers FOEGrafcetBrowser)
       [ClassVariables (PrintName " Interface")
              .(MethodItems #.($A (PROGN FISManualMMFSMethodItems) EveryFetch NoUpdatePermitted))
               (DirectionMenuItems ((Source 'source "Selected process is source of traced messages")
                                    (Destination 'destination "Selected process is destination of traced
                                           messages")
                                    (Both 'either "Trace messages to and from selected process"]
```

```
(Instancevariables (registered #.($A NIL NIL FISMMFSManUpdateTitle))
        (sendStep #.($A FindSRStep FFSendSelf ReplaceMe))
        (receiveStep #.($A FindSRStep FFSendSelf ReplaceMe))
        (associationAList NIL doc "AList of (name . channel) for each association")
        (associationMenu NIL doc "Attached menu of associations")
        (associationSelection NIL doc "Current selection")
        (directionMenu NIL DontSave Any doc "cache of direction menu")
        (gateway NIL doc "Alternate gateway addr")))

(DEFCLASS ManualMMFSContext (MetaClass Class Edited%:          (* mcf%. "21-Oct-86 16.03")
                                 doc "This is the default metaClass for all classes")
    (Supers DefaultContext)
    (ClassVariables (Browser #.($C FOEManualMMFSBrowser))
        (SubContextTypes (#.($C ExamineMMFSMessageFolderContext) #.($C ExamineFormContext))))
    (InstanceVariables (object NIL VR #.($C GrafcetMacroProgram))))

(DEFINST GrafcetMainProgram (SimpleSendReceiveMainTemplate (GHXO.1Y%:.<i7.QA> . 2165))
    (subObjects (#.($& GrafcetReceiveStep (GHXO.1Y%:.<i7.QA> . 2172)) #.($& GrafcetSendStep (GHXO.1Y%:.<i7.
QA> . 2173))))
    (objectIdentifier (SimpleSendReceiveMainTemplate NoVersion))
    (quietFlg NIL))

(DEFINST GrafcetReceiveStep ((GHXO.1Y%:.<i7.QA> . 2172))
    (label NIL)
    (superObject #.($& GrafcetMainProgram (GHXO.1Y%:.<i7.QA> . 2165)))
    (center (30 . 180))
    (abbreviation #.($A NIL FISAddAbbrevDelimiters NIL))
    (stepNumber 1))
```

```
(DEFINST GrafcetSendStep ((GHXO.1Y%:.<i7.QA> . 2173))
    (label NIL)
    (superObject #.($& GrafcetMainProgram (GHXO.1Y%:.<i7.QA> . 2165)))
    (center (30 . 220))
    (abbreviation #.($A NIL FISAddAbbrevDelimiters NIL))
    (stepNumber 0))

(\BatchMethodDefs)

(Method ((FOEManualMMFSBrowser Browse) self context object)
                                                  : mcf: 23-Oct-86 09:29
  "Specialization"
  (_Super self Browse context object)
  (for sub in (@ object %:subObjects) do (_ sub CacheFlush))
  (COND
    ((AND FISMMFSManGatewayFlg (EQ (_ MapNetwork MapRegistered? (@ |:sendStep:label|))
                                   1))
     (_@ self %:registered T))))

(Method ((FOEManualMMFSBrowser BuildAssociationMenu) self DontClearFlg)
                                                  . mcf: 2-Oct-86 14:44
  "New method template"
  (LET [menu (menuW (@ %:associationMenu))
             (items (for i in (@ %:associationAList) collect (CAR i]
    [COND
      (menuW (DETACHWINDOW menuW)
             (CLOSEW menuW)
             (SETQ menuW NIL)
             (OR DontClearFlg (_@ %:associationSelection NIL))]
    (REMOVEPROMPTWINDOW (@ %:window))
    (COND
      (items (SETQ menuW (ATTACHMENU (SETQ menu (create MENU
                                                        ITEMS _ items
                                                        WHENSELECTEDFN _ (FUNCTION MWWhenSelectedFN)
                                                        CENTERFLG _ T
                                                        TITLE _ "Associations"))
                                     (@ %:window)
                                     'LEFT
                                     'TOP))
             (WINDOWPROP menuW 'Browser self)))
    (_@ %:associationMenu menuW)
    (AND (EQ (LENGTH items)
             1)
         (_@ %:associationSelection (CAR items)))
    (COND
      ((@ %:associationSelection)
       (_ self MWWhenSelected (@ %:associationSelection)
          menu NIL menuW)))
    menuW))

(Method ((FOEManualMMFSBrowser ConstructTitle) self object browsername)
                                                  mcf: 19-Nov-86 11 44
                                                  . Specialization
  "(_Super self ConstructTitle object browsername)"
  (CONCAT (COND
            ((AND object (@ object %:sendStepAList))
             (CAAR (@ object %:sendStepAList)))
            (T "Manual"))
          (@ |::PrintName|)
          (COND
            ((@ %:registered)
             ": Registered   ")
            (T ": Not Registered"))))
```

```
(Method ((FOEManualMMFSBrowser Destroy) self)    TAL 21-Jan-88 14:56
   "Specialization"
   (LET (assocs regs (obj (@ %:object)))
     (RESETLST
        (RESETSAVE (CURSOR WAITINGCURSOR))
        (ALLOW.BUTTON.EVENTS)
        (SETQ assocs (@ %:associationAList))
        (SETQ regs (@ |:sendStep:label|))
        (for con in (COPY (@ |:context:spawnedContexts|)) do (_ con Exit))
                                             (* Context Exit destructively modifies this list)
        (for sub in (@ obj %:subObjects) do (_ sub Destroy))
        [COND
           (FISMMFSManGatewayFlg (for associates in assocs do (_ MapNetwork MapRelease (CDR associates)))
                  (_ MapNetwork MapDeRegister regs)        (* (OR (@ MapNetwork % registrations)
```

```
                                             (_ MapNetwork MapReset)))
                  ]
        (_Super self Destroy)
        (_ obj Destroy))))

(Method ((FOEManualMMFSBrowser FindSRStep) self localSt varName propName)
                                             : mcf: 23-Sep-86 13.08
   "New method template"
   (CADAR (GetIt (@ %:object)
                 (PACK* localSt "AList"))))

(Method ((FOEManualMMFSBrowser MMFSManAbort) self Sel)
                                             : mcf: 23-Sep-86 16.29
   "New method template"
   (_ self MMFSManRelease Sel T))

(Method ((FOEManualMMFSBrowser MMFSManAssociate) self)
                                             . TAL 21-Jan-88 14:59
   "New method template"
   (COND
      [(@ %:registered)
       (LET ((TTYIN.DONT.STRIP.BLANKS T)
             name subname channel w)
         (DECLARE (SPECVARS TTYIN.DONT.STRIP.BLANKS))
         [COND
            ((EQ [SETQ name (MENU (create MENU
                                          ITEMS _ (NCONC1 (_ (@ self %:sendStep)
                                                             ComputeCorrespondents)
                                                          '*Other*)
                                          CENTERFLG _ T
                                          CHANGEOFFSETFLG _ T
                                          TITLE _ 'Correspondent]
                 '*Other*)
              (SETQ name (_ self SWPromptForWord "Correspondent: " NIL T)]
         (COND
            [(PROGN name)
             (SETQ subname (_ self SWPromptForString "Application context: "))
             (RESETLST
                (RESETSAVE (CURSOR WAITINGCURSOR))
                (COND
                   ((COND
                       ((FASSOC name (@ %:associationAList))
                        (_ self SWPromptPrint "Association already exits" NIL T NIL 1200)
                        NIL)
                       ((PROGN FISMMFSManGatewayFlg)
                        (COND
                           ((NEQ (SETQ channel (_ MapNetwork MapAssociate (@ |:sendStep:label|)
                                                      name subname NIL (@ %:gateway)))
                                 -1)
                            (push (@ %:associationAList)
                                  (CONS name channel)))
                           (T (_ self SWPromptPrint "ERROR: Association failed" NIL T NIL 1200)
                              NIL)))
                       (T (push (@ %:associationAList)
                                (CONS name channel))
                          T))
                    (SETQ w (_ self BuildAssociationMenu))
                    (_ self MWWhenSelected name (CAR (WINDOWPROP w 'MENU))
                           NIL w))))]
            (T (_ self SWPromptPrint "ERROR: Correspondent required" NIL T NIL 1200)]
      (T (_ self SWPromptPrint "ERROR: Please register first" NIL T NIL 1200))))

(Method ((FOEManualMMFSBrowser MMFSManDeRegister) self)
                                             . mcf  1-Oct-86 10.25
   "New method template"
   [LET ((name (@ |:sendStep:label|)))
     (COND
        (name [COND
                 (FISMMFSManGatewayFlg (for associates in (@ %:associationAList)
                                          do (_ MapNetwork MapRelease (CDR associates)))]
              (_@ %:registered NIL)
              (_@ %:associationSelection NIL)
              (_@ %:associationAList NIL)
              (_ self BuildAssociationMenu)
              (COND
                 (FISMMFSManGatewayFlg (_ MapNetwork MapDeRegister name)])
```

```
(Method ((FOEManualMMFSBrowser MMFSManRegister) self)
                                                     TAL 21-Jan-88 15:00
   "Register the name; send error messages to the prompt window"
   [LET ((name (@ |:sendStep:label|)))
     (COND
        (name (COND
                (FISMMFSManGatewayFlg (AND (_ MapNetwork MapRegister name self NIL (@ %:gateway))
                                           (_@ %:registered T)))
                (T (_@ %:registered T))])

(Method ((FOEManualMMFSBrowser MMFSManRelease) self Sel AbortFlg)
                                                     mct: 1-Oct-86 11:53
   "New method template"
   [LET ((sel Sel))
     (RESETLST
        (RESETSAVE (CURSOR WAITINGCURSOR))
        (COND
           (sel (SETQ sel (FASSOC sel (@ %:associationAList)))
                (change (@ %:associationAList)
                        (DREMOVE sel DATUM))
                [COND
                   (FISMMFSManGatewayFlg (_! MapNetwork (COND
                                                          (AbortFlg 'MapAbort)
                                                          (T 'MapRelease))
                                                    (CDR sel))]
                (_ self BuildAssociationMenu))))])

(Method ((FOEManualMMFSBrowser MMFSManSaveTemplates) self)
                                                     TAL 10-Jan-88 18.43
   "New method template"
   [LET (file (send (@ |:sendStep:sendableTemplates|))
              (receive (@ |:receiveStep:receivableTemplates|))
              (w SavoirPROMPTWINDOW))
     (COND
        [(OR send receive)
         [COND
            ((SETQ file (WHEREIS send 'INSTANCES))
             (SETQ file (CAR file)))
            (T (SETQ file (U-CASE (_ self SWPromptForWord "Store on file: " (U-CASE (CONCAT (@
                                                                                 |:sendStep:label|
)
                                                                                 ".Templates"))
                                                 T NIL w)]
         (COND
            (file (NLSETQ (RESETLST
                             (RESETSAVE (TTYDISPLAYSTREAM w))
                             (RESETSAVE (TTY.PROCESS (THIS.PROCESS)))
                             (RESETSAVE NOSPELLFLG 'Programs)
                             (RESETSAVE COPYRIGHTFLG NIL)
                             (RESETSAVE (CURSOR WAITINGCURSOR))
                             (AND send (ADDTOFILE (@ send %:name)
                                                  'INSTANCES file))
                             (AND receive (ADDTOFILE (@ receive %:name)
                                                     'INSTANCES file))
                             (_ self SWPromptPrint (CONCAT "Saving: " file "...")
                                    T NIL w)
                             (MAKEFILE file FISMakefilesOptions)
                             (_ self SWPromptPrint "Done" 'NOCR 1 w))]
        (T (_ self SWPromptPrint "No templates to save" T 1 NIL 1200)])

(Method ((FOEManualMMFSBrowser MMFSManSend) self Correspondent)
                                                     mct: 3-Oct-86 13.59
   "New method template"
   [LET (dataDesc newMsg msg id)
     (COND
        [(AND (SETQ msg (@ |:sendStep:sendableTemplates|))
              (SETQ msg (_ msg CheckPropList 'TEMPLATEFOLDERBROWSER))
              (SETQ msg (@ msg %:selection)))
         (COND
            [(EQ Correspondent (@ msg %:destination))
             (COND
                [(SETQ dataDesc (@ msg %:dataDescription))      (* There must be a data-description or the message hasn't been
                                                                 compiled or is ill-formed)
                 (COND
                    [[for x in dataDesc never (OR (type? MMFSTemplateData (fetch MMFSFieldData of x))
                                                  (type? MMFSTemplateData (fetch MMFSFieldLen of x]
                     (SETQ newMsg (_ (DEFERREDCONSTANT ($ MMFSMessage))
                                     New))
                     (_ newMsg ConstructMsg msg NIL NIL (@ %:sendStep))
```

```
                     (COND
                        (FISMMFSManGatewayFlg (COND
                                                ([SETQ id (CDR (FASSOC Correspondent (@ %:associationAList)]
                                                 (_ MapNetwork SendMessage newMsg id))
                                                (T (_ self SWPromptPrint "ERROR: Can't find association" NIL
                                                                T NIL 1200)]
                    (T (_ self SWPromptPrint "ERROR: Selected message contains variables" NIL T NIL 1200)]
                (T (_ self SWPromptPrint "ERROR: Selected message hasn't been compiled" NIL T NIL 1200)]
            (T (_ self SWPromptPrint "ERROR: Destination conflicts with association" NIL T NIL 1200)]
        (T (_ self SWPromptPrint "ERROR: Select message to send first" NIL T NIL 1200)])
```

```
(Method ((FOEManualMMFSBrowser MMFSManSetGateway) self)
                                                        ; TAL 21-Jan-88 15.57
  "New method template"
  [LET ((gate (_ self SWPromptForWord "Gateway addr: " (@ %:gateway)
                      T))
        addr)
    (COND
       ((NULL gate)
        (_@ %:gateway NIL)
        (_ self SWPromptPrint "OK, using default" NIL NIL NIL 800))
       ((SETQ addr (_ MapNetwork NSAddrFromSpec gate))
        (_@ %:gateway gate)
        (_ self SWPromptPrint (CONCAT "OK,  " addr)
              NIL NIL NIL 1200))
       (T (_ self SWPromptPrint "ERROR: Illegal gateway address" NIL T NIL 1200)])

(Method ((FOEManualMMFSBrowser MMFSManSetName) self MMFSProcessName)
                                                        ; mcf: 23-Sep-86 15.38
  "Change the MMFS process and reset associated information in the browser"
  [LET (name)
    (COND
       ((SETQ name (OR MMFSProcessName (_ self SWPromptForWord "New name: " NIL T)))
                                          (* check registration and associations)
        (for sub in (@ |:object:subObjects|) do (_ sub SetLabel name)
                                                (_ sub CacheFlush)])

(Method ((FOEManualMMFSBrowser MMFSManSetTran) self)
                                                        ; mcf: 23-Sep-86 14 32
  "New method template"
  [LET (newTN)
    (COND
       ([FIXP (SETQ newTN (_ self SWPromptForWord "New Number: " (@ |:sendStep:lastTN|)))]
        (_@ |:sendStep:lastTN| newTN))
       (T (_ self SWPromptPrint "ERROR: Integer required" NIL T NIL 1200)])

(Method ((FOEManualMMFSBrowser MMFSManTrace) self Sel)
                                                        ; mcf: 18-Dec-86 12.24
  "New method template"
  [LET (filter direction oldFilter)
    (SETQ filter (_ ($ MMFSTraceFilter)
                    New))
    (_@ filter %:traceName (@ |:sendStep:label|))
    (_@ filter %:correspondent (CONS (MKATOM Sel)))
    (SETQ direction (OR [MENU (OR (@ %:directionMenu)
                                  (_@ %:directionMenu (create MENU
                                                         ITEMS _ (@ |::DirectionMenuItems|)
                                                         CENTERFLG _ T
                                                         CHANGEOFFSETFLG _ T
                                                         TITLE _ 'Direction))]
                        'either))
    (_@ filter %:!\direction (CONS (@ |:sendStep:label|)))
    (COND
       ((SETQ oldFilter (_ MapNetwork FindTraceFilter filter))
        (_ (@ oldFilter %:traceBrowser)
           FlashBrowser))
       (T (_ (@ %:context)
             SpawnLinkedContext
             ($ MMFSTraceContext)
             filter)])
```

Page 6

```
(Method ((FOEManualMMFSBrowser MWWhenSelected) self Item Menu Key Window)
                                                        ; mcf: 23-Sep-86 15:55
  "New method template"
  (LET ((oldItem (@ %:associationSelection)))
    (COND
       (oldItem (SHADEITEM oldItem Menu WHITESHADE Window)))
    (SHADEITEM Item Menu BLACKSHADE Window)
    (_@ %:associationSelection Item)))

(Method ((FOEManualMMFSBrowser MessageReceive) self Id Cmd Local Remote)
                                                        ; mcf: 3-Oct-86 16:32
  "New method template"
  (SELECTQ Cmd
     (Association (_ self SWPromptPrint (CONCAT "Association received from " Remote)
                       NIL T NIL 2000)
                  (push (@ %:associationAList)
                        (CONS (MKATOM Remote)
                              Id))
                  (_ self BuildAssociationMenu T))
     ((Release Abort)
          (change (@ %:associationAList)
                  (DREMOVE (FASSOC Remote DATUM)
                           DATUM))
          (_ self BuildAssociationMenu)
          (_ self SWPromptPrint (CONCAT Cmd " received from " Remote)
                NIL T NIL 2000))
     (Receive (_ MapNetwork GetMessage Local (@ %:receiveStep)))
     (Close (_@ %:registered NIL)
            (_ MapNetwork MapDeRegister Local))
     NIL))
```

```
(Method ((FOEManualMMFSBrowser MethodMenuSelection) self Item Button SubObject)
                                                      , mct: 30-Oct-86 14:41
   "Specialization"
   [LET ((Process (@ self %:menuProcess)))
     (COND
        ((AND (PROCESSP Process)
              (NEQ Process (THIS.PROCESS))
              (PLAYTUNE RINGBELLS.L1)))
        (T (_@ self %:menuProcess (THIS.PROCESS))
           (_Super self MethodMenuSelection Item Button SubObject)
           (_@ self %:menuProcess NIL)])

(Method ((FOEManualMMFSBrowser SelCommand) self Item)
                                                      , mct: 23-Sep-86 16:32
   "New method template"
   [LET ((com (CAADR Item))
         (sel (@ %:associationSelection)))
     (COND
        (sel (_! self com sel))
        (T (_ self SWPromptPrint "ERROR: Select association first" NIL T NIL 1200)])

(\UnbatchMethodDefs)

(RPAQ? FISMMFSManGatewayFlg T)

(DECLARE%: DOEVAL@COMPILE DONTCOPY

(GLOBALVARS FISMMFSManGatewayFlg)
)

(RPAQQ FISManualMMFSMethodItems
       ((Register MMFSManRegister "Register MMFS process on the MAP network")
        (Associate MMFSManAssociate "Associate MMFS process with (prompted for) process on the MAP network")
        (Send (MMFSManSend SelCommand)
              "Send selected message on the current MMFS Association"
              (SUBITEMS ("Set Transaction Number" MMFSManSetTran "Manually set the transaction number for the
                         next message")))
        (Release (MMFSManRelease SelCommand)
               "Remove selected association from the MAP network"
               (SUBITEMS (Abort (MMFSManAbort SelCommand)
                                "Abort selected association on the MAP network")))
        (De-Register MMFSManDeRegister "Remove registration from the MAP network")
        (Trace (MMFSManTrace SelCommand)
               "Trace messages received on selected association")
        (Save MMFSManSaveTemplates "Save the templates associated with this session on a file")
        (Gateway MMFSManSetGateway "Specify address of alternate MAP gateway")))

(DEFINEQ
```

```
(FISMMFSManUpdateTitle
  [LAMBDA (self varName newValue propName activeVal type)      (* mct%: "25-Nov-86 12.14")

          (* This is a putFn. ***NOTE*** The value of this function will be returned as the value of any enclosing PutValue.
          This usually means that you want to return the value returned by PutLocalState.)

    (PutLocalState activeVal newValue self varName propName type)
    (WINDOWPROP (@ %:window)
           'TITLE
           (_ self ConstructTitle (@ %:object))])
)

(PUTPROPS MMFSINTERFACE FILETYPE :FAKE-COMPILE-FILE)

(PUTPROPS MMFSINTERFACE COPYRIGHT ("savoir" 1986 1987 1988))
```

FUNCTION INDEX

NetworkStatus.GetStatus .........7 NetworkStatus.MakeAssociation ...7 NetworkStatusFilterFn ..........7

METHOD INDEX

NetworkFormEditor.Browse ..........................2
NetworkFormEditor.ComputeExtent ....................2
NetworkFormEditor.Destroy ..........................2
NetworkFormEditor.LeftSelection ....................2
NetworkFormEditor.LocateField ......................3
NetworkFormEditor.LocateFieldFromID ................3
NetworkFormEditor.LocateFieldFromRegName ...........3
NetworkFormEditor.LocateLowestTableEntry ...........3
NetworkFormEditor.LocateTargetField ................3
NetworkFormEditor.MiddleSelection ..................4
NetworkFormEditor.PrintActivity ....................4
NetworkFormEditor.ShapeToFit .......................4
NetworkFormEditor.ToggleActivity ...................4
NetworkFormEditor.UpdateActivity ...................4
NetworkFormEditor.UpdateAllFields ..................4
NetworkFormEditor.UpdateAssociations ...............5
NetworkFormEditor.UpdateFields .....................5
NetworkFormEditor.UpdateMisc .......................5
NetworkFormEditor.UpdateNetworkStatus ..............5
NetworkFormEditor.UpdateRegistrations ..............6
NetworkStatusForm.GetAssociations ..................6
NetworkStatusForm.GetGateway .......................7
NetworkStatusForm.GetRegistrations .................7
NetworkStatusForm.GetTimeout .......................7

CLASS INDEX

NetworkFormEditor ...............1
NetworkStatusAssociation ........1
NetworkStatusContext ...........1
NetworkStatusForm ..............2
NetworkStatusObject ............2
NetworkStatusRegistration ......2

PROPERTY INDEX

NETSTAT .......................1,7 changes to: (FNS NetworkStatus.MakeAssociation)
(VARS NETSTATCOMS)

previous date: 6-Jun-88 10:57:44 (POGO:AISNORTH:XEROX)<LIPKIS>FIS>NETSTAT.;24

Read Table: INTERLISP

Package: IL

;; Copyright (c) 1986, 1987, 1988 by Savoir, Inc.. All rights reserved.

```
(RPAQQ NETSTATCOMS
       ((DECLARE%: DONTCOPY (PROP MAKEFILE-ENVIRONMENT NETSTAT))
        (FILES (FROM WORKS)
               SWFORMEDIT)
        (CLASSES NetworkFormEditor NetworkStatusAssociation NetworkStatusContext NetworkStatusForm
               NetworkStatusObject NetworkStatusRegistration)
        (METHODS NetworkFormEditor.Browse NetworkFormEditor.ComputeExtent NetworkFormEditor.Destroy
               NetworkFormEditor.LeftSelection NetworkFormEditor.LocateField
               NetworkFormEditor.LocateFieldFromID NetworkFormEditor.LocateFieldFromRegName
               NetworkFormEditor.LocateLowestTableEntry NetworkFormEditor.LocateTargetField
               NetworkFormEditor.MiddleSelection NetworkFormEditor.PrintActivity NetworkFormEditor.ShapeToFit
               NetworkFormEditor.ToggleActivity NetworkFormEditor.UpdateActivity
               NetworkFormEditor.UpdateAllFields NetworkFormEditor.UpdateAssociations
               NetworkFormEditor.UpdateFields NetworkFormEditor.UpdateMisc
               NetworkFormEditor.UpdateNetworkStatus NetworkFormEditor.UpdateRegistrations
               NetworkStatusForm.GetAssociations NetworkStatusForm.GetGateway
               NetworkStatusForm.GetRegistrations NetworkStatusForm.GetTimeout)
        (FNS NetworkStatus.GetStatus NetworkStatus.MakeAssociation NetworkStatusFilterFn)
        (PROP FILETYPE NETSTAT)))

(DECLARE%: DONTCOPY

(PUTPROPS NETSTAT MAKEFILE-ENVIRONMENT (:PACKAGE "IL" :READTABLE "INTERLISP" :BASE 10))
)

(FILESLOAD (FROM WORKS)
       SWFORMEDIT)

(DEFCLASS NetworkFormEditor (MetaClass Class Edited%:          (* mcl%. " 1-Dec-86 17 09")
                                doc "This is the default metaClass for all classes")
       (Supers SWOldFormEditor)
       (ClassVariables (PrintName "MAP Network Status")
              (ActivityTitle "MAP Network Activity")
              (MiddleMethodItems NIL)
              (HorizMethodItems ((Exit ExitBrowser "Exit out of this Browser")
                                 (Activity ToggleActivity "Toggle display of MAP network activity")
                                 ("Shape to Fit" ShapeToFit "Shape window to fit display"))
                     doc "(Update UpdateAllFields Update status display)")
              (CompactTableFlg T)
              (MinHeight 150))
       (InstanceVariables (activityTrace NIL doc "window used in the activity trace")
              (activityStream NIL doc "stream used by activity window")))
```

```
(DEFCLASS NetworkStatusAssociation (MetaClass Class Edited%: (* mcl%. "19-Nov-86 17 14")
                                         doc "This is the default metaClass for all classes")
       (Supers NetworkStatusObject)
       (ClassVariables (SummaryFields (nsId nsName nsStatus)))
       (InstanceVariables (nsName NIL FieldSpec Atom Heading Local/Remote)
              (nsStatus NIL FieldSpec Atom Heading Status)
              (nsId NIL Heading ID doc "MapNetwork's numeric identifier")
              (nsNames NIL doc "MapNetwork's name identifier")))

(DEFCLASS NetworkStatusContext (MetaClass Class Edited%:    (* mcl%. "11-Nov-86 13 25")
                                         doc "This is the default metaClass for all classes")
       (Supers SWExamineFormContext)
       (ClassVariables (AttachHorizMenu T)
              (Browser #,($C NetworkFormEditor)))
       (InstanceVariables (object NIL VR #,($C NetworkStatusForm))))
```

```
(DEFCLASS NetworkStatusForm (MetaClass Class Edited%:       (* mcl%. "19-Nov-86 13:05")
                                   doc "This is the default metaClass for all classes")
       (Supers NetworkStatusObject)
       (ClassVariables (DisplayFields (netGateways netTimeouts netRegistrations netAssociations)))
       (InstanceVariables (netGateways #,($A GetGateway AVSendSelf ReplaceMe) FieldSpec Atom Heading "UB
                                 Address")
              (netTimeouts #,($A GetTimeout AVSendSelf ReplaceMe) FieldSpec Atom Heading "Timeout    ")
              (netRegistrations #,($A GetRegistrations FFSendSelf ReplaceMe) FieldSpec (Table
                                                                     #,($C NetworkStatusRegistration)
                                                                     )

                     Heading Registrations)
              (netAssociations #,($A GetAssociations FFSendSelf ReplaceMe) FieldSpec (Table
                                                                     #,($C NetworkStatusAssociation)
                                                                     )

                     Heading "Associations ")))

(DEFCLASS NetworkStatusObject (MetaClass Class Edited%:     (* mcl%. "11-Nov-86 15:51")
                                   doc "This is the default metaClass for all classes")
       (Supers ComputerObject))

(DEFCLASS NetworkStatusRegistration (MetaClass Class Edited%:
                                                            (* mcl%. "12-Nov-86 12:32")
                                         doc "This is the default metaClass for all classes")
       (Supers NetworkStatusObject)
       (ClassVariables (SummaryFields (nsName nsStatus)))
       (InstanceVariables (nsName NIL FieldSpec Atom Heading Name)
              (nsStatus NIL FieldSpec Atom Heading Status)))

(\BatchMethodDefs)

(Method ((NetworkFormEditor Browse) self context object)
                                                            . mcl: 15-Nov-86 12:19
   "Specialization"
   (_Super self Browse context object)
   (_ self ToggleActivity))

(Method ((NetworkFormEditor ComputeExtent) self): mcl: 1-Dec-86 17 07
   "Specialization"
   (LET (extent)
     (SETQ extent (_Super self ComputeExtent))
     (replace WIDTH of extent with FISTraceWidth)
     (replace HEIGHT of extent with (MAX (fetch HEIGHT of extent)
                                         (@ |::MinHeight|)))
     extent))

(Method ((NetworkFormEditor Destroy) self)                  . mcl: 15-Nov-86 11 39
   "Specialization"
   (LET ((obj (@ self %:object)))
     [COND
        ((ObjectExists? obj)
         (for iv in (@ obj |::DisplayFields|) do (_@ obj %:!\iv NotSetValue)]
                                                            . dispose of the activity trace
     (AND (@ %:activityTrace)
          (_ self ToggleActivity))
     (_Super self Destroy)))

(Method ((NetworkFormEditor LeftSelection) self)   . mcl: 11-Nov-86 13:38
                                                            . Specialization
   "(_Super self LeftSelection)"
   (PROG ((window (@ %:window))
          subObj)
         (SETQ subObj (_ self FindSelectedSubObject window (FUNCTION NetworkStatusFilterFn)))
         (OR subObj (RETURN NIL))
         (_ self Highlight subObj 'Shade)

          (* * subObj has been selected, but not sure what to do with selections yet)

     NIL))
```

```
(Method ((NetworkFormEditor LocateField) self ParentIV TargetIV Value RegType)
                                                          : mcf: 14-Nov-86 13:28
  "New method template"
  [LET (fields)
    [SETQ fields (COND
                   [ParentIV (for f in (@ %:fields) thereis (EQ ParentIV (fetch FFIVName of f]
                   (T (@ %:fields)]
    (for f inside fields thereisval (COND
                                      ((AND RegType (EQ RegType (fetch FFRegType of f)))
                                       f)
                                      ([AND TargetIV (EQ TargetIV (fetch FFIVName of f))
                                            (OR (NOT Value)
                                                (EQUAL Value (fetch FFValue of f]
                                       f)
                                      (T (_ self LocateTargetField f TargetIV Value RegType)])

(Method ((NetworkFormEditor LocateFieldFromID) self Id Field Parent)
                                                          : mcf: 12-Nov-86 13:43
  "New method template"
  [LET (id iv (parent Parent))
    (COND
      ([OR parent (AND (SETQ id (_ self LocateField 'netAssociations 'nsId Id))
                       (SETQ parent (fetch FFParent of id]
       (COND
         ((SETQ iv (SELECTQ Field
                     (Id 'nsId)
                     (Name 'nsName)
                     (Status 'nsStatus)
                     NIL))
          (_ self LocateTargetField parent iv))
         (T parent])

(Method ((NetworkFormEditor LocateFieldFromRegName) self Name Field Parent)
                                                          : mcf: 12-Nov-86 13.43
  "New method template"
  [LET (iv name (parent Parent))
    (COND
      ([OR parent (AND (SETQ name (_ self LocateField 'netRegistrations 'nsName Name))
                       (SETQ parent (fetch FFParent of name]
       (COND
         ((SETQ iv (SELECTQ Field
                     (Name 'nsName)
                     (Status 'nsStatus)
                     NIL))
          (_ self LocateTargetField parent iv))
         (T parent])

(Method ((NetworkFormEditor LocateLowestTableEntry) self IV)
                                                          mcf: 13-Nov-86 15:43
  "New method template"
  [LET (field)
    (COND
      ((SETQ field (_ self LocateField IV NIL NIL 'TableHeading))
       (bind val (max _ 0) for sf in (fetch FFSubFields of (fetch FFParent of field))
          when (IGREATERP (SETQ val (fetch FFBottom of sf))
                          max)
          do (SETQ max val)
             (SETQ $$VAL sf)
          yield $$VAL])

(Method ((NetworkFormEditor LocateTargetField) self Field TargetIV Value RegType)
                                                          : mcf: 12-Nov-86 18:22
  "New method template"
  [for sf in (fetch FFSubFields of Field) thereisval (COND
                                                      ((AND RegType (EQ RegType (fetch FFRegType
                                                                                   of sf)))
                                                       sf)
                                                      ([AND TargetIV (EQ TargetIV (fetch FFIVName
                                                                                     of sf))
                                                            (OR (NOT Value)
                                                                (EQUAL Value (fetch FFValue of sf]
                                                       sf)
                                                      (T (_ self LocateTargetField sf TargetIV Value
                                                                RegType)])
```

```
(Method ((NetworkFormEditor MiddleSelection) self)
                                                          : mcf: 11-Nov-86 13:36
  "Specialization"
  (_Super self MiddleSelection (FUNCTION NetworkStatusFilterFn)))

(Method ((NetworkFormEditor PrintActivity) self str); mcf: 15-Nov-86 14:04
  "New method template"
  (LET (stream)
    (AND str (SETQ stream (@ %:activityStream))
         (printout stream str T))))
```

```
(Method ((NetworkFormEditor ShapeToFit) self)        . mct: 14-Nov-86 12:44
   "New method template"
   [LET ((dx (@ %:downExtent)))
     (AND dx (_ self ShapeFromUpperLeft (MAX (@ %:width)
                                             (fetch WIDTH of dx))
                     (fetch HEIGHT of dx))])

(Method ((NetworkFormEditor ToggleActivity) self) . mct: 9-Jul-87 14:22
   "New method template"
   [LET (reg (actw (@ %:activityTrace))
          (w (@ %:window)))
     (COND
        (actw (DETACHWINDOW actw)
              (COND
                 ((TEXTSTREAMP (WINDOWPROP actw 'TEXTSTREAM))
                  (TEDIT.KILL (TEXTSTREAM actw)))
                 (T (CLEARW actw)))
              (CLOSEW actw)
              (_@ self %:activityTrace NIL)
              (_@ self %:activityStream NIL))
        (T [SETQ reg (COPY (WINDOWPROP w 'REGION]
           (replace BOTTOM of reg with (IDIFFERENCE (fetch BOTTOM of reg)
                                                    FISTraceHeight))
           (replace HEIGHT of reg with FISTraceHeight)
           (_@ self %:activityStream (SETQ actw (FISCreateTraceWindow NIL NIL NIL 'TEDIT T T)))
           (_ self UpdateActivity)
           (_@ self %:activityStream (SETQ actw (FISCreateTraceWindow reg (@ !::ActivityTitle)
                                                     NIL
                                                     'TEDIT T NIL actw)))
           (SETQ actw (WFROMDS actw))
           (ATTACHMENU (create MENU
                          ITEMS _ '(("")
                                   (Clear FISInitializeTextStream "Clear the contents of this window"))
                          CENTERFLG _ T
                          MENUBORDERSIZE _ 1
                          WHENSELECTEDFN _ (FUNCTION SWWhenSelectedFN))
                 actw
                 'TOP
                 'JUSTIFY)
           (ATTACHWINDOW actw w 'BOTTOM 'LEFT)
           (_@ self %:activityTrace actw)])

(Method ((NetworkFormEditor UpdateActivity) self) . mct: 1-Dec-86 16:38
   "New method template"
   [LET (msgs)
     (COND
        ((AND MapNetwork (@ %:activityStream)
              (SETQ msgs (@ MapNetwork %:statusMsgs)))
         (_@ MapNetwork %:statusMsgs NIL)
         (_@ MapNetwork %:statusMsgCount NIL)
         (for m in msgs do (_ self PrintActivity m)])

(Method ((NetworkFormEditor UpdateAllFields) self)
                                                     . mct: 14-Nov-86 13:58
   "Update all relevant fields"
   [LET ((obj (@ %:object)))
     (COND
        (MapNetwork (_ self UpdateRegistrations obj)
               (_ self UpdateAssociations obj)
               (_ self UpdateMisc obj)])
```

```
(Method ((NetworkFormEditor UpdateAssociations) self Obj)
                                                     . mct: 13-Nov-86 15.46
   "New method template"
   [LET (toDel toAdd toChange oldAscs (obj (OR Obj (@ %:object)))
             (ascs (@ MapNetwork %:associations)))
     (SETQ oldAscs (@ obj %:netAssociations))
     (SETQ toDel (for a in oldAscs collect (CONS (@ a %:nsId)
                                                  a)))
     [bind oa for a in ascs do (COND
                                  ((SETQ oa (FASSOC (fetch MAPAssocID of a)
                                                    toDel))
                                   (push toChange (CONS (CDR oa)
                                                        a))
                                   (SETQ toDel (DREMOVE oa toDel)))
                                  (T (push toAdd a]
     [COND
        (toDel (bind goners for td in toDel do (_ self DeleteField NIL (_ self LocateFieldFromID (CAR td)))
                                               (push goners (CDR td))
               finally (change (@ obj %:netAssociations)
                               (LDIFFERENCE oldAscs goners]
```

```
[COND
   (toChange (bind field status for tc in toChange when (COND
                                                          ((SETQ field (_ self LocateFieldFromID
                                                                                (CADR tc)
                                                                                'Status))
                                                           (COND
                                                              ([NEQ (@ (CAR tc)
                                                                       %:nsStatus)
                                                                    (SETQ status (
                                                                          NetworkStatus.GetStatus
                                                                           (CDR tc]
                                                                 (_@ (CAR tc)
                                                                     %:nsStatus status) .
                                                                 T)))
                                                          (T (push toAdd (CAR tc))

      (* On the first update, we may have computed oldAscs via the active value, and so it will not reflect what is currently displayed)

                                                                NIL))
                 do (_ self ChangeField NIL field (CONS (CONS status)))]
(COND
   (toAdd (bind field aobj for ta in toAdd collect (COND
                                                      ((LISTP ta)
                                                       (SETQ aobj (NetworkStatus.MakeAssociation ta))
                                                       (change (@ obj %:netAssociations)
                                                               (NCONC1 DATUM aobj)))
                                                      (T (SETQ aobj ta)))
                                                   (SETQ field (_ self LocateLowestTableEntry
                                                                       'netAssociations))
                                                   (_ self AddField NIL field (_ self BuildField
                                                                                     'TableEntry
                                                                                     (fetch FFType
                                                                                        of field)
                                                                                     aobj
                                                                                     (fetch FFParent
                                                                                        of field))))])
```

```
(Method ((NetworkFormEditor UpdateFields) self)                    mcf: 14-Nov-86 13:56
   "Update a subset of fields; used under simulation"
   [LET ((obj (@ %:object)))
     (COND
        (MapNetwork (_ self UpdateRegistrations obj)
               (_ self UpdateAssociations obj)])
```

```
(Method ((NetworkFormEditor UpdateMisc) self Obj)                  mcf: 14-Nov-86 13:54
   "New method template"
   [bind field newval (obj _ (OR Obj (@ %:object))) for iv in '(netGateways netTimeouts)
      when (NEQ [fetch FFValue of (SETQ field (CADR (fetch FFSubFields of (_ self LocateField NIL iv)]
                (SETQ newval (@ obj %:!\iv)))
      do (_ self ChangeField NIL field (CONS (CONS newval)))])
```

```
(Method ((NetworkFormEditor UpdateNetworkStatus) self)
                                                                    mcf: 1-Dec-86 16 22
   "New method template"
   (_ self UpdateActivity)
   (_ self UpdateFields))
```

```
(Method ((NetworkFormEditor UpdateRegistrations) self Obj)
                                                                    mcf: 13-Nov-86 15:46
   "New method template"
   [LET (toDel toAdd toChange oldRegs (obj (OR Obj (@ %:object)))
               (regs (@ MapNetwork %:registrations)))
     (SETQ oldRegs (@ obj %:netRegistrations))
     (SETQ toDel (for r in oldRegs collect (CONS (@ r %:nsName)
                                                  r)))
     [bind or for r in regs do (COND
                                  ((SETQ or (FASSOC (fetch MAPName of r)
                                                    toDel))
                                   (push toChange (CONS (CDR or)
                                                        r))
                                   (SETQ toDel (DREMOVE or toDel)))
                                  (T (push toAdd r]
     [COND
        (toDel (bind goners for td in toDel do (_ self DeleteField NIL (_ self LocateFieldFromRegName
                                                                              (CAR td)))
                                               (push goners (CDR td))
                 finally (change (@ obj %:netRegistrations)
                                 (LDIFFERENCE oldRegs goners]
```

```
[COND
   (toChange (bind field status for tc in toChange when (COND
                                                           ((SETQ field (_ self LocateFieldFromRegName
                                                                               (CADR tc)
                                                                               'Status))
                                                            (COND
                                                               ((NEQ (@ (CAR tc)
                                                                        %:nsStatus)
                                                                     (SETQ status (
                                                                                  NetworkStatus.GetStatus
                                                                                   (CDR tc)
                                                                                   T)))
                                                                (_@ (CAR tc)
                                                                    %:nsStatus status)
                                                                T)))
                                                           (T (push toAdd (CAR tc))

        (* On the first update, we may have computed oldRegs via the active value, and so it will not reflect what is currently displayed)

                                                              NIL))
                 do (_ self ChangeField NIL field (CONS (CONS status)))]
(COND
   (toAdd (bind field robj for ta in toAdd collect (COND
                                                      ((LISTP ta)
                                                       (SETQ robj (_ (DEFERREDCONSTANT ($
                                                                                          NetworkStatusRegistration
                                                                                          ))
                                                                     New))
                                                       (_@ robj %:nsName (fetch MAPName of ta))
                                                       (_@ robj %:nsStatus (NetworkStatus.GetStatus
                                                                               ta T))
                                                       (change (@ obj %:netRegistrations)
                                                               (NCONC1 DATUM robj)))
                                                      (T (SETQ robj ta)))
                                               (SETQ field (_ self LocateLowestTableEntry
                                                                  'netRegistrations))
                                               (_ self AddField NIL field (_ self BuildField
                                                                              'TableEntry
                                                                              (fetch FFType
                                                                                 of field)
                                                                              robj
                                                                              (fetch FFParent
                                                                                 of field)))])
```

```
(Method ((NetworkStatusForm GetAssociations) self)
                                                          ; mcf: 13-Nov-86 10.44
   "New method template"
   [LET (ascs)
     (COND
        ((AND MapNetwork (SETQ ascs (@ MapNetwork %:associations)))
         (SETQ ascs (for a in ascs collect (NetworkStatus.MakeAssociation a)))
         (SORT ascs (FUNCTION (LAMBDA (A B)
                              (IGREATERP (@ B %:nsId)
                                         (@ A %:nsId)])
```

```
(Method ((NetworkStatusForm GetGateway) self)        ; mcf: 11-Nov-86 15:10
   "New method template"
   (AND MapNetwork (@ MapNetwork %:defaultGateway)))

(Method ((NetworkStatusForm GetRegistrations) self)
                                                          ; mcf: 13-Nov-86 12:37
   "New method template"
   [LET (regs)
     (COND
        ((AND MapNetwork (SETQ regs (@ MapNetwork %:registrations)))
         (bind robj for r in regs collect (SETQ robj (_ (DEFERREDCONSTANT ($ NetworkStatusRegistration))
                                                        New))
                                          (_@ robj %:nsName (fetch MAPName of r))
                                          (_@ robj %:nsStatus (NetworkStatus.GetStatus r T))
                                          robj])

(Method ((NetworkStatusForm GetTimeout) self)        ; mcf: 11-Nov-86 15:10
   "New method template"
   (AND MapNetwork (@ MapNetwork %:mapTimeout)))

(\UnbatchMethodDefs)

(DEFINEQ

(NetworkStatus.GetStatus
  [LAMBDA (Chan RegFlg)                                (* mcf%. "13-Nov-86 12.29")
    (LET (status)
      (SELECTQ (SETQ status (fetch MAPChannel of Chan))
          (Internal (COND
                       (RegFlg 'Reg)
                       (T 'Open)))
          (COND
             ((LISTP status)
              (fetch GEMSChanState of status))
             (T 'Closed])
```

(NetworkStatus.MakeAssociation

```
  [LAMBDA (AssocRecord)                                   Edited 24-Jun-88 11 26 by lipkis
    (LET (name obj)
      (SETQ obj (_ (DEFERREDCONSTANT ($ NetworkStatusAssociation))
                   New))
      (_@ obj %:nsId (fetch WAPAssocID of AssocRecord))
      (SETQ name (fetch WAPAssocNames of AssocRecord))
      (_@ obj %:nsNames name)
      (_@ obj %:nsName (CONCAT (CAR name)
                              "/"
                              (CADR name)))
      (_@ obj %:nsStatus (NetworkStatus.GetStatus AssocRecord))
      obj])
```

(NetworkStatusFilterFn

```
  [LAMBDA (field)                                         (* mcf%: "12-Nov-86 10:38")
                                                          (* (NOT (FMEMB (fetch FFRegType of field)
                                                          (QUOTE (Aggregate Table TableHeading)))))
    (AND (NEQ (fetch FFType of field)
              'Heading)
         (EQ (fetch FFRegType of field)
             'Leaf])
)

(PUTPROPS NETSTAT FILETYPE :FAKE-COMPILE-FILE)

(PUTPROPS NETSTAT COPYRIGHT ("Savoir, Inc." 1986 1987 1988))
```

VARIABLE INDEX

FISFirstQualVersion ............1    FISVersionNumber ...............1    FISVersionString ...............1 changes to: (VARS FISVERSIONCOMS)

previous date: 5-Jun-88 12:55:46 (DSK)<LISPFILES>LYRIC>FIS>FISVERSION.;8

Read Table: INTERLISP

Package: INTERLISP

;; Copyright (c) 1987, 1988 by Savoir, Inc.. All rights reserved.

```
(RPAQQ FISVERSIONCOMS (

;;; FISVersionString FISVersionNumber should be incremented in parallel to the currently released version number. FISFirstQualVersion is the first release where
;;; version numbering was enforced

                      (VARS FISFirstQualVersion FISVersionString FISVersionNumber)))

;;; FISVersionString FISVersionNumber should be incremented in parallel to the currently released version number. FISFirstQualVersion is the first release where
;;; version numbering was enforced

(RPAQQ FISFirstQualVersion 2.18)

(RPAQQ FISVersionString "2.30")

(RPAQQ FISVersionNumber 2.3)

(PUTPROPS FISVERSION COPYRIGHT ("Savoir, Inc." 1987 1988))
```

FUNCTION INDEX

ExamineSVSubItemFn .............19
FISConvertCCharConstant ........19
FISDIGITBASEP ..................20
FISREADNUMBERINBASE ............20
FISSVTitleFromPath .............21

METHOD INDEX

ExamineSubSVFolderContext.ProcessContextArgs .......4
ExamineSVFolderContext.CheckSVAutoFlg ..............3
ExamineSVFolderContext.FindObject ..................3
StateVariable.ComputeVarDoc ........................14
StateVariable.GetTypeRecord ........................14
StateVariableDocBrowser.Browse .....................14
StateVariableDocBrowser.Repaint ....................15
StateVariableFolder.ClearSVCache ...................15
StateVariableFolder.GetValue .......................15
StateVariableFolder.ProcessNonObjects ..............15
StateVariableFolder.PutValue .......................15
StateVariableNexus.AnalysisScope ...................15
StateVariableNexus.FFGetValue ......................15
StateVariableNexus.GetArrayValue ...................15
StateVariableNexus.GetBoolArrayValue ...............16
StateVariableNexus.GetComplexValue .................16
StateVariableNexus.GetStringValue ..................16
StateVariableNexus.GetStructValue ..................16
StateVariableNexus.GetSubType ......................17
StateVariableNexus.GetType .........................17
StateVariableNexus.GetValue ........................17
StateVariableNexus.ObjectForSearch .................17
StateVariableNexus.PutValue ........................17
SubStateVariable.ComputeVarNameStr .................18
SubStateVariable.GetTypeRecord .....................18
SubStateVariableFolder.ClearSVCache ................18
SubStateVariableFolder.ComputeAccessPath ...........18
SubStateVariableFolder.ComputeAccessValue ..........18
SubStateVariableFolder.ComputePathCache ............18
SubStateVariableFolder.ComputePointerFlg ...........19
SubStateVariableFolder.GetValue ....................19
SubStateVariableFolder.PutValue ....................19
SVFolderBrowser.AttachMethodMenu ...................4
SVFolderBrowser.Browse .............................4
SVFolderBrowser.ChoiceMenu .........................4
SVFolderBrowser.ClearSVCache .......................4
SVFolderBrowser.ComputeElementWidths ...............5
SVFolderBrowser.ComputeSVAssocLst ..................5
SVFolderBrowser.ComputeSVNames .....................5
SVFolderBrowser.ConstructTitle .....................5
SVFolderBrowser.Destroy ............................5
SVFolderBrowser.DetachAndMove ......................5
SVFolderBrowser.ElementChanged .....................6
SVFolderBrowser.ElementUnchanged ...................6
SVFolderBrowser.Examine ............................6
SVFolderBrowser.ExamineAsArray .....................6
SVFolderBrowser.ExamineCharacterArray ..............7
SVFolderBrowser.ExamineCharArray ...................7
SVFolderBrowser.GetMenuItems .......................7
SVFolderBrowser.GetProcessContext ..................7
SVFolderBrowser.MarkElement ........................7
SVFolderBrowser.MiddleItemPredicate ................7
SVFolderBrowser.RadixSet ...........................8
SVFolderBrowser.RadixShow ..........................8
SVFolderBrowser.Repaint ............................8
SVFolderBrowser.RepaintChangedElement ..............8
SVFolderBrowser.RepaintElement .....................9
SVFolderBrowser.SetSVToChar ........................9
SVFolderBrowser.SetSVToF ...........................9
SVFolderBrowser.SetSVToString ......................9
SVFolderBrowser.SetSVToT ...........................9
SVFolderBrowser.SetSVToValue .......................9
SVFolderBrowser.SetSVValue .........................9
SVFolderBrowser.ShapeToFit .........................10
SVFolderBrowser.ShowValue ..........................10
SVFolderBrowser.ShowValues .........................10
SVFolderBrowser.UpdateValueDisplay .................11
SVSubFolderBrowser.ComputeMaxHeight ................11
SVSubFolderBrowser.ComputeSuperTitle ...............11
SVSubFolderBrowser.ConstructTitle ..................11
SVSubFolderBrowser.CreateMethodMenu ................12
SVSubFolderBrowser.CreateSuperTitleWindow ..........12
SVSubFolderBrowser.GetShapeRegion ..................12
SVSubFolderBrowser.LockPointer .....................12
SVSubFolderBrowser.Repaint .........................13
SVSubFolderBrowser.RepaintSuperTitle ...............13
SVSubFolderBrowser.Shape ...........................13
SVSubFolderBrowser.ShowValues ......................13
SVSubFolderBrowser.Update ..........................13
SVSubFolderBrowser.UpdateSVValues ..................13
SVTopFolderBrowser.UpdateSVValues ..................14

VARIABLE INDEX

CCCBackList ....................22
CCCEscapeList ..................26
CCCListArray ...................26
FISAutoStateVariableValues .....21
FISBooleanTypeLst ..............21
FISCharacterTypeLst ............21
FISOldSVCharFlg ................21
FISPointerTypeLst ..............21
FISSVAddressFormat .............21
FISSVAddressPrefix .............21
FISSVAddressSuffix .............21
FISSVExamineArrayLst ...........21
FISSVExamineCharArrayLst .......21
FISSVFullVarNameFlg ............21
FISSVLockPointerFlg ............21
FISSVLockPrefix ................21
FISSVLockSuffix ................21
FISSVMarkChar ..................21
FISSVMaxTitlePathLength ........21
FISSVShowAddressFlg ............21
FISSVTypeTitleFlg ..............21
FISSVValueWithSubItems .........22
FISSVValueWithSubItems2 ........22
SWGlobalParameters .............22

CLASS INDEX

ExamineSubSVFolderContext .......2
ExamineSVFolderContext ..........2
StateVariable ...................2
StateVariableDoc ................2
StateVariableDocBrowser .........2
StateVariableDocContext .........2
StateVariableFolder .............3
StateVariableNexus ..............3
SubStateVariable ................3
SubStateVariableFolder ..........3
SVFolderBrowser .................2
SVSubFolderBrowser ..............2
SVTopFolderBrowser ..............2

PROPERTY INDEX

FISSV ..........................26

MACRO INDEX

\CCC.FastArrayFetch ............21

```
  changes to:  (CLASSES SVFolderBrowser StateVariableFolder StateVariableNexus SubStateVariableFolder)
               (METHODS SVFolderBrowser.Repaint SVFolderBrowser.RepaintChangedElement
                      SVFolderBrowser.RepaintElement SVFolderBrowser.ShowValue SVFolderBrowser.ShowValues
                      SVFolderBrowser.UpdateValueDisplay SubStateVariableFolder.ComputeAccessPath
                      SVSubFolderBrowser.UpdateSVValues SVFolderBrowser.SetSVValue
                      SVFolderBrowser.SetSVToEnum SVFolderBrowser.MiddleItemPredicate
                      StateVariableNexus.GetValue StateVariableNexus.PutValue SVFolderBrowser.Examine)
               (VARS FISSVCOMS)
               (FNS ExamineSVSubItemFn)

previous date:   2-Aug-88 12:37:24  (DSK)<LISPFILES2>FIS>FISSV.;15

  Read Table:  INTERLISP

     Package:  INTERLISP
```

;; Copyright (c) 1988 by Savoir, Inc.. All rights reserved.

```
(RPAQQ FISSVCOMS
       ((CLASSES ExamineSVFolderContext ExamineSubSVFolderContext SVFolderBrowser SVSubFolderBrowser
               SVTopFolderBrowser StateVariable StateVariableDoc StateVariableDocBrowser
               StateVariableDocContext StateVariableFolder StateVariableNexus SubStateVariable
               SubStateVariableFolder)
        (METHODS ExamineSVFolderContext.CheckSVAutoFlg ExamineSVFolderContext.FindObject
               ExamineSubSVFolderContext.ProcessContextArgs SVFolderBrowser.AttachMethodMenu
               SVFolderBrowser.Browse SVFolderBrowser.ChoiceMenu SVFolderBrowser.ClearSVCache
               SVFolderBrowser.ComputeElementWidths SVFolderBrowser.ComputeSVAssocLst
               SVFolderBrowser.ComputeSVNames SVFolderBrowser.ConstructTitle SVFolderBrowser.Destroy
               SVFolderBrowser.DetachAndMove SVFolderBrowser.ElementChanged SVFolderBrowser.ElementUnchanged
               SVFolderBrowser.Examine SVFolderBrowser.ExamineAsArray SVFolderBrowser.ExamineCharArray
               SVFolderBrowser.ExamineCharacterArray SVFolderBrowser.GetMenuItems
               SVFolderBrowser:GetProcessContext SVFolderBrowser.MarkElement
               SVFolderBrowser.MiddleItemPredicate SVFolderBrowser.RadixSet SVFolderBrowser.RadixShow
               SVFolderBrowser.Repaint SVFolderBrowser.RepaintChangedElement SVFolderBrowser.RepaintElement
               SVFolderBrowser.SetSVToChar SVFolderBrowser.SetSVToF SVFolderBrowser.SetSVToString
               SVFolderBrowser.SetSVToT SVFolderBrowser.SetSVToValue SVFolderBrowser.SetSVValue
               SVFolderBrowser.ShapeToFit SVFolderBrowser.ShowValue SVFolderBrowser.ShowValues
               SVFolderBrowser.UpdateValueDisplay SVSubFolderBrowser.ComputeMaxHeight
               SVSubFolderBrowser.ComputeSuperTitle SVSubFolderBrowser.ConstructTitle
               SVSubFolderBrowser.CreateMethodMenu SVSubFolderBrowser.CreateSuperTitleWindow
               SVSubFolderBrowser.GetShapeRegion SVSubFolderBrowser.LockPointer SVSubFolderBrowser.Repaint
               SVSubFolderBrowser.RepaintSuperTitle SVSubFolderBrowser.Shape SVSubFolderBrowser.ShowValues
               SVSubFolderBrowser.Update SVSubFolderBrowser.UpdateSVValues SVTopFolderBrowser.UpdateSVValues
               StateVariable.ComputeVarDoc StateVariable.GetTypeRecord StateVariableDocBrowser.Browse
               StateVariableDocBrowser.Repaint StateVariableFolder.ClearSVCache StateVariableFolder.GetValue
               StateVariableFolder.ProcessNonObjects StateVariableFolder.PutValue
               StateVariableNexus.AnalysisScope StateVariableNexus.FFGetValue
               StateVariableNexus.GetArrayValue StateVariableNexus.GetBoolArrayValue
               StateVariableNexus.GetComplexValue StateVariableNexus.GetStringValue
               StateVariableNexus.GetStructValue StateVariableNexus.GetSubType StateVariableNexus.GetType
               StateVariableNexus.GetValue StateVariableNexus.ObjectForSearch StateVariableNexus.PutValue
               SubStateVariable.ComputeVarNameStr SubStateVariable.GetTypeRecord
               SubStateVariableFolder.ClearSVCache SubStateVariableFolder.ComputeAccessPath
               SubStateVariableFolder.ComputeAccessValue SubStateVariableFolder.ComputePathCache
               SubStateVariableFolder.ComputePointerFlg SubStateVariableFolder.GetValue
               SubStateVariableFolder.PutValue)
        (FNS ExamineSVSubItemFn FISConvertCCharConstant FISDIGITBASEP FISREADNUMBERINBASE FISSVTitleFromPath)
        (INITVARS (FISSVAddressFormat '(FIX NIL 16))
               (FISSVAddressPrefix "#<")
               (FISSVAddressSuffix ">")
               (FISSVLockPointerFlg)
               (FISSVLockPrefix (CHARACTER 124))
               (FISSVLockSuffix (CHARACTER 124))
               (FISSVMaxTitlePathLength)
               (FISSVShowAddressFlg T)
               (FISSVMarkChar "*")
               (FISAutoStateVariableValues T)
               (FISOldSVCharFlg T))
        (MACROS \CCC.FastArrayFetch)
        (VARS FISBooleanTypeLst FISCharacterTypeLst FISPointerTypeLst FISSVExamineArrayLst
               FISSVExamineCharArrayLst FISSVFullVarNameFlg FISSVTypeTitleFlg FISSVValueWithSubItems
               FISSVValueWithSubItems2)
        (GLOBALVARS FISOldSVCharFlg FISBooleanTypeLst FISCharacterTypeLst FISPointerTypeLst FISSVMarkChar
               FISAutoStateVariableValues)
        (ADDVARS (SWGlobalParameters (AutoStateVariableValues FISAutoStateVariableValues SWBooleanP "a
                                                    boolean")))
        (VARS CCCBackList CCCEscapeList CCCListArray)
```

Page 2

```
        (PROP FILETYPE FISSV)))

(DEFCLASS ExamineSVFolderContext (MetaClass Class Edited%:           (* mcl%: " 8-Mar-88 18:19"))
       (Supers ExamineFolderContentsContext)
       (ClassVariables (AttachHorizMenu T doc                         (* Controls appearance of horizontal menu items, defaults on))
              (SubContexts NIL)
              (LinkedContexts NIL)
              (SubContextTypes (#,($C GrafcetVarAnalysisContext)))
              (MenuName ("View State Variables" ("View " * " State Variables")))
              (MenuDoc "View the state variables, and see who sets & tests them.")
              (Browser #,($C SVTopFolderBrowser))
              (InitialActions (CheckSVAutoFlg))
              (Prototype #,($& ExamineSVFolderContext (|NFWO.L2[:.OH=| . 195))))
       (InstanceVariables (object NIL VR #,($C StateVariableFolder))))
```

```
(DEFCLASS ExamineSubSVFolderContext (MetaClass Class Edited%:
                                                        (* mcl%: " 8-Mar-88 18:19"))
        (Supers ExamineSVFolderContext)
        (ClassVariables (SubContextTypes NIL)
                (Browser #.($C SVSubFolderBrowser)))
        (InstanceVariables (object NIL VR #.($C SubStateVariableFolder))))

[DEFCLASS SVFolderBrowser (MetaClass Class Edited%:      . Edited 14-Sep-88 13:20 by TAL
                                    )
        (Supers GrafcetFolderBrowser)
        (ClassVariables (MiddleMethodItems #.($A ((Examine Examine "Examine the contents of this state variable
") ("Set to True" (SetSVToT SetSVValue) "Set state variable True") ("Set to False" (SetSVToF SetSVValue) "Set
state variable False") ("Set to Value" (SetSVToValue SetSVValue) "Prompts for new value, and sets state variab
le to it") ("Set to Character" (SetSVToChar SetSVValue) "Prompts for a character, and sets state variable to i
t") ("Set to String" (SetSVToString SetSVValue) "Prompts for a string, and sets state variable to it")) UnionS
uperValue NoUpdatePermitted))
                (AttachRightButtonItems '((Move 'DetachAndMove "Move the window")))
                (MinSeparatorFields 4 doc          (* Separators drawn only if at least this many fields)))
        (InstanceVariables (dontShapeFlg #.($A T FFCache ReplaceMe) doc
                                                   (* dont auto ShapeToFit if set))
                (myProcessBrowser NIL doc          (* process browser to connect to))
                (properties #.($A ComputeSVNames FFSendSelf ReplaceMe) doc
                                                   (* names of browsed state variables))
                (svAssocLst #.($A ComputeSVAssocLst FFSendSelf ReplaceMe) doc
                                                   (* AList maps names to elements))
                (subObjectValueCache NIL doc       (* store (name region value) here))
                (oldChanges NIL doc                (* cache of items changed on previous scan)]

(DEFCLASS SVSubFolderBrowser (MetaClass Class Edited%:    (* mcl%. "16-Mar-88 16:19"))
        (Supers SVFolderBrowser)
        (ClassVariables (MaxHeight #.($A ComputeMaxHeight AVSendSelf NoUpdatePermitted)))
        (InstanceVariables (properties NIL)
                (svAssocLst NIL)
                (superTitleWindow NIL)
                (superTitle NIL)
                (addressCache NIL)))

(DEFCLASS SVTopFolderBrowser (MetaClass Class Edited%:    (* mcl%. " 4-Mar-88 07 47"))
        (Supers SVFolderBrowser))

[DEFCLASS StateVariable (MetaClass Class Edited%:         (* mcl%: " 3-Mar-88 10.19"))
        (Supers StateVariableNexus)
        (ClassVariables (PrintName "State Variable")
                (SummaryFields (varName changed iValue))
                (DisplayFields (varName))
                (BrowseableSubParts (varDoc))
                (Prototype #.($& StateVariable (UXV0.0BZ%::GM8 . 784))))
        (InstanceVariables (varDoc #.($A ComputeVarDoc FFSendSelf ReplaceMe) doc
                                                   (* IV added by FEBER)]

(DEFCLASS StateVariableDoc (MetaClass Class Edited%:      (* TAL " 1-May-86 17 36"))
        (Supers ComputerObject)
        (InstanceVariables (docStrings NIL)))

(DEFCLASS StateVariableDocBrowser (MetaClass Class Edited%:   (* TAL " 1-May-86 18.06"))
        (Supers Browser)
        (ClassVariables (PrintName "Documentation")
                (Scrollable T))
        (InstanceVariables (extent NIL)))

(DEFCLASS StateVariableDocContext (MetaClass Class Edited%:   (* TAL " 1-May-86 18:12"))
        (Supers DefaultContext)
        (ClassVariables (AttachHorizMenu T)
                (MenuName "Documentation")
                (MenuDoc "View a description of the state variable")
                (Browser #.($C StateVariableDocBrowser)))
        (InstanceVariables (object NIL VR #.($C StateVariableDoc))))
```

Page 3

```
[DEFCLASS StateVariableFolder (MetaClass Class Edited%:    . Edited 11-Sep-88 17:04 by TAL
                                          )
        (Supers Folder)
        (ClassVariables (SortCompareFn UALPHORDER)
                (Valuable Off doc                  (* have values, initially off)))
        (InstanceVariables (elements NIL VR #.($C StateVariable))
                (scope NIL doc                     (* main program, when available. Used to get at the process context))
                (pathSpec NIL doc                  (* The path from top level to this object))
                (radix #.($A 10 FFCache ReplaceMe) doc   (* printout radix for any numeric values)]

[DEFCLASS StateVariableNexus (MetaClass Class Edited%:     . Edited 11-Sep-88 19:08 by TAL
                                        )
        (Supers ComputerObject)
        (InstanceVariables (varName NIL doc        (* IV added by FEBER))
                (changed NIL doc                   (* IV added by FEBER))
                (container NIL doc                 (* folder containing me, used to get value))
                (iValue #.($A FFGetValue FFSendSelf ReplaceMe) TypicalElement "ABCDEFG" doc
                                                   (* value of varName))
                (nameCache NIL doc                 (* info about varNameStr))
                (pValue NIL doc                    (* storage for value when CPointer))
                (type #.($A GetType AVSendSelf NoUpdatePermitted) doc
                                                   (* retrieve (user) type))
                (typeRecord #.($A GetTypeRecord FFSendSelf ReplaceMe) doc
                                                   (* Cache for type information -
                                                   cleared on initialization and changing ids)]
```

```
(DEFCLASS SubStateVariable (MetaClass Class Edited%:            (* mct%  3 Mar-88 10 27"))
       (Supers StateVariableNexus)
       (ClassVariables (PrintName "State Variable")
             (SummaryFields (varNameStr changed iValue))
             (DisplayFields (varNameStr)))
       (InstanceVariables (varNameStr #,($A ComputeVarNameStr FFSendSelf ReplaceMe))))

(DEFCLASS SubStateVariableFolder (MetaClass Class Edited%:      . Edited 14-Sep-88 15.52 by TAL
                                                                )
       (Supers StateVariableFolder)
       (ClassVariables (SortCompareFn NIL))
       (InstanceVariables (elements NIL VR #,($C SubStateVariable))
             (pathCache #,($A ComputePathCache FFSendSelf ReplaceMe) doc
                                                 (* IV added by FEBER))
             (accessPath #,($A ComputeAccessPath FFSendSelf ReplaceMe) doc
                                                 (* Data structure used for computing my parts. cleared on clearcache))
             (accessValue #,($A ComputeAccessValue FFSendSelf ReplaceMe) doc
                                                 (* Currently the computed cpointer through which values are fetched))
             (typeString NIL doc                 (* passed from above))
             (forceType NIL doc                  (* force the object to be displayed as another type))
             (pointerFlg #,($A ComputePointerFlg FFSendSelf ReplaceMe) doc
                                                 (* pointers involved somewhere))

(\BatchMethodDefs)

(Method ((ExamineSVFolderContext CheckSVAutoFlg) self)
                                                                . mct: 1-Mar-88 17 52
   "New method template"
   [COND
     ((AND FISAutoStateVariableValues (@ self |:object:scope|)
          (@ self |:object:scope:processContext|))
      (_@ self |:myBrowser:valuable| 'On)])

(Method ((ExamineSVFolderContext FindObject) self suppliedObject)
                                                                . mct: 1-Mar-88 17 52
   "Specialization"
   (LET ((folder (_Super self FindObject suppliedObject))
         context obj)          (* (COND ((COND ((AND (SETQ obj (@ self %.spawnersSubObject))
                                  (_ obj InstOf! (QUOTE GrafcetProgram))
                                  (SETQ obj (@ obj %.caller)))) ((AND (SETQ context
                                  (CAR (@ %.spawningContexts))) (SETQ obj
                                  (@ context %.object)) (Object? obj) (_ obj InstOf!
                                  (QUOTE GrafcetProgram)))) (_@ folder %.scope
                                  (@ obj %.mainProgram)) (for ele in (@ folder %.elements) do
                                  (_@ ele % container folder)))))

     [COND
       ([AND (NULL (@ folder %:scope))
             (OR (AND (SETQ obj (@ self %:spawnersSubObject))
                      (_ obj InstOf! 'GrafcetProgram))
                 (AND (SETQ context (CAR (@ %:spawningContexts)))
                      (SETQ obj (@ context %:object))
                      (Object? obj)
                      (_ obj InstOf! 'GrafcetProgram))
                 (AND (_ obj InstOf' 'StateVariableFolder)
```

```
                      (SETQ obj (@ obj %:scope)]
        (_@ folder %:scope (@ obj %:mainProgram))]
     folder))

(Method ((ExamineSubSVFolderContext ProcessContextArgs) self ContextArgs)
                                                                : mct: 15-Mar-88 14:44
                                                                : Specialization
   "(_Super self ProcessContextArgs ContextArgs)"
   [LET (temp)
     (COND
       ((AND ContextArgs)
        (COND
          ((SETQ temp (LISTGET ContextArgs 'pathSpec))
           (_@ self |:object:pathSpec| temp)))
        (COND
          ((SETQ temp (LISTGET ContextArgs 'typeString))
           (_@ self |:object:typeString| temp)))
        (COND
          ((SETQ temp (LISTGET ContextArgs 'forceType))
           (_@ self |:object:forceType| temp)))
        (COND
          ((SETQ temp (LISTGET ContextArgs 'radix))
           (_@ self |:object:radix| temp)])

(Method ((SVFolderBrowser AttachMethodMenu) self Items)
                                                                mct: 21 Mar-88 15.32
                                                                . Specialization
   "Its either this or a subitemfn"
   (DECLARE (GLOBALVARS FISSVValueWithSubItems FISSVValueWithSubItems2))
   (LET (vitem (items (COPY Items)))
     [COND
       ((SETQ vitem (FASSOC 'Values items))
        (COND
          ((FMEMB '* (@ |:object:pathSpec|))
           (RPLACA (FMEMB vitem items)
```

```
          (APPEND vitem FISSVValueWithSubItems2)))
     (T (RPLACA (FMEMB vitem items)
                (APPEND vitem FISSVValueWithSubItems]
  (_Super self AttachMethodMenu items)))
```

(Method ((SVFolderBrowser Browse) self context object)
mct: 3-Jul-86 09:04

```
  "Specialization"
  (_Super self Browse context object)
  (LET ((svb (@ |:object:scope:processContext|)))
    (AND svb (SETQ svb (@ svb %:myBrowser))
         (_ svb AddStateWindow self))))
```

(Method ((SVFolderBrowser ChoiceMenu) self itemCV)
mct: 10-Mar-88 14 43

```
  "Specialization"
  (LET (menu)
    (SETQ menu (_Super self ChoiceMenu itemCV))
    (AND menu (SELECTQ itemCV
                (MiddleButtonItems
                  (replace SUBITEMFN of menu with 'ExamineSVSubItemFn))
                NIL))
    menu))
```

(Method ((SVFolderBrowser ClearSVCache) self TypeOnlyFlg)
mct: 21-Mar-88 14:43

```
  "New method template"
  [COND
    (TypeOnlyFlg (for e in (@ %:elements) do (_@ e %:typeRecord NotSetValue)))
    (T (for e in (@ %:elements) do (_@ e %:iValue NotSetValue)
                                   (_@ e %:typeRecord NotSetValue)]
  (_ (@ %:object)
     ClearSVCache))
```

(Method ((SVFolderBrowser ComputeElementWidths) self Elements Font UniqueLstFlg)
mct: 28-Mar-88 12:38

```
  "Specialization"
  [LET (cWidths font parens string (radix (@ |:object:radix|)))
    (COND
      ((AND radix (NEQ radix 10))
       (SETQ string (ALLOCSTRING 0))
       [SETQ font (OR Font (DSPFONT NIL (@ %:window)]
       (SETQ parens (STRINGWIDTH "()" font))
       (SETQ cWidths (@ %:cacheWidths))
       (AND UniqueLstFlg (SETQ cWidths (COPY cWidths)))
       (bind val w for c on cWidths as field in (@ %:fields) as maxW in (@ %:maxWidths)
          do [RPLACA c (IMIN maxW (for x inside Elements eachtime (SETQ val (OR (@ x %:!\field)
                                                                                 (ValueIfSet (@ x
                                                                                   |:!\field:,TypicalElement:
))
                                                                                 ""))
                                                              [COND
                                                                ((FIXP val)
                                                                 (SETQ val (ConvertNumberToString val
                                                                                radix string]
                                                              (SETQ w (STRINGWIDTH val font))
                                    maximize (COND
                                               ((LISTP val)
                                                (IDIFFERENCE w parens))
                                               (T w]
          yield cWidths))
      (T (_Super )]))
```

(Method ((SVFolderBrowser ComputeSVAssocLst) self)
mct: 3-Jul-86 09:05

```
  "New method template"
  (for ele in (@ %:elements) collect (CONS (@ ele %:varName)
                                            ele)))
```

(Method ((SVFolderBrowser ComputeSVNames) self)
mct: 3-Jul-86 09:05

```
  "New method template"
  (for ele in (@ %:elements) collect (@ ele %:varName)))
```

(Method ((SVFolderBrowser ConstructTitle) self Object Browsername)
mct: 4-Mar-88 11 17

```
  "Specialization"
  (LET (path name scope (otitle (_Super self ConstructTitle Object Browsername)))
    (OR (AND (EQUAL otitle "State Variables")
             Object
             (SETQ scope (ObjectExists? (@ Object %:scope)))
             (SETQ name (_ scope QualifiedPrintName))
             (SETQ name (CONCAT name " SVs"))
             name)
        otitle)))
```

```
(Method ((SVFolderBrowser Destroy) self)                    . mct: 16-Dec-86 16.49
   "Specialization"
   (LET ((mpb (@ %:myProcessBrowser)))
     (AND mpb (NOT (DestroyedObject? mpb))
          (_ mpb RemoveStateWindow self))
     (for e in (@ %:elements) do (_@ e %:container NIL))       (* Remove circular reference so elements will be garbage collected)
     (_@ %:elements NIL)
     (_Super self Destroy)))

(Method ((SVFolderBrowser DetachAndMove) self)  . mct: 16-Dec-86 17 05
   "New method template"
   (LET (super (context (@ %:context)))
     [COND
       ([SETQ super (ObjectExists? (CAR (@ context %:spawningContexts)]
        (change (@ super %:spawnedContexts)
                (DREMOVE context DATUM]
     (_@ context %:spawningContexts NotSetValue)
     (_@ context %:spawningRelation 'TopLevel)
     (DETACHWINDOW (@ %:window))                              (* (_@ self % dontShapeFlg NIL))
     (_ self Move)
     (_ self AttachMethodMenu (@ |::HorizMethodItems|))))
```

Page 6

```
(Method ((SVFolderBrowser ElementChanged) self Element DontShapeFlg Stream DontMarkFlg)
                                                              . mct: 3-Mar-88 15:34
   "Specialization"
   (LET [(stream (OR Stream (@ %:window)]
     (_Super self ElementChanged Element (@ %:dontShapeFlg)
             stream)
     (_ self MarkElement Element stream DontMarkFlg)))

(Method ((SVFolderBrowser ElementUnchanged) self Element Stream)
                                                              . mct: 11-Mar-88 16.18
   "New method template"
   (_ self MarkElement Element Stream 'Clear))

(Method ((SVFolderBrowser Examine) self Item SubObject)
                                                              . Edited 14-Sep-88 17 08 by TAL
   "New method template"
   [LET [dimen path subTypeRec type typeRecord typeString varLst (sv (OR SubObject (@ middleSubObject)]
     (RESETLST
        (RESETSAVE (CURSOR WAITINGCURSOR))
        (SETQ typeRecord (@ sv typeRecord))
        [SETQ path (APPEND (@ |:object:pathSpec|)
                           (CONS (@ sv varName)]
        [COND
           ((EQ (SETQ type (fetch CCType/Type of typeRecord))
                'pointer)
            (NCONC1 path '*)
            (SETQ typeRecord (fetch CCType/SubType of typeRecord))
            (SETQ type (fetch CCType/Type of typeRecord]
        [SETQ varLst (SELECTQ type
                          (array (SETQ dimen (fetch CCType/ArrayDim of typeRecord))
                                 (SETQ subTypeRec (fetch CCType/SubType of typeRecord))
                                 (SETQ typeString (_ sv GetArrayValue (fetch CCType/UserType of subTypeRec
                                                         subTypeRec dimen NIL NIL T))
                                 (for x from 0 to (SUB1 dimen) collect x))
                          ((struct union)
                               (SETQ typeString (_ sv GetStructValue type typeRecord NIL NIL T))
                               (CC.StructMemberNames typeRecord))
                          (pointer NIL)
                          (PROGN (SETQ typeString type)
                                 (CONS (@ sv varName)]
        [AND varLst (_ (@ context)
                       SpawnLinkedContext
                       (DEFERREDCONSTANT ($ ExamineSubSVFolderContext))
                       varLst
                       (LIST 'pathSpec path 'typeString typeString 'radix (@ self |:object:radix|))))])])

(Method ((SVFolderBrowser ExamineAsArray) self Item SubObject ForceType)
                                                              mct: 15-Mar-88 14 41
   "New method template"
   [LET [dimen path subTypeRec type typeRecord typeString varLst (sv (OR SubObject (@ %:middleSubObject)]
     (COND
       [[NUMBERP (SETQ dimen (MKATOM (_ self SWPromptForWord "Length: " NIL NIL 1)]
        (RESETLST
           (RESETSAVE (CURSOR WAITINGCURSOR))
           (SETQ typeRecord (@ sv %:typeRecord))
           [SETQ path (APPEND (@ |:object:pathSpec|)
                              (CONS (@ sv %:varName)]
           [COND
              ((EQ (fetch CCType/Type of typeRecord)
                   'pointer)
               (NCONC1 path '*)
               (SETQ typeRecord (fetch CCType/SubType of typeRecord))
               (SETQ type (fetch CCType/Type of typeRecord))
               (SETQ varLst (for x from 0 to (SUB1 dimen) collect x))
               (SETQ typeString (_ sv GetArrayValue (OR ForceType type)
                                       typeRecord dimen NIL NIL T))
```

```
                  (AND varLst (_ (@ %:context)
                                  SpawnLinkedContext
                                  (DEFERREDCONSTANT ($ ExamineSubSVFolderContext))
                                  varLst
                                  (LIST 'pathSpec path 'typeString typeString 'forceType ForceType 'radix
                                        (@ self |:object:radix|))))]]
        (T (_ self SWPromptPrint "Length must be a number." NIL 1 NIL 2000))])
```

```
(Method ((SVFolderBrowser ExamineCharArray) self Item SubObject)
                                                        , mcf: 10-Mar-88 11:40
   "New method template"
   (_ self ExamineAsArray Item SubObject 'char))

(Method ((SVFolderBrowser ExamineCharacterArray) self Item SubObject)
                                                        , mcf: 10-Mar-88 11:40
   "New method template"
   (_ self ExamineAsArray Item SubObject 'character))

(Method ((SVFolderBrowser GetMenuItems) self itemCV)
                                                        , mcf: 9-Jul-86 16:31
   "Specialization"
   (COND
      ((NEQ (@ %:window)
            (MAINWINDOW (@ %:window)))
       (SELECTQ itemCV
            ((RightButtonItems ShiftRightButtonItems)
                 (@ |::AttachRightButtonItems|))
            ((ShiftMiddleTitleItems MiddleTitleItems))
            (_Super self GetMenuItems itemCV)))
      (T (_Super self GetMenuItems itemCV))))

(Method ((SVFolderBrowser GetProcessContext) self)
                                                        ; mcf 1-Jan-87 16.52
   "New method template"
   (LET (pc)
     [AND (SETQ pc (ObjectExists? (@ self %:object)))
          (SETQ pc (ObjectExists? (@ pc %:scope)))
          (SETQ pc (ObjectExists? (@ pc %:processContext))]
     pc))

(Method ((SVFolderBrowser MarkElement) self Element Stream DontMarkFlg)
                                                        , mcf: 11-Mar-88 16:19
   "New method template"
   (DECLARE (GLOBALVARS FISSVMarkChar))
   [LET [font l b (stream (OR Stream (@ %:window)))
             (reg (fetch subObjectRegion of (FASSOC Element (@ %:subObjectRegions)]
     (COND
        (reg (SETQ font (DSPFONT NIL stream))
             (SETQ l (CAR (NLEFT (@ %:tabStops)
                                 3)))
             (SETQ b (fetch BOTTOM of reg))
             (SELECTQ DontMarkFlg
                  (Clear (BITBLT stream l b stream l b (STRINGWIDTH FISSVMarkChar font)
                                 (FONTPROP font 'HEIGHT)
                                 NIL
                                 'ERASE))
                  (T)
                  (PROGN (MOVETO l (PLUS (FONTPROP font 'DESCENT)
                                         b)
                                 stream)
                         (printout stream FISSVMarkChar])

(Method ((SVFolderBrowser MiddleItemPredicate) self subObject item selector)
                                                        . Edited 14-Sep-88 13:25 by TAL
   "Specialization"
   (DECLARE (GLOBALVARS FISBooleanTypeLst FISCharacterTypeLst FISPointerTypeLst FISOldSVCharFlg))
   [LET [iValue (typ (@ subObject type))
             (valuesFlg (AND (EQ (@ valuable)
                                 'On)
                             (_ self GetProcessContext)]
     (COND
        [(AND (LISTP selector)
              (EQ (CADR selector)
                  'SetSVValue))                          . Format for value setting commands
         (COND
            ((AND valuesFlg typ (NEQ (SETQ iValue (@ subObject iValue))
                                     (@ subObject |:container::DefaultiValue|)))
             (COND
                ((SELECTQ (CAR selector)
                      (SetSVToT (AND (FMEMB typ FISBooleanTypeLst)
                                     (NEQ iValue T)))
                      (SetSVToF (AND (FMEMB typ FISBooleanTypeLst)
                                     (NEQ iValue 'F)))
                      (SetSVToChar (FMEMB typ FISCharacterTypeLst))
                      (SetSVToString
```

```
                    [AND (EQ typ 'array)
                         (OR (FMEMB (SETQ typ (_ subObject GetSubType))
                                    FISCharacterTypeLst)
                             (AND FISOldSVCharFlg (EQ typ 'char])
                (SetSVToValue (AND (NOT (FMEMB typ FISPointerTypeLst))
                                   (NOT (FMEMB typ FISBooleanTypeLst))
                                   (NOT (FMEMB typ FISCharacterTypeLst))))
                NIL)
            item]
      ((EQ selector 'Examine)
       (AND valuesFlg (FMEMB typ FISPointerTypeLst)
            (NEQ (@ subObject iValue)
                 (@ subObject |:container::DefaultiValue|))
            item))
      (T (_Super )])
```

(Method ((SVFolderBrowser RadixSet) self RadixOrItem)
mct: 28-Mar-88 12:49

```
   "New method template"
   [LET (radix temp widths (oldRadix (@ |:object:radix|)))
     [SETQ radix (COND
                   ((FIXP RadixOrItem))
                   ((LISTP RadixOrItem)
                    (SETQ temp (CADR RadixOrItem))
                    (COND
                       [(AND (LISTP temp)
                             (FIXP (CAR temp]
                       (T (SETQ temp (_ self SWPromptForWord "New Radix: " (OR oldRadix 10)))
                          (COND
                             ((AND (FIXP (SETQ temp (MKATOM temp)))
                                   (IGEQ temp 2)
                                   (ILEQ temp 36)
                                   temp))
                             (T (_ self SWPromptPrint "ERROR: Radix must be between 2 and 36" NIL 2 NIL 2000)
                                oldRadix]
     (SETQ radix (SELECTQ radix
                    (10 NIL)
                    radix))
     (COND
        ((NEQ radix oldRadix)
         (_@ |:object:radix| radix)
         (_ self LayoutFolder)
         (_ self Repaint)])
```

(Method ((SVFolderBrowser RadixShow) self)
mct: 15-Mar-88 16:32

```
   "New method template"
   (_ self SWPromptPrint (CONCAT "Radix: " (SELECTQ (@ |:object:radix|)
                                               ((10 NIL)
                                                 "Decimal")
                                               (8 "Octal")
                                               (16 "Hex")
                                               (@ |:object:radix|)))
         NIL NIL NIL 2000))
```

(Method ((SVFolderBrowser Repaint) self Region AppendFlg)
Edited 9-Sep-88 12:34 by TAL
mct: 15-Mar-88 14:33

```
   "Specialization"
   [LET NIL
     (_Super self Repaint Region AppendFlg)
     (for x in (@ oldChanges) do (_ self MarkElement x (@ window)))
     (AND (BOUNDP 'currentChanges)
          (for x in currentChanges do (_ self MarkElement x (@ window))])
```

(Method ((SVFolderBrowser RepaintChangedElement) self Element Reg Erasefirst Stream Fields TabStops FDescent widths)
Edited 9-Sep-88 12.33 by TAL

```
   "Specialization"
   [LET (l b (val (@ Element iValue))
          (stream (OR Stream (@ window)))
          (tabStops (OR TabStops (@ tabStops)))
          (*PRINT-BASE* (OR (@ |:object:radix|)
                            10))
          (reg (OR Reg (fetch subObjectRegion of (FASSOC Element (@ subObjectRegions)]
     (COND
        [(EQ (@ valuable)
             'On)
         (SETQ l (CAR (NLEFT tabStops 2)))
```

```
         (SETQ b (fetch BOTTOM of reg))
         [COND
            (Erasefirst (BITBLT stream l b stream l b (fetch WIDTH of reg)
                               (fetch HEIGHT of reg)
                               NIL
                               'ERASE]
```

```
(MOVETO 1 (PLUS (OR FDescent (FONTPROP (DSPFONT NIL stream)
                                       'DESCENT))
                b)
        stream)
(COND
  [(LISTP val)
    (for item on val do (printout stream (CAR item))
                        (COND
                          ((CDR item)
                           (printout stream .SP 1]
   (T (printout stream val]
 (T (_Super )]])
```

(Method ((SVFolderBrowser RepaintElement) self Element Reg Erasefirst Stream Fields TabStops FDescent Widths)
; Edited 9-Sep-88 12:31 by TAL
; mct: 15-Mar-88 14:30

```
"Specialization"
(LET ((*PRINT-BASE* (OR (@ |:object:radix|)
                        10)))
  (_Super self RepaintElement Element Reg Erasefirst Stream Fields TabStops FDescent Widths)))
```

(Method ((SVFolderBrowser SetSVToChar) self) ; mct: 19-Sep-86 13:27

```
"New method template"
(_ self SetSVValue 'Char))
```

(Method ((SVFolderBrowser SetSVToF) self) ; mct: 3-Jul-86 09:06

```
"New method template"
(_ self SetSVValue 'False))
```

(Method ((SVFolderBrowser SetSVToString) self) ; mct: 19-Sep-86 16:04

```
"New method template"
(_ self SetSVValue 'String))
```

(Method ((SVFolderBrowser SetSVToT) self) ; mct: 3-Jul-86 09:06

```
"New method template"
(_ self SetSVValue 'True))
```

(Method ((SVFolderBrowser SetSVToValue) self) ; mct: 3-Jul-86 09:06

```
"New method template"
(_ self SetSVValue 'Value))
```

(Method ((SVFolderBrowser SetSVValue) self Item) ; Edited 14-Sep-88 13:40 by TAL

```
"New method template"
[LET ((obj (@ middleSubObject))
      oldValue newValue newIValue numFlg fixFlg type typeStr svo radix)
  (SETQ type (@ obj typeRecord))
  (COND
    ((SELECTQ Item
         (True (SETQ newValue T))
         (False (SETQ newValue 'F))
         (Value (COND
                  ((AND (EQ (fetch CCType/UserType of type)
                            'enum)
                        (NEQ (SETQ newValue (MENU (CC.EnumMenu type)))
                             '*Number*))
                   newValue)
                  (T (SETQ oldValue (@ obj iValue))
                     (SETQ typeStr (COND
                                     ((SETQ numFlg (CC.NumericType? type T))
                                      (COND
                                        ((SETQ fixFlg (CC.IntegralType? type T))
                                         (SELECTQ (SETQ radix (@ |:object:radix|))
                                             (2 " (Binary #): ")
                                             (8 " (Octal #): ")
                                             (16 " (Hex #): ")
                                             ((NIL 10)
                                               " (number): ")
                                             (CONCAT " (base " radix " #): ")))
```

```
                                        (T " (float #): ")))
                                     (T ": ")))
                     (SETQ newValue (_ self SWPromptForString (CONCAT "New" typeStr)
                                       NIL NIL 2))
                     [COND
                       (numFlg [COND
                                 ((AND radix fixFlg)
                                  (SETQ newValue (FISREADNUMBERINBASE newValue radix)))
                                 (T (SETQ newValue (MKATOM newValue]
                               (COND
                                 ((NOT (NUMBERP newValue))
                                  (_ self SWPromptPrint (COND
```

```
                                             (radix (CONCAT "Value is not a number in
                                                            radix " radix "."))
                                             (T "Value is not a number."))
                                  NIL NIL NIL 2000)
                              (SETQ newValue NIL))
                             (fixFlg (SETQ newValue (FIX newValue)))
                             (T (SETQ newValue (FLOAT newValue]
                  (AND (EQUAL oldValue newValue)
                       (SETQ newValue NIL))
                  newValue)))
         (Char (SETQ newValue (_ self SWPromptForString (CONCAT "New Character: ")
                                   NIL NIL 2))
               (SETQ newValue (FISConvertCCharConstant (MKATOM newValue))))
         (String (SETQ newValue (_ self SWPromptForString (CONCAT "New String: ")
                                   NIL NIL 2))
                 (OR newValue (SETQ newValue ""))
                 (_ obj PutValue newValue)
                 (_@ obj iValue (_ obj GetValue))
                 (SETQ newValue NIL)
                 T)
         NIL)
      (COND
         (newValue (_ obj PutValue newValue)
                   (_@ obj iValue newValue)))
      (_ self ElementChanged obj NIL NIL T)
      (COND
         ((SETQ svb (@ self myProcessBrowser))
          (_ svb UpdateStateVariableDisplay T T)]))
```

(Method ((SVFolderBrowser ShapeToFit) self)   . mct: 29-Aug-86 17 07
. Specialization

```
   "(OR (@ :dontShapeFlg) (_Super self ShapeToFit))"
   (_Super self ShapeToFit))
```

(Method ((SVFolderBrowser ShowValue) self SubObject Value ObjRegions)
Edited 9-Sep-88 12:31 by TAL
. mct: 15-Mar-88 14 30

```
   "Specialization"
   (LET ((*PRINT-BASE* (OR (@ |:object:radix|)
                           10)))
     (_Super self ShowValue SubObject Value ObjRegions)))
```

(Method ((SVFolderBrowser ShowValues) self)   . Edited 9-Sep-88 12:30 by TAL
. mct: 17-Mar-88 14:44

```
   "Toggle value display associated with folder items"
   (LET (cb val)
     [AND (SETQ cb (_ self GetProcessContext))
          (SETQ cb (ObjectExists? (@ cb myBrowser)]
     (SELECTQ (SETQ val (_Super ))
          (On (COND
                 (cb (_ cb AddStateWindow self))))
          (Off (COND
                  (cb (_ cb RemoveStateWindow self))
                  (T (_ self ClearSVCache)))
               (_@ self oldChanges NIL))
          NIL)
     val).)
```

(Method ((SVFolderBrowser UpdateValueDisplay) self VarLst DontMarkFlg)
. Edited 9-Sep-88 12:28 by TAL
. mct: 18-Mar-88 16:18

```
   "New method template"
   (LET (currentChanges oldVal newVal svlst varLst pc (folder (@ object))
             (stream (@ window)))
     (AND (SETQ pc (ObjectExists? (@ folder scope)))
          (SETQ pc (@ pc processContext)))
     [SETQ varLst (COND
                    ((LISTP VarLst)
                     (SETQ svlst (@ svAssocLst))
                     (bind e for v in VarLst when (SETQ e (CDR (FASSOC v svlst))) collect e))
                    (VarLst (@ elements)]
     (SETQ currentChanges (_ self UpdateSVValues varLst folder pc stream DontMarkFlg))
     (SELECTQ DontMarkFlg
          (Merge (SETQ currentChanges (UNION currentChanges (@ oldChanges))))
          (for o in (@ oldChanges) when (NOT (FMEMB o currentChanges)) do (_ self ElementUnchanged o stream)))
     (_@ self oldChanges currentChanges)))
```

(Method ((SVSubFolderBrowser ComputeMaxHeight) self)
. mct: 21-Mar-88 15:34

```
   "New method template"
   (PLUS (IDIFFERENCE SCREENHEIGHT (ITIMES 4 WBorder))
         (TIMES 2 (DSPLINEFEED NIL WindowTitleDisplayStream))
         -20))
```

(Method ((SVSubFolderBrowser ComputeSuperTitle) self ForceComputeFlg)
mct 31-Mar-88 15 06

```
   "New method template"
   (DECLARE (GLOBALVARS FISSVShowAddressFlg FISSVAddressFormat FISSVAddressPrefix FISSVAddressSuffix
                        FISSVLockPrefix FISSVLockSuffix))
```

```
(LET [access address title (lockFlg (EQ (@ |:object:pointerFlg|)
                                         'Lock]
  (SETQ access (FISSVTitleFromPath (@ |:object:pathSpec|)))
  (COND
    (FISSVShowAddressFlg (AND (SETQ address (@ |:object:accessValue|))
                              (SETQ address (CR.CPointerAddress address)))
         (COND
           ((AND (NOT ForceComputeFlg)
                 (EQUAL address (@ %:addressCache))
                 (@ %:superTitle)))
           (T [SETQ title (COND
                            ((STRINGP address)
                             (CONCAT (OR (AND lockFlg FISSVLockPrefix)
                                         "")
                                     access " " address (OR (AND lockFlg FISSVLockSuffix)
                                                            ""))))
                            (T (CONCAT (OR (AND lockFlg FISSVLockPrefix)
                                           "")
                                       access " " FISSVAddressPrefix (OR (AND address (NEQ address 0)
                                                                              (ConvertNumberToString
                                                                                address
                                                                                FISSVAddressFormat))
                                                                         "")
                                       FISSVAddressSuffix
                                       (OR (AND lockFlg FISSVLockSuffix)
                                           ""]
              (_@ %:superTitle title)
              (_@ %:addressCache address)
              title)))
    (T access))))
```

(Method ((SVSubFolderBrowser ConstructTitle) self Object Browsername)
, mcf: 9-Mar-88 12:40

```
  "Specialization"
  (DECLARE (GLOBALVARS FISSVTypeTitleFlg))
  [LET (path name scope)
    (AND Object (SETQ scope (ObjectExists? (@ Object %:scope)))
         (SETQ name (_ scope QualifiedPrintName)))
    (SETQ path (@ |:object:pathSpec|))
    (COND
      ((AND FISSVTypeTitleFlg path name)
       [SETQ path (COND
                    ((EQ (CAR (LAST path))
                         '*)
                     (CAR (NLEFT path 2)))
                    (T (CAR (LAST path]
       (CONCAT (@ |:object:typeString|)
               " in " name))
```

Page 12

```
      (name (SETQ name (CONCAT name " SVs"))
            (OR (AND path (CONCAT name ": " (CC.UnparseAccessPath path)))
                name))
      (T (_Super self ConstructTitle Object Browsername)])
```

(Method ((SVSubFolderBrowser CreateMethodMenu) self)
, mcf: 16-Mar-88 12:21

```
  "Specialization"
  (_ self CreateSuperTitleWindow T)
  (_Super self CreateMethodMenu)
  (_ self Update))
```

(Method ((SVSubFolderBrowser CreateSuperTitleWindow) self ForceSizeFlg)
, mcf: 17-Mar-88 12:55

```
  "New method template"
  (DECLARE (GLOBALVARS FISWindowTitleFont))
  (LET (font w h title tw width (oldWindow (@ superTitleWindow)))
    (AND oldWindow (CLOSEW oldWindow))
    (SETQ w (@ width))
    (SETQ font FISWindowTitleFont)
    [SETQ h (IPLUS WBorder (FONTPROP font 'HEIGHT]
    (SETQ title (_ self ComputeSuperTitle))
    (COND
      ((AND ForceSizeFlg (IGREATERP (SETQ width (WIDTHIFWINDOW (STRINGWIDTH title font)))
                                    w))
       (SETQ w width)
       (_@ self width w)
       (_ self Update)))
    [COND
      ((WINDOWP oldWindow)
       (SETQ tw oldWindow)
       (SHAPEW tw (CREATEREGION (@ left)
                                (IPLUS (@ bottom)
                                       (@ height))
                                w h)))
      (T (SETQ tw (CREATEW (CREATEREGION (@ left)
                                         (IPLUS (@ bottom)
                                                (@ height))
                                         w h)
                           NIL 0 T))
```

```
        (_@ superTitleWindow tw)
        (DSPOPERATION 'INVERT tw)
        (DSPFONT font tw)
        (DSPRIGHTMARGIN MAX.SMALLP tw)
        (WINDOWPROP tw 'MINSIZE (RPLACD (MINIMUMWINDOWSIZE tw)
                                        n]
  (ATTACHWINDOW tw (@ window)
        'TOP
        'RIGHT)
  (_ self RepaintSuperTitle tw title width)))
```

(Method ((SVSubFolderBrowser GetShapeRegion) self Window)
, mct: 16-Mar-88 12:33

```
  "Specialization"
  (LET (region (font (DSPFONT NIL WindowTitleDisplayStream)))
    (SETQ region (_Super self GetShapeRegion Window))
    [replace HEIGHT of region with (IDIFFERENCE (fetch HEIGHT of region)
                                     (IPLUS WBorder (FONTPROP font 'HEIGHT]
    region))
```

(Method ((SVSubFolderBrowser LockPointer) self ItemOrUFlg)
, mct: 21-Mar-88 15:31

```
  "New method template"
  (LET (temp uFlg (folder (@ %:object)))
    (COND
      [(LISTP ItemOrUFlg)
       (SETQ temp (CADR ItemOrUFlg))
       (AND (LISTP temp)
            (SETQ uFlg (CAR temp]
      ((SETQ uFlg ItemOrUFlg)))
    (AND (FMEMB '* (@ folder %:pathSpec))
         (_@ folder %:pointerFlg (OR uFlg NotSetValue))
         (_ self RepaintSuperTitle NIL NIL NIL T))))
```

Page 13

(Method ((SVSubFolderBrowser Repaint) self Region AppendFlg)
, mct 31-Mar-88 14:49

```
  "Specialization"
  (_Super self Repaint Region AppendFlg)
  (_ self RepaintSuperTitle))
```

(Method ((SVSubFolderBrowser RepaintSuperTitle) self Window Title Width ForceComputeFlg)
, mct 31-Mar-88 14:53

```
  "New method template"
  [LET (width title (w (OR Window (@ superTitleWindow)))
              (oTitle (@ superTitle)))      ; when a sub window is first computed, it does not have a super title
                                            ; window yet
    (COND
      (w (SETQ title (OR Title (_ self ComputeSuperTitle ForceComputeFlg)))
         [SETQ width (OR Width (WIDTHIFWINDOW (STRINGWIDTH title (DSPFONT NIL w]
         (DSPFILL NIL BLACKSHADE 'REPLACE w)
         (COND
           ((LEQ width (WINDOWPROP w 'WIDTH))
            (CENTERPRINTINREGION title NIL w))
           (T (MOVETO WBorder (ADD1 WBorder)
                      w)
              (printout w title])
```

(Method ((SVSubFolderBrowser Shape) self newRegion)
, mct: 16-Mar-88 12:03

```
  "Specialization"
  (LET ((h (@ %:horizMethodMenuWindow)))
    (DETACHWINDOW (@ %:superTitleWindow))
    (_Super self Shape newRegion)
    (DETACHWINDOW h)
    (_ self CreateSuperTitleWindow)
    (ATTACHWINDOW h (@ %:window)
          'TOP
          'JUSTIFY)))
```

(Method ((SVSubFolderBrowser ShowValues) self) , mct: 17-Mar-88 14:22

```
  "Specialization"
  (LET (title (oTitle (@ %:superTitle)))
    (SELECTQ (_Super )
      (On (AND (NEQ oTitle (SETQ title (_ self ComputeSuperTitle)))
               (_ self RepaintSuperTitle NIL title)))
      NIL)))
```

(Method ((SVSubFolderBrowser Update) self) mct: 16-Mar-88 12:14

```
  "Specialization"
  [LET (wFlg (h (@ horizMethodMenuWindow))
             (s (@ superTitleWindow)))
    (COND
      ([SETQ wFlg (AND s h (NEQ (@ width)
                                (WINDOWPROP s 'WIDTH]
       (DETACHWINDOW s)
       (DETACHWINDOW h)))
```

```
  (_Super self Update)
  (COND
     (wFlg (_ self CreateSuperTitleWindow)
           (ATTACHWINDOW h (@ window)
                 'TOP
                 'JUSTIFY])
```

(Method ((SVSubFolderBrowser UpdateSVValues) self VarLst Folder ProcContext Stream DontMarkFlg
)
. Edited 11-Sep-88 18.51 by TAL

```
  "New method template"
  (DECLARE (USEDFREE currentChanges))
  (LET (oldVal newVal av ap pFlg title)
    [COND
      (VarLst (SETQ av (@ Folder accessValue))
              [COND
                ((AND (SETQ pFlg (@ Folder pointerFlg))
                      (NEQ pFlg 'Lock))
                 (SETQ av (_ Folder ComputeAccessValue av))

                 .. Only need to do ComputeSuperTitle if access value has changed, but that's not convenient cause recomputing it reuses the old
                 .. CPointer

                 (AND (NEQ (@ superTitle)
                           (SETQ title (_ self ComputeSuperTitle)))
                      (_ self RepaintSuperTitle NIL title)]
              (SETQ ap (@ Folder accessPath))
```

Page 14

```
              (bind x for sv in VarLst when (NEQ (SETQ oldVal (@ sv iValue))
                                                 (SETQ newVal (_ sv GetValue oldVal Folder ProcContext av ap
                                                                    pFlg)))
                 do (PROGN (_@ sv iValue newVal)
                           (push currentChanges sv)
                           (_ self ElementChanged sv NIL Stream DontMarkFlg)
                           sv]
    currentChanges))
```

(Method ((SVTopFolderBrowser UpdateSVValues) self VarLst Folder ProcContext Stream DontMarkFlg
)
. mcf: 14-Mar-88 12:18

```
  "New method template"
  (DECLARE (USEDFREE currentChanges))
  (LET (oldVal newVal svs)
    [COND
      (VarLst (SETQ svs (AND ProcContext (@ ProcContext %:stateVariables)))
              (bind x for sv in VarLst when (NEQ (SETQ oldVal (@ sv %:iValue))
                                                 (SETQ newVal (_ sv GetValue oldVal Folder ProcContext svs))
                                                 )
                 do (PROGN (_@ sv %:iValue newVal)
                           (push currentChanges sv)
                           (_ self ElementChanged sv NIL Stream DontMarkFlg)
                           sv]
    currentChanges))
```

(Method ((StateVariable ComputeVarDoc) self localSt varName propName)
. mcf: 3-Mar-88 10.32

```
  "New method template"
  (LET (doc inst)
    (DECLARE (GLOBALVARS JLVarsAList))
    (COND
      ([AND (BOUNDP 'JLVarsAList)
            (SETQ doc (CDR (FASSOC (@ self %:varName)
                                   JLVarsAList]
       (SETQ inst (_ ($ StateVariableDoc)
                     New))
       (_@ inst %:docStrings doc)
       (_@ inst %:printName (@ %:varName))
       inst))))
```

(Method ((StateVariable GetTypeRecord) self) mcf: 3-Mar-88 10 24

```
  "New method template"
  [LET (type (container (@ %:container)))
    (COND
      ((SETQ type (ObjectExists? (@ container %:scope)))
       (AND (SETQ type (@ type %:ids))
            (SETQ type (FASSOC (@ %:varName)
                               type))
            (SETQ type (fetch CCID/Type of type])
```

(Method ((StateVariableDocBrowser Browse) self context object)
. TAL 1-May-88 18:14

```
  "Specialization"
  [PROG (stream font (strings (@ |:object:docStrings|)))
        (COND
          (strings [bind (wid _ 0) for x in strings as y from 0 do (SETQ wid (MAX wid (STRINGWIDTH x font))
                                                                        )
                      finally (_@ extent (CREATEREGION 0 0 wid (TIMES y (FONTHEIGHT font))))]
                   (_ self PositionBrowser (fetch WIDTH of (@ extent))
                          (fetch HEIGHT of (@ extent)))
```

```
(WINDOWPROP (SETQ stream (@ window))
       'EXTENT
       (@ extent))
.. scroll so window shows top of extent, rather than bottom as window system leaves it
(PreSCROLLW stream 0 (PreScrollYPos self stream))
(_ self Repaint NIL)
(_Super )])
```

```
(Method ((StateVariableDocBrowser Repaint) self region)
                                              ; TAL 1-May-88 18:21
  "New method template"
  (LET ((stream (@ %:window)))
    (DSPRIGHTMARGIN MAX.SMALLP stream)
    (MOVETO (fetch LEFT of (@ %:extent))
            (DIFFERENCE (fetch PTOP of (@ %:extent))
                    (FONTASCENT stream))
            stream)
    (for x in (@ |:object:docStrings|) do (printout stream x T))))

(Method ((StateVariableFolder ClearSVCache) self)  ; mcf: 2-Mar-88 10:27
  "New method template"
  self)

(Method ((StateVariableFolder GetValue) self SVName ProcContext SV SVs)
                                              ; mcf: 21-Mar-88 15:55
  "New method template"
  [COND
    (ProcContext (CVAR.REF SVName (OR SVs (@ ProcContext stateVariables)])

(Method ((StateVariableFolder ProcessNonObjects) self objects)
                                              ; TAL 18-Nov-87 14:45
  "Specialization"
  (bind sv (vr _ (@ |:elements:,VR|)) for x in objects eachtime (SETQ sv (_ vr New))
                                                               (_@ sv %:varName x)
                                                               (_@ sv %:container self)

     collect sv))

(Method ((StateVariableFolder PutValue) self SVName Type NewValue)
                                              ; mcf: 18-Mar-88 16:24
  "New method template"
  [LET [(temp (ObjectExists? (@ %:scope)]
    (COND
      ((AND temp (SETQ temp (@ temp %:processContext)))
       (_ temp SetStateVariable SVName NewValue)])

(Method ((StateVariableNexus AnalysisScope) self)  ; mcf: 3-Mar-88 10:21
  "New method template"
  (@ |:container:scope|))

(Method ((StateVariableNexus FFGetValue) self LocalSt)
                                              ; mcf: 3-Mar-88 10:22
  "New method template"
  (_ self GetValue))

(Method ((StateVariableNexus GetArrayValue) self Type TypeRecord Dimension LocalVal PtrFlg
                                                DontChangeFlg)
                                              ; mcf: 8-Mar-88 11:20
  "New method template"
  [LET (temp type)
    (SETQ type (SELECTQ Type
                   (struct (OR (fetch CCType/StructName of TypeRecord)
                               Type))
                   Type))
    (COND
      ((AND LocalVal (SETQ temp (LISTP (@ %:nameCache)))
            (EQ type (CAR temp))
            (EQ Dimension (CDR temp)))
       LocalVal)
      (T (OR DontChangeFlg (_@ %:nameCache (CONS type Dimension)))
         (CONCAT (OR (AND PtrFlg "*")
                     "")
                 type "[" (OR (NUMBERP Dimension)
                              "")
                 "]"])
```

```
(Method ((StateVariableNexus GetBoolArrayValue) self TypeRecord Dimension Value LocalVal)
                                              ; mcf: 7-Mar-88 17:39
  "New method template"
  [COND
    ([for x from 0 to (SUB1 Dimension) always (EQ (COND
                                                    ((EQ 0 (CR.AggregateFetch Value TypeRecord x))
                                                     'F)
                                                    (T T))
```

```
                                                    (NTHCHAR LocalVal (ADD1 x]
      LocalVal)
    (T (CONCATLIST (for i from 0 to (SUB1 Dimension) collect (COND
                                                              ((EQ 0 (CR.AggregateFetch Value TypeRecord
                                                                                   i))
                                                               'F)
                                                              (T T])

(Method ((StateVariableNexus GetComplexValue) self Type TypeRecord Value LocalVal)
                                                       . mct: 7-Mar-88 18:18
  "New method template"
  (DECLARE (GLOBALVARS FISOldSVCharFlg FISBooleanTypeLst FISCharacterTypeLst FISPointerTypeLst))
  (LET (dimen subType subTypeRec temp)
    (SELECTQ Type
       ((array)
          (SETQ dimen (fetch CCType/ArrayDim of TypeRecord))
          (AND (SETQ subTypeRec (fetch CCType/SubType of TypeRecord))
               (SETQ subType (fetch CCType/UserType of subTypeRec)))
          (COND
             ((FMEMB subType FISBooleanTypeLst)
              (_ self GetBoolArrayValue TypeRecord dimen Value LocalVal))
             ([OR (FMEMB subType FISCharacterTypeLst)
                  (AND FISOldSVCharFlg (EQ subType 'char]
              (_ self GetStringValue Value LocalVal))
             (T (_ self GetArrayValue subType subTypeRec dimen LocalVal))))
       (struct (_ self GetStructValue Type TypeRecord LocalVal))
       (pointer (AND (SETQ subTypeRec (fetch CCType/SubType of TypeRecord))
                     (SETQ subType (fetch CCType/UserType of subTypeRec)))
                [SELECTQ subType
                    (array (_ self GetArrayValue subType subTypeRec (fetch CCType/ArrayDim of subTypeRec)
                                 LocalVal T))
                    ((struct union)
                       (_ self GetStructValue subType subTypeRec LocalVal T))
                    (COND
                       ((AND (EQ subType (@ %:nameCache))
                             LocalVal))
                       (T (_@ %:nameCache subType)
                          (CONCAT "*" subType])
       Type)))

(Method ((StateVariableNexus GetStringValue) self Value LocalVal)
                                                       . mct 31-Mar-88 15.25
  "New method template"
  (COND
    ([OR (NOT LocalVal)
         (NOT (CR.CmpCstrLstr Value (OR (SUBSTRING LocalVal 2 -2 (CONSTANT (ALLOCSTRING 1)))
                                        ""]
     (CONCAT '%" (CR.LispString Value)
             '%"))
    (T LocalVal)))

(Method ((StateVariableNexus GetStructValue) self Type TypeRecord LocalVal PtrFlg DontChangeFlg)
                                                       . mct: 15-Mar-88 12.12
  "New method template"
  [LET (name)
    (SETQ name (OR (fetch CCType/StructName of TypeRecord)
                   ""))
    (COND
       ((AND (EQ name (@ %:nameCache))
             LocalVal))
       (T (OR DontChangeFlg (_@ %:nameCache name))
          (CONCAT (OR (AND PtrFlg "*")
                      "")
                  Type " " name])
```

Page 17

```
(Method ((StateVariableNexus GetSubType) self)     . mct: 3-Mar-88 10:22
  "New method template"
  [LET (typ)
    (COND
       ((SETQ typ (fetch CCType/SubType of (@ %:typeRecord)))
        (fetch CCType/UserType of typ])

(Method ((StateVariableNexus GetType) self)        . mct: 3-Mar-88 10:22
  "New method template"
  (LET ((typ (@ %:typeRecord)))
    (AND typ (fetch CCType/UserType of typ))))

(Method ((StateVariableNexus GetValue) self LocalVal Folder ProcessContext Arg1 Arg2 Arg3)
                                                       . Edited 13-Sep-88 00:24 by TAL
  "Get my value from my folder's scope"
  (DECLARE (GLOBALVARS FISBooleanTypeLst FISCharacterTypeLst FISPointerTypeLst))
  [LET [type val typeRecord scope (folder (OR Folder (@ container))]
    (SETQ val (OR (_ folder GetValue (@ self varName)
                         (OR ProcessContext (AND (ObjectExists? (SETQ scope (@ folder scope)))
                                                 (@ scope processContext)))
                         self Arg1 Arg2 Arg3)))
```

```
(COND
   (val (AND (SETQ typeRecord (@ self typeRecord))
             (SETQ type (fetch CCType/UserType of typeRecord)))
        (COND
           ((AND (FMEMB type FISPointerTypeLst)
                 (NOT (ATOM val))
                 (CR.CheckPointer val))                    (type? CPointer val)
            (_@ pValue val)
            (_ self GetComplexValue type typeRecord val LocalVal))
           ((FMEMB type FISBooleanTypeLst)
            (COND
               ((EQ 0 val)
                'F)
               (T T)))
           ((FMEMB type FISCharacterTypeLst)
            (FISConvertCCharConstant val))
           ((EQ type 'enum)
            (OR (CC.NumToEConst val typeRecord)
                val))
           (T val)))
   (T (@ folder |::DefaultValue|)]])
```

```
(Method ((StateVariableNexus ObjectForSearch) self)
                                                  mcf: 3-Mar-88 10 23
   "New method template"
   (@ %:varName))
```

```
(Method ((StateVariableNexus PutValue) self NewValue)
                                                  Edited 14-Sep-88 13:56 by TAL
   "New method template"
   (DECLARE (GLOBALVARS FISBooleanTypeLst FISCharacterTypeLst FISPointerTypeLst FISOldSVCharFlg))
   [LET (subtype (newValue NewValue)
                 (container (@ container))
                 (type (@ type)))
     (COND
        ([AND (EQ type 'array)
              (OR (FMEMB (SETQ subtype (_ self GetSubType))
                         FISCharacterTypeLst)
                  (AND FISOldSVCharFlg (EQ subtype 'char]
         (AND (SETQ type (@ self typeRecord))
              (SETQ type (fetch CCType/ArrayDim of type))
              (@ pValue)
              (CR.StoreString (@ pValue)
                    newValue type)))
        (T [COND
              [(FMEMB type FISBooleanTypeLst)
               (SETQ newValue (COND
                                 ((EQ newValue 'F)
                                  0)
                                 (T 1]
              ((FMEMB type FISCharacterTypeLst)
               (SETQ newValue (FISConvertCCharConstant newValue T)))
              ((EQ type 'enum)
               (COND
                  ((NOT (NUMBERP newValue))
                   (SETQ newValue (OR (CC.EConstToNum newValue (@ typeRecord))
                                      0]
```

Page 18

```
           (_ container PutValue (@ varName)
                 type newValue)])
```

```
(Method ((SubStateVariable ComputeVarNameStr) self)
                                                  mcf: 10-Mar-88 13:38
   "New method template"
   (DECLARE (GLOBALVARS FISSVFullVarNameFlg))
   (LET (path (name (@ %:varName)))
     (COND
        ((AND FISSVFullVarNameFlg (SETQ path (@ |:container:pathCache|)))
         (RPLACA (LAST path)
                name)
         (CC.UnparseAccessPath path))
        ((NUMBERP name)
         (MKSTRING name))
        (name))))
```

```
(Method ((SubStateVariable GetTypeRecord) self)     mcf: 10-Mar-88 15.50
   "Specialization"
   (LET (fType type (container (@ %:container)))
     (COND
        ((SETQ type (@ container %:accessPath))
         (SETQ type (OR (CC.AggregateSubType (CADR type)
                              (@ %:varName))
                        (CADR type)))
         [COND
            ((SETQ fType (@ container %:forceType))
             (SETQ type (COPY type))
             (SELECTQ fType
                 ((character bool boolean)
                     (replace CCType/TypeDef of type with fType))
```

```
            (PROGN (replace CCType/Type of type with fType)
                   (AND (fetch CCType/TypeDef of type)
                        (replace CCType/TypeDef of type with NIL]
      type))))

(Method ((SubStateVariableFolder ClearSVCache) self)
                                                          . mcf: 21-Mar-88 14:11
   "Specialization"
   (_@ self accessPath NotSetValue)
   (_@ self accessValue NotSetValue)
   (_@ self pathCache NotSetValue))

(Method ((SubStateVariableFolder ComputeAccessPath) self)
                                                          . Edited 9-Sep-88 16.50 by TAL
                                                          . mcf: 2-Mar-88 10.31
   "New method template"
   (LET (tmp path)
     (AND (SETQ path (@ pathSpec))
          (SETQ tmp (ObjectExists? (@ scope)))
          (SETQ tmp (@ tmp ids))
          (CC.CompileAccessPath path tmp))))

(Method ((SubStateVariableFolder ComputeAccessValue) self CPtr)
                                                          . mcf: 16-Mar-88 15:40
   "New method template"
   [LET [svs (path (@ self %:accessPath))
             (scope (ObjectExists? (@ %:scope)]
     (AND scope path (SETQ svs (@ scope %:processContext))
          (SETQ svs (@ svs %:stateVariables))
          (CR.FetchAccessPath (CAR path)
                 svs
                 (AND (type? CPointer CPtr)
                      CPtr])

(Method ((SubStateVariableFolder ComputePathCache) self)
                                                          . mcf: 2-Mar-88 10 35
   "New method template"
   [LET ((path (@ %:pathSpec)))
     (AND path (APPEND path (CONS])
```

```
(Method ((SubStateVariableFolder ComputePointerFlg) self)
                                                          ; mcf: 17-Mar-88 11:30
   "New method template"
   (DECLARE (GLOBALVARS FISSVLockPointerFlg))
   (COND
      ((FMEMB '* (@ %:pathSpec))
       (OR FISSVLockPointerFlg T))))

(Method ((SubStateVariableFolder GetValue) self SVName ProcContext SV AValue APath PFlg)
                                                          ; mcf: 21-Mar-88 14:33
   "Specialization"
   (LET [val (pFlg (OR PFlg (@ %:pointerFlg)]
     [COND
        (ProcContext (SETQ val (CR.AggregateFetch (OR AValue (AND pFlg (NEQ pFlg 'Lock)
                                                         (_@ self accessValue (_ self
                                                                  ComputeAccessValue
)))
                                                   (@ self accessValue))
                                 (CADR (OR APath (@ self accessPath)))
                                 SVName]
     (COND
        (val)
        (pFlg (_@ SV nameCache NotSetValue)))
     val))

(Method ((SubStateVariableFolder PutValue) self SVName Type NewValue)
                                                          . mcf: 2-Mar-88 10 47
   "Specialization"
   [LET ((ptr (@ %:accessValue)))
     (COND
        (ptr (CR.AggregateStore ptr (CADR (@ %:accessPath))
                    SVName NewValue])

(\UnpatchMethodDefs)

(DEFINEQ

(ExamineSVSubItemFn
  [LAMBDA (Menu Item)                                     . Edited 3-Jun-88 17 04 by
    (DECLARE (USEDFREE subObj))
    (DECLARE (GLOBALVARS FISSVExamineCharArrayLst FISSVExamineArrayLst))
    (LET (typeRecord subType)
      (COND
         ((AND (LISTP Item)
               (EQ (CAR Item)
                   'Examine))
```

```
    (SETQ typeRecord (@ subObj %:typeRecord))
    (SELECTQ (fetch CCType/UserType of typeRecord)
        ((pointer)
            (COND
               ((AND (SETQ subType (fetch CCType/SubType of typeRecord))
                     (SETQ subType (fetch CCType/UserType of subType)))
```

. (SELECTQ subType ((char character) FISSVExamineCharArrayLst) NIL)

. (SELECTQ subType ((char character) FISSVExamineCharArrayLst) FISSVExamineArrayLst)

```
                (SELECTQ subType
                    ((char character)
                        FISSVExamineCharArrayLst)
                    NIL))))
        NIL))
   (T (DualSubItems Menu Item])
```

(FISConvertCCharConstant

```
 [LAMBDA (Value ToNumberFlg)
   (DECLARE (GLOBALVARS CCCBackList CCCEscapeList CCCListArray))
                                                    (* mcf "23-Dec-87 17 48")
   (LET (index newVal arraySize (badval (\CCC.FastArrayFetch CCCListArray 0)))
     [SETQ arraySize (DEFERREDCONSTANT (SUB1 (ARRAYSIZE CCCListArray]
     (COND
       [ToNumberFlg (COND
                      ((NUMBERP Value))
                      ((EQ (CHCON1 Value)
                           (CONSTANT (CHARCODE %')))
                       (OR (CDR (FASSOC Value CCCBackList))
                           0))
                      ((EQ (CHCON1 Value)
                           (CONSTANT (CHARCODE \)))
                       (OR (CDR (FASSOC (PACK* '%' Value '%')
```

```
                                        CCCBackList))
                           0))
                     (T (OR (CDR (FASSOC (PACK* '%' '\ Value '%')
                                         CCCBackList))
                            0]
       ((NUMBERP Value)
        (OR (AND (GEQ Value 0)
                 (LEQ Value arraySize)
                 (\CCC.FastArrayFetch CCCListArray Value))
            badval))
       ((EQ (CHCON1 Value)
            (CONSTANT (CHARCODE %')))
        (OR (AND [OR (SETQ index (CDR (FASSOC Value CCCBackList)))
                     (SETQ index (CDR (FASSOC Value CCCEscapeList)))
                     (AND [NUMBERP (SETQ index (PACK* (SUBATOM Value 3 -2)
                                                       'Q]
                          (AND (GEQ index 0)
                               (LEQ index arraySize]
                 (\CCC.FastArrayFetch CCCListArray index))
            badval))
       ((EQ (CHCON1 Value)
            (CONSTANT (CHARCODE \)))
        (OR (AND [OR (SETQ index (CDR (FASSOC (SETQ newVal (PACK* '%' Value '%'))
                                              CCCBackList)))
                     (SETQ index (CDR (FASSOC newVal CCCEscapeList)))
                     (AND [NUMBERP (SETQ index (PACK* (SUBATOM Value 2 -1)
                                                       'Q]
                          (AND (GEQ index 0)
                               (LEQ index arraySize]
                 (\CCC.FastArrayFetch CCCListArray index))
            badval))
       (T (OR (AND (CDR (FASSOC (SETQ newVal (PACK* '%' Value '%'))
                                CCCBackList))
                   newVal)
              badval])
```

(FISDIGITBASEP

```
 [LAMBDA (CODE RADIX)                               (* mcf%: "29-Mar-88 14:47")
   (LET (bigFlg code)
     [SETQ code (COND
                  [(WithinRange? CODE (CONSTANT (CHARCODE 0))
                           (CONSTANT (CHARCODE 9)))
                   (IDIFFERENCE CODE (CONSTANT (CHARCODE 0]
                  [[AND (SETQ bigFlg (IGREATERP RADIX 10))
                        (WithinRange? CODE (CONSTANT (CHARCODE A))
                               (CONSTANT (CHARCODE Z]
                   (IDIFFERENCE CODE (CONSTANT (IDIFFERENCE (CHARCODE A)
                                                            10]
                  ([AND bigFlg (WithinRange? CODE (CONSTANT (CHARCODE a))
                                      (CONSTANT (CHARCODE z]
                   (IDIFFERENCE CODE (CONSTANT (IDIFFERENCE (CHARCODE a)
                                                            10]
     (AND code (IGEQ code 0)
          (ILESSP code RADIX)
          code])
```

(FISREADNUMBERINBASE

```
  [LAMBDA (String Radix)                                         (* mcl%. "29-Mar-88 14.39")
    (LET (len minusFlg base (val 0)
              (radix (OR (NUMBERP Radix)
                         10)))
      (COND
         (String (SETQ len (NCHARS String))
                 [bind firstchar for x from 1 to len first (SETQ firstchar (NTHCHARCODE String 1))
                                                     [COND
                                                        ([OR (AND (EQ firstchar (CONSTANT (CHARCODE
                                                                                             -)))
                                                                  (SETQ minusFlg T))
                                                             (EQ firstchar (CONSTANT (CHARCODE +]
                                                         (COND
                                                            ((IGREATERP (SETQ x 2)
                                                                    len)
                                                             (RETURN (SETQ val NIL]
                    do (COND
                          ((SETQ base (FISDIGITBASEP (NTHCHARCODE String x)
                                             radix))
                           (SETQ val (PLUS (TIMES val radix)
                                           base)))
                          (T (RETURN (SETQ val NIL]
                 (COND
```

Page 21

```
                    ((AND minusFlg val)
                     (MINUS val))
                    (T val])
```

(FISSVTitleFromPath

```
  [LAMBDA (Path)                                                 (* mcl%: "17-Mar-88 16:13")
    (DECLARE (GLOBALVARS FISSVMaxTitlePathLength))
    (LET ((path Path))
      [COND
         ((AND FISSVMaxTitlePathLength (FIXP FISSVMaxTitlePathLength)
               (IGREATERP FISSVMaxTitlePathLength 0)
               (ILESSP FISSVMaxTitlePathLength (LENGTH path)))
          (SETQ path (for x in (REVERSE path) as y from 1 to FISSVMaxTitlePathLength
                        collect (AND (EQ x '*)
                                     (SETQ y (SUB1 y)))
                               x))
          (AND (FMEMB '* Path)
               (NOT (FMEMB '* path))
               (NCONC1 path '*))
          (SETQ path (DREVERSE path]
      (CC.UnparseAccessPath path])

)

(RPAQ? FISSVAddressFormat '(FIX NIL 16))

(RPAQ? FISSVAddressPrefix "#<")

(RPAQ? FISSVAddressSuffix ">")

(RPAQ? FISSVLockPointerFlg )

(RPAQ? FISSVLockPrefix (CHARACTER 124))

(RPAQ? FISSVLockSuffix (CHARACTER 124))

(RPAQ? FISSVMaxTitlePathLength )

(RPAQ? FISSVShowAddressFlg T)

(RPAQ? FISSVMarkChar "*")

(RPAQ? FISAutoStateVariableValues T)

(RPAQ? FISOldSVCharFlg T)

(DECLARE%: EVAL@COMPILE

(PUTPROPS \CCC.FastArrayFetch MACRO (OPENLAMBDA (A N)        (* UNDOC -
                                                               fast access)
                                      (\GETBASEPTR (\GETBASEPTR (ARRAYP A)
                                                          0)
                                             (LLSH N 1))))
)

(RPAQQ FISBooleanTypeLst (bool boolean))

(RPAQQ FISCharacterTypeLst (character))

(RPAQQ FISPointerTypeLst (pointer array struct union))

(RPAQQ FISSVExamineArrayLst (("Examine" Examine "Examine the contents of this state variable")
                             ("Examine as Array" ExamineAsArray "Examine as an array of item's type")))
```

```
(RPAQQ FISSVExamineCharArrayLst (("Examine" Examine "Examine the contents of this state variable")
                                 ("Examine as Array of Char" ExamineCharArray "Examine item as an array of
                                   char")
                                 ("Examine as Array of Character" ExamineCharacterArray "Examine item as an
                                       array of character")))

(RPAQQ FISSVFullVarNameFlg NIL)

(RPAQQ FISSVTypeTitleFlg T)
```

```
(RPAQQ FISSVValueWithSubItems ((SUBITEMS ("Show Radix" RadixShow "Show current output radix value")
                                         ("Set Radix" RadixSet "Set output radix")
                                         ("Set To Hex" (16 RadixSet)
                                                "Set output radix to hex")
                                         ("Set To Octal" (8 RadixSet)
                                                "Set output radix to octal")
                                         ("Set To Decimal" (10 RadixSet)
                                                "Set output radix to decimal"))))

(RPAQQ FISSVValueWithSubItems2
       ((SUBITEMS ("Show Radix" RadixShow "Show current output radix value")
               ("Set Radix" RadixSet "Set output radix")
               ("Set To Hex" (16 RadixSet)
                      "Set output radix to hex")
               ("Set To Octal" (8 RadixSet)
                      "Set output radix to octal")
               ("Set To Decimal" (10 RadixSet)
                      "Set output radix to decimal")
               ("Lock Pointer" (Lock LockPointer)
                      "Lock the view on this pointer")
               ("Unlock Pointer" (T LockPointer)
                      "Unlock the view on this pointer"))))

(DECLARE%: DOEVAL@COMPILE DONTCOPY

(GLOBALVARS FISOldSVCharFlg FISBooleanTypeLst FISCharacterTypeLst FISPointerTypeLst FISSVMarkChar
       FISAutoStateVariableValues)
)

(ADDTOVAR SWGlobalParameters (AutoStateVariableValues FISAutoStateVariableValues SWBooleanP "a boolean"))

(RPAQQ CCCBackList
       ((%'\0' . 0)
        (%'\001' . 1)
        (%'\01' . 1)
        (%'\1' . 1)
        (%'\002' . 2)
        (%'\02' . 2)
        (%'\2' . 2)
        (%'\003' . 3)
        (%'\03' . 3)
        (%'\3' . 3)
        (%'\004' . 4)
        (%'\04' . 4)
        (%'\4' . 4)
        (%'\005' . 5)
        (%'\05' . 5)
        (%'\5' . 5)
        (%'\006' . 6)
        (%'\06' . 6)
        (%'\6' . 6)
        (%'\007' . 7)
        (%'\07' . 7)
        (%'\7' . 7)
        (%'\010' . 8)
        (%'\10' . 8)
        (%'\011' . 9)
        (%'\11' . 9)
        (%'\012' . 10)
        (%'\12' . 10)
        (%'\013' . 11)
        (%'\13' . 11)
        (%'\014' . 12)
        (%'\14' . 12)
        (%'\015' . 13)
        (%'\15' . 13)
        (%'\016' . 14)
        (%'\16' . 14)
        (%'\017' . 15)
        (%'\17' . 15)
        (%'\020' . 16)
        (%'\20' . 16)
        (%'\021' . 17)
        (%'\21' . 17)
        (%'\022' . 18)
        (%'\22' . 18)
        (%'\023' . 19)
        (%'\23' . 19)
        (%'\024' . 20)
        (%'\24' . 20)
        (%'\025' . 21)
        (%'\25' . 21)
```

```
(%'\026' . 22)
(%'\26' . 22)
(%'\027' . 23)
(%'\27' . 23)
(%'\030' . 24)
(%'\30' . 24)
(%'\031' . 25)
(%'\31' . 25)
(%'\032' . 26)
(%'\32' . 26)
(%'\033' . 27)
(%'\33' . 27)
(%'\034' . 28)
(%'\34' . 28)
(%'\035' . 29)
(%'\35' . 29)
(%'\036' . 30)
(%'\36' . 30)
(%'\037' . 31)
(%'\37' . 31)
(|' '| . 32)
(%'!' . 33)
(|'"'| . 34)
(%'#' . 35)
(%'$' . 36)
(%'%%' . 37)
(%'&' . 38)
(%''' . 39)
(|'('| . 40)
(|')'| . 41)
(%'*' . 42)
(%'+' . 43)
(%',' . 44)
(%'-' . 45)
(%'.' . 46)
(%'/' . 47)
(%'0' . 48)
(%'1' . 49)
(%'2' . 50)
(%'3' . 51)
(%'4' . 52)
(%'5' . 53)
(%'6' . 54)
(%'7' . 55)
(%'8' . 56)
(%'9' . 57)
(|':'| . 58)
(%';' . 59)
(%'<' . 60)
(%'=' . 61)
(%'>' . 62)
(%'?' . 63)
(%'@' . 64)
(%'A' . 65)
(%'B' . 66)
(%'C' . 67)
(%'D' . 68)
(%'E' . 69)
(%'F' . 70)
(%'G' . 71)
(%'H' . 72)
(%'I' . 73)
(%'J' . 74)
(%'K' . 75)
(%'L' . 76)
(%'M' . 77)
(%'N' . 78)
(%'O' . 79)
(%'P' . 80)
(%'Q' . 81)
(%'R' . 82)
(%'S' . 83)
(%'T' . 84)
(%'U' . 85)
(%'V' . 86)
(%'W' . 87)
(%'X' . 88)
(%'Y' . 89)
(%'Z' . 90)
(|'['| . 91)
(%'\' . 92)
(|']'| . 93)
(%'^' . 94)
```

```
(%'_' . 95)
(%'`' . 96)
(%'a' . 97)
(%'b' . 98)
(%'c' . 99)
(%'d' . 100)
(%'e' . 101)
(%'f' . 102)
(%'g' . 103)
```

```
(%'h' . 104)
(%'i' . 105)
(%'j' . 106)
(%'k' . 107)
(%'l' . 108)
(%'m' . 109)
(%'n' . 110)
(%'o' . 111)
(%'p' . 112)
(%'q' . 113)
(%'r' . 114)
(%'s' . 115)
(%'t' . 116)
(%'u' . 117)
(%'v' . 118)
(%'w' . 119)
(%'x' . 120)
(%'y' . 121)
(%'z' . 122)
(%'{' . 123)
(%'%|' . 124)
(%'}' . 125)
(%'~' . 126)
(%'\177' . 127)
(%'\200' . 128)
(%'\201' . 129)
(%'\202' . 130)
(%'\203' . 131)
(%'\204' . 132)
(%'\205' . 133)
(%'\206' . 134)
(%'\207' . 135)
(%'\210' . 136)
(%'\211' . 137)
(%'\212' . 138)
(%'\213' . 139)
(%'\214' . 140)
(%'\215' . 141)
(%'\216' . 142)
(%'\217' . 143)
(%'\220' . 144)
(%'\221' . 145)
(%'\222' . 146)
(%'\223' . 147)
(%'\224' . 148)
(%'\225' . 149)
(%'\226' . 150)
(%'\227' . 151)
(%'\230' . 152)
(%'\231' . 153)
(%'\232' . 154)
(%'\233' . 155)
(%'\234' . 156)
(%'\235' . 157)
(%'\236' . 158)
(%'\237' . 159)
(%'\240' . 160)
(%'\241' . 161)
(%'\242' . 162)
(%'\243' . 163)
(%'\244' . 164)
(%'\245' . 165)
(%'\246' . 166)
(%'\247' . 167)
(%'\250' . 168)
(%'\251' . 169)
(%'\252' . 170)
(%'\253' . 171)
(%'\254' . 172)
(%'\255' . 173)
(%'\256' . 174)
(%'\257' . 175)
(%'\260' . 176)
(%'\261' . 177)
(%'\262' . 178)
(%'\263' . 179)
(%'\264' . 180)
(%'\265' . 181)
(%'\266' . 182)
(%'\267' . 183)
(%'\270' . 184)
(%'\271' . 185)
(%'\272' . 186)
(%'\273' . 187)
(%'\274' . 188)
(%'\275' . 189)
(%'\276' . 190)
(%'\277' . 191)
(%'\300' . 192)
(%'\301' . 193)
(%'\302' . 194)
(%'\303' . 195)
(%'\304' . 196)
(%'\305' . 197)
```

```
(%'\306' . 198)
(%'\307' . 199)
(%'\310' . 200)
(%'\311' . 201)
(%'\312' . 202)
(%'\313' . 203)
(%'\314' . 204)
(%'\315' . 205)
(%'\316' . 206)
(%'\317' . 207)
(%'\320' . 208)
(%'\321' . 209)
(%'\322' . 210)
(%'\323' . 211)
(%'\324' . 212)
(%'\325' . 213)
(%'\326' . 214)
(%'\327' . 215)
(%'\330' . 216)
(%'\331' . 217)
(%'\332' . 218)
(%'\333' . 219)
(%'\334' . 220)
(%'\335' . 221)
(%'\336' . 222)
(%'\337' . 223)
(%'\340' . 224)
(%'\341' . 225)
(%'\342' . 226)
(%'\343' . 227)
(%'\344' . 228)
(%'\345' . 229)
(%'\346' . 230)
(%'\347' . 231)
(%'\350' . 232)
(%'\351' . 233)
(%'\352' . 234)
(%'\353' . 235)
(%'\354' . 236)
(%'\355' . 237)
(%'\356' . 238)
(%'\357' . 239)
(%'\360' . 240)
(%'\361' . 241)
(%'\362' . 242)
(%'\363' . 243)
(%'\364' . 244)
(%'\365' . 245)
(%'\366' . 246)
(%'\367' . 247)
(%'\370' . 248)
(%'\371' . 249)
(%'\372' . 250)
(%'\373' . 251)
(%'\374' . 252)
(%'\375' . 253)
(%'\376' . 254)
(%'\377' . 255)))
```

```
(RPAQQ CCCEscapeList ((%'\b' . 8)
                      (%'\t' . 9)
                      (%'\n' . 13)
                      (%'\v' . 10)
                      (%'\f' . 12)
                      (%'\r' . 13)))

(RPAQ CCCListArray
      (READARRAY-FROM-LIST 256 'POINTER 0
            '(%'\0' %'\001' %'\002' %'\003' %'\004' %'\005' %'\006' %'\007' %'\010' %'\011' %'\012' %'\013'
                    %'\014' %'\015' %'\016' %'\017' %'\020' %'\021' %'\022' %'\023' %'\024' %'\025' %'\026'
                    %'\027' %'\030' %'\031' %'\032' %'\033' %'\034' %'\035' %'\036' %'\037' |' '| %'!' |'"'|
                    %'#' %'$' %'%%' %'&' %''' |'('| |')'| %'*' %'+' %',' %'-' %'.' %'/' %'0' %'1' %'2' %'3'
                    %'4' %'5' %'6' %'7' %'8' %'9' |':'| %';' %'<' %'=' %'>' %'?' %'@' %'A' %'B' %'C' %'D'
                    %'E' %'F' %'G' %'H' %'I' %'J' %'K' %'L' %'M' %'N' %'O' %'P' %'Q' %'R' %'S' %'T' %'U'
                    %'V' %'W' %'X' %'Y' %'Z' |'['| %'\' |']'| %'^' %'_' %'`' %'a' %'b' %'c' %'d' %'e' %'f'
                    %'g' %'h' %'i' %'j' %'k' %'l' %'m' %'n' %'o' %'p' %'q' %'r' %'s' %'t' %'u' %'v' %'w'
                    %'x' %'y' %'z' %'{' %'%|' %'}' %'~' %'\177' %'\200' %'\201' %'\202' %'\203' %'\204'
                    %'\205' %'\206' %'\207' %'\210' %'\211' %'\212' %'\213' %'\214' %'\215' %'\216' %'\217'
                    %'\220' %'\221' %'\222' %'\223' %'\224' %'\225' %'\226' %'\227' %'\230' %'\231' %'\232'
                    %'\233' %'\234' %'\235' %'\236' %'\237' %'\240' %'\241' %'\242' %'\243' %'\244' %'\245'
                    %'\246' %'\247' %'\250' %'\251' %'\252' %'\253' %'\254' %'\255' %'\256' %'\257' %'\260'
                    %'\261' %'\262' %'\263' %'\264' %'\265' %'\266' %'\267' %'\270' %'\271' %'\272' %'\273'
                    %'\274' %'\275' %'\276' %'\277' %'\300' %'\301' %'\302' %'\303' %'\304' %'\305' %'\306'
                    %'\307' %'\310' %'\311' %'\312' %'\313' %'\314' %'\315' %'\316' %'\317' %'\320' %'\321'
                    %'\322' %'\323' %'\324' %'\325' %'\326' %'\327' %'\330' %'\331' %'\332' %'\333' %'\334'
                    %'\335' %'\336' %'\337' %'\340' %'\341' %'\342' %'\343' %'\344' %'\345' %'\346' %'\347'
                    %'\350' %'\351' %'\352' %'\353' %'\354' %'\355' %'\356' %'\357' %'\360' %'\361' %'\362'
                    %'\363' %'\364' %'\365' %'\366' %'\367' %'\370' %'\371' %'\372' %'\373' %'\374' %'\375'
                    %'\376' %'\377' NIL)))

(PUTPROPS FISSV FILETYPE :FAKE-COMPILE-FILE)

(PUTPROPS FISSV COPYRIGHT ("Savoir, Inc." 1988))
```

FUNCTION INDEX

AVSmashItemFn ....................................15
CreateFISFolderSeparator ..........................14
FISTraceLimitFn ...................................15
FolderBrowserReshapeFn ............................14

METHOD INDEX

ExamineFolderContentsContext.ContextReturned .......3
ExamineFolderContentsContext.CreateObject ..........3
ExamineFolderContentsContext.GetLinkedContexts .....4
ExamineFolderContentsContext.ProcessListObject .....4
Folder.DeleteElement ..............................4
Folder.Kill .......................................4
Folder.ProcessNonObjects ..........................4
Folder.SortElements ...............................4
Folder.TypicalValueWidth ..........................4
FolderBrowser.AdjustSubObjRegions .................4
FolderBrowser.AppendElement .......................5
FolderBrowser.Browse ..............................5
FolderBrowser.CheckWidths .........................5
FolderBrowser.ClearFolder .........................5
FolderBrowser.ComputeCacheLst .....................5
FolderBrowser.ComputeElementWidths .................6
FolderBrowser.ComputeIValueRegions .................6
FolderBrowser.ContentsChanged .....................6
FolderBrowser.DeleteElement .......................6
FolderBrowser.DrawSeparators ......................7
FolderBrowser.ElementChanged ......................7
FolderBrowser.FindSelectedSubObject ...............7
FolderBrowser.LayoutFolder ........................7
FolderBrowser.LayoutRegions .......................8
FolderBrowser.LeftSelection .......................9
FolderBrowser.MiddleItemPredicate .................9
FolderBrowser.Repaint .............................9
FolderBrowser.RepaintChangedElement ...............10
FolderBrowser.RepaintElement ......................10
FolderBrowser.ReshapeFn ...........................10
FolderBrowser.ScrollFn ............................10
FolderBrowser.ShapeToFit ..........................11
FolderBrowser.ShowValue ...........................11
FolderBrowser.ShowValues ..........................11
FolderBrowser.UpdateTabStops ......................11
FolderBrowser.Valuable? ...........................11
GrafcetFolderBrowser.ConstructTitle ...............12
TemplateFolderBrowser.AddTemplate .................12
TemplateFolderBrowser.CompileTemplate .............12
TemplateFolderBrowser.ComputeHorizMethodItems .....12
TemplateFolderBrowser.LeftSelection ...............12
TemplateFolderBrowser.LeftTitleSelection ..........13
TraceFolderBrowser.AddToTrace .....................13
TraceFolderBrowser.AppendElement ..................13
TraceFolderBrowser.Browse .........................13
TraceFolderBrowser.ClearFolder ....................13
TraceFolderBrowser.ConstructTitle .................14
TraceFolderBrowser.Destroy ........................14
TraceFolderBrowser.TruncateElements ...............14

CLASS INDEX

ExamineFolderContentsContext ....1
ExamineMailFolderContext ........2
ExamineProgramFolderContext .....2
Folder ..........................2
FolderBrowser ...................2
FolderFolder ....................2
GrafcetFolderBrowser ............3
MailFolder ......................3
MessageDefinitionFolder .........3
MMFSTraceFolder .................3
ProgramFolder ...................3
TemplateFolderBrowser ...........3
TraceFolderBrowser ..............3

PROPERTY INDEX

FISFOLDER ...........1,15
FISFolderSeparator ....15
FISHardTraceLimit .....15
MessageTraceLimit .....15

VARIABLE INDEX

FISHardTraceLimit .....15
MessageTraceLimit .....15 changes to: (VARS FISFOLDERCOMS)

previous date: 15-Jun-88 18:40:24 (POGO:AISNORTH:XEROX)<LIPKIS>FIS>FISFOLDER.;161

Read Table: INTERLISP

Package: IL

.. Copyright (c) 1985, 1986, 1987, 1988 by Savoir, Inc.. All rights reserved

```
(RPAQQ FISFOLDERCOMS
       ((DECLARE%: DONTCOPY (PROP MAKEFILE-ENVIRONMENT FISFOLDER))
                                                              , File created by LIPKIS
        (CLASSES ExamineFolderContentsContext ExamineMailFolderContext ExamineProgramFolderContext Folder
               FolderBrowser FolderFolder GrafcetFolderBrowser MMFSTraceFolder MailFolder
               MessageDefinitionFolder ProgramFolder TemplateFolderBrowser TraceFolderBrowser)
        (METHODS ExamineFolderContentsContext.ContextReturned ExamineFolderContentsContext.CreateObject
               ExamineFolderContentsContext.GetLinkedContexts ExamineFolderContentsContext.ProcessListObject
               Folder.DeleteElement Folder.Kill Folder.ProcessNonObjects Folder.SortElements
               Folder.TypicalValueWidth FolderBrowser.AdjustSubObjRegions FolderBrowser.AppendElement
               FolderBrowser.Browse FolderBrowser.CheckWidths FolderBrowser.ClearFolder
               FolderBrowser.ComputeCacheLst FolderBrowser.ComputeElementWidths
```

```
            FolderBrowser.ComputeIValueRegions FolderBrowser.ContentsChanged FolderBrowser.DeleteElement
            FolderBrowser.DrawSeparators FolderBrowser.ElementChanged FolderBrowser.FindSelectedSubObject
            FolderBrowser.LayoutFolder FolderBrowser.LayoutRegions FolderBrowser.LeftSelection
            FolderBrowser.MiddleItemPredicate FolderBrowser.Repaint FolderBrowser.RepaintChangedElement
            FolderBrowser.RepaintElement FolderBrowser.ReshapeFn FolderBrowser.ScrollFn
            FolderBrowser.ShapeToFit FolderBrowser.ShowValue FolderBrowser.ShowValues
            FolderBrowser.UpdateTabStops FolderBrowser.Valuable? GrafcetFolderBrowser.ConstructTitle
            TemplateFolderBrowser.AddTemplate TemplateFolderBrowser.CompileTemplate
            TemplateFolderBrowser.ComputeHorizMethodItems TemplateFolderBrowser.LeftSelection
            TemplateFolderBrowser.LeftTitleSelection TraceFolderBrowser.AddToTrace
            TraceFolderBrowser.AppendElement TraceFolderBrowser.Browse TraceFolderBrowser.ClearFolder
            TraceFolderBrowser.ConstructTitle TraceFolderBrowser.Destroy
            TraceFolderBrowser.TruncateElements)
        (FNS CreateFISFolderSeparator FolderBrowserReshapeFn AVSmashItemFn)
        (PROP GLOBALVAR FISFolderSeparator MessageTraceLimit FISHardTraceLimit)
        (INITVARS (MessageTraceLimit 60))
        (P (CreateFISFolderSeparator))
        [COMS
              .. Stuff for the mode setting parameters

              (VARS (FISHardTraceLimit 30))
              (FNS FISTraceLimitFn)
              (P (SETQ SWGlobalParameters (APPEND SWGlobalParameters (LIST (create SWParameterDescription
                                                                                   SWParmName _
                                                                                   'MessageTraceLimit
                                                                                   SWParmVarName _
                                                                                   'MessageTraceLimit
                                                                                   SWParmTypeTester _
                                                                                   'FISTraceLimitFn
                                                                                   SWParmString _
                                                                                   (CONCAT "a value at least "
                                                                                        FISHardTraceLimit]
        (PROP FILETYPE FISFOLDER)))

(DECLARE%: DONTCOPY

(PUTPROPS FISFOLDER MAKEFILE-ENVIRONMENT (:PACKAGE "IL" :READTABLE "INTERLISP" :BASE 10))
)


. File created by LIPKIS

(DEFCLASS ExamineFolderContentsContext (MetaClass Class Edited%:
                                                                   (* mcf%: "24-Sep-85 11 28")
                                             doc "This is the default metaClass for all classes")
      (Supers DefaultContext)
      (ClassVariables (AttachHorizMenu NIL doc "Controls appearance of horizontal menu items. This turns it
                            off.")
             (LinkedContexts (#,($C ChooseFolderContext)))
             (LinkedContextTypes (#,($C ExamineFormContext)))
             (ChoiceContexts (#,($C ChooseFolderContext)))
             (SubContexts (#,($C FileItemContext) #,($C DeleteItemContext)))
             (MenuDoc "Lets you see what's in a folder, delete and re-file items, etc." doc "The help string
                   for this context in menus")
             (MenuName "ExamineFolder" doc "The string used for this context in menus")
             (Browser #,($C FolderBrowser))
             (Prototype #,($& ExamineFolderContentsContext (|AZXO.L2[:.c>@| . 282))))
      (InstanceVariables (object NIL VR #,($C Folder))))

(DEFCLASS ExamineMailFolderContext (MetaClass Class Edited%:  (* mcf%: "25-Nov-85 20:18")
                                           doc "This is the default metaClass for all classes")
      (Supers ExamineFolderContentsContext)
      (ClassVariables (MenuDoc "Lets you look at your mail, answer it, file it, etc. If you
                            release now, you will get your current mail; slide right to
                            choose a different folder." doc "The help string for this context in menus")
             (MenuName "Examine Mail" doc "The string used for this context in menus")
             (SubContexts (#,($C ShowUserMessageContext) #,($C FileItemContext) #,($C DeleteItemContext))
                   VR #,($C DefaultContext))
             (LinkedContexts (#,($C ChooseFolderContext)))
             (ChoiceContexts (#,($C ChooseFolderContext)))
             (Browser #,($C FolderBrowser)))
      (InstanceVariables (object NIL VR #,($C MailFolder))))

(DEFCLASS ExamineProgramFolderContext (MetaClass Class Edited%:
                                                                   (* W.Mark "24-Jan-85 11 49")
                                             doc "This is the default metaClass for all classes")
      (Supers ExamineFolderContentsContext)
      (ClassVariables (LinkedContexts (#,($C ChooseFolderContext)))
             (ChoiceContexts (#,($C ChooseFolderContext))))
      (InstanceVariables (object NIL VR #,($C ProgramFolder))))

(DEFCLASS Folder (MetaClass Class Edited%:                (* mcf%. "31-Aug-86 11 20")
                      doc "Objects that store other objects inside them for later retrieval by the user")
      (Supers ComputerObject)
      (ClassVariables (SummaryFields NIL)
             (SortCompareFn NIL doc "Name of a function to be used as a comparefn to sort the elements of
                   the folder. (Usually by ProcessListObject)")
             (Valuable NIL doc "Flag when folder contains items with values")
             (DefaultiValue ?? doc."If nothing else, print this")
             (AllowDeletion NIL doc "default doesn't permit deletion")
             (FolderHorizMethodItems NIL))
      (InstanceVariables (elements NIL VR #,($C ComputerObject))))

(DEFCLASS FolderBrowser (MetaClass Class Edited%:         (* mcf%: "16-Mar-86 11 03")
                           doc "This is the default metaClass for all classes")
```

Page 2

```
        (Supers Browser)
        (ClassVariables (Scrollable T)
                (ColumnSpace 10 doc "Space between columns")
                (Dashing (1 2))
                (DefaultValue #,NotSetValue doc "something to print if no value")
                (HeaderSeparatorHeight 3 doc "height of line separating header from text")
                (SeparatorSpace 3)
                (MinSeparatorFields 2 doc "Separators drawn only if at least this many fields")
                (RightButtonItems #,($A (ShapeToFit) UnionSuperValue NoUpdatePermitted))
                (ShiftRightButtonItems #,($A (ShapeToFit) UnionSuperValue NoUpdatePermitted))
                (HorizMethodItems
              #,($A (valuable (Values ShowValues "Toggle value display")) CondUnionSuperValue NoUpdatePermitted)
                  )
                (MiddleMethodItems
                  #,($A ((Delete DeleteElement "Delete element from folder")) UnionSuperValue NoUpdatePermitted)
                  ))
        (InstanceVariables (suppressRedisplay NIL)
                (groupSize 3)
                (redrawElements NIL)
                (elements NIL doc "elements of the folder")
                (fields NIL doc "Names of IVs of summarized fields")
                (headings NIL doc "List of heading strings")
                (widths NIL doc "List of column widths")
                (tabStops NIL)
                (maxWidths NIL)
                (cacheWidths #,($A ComputeCacheLst FFSendSelf ReplaceMe) doc "cache to avoid consing when
                        computing widths")
                (separators NIL)
                (extent NIL)
                (scrolling NIL doc "Interactive scrolling flag")
                (selection NIL doc "current selection")
                (valuable #,($A Valuable? FFSendSelf ReplaceMe) doc "Are values going to be present in this
                        folder")
                (iValueRegions #,($A ComputeIValueRegions FFSendSelf ReplaceMe) doc "region cache for folders
                        with values")))

(DEFCLASS FolderFolder (MetaClass Class Edited%:          (* W Mark "12-Jan-85 17 24")
                                doc "the folder containing all the user's folders")
        (Supers Folder)
        (ClassVariables (Prototype #,($& FolderFolder (|GEU0.1E↑:.L>:| . 641))))
        (InstanceVariables (elements NIL VR #,($C Folder))))
(DEFCLASS GrafcetFolderBrowser (MetaClass Class Edited%:          (* mcl%. " 1-Jul-86 10:48")
                                        doc "This is the default metaClass for all classes")
        (Supers FolderBrowser))
```

Page 3

```
(DEFCLASS MMFSTraceFolder (MetaClass Class Edited%:          (* TAL "12-Oct-85 19:20")
                                doc "This is the default metaClass for all classes")
        (Supers Folder)
        (InstanceVariables (elements NIL VR #,($C MMFSMessage))))

(DEFCLASS MailFolder (MetaClass Class Edited%:          (* W Mark " 2-Feb-85 16:22")
                        doc "This is the default metaClass for all classes")
        (Supers Folder)
        (ClassVariables (FocusIV mailFolder))
        (InstanceVariables (elements NIL VR #,($C Memo))))

(DEFCLASS MessageDefinitionFolder (MetaClass Class Edited%:     (* TAL " 2-Aug-85 11:07")
                                        doc "This is the default metaClass for all classes")
        (Supers Folder)
        (InstanceVariables (elements NIL VR #,($C MessageDefinition))))

(DEFCLASS ProgramFolder (MetaClass Class Edited%:          (* TAL " 4-Feb-85 02:58")
                                doc "This is the default metaClass for all classes")
        (Supers Folder)
        (ClassVariables (FocusIV programFolder)
            (Prototype #,($& ProgramFolder (|GAU0.1E↑:.00:| . 10))))
        (InstanceVariables (elements NIL VR #,($C Program))))

(DEFCLASS TemplateFolderBrowser (MetaClass Class Edited%:     (* mcl%. "24-Sep-86 11 49")
                                        doc "This is the default metaClass for all classes")
        (Supers GrafcetFolderBrowser)
        (ClassVariables (HorizMethodItems
           #,($A #,($A ComputeHorizMethodItems AVSendSelf NoUpdatePermitted) UnionSuperValue NoUpdatePermitted)
                          )))

(DEFCLASS TraceFolderBrowser (MetaClass Class Edited%:          (* mcl%. "21-Nov-86 13.22")
                                doc "This is the default metaClass for all classes")
        (Supers FolderBrowser)
        (ClassVariables (MinWidth 450)
                (MinHeight 90)
                (HorizMethodItems #,($A ((Clear ClearFolder "Clear contents")) AVSmashItemFn NoUpdatePermitted)
                        ))
        (InstanceVariables (scrolling T doc "Scroll flag")
                (itemCount 0 doc "Number of items in the trace")))

(\BatchMethodDefs)
```

```
(Method ((ExamineFolderContentsContext ContextReturned) self returningContext
                                                              spawningRelation object edited
                                                              container containerIV)
                                                  mcf: 29-Apr-88 15.41
   "Specialization"
   [LET (browser)
     (_Super )
     (COND
        ((LISTGET (@ %:contextArgs)
               'IgnoreEdit))
        (edited                                   (* If an element was edited, the folder was edited)
              (_ self DidEdit)
              (SETQ browser (@ %:myBrowser))
              (COND
                 ((DestroyedObject? browser)
                  (SETQ browser NIL)))
              (COND
                 [(EQ edited 'Create)
                  (COND
                     (browser (_ browser AppendElement object))
                     (T (change (@ |:object:elements|)
                               (NCONC1 DATUM object]
                 (T (AND browser (_ browser ElementChanged object)])

(Method ((ExamineFolderContentsContext CreateObject) self)
                                                  mcf: 7 Aug-86 10 12
   "Specialization"
   (LET (name (object (_Super self CreateObject)))
     [COND
        ((NULL (@ object %:printName))
         (AND (SETQ name (GetClassValue (@ object |:elements:,VR|)
                               'PrintName))
              (_@ object %:printName (Plural name))]
     object))

                                                                        Page 4
(Method ((ExamineFolderContentsContext GetLinkedContexts) self)
                                                  mcf: 6-Sep-85 00:44
                                                  Specialization
  "Since this currently only finds creation contexts, the test in the funion is a little weird, but will be
  right when this method is made more general and moved up"
  (LET (l candidates)
    (SETQ l (_Super self GetLinkedContexts))
    (COND
       ([SETQ candidates (for c in (@ |::LinkedContextTypes|)
                        funion (COND
                                 ((@ %:permitEdits)
                                  (AllSubClassesToo c))
                                 (T (for x in (AllSubClassesToo c)
                                       when (NOT (GetClassIV x 'canCreate)) collect x]
        (APPEND (_ self SubContextsForType (@ |:object:elements:,VR|)
                    candidates T T)
              l))
       (T l))))

(Method ((ExamineFolderContentsContext ProcessListObject) self object folderClass
                                                              elementClass)
                                                  TAL 20-Mar-86 06:20
  "Specialization"
  (LET (sortFn)
    (_Super self ProcessListObject (COND
                                  ((AND folderClass (_ folderClass HasCV 'SortCompareFn)
                                        (SETQ sortFn (@ folderClass |::SortCompareFn|)))
                                   (SORT (APPEND object)
                                         sortFn))
                                  (T object))
            folderClass elementClass)))

(Method ((Folder DeleteElement) self)             mcf: 14-Aug-86 14:16
  "New method template"
  self)

(Method ((Folder Kill) self)                      mcf: 24-Aug-87 11 00
  "Specialization"
  (for e in (@ self %:elements) do (_ e Kill))
  (_Super self Kill))

(Method ((Folder ProcessNonObjects) self objects)     TAL 2-Sep-85 12.00
  "Called to turn a list of non objects into a list of objects. Default is to do nothing"
  objects)

(Method ((Folder SortElements) self)              TAL 6-Dec-85 00.07
  "New method template"
  (LET ((compareFn (@ |::SortCompareFn|)))
    [COND
       (compareFn (change (@ %:elements)
                       (SORT DATUM compareFn]
    self))
```

```
(Method ((Folder TypicalValueWidth) self Font)          . mcf: 25-Jun-86 16:29
   "New method template"
   (STRINGWIDTH "1234" (OR Font DEFAULTFONT)))

(Method ((FolderBrowser AdjustSubObjRegions) self Window)
                                                         mcf 28-Mar-88 12 29
   "New method template"
   [LET [reg subor width (w (OR Window (@ %:window)]
     (SETQ width (WINDOWPROP w 'WIDTH))
     (COND
        ((AND (SETQ subor (@ self %:subObjectRegions))
              (SETQ reg (fetch subObjectRegion of (CAR subor)))
              (IGREATERP width (fetch WIDTH of reg)))
         (for x in subor do (replace WIDTH of (fetch subObjectRegion of x) with width])

(Method ((FolderBrowser AppendElement) self element)
                                                         . mcf: 14-Jul-86 15:39
   "New method template"
   (DECLARE (GLOBALVARS FISWindowTitleFont))
   [LET (window (widths (_ self ComputeElementWidths element)))
     (_@ |:object:elements| (change (@ elements)
                                    (NCONC1 DATUM element)))
     (COND
        (NIL (_ self CheckWidths widths)
             (_ self RepaintElement element NIL T))
        (T (_ self UpdateTabStops widths)
           (_ self LayoutRegions)
           (RESETLST
               [RESETSAVE (_@ suppressRedisplay T)
                      (LIST (FUNCTION (LAMBDA NIL
                                         (_@ suppressRedisplay NIL)]
               (_ self ShapeToFit)
               (SETQ window (@ window))

               .. Lyric: height refers to entire instead of interior

               (PreSCROLLW window 0 (PreScrollYPos self window)))
           (_ self Repaint)])

(Method ((FolderBrowser Browse) self context object)  . mcf: 18-Mar-88 15:20
   "Layout and display the items in a folder"
   [PROG (win extent)
         (COND
            ((OR T (@ object elements)
                 (@ |:context:permitEdits|))
             (_@ elements (@ object %:elements))
             (_ self LayoutFolder NIL)
             (SETQ extent (@ extent))
             (_ self PositionBrowser (fetch WIDTH of extent)
                    (fetch HEIGHT of extent))

             .. scroll so window shows top of extent, rather than bottom as window system leaves it

             (SETQ win (@ window))

             .. This may no longer be necessary in lyric: (PreSCROLLW win 0 (DIFFERENCE (PLUS (WindowBottomY win) (@ height)) (fetch PTOP of extent)))

             (DSPRESET win)
             (_ self Repaint NIL NIL)

             .. Replaced by method (WINDOWADDPROP win (QUOTE RESHAPEFN) (FUNCTION FolderBrowserReshapeFn))

             (_Super )
             (_ self AdjustSubObjRegions win)])

(Method ((FolderBrowser CheckWidths) self widths)    TAL 24-Mar-86 03.04
   "New method template"
   (for ow in (@ %:widths) as nw in widths never (GREATERP nw ow)))

(Method ((FolderBrowser ClearFolder) self)           mcf. 14-Jul-86 09 58
   "Clear away everything and repaint"
   (DSPRESET (@ %:window))
   (_@ self elements NIL)
   (_@ self subObjectRegions NIL)
   (_ self LayoutFolder)
   (PreSCROLLW (@ window)
          0
          (PreScrollYPos self))
   (_ self Repaint))

(Method ((FolderBrowser ComputeCacheLst) self)      . mcf: 1-Mar-88 10.57
   "New method template"
   (for x in (@ %:fields) collect 0))
```

```
(Method ((FolderBrowser ComputeElementWidths) self Elements Font UniqueLstFlg)
                                                    . mcl: 27-Mar-88 15.42
   "New method template"
   (LET* [parens (cWidths (@ %:cacheWidths))
               (font (OR Font (DSPFONT NIL (@ %:window)]
     (SETQ parens (STRINGWIDTH "()" font))
     (AND UniqueLstFlg (SETQ cWidths (COPY cWidths)))
     (bind val w for c on cWidths as field in (@ %:fields) as maxW in (@ %:maxWidths)
        do [RPLACA c (IMIN maxW (for x inside Elements eachtime (SETQ w
                                                  (STRINGWIDTH (OR (SETQ val (@ x %:!\field))
                                                                   (SETQ val
                                                                    (ValueIfSet (@ x
                                                                     |:!\field:.TypicalElement|
)))
                                                                    ""))
                                                        font))
                                  maximize (COND
                                             ((LISTP val)
                                              (IDIFFERENCE w parens))
                                             (T w]
        yield cWidths)))

(Method ((FolderBrowser ComputelValueRegions) self)
                                                    . mcl 23-Dec-87 16:31
   "New method template"
   [LET (left hleft (tabs (@ %:tabStops)))
     (SETQ left (CAR (NLEFT tabs 2)))
     (SETQ hleft (CAR (NLEFT tabs 3)))
     (bind region for x in (@ %:subObjectRegions) collect (SETQ region (fetch subObjectRegion of x))
                                       (create SubObjectRegion
                                           subObject _ (fetch subObject of x)
                                           subObjectRegion _
                                           (create REGION
                                                  LEFT _ left
                                                  WIDTH _ (IDIFFERENCE (fetch WIDTH
                                                                          of region)
                                                                    left)
                                              using region)
                                           subObjectHighlight _
                                           (create REGION
                                                  LEFT _ hleft
                                                  WIDTH _ (IDIFFERENCE (fetch WIDTH
                                                                          of region)
                                                                    hleft)
                                              using region])

(Method ((FolderBrowser ContentsChanged) self Arg1)
                                                    . mcl: 11-Nov-87 16.41
   "Specialization"
   (COND
      ((AND Arg1 (FMEMB Arg1 (@ %:elements)))
       (_ self RepaintElement Arg1 NIL T))
      (T (_Super self ContentsChanged Arg1))))

(Method ((FolderBrowser DeleteElement) self Element)
                                                    . TAL 22-Nov-87 15.04
   "Delete the selected element from the folder"
   [LET [(element (OR (AND (Object? Element)
                          Element)
                     (@ %:middleSubObject)]
     (COND
        (element (_ self Highlight element 'Shade)
               (COND
                  ((MOUSECONFIRM "Delete element? " NIL SavoirPROMPTWINDOW)
                   (_ self Highlight element 'Shade)

       (* This is wrong  The shade should be turned off with Off, not Shade, but Browser Highlight blows it, so this is the only way to do it)

                   (*_@ |:object:elements| (change (@ %:elements)
                                             (DREMOVE element DATUM)))
                   (_ element Kill)                      (* Removed (11/22/87) (_ self UpdateTabStops
                                                         (_ self ComputeElementWidths element)))
                   (_ self LayoutRegions)
                   (_ self Repaint)
                   (_ (@ %:context)
                      DidEdit))
                  (T (_ self Highlight element 'Shade)])
```

```
(Method ((FolderBrowser DrawSeparators) self Region Stream)
                                                    . mcl: 1-Mar-88 10.42
   "New method template"
   (LET (left (stream (OR Stream (@ %:window)))
             (width (fetch WIDTH of (@ %:extent)))
             (region Region))
     (SETQ left (DSPLEFTMARGIN NIL stream))
     [COND
        ((NULL region)
         (SETQ region (DSPCLIPPINGREGION NIL stream]
     (for sepY in (@ %:separators) when (WithinRange? sepY (fetch BOTTOM of region)
                                                    (fetch TOP of region))
        do (BITBLT FISFolderSeparator 0 0 stream left sepY width 1))))
```

```
(Method ((FolderBrowser ElementChanged) self Element DontShapeFlg Stream)
                                                            . mcf: 4-Mar-88 08.40
   "New method template"
   [AND (FMEMB Element (@ %:elements))
        (LET (clip (stream (OR Stream (@ %:window)))
                   (widths (_ self ComputeElementWidths Element)))
          (COND
             [(_ self CheckWidths widths)
              (COND
                 ((@ %:headings)
                  (SETQ clip (create REGION using (DSPCLIPPINGREGION NIL stream)))
                  (add (fetch HEIGHT of clip)
                       (TIMES 2 (DSPLINEFEED NIL stream)))
                  (RESETLST
                      [RESETSAVE (DSPCLIPPINGREGION clip stream)
                             (CONSTANT (LIST (FUNCTION (LAMBDA NIL
                                                       (DSPCLIPPINGREGION OLDVALUE stream]
                      (_ self RepaintChangedElement Element NIL T stream NIL NIL NIL widths)))
                 (T (_ self RepaintChangedElement Element NIL T stream NIL NIL NIL widths)))
              (AND (EQ Element (@ %:selection))
                   (_ self Highlight Element 'Invert)]
             (T (_ self UpdateTabStops widths)
                (_ self LayoutRegions)
                (OR DontShapeFlg (RESETLST
                                     [RESETSAVE (_@ %:suppressRedisplay T)
                                            (LIST (FUNCTION (LAMBDA NIL
                                                            (_@ %:suppressRedisplay NIL)]
                                     (_ self ShapeToFit)))
                (_ self Repaint)])
```

```
(Method ((FolderBrowser FindSelectedSubObject) self window filterFn)
                                                            . mcf 21-Oct-86 11 07
   "New method template"
   [LET (clip res)
     (COND
        ((@ %:headings)
         (SETQ clip (create REGION using (DSPCLIPPINGREGION NIL window)))
         (add (fetch HEIGHT of clip)
              (TIMES 2 (DSPLINEFEED NIL window)))
         (RESETLST
             [RESETSAVE (DSPCLIPPINGREGION clip window)
                    (CONSTANT (LIST (FUNCTION (LAMBDA NIL
                                              (DSPCLIPPINGREGION OLDVALUE window]
             (SETQ res (_Super ))
             (AND res [INTERSECTREGIONS clip (CADR (FASSOC res (@ %:subObjectRegions)]
                  res)))
        (T (_Super )])
```

```
(Method ((FolderBrowser LayoutFolder) self fields)   . mcf: 27-Mar-88 15.16
   "Compute the layout positions of the elements of the object"
   (PROG (headings anObj tabStops widths maxWidths font w h (folder (@ |:context:object|))
             (stream (@ %:window))
             (fields fields)
             (elements (@ %:elements))
             (columnSpace (@ |::ColumnSpace|)))
         (SETQ anObj (OR (CAR elements)
                         (_ (@ folder |:elements:,VR|)
                            Prototype)))                         Get a typical element
         (OR [SETQ fields (_@ %:fields (OR fields (@ %:fields)
                                           (@ folder |::SummaryFields|)
                                           (@ anObj |::SummaryFields|)))]
             (RETURN self))                                      . Names of I V s that make up summary
         (SETQ maxWidths (for field in fields collect (OR (ValueIfSet (@ anObj |:!\field:,MaxColumnWidth|))
                                                          MAX.SMALLP)))
         (_@ %:maxWidths maxWidths)
         (COND                                                                                       Page 8
            ((LESSP (FLENGTH fields)
                    (@ |::MinSeparatorFields|))
             (_@ %:groupSize NIL)))
         (SETQ font (DSPFONT NIL stream))
         (SETQ headings (for field in fields collect (OR (ValueIfSet (@ anObj |:!\field:,heading|))
                                                         (ValueIfSet (@ anObj |:!\field:,Heading|))
                                                         "")))
                                                          . heading for each column is heading prop of I V
         (change (@ %:headings)
                 (for x in headings never (STREQUAL x "") thenyield headings))
.. (SETQ widths (bind w val (parens   (STRINGWIDTH '()' font)) for field in fields as maxW in maxWidths collect (IMIN maxW (for x in elements eachtime (SETQ
.. w (STRINGWIDTH (OR (SETQ val (@ x  !\field)) (SETQ val (ValueIfSet (@ x  !\field:,TypicalElement))) 'ABCDEFGHIJK') font)) maximize (COND ((LISTP val)
.. (IDIFFERENCE w parens)) (T w))))))
         (SETQ widths (_ self ComputeElementWidths elements font T))
                                                          . Get the max w of each field
         (bind tmp for w on widths as h in headings when (GREATERP (SETQ tmp (STRINGWIDTH h font))
                                                                   (CAR w))
            do (RPLACA w tmp))
         (_@ %:widths widths)
         (SETQ tabStops (bind (column _ 0) for w in widths as h in headings
                           eachtime (add column (IPLUS columnSpace w)) collect column))
         (push tabStops 0)                                . The first tab stop is always the left margin
         (SETQ w (add (CAR (LAST tabStops))
                      (MINUS columnSpace)))               . The last tabstop becomes the width
         (_@ %:tabStops tabStops)
         (_ self LayoutRegions)))
```

```
(Method ((FolderBrowser LayoutRegions) self)                mct: 18-Mar-88 14 37
   "New method template"
   (PROG ((stream (@ %:window))
          (oldRegions (@ %:subObjectRegions))
          (newSOR (LIST NIL))
          (extent (@ %:extent))
          left width y yTop lf separators)
         (SETQ left (DSPLEFTMARGIN NIL stream))
         [SETQ width (IMAX (CAR (LAST (@ %:tabStops)))
                           (WINDOWPROP stream 'WIDTH]
         (SETQ lf (DSPLINEFEED NIL stream))
         (SETQ yTop (COND
                      (extent (fetch PTOP of extent))
                      (T 1)))
         (SETQ y yTop)
         [COND
           ((@ %:headings)
            (add y (PLUS lf lf]
         (bind reg soReg (sep _ (@ |::SeparatorSpace|))
               (cnt _ (ADD1 (OR (@ %:groupSize)
                                -2)))
            for subObject in (@ %:elements) eachtime [AND (SETQ soReg (FASSOC subObject oldRegions))
                                                          (COND
                                                            ((FMEMB soReg (CAR newSOR))
                                                             . the same object may appear twice
                                                             (SETQ soReg NIL))
                                                            ((SETQ reg (fetch subObjectRegion of soReg]
            do [COND
                 ((ZEROP (add cnt -1))
                  (push separators (DIFFERENCE y (RSH sep 1)))
                  (add y (MINUS sep))
                  (SETQ cnt (@ %:groupSize)]
               (add y lf)
               [COND
                 (soReg (replace BOTTOM of reg with y)
                        (replace WIDTH of reg with width))
                 (T (SETQ soReg (create SubObjectRegion
                                        subObject _ subObject
                                        subObjectRegion _ (CREATEREGION left y width (MINUS lf]
               (TCONC newSOR soReg))
         (change (@ %:subObjectRegions)
                 (CAR newSOR))
         (change (@ %:separators)
                 (DREVERSE separators))
         [WINDOWPROP stream 'EXTENT (_@ %:extent (CREATEREGION left y (CAR (LAST (@ %:tabStops)))
                                                               (DIFFERENCE yTop y))))]
         (COND
           ((@ %:valuable)
            (_@ %:iValueRegions NotSetValue)))
    self))
```

```
(Method ((FolderBrowser LeftSelection) self)                mct: 8-Jul-86 11:05
   "Specialization"
   (_ self FindSelectedSubObject (@ %:window)
          NIL))
```

```
(Method ((FolderBrowser MiddleItemPredicate) self subObject item selector)
                                                            mct: 14-Aug-86 14:51
   "Specialization"
   (AND (COND
          ((EQ (CAR item)
               'Delete)                                     (* if edits are allowed and the folder permits deletion)
           (AND (@ |:context:permitEdits|)
                (@ |:object::AllowDeletion|)))
          (T))
        (_Super self MiddleItemPredicate subObject item selector)))
```

```
(Method ((FolderBrowser Repaint) self Region Appendflg)
                                                            mct: 1-Mar-88 10:45
   "New method template"
   (PROG (stream tabStops font left width y fDescent lf clipReg cReg nBot restoreClip sel (fields
                                                                                            (@ fields))
               (redraw (@ redrawElements))
               (subObjectRegions (@ subObjectRegions))
               (widths (@ widths)))
        (COND
          ((@ suppressRedisplay)
           (RETURN NIL)))
        (SETQ stream (@ window))
        (SETQ left (DSPLEFTMARGIN NIL stream))
        (SETQ width (fetch WIDTH of (@ extent)))
 .. (DSPRIGHTMARGIN width stream)
        (DSPRIGHTMARGIN MAX.SMALLP stream)
        (SETQ font (DSPFONT NIL stream))
        (SETQ lf (DSPLINEFEED NIL stream))
        (SETQ fDescent (FONTPROP font 'DESCENT))
        (SETQ tabStops (@ tabStops))
        (SETQ clipReg (DSPCLIPPINGREGION NIL stream))
        (SETQ cReg (OR Region clipReg))
        (OR Region (DSPFILL NIL NIL NIL stream))
```

```
        (DSPXPOSITION (DSPLEFTMARGIN NIL stream)
               stream)
        [COND
           ((@ headings)
            [SETQ y (PreScrollYPos self stream (FONTPROP font 'ASCENT]
            (COND
               ((LESSP (DIFFERENCE y fDescent)
                       (fetch PTOP of cReg))
                (DSPYPOSITION (IPLUS y (IQUOTIENT lf 2)
                                     2)
                       stream)
                (for h in (@ headings) as t in tabStops do (DSPXPOSITION t stream)
                                                          (printout stream h))
                (BITBLT NIL NIL NIL stream 0 (DIFFERENCE (IPLUS y lf 1)
                                                      fDescent)
                       width
                       (@ |::HeaderSeparatorHeight|)
                       'TEXTURE
                       'REPLACE -1)
                (SETQ cReg (create REGION using clipReg))
                (add (fetch HEIGHT of cReg)
                     lf lf)
                (SETQ restoreClip (DSPCLIPPINGREGION cReg stream]
        [bind reg for subObject in (@ elements) as soReg in subObjectRegions
           do (SETQ reg (fetch subObjectRegion of soReg))
              (COND
                 ((OR (COND
                         ((FMEMB subObject redraw)
                          (COND
                             ((NOT Appendflg)
                              (DSPFILL reg NIL NIL stream)))
                          T))
                      (REGIONSINTERSECTP cReg reg))

                  . (DSPYPOSITION (PLUS fDescent (fetch BOTTOM of reg)) stream) (bind val for field in fields as t in tabStops when (SETQ val (@
                  subObject ::field)) do (DSPXPOSITION t stream) (COND ((LISTP val) (for item on val do (printout stream (CAR item)) (COND ((CDR item)
                  . (printout stream .SP 1))))) (T (printout stream val))))

                  (_ self RepaintElement subObject reg NIL stream fields tabStops fDescent widths)]
        (_ self DrawSeparators cReg stream)
        (AND (SETQ sel (@ selection))
             (_ self Highlight sel 'Invert))                                              Page 10
        (COND
           (restoreClip (DSPCLIPPINGREGION restoreClip stream)))
        (_@ redrawElements NIL)
        (RETURN self)))
```

(Method ((FolderBrowser RepaintChangedElement) self Element Reg Erasefirst Stream Fields TabStops FDescent Widths)

. mcf: 1-Mar-88 16:11

```
   "New method template"
   (_ self RepaintElement Element Reg Erasefirst Stream Fields TabStops FDescent Widths))
```

(Method ((FolderBrowser RepaintElement) self Element Reg Erasefirst Stream Fields TabStops FDescent Widths)

. : mcf: 22-Mar-88 11:44

```
   "New method template"
   [LET [(vFlg (@ %:valuable))
         (stream (OR Stream (@ %:window)))
         (fields (OR Fields (@ %:fields)))
         (tabStops (OR TabStops (@ %:tabStops)))
         (widths (OR Widths (@ %:widths)))
         (reg (OR Reg (fetch subObjectRegion of (FASSOC Element (@ %:subObjectRegions)]
    (COND
       (Erasefirst (DSPFILL reg NIL NIL stream)))
    (DSPYPOSITION (PLUS (OR FDescent (FONTPROP (DSPFONT NIL stream)
                                               'DESCENT))
                        (fetch BOTTOM of reg))
           stream)
    (bind val newX colEnd for field in fields as t in tabStops as w in widths
       when (SETQ val (@ Element %;!\field)) do (COND
                                                   ((OR (NEQ field 'iValue)
                                                        (EQ vFlg 'On))
                                                    (DSPXPOSITION t stream)
                                                    (COND
                                                       [(LISTP val)
                                                        (for item on val
                                                           do (printout stream (CAR item))
                                                              (COND
                                                                 ((CDR item)
                                                                  (printout stream .SP 1]
                                                       (T (printout stream val)))
                                                    (COND
                                                       ([AND (NEQ field 'iValue)
                                                             (IGREATERP (SETQ newX (DSPXPOSITION NIL stream)
                                                                        )
                                                                 (SETQ colEnd (PLUS t w]
                                                        (BITBLT NIL NIL NIL stream colEnd
                                                               (fetch BOTTOM of reg)
                                                               (DIFFERENCE newX colEnd)
                                                               (fetch HEIGHT of reg)
                                                               'TEXTURE
                                                               'REPLACE WHITESHADE])
```

```
(Method ((FolderBrowser ReshapeFn) self Window OldImage ImageReg OldScreenReg dontRESHAPEBYREPAINTFN
)                                                                     . mcf: 18-Mar-88 15.19
   "Specialization"
   (_Super self ReshapeFn Window OldImage ImageReg OldScreenReg T)
   (_ self Repaint NIL NIL)
   (_ self AdjustSubObjRegions Window))


(Method ((FolderBrowser ScrollFn) self XDelta YDelta ContinuousFlg)
                                                                     . TAL 24-Mar-86 01 45
   "If the folder has headings, and we're scrolling vertically, reset the clipping region to exclude the
   headings, then scroll, then fix clipping region"
   [LET (stream headH clip extent)
     (COND
       ((OR (EQ YDelta 0)
            (NOT (@ %:headings)))              (* Use EQ rather than ZEROP as floating zero doesn t mean same thing)
        (_Super ))
       (T (COND
            ((NEQ XDelta 0)
             (_Super self ScrollFn XDelta 0 ContinuousFlg)))
          (SETQ stream (@ %:window))
          (SETQ headH (TIMES -2 (DSPLINEFEED NIL stream)))
          (SETQ clip (DSPCLIPPINGREGION NIL stream))
          (SETQ extent (WINDOWPROP stream 'EXTENT))
          [SETQ YDelta (COND
                         [(FLOATP YDelta)
                          (IDIFFERENCE (fetch PTOP of clip)                                  Page 11
                                 (IPLUS (FIXR (FTIMES (FDIFFERENCE 1.0 YDelta)
                                                      (fetch HEIGHT of extent)))
                                        (fetch BOTTOM of extent]
                         (T (IMAX (IDIFFERENCE (fetch PTOP of clip)
                                         (fetch PTOP of extent))
                                  (IMIN (IDIFFERENCE (fetch TOP of clip)
                                               (fetch BOTTOM of extent))
                                        YDelta]
          (SETQ clip (create REGION using clip))
          (add (fetch HEIGHT of clip)
               (MINUS headH))
          (RESETLST
              [RESETSAVE (DSPCLIPPINGREGION clip stream)
                     (LIST (FUNCTION (LAMBDA NIL
                                       (LET [(r (create REGION using (DSPCLIPPINGREGION NIL stream]
                                         (add (fetch HEIGHT of r)
                                              headH)
                                         (DSPCLIPPINGREGION r stream]
              (_Super self ScrollFn 0 YDelta ContinuousFlg))])


(Method ((FolderBrowser ShapeToFit) self)                   . TAL 29-Sep-85 01:27
   "New method template"
   (_ self PositionBrowser (fetch WIDTH of (@ %:extent))
          (fetch HEIGHT of (@ %:extent))))


(Method ((FolderBrowser ShowValue) self SubObject Value ObjRegions)
                                                                     mcf 23-Dec-87 15.42
   "New method template"
   [LET ([objRegions (OR ObjRegions (FASSOC SubObject (@ %:iValueRegions)]
         (w (@ %:window)))                       (* (SETQ region (create REGION LEFT  left WIDTH
                                                  (IDIFFERENCE (fetch WIDTH of region) left) using region)))
     (COND
       (Value (DSPFILL (fetch subObjectHighlight of objRegions)
                     WHITESHADE
                     'REPLACE w)
              (PRIN1ATBOX Value w (fetch subObjectRegion of objRegions)))
       (T (ShadeRegion w (fetch subObjectHighlight of objRegions)
                 GRAYSHADE1])


(Method ((FolderBrowser ShowValues) self)                   . mcf: 22-Feb-88 15:54
   "Toggle value display associated with folder items Return current setting"
   [LET (ivrs left (valuable (@ %:valuable)))
     (COND
       (valuable (SETQ ivrs (@ %:iValueRegions))
              (COND
                ((EQ valuable 'Off)
                 (bind obj for sub in ivrs do (_ self ShowValue (SETQ obj (fetch subObject of sub))
                                                   (_ obj GetValue)
                                                   sub))
                 (PROG1 (_@ %:valuable 'On)
                        (_ self LayoutFolder)))
                (T (for sub in ivrs do (_ self ShowValue (fetch subObject of sub)
                                             NIL sub))
                   (_@ %:valuable 'Off)]])


(Method ((FolderBrowser UpdateTabStops) self newElementWidths)
                                                                     . TAL 24-Mar-86 03.25
   "New method template"
   (LET ((columnSpace (@ !::ColumnSpace!))
         (widths (@ %:widths))
         tabStops)
     (for w on widths as newW in newElementWidths when (GREATERP newW (CAR w)) do (RPLACA w newW))
     (SETQ tabStops (bind (column _ 0) for w in widths eachtime (add column (IPLUS columnSpace w))
                       collect column))
```

```
  (push tabStops 0)
  (add (CAR (LAST tabStops))
       (MINUS columnSpace))
  (_@ %:tabStops tabStops)))
```

(Method ((FolderBrowser Valuable?) self) . mcf 25-Jun-86 15.00

```
  "New method template"
  (@ |:context:object::Valuable|))
```

(Method ((GrafcetFolderBrowser ConstructTitle) self Object Browsername) . TAL 17-Jan-88 17 58

```
  "Specialization"
  (LET (spawner brows obj (object (OR Object (@ %:object)))
            (fromObj (@ |:context:objectContainer|))
            (otitle (_Super self ConstructTitle Object Browsername)))
    (COND
      ((AND (NOT (_ object InstOf! 'SWNamedObject))
            (SETQ obj fromObj))
                          (* (AND (NOT (_ object InstOf! (QUOTE SWNamedObject)))
                          (SETQ spawner (CAR (@ |:context:spawningContexts|)))
                          (SETQ brows (@ spawner %:myBrowser))
                          (SETQ obj (@ brows %:middleSubObject))))

        (COND
          ((OR (_ obj InstOf! 'GrafcetStep)
               (_ obj InstOf! 'GrafcetProgram))
           (CONCAT (SELECTQ (@ |:context:containerIV|)
                     (settableVars "Vars Set in")
                     (testableVars "Vars Tested in")
                     (sendableMessages
                          "Messages that can be sent by")
                     (receivableMessages
                          "Messages that can be received by")
                     (CONCAT otitle " in"))
                   " "
                   (_ obj QualifiedPrintName)))
          ((_ obj InstOf! 'GrafcetTransition)
           (CONCAT "Vars Tested in " (_ (@ obj %:superObject)
                                        QualifiedPrintName)
                   " Transition"))
          (T otitle)))
      (T otitle))))
```

(Method ((TemplateFolderBrowser AddTemplate) self item) . TAL 31-Aug-86 17:12

```
  "New method template"
  (_ (@ %:context)
     SpawnLinkedContext
     (CAADR item)))
```

(Method ((TemplateFolderBrowser CompileTemplate) self) . mcf 1-Jan-87 16.17 . Compile all the templates in the folder

```
  "This should have the folder do the actual compilation"
  [LET ((folder (@ %:object))
        (CC.ErrorStream (FUNCTION FISCompileError)))
    (DECLARE (SPECVARS CC.ErrorStream))
    (_ self SWPromptPrint "Compiling ...")
    (COND
      ((_ folder CompileTemplates)
       (_ self SWPromptPrint "  OK." 'NOCR))
      (T (_ self SWPromptPrint "  Failed." 'NOCR)]]
```

(Method ((TemplateFolderBrowser ComputeHorizMethodItems) self) . mcf: 31-Aug-86 11 24

```
  "New method template"
  (@ |:object::FolderHorizMethodItems|))
```

(Method ((TemplateFolderBrowser LeftSelection) self) . mcf: 21-Oct-86 11 28 . Specialization

```
  "(_Super self LeftSelection)"
  (COND
    ((_ (CAR (@ |:context:spawningContexts|))
        InstOf
        'ManualMMFSContext)
     (LET (clip sel subObj (window (@ %:window)))
       (COND
         ((SETQ subObj (_ self FindSelectedSubObject window NIL))
          (add (fetch HEIGHT of (SETQ clip (create REGION using (DSPCLIPPINGREGION NIL window]
               (TIMES 2 (DSPLINEFEED NIL window)))
          (RESETLST
            [RESETSAVE (DSPCLIPPINGREGION clip window)
                  (CONSTANT (LIST (FUNCTION (LAMBDA NIL
                                    (DSPCLIPPINGREGION OLDVALUE window]
            (AND (SETQ sel (@ %:selection))
                 (_ self Highlight sel 'Invert))
            (_ self Highlight subObj 'Invert))
          (_@ %:selection subObj)))
                    NIL))))
```

```
(Method ((TemplateFolderBrowser LeftTitleSelection) self)
                                                    . mcf: 21-Oct-86 12:06
                                                    . Specialization
   "(_Super self LeftTitleSelection)"
   [LET (clip (sel (@ selection))
              (window (@ window)))
     (COND
        (sel (add [fetch HEIGHT of (SETQ clip (create REGION using (DSPCLIPPINGREGION NIL window]
                  (TIMES 2 (DSPLINEFEED NIL window)))
             (RESETLST
                [RESETSAVE (DSPCLIPPINGREGION clip window)
                       (CONSTANT (LIST (FUNCTION (LAMBDA NIL
                                            (DSPCLIPPINGREGION OLDVALUE window]
                (_ self Highlight sel 'Invert)
                (_@ selection NIL))])

(Method ((TraceFolderBrowser AddToTrace) self newElement)
                                                    . TAL 24-Mar-86 03 44
   "New method template"
   (LET NIL
     (DECLARE (GLOBALVARS MessageTraceLimit))
     (COND
        ((AND MessageTraceLimit (IGREATERP (@ %:itemCount)
                                           MessageTraceLimit))
         (_ self TruncateElements)))
     (_ self AppendElement newElement)
     (add (@ %:itemCount)
          1)))

(Method ((TraceFolderBrowser AppendElement) self element)
                                                    . exerciser 21-Mar-88 09:54
   "New method template"
   [LET (clip extent changeFlg bClip bExtent reg (stream (@ %:window))
              (widths (_ self ComputeElementWidths element)))
     (_@ |:object:elements| (change (@ %:elements)
                                    (NCONC1 DATUM element)))
     (SETQ clip (DSPCLIPPINGREGION NIL stream))
     (SETQ changeFlg (NOT (_ self CheckWidths widths)))
     (COND
        (changeFlg (_ self UpdateTabStops widths)))
     (_ self LayoutRegions)
     [SETQ reg (fetch subObjectRegion of (CAR (LAST (@ %:subObjectRegions)]
                                                    (* newly appended element is now in the last position)
     (SETQ extent (@ %:extent))
     (COND
        (changeFlg (_ self Repaint)))
     (COND
        ((ILEQ (SETQ bClip (fetch BOTTOM of clip))
               (SETQ bExtent (fetch BOTTOM of extent)))    (* White space currently available)
         (_ self RepaintElement element reg NIL stream)
         (_ self DrawSeparators NIL stream))
        ((LESSP bClip (fetch PTOP of reg))                  (* Only part of a line is available)
                                                            (* (_ self RepaintElement element NIL NIL))
         (_ self RepaintElement element reg NIL stream)
         (_ self DrawSeparators NIL stream)
         (_ self ScrollFn 0 (IDIFFERENCE bClip bExtent)))
        (T                                                  (* No space available, only scrolling is required)
           (_ self ScrollFn 0 (IDIFFERENCE bClip bExtent))])

(Method ((TraceFolderBrowser Browse) self context object)
                                                    mcf: 11 Jul-86 15 16
   "Specialization"
   (_Super self Browse context object)
   (_ (@ %:context)
      StartTrace))

(Method ((TraceFolderBrowser ClearFolder) self)     mcf: 14-Jul-86 09 50
   "Specialization"
   (_Super self ClearFolder)
   (_@ self %:itemCount 0))
```

```
(Method ((TraceFolderBrowser ConstructTitle) self object browsername)
                                                    . mcf: 18-Dec-86 10.55
   "Specialization"
   (LET (addendum corres title (filter (@ self |:context:filter|)))
     (SETQ title (_Super self ConstructTitle object browsername))
     (SETQ addendum (for field in (@ filter |::TitleIVs|) thereis (@ filter %:!\field)))
     [COND
        ((SETQ addendum (@ filter |:!\addendum:,Title|))
         (SETQ title (CONCAT title addendum]
     [COND
        ((AND (SETQ corres (@ filter %:correspondent))
              (EQ 1 (LENGTH corres)))
         (SETQ title (CONCAT title " with " (CAR corres]
     title))
```

```
(Method ((TraceFolderBrowser Destroy) self)                    . edited: 7-Dec-85 21 10
   "Specialization"
   (LET ((context (@ %:context)))
     (COND
       ((NOT (DestroyedObject? context))
         (_ context StopTrace)))
     (_Super self Destroy)))


(Method ((TraceFolderBrowser TruncateElements) self)
                                                                 . mcf 31-Jul-86 18 08
   "Remove excess (ie. greater than MessageTraceLimit) elements from the browser"
   (DECLARE (GLOBALVARS MessageTraceLimit))
   [LET (itemcount subobjs adjust (groupsize (@ %:groupSize))
              (extent (@ %:extent))
              trunc)
     (COND
       ((AND MessageTraceLimit (IGREATERP (SETQ itemcount (@ %:itemCount))
                                          MessageTraceLimit)
             (ZEROP (IREMAINDER (SETQ trunc (IDIFFERENCE itemcount MessageTraceLimit))
                                groupsize)))
         (change (@ %:elements)
                 (NTH DATUM (ADD1 trunc)))
         (change (@ %:subObjectRegions)
                 (NTH DATUM (ADD1 trunc)))
         (WINDOWPROP (@ %:window)
                 'EXTENT
                 (_@ self %:extent (create REGION
                                   HEIGHT _ [IDIFFERENCE (fetch HEIGHT of extent)
                                                  (IPLUS (ITIMES (IQUOTIENT trunc groupsize)
                                                                 (@ |::SeparatorSpace|))
                                                         (ITIMES trunc (FONTHEIGHT (DSPFONT
                                                                                    NIL
                                                                                    (@ %:window)]
                               using extent)))      (* ( @ self %.extent (create REGION HEIGHT
                                                    (IDIFFERENCE (fetch PTOP of (fetch subObjectRegion of
                                                    (CAR (@ %:subObjectRegions)))) (fetch BOTTOM of extent)) using
                                                    extent)))

         (_@ self %:itemCount MessageTraceLimit)])

(\UnbatchMethodDefs) .

(DEFINEQ

(CreateFISFolderSeparator
  [LAMBDA NIL                                                  (* TAL "30-Sep-85 09.10")
    (COND
      ((OR (NOT (BOUNDP 'FISFolderSeparator))
           (NULL FISFolderSeparator)
           (NOT (type? BITMAP FISFolderSeparator))
           (LESSP (BITMAPWIDTH FISFolderSeparator)
                  SCREENWIDTH))
        (SETQ FISFolderSeparator (BITMAPCREATE SCREENWIDTH 1))
        (DRAWCURVE (LIST (CONS 0 0)
                         (CONS SCREENWIDTH 0))
               NIL NIL '(1 2)
               (DSPCREATE FISFolderSeparator]
    FISFolderSeparator])

(FolderBrowserReshapeFn
  [LAMBDA (Window Bitmap Region)                               (* mcf% "26-Jun-86 13.19")
    (LET [(brwsr (WINDOWPROP Window 'LoopsWindow]
      (_ brwsr Repaint NIL NIL)])
```

Page 15

```
(AVSmashItemFn
  [LAMBDA (self varName localSt propName activeVal type)      (* mcf%: "14-Jul-86 09:35")

          (* This is a getFn. The value of this getFn is returned as the value of the enclosing GetValue.)

    (CONS (CAR (GetSuperClassValue self varName propName activeVal))
          localSt])

)

(PUTPROPS FISFolderSeparator GLOBALVAR T)

(PUTPROPS MessageTraceLimit GLOBALVAR T)

(PUTPROPS FISHardTraceLimit GLOBALVAR T)

(RPAQ? MessageTraceLimit 60)

(CreateFISFolderSeparator)

;; Stuff for the mode setting parameters

(RPAQQ FISHardTraceLimit 30)

(DEFINEQ
```

```
(FISTraceLimitFn
  [LAMBDA (Val)                                               (* TAL " 6-Dec-85 13.27")
    (COND
       ((AND (FIXP Val)
             (IGEQ Val FISHardTraceLimit)
             T])
)

[SETQ SWGlobalParameters (APPEND SWGlobalParameters (LIST (create SWParameterDescription
                                                                  SWParmName _ 'MessageTraceLimit
                                                                  SWParmVarName _ 'MessageTraceLimit
                                                                  SWParmTypeTester _ 'FISTraceLimitFn
                                                                  SWParmString _ (CONCAT "a value at least "
                                                                                         FISHardTraceLimit]

(PUTPROPS FISFOLDER FILETYPE :FAKE-COMPILE-FILE)

(PUTPROPS FISFOLDER COPYRIGHT ("Savoir, Inc." 1985 1986 1987 1988))
```

FUNCTION INDEX

GD.BuildTSyll ..................11
GD.FieldSylls ..................12
GD.GDType ......................19
GD.GDTypeArray .................19
GD.GDTypeLength ................20
GD.GDTypeStruct ................19
GD.GDTypeStructAlign ...........20
GD.Setup .......................21
GD.SimpleType? .................20
GD.SyllData ....................12
GD.TypeEqual? ..................20
GDActor.Build ..................2
GDActor.PrintRcvStep ...........3
GDActor.PrintSendStep ..........3
GDArray.Append .................3
GDArray.EqualObj? ..............3
GDArray.Include ................3
GDArray.ObjSize ................3
GDArray.PrintAddr ..............3
GDArray.PrintDecl ..............3
GDArray.PrintElement ...........4
GDArray.PrintElementAddr .......4
GDArray.PrintInit ..............4
GDArray.Search .................4
GDConnTab.Build ................4
GDConnTab.PrintElement .........5
GDConnTab.PrintRcvStep .........5
GDConnTab.PrintSendStep ........6
GDFunction.Print ...............18
GDFunction.PrintAddr ...........18
GDFunction.PrintBody ...........18
GDFunction.PrintDecl ...........18
GDMVarTab.AddSym ...............8
GDMVarTab.Build ................8
GDMVarTab.PrintElement .........8
GDObject.Build .................6
GDObject.Name ..................6
GDObject.NewObj ................6
GDObject.Print .................6
GDObject.PrintAddr .............6
GDObject.PrintDecl .............6
GDObject.PrintInit .............7
GDObject.PrintType .............7
GDPrintString ..................22
GDRcvTab.Build1 ................10
GDSendTab.Build1 ...............11
GDSymTab.Build .................7
GDSymTab.NewSym ................8
GDSymTab.PrintElement ..........8
GDTEffect.Build ................19
GDTEffect.PrintBody ............19
GDTmplTab.Build ................10
GDTmplTab.Print ................10
GDTmplTab.PrintElement .........10
GDTSyllTab.Build ...............11
GDTSyllTab.PrintElement ........11
GDTypeTab.EqualObj? ............9
GDTypeTab.ObjSize ..............9
GDTypeTab.PrintElement .........9
P3.DopeName ....................17
P3.Flag ........................18
P3.IndName .....................17
P3.MacroName ...................17
P3.MakeFile ....................14
P3.PtrName .....................17
P3.StepNumbers .................18
P3.TLDownload ..................14
P3.WriteDope ...................16
P3.WriteInds ...................15
P3.WriteMac ....................17
P3.WriteMacro ..................15
P3.WritePtrs ...................16

VARIABLE INDEX

GDString.Quote ........22
GDTString.ArrayBeg ....21
GDTString.ArrayEnd ....21
GDTString.Char ........21
GDTString.Imm .........21
GDTString.Remote ......21
GDTString.String ......21
GDTString.StructBeg ...21
GDTString.StructEnd ...21
GDTString.UImm ........21
GDTSyllFlags ..........13
GDTSyllSpecs ..........13
GDTypes ...............21
GDTypeVars ............21
P3.CommentCol .........18
P3.CommentFlg .........18
P3.DownloadDir ........18
P3.SmallFlg ...........18
P3.TabCol .............18

CLASS INDEX

GDActor ...........2
GDArray ...........2
GDCollection ......2
GDConnTab .........2
GDFunction .......18
GDGMac ............2
GDMVarTab .........7
GDObject ..........2
GDRcvTab ..........9
GDSendTab .........9
GDSymTab ..........7
GDTEffect ........18
GDTmplTab .........9
GDTSyllTab ........9
GDTypeTab .........7

RECORD INDEX

DopeEntry .............14
GDConn ................7
GDElement .............7
GDSym .................7
GDTemplate ............13
GDTSyll ...............13
GDTSyllSpec ...........13
GDType ................19

MACRO INDEX

GDStringChar .........:22

```
    changes to:  (METHODS GDConnTab.PrintElement GDObject.Name)
                 (FNS GDConnTab.PrintElement GD.FieldSylls GDObject.Name P3.TLDownload)
                 (CLASSES GDMVarTab GDTypeTab GDTmplTab GDTSyllTab)
                 (VARS FISDOWNLOADCOMS)

 previous date:   7-Apr-88 18:43:23  {DSK}<LISPFILES>FIS>FISDOWNLOAD.;40

    Read Table:  OLD-INTERLISP-FILE

       Package:  INTERLISP
```

(* * Copyright (c) 1987, 1988 by Savoir, Inc. All rights reserved.)

```
(RPAQQ FISDOWNLOADCOMS
       [(COMS (CLASSES)
              (METHODS)
              (RECORDS)
              (FNS)
              (MACROS)
              (VARS P3.SmallFlg))
        (COMS (CLASSES GDActor GDArray GDCollection GDConnTab GDGMac GDObject)
              (METHODS GDActor.Build GDActor.PrintRcvStep GDActor.PrintSendStep GDArray.Append
                     GDArray.EqualObj? GDArray.Include GDArray.ObjSize GDArray.PrintAddr GDArray.PrintDecl
                     GDArray.PrintElement GDArray.PrintElementAddr GDArray.PrintInit GDArray.Search
                     GDConnTab.Build GDConnTab.PrintElement GDConnTab.PrintRcvStep GDConnTab.PrintSendStep
                     GDObject.Build GDObject.Name GDObject.NewObj GDObject.Print GDObject.PrintAddr
                     GDObject.PrintDecl GDObject.PrintInit GDObject.PrintType)
              (RECORDS GDConn GDElement))
```

```
        (COMS (* * Symbol table, Msgvar table, Type table)
              (RECORDS GDSym)
              (CLASSES GDSymTab GDMVarTab GDTypeTab)
              (METHODS GDSymTab.Build GDSymTab.NewSym GDSymTab.PrintElement GDMVarTab.Build GDMVarTab.AddSym
                     GDMVarTab.PrintElement GDTypeTab.EqualObj? GDTypeTab.ObjSize GDTypeTab.PrintElement))
        (COMS (* * Templates)
              (CLASSES GDTmplTab GDRcvTab GDSendTab GDTSyllTab)
              (METHODS GDTmplTab.Build GDTmplTab.Print GDTmplTab.PrintElement GDRcvTab.Build1
                     GDSendTab.Build1 GDTSyllTab.Build GDTSyllTab.PrintElement)
              (FNS GD.BuildTSyll GD.SyllData GD.FieldSylls)
              (RECORDS GDTemplate GDTSyll GDTSyllSpec)
              (VARS GDTSyllSpecs GDTSyllFlags))
        (COMS (RECORDS DopeEntry)
              (FNS P3.TLDownload P3.MakeFile P3.WriteMacro P3.WriteInds P3.WritePtrs P3.WriteDope P3.writeMac
                   P3.DopeName P3.IndName P3.MacroName P3.PtrName P3.Flag P3.StepNumbers)
              (INITVARS (P3.SmallFlg NIL)
                     (P3.CommentFlg T)
                     (P3.CommentCol 40)
                     (P3.TabCol 4)
                     (P3.DownloadDir "C:\GRAFCET\"))
              (GLOBALVARS P3.SmallFlg P3.CommentFlg P3.CommentCol P3.TabCol))
        (COMS (* * Fns)
              (CLASSES GDFunction GDTEffect)
              (METHODS GDFunction.Print GDFunction.PrintAddr GDFunction.PrintBody GDFunction.PrintDecl
                     GDTEffect.Build GDTEffect.PrintBody))
        [COMS (* * Type descriptions)
              (RECORDS GDType)
              (FNS GD.GDType GD.GDTypeArray GD.GDTypeStruct GD.GDTypeStructAlign GD.SimpleType? GD.TypeEqual?
                   GD.GDTypeLength)
              (VARS * GDTypeVars)
              (GLOBALVARS * (MAPCAR GDTypeVars (FUNCTION CAR]
        (COMS (* *)
              (FNS GD.Setup GDPrintString)
              (MACROS GDStringChar)
              (VARS (GDString.Quote "%""))
              (GLOBALVARS GDString.Quote)
              (P (GD.Setup]))

(DECLARE: EVAL@COMPILE)

(DECLARE: EVAL@COMPILE)

(RPAQQ P3.SmallFlg T)

[DEFCLASS GDActor (MetaClass Class Edited:                    (* TAL " 3-Feb-88 05:58"))          Page 2
       (Supers GDObject)
       (InstanceVariables (gdProg NIL)
              (gdLabel NIL)
              (gdTypeTab NIL)
              (gdSymTab NIL)
              (gdConnTab NIL)
              (gdLabelNumbers NIL doc                          (* AList for generating unique labels)]

(DEFCLASS GDArray (MetaClass Class Edited:                    (* TAL "10-Feb-88 12.26"))
       (Supers GDCollection)
       (ClassVariables (GDZeroTerminate NIL)
              (GDZeroStart NIL))
       (InstanceVariables (gdElements NIL)
              (gdSize 0)))

(DEFCLASS GDCollection (MetaClass Class Edited:               (* TAL "26-Aug-87 03:53"))
       (Supers GDObject))

(DEFCLASS GDConnTab (MetaClass Class Edited:                  (* TAL "10-Feb-88 12.26"))
       (Supers GDArray)
       (ClassVariables (GDCType "_CONNEX")
              (GDNamePrefix "_CONN_")
              (GDZeroTerminate T)
              (GDZeroStart T)))

(DEFCLASS GDGMac (MetaClass Class Edited:                     (* TAL "26-Aug-87 04.19"))
       (Supers GDObject))

(DEFCLASS GDObject (MetaClass Class Edited:                   (* TAL " 3-Feb-88 06.38"))
       (Supers Object)
       (ClassVariables (GDCType NIL doc                        (* C type string))
              (GDNamePrefix NIL doc                            (* Defaults to GDCType))
              (GDStatic T doc                                  (* Include "static" in def))
              (GDNumbered NIL doc                              (* Names gets unique numbers if T)))
       (InstanceVariables (gdName NIL)))

(DEFINEQ

(GDActor.Build
  (Method ((GDActor Build)
           self prog progLabel s)                              (* TAL "21-Mar-88 17.57")
                                                               (* New method template)
                                     (LET ((label (OR progLabel (@ prog :printName)))
                                           typeTab symTab connTab (tnum 0)
                                           (spnum 0)
                                           connLen)
                                          (DECLARE (SPECVARS tnum spnum))
                                          (change (@ :gdLabel)
                                                  label)
                                          (change (@ :gdProg)
                                                  prog)
```

```
(change (@ :gdTypeTab)
        (SETQ typeTab (_ self NewObj ($ GDTypeTab)
                                     self)))
(change (@ :gdSymTab)
        (SETQ symTab (_ self NewObj ($ GDSymTab)
                                    self)))
(change (@ :gdConnTab)
        (SETQ connTab (_ self NewObj ($ GDConnTab)
                                     self)))
(printout s "/* " (OR progLabel "")
        " Generated "
        (DATE)
        " from "
        (@ prog :printName)
        " */" T T)
(printout s "#include %"actor.h%"" T "typedef char bool;" T "typedef char
        character;" T T)
(_ typeTab Print s)
(for x in (_ prog FindAllMacroPrograms) as i from 1
   do (P3.WriteMacro x s self i))
(_ symTab Print s)
(_ connTab Print s)       (* (SETQ connLen (P3 WriteConntab prog s)))
(printout s T T "_GMAIN_PROGRAM " label " = { &_MAC__MAIN, ")
(_ connTab PrintAddr s)
(printout s ", " (@ connTab :gdSize)
        ", ")
(_ symTab PrintAddr s)
(printout s "};" T))))
```

Page 3

(GDActor.PrintRcvStep

```
(Method ((GDActor PrintRcvStep)
         self step s fnName)                    (* TAL "15-Mar-88 17 21")
                                                (* New method template)
        (_ (@ :gdConnTab)
           PrintRcvStep
           (MKATOM (@ step :label))
           s fnName (COND
                      ((_ step HasIV (QUOTE singleShot))
                       (P3.Flag (@ step :singleShot)))
                      (T 0)))))
```

(GDActor.PrintSendStep

```
(Method ((GDActor PrintSendStep)
         self step s)                           (* TAL " 9-Feb-88 12.06")
                                                (* New method template)
        (_ (@ :gdConnTab)
           PrintSendStep
           (MKATOM (@ step :label))
           s)))
```

(GDArray.Append

```
(Method ((GDArray Append)
         self obj)                              (* TAL " 2-Feb-88 07 23")
                                                (* New method template)
        (LET ((off (@ :gdSize))
              ele)
          (SETQ ele (create GDElement
                            GDEleObj _ obj
                            GDEleID _ off))
          (cnconc1 (@ :gdElements)
                   ele)
          (change (@ :gdSize)
                  (PLUS off (_ self ObjSize obj)))
          off)))
```

(GDArray.EqualObj?

```
(Method ((GDArray EqualObj?)
         self obj1 obj2)                        (* TAL " 2-Feb-88 04 08")
                                                (* New method template)
        (EQUAL obj1 obj2)))
```

(GDArray.Include

```
(Method ((GDArray Include)
         self obj)                              (* TAL " 2-Feb-88 04 01")
                                                (* New method template)
        (OR (_ self Search obj)
            (_ self Append obj))))
```

(GDArray.ObjSize

```
(Method ((GDArray ObjSize)
         self obj)                              (* TAL " 2 Feb-88 04 22")
                                                (* New method template)
        1))
```

(GDArray.PrintAddr

```
(Method ((GDArray PrintAddr)
         self s)                                (* TAL " 3-Feb-88 03.04")
                                                (* Specialization)
        (printout s (@ :gdName))))
```

(GDArray.PrintDecl

```
(Method ((GDArray PrintDecl)
         self s)                                    (* TAL " 3-Feb-88 02.46")
                                                    (* Adds "[]" to array declaration)
                 (_Super self PrintDecl s)
                 (printout s "[]")))
```

(GDArray.PrintElement

```
(Method ((GDArray PrintElement)
         self ele s)                                (* TAL " 2-Feb-88 05.17")
                                                    (* New method template)
                    self))
```

(GDArray.PrintElementAddr

```
(Method ((GDArray PrintElementAddr)
         self id strm)                              (* TAL " 2-Feb-88 04:48")
                                                    (* New method template)
                     (printout strm "&" (@ :gdName)
                            "[" id "]")))
```

(GDArray.PrintInit

```
(Method ((GDArray PrintInit)
         self s)                                    (* TAL "10-Feb-88 12:43")
                                                    (* Do PrintElement for all elements)
                 (LET (flg)
                   (printout s "{")
                   (COND
                      ((@ ::GDZeroStart)
                       (SETQ flg T)                 (* This is wrong for scalar arrays)
                       (printout s "{0},")))
                   (for x in (@ :gdElements) do (_ self PrintElement x s)
                                                (printout s ","))
                   (COND
                      ((@ ::GDZeroTerminate)
                       (SETQ flg T)                 (* This is wrong for scalar arrays)
                       (printout s "{0} ")))
                   (COND
                      ((AND (NOT flg) .
                            (NOT (@ :gdElements)))  (* Compiler doesn't like empty initializers)
                       (printout s "0")))
                   (printout s "}"))))
```

(GDArray.Search

```
(Method ((GDArray Search)
         self obj)                                  (* TAL " 2-Feb-88 04:07")
                                                    (* New method template)
                 (for x in (@ :gdElements) thereis (_ self EqualObj? obj (fetch GDEleObj of x)) then
                                                   (fetch GDEleID of x))))
```

(GDConnTab.Build

```
(Method ((GDConnTab Build)
         self actor spec folder)                    (* TAL " 8-Feb-88 16.39")
                                                    (* Specialization)
                          (LET* ((prog (@ actor :gdProg))
                                 (folder (@ prog :mapAssociations))
                                 conn sendFolder rcvFolder)
                            (for spec in (AND (ObjectExists? folder)
                                              (@ folder :elements))
                               do (SETQ conn (create GDConn
                                                     GDCAssSpec _ spec))
                                  [COND
                                     ((NOT (STRING-EQUAL "RAW" (@ spec :msgType)))
                                      [COND
                                         ((SETQ sendFolder (FISTemplatesForSender (@ spec :local)
                                                                   NIL prog))
                                          (change (fetch GDCSendTab of conn)
                                                  (_ self NewObj ($ GDSendTab)
                                                         actor spec sendFolder)]
                                      (COND
                                         ((SETQ rcvFolder (FISTemplatesForReceiver (@ spec :local)
                                                                  NIL prog))
                                          (change (fetch GDCRcvTab of conn)
                                                  (_ self NewObj ($ GDRcvTab)
                                                         actor spec rcvFolder)]
                                  (_ self Append conn)) .
                          self)))
```

(GDConnTab.PrintElement

```
(Method ((GDConnTab PrintElement)
         self ele s)                                (* TAL " 3-Jun-88 17 13")
                                                    (* Specialization)
                    (LET* ((conn (fetch GDEleObj of ele))
                           (spec (fetch GDCAssSpec of conn))
                           (autoFlg (U-CASE (@ spec autoAssoc)))
                           [netType (COND
                                       ((_ spec HasIV (QUOTE netType))
                                        (@ spec netType))
                                       (T (QUOTE IMS]
                           tmp)
                      (COND
```

```
    ([NULL (FMEMB autoFlg (QUOTE (N NO ASSOC RESPOND]
     (printout (FISGetCompileErrorStream)
            "Warning: AutoAssoc flag may not be set right for "
            (@ spec :local)
            " - "
            (@ spec :remote)
            " connection." T)))
 (printout s .TAB0 P3.TabCol "(" (COND
                                    ((STRING-EQUAL netType "MAP")
                                     "_NET_MAP")
                                    (T "_NET_IMS"))
        ","
        (COND
           ((STRING-EQUAL "RAW" (@ spec :msgType))
            "_MSG_RAW")
           (T "_MSG_MMFS"))
        ",")
 (GDPrintString s (@ spec :local)
        T)
 (printout s ",")
 (GDPrintString s (@ spec :remote)
        T)
 (printout s ",")
 (GDPrintString s (OR (@ spec :localAKA)
                      "")
        T)
 (printout s "," (P3.Flag (EQ autoFlg (QUOTE ASSOC)))
        ","
        (P3.Flag (EQ autoFlg (QUOTE RESPOND)))
        ","
        (COND
           ((@ spec :connectionVariable)
            (CONCAT "&" (@ spec :connectionVariable)))
           (T 0))
        ",")
 (COND
    ((SETQ tmp (fetch GDCSendTab of conn))
     (_ tmp PrintAddr s))
    (T (printout s "0")))
 (printout s ",")
 (COND
    ((SETQ tmp (fetch GDCRcvTab of conn))
     (_ tmp PrintAddr s))
    (T (printout s "0")))
 (printout s "}"))))
```

(GDConnTab.PrintRcvStep

```
 (Method ((GDConnTab PrintRcvStep)
          self dst s fnName flags)                    (* TAL "15-Mar-88 17 21")
                                                      (* New method template)
         (LET (connVars)
           (printout s T "/* TEMPLATES */" T)
           (SETQ connVars (bind conn spec for x in (@ :gdElements)
                            eachtime (SETQ conn (fetch GDEleObj of x))
                                     (SETQ spec (fetch GDCAssSpec of conn))
                            when (EQ dst (@ spec :local))
                            collect (_ (fetch GDCRcvTab of conn)
                                       Print s)
                                    (@ spec :connectionVariable)))
           (printout s T "/* END OF TEMPLATES */" T)
           (printout s "static " fnName "(){")
           (for x in connVars
              do (printout s "mmfs_receive(" x "," flags ");" T))
           (printout s "}" T T))))
```

(GDConnTab.PrintSendStep

Page 6

```
 (Method ((GDConnTab PrintSendStep)
          self src s)                                 (* TAL "15-Mar-88 18:10")
                                                      (* New method template)
     (printout s T "/* TEMPLATES */" T)
     (bind conn for x in (@ :gdElements) eachtime (SETQ conn (fetch GDEleObj of x))
        when (EQ src (@ (fetch GDCAssSpec of conn)
                        :local))
        do (_ (fetch GDCSendTab of conn)
              Print s))
     (printout s T "/* END OF TEMPLATES */" T)))
```

(GDObject.Build

```
 (Method ((GDObject Build)
          self actor)                                 (* TAL " 8-Feb-88 16:39")
                                                      (* New method template)
     self))
```

(GDObject.Name

```
 (Method ((GDObject Name)
          self actor)                                 (* TAL "19-May-88 16:06")
                                                      (* New method template)
     [LET ((label (@ actor :gdLabel))
           [prefix (COND
                      ((@ ::GDNamePrefix))
                      (T (CONCAT (@ ::GDCType)
                                 "_"]
           tmp)
```

```
                    (change (@ :gdName)
                          (COND
                             ((@ ::GDNumbered)
                              (COND
                                 [(SETQ tmp (SASSOC prefix (@ actor :gdLabelNumbers)]
                                 (T (SETQ tmp (CONS prefix 0))
                                    (push (@ actor :gdLabelNumbers)
                                          tmp)))
                              (CONCAT prefix (add (CDR tmp)
                                                  1)))
                             (T prefix]))
```

(GDObject.NewObj

```
  (Method ((GDObject NewObj)
          self class actor arg1 arg2 arg3 arg4 arg5)    (* TAL " 3-Feb-88 08:42")
                                                        (* New method template)
                                   (LET ((obj (_ class New)))
                                     (_ obj Name actor)
                                     (_ obj Build actor arg1 arg2 arg3 arg4 arg5)
                                     obj)))
```

(GDObject.Print

```
  (Method ((GDObject Print)
          self s)                                       (* TAL " 3-Feb-88 02:56")
                                                        (* New method template)
                (LET NIL
                  (_ self PrintDecl s)
                  (printout s " = ")
                  (_ self PrintInit s)
                  (printout s ";" T T))))
```

(GDObject.PrintAddr

```
  (Method ((GDObject PrintAddr)
          self s)                                       (* TAL " 3-Feb-88 03:04")
                                                        (* New method template)
                (printout s "&" (@ :gdName))))
```

(GDObject.PrintDecl

```
  (Method ((GDObject PrintDecl)
          self s)                                       (* TAL " 3-Feb-88 03:07")
                                                        (* New method template)
                (COND
                   ((@ ::GDStatic)
                    (printout s "static ")))
                (_ self PrintType s)
                (printout s " " (@ :gdName))))
```

Page 7

(GDObject.PrintInit

```
  (Method ((GDObject PrintInit)
          self s)                                       (* TAL " 3-Feb-88 02:49")
                                                        (* Print initializer, including braces if any)
                (printout s 0)))
```

(GDObject.PrintType

```
  (Method ((GDObject PrintType)
          self strm)                                    (* TAL " 3-Feb-88 02:42")
                                                        (* New method template)
                   (printout strm (@ ::GDCType))))

)

(DECLARE: EVAL@COMPILE

(RECORD GDConn (GDCAssSpec GDCSendFolder GDCRcvFolder GDCSendTab GDCRcvTab))

(RECORD GDElement (GDEleID GDEleObj))
)

          (* * Symbol table, Msgvar table, Type table)

(DECLARE: EVAL@COMPILE

(RECORD GDSym (GDSName GDSType GDSTypeOffset GDSCCType))
)

(DEFCLASS GDSymTab (MetaClass Class Edited:             (* TAL " 3-Feb-88 03:49"))
       (Supers GDArray)
       (ClassVariables (GDCType "_STATE_VAR" doc        (* C type string))
              (GDNamePrefix "_VARS_")
              (GDZeroTerminate T))
       (InstanceVariables (gdTypeTab NIL)))

(DEFCLASS GDMVarTab (MetaClass Class Edited:            (* TAL " 9-Feb-88 12:25"))
       (Supers GDSymTab)
       (ClassVariables (GDCType "_MSGVAR")
              (GDNamePrefix "_MV_")
              (GDZeroTerminate NIL)
              (GDNumbered T)))
```

```
(DEFCLASS GDTypeTab (MetaClass Class Edited:                    (* TAL " 2-Feb-88 04 32"))
       (Supers GDArray)
       (ClassVariables (GDCType "_CTYPE")
              (GDNamePrefix "_CT_")))

(DEFINEQ
```

(GDSymTab.Build

```
  (Method ((GDSymTab Build)
          self actor)                                          (* TAL  8-Feb-88 16 08")
                                                               (* New method template)
                    (LET ((prog (@ actor :gdProg))
                          (typeTab (@ actor :gdTypeTab)))
                      [COND
                         ((NULL (@ prog :cEnv))
                          (ERROR "Program must be compiled before downloading: " (@ prog :printName)]
                      (change (@ :gdTypeTab)
                             typeTab)
                      [for ccID in [SORT (APPEND (@ prog :ids))
                                         (FUNCTION (LAMBDA (x y)
                                                     (UALPHORDER (fetch CCID/ID of x)
                                                            (fetch CCID/ID of y]
                         do (_ self Append (_ self NewSym (fetch CCID/ID of ccID)
                                                     (fetch CCID/Type of ccID)))]
                      self)))
```

Page 6

(GDSymTab.NewSym

```
  (Method ((GDSymTab NewSym)
          self name ccType)                                    (* TAL " 8-Feb-88 16:10")
                                                               (* New method template)
                       (LET ((sym (create GDSym
                                         GDSName _ name
                                         GDSCCType _ ccType))
                             type)
                         (COND
                            [ccType (SETQ type (GD.GDType ccType))
                                   (change (fetch GDSType of sym)
                                          (COND
                                             ((GD.SimpleType? type))
                                             (T (_ (@ :gdTypeTab)
                                                   Include type))]
                            ((STRINGP name)
                             (change (fetch GDSType of sym)
                                    GDTString.String))
                            ((NUMBERP name)
                             (change (fetch GDSType of sym)
                                    GDTString.Imm)))
                         sym)))
```

(GDSymTab.PrintElement

```
  (Method ((GDSymTab PrintElement)
          self ele s)                                          (* TAL "10-Feb-88 16.17")
                                                               (* Specialization)
                    (LET* ((sym (fetch GDEleObj of ele))
                           (typeStringOrIndex (fetch GDSType of sym))
                           rmtFlg)
                      (printout s .TAB0 P3.TabCol "(" (SELECTQ (fetch CCType/Type
                                                                 of (fetch GDSCCType of sym))
                                                        (array (fetch GDSName of sym))
                                                        (CONCAT "&" (fetch GDSName of sym)))
                             ","
                             (COND
                                ((OR (STRINGP typeStringOrIndex)
                                     (LITATOM typeStringOrIndex))
                                 typeStringOrIndex)
                                (T (SETQ rmtFlg T)
                                   GDTString.Remote))
                             ",")
                      (GDPrintString s (MKSTRING (fetch GDSName of sym))
                             T)
                      (printout s ",")
                      (COND
                         (rmtFlg (_ (@ :gdTypeTab)
                                    PrintElementAddr typeStringOrIndex s)))
                      (printout s ")"))))
```

(GDMVarTab.Build

```
  (Method ((GDMVarTab Build)
          self actor)                                          (* TAL " 8-Feb-88 16:41")
                                                               (* Do nothing)
                    (change (@ :gdTypeTab)
                           (@ actor :gdTypeTab))))
```

(GDMVarTab.AddSym

```
  (Method ((GDMVarTab AddSym)
          self varOrVal ccType)                                (* TAL " 8-Feb-88 16.13")
                                                               (* New method template)
                          (_ self Include (_ self NewSym varOrVal ccType))))
```

(GDMVarTab.PrintElement

```
  (Method ((GDMVarTab PrintElement)
          self ele s)                                    (* edited: "12-Feb-88 10.13")
                                                         (* Specialization)
                        (LET* ((sym (fetch GDEleObj of ele))
                               (typeStringOrIndex (fetch GDSType of sym))
                               (var (fetch GDSName of sym))
                               (ccType (fetch GDSCCType of sym))
                               rmtFlg)
                          (printout s .TAB0 P3.TabCol "(")
                          (COND
                            [ccType (printout s (SELECTQ (fetch CCType/Type of ccType)
                                                         (array (fetch GDSName of sym))
                                                         (CONCAT "&" (fetch GDSName of sym]
                            ((STRINGP var)
                             (GDPrintString s var T))
                            (T (printout s "0")))
                          (printout s "," (COND
                                            ((OR (STRINGP typeStringOrIndex)
                                                 (LITATOM typeStringOrIndex))
                                             typeStringOrIndex)
                                            (T (SETQ rmtFlg T)
                                               GDTString.Remote))
                                  ",")
                          (printout s (COND
                                        ((NUMBERP var)
                                         var)
                                        (T 0))
                                  ",")
                          (COND
                            (rmtFlg (_ (@ :gdTypeTab)
                                       PrintElementAddr typeStringOrIndex s)))
                          (printout s "}"))))
```

(GDTypeTab.EqualObj?

```
  (Method ((GDTypeTab EqualObj?)
          self obj1 obj2)                                (* TAL " 2-Feb-88 04 16")
                                                         (* Specialization)
                          (GD.TypeEqual? obj1 obj2)))
```

(GDTypeTab.ObjSize

```
  (Method ((GDTypeTab ObjSize)
          self obj)                                      (* TAL " 2-Feb-88 04.23")
                                                         (* Specialization)
                    (GD.GDTypeLength obj)))
```

(GDTypeTab.PrintElement

```
  (Method ((GDTypeTab PrintElement)
          self ele s)                                    (* TAL " 8-Feb-88 16.55")
                                                         (* Specialization)
                        (LET NIL
                          (printout s .TAB0 P3.TabCol)
                          (bind flg for x in (fetch GDTDesc of (fetch GDEleObj of ele))
                             do (COND
                                    (flg (printout s ","))
                                    (T (SETQ flg T)))
                                (printout s (CAR x)
                                          ","
                                          (OR (CADR x)
                                              "0")))             (* (COND (P3.CommentFlg (printout s .TAB P3.CommentCol " "
                                                                 (fetch GDSName of sym) " " ""))))
                          NIL)))

)

          (* * Templates)

(DEFCLASS GDTmplTab (MetaClass Class Edited:            (* TAL " 9-Feb-88 14 40"))
        (Supers GDArray)
        (ClassVariables (GDCType "_TEMPLATE")
                (GDNamePrefix "_TM_")
                (GDNumbered T)
                (GDZeroTerminate T))
        (InstanceVariables (gdMVarTab NIL)
                (toPrint NIL)))

(DEFCLASS GDRcvTab (MetaClass Class Edited:             (* TAL " 3-Feb-88 06 33"))
        (Supers GDTmplTab))

(DEFCLASS GDSendTab (MetaClass Class Edited:            (* TAL " 3-Feb-88 06.33"))
        (Supers GDTmplTab))

(DEFCLASS GDTSyllTab (MetaClass Class Edited:           (* TAL  9 Feb-88 12.42"))
        (Supers GDArray)
        (ClassVariables (GDCType "_TEMPL_SYLL")
                (GDNamePrefix "_SY_")
                (GDNumbered T)))

(DEFINEQ
```

(GDTmplTab.Build

```
(Method ((GDTmplTab Build)
         self actor spec folder)                    (* TAL " 9-Feb-88 15:40")
                                                    (* Specialization)
                         (LET NIL
                           (change (@ :gdMVarTab)
                                   (_ self NewObj ($ GDMVarTab)
                                           actor))
                           (_ self Build1 actor folder (@ spec :local)
                                   (@ spec :remote))
                           (cnconc1 (@ :toPrint)
                                   (@ :gdMVarTab))
                           self)))
```

(GDTmplTab.Print

```
(Method ((GDTmplTab Print)
         self s)                                    (* TAL " 9-Feb-88 12.28")
                                                    (* Specialization)
         (for x in (@ :toPrint) do (_ x Print s))
         (_Super self Print s)))
```

(GDTmplTab.PrintElement

```
(Method ((GDTmplTab PrintElement)
         self ele s)                                (* TAL " 9-Feb-88 17 11")
                                                    (* Specialization)
           (LET* ((tmpl (fetch GDEleObj of ele))
                  (dq "%"")
                  tmp)
             (printout s .TAB0 P3.TabCol "(")
             (_ (fetch GDTSyll of tmpl)
                PrintAddr s)
             (printout s ",")
             (_ (@ :gdMVarTab)
                PrintAddr s)
             (printout s ",")
             (COND
                ((SETQ tmp (fetch GDTEffect of tmpl))
                 (_ tmp PrintAddr s))
                (T (printout s "0")))
             (printout s "," (fetch GDTNum of tmpl)
                   "}"))))
```

(GDRcvTab.Build1

```
(Method ((GDRcvTab Build1)
         self actor folder local remote)            (* TAL " 9-Feb-88 15:41")
                                                    (* New method template)
         [bind tmp for tmpl in (@ folder :elements)
            when (AND (EQ remote (@ tmpl :source))
                      (EQ local (@ tmpl :destination)))
            do (SETQ tmp (_ self NewObj ($ GDTSyllTab)
                                actor tmpl (QUOTE R)
                                (@ :gdMVarTab)))
               (cnconc1 (@ :toPrint)
                        tmp)
               (_ self Append
                       (create GDTemplate
                               GDTSyll _ tmp
                               GDTNum _ 0
                               GDTEffect _ (COND
                                              ((@ tmpl :action)
                                               (SETQ tmp
                                                (_ self NewObj ($ GDTEffect)
                                                        actor
                                                        (@ tmpl :action)))
                                               (cnconc1 (@ :toPrint)
                                                        tmp)
                                               tmp))))])
```

(GDSendTab.Build1

```
(Method ((GDSendTab Build1)
         self actor folder local remote)            (* TAL " 9-Feb-88 15:41")
                                                    (* New method template)
         [bind tmp for tmpl in (@ folder :elements)
            when (AND (EQ local (@ tmpl :source))
                      (EQ remote (@ tmpl :destination)))
            do (SETQ tmp (_ self NewObj ($ GDTSyllTab)
                                actor tmpl (QUOTE S)
                                (@ :gdMVarTab)))
               (cnconc1 (@ :toPrint)
                        tmp)
               (_ self Append (create GDTemplate
                                      GDTSyll _ tmp
                                      GDTNum _ (@ tmpl :templateID)))])
```

```
(GDTSyllTab.Build
  (Method ((GDTSyllTab Build)
          self actor tmpl s/r mVars)                        (* TAL " 9-Feb-88 14:42")
                                                            (* Specialization)
                              [LET NIL
                                (for field in (@ tmpl :dataDescription)
                                   do (_ self Append (GD.FieldSylls field s/r mVars)))
                                (_ self Append [LIST (create GDTSyll
                                                            GDTSVal _ 0
                                                            GDTSFlags _ (QUOTE (START EOT]])))

(GDTSyllTab.PrintElement
  (Method ((GDTSyllTab PrintElement)
          self ele s)                                       (* TAL " 9-Feb-88 12.44")
                                                            (* Specialization)
                    (LET* ((sylls (fetch GDEleObj of ele))
                           (dq "%"")
                           tmp)
                      (printout s .TAB0 P3.TabCol)
                      (bind flg for syll in sylls
                         do (COND
                              (flg (printout s ","))
                              (T (SETQ flg T)))
                            (printout s "(" (fetch GDTSVal of syll)
                                   ",")
                            [COND
                              (NIL                          (* Eventually compute flag value here)
                              (T (for x in (FISSeparatedList (fetch GDTSFlags of syll)
                                                             " | "
                                                             (OR (CADR (FASSOC X GDTSyllFlags))
                                                                 (SHOULDNT X)))
                                    do (printout s x]
                            (printout s ")")))))

)
(DEFINEQ

(GD.BuildTSyll
  [LAMBDA (type s/r data dType mVars iter?)                 (* TAL " 8-Feb-88 17 47")
    (LET [(syll (create GDTSyll))
          [dataFlg (COND
                     ((NULL data)
                      NIL)
                     ((type? MMFSTemplateData data)
                      (QUOTE VAR))
                     ((OR (NUMBERP data)
                          (STRINGP data))
                      (QUOTE CONST))
                     (T (SHOULDNT]
          (spec (CDR (FASSOC type GDTSyllSpecs]             (* (RECORD GDTSyllSpec (GDTSSFlags GDTSSAct)))
      [SETQ spec (CDR (for x in spec thereis (OR (EQ s/r (CAR x))
                                                 (EQ T (CAR x]
      [SETQ spec (CDR (for x in spec thereis (OR (EQ dataFlg (CAR x))
                                                 (EQ T (CAR x]
      (OR spec (SHOULDNT))
      [COND
        ((EQ (CAR (fetch GDTSSFlags of spec))
             (QUOTE ERROR))
         (ERROR (CADR (fetch GDTSSFlags of spec]
      (change (fetch GDTSFlags of syll)
            (fetch GDTSSFlags of spec))
      [COND
        (iter? (push (fetch GDTSFlags of syll)
                     (QUOTE INDEXED]
      (GD.SyllData syll data dType mVars)
      (for x in (fetch GDTSSAct of spec)
         do (SELECTQ x
                (ID [COND
                      ((EQ data MMFSIDCodeTN)
                       (push (fetch GDTSFlags of syll)
                             (QUOTE TN)))
                      ([FMEMB data (CONSTANT (for x in MMFSGroupers collect (fetch MMFSIDEncoding
                                                                              of (MMFS.DescFromID x]
                       (push (fetch GDTSFlags of syll)
                             (QUOTE GROUPER]))
                NIL))
      syll])

(GD.SyllData
  [LAMBDA (syll data contentType mVars)                     (* TAL " 7-Mar-88 15:02")
    (LET (val remote)
      (COND
        ((NULL data)
         (SETQ val 0))
        ((AND (NUMBERP data)
              (WithinRange? data 0 65535)
              (NOT (SMALLP data)))
         (HELP "It happened!  Call Tom"))
        ((AND (SMALLP data)
              (WithinRange? data 0 65535))
         (SETQ val data))
```

```
        ((type? WMFSTemplateData data)
         (SETQ val (_ mVars AddSym (fetch WMFSTemplateDataName of data)
                          (fetch WMFSTemplateDataType of data)))
         (SETQ remote T))
        ((OR (STRINGP data)
             (NUMBERP data))
         (SETQ val (_ mVars AddSym data NIL))
         (SETQ remote T))
        (T (SHOULDNT)))
      (change (fetch GDTSVal of syll)
              val)
      (COND
         (contentType (push (fetch GDTSFlags of syll)
                            contentType)))
      (COND
         (remote (push (fetch GDTSFlags of syll)
                       (QUOTE REMOTE])
```

(GD.FieldSylls

```
  [LAMBDA (field s/r mVars)                                   (* TAL "27-May-88 10:36")
    (LET* ((id (fetch WMFSFieldID of field))
           (idDesc (WMFS.DescFromCode id))
           sylls iter tmp)
      [COND
         ((SETQ iter (fetch WMFSFieldRpt of field))
          (push sylls (GD.BuildTSyll (QUOTE ITER)
                            s/r iter NIL mVars]
      [COND
         ((SETQ tmp (fetch WMFSFieldOpt of field))
          (push sylls (GD.BuildTSyll (QUOTE OPT)
                            s/r
                            (SELECTQ tmp
                                 (T NIL)
                                 tmp)
                            NIL mVars]
      (push sylls (GD.BuildTSyll (QUOTE ID)
                        s/r id NIL mVars))
      [COND
         ((AND (SETQ tmp (fetch WMFSFieldLen of field))
               (OR (type? WMFSTemplateData tmp)
                   (NOT (type? WMFSTemplateData (fetch WMFSFieldData of field)))
                   (MINUSP tmp)))         (* Do not gen len syl iff it was derived from content variable type)
          (push sylls (GD.BuildTSyll (QUOTE LEN)
                            s/r
                            (COND
                               ((fetch WMFSFieldStreamHack of field)
                                0)
                               ((FIXP tmp)
                                (IABS tmp))
                               (T tmp))
                            NIL mVars]
      [COND
         ((OR (EQ s/r (QUOTE R))
              (fetch WMFSFieldData of field))
          (push sylls (GD.BuildTSyll (QUOTE CONT)
                            s/r
                            (COND
                               ((fetch WMFSFieldStreamHack of field)

         (* We derived content from sum of sizes of stream elements, which may be different in rte)

                                0)
                               (T (fetch WMFSFieldData of field)))
                            (fetch WMFSIDContentType of idDesc)
                            mVars iter]
      (SELECTQ (fetch WMFSIDName of idDesc)
          (DS (for x in (fetch WMFSFieldStream of field)
                 do [COND
                       ((AND (SETQ tmp (fetch WMFSStreamFieldLen of x))
                             (OR (NOT (type? WMFSTemplateData (fetch WMFSStreamFieldData of x)))
                                 (MINUSP tmp)))      (* Do not gen len syl iff it was derived from content variable type)
                        (push sylls (GD.BuildTSyll (QUOTE DSLEN)
                                          s/r
                                          (IABS tmp)
                                          NIL mVars]
                    (push sylls (GD.BuildTSyll (QUOTE DSCONT)
                                      s/r
                                      (fetch WMFSStreamFieldData of x)
                                      NIL mVars))))
          NIL)
      (SETQ sylls (DREVERSE sylls))
      (push (fetch GDTSFlags of (CAR sylls))
            (QUOTE START))
      sylls])
)
(DECLARE: EVAL@COMPILE

(RECORD GDTemplate (GDTSyll GDTEffect GDTNum))

(RECORD GDTSyll (GDTSVal GDTSFlags))

(RECORD GDTSyllSpec (GDTSSFlags GDTSSAct))
)
```

```
(RPAQQ GDTSyllSpecs
       [(ID (R (T (ID MATCH)
                  ID))
            (S (T (ID FETCH)
                  ID)))
        [CONT (R (NIL (CONT))
                 (CONST (CONT MATCH))
                 (VAR (CONT STORE)))
              (S (T (CONT FETCH]
        [LEN (R (CONST (LNTH))
                (VAR (LNTH STORE)))
             (S (T (LNTH FETCH]
        [ITER (T (T (ITER FETCH]
        [OPT (R (NIL (OPT))
                (VAR (OPT STORE))
                (CONST (ERROR "Constant appears as optional field flag, must be var")))
             (S (NIL (ERROR "Must specify flag variable to send optional field"))
                (T (OPT FETCH]
        [DSLEN (R (T (DS DSLEN FETCH)))
               (S (T (DS DSLEN FETCH]
        [DSCONT (R (VAR (DS DSCONT STORE))
                   (T (DS DSCONT)))
                (S (T (DS DSCONT FETCH]
        (EOT (T (T (EOT])

(RPAQQ GDTSyllFlags
       ((ID "_TS_ID" 16384)
        (CONT "_TS_CNTNT" 24576)
        (LNTH "_TS_LNTH" 20480)
        (OPT "_TS_OPT" 8192)
        (ITER "_TS_ITER" 4096)
        (DS "_TS_DS" 28672)
        (DSLEN "_TS_DSLEN" 256)
        (DSCONT "_TS_DSCNT" 512)
        (START "_TS_Start" 32768)
        (REMOTE "_TS_remot" 2048)
        (EOT "_TS_EOT" 0)
        (UI "_TS_UI" 0)
        (Code "_TS_UI" 0)
        (SI "_TS_SI" 256)
        (80 "_TS_80" 512)
        (UD "_TS_UD" 1024)
        (CH "_TS_CH" 1280)
        (GROUPER "_TS_grouper" 1)
        (TN "_TS_trans" 2)
        (FETCH "_TS_fetch" 4)
        (MATCH "_TS_match" 12)
        (STORE "_TS_store" 16)
        (INDEXED "_TS_aray" 32)))

(DECLARE: EVAL@COMPILE

(RECORD DopeEntry (DopeObj                       (* Step or trans. Must be first)
                   DopeInd                       (* Index of this entry in dope vector)
                   DopePtrs                      (* Name or list of names to put in pointer array)
                   DopePtrInd                    (* Index of above in pointer array)
                   DopeIndInd                    (* Index of successors and predecessors in index array)
                   ))
)

(DEFINEQ

(P3.TLDownload
  [LAMBDA (prog)                                 (* TAL "26-Apr-88 21 44")
    (LET (flg)
      (COND
        ((AND (ObjectExists? prog)
              (_ prog InstOf! (QUOTE GrafcetMainProgram)))
         (LET* ((name (@ prog :printName))
                (file (PACKFILENAME (QUOTE NAME)
                                    name
                                    (QUOTE EXTENSION)
                                    "P3"))
                localfile)
           (FISCompileMsg (CONCAT "Building " name FISOneCR))
           [COND
             [(SETQ localfile (P3.MakeFile prog file))
              (FISCompileMsg (CONCAT "Sending " name FISOneCR))
              (SETQ flg (UB.SendFile file (CONCAT P3.DownloadDir (OR (SUBSTRING name 1 7)
                                                                     name)
                                                  "\"
                                                  (OR (SUBSTRING name 1 7)
                                                      name)
                                                  ".P3")
                                     (UBToNSAddr (@ MapNetwork :defaultGateway))
                                     T))
              (DELFILE localfile)
              (COND
                (flg (FISCompileMsg (CONCAT "Finished downloading " name FISOneCR)))
                (T (FISCompileMsg (CONCAT "ERROR: Couldn't send " name FISOneCR]
             (T (FISCompileMsg (CONCAT "ERROR: Couldn't build " name FISOneCR]
           (FISCompileMsg FISOneCR])
```

(P3.MakeFile

```
[LAMBDA (prog file name)                                   (* TAL " 7-Apr-88 17 13")
  (LET ((name "_actor_main")
        (prog (OR (ObjectExists? prog)
                  ($! prog)
                  (ERROR prog " doesn't exist")))
        (actor (_ ($ GDActor)
                  NewTemp))
        s filename)
     (RESETLST
        [RESETSAVE (SETQ s (OPENSTREAM file (QUOTE OUTPUT)))
              (QUOTE (PROGN (CLOSEF s]
        (SETQ filename (FULLNAME s))
        (_ actor Build prog name s))
     filename])
```

(P3.WriteMacro

```
[LAMBDA (prog s actor macNum)                              (* TAL " 5-Apr-88 14:03")
  (LET ((dopeInd 0)
        dopeVec dopeEnt decls fwdRefs)
     (DECLARE (USEDFREE tnum spnum))
     (printout s "/* Macro program " (@ prog :printName)
          " */" T T)
     (COND
        ((AND (SETQ decls (@ prog :cDecls))
              (NEQ 0 (NCHARS decls)))
         (printout s "/* DECLS */" T T decls T T "/* END OF DECLS */" T T)))
     (for step in (@ prog :steps) do (SETQ dopeEnt (create DopeEntry
                                                            DopeObj _ step
                                                            DopeInd _ (add dopeInd 1)))
                                  [replace DopePtrs of dopeEnt
                                     with (COND
                                             ((_ step InstOf! (QUOTE GrafcetMacroStep))
                                              (push fwdRefs (P3.MacroName step))
                                              (CONCAT "&" (P3.MacroName step)))
                                             ((_ step InstOf! (QUOTE GrafcetRegularStep))
                                              (bind part pi name for iv
                                                 in (QUOTE (activation continuous deactivation))
                                                 when (SETQ part (GetValue step iv))
                                                 collect (SETQ name (CONCAT "_SP" (add spnum 1)))
                                                         (printout s "static " name "(){" (@ part :text)
                                                               "}" T)
                                                         name))
                                             ((_ step InstOf! (QUOTE GrafcetSendStep))
                                              (_ actor PrintSendStep step s)
                                              NIL)
                                             ((_ step InstOf! (QUOTE GrafcetReceiveStep))
                                              (LET [(name (CONCAT "_SP" (add spnum 1]
                                                (_ actor PrintRcvStep step s name)
                                                name]
                                  (cnconc1 dopeVec dopeEnt))
     (TERPRI s)
     (bind lab transExprs for trans in (@ prog :transitions)
        do (SETQ dopeEnt (create DopeEntry
                                 DopeObj _ trans
                                 DopeInd _ (add dopeInd 1)))
           [COND
              ((OR (NOT (SETQ lab (@ trans :label)))
                   (EQ 0 (NCHARS lab))
                   (STRING-EQUAL lab "Otherwise")
                   (STRING-EQUAL lab "AnyPrevious")))
              [(AND P3.SmallFlg (for x in transExprs thereis (STREQUAL lab (CAR x)) then
                                                         (replace DopePtrs of dopeEnt with (CADR x]
              (T (replace DopePtrs of dopeEnt with (CONCAT "_TRANS" (add tnum 1)))
                 (printout s "static " (fetch DopePtrs of dopeEnt)
                       "(){return (int)(" lab ");}" T)
                 (COND
                    (P3.SmallFlg (push transExprs (LIST lab (fetch DopePtrs of dopeEnt]
           (cnconc1 dopeVec dopeEnt))
     (printout s T T)
     (P3.WriteInds s prog dopeVec)
     (COND
        (fwdRefs (printout s "_GMACRO")
              (bind (sep _ " ") for x in (DREVERSE fwdRefs) do (printout s sep x)
                                                               (SETQ sep ","))
              (printout s ";" T T)))
     (P3.WritePtrs s prog dopeVec)
     (P3.WriteDope s prog dopeVec)
     (P3.WriteMac s prog dopeVec macNum)
     (printout s "/* End of " (@ prog :printName)
          " */" T T])
```

(P3.WriteInds

```
[LAMBDA (s prog dopeVec)                                   (* TAL " 3 Jun-87 18 56")
  (LET ((ind 1)
        obj)
    (printout s "static short " (P3.IndName prog)
         "[] = {0,")
    [for dopeEnt in dopeVec do (SETQ obj (fetch DopeObj of dopeEnt))
                               (replace DopeIndInd of dopeEnt with ind)
                               [COND
```

```
((_ obj InstOf! (QUOTE GrafcetTransition))
 (printout s .TAB0 P3.TabCol)
 (for x in (@ obj :predecessors)
    do (printout s (fetch DopeInd of (FASSOC x dopevec))
                ",")
       (add ind 1)
     finally (printout s "0,")
             (add ind 1)
             (AND P3.CommentFlg (printout s .TAB P3.CommentCol "/* "
                                          (fetch DopeInd of dopeEnt)
                                          " pred */"]
(printout s .TAB0 P3.TabCol)
(for x in (@ obj :successors) do (printout s (fetch DopeInd
                                                    of (FASSOC x dopeVec))
                                           ",")
                                 (add ind 1)
  finally (printout s "0,")
          (add ind 1)
          (AND P3.CommentFlg (printout s .TAB P3.CommentCol "/* "
                                       (fetch DopeInd of dopeEnt)
                                       " succ */"]
(printout s "};" T T])
```

Page 16

```
(P3.WritePtrs
 [LAMBDA (s prog dopeVec)                                    (* TAL " 3-Jun-87 16:47")
   (LET ((ind 1)
         obj)
     (printout s "static void *" (P3.PtrName prog)
            "[] = {0,")
     [for dopeEnt in dopeVec do (SETQ obj (fetch DopeObj of dopeEnt))
                                (COND
                                   ((fetch DopePtrs of dopeEnt)
                                    (replace DopePtrInd of dopeEnt with ind)
                                    (printout s .TAB0 P3.TabCol)
                                    (for x inside (fetch DopePtrs of dopeEnt) -
                                       do (printout s x ",")
                                          (add ind 1)
                                       finally (AND P3.CommentFlg (printout s .TAB P3.CommentCol "/* "
                                                                   (fetch DopeInd of dopeEnt)
                                                                   " */"]
     (printout s "};" T T])

(P3.WriteDope
 [LAMBDA (s prog dopeVec)                                    (* edited: "11-Feb-88 18:13")
   (printout s "static _GDOPE " (P3.DopeName prog)
          "[] = {{0},")
   [bind obj lab for dopeEnt in dopeVec do (SETQ obj (fetch DopeObj of dopeEnt))
                                            (printout s .TAB0 P3.TabCol "{" (OR (fetch DopePtrInd
                                                                                 of dopeEnt)
                                                                             "0")
                                                   ","
                                                   (fetch DopeIndInd of dopeEnt)
                                                   ",")
                                            (COND
                                               ((_ obj InstOf! (QUOTE GrafcetStep))
                                                (printout s (SELECTQ (@ obj :stepNumber)
                                                                (IN 1)
                                                                (OUT 2)
                                                                (IPLUS 3 (@ obj :stepNumber)))
                                                       ","))
                                               (T (printout s "0,")))
                                            (COND
                                               [(_ obj InstOf! (QUOTE GrafcetTransition))
                                                (SETQ lab (@ obj :label))
                                                (printout s "TY_TRANS,0,0,0,0,0,0," (P3.Flag (STRING-EQUAL
                                                                                               lab
                                                                                               "Otherwise"))
                                                       ","
                                                       (P3.Flag (STRING-EQUAL lab "AnyPrevious"]
                                               ((_ obj InstOf! (QUOTE GrafcetMacroStep))
                                                (printout s "TY_MACRO,0,0,0,0," (P3.Flag (_ obj InstOf!
                                                                                             (QUOTE
                                                                                         GrafcetProcessStep
                                                                                                 )))
                                                       ","
                                                       (P3.Flag (@ obj :firstTrueFlg))
                                                       ",0,0"))
                                               (T (printout s "TY_REGULAR," (P3.Flag (_ obj InstOf!
                                                                                         (QUOTE
                                                                                     GrafcetInitialStep
                                                                                            )))
                                                         ",")
                                                  (COND
                                                     ((_ obj InstOf! (QUOTE GrafcetRegularStep))
                                                      (printout s (P3.Flag (@ obj :activation))
                                                             ","
                                                             (P3.Flag (@ obj :continuous))
                                                             ","
                                                             (P3.Flag (@ obj :deactivation))
                                                             ","))
                                                     ((_ obj InstOf! (QUOTE GrafcetReceiveStep))
                                                      (printout s "0,1,0,"))
                                                     (T (printout s "0,0,0,")))
                                                  (printout s "0," (P3.Flag (@ obj :firstTrueFlg))
                                                         ",0,0")))
```

Page 17

```
                                        (printout s "),")
                                        (COND
                                          (P3.CommentFlg (printout s .TAB P3.CommentCol "/* "
                                                                   (fetch DopeInd of dopeEnt)
                                                                   ",")
                                                [COND
                                                  ((_ obj InstOf! (QUOTE GrafcetMacroStep))
                                                   (printout s "M" (@ obj :stepNumber)))
                                                  ((_ obj InstOf! (QUOTE GrafcetStep))
                                                   (printout s (@ obj :stepNumber)))
                                                  ((_ obj InstOf! (QUOTE GrafcetTransition))
                                                   (printout s (P3.StepNumbers (@ obj :predecessors))
                                                             " -> "
                                                             (P3.StepNumbers (@ obj :successors))]
                                                (printout s " */"]
    (printout s ");" T T])
```

(P3.WriteMac

```
  [LAMBDA (s prog dopeVec macNum)                                    (* TAL " 8-Mar-88 19.28")
    (printout s "_GMACRO " (P3.MacroName prog)
           " = ("
           (P3.DopeName prog)
           ","
           (P3.PtrName prog)
           ","
           (P3.IndName prog)
           ",")
    (COND
      ((_ prog InstOf! (QUOTE GrafcetMacroProgram))
       (printout s (fetch DopeInd of (FASSOC (@ prog :inStep)
                                             dopeVec))
               ","
               (fetch DopeInd of (FASSOC (@ prog :outStep)
                                         dopeVec))
               ","))
      (T (printout s "0,0,")))
    (printout s macNum ",")
    (GDPrintString s (MKSTRING (@ prog :printName))
           T)
    (printout s "," (LENGTH dopeVec)
           ");" T T])
```

(P3.DopeName

```
  [LAMBDA (prog)                                                     (* TAL " 3-Jun-87 01 07")
    (CONCAT "_DOPE_" (@ prog :printName)])
```

(P3.IndName

```
  [LAMBDA (prog)                                                     (* TAL " 2-Jun-87 20:11")
    (CONCAT "_IND_" (@ prog :printName)])
```

(P3.MacroName

```
  [LAMBDA (prog)                                                     (* TAL " 3-Jun-87 17 10")
    (CONCAT "_MAC_" (COND
                      ((_ prog InstOf! (QUOTE GrafcetMainProgram))
                       "_MAIN")
                      ((_ prog InstOf! (QUOTE GrafcetProgram))
                       (@ prog :printName))
                      ((_ prog InstOf! (QUOTE GrafcetMacroStep))
                       (@ prog :label))
                      (T (SHOULDNT])
```

(P3.PtrName

```
  [LAMBDA (prog)                                                     (* TAL " 3-Jun-87 00 38")
    (CONCAT "_PTR_" (@ prog :printName)])
```

Page 18

(P3.Flag

```
  [LAMBDA (pred)                                                     (* TAL " 3-Jun-87 01:06")
    (COND
      (pred "1")
      (T "0")])
```

(P3.StepNumbers

```
  [LAMBDA (steps)                                                    (* TAL " 5-Apr-88 08:37")
    (COND
      ((CDR steps)
       (for x in steps collect (@ x :stepNumber)))
      ((CAR steps)
       (@ (CAR steps)
          :stepNumber))
      (T ""])
)

(RPAQ? P3.SmallFlg NIL)

(RPAQ? P3.CommentFlg T)

(RPAQ? P3.CommentCol 40)
```

```
(RPAQ? P3.TabCol 4)

(RPAQ? P3.DownloadDir "C:\GRAFCET\")

(DECLARE: DOEVAL@COMPILE DONTCOPY

(GLOBALVARS P3.SmallFlg P3.CommentFlg P3.CommentCol P3.TabCol)
)


          (* * Fns)

(DEFCLASS GDFunction (MetaClass Class Edited:                    (* TAL " 8-Feb-88 13.07"))
       (Supers GDObject)
       (ClassVariables (GDNumbered T)))

(DEFCLASS GDTEffect (MetaClass Class Edited:                     (* TAL " 9-Feb-88 15.23"))
       (Supers GDFunction)
       (ClassVariables (GDNamePrefix "_RE_")
              (GDCType "void"))
       (InstanceVariables (cExpr NIL)))

(DEFINEQ

(GDFunction.Print
  (Method ((GDFunction Print)
           self s)                                                (* TAL " 9-Feb-88 15.24")
                                                                  (* New method template)
                    (LET NIL
                      (_ self PrintDecl s)
                      (_ self PrintBody s)
                      (printout s T T))))

(GDFunction.PrintAddr
  (Method ((GDFunction PrintAddr)
           self s)                                                (* TAL " 8-Feb-88 19:49")
                                                                  (* Specialization)
                    (printout s (@ :gdName))))

(GDFunction.PrintBody
  (Method ((GDFunction PrintBody)
           self s)                                                (* TAL " 8-Feb-88 19 43")
                                                                  (* New method template)
                    (printout s "()")))

(GDFunction.PrintDecl
  (Method ((GDFunction PrintDecl)
           self s)                                                (* TAL " 8-Feb-88 19 41")
                                                                  (* Adds "()" to In declaration)
                    (_Super self PrintDecl s)
                    (printout s "()")))

(GDTEffect.Build
  (Method ((GDTEffect Build)
           self actor cExpr)                                      (* TAL " 8-Feb-88 16:39")
                                                                  (* Specialization)
                                (change (@ :cExpr)
                                        cExpr)))

(GDTEffect.PrintBody
  (Method ((GDTEffect PrintBody)
           self s)                                                (* TAL " 9-Feb-88 15:25")
                                                                  (* Specialization)
                    (printout s "{ (" (@ :cExpr)
                           "); }")))
)

          (* * Type descriptions)

(DECLARE: EVAL@COMPILE

(RECORD GDType (GDTSize GDTAlign GDTDesc))
)

(DEFINEQ

(GD.GDType
  [LAMBDA (ccType)                                                (* TAL "27-Aug-87 17 23")
    (LET ((type (fetch CCType/Type of ccType)))
      (OR (SELECTQ type
              ((struct union)
                   (GD.GDTypeStruct ccType))
              (array (GD.GDTypeArray ccType))
              (function (ERROR "GD.GDType called with function type"))
              (CADR (FASSOC type GDTypes)))
          (SHOULDNT type])
```

Page 19

GD.GDTypeArray

```
(GD.GDTypeArray
  [LAMBDA (ccType)                                                (* TAL "28-Aug-87 17 20")
    (LET [(dim (fetch CCType/ArrayDim of ccType))
          (gdType (create GDType using (GD.GDType (fetch CCType/SubType of ccType]
      (change (fetch GDTSize of gdType)
              (TIMES DATUM dim))
      [change (fetch GDTDesc of gdType)
              (COND
                ([AND (LISTP (CAR DATUM))
                      [OR (NULL (CDR DATUM))
                          (STRING-EQUAL GDTString.StructBeg (CAR (CAR DATUM]
                      (OR (NULL (CADR (CAR DATUM)))
                          (EQ 0 (CADR (CAR DATUM]

         (* Can add multiplier to existing desc if either simple or a struct with no multiplier)
                                                                  (* This gets confused by zero element arrays
                                                                  Are they legal?)

                 (BQUOTE ((, (CAR (CAR DATUM))
                             , dim)
                          ,@
                          (CDR DATUM]
                (T                                                (* Otherwise wrap it in array brackets)
                   (BQUOTE ((, GDTString.ArrayBeg , dim)
                            ,@ DATUM (, GDTString.ArrayEnd]
      gdType])
```

GD.GDTypeStruct

```
(GD.GDTypeStruct
  [LAMBDA (ccType)                                                (* TAL "28-Aug-87 14 54")
    (LET ([gdType (create GDType
                         GDTSize _ 0
                         GDTAlign _ 2
                         GDTDesc _ (LIST (LIST GDTString.StructBeg]
          (unionFlg (EQ (fetch CCType/Type of ccType)
                        (QUOTE union)))
          (maxUnion 0)
          descTconc memType maxMemb)
      (SETQ descTconc (LCONC NIL (fetch GDTDesc of gdType)))
      (for x in (fetch CCType/Members of ccType) do (SETQ memType (GD.GDType (CADDR x)))
                                                   (COND
                                                     [unionFlg
                                                               (* If a union, just find the largest member)
                                                               (COND
                                                                 ((IGREATERP (fetch GDTSize of memType)
                                                                             maxUnion)
                                                                  (SETQ maxUnion (fetch GDTSize of memType))
                                                                  (SETQ maxMemb memType]
                                                     (T        (* If struct, add this member to the description)
                                                        (GD.GDTypeStructAlign gdType (fetch GDTAlign
                                                                                            of memType)
                                                                              descTconc)
                                                        (LCONC descTconc (APPEND (fetch GDTDesc
                                                                                        of memType)))
                                                        (add (fetch GDTSize of gdType)
                                                             (fetch GDTSize of memType]
                                                   (change (fetch GDTAlign of gdType)
                                                           (MAX DATUM (fetch GDTAlign of memType)))
                                                               (* Should be LCM, but MAX works for 1, 2, 4)
                                                   )
      [COND
        (unionFlg (LCONC descTconc (APPEND (fetch GDTDesc of maxMemb)))
                  (change (fetch GDTSize of gdType)
                          (fetch GDTSize of maxMemb]
      (GD.GDTypeStructAlign gdType (fetch GDTAlign of gdType)
             descTconc)
      (TCONC descTconc (LIST GDTString.StructEnd))
      gdType])
```

Page 20

GD.GDTypeStructAlign

```
(GD.GDTypeStructAlign
  [LAMBDA (gdType align descTconc)                                (* TAL "28-Aug-87 13.00")

         (* Add padding bytes to the partial structure description in gdType to bring it to the specified alignment
         descTconc is an optional TCONC of the GDTDesc list in gdType)

    (LET ((pad (IMOD (IMINUS (fetch GDTSize of gdType))
                     align)))
      (COND
        ((NEQ 0 pad)
         [COND
           (descTconc (TCONC descTconc (LIST GDTString.Char pad)))
           (T (NCONC1 (fetch GDTDesc of gdType)
                     (LIST GDTString.Char pad]
         (add (fetch GDTSize of gdType)
              pad])
```

GD.SimpleType?

```
(GD.SimpleType?
  [LAMBDA (gdType)                                                (* TAL "31-Aug-87 11 18")

         (* If gdType can be represented without pointing to a remote CTYPE, returns the simple TYPE constant
         All simple types are represented in one syllable, and an explicit iterator always indicates an array)

    (LET ((desc (fetch GDTDesc of gdType)))
      (AND (LISTP (CAR desc))
           (NULL (CDR desc))
```

```
        [OR (NULL (CADR (CAR desc)))
            (EQ 0 (CADR (CAR desc]
        (CAR (CAR desc])
```

(GD.TypeEqual?

```
  [LAMBDA (t1 t2)                                  (* TAL " 2-Feb-88 04.16")
                                                   (* Could be smarter about EQUAL if this gets slow)

    (AND (IEQP (fetch GDTSize of t1)
               (fetch GDTSize of t2))
         (EQ (fetch GDTAlign of t1)
             (fetch GDTAlign of t2))
         (EQUAL (fetch GDTDesc of t1)
                (fetch GDTDesc of t2])
```

(GD.GDTypeLength

```
  [LAMBDA (gdType)                                 (* TAL "13-Jan-88 20:21")
                                                   (* gdType is assumed to be complex)

    (LENGTH (fetch GDTDesc of gdType])

)
```

Page 21

```
(RPAQQ GDTypeVars
       ([GDTypes (QUOTE ([char (1 1 (("_u_char"]
                         [short (2 2 (("_s_short"]
                         [int (2 2 (("_s_int"]
                         [long (4 2 (("_s_long"]
                         [ushort (2 2 (("_u_short"]
                         [uint (2 2 (("_u_int"]
                         [ulong (4 2 (("_u_long"]
                         [float (2 2 (("_s_float"]
                         [double (4 2 (("_s_double"]
                         (pointer (4 2 (("_pointer"]
        (GDTString.ArrayBeg "_BK_beg")
        (GDTString.ArrayEnd "_BK_end")
        (GDTString.StructBeg "_BR_beg")
        (GDTString.StructEnd "_BR_end")
        (GDTString.Char "_u_char")
        (GDTString.String "_string")
        (GDTString.Remote "_remote")
        (GDTString.Imm "_s_immed")
        (GDTString.UImm "_u_immed")))

(RPAQQ GDTypes
       [[char (1 1 (("_u_char"]
        [short (2 2 (("_s_short"]
        [int (2 2 (("_s_int"]
        [long (4 2 (("_s_long"]
        [ushort (2 2 (("_u_short"]
        [uint (2 2 (("_u_int"]
        [ulong (4 2 (("_u_long"]
        [float (2 2 (("_s_float"]
        [double (4 2 (("_s_double"]
        (pointer (4 2 (("_pointer"])

(RPAQ GDTString.ArrayBeg "_BK_beg")

(RPAQ GDTString.ArrayEnd "_BK_end")

(RPAQ GDTString.StructBeg "_BR_beg")

(RPAQ GDTString.StructEnd "_BR_end")

(RPAQ GDTString.Char "_u_char")

(RPAQ GDTString.String "_string")

(RPAQ GDTString.Remote "_remote")

(RPAQ GDTString.Imm "_s_immed")

(RPAQ GDTString.UImm "_u_immed")

(DECLARE: DOEVAL@COMPILE DONTCOPY

(GLOBALVARS GDTypes GDTString.ArrayBeg GDTString.ArrayEnd GDTString.StructBeg GDTString.StructEnd
       GDTString.Char GDTString.String GDTString.Remote GDTString.Imm GDTString.UImm)
)

          (* *)

(DEFINEQ
```

(GD.Setup

```
  [LAMBDA NIL                                      (* TAL " 6-Sep-87 18.42")
    (LET NIL
      (DECLARE (GLOBALVARS GDStringChars))
      (SETQ GDStringChars (ARRAY 256 (QUOTE POINTER)
                                 NIL 0))
      [for range
         in (CHARCODE ((A Z)
                       (a z)
                       (0 9)
                       SP ! %# %% + & * %( %) - _ + = ~ %[ %] %| ; : ( ) . "." < > / ?))
```

```
        do (for x from (OR (NUMBERP range)
                           (CAR range))
               to (OR (NUMBERP range)
                      (CADR range))
               do (SETA GDStringChars x (MKSTRING (CHARACTER x]
     (for x from 0 to 255 when (NULL (ELT GDStringChars x))
        do (SETA GDStringChars x (CONCAT "\" (ConvertNumberToString x (QUOTE (FIX 3 8 T]
```

(GDPrintString

```
  [LAMBDA (stream string width pos)                          (* TAL "10-Feb-88 16.14")
    (LET ([pos (AND width (ADD1 (OR (FIXP pos)
                                    (POSITION stream]
          (width (SELECTQ width
                     (T (LINELENGTH NIL stream))
                     width))
          char)
      (PRIN3 GDString.Quote stream)
      (add pos 1)
      (for i from 1 to (NCHARS string) do (SETQ char (GDStringChar (NTHCHARCODE string i)))
                                          [COND
                                             ((AND width (IGEQ (add pos (NCHARS char))
                                                               width))
                                              (PRIN3 "\" stream)
                                              (TERPRI stream)
                                              (SETQ pos (NCHARS char]
                                          (PRIN3 char stream))
      (PRIN3 GDString.Quote stream)
      (add pos 1)
      (POSITION stream pos)
      NIL])
)

(DECLARE: EVAL@COMPILE

(PUTPROPS GDStringChar MACRO (OPENLAMBDA (char)
                                 (DECLARE (GLOBALVARS GDStringChars))
                                 (ELT GDStringChars char)))
)

(RPAQ GDString.Quote "%"")

(DECLARE: DOEVAL@COMPILE DONTCOPY

(GLOBALVARS GDString.Quote)
)

(GD.Setup)

(PUTPROPS FISDOWNLOAD COPYRIGHT ("Savoir, Inc." 1987 1988))
```

STRUCTURE INDEX

FIS-CPARSE-ERROR ................1 FIS-ERROR .......................1 FIS-SUBPARSE-ERROR ..............1

PROPERTY INDEX

FISERROR ........................1 changes to: (VARS FISERRORCOMS)
(STRUCTURES FIS-CPARSE-ERROR FIS-SUBPARSE-ERROR)

previous date: 5-Aug-88 12:06:19 (POGO:AISNORTH:XEROX)<LIPKIS>FIS>FISERROR.;2

Read Table: INTERLISP

Package: INTERLISP

;; Copyright (c) 1988 by Savoir, Inc All rights reserved.

```
(RPAQQ FISERRORCOMS (;; KEEP THESE IN THE RIGHT ORDER!!
                      (STRUCTURES FIS-ERROR FIS-CPARSE-ERROR FIS-SUBPARSE-ERROR)
                      (PROP FILETYPE FISERROR)))

;; KEEP THESE IN THE RIGHT ORDER!!

(DEFINE-CONDITION FIS-ERROR (CONDITION)
   (CODE MESSAGE)
   (:HANDLE CONDITIONS:INVOKE-DEBUGGER)
   [:REPORT (LAMBDA (Condition Stream)
              (LET (mess)
                (COND
                   ((SETQ mess (FIS-ERROR-MESSAGE Condition))
                    (CL:FORMAT Stream "ERROR:  ~A  ~D" mess (OR (FIS-ERROR-CODE Condition)
                                                                 "")))
                   (T (CL:FORMAT Stream "Condition ~S occurred."])

(DEFINE-CONDITION FIS-CPARSE-ERROR (FIS-ERROR)
   (MESSAGE1 MESSAGE2 LINE-NO))

(DEFINE-CONDITION FIS-SUBPARSE-ERROR (FIS-CPARSE-ERROR)
   (POS))

(PUTPROPS FISERROR FILETYPE :FAKE-COMPILE-FILE)

(PUTPROPS FISERROR COPYRIGHT ("Savoir, Inc." 1988))
```

FUNCTION INDEX

CombineRemoteSystemBrowser.Browse .................9
CombineRemoteSystemBrowser.Connect .................9
CombineRemoteSystemBrowser.ConnRS232 ...............9
CombineRemoteSystemBrowser.Disconnect ..............9
CombineRemoteSystemBrowser.ExitBrowser .............9
CombineRemoteSystemBrowser.TmpPrint ...............10
CombineRemoteSystemContext.ConnectToRTE ...........10
CombineRemoteSystemContext.DisconnectFromRTE ......10
CombineRemoteSystemContext.RTEConnected ...........10
CombineRemoteSystemContext.RTEDisconnected ........10
RemoteActorBrowser.AddStateWindow .................10
RemoteActorBrowser.Attach .........................10
RemoteActorBrowser.ContinueProcess ................10
RemoteActorBrowser.Detach .........................11
RemoteActorBrowser.InitializeManually .............11
RemoteActorBrowser.LoadActor ......................11
RemoteActorBrowser.OneManualScan ..................11
RemoteActorBrowser.RemoveStateWindow ..............11
RemoteActorBrowser.SetFast ........................11
RemoteActorBrowser.SetPulse .......................11
RemoteActorBrowser.StopProcess ....................11
RemoteActorContext.AddingTraceFilter ..............11
RemoteActorContext.Attach .........................12
RemoteActorContext.Attached .......................12
RemoteActorContext.BrowseBrowser? .................12
RemoteActorContext.ChangeDisplayedVars ............12
RemoteActorContext.ClearAllHighlights .............12
RemoteActorContext.ContinueProcess ................12
RemoteActorContext.Detach .........................13
RemoteActorContext.Exit ...........................13
RemoteActorContext.InitActor ......................13
RemoteActorContext.InitializeManually .............13
RemoteActorContext.InitializeState ...............14
RemoteActorContext.LoadProc .......................14
RemoteActorContext.MacroFromNum ...................14
RemoteActorContext.MsgTrace .......................14
RemoteActorContext.OneManualScan ..................14
RemoteActorContext.RemovingTraceFilter ............15
RemoteActorContext.RequestMsgTrace ................15
RemoteActorContext.Reset ..........................15
RemoteActorContext.RTEAckIn .......................15
RemoteActorContext.RTEMsgIn .......................15
RemoteActorContext.RunMode ........................16
RemoteActorContext.ScanDone .......................16
RemoteActorContext.SetStateVariable ...............16
RemoteActorContext.StopProcess ....................16
RemoteActorContext.SummarizeTraceFilters ..........16
RemoteActorContext.Text ...........................17
RemoteActorContext.TmpPrint .......................17
RemoteActorContext.UpdateActiveStepHighlights .....17
RemoteActorContext.VarValues ......................18
RemoteProcessContext.PrintState ...................18
RemoteProcessContext.RTEConnected .................19
RemoteProcessContext.RTEDisconnected ..............19
RemoteProcessContext.RTEMsgIn .....................19
RemoteProcessContext.SendRTE ......................19
RemoteRTE.Attach ..................................19
RemoteRTE.Connect .................................19
RemoteRTE.Connect1 ................................19
RemoteRTE.Detach ..................................20
RemoteRTE.Disconnect ..............................20
RemoteRTE.Disconnect1 .............................20
RemoteRTE.Disconnected ............................21
RemoteRTE.DoAsProcess .............................21
RemoteRTE.MessageReceive ..........................21
RemoteRTE.MsgIgnored ..............................21
RemoteRTE.MsgIn ...................................21
RemoteRTE.ProcEntry ...............................22
RemoteRTE.RS232Input ..............................23
RemoteRTE.RTEAckIn ................................23
RemoteRTE.RTEMsgIn ................................23
RemoteRTE.SendMsg .................................24
RemoteRTE.SendRS232 ...............................24
RemoteRTE.TmpPrint ................................24
RTM.BuildMsg ......................................2
RTM.BuildMsg1 .....................................3
RTM.BuildMsgNull ..................................3
RTM.GetField ......................................4
RTM.GetFloat ......................................4
RTM.GetInt ........................................4
RTM.Init ..........................................5
RTM.InitArgs ......................................6
RTM.ParseMsg ......................................3
RTM.ParseMsg1 .....................................4
RTM.PutField ......................................5
RTM.PutFloat ......................................5
RTM.PutInt ........................................5

VARIABLE INDEX

DarkStepShade ....................6
FISModuleTLMethodItems .........25
FISRemoteModuleTLMethodItems ...25
LightStepShade ...................6
PDEDisconnectBeforeExit .........8
RemoteActorBrowserMenuItems .....8
RTM.ArgTypes ....................6
RTM.IterLimit ...................6
RTM.MaxLen ......................6
RTM.MsgDescs ....................7
RTM.TypeENUMToType ..............6
UB.RTSHost ......................8

CLASS INDEX

CombineRemoteSystemBrowser ......7
CombineRemoteSystemContext ......7
RemoteActorBrowser ..............7
RemoteActorContext ..............8
RemoteProcessContext ............8
RemoteRTE .......................8

RECORD INDEX

RTEProc .........................25
RTMDesc .........................6
RTMDescHash .....................6

MACRO INDEX

RS432BIN ........................24
RS432BOUT .......................24
RS432WOUT .......................24 changes to: (METHODS RemoteActorContext.StopProcess RemoteActorContext.Attach RemoteRTE.Attach RemoteActorContext.RTEMsgIn RemoteActorContext.Attached RemoteActorContext.LoadProc RemoteActorBrowser.LoadActor RemoteActorContext.SummarizeTraceFilters CombineRemoteSystemBrowser.TraceMsgs RemoteActorContext.MsgTrace RemoteActorContext.RemovingTraceFilter RemoteActorContext.RequestMsgTrace RemoteActorContext.AddingTraceFilter RemoteActorContext.RTEAckIn RemoteActorContext.Detach CombineRemoteSystemContext.DisconnectFromRTE RemoteRTE.RS232Input RemoteRTE.Disconnect1 CombineRemoteSystemContext.RTEDisconnected RemoteProcessContext.RTEDisconnected RemoteRTE.Connect1 RemoteRTE.SendRS232 CombineRemoteSystemBrowser.ExitBrowser CombineRemoteSystemBrowser.Connect CombineRemoteSystemContext.ConnectToRTE RemoteRTE.Connect RemoteRTE.SendMsg CombineRemoteSystemBrowser.ConnRS232 CombineRemoteSystemBrowser.Browse RemoteProcessContext.SendRTE RemoteRTE.MessageReceive RemoteRTE.RTEMsgIn RemoteRTE.Disconnected RemoteRTE.Disconnect RemoteProcessContext.PrintState RemoteProcessContext.RTEConnected CombineRemoteSystemContext.RTEConnected)

```
(FNS RemoteActorContext.StopProcess RemoteActorBrowser.LoadActor RemoteActorContext.Attach
     RemoteActorContext.Attached RemoteActorContext.LoadProc RemoteActorContext.RTEMsgIn
     RemoteRTE.Attach RemoteActorContext.SummarizeTraceFilters
     CombineRemoteSystemBrowser.TraceMsgs RemoteActorContext.MsgTrace RTM.Init
     RemoteActorContext.AddingTraceFilter RemoteActorContext.RemovingTraceFilter
     RemoteActorContext.RequestMsgTrace CombineRemoteSystemContext.DisconnectFromRTE
     RemoteActorContext.Detach RemoteActorContext.RTEAckIn RTM.ParseMsg RTM.GetField
     RemoteRTE.RS232Input CombineRemoteSystemBrowser.ExitBrowser
     CombineRemoteSystemContext.RTEDisconnected RemoteProcessContext.RTEDisconnected
     RemoteRTE.Connect1 RemoteRTE.Disconnect1 RemoteRTE.SendRS232
     CombineRemoteSystemBrowser.ConnRS232 CombineRemoteSystemBrowser.Connect
     CombineRemoteSystemContext.ConnectToRTE RemoteRTE.Connect RemoteRTE.SendMsg
     CombineRemoteSystemBrowser.Browse CombineRemoteSystemContext.RTEConnected
     RemoteProcessContext.PrintState RemoteProcessContext.RTEConnected
     RemoteProcessContext.SendRTE RemoteRTE.Disconnect RemoteRTE.Disconnected
     RemoteRTE.MessageReceive RemoteRTE.RTEMsgIn)
(VARS FISREMOTECOMS RTM.ArgTypes RTM.MsgDescs RemoteActorBrowserMenuItems
      POEDisconnectBeforeExit)
(MACROS RS432BIN RS432WOUT RS432BOUT)
(CLASSES RemoteRTE RemoteActorContext)
```

previous date: 8-Apr-88 09:58:12 {DSK}<LISPFILES>FIS>FISREMOTE.;38

Read Table: OLD-INTERLISP-FILE

Package: INTERLISP (* * Copyright (c) 1988 by Savoir, Inc. All rights reserved.)

```
(RPAQQ FISREMOTECOMS
       [(COMS (* * RTE message low level)
              (FNS RTM.BuildMsg RTM.BuildMsg1 RTM.BuildMsgNull RTM.ParseMsg RTM.ParseMsg1 RTM.GetField
                   RTM.GetFloat RTM.GetInt RTM.PutField RTM.PutFloat RTM.PutInt)
              (FNS RTM.Init RTM.InitArgs)
              (RECORDS RTMDesc RTMDescHash)
              (VARS DarkStepShade LightStepShade (RTM.MaxLen 500)
                    (RTM.IterLimit (IDIFFERENCE RTM.MaxLen 8))
                    RTM.TypeENUMToType RTM.ArgTypes RTM.MsgDescs)
              (P (RTM.Init)))
        (COMS (* Catchall)
              (FNS)
              (VARS)
              (RECORDS))
        (COMS (CLASSES CombineRemoteSystemBrowser CombineRemoteSystemContext RemoteActorBrowser
                     RemoteActorContext RemoteProcessContext RemoteRTE)
              (INITVARS (UB.RTSHost NIL)
                     (POEDisconnectBeforeExit T))
              (VARS RemoteActorBrowserMenuItems)
              (METHODS CombineRemoteSystemBrowser.Browse CombineRemoteSystemBrowser.ConnRS232
                     CombineRemoteSystemBrowser.Connect CombineRemoteSystemBrowser.Disconnect
                     CombineRemoteSystemBrowser.ExitBrowser CombineRemoteSystemBrowser.TmpPrint
                     CombineRemoteSystemContext.ConnectToRTE CombineRemoteSystemContext.DisconnectFromRTE
                     CombineRemoteSystemContext.RTEConnected CombineRemoteSystemContext.RTEDisconnected
                     RemoteActorBrowser.AddStateWindow RemoteActorBrowser.Attach
                     RemoteActorBrowser.ContinueProcess RemoteActorBrowser.Detach
                     RemoteActorBrowser.InitializeManually RemoteActorBrowser.LoadActor
                     RemoteActorBrowser.OneManualScan RemoteActorBrowser.RemoveStateWindow
                     RemoteActorBrowser.SetFast RemoteActorBrowser.SetPulse RemoteActorBrowser.StopProcess
                     RemoteActorContext.AddingTraceFilter RemoteActorContext.Attach
                     RemoteActorContext.Attached RemoteActorContext.BrowseBrowser?
                     RemoteActorContext.ChangeDisplayedVars RemoteActorContext.ClearAllHighlights
                     RemoteActorContext.ContinueProcess RemoteActorContext.Detach RemoteActorContext.Exit
                     RemoteActorContext.InitActor RemoteActorContext.InitializeManually
                     RemoteActorContext.InitializeState RemoteActorContext.LoadProc
                     RemoteActorContext.MacroFromNum RemoteActorContext.MsgTrace
                     RemoteActorContext.OneManualScan RemoteActorContext.RTEAckIn RemoteActorContext.RTEMsgIn
                     RemoteActorContext.RemovingTraceFilter RemoteActorContext.RequestMsgTrace
                     RemoteActorContext.Reset RemoteActorContext.RunMode RemoteActorContext.ScanDone
                     RemoteActorContext.SetStateVariable RemoteActorContext.StopProcess
                     RemoteActorContext.SummarizeTraceFilters RemoteActorContext.Text
                     RemoteActorContext.TmpPrint RemoteActorContext.UpdateActiveStepHighlights
                     RemoteActorContext.VarValues RemoteProcessContext.PrintState
                     RemoteProcessContext.RTEConnected RemoteProcessContext.RTEDisconnected
                     RemoteProcessContext.RTEMsgIn RemoteProcessContext.SendRTE RemoteRTE.Attach
                     RemoteRTE.Connect RemoteRTE.Connect1 RemoteRTE.Detach RemoteRTE.Disconnect
                     RemoteRTE.Disconnect1 RemoteRTE.Disconnected RemoteRTE.DoAsProcess
                     RemoteRTE.MessageReceive RemoteRTE.MsgIgnored RemoteRTE.MsgIn RemoteRTE.ProcEntry
                     RemoteRTE.RS232Input RemoteRTE.RTEAckIn RemoteRTE.RTEMsgIn RemoteRTE.SendMsg
                     RemoteRTE.SendRS232 RemoteRTE.TmpPrint)
              (MACROS RS432BIN RS432BOUT RS432WOUT)
              (RECORDS RTEProc))
        (COMS (* Move to FISMODULETL)
              (VARS FISRemoteModuleTLMethodItems (FISModuleTLMethodItems FISRemoteModuleTLMethodItems])
```

```
(* * RTE message low level)

(DEFINEQ
```

```
(RTM.BuildMsg
  [LAMBDA (cmd args vLen)                                          (* TAL "19-Mar-88 18:00")

          (* Returns encoded msg or msgs as string or list of strings. Optional vLen is sum of lengths of variable length args)

    (LET ((desc (fetch RTMDesc of cmd))
          len str vec vec0 res bmeIdx ValueType)
      (DECLARE (GLOBALVARS RTM.MaxLen RTM.IterLimit)
               (SPECVARS ValueType))
      (OR desc (ERROR "Sending unknown remote command:" cmd))
      (SETQ len (fetch RTMLen of desc))
      (SETQ len (COND
                  ((NOT (NUMBERP len))
                   NIL)
                  ((GREATERP len 0)
                   len)
                  (vLen (DIFFERENCE vLen len))
                  (T NIL)))
      (SETQ str (ALLOCSTRING (OR len RTM.MaxLen)
                             0))
      (SETQ vec (FVEC.Create str NIL NIL (FVEC.ConstantBox)))
      (FVEC.Put++ vec (fetch RTMCode of desc))
      [bind x for argType in (fetch RTMArgs of desc) eachtime [COND
                                                                 ((EQ argType (QUOTE BME)))
                                                                 (args (SETQ x (pop args)))
                                                                 (T (ERROR "Insufficient args:"
                                                                           (fetch RTMCmd of desc]

         do (COND
              ((EQ argType (QUOTE BME))
               (SETQ vec0 vec)
               (SETQ bmeIdx (FVEC.Idx vec))
               (FVEC.Put++ vec 1))
              ((NLISTP argType)
               (RTM.PutField vec argType x))
              (T (bind (argLst _ x) while (enable IllBounds => (COND
                                                                  ((NULL iterIdx)
                                                                   (goto TooLong))
                                                                  (T (FVEC.Idx vec iterIdx)
                                                                     (goto IllBounds)))
                                              ArgErr => (goto ArgErr)
                                              (LET (newIdx)
                                                (DECLARE (USEDFREE argLst vec argType))
                                                (bind iterIdx while argLst
                                                   do (RTM.BuildMsg1 vec argType (CAR argLst))
                                                      [COND
                                                        ((GREATERP (SETQ newIdx (FVEC.Idx vec))
                                                                   RTM.IterLimit)
                                                         (Signal (QUOTE IllBounds)))
                                                        (T (SETQ iterIdx newIdx)
                                                           (SETQ argLst (CDR argLst]
                                                   finally (RETURN NIL)))
                                              IllBounds -> T TooLong -> (ERROR "Error building RTM msg -
                                                                                field too long")
                                              ArgErr -> (ERROR $SignalArg$))
                    do (RTM.BuildMsgNull vec argType)
                       (push res (SUBSTRING str 1 (FVEC.Idx vec)
                                            str))
                       (SETQ str (ALLOCSTRING RTM.MaxLen 0))
                       (SETQ vec (FVEC.Create str NIL NIL (FVEC.ConstantBox)))
                       (FVEC.Idx vec0 0)
                       (FRPTQ bmeIdx (FVEC.Put++ vec (FVEC.Get++ vec0)))
                       (FVEC.Put++ vec 0)
                    finally (RTM.BuildMsgNull vec argType)
                          (FVEC.Put vec bmeIdx (LOGOR 2 (FVEC.Get vec bmeIdx)))
                          (COND
                            (res (push res (SUBSTRING str 1 (FVEC.Idx vec)
                                                      str]
      (COND
        (res (DREVERSE res))
        (len str)
        (T (SUBSTRING str 1 (FVEC.Idx vec)
                      str])
```

```
(RTM.BuildMsg1
  [LAMBDA (vec argTypes args)                                      (* TAL "19-Mar-88 17:03")
    (bind x for argType in argTypes eachtime (COND
                                               ((LISTP args)
                                                (SETQ x (pop args)))
                                               (args (SETQ x args)
                                                     (SETQ args NIL))
                                               (T (Signal (QUOTE ArgErr)
                                                          "Insufficient args in iteration")))

       do (COND
            ((LISTP argType)
             (Signal (QUOTE ArgErr)
                     "Nested iterated args not implemented"))
            (T (RTM.PutField vec argType x])

(RTM.BuildMsgNull
  [LAMBDA (vec argTypes)                                           (* TAL "19-Mar-88 15:16")
    (for argType in argTypes do (RTM.PutField vec argType (SELECTQ argType
                                                                ((String Atom)
                                                                 "")
                                                                ((Float32 Float64)
                                                                 0.0)
                                                                0])
```

```
(RTM.ParseMsg
  [LAMBDA (string)                                          (* TAL "18-May-88 18:45")
                                                            (* Returns (BME Cmd  Args))
    (enable IllBounds => (goto IllBounds)
           ArgErr => (goto ArgErr)
           [LET ((vec (FVEC.Create string NIL NIL (FVEC.ConstantBox)))
                 cmd desc args (bme 3)
                 ValueType DataLen)
             (DECLARE (SPECVARS ValueType DataLen))
             (SETQ cmd (FVEC.Get++ vec))
             (SETQ desc (fetch RTMDesc of cmd))
             (COND
                (desc [SETQ args (bind x for argType in (fetch RTMArgs of desc)
                                    unless (COND
                                              ((EQ argType (QUOTE BME))
                                               (SETQ bme (RTM.GetField vec (QUOTE Byte)))
                                               T))
                                    collect (COND
                                               ((LISTP argType)
                                                (RTM.ParseMsg1 vec argType))
                                               (T (RTM.GetField vec argType]
                      (LIST* bme (fetch RTMCmd of desc)
                             args))
                (T                                          (* Unknown msg, return numeric command code)
                   (LIST bme cmd]
           IllBounds -> (LIST NIL "Ill formed RTE message")
           ArgErr -> (ERROR $SignalArg$])
```

Page 4

```
(RTM.ParseMsg1
  [LAMBDA (vec argTypes)                                    (* TAL "19-Mar-88 17:20")
    (COND
       ((CDR argTypes)
        (bind x while [SETQ x (bind arg (nullFlg _ T) for argType in argTypes
                                 eachtime (SETQ arg (RTM.GetField vec argType))
                                          [COND
                                             (nullFlg (OR (NULL arg)
                                                          (ZEROP arg)
                                                          (SETQ nullFlg NIL]
                                 collect arg finally (AND nullFlg (RETURN NIL]
           collect x))
       (T (bind arg eachtime (SETQ arg (RTM.GetField vec (CAR argTypes))) until (OR (NULL arg)
                                                                                    (ZEROP arg))
             collect arg])

(RTM.GetField
  [LAMBDA (vec type)                                        (* TAL "18-May-88 18:53")
    (DECLARE (USEDFREE ValueType DataLen)
           (GLOBALVARS RTM.TypeENUMToType))
    (SELECTQ type
        (Byte (FVEC.Get++ vec))
        (UInt16 (LOGOR (LLSH (FVEC.Get++ vec)
                             8)
                       (FVEC.Get++ vec)))
        (Type (SETQ ValueType (FVEC.Get++ vec)))
        (ValueType (RTM.GetField vec (CDR (FASSOC ValueType RTM.TypeENUMToType))))
        (DataLen (SETQ DataLen (LOGOR (LLSH (FVEC.Get++ vec)
                                            8)
                                      (FVEC.Get++ vec))))
        (Data (COND
                 ((NEQ DataLen 0)
                  (FVEC.GetString vec DataLen))
                 (T "")))
        (Atom [LET ((tmp (FVEC.FindNull vec)))
                (PROG1 (COND
                          ((GREATERP tmp (FVEC.Idx vec))
                           (FVEC.MKATOM vec NIL (SUB1 tmp)))
                          (T NIL))
                       (FVEC.Idx vec (ADD1 tmp)))])
        (String (LET [(tmp (DIFFERENCE (FVEC.FindNull vec)
                                       (FVEC.Idx vec]
                  (PROG1 (COND
                            ((NEQ tmp 0)
                             (FVEC.GetString vec tmp))
                            (T ""))
                         (FVEC.Get++ vec))))
        (UInt32 (RTM.GetInt vec 4))
        (SInt16 (RTM.GetInt vec 2 T))
        (SInt32 (RTM.GetInt vec 4 T))
        (SByte (RTM.GetInt vec 1 T))
        (Float32 (RTM.GetFloat vec 4))
        (Float64 (RTM.GetFloat vec 8))
        (SHOULDNT])

(RTM.GetFloat
  [LAMBDA (vec len)                                         (* TAL "18-Mar-88 13.55")
    (LET [(res (NCREATE (QUOTE FLOATP]                      (* UNDOC)
      (SELECTQ len
          (4 (for i from 0 to 3 do (\PUTBASEBYTE res i (FVEC.Get++ vec))))
          (8 (for i from 0 to 3 do (\PUTBASEBYTE res i (FVEC.Get++ vec)))
             (FVEC.Idx vec (PLUS 4 (FVEC.Idx vec)))                   (* wrong)
             )
          (SHOULDNT))
      res])
```

```
(RTM.GetInt
  [LAMBDA (vec len signed)                                        (* TAL " 2-Mar-88 14:52")
    (LET [(val (COND
                 ((AND signed (GREATERP (FVEC.Get vec)
                                        127))
                  -1)
                 (T 0]
      [FRPTQ len (SETQ val (LOGOR (LSH val 8)
                                  (FVEC.Get++ vec]                (* (COND ((GREATERP val MAX.FIXP) MAX.FIXP)
                                                                  ((LESSP val MIN.FIXP) MIN.FIXP) (T val)))

      val])
```

Page 5

```
(RTM.PutField
  [LAMBDA (vec type val)                                          (* TAL "18-Mar-88 15:15")
    (DECLARE (USEDFREE ValueType)
             (GLOBALVARS RTM.TypeENUMToType))
    (SELECTQ type
        (Byte (FVEC.Put++ vec val))
        (UInt16 (FVEC.Put++ vec (LOGAND (LRSH val 8)
                                        255))
                (FVEC.Put++ vec (LOGAND val 255)))
        (Type (SETQ ValueType val)
              (FVEC.Put++ vec val))
        (ValueType (RTM.PutField vec (CDR (FASSOC ValueType RTM.TypeENUMToType))
                          val))
        ((String Atom)
             (FVEC.PutString vec (MKSTRING val))
             (FVEC.Put++ vec 0))
        (UInt32 (RTM.PutInt vec val 4))
        (SInt16 (RTM.PutInt vec val 2 T))
        (SInt32 (RTM.PutInt vec val 4 T))
        (SByte (FVEC.Put++ vec val))
        (Float32 (RTM.PutFloat vec val 4))
        (Float64 (RTM.PutFloat vec val 8))
        (SHOULDNT])

(RTM.PutFloat
  [LAMBDA (vec val len)                                           (* TAL "18-Mar-88 15:15")
    (LET ((val (FLOAT val)))                                      (* UNDOC)
      (SELECTQ len
          (4 (for i from 0 to 3 do (FVEC.Put++ vec (\GETBASEBYTE val i))))
          (8 (for i from 0 to 3 do (FVEC.Put++ vec (\GETBASEBYTE val i)))
             (FRPTQ 4 (FVEC.Put++ vec 0))                         (* wrong)
             )
          (SHOULDNT))
      NIL])

(RTM.PutInt
  [LAMBDA (vec val len signed)                                    (* TAL " 2-Mar-88 14:44")
    (LET ((val val)
          newIdx)
      [FVEC.Idx vec (SETQ newIdx (PLUS len (FVEC.Idx vec]
      [FRPTQ len (FVEC.--Put vec (LOGAND val 255))
             (COND
                (signed (SETQ val (RSH val 8)))
                (T (SETQ val (LRSH val 8]
      (FVEC.Idx vec newIdx])

)

(DEFINEQ

(RTM.Init
  [LAMBDA NIL                                                     (* TAL "21-May-88 16:44")
                                                                  (* Preprocess the RTM msg descriptions and hash them under their
                                                                  name and code)

    (bind desc for x in RTM.MsgDescs
       do [SETQ desc (create RTMDesc
                             RTMCmd _ (CAR x)
                             RTMCode _ (CADR x)
                             RTMArgs _ (RTM.InitArgs (CADDR x]
          [replace RTMLen of desc with (bind flg len (tot _ 1) for x in (fetch RTMArgs of desc)
                                          do (COND
                                                ((LISTP x)
                                                 (RETURN NIL))
                                                ([NUMBERP (SETQ len (CADR (FASSOC x RTM.ArgTypes]
                                                 (add tot (SELECTQ len
                                                              (0 (SETQ flg T)
                                                                 (SELECTQ x
                                                                     ((String Atom)
                                                                          1)
                                                                     0))
                                                              len)))
                                                (T (SHOULDNT)))
                                          yield (COND
                                                   (flg (MINUS tot))
                                                   (T tot]
          (replace RTMDesc of (fetch RTMCmd of desc) with desc)
          (replace RTMDesc of (fetch RTMCode of desc) with (COPY desc])
```

```
(RTM.InitArgs
  [LAMBDA (lst)                                   (* TAL " 2-Mar-88 17 58")
                                                  (* Process msg argtype list into equivalent structure of base types)
    (for x in lst collect (COND
                            ((LISTP x)
                             (RTM.InitArgs x))
                            (T (bind tmp until [NUMBERP (SETQ tmp (CADR (FASSOC x RTM.ArgTypes]
                                  do (OR (SETQ x tmp)
                                         (SHOULDNT))
                                  yield x])
)
(DECLARE: EVAL@COMPILE

(RECORD RTMDesc (RTMCmd RTMCode RTMArgs RTMLen))

(HASHLINK RTMDescHash (RTMDesc RTMDescHash))
)

(DECLARE: EVAL@COMPILE

(GLOBALVARS RTMDescHash)
)

(SETUPHASHARRAY (QUOTE RTMDescHash)
       NIL)

(RPAQQ DarkStepShade 31710)

(RPAQQ LightStepShade 1025)

(RPAQQ RTM.MaxLen 500)

(RPAQ RTM.IterLimit (IDIFFERENCE RTM.MaxLen 8))

(RPAQQ RTM.TypeENUMToType ((1 . Byte)
                           (2 . UInt16)
                           (4 . UInt32)
                           (9 . SByte)
                           (10 . SInt16)
                           (12 . SInt32)
                           (14 . String)
                           (16 . Float32)
                           (17 . Float64)
                           (0 . Byte)))

(RPAQQ RTM.ArgTypes
       ((Byte 1)
        (SByte 1)
        (UInt16 2)
        (SInt16 2)
        (UInt32 4)
        (SInt32 4)
        (Float32 4)
        (Float64 8)
        (String 0)
        (Atom 0)
        (ValueType 0)
        (Type 1)
        (DataLen 2)
        (Data 0)
        (Value ValueType)
        (Proc Byte)
        (Actor Proc)
        (ProcName String)
        (ActorName ProcName)
        (ProcCommand String)
        (Macro UInt16)
        (Step UInt16)
        (Trans UInt16)
        (VarList Byte)
        (VarName Atom)
        (BME 1)
        (Cmd Byte)
        (Result UInt16)
        (Bool Byte)
        (ScanNum UInt32)))
```

```
(RPAQQ RTM.MsgDescs
       [(Attach 65 (ProcName))
        (Detach 66 (Proc))
        (GetProcName 67 (Proc))
        (GetActorName 68 (Actor))
        (LoadActor 69 (ActorName))
        (ProcStart 70 (ProcName ProcCommand))
        (ProcKill 71 (Proc))
        (GetProcStatus 72 (Proc))
        (GetActorState 73 (Actor Bool Byte Byte))
        (Scan 74 (Actor Byte Byte VarList))
        (Continue 75 (Actor UInt16))
        (Stop 76 (Actor))
        (SetVar 77 (Actor Type Value VarName))
        (GetVar 78 (Actor VarName))
```

```
        (SelVars 79 (Actor VarList BME (VarName)))
        (GetVarList 80 (Actor Byte VarList))
        (GetTrans 81 (Actor Macro Trans))
        (Init 82 (Actor))
        (MsgResp 83 (Proc Byte))
        (Input 84 (Actor String))
        (SetBkpt 85 (Actor Macro Step Byte))
        (SendFile 86 (Byte String))
        (ReceiveFile 87 (Byte String))
        (Exit 88 (Byte))
        (TraceMsgs 89 (Actor Byte Byte Byte)
                (Actor ConnIdx (0 = All)
                       SndWindow RcvWindow (0 = Off)))
        (GetVarNames 90 (Actor VarList))
        (ClrBkpt 91 (Actor Macro Step Byte))
        (GetBkpts 92 (Actor))
        (Ack 96 (Proc Cmd Result))
        (UNUSED 97 (Actor))
        (ProcNames 98 (BME (Proc ProcName)))
        (ActorNames 99 (BME (Actor ActorName)))
        (ProcStarted 100 (Proc Result ProcName))
        (ProcFinished 101 (Proc Result))
        (ProcStatus 102 (Proc Bool Bool Byte))
        (State 103 (Actor ScanNum BME (Macro Step Byte)))
        (StateChange 104 (Actor ScanNum BME (Macro Step Byte)))
        (ScanDone 105 (Actor ScanNum))
        (VarValues 106 (Actor ScanNum BME (Type Value VarName)))
        (TransVal 107 (Actor ScanNum Macro Trans Bool Bool))
        (MsgBox 108 (Proc Type String String))
        (ReqInput 109 (Proc Byte))
        (Text 110 (Proc Byte String))
        (Bkpt 111 (Actor Macro Step))
        (SendingFile 112 (Result Byte String))
        (ReceivingFile 113 (Byte String))
        (ReceivedFile 114 (Result Byte String))
        (Attached 115 (Proc Result ProcName))
        (MsgTrace 116 (Actor Byte Atom Atom Byte UInt16 DataLen Data)
                (Actor Window Src Dest MsgType (0 = RAW 1 = MMFS)
                       Tmpl Len Data))
        (VarNames 117 (Actor VarList BME (VarName)))
        (ActorLoaded 118 (Actor Result ActorName))
        (BkptList 119 (Actor BME (Macro Step Byte])

(RTM.Init)

        (* * Catchall)

(DECLARE: EVAL@COMPILE)

(DEFCLASS CombineRemoteSystemBrowser (MetaClass Class Edited:
                                                        (* TAL " 8-Mar-88 17 47"))
        (Supers CombineFactorySystemBrowser)
        (ClassVariables (PrintName "Remote Execution")
                (MethodItems #,($A (PROGN RemoteActorBrowserMenuItems) EveryFetch NoUpdatePermitted))))

(DEFCLASS CombineRemoteSystemContext (MetaClass Class doc   (* Should be sibling, not subclass of CombineFactorySystemContext)
                                              Edited:       (* TAL "16-Mar-88 14:11")
                                              )
        (Supers CombineFactorySystemContext)
        (ClassVariables (Browser #,($C CombineRemoteSystemBrowser)))
        (InstanceVariables (processContexts NIL)
                (rte NIL)))

(DEFCLASS RemoteActorBrowser (MetaClass Class Edited:      (* TAL "18-Mar-88 17 25"))
        (Supers CombineGrafcetProcessBrowser)
        (InstanceVariables (displayedStateVariables NIL)))

(DEFCLASS RemoteActorContext (MetaClass Class Edited:      (* TAL "28-Apr-88 16:18"))
        (Supers RemoteProcessContext RunActorContext)
        (ClassVariables (Browser #,($C RemoteActorBrowser))
                (InitialActions (InitActor)))
        (InstanceVariables (running NIL doc                (* NIL T or Pulse))
                (updateMode Time doc                       (* NIL Scan or Time))
                (scanNum 0)
                (scanDelay 0)
                (program #,($A object GetFromIV NoUpdatePermitted))
                (macroHash NIL)))

(DEFCLASS RemoteProcessContext (MetaClass Class Edited:    (* TAL " 7-Mar-88 01:23"))
        (Supers DefaultContext)
        (InstanceVariables (rte NIL)
                (procNum NIL)))

(DEFCLASS RemoteRTE (MetaClass Class doc                   (* Local representation of a runtime engine)
                             Edited:                       (* TAL "17-May-88 12.49")
                             )
        (Supers WorkstationObject)
        (InstanceVariables (conn NIL)
                (procMap #,($A (HASHARRAY 6) FirstFetch ReplaceMe))
                (connStat NIL)
                (owners NIL doc                            (* people using me))
                (gateway #,($A (PROGN UB.RTSHost) EveryFetch ReplaceMe))
                (rteName "_RTS")
                (pdeName "_PDE")))

(RPAQ? UB.RTSHost NIL)
```

```
(RPAQ? PDEDisconnectBeforeExit T)

(RPAQQ RemoteActorBrowserMenuItems
       [(Connect Connect "Open connection to remote supervisor" (SUBITEMS (RS232 ConnRS232 "Open RS232
                                                                                  connection to remote
                                                                                  supervisor")
                                                                          (Disconnect Disconnect "Close
                                                                                connection to remote
                                                                                supervisor")))
        (Attach (Attach SendToCurrentOnes)
               "Attach actor(s)"
               (SUBITEMS (Detach (Detach SendToCurrentOnes)
                                 "Detach from actor(s)")
                         (Load (LoadActor SendToCurrentOnes)
                               "Load and attach actor(s)")))
        (Initialize (InitializeManually SendToCurrentOnes)
               "Reset to initial conditions"
               (SUBITEMS ("Initialize Trace" InitializeTrace "Initialize (or set up) the Device Control and
                                 Trace windows")))
        (Stop (StopProcess SendToCurrentOnes)
              "Stop the process")
        (Continue (ContinueProcess SendToCurrentOnes)
               "Continue the process from the current state"
               (SUBITEMS ("Pulse mode" (SetPulse SendToCurrentOnes)
                                 "Set run mode to pulse.")
                         ("Fast mode" (SetFast SendToCurrentOnes)
                               "Set run mode to fast.")))
        (One% Scan (OneManualScan SendToCurrentOnes)
               "Execute a single scan and stop")
        (State (ToggleStateDisplay SendToSelectOne)
               "Display the process's interesting state variables and their values.
               or turn off the display if already there"
               (SUBITEMS ("Selected Variables" (ShowSelectedState SendToSelectOne)
                                 "Display the process's interesting state variables and their values")
                         ("All Variables" (ShowAllState SendToSelectOne)
                               "Display all of the process's state variables and their values")
                         ("Create Display" (CreateStateDisplay SendToSelectOne)
                               "Create a display of state variables selected from a menu")
                         ("Set Selection" (InstallSelection SendToSelectOne)
                               "Select a set of state variables to use in the default state variable display"];

(DEFINEQ
```

(CombineRemoteSystemBrowser.Browse

```
  (Method ((CombineRemoteSystemBrowser Browse)
           self context object)                              (* TAL "28-Apr-88 14:20")
                                                             (* Specialization)
                          [LET ((ctx (@ :context))
                                brwsrs cntxts window)
                            (COND
                              ((@ :processLst)
                               (RESETLST
                                 (RESETSAVE (CURSOR WAITINGCURSOR))
                                 (SETQ cntxts (for p in (@ :processLst)
                                                 collect (_ ctx SpawnLinkedContext
                                                            (DEFERREDCONSTANT ($
                                                                                 RemoteActorContext
                                                                                  ))
                                                            p)))
                                 (SETQ cntxts (for x in cntxts when (ObjectExists? x) collect x))
                                 (_@ self :processContexts cntxts)
                                 (_@ ctx :processContexts cntxts)
                                 (_@ self :processBrowsers (SETQ brwsrs
                                                             (for cntxt in (@ :processContexts)
                                                                collect (@ cntxt :myBrowser)))))
                               (_ self BuildSmallCombinationWindow cntxts brwsrs)
                               (_@ self :activeBrowsers brwsrs)
                               (for brwsr in brwsrs do
                                                             (* (_ brwsr InitializeState))
                                                             (_@ brwsr :combineBrowser self)
                                                             (_ brwsr Clear))
                               (SETQ window (@ :window))
                               (WINDOWADDPROP window (QUOTE SHRINKFN)
                                      (FUNCTION DoShrinkFnMethod)
                                      T)
                               (WINDOWADDPROP window (QUOTE EXPANDFN)
                                      (FUNCTION DoExpandFnMethod))
                               (WINDOWPROP window (QUOTE ICONFN)
                                      (FUNCTION DoIconFnMethod)))
                              (T (_ self AbortBrowser)]))
```

(CombineRemoteSystemBrowser.ConnRS232

```
  (Method ((CombineRemoteSystemBrowser ConnRS232)
           self)                                             (* TAL "18-May-88 12:26")
                                                             (* New method template)
           (_ (@ context)
              ConnectToRTE
              (QUOTE RS232))))
```

(CombineRemoteSystemBrowser.Connect

```
  (Method ((CombineRemoteSystemBrowser Connect)
           self)                                             (* TAL "18-May 88 12.25")
                                                             (* New method template)
           (_ (@ context)
              ConnectToRTE NIL)))
```

(CombineRemoteSystemBrowser.Disconnect

```
(Method ((CombineRemoteSystemBrowser Disconnect)
        self)                                    (* TAL " 8-Mar-88 17 39")
                                                 (* New method template)
        (_ (@ context)
           DisconnectFromRTE)))
```

(CombineRemoteSystemBrowser.ExitBrowser

```
(Method ((CombineRemoteSystemBrowser ExitBrowser)
        self)                                    (* TAL "18-May-88 15.39")
                                                 (* Specialization)
        (LET ((ctx (@ context)))
          (COND
            ((AND PDEDisconnectBeforeExit (@ ctx rte))
             (_ ctx DisconnectFromRTE)))
          (_Super self ExitBrowser))))
```

(CombineRemoteSystemBrowser.TmpPrint

```
(Method ((CombineRemoteSystemBrowser TmpPrint)
        self m1 m2 m3)                           (* TAL "16-Mar-88 14.44")
                                                 (* New method template)
        (FISCompileMsg (CONCAT m1 (OR m2 "")
                               (OR m3 "")
                               FISTwoCR))))
```

(CombineRemoteSystemContext.ConnectToRTE

```
(Method ((CombineRemoteSystemContext ConnectToRTE)
        self dev)                                (* TAL "18-May-88 12:27")
                                                 (* New method template)
        (LET [(rte (OR (@ rte)
                       (change (@ rte)
                               (_ ($ RemoteRTE)
                                  NewTemp)]
          (_ rte Connect self dev))))
```

(CombineRemoteSystemContext.DisconnectFromRTE

```
(Method ((CombineRemoteSystemContext DisconnectFromRTE)
        self)                                    (* TAL "22-May-88 13:40")
                                                 (* New method template)
        [LET ((rte (@ rte)))
          (COND
            (rte (for ctx in (@ processContexts) do (_ ctx Detach))
                 (_ rte Disconnect)]))
```

(CombineRemoteSystemContext.RTEConnected

```
(Method ((CombineRemoteSystemContext RTEConnected)
        self rte)                                (* TAL "28-Apr-88 16.00")
                                                 (* New method template)
        (for ctx in (@ processContexts) do (_ ctx RTEConnected rte))))
```

(CombineRemoteSystemContext.RTEDisconnected

```
(Method ((CombineRemoteSystemContext RTEDisconnected)
        self rte)                                (* TAL "18-May-88 15:11")
                                                 (* New method template)
        (COND
          ((EQ rte (@ rte))
           (for ctx in (@ processContexts) do (_ ctx RTEDisconnected))
           (_@ rte NIL)))))
```

(RemoteActorBrowser.AddStateWindow

```
(Method ((RemoteActorBrowser AddStateWindow)
        self swBrowser)                          (* TAL "20-Mar-88 17 44")
                                                 (* Specialization)
        (LET ((oldSVList (@ :displayedStateVariables)))
          (_Super self AddStateWindow swBrowser)
          (_ (@ context)
             ChangeDisplayedVars oldSVList (change (@ :displayedStateVariables)
                                                   (FUnion (@ swBrowser :properties)
                                                           oldSVList))
             T))))
```

(RemoteActorBrowser.Attach

```
(Method ((RemoteActorBrowser Attach)
        self)                                    (* TAL "17-Mar-88 10.23")
                                                 (* New method template)
        (_ (@ context)
           Attach)))
```

(RemoteActorBrowser.ContinueProcess

```
(Method ((RemoteActorBrowser ContinueProcess)
        self)                                    (* TAL "20-Mar-88 19 01")
                                                 (* New method template)
        (_ (@ context)
           ContinueProcess)))
```

(RemoteActorBrowser.Detach

```
(Method ((RemoteActorBrowser Detach)                    (* TAL "22-Mar-88 17 10")
         self)                                          (* New method template)

        (_ (@ context)
           Detach)))
```

(RemoteActorBrowser.InitializeManually

```
(Method ((RemoteActorBrowser InitializeManually)        (* TAL "20-Mar-88 18:31")
         self)                                          (* New method template)

        (_ (@ context)
           InitializeManually)))
```

(RemoteActorBrowser.LoadActor

```
(Method ((RemoteActorBrowser LoadActor)                 (* TAL " 2-Jun-88 14:51")
         self)                                          (* New method template)

        (_ (@ context)
           LoadProc)))
```

(RemoteActorBrowser.OneManualScan

```
(Method ((RemoteActorBrowser OneManualScan)             (* TAL "17-Mar-88 10.35")
         self)                                          (* New method template)

        (_ (@ context)
           OneManualScan)))
```

(RemoteActorBrowser.RemoveStateWindow

```
(Method ((RemoteActorBrowser RemoveStateWindow)         (* TAL "20-Mar-88 13.37")
         self swBrowser)                                (* Specialization)
                [LET ((oldSVList (@ :displayedStateVariables)))
                  (_Super self RemoveStateWindow swBrowser)
                  (_ (@ context)
                     ChangeDisplayedVars oldSVList (change (@ :displayedStateVariables)
                                                           (_ self ComputeDisplayedStateVariables)))
                  ]))
```

(RemoteActorBrowser.SetFast

```
(Method ((RemoteActorBrowser SetFast)                   (* TAL " 8-Apr-88 08.49")
         self)                                          (* New method template)

        (_ (@ context)
           RunMode
           (QUOTE Time))))
```

(RemoteActorBrowser.SetPulse

```
(Method ((RemoteActorBrowser SetPulse)                  (* TAL " 8-Apr-88 08:49")
         self)                                          (* New method template)

        (_ (@ context)
           RunMode
           (QUOTE Scan))))
```

(RemoteActorBrowser.StopProcess

```
(Method ((RemoteActorBrowser StopProcess)               (* TAL "20-Mar-88 19.02")
         self)                                          (* New method template)

        (_ (@ context)
           StopProcess)))
```

(RemoteActorContext.AddingTraceFilter

```
(Method ((RemoteActorContext AddingTraceFilter)         (* TAL "21 May-88 17 22")
         self filter)                                   (* Tell remote about any changes in msg tracing)
              [LET ((newTrace (_ self SummarizeTraceFilters)))
                (for lst in newTrace as dir in (QUOTE (Both Src Dst))
                   do (for conn inside lst do (_ self RequestMsgTrace conn dir)]))
```

(RemoteActorContext.Attach

```
(Method ((RemoteActorContext Attach)                    (* TAL " 2-Jun-88 14:52")
         self)                                          (* New method template)

        [LET ((rte (@ rte)))
          (COND
            (rte (_ rte Attach (@ :object:printName)
                       self
                       (QUOTE Attach))]))
```

(RemoteActorContext.Attached

```
 (Method ((RemoteActorContext Attached)
          self procNum result)                    (* TAL " 2-Jun-88 15.43")
                                                  (* When attached get current state and var values and request
                                                  appropriate msg traces)
                   [COND
                      ((OR (EQ result 0)
                           (EQ result 4)
                           (EQ result 6))
                       (_@ procNum procNum)
                       (_ self PrintState "Att") (* (_ self SendRTE (QUOTE GetProcStatus)))
                       (_ self SendRTE (QUOTE GetActorState)
                              (QUOTE (1 0 0)))
                       (_ self ChangeDisplayedVars NIL (@ :myBrowser:displayedStateVariables)
                              T)
                       (_ self AddingTraceFilter NIL)
                                                  (* Recompute and request currently active msg traces)
                       NIL)
                      (T (_ self PrintState (CONCAT "E" result)))]))
```

(RemoteActorContext.BrowseBrowser?

```
 (Method ((RemoteActorContext BrowseBrowser?)
          self)                                   (* TAL "16-Mar-88 13:55")
                                                  (* Specialization)
          NIL))
```

(RemoteActorContext.ChangeDisplayedVars

```
 (Method ((RemoteActorContext ChangeDisplayedVars)
          self oldVars newVars addFlg)            (* TAL "23-Mar-88 17:13")
                                                  (* New method template)
                   [COND
                      ((NULL (@ :rte)))
                      [addFlg (_ self SendRTE (QUOTE SelVars)
                                     (LIST 1 newVars))
                              (_ self SendRTE (QUOTE GetVarList)
                                     (QUOTE (2 1)))]
                      (T (LET ((svs (@ :stateVariables)))
                              (for x in (FLDifference oldVars newVars)
                                 do (PUTHASH x NIL svs))
                                                  (* Make sure no old values left around locally)
                              (_ self SendRTE (QUOTE SelVars)
                                     (LIST 1 newVars))]))
```

(RemoteActorContext.ClearAllHighlights

```
 (Method ((RemoteActorContext ClearAllHighlights)
          self)                                   (* TAL "17-Mar-88 11 12")
                                                  (* New method template)
          (for prog in (@ :object:macroPrograms) do (_ prog ClearAllHighlights))))
```

(RemoteActorContext.ContinueProcess

```
 (Method ((RemoteActorContext ContinueProcess)
          self)                                   (* TAL "21-Mar-88 17 26")
                                                  (* New method template)
          (COND
             ((SELECTQ (@ updateMode)
                   (NIL (_@ running T)
                        (_ self SendRTE (QUOTE Continue)
                               (LIST (@ scanDelay))))
                   (Scan (SELECTQ (@ running)
                               (Pulse T)
                               ((NIL T)           (* Maybe need to stop if was T)
                                 (_@ running (QUOTE Pulse))
                                 (_ self SendRTE (QUOTE Scan)
                                        (QUOTE (1 1 1))))
                               (SHOULDNT)))
                   (Time (_@ running T)
                         (_ self SendRTE (QUOTE Continue)
```

```
                                (LIST (@ scanDelay)))
                         (_ self SendRTE (QUOTE GetActorState)
                                (QUOTE (0 1 1))))
                   (SHOULDNT))
              (_ self PrintState (SELECTQ (@ running)
                                     (Pulse "Pulse")
                                     "Run")))
             (T (_ self TmpPrint "Can't continue")
                (_@ running NIL)))))
```

(RemoteActorContext.Detach

```
 (Method ((RemoteActorContext Detach)
          self)                                   (* TAL "22-May-88 13.39")
                                                  (* If we are attached, turn off msg tracing and detach)
          (_@ running NIL)
          [COND
             ((@ procNum)
              (_ self RequestMsgTrace 0 (QUOTE Off))
              (COND
                 ((_ self SendRTE (QUOTE Detach))
                  (_ self PrintState "Det...")]))
```

(RemoteActorContext.Exit

```
(Method ((RemoteActorContext Exit)                             (* TAL "17-Mar-88 11.10")
        self AbortFlg)                                          (* Specialization)
              (LET (process mo (program (@ object)))
                (_ self Reset)
                (COND
                   ((LISTP ActiveSimulations)
                    (PUTASSOC program NIL ActiveSimulations)))
                (COND
                   ([AND (for sim in ActiveSimulations never (CDR sim))
                         (SETQ process (FIND.PROCESS (QUOTE FISBackgroundProcess]
                    (SUSPEND.PROCESS process)))
                (COND
                   ((AND (NOT (DestroyedObject? program))
                         (EQ self (@ program :processContext)))
                    (_@ program :processContext NIL)))
                [COND
                   ((SETQ mo (ObjectExists? (@ :myBrowser)))
                    (for sv in (@ mo :stateVariableWindows) when (ObjectExists? sv)
                       do (_ sv ShowValues)]
                (_Super self Exit AbortFlg))))
```

(RemoteActorContext.InitActor

```
(Method ((RemoteActorContext InitActor)                        (* TAL " 8-Apr-88 08:40")
        self)                                                   (* New method template)
        (LET ((obj (@ object)))
          (bind sh (mn _ (change (@ macroHash)
                                 (HASHARRAY 50)))
             for m in (_ obj FindAllMacroPrograms) as i from 1
             do (SETQ sh (HASHARRAY 10))
                (for step in (@ m steps) do (PUTHASH (SELECTQ (@ step stepNumber)
                                                              (IN 1)
                                                              (OUT 2)
                                                              (IPLUS (@ step stepNumber)
                                                                     3))
                                                     step sh))
                (PUTHASH i (LIST m sh)
                         mn))
          (_@ obj :processContext self)
          (change ActiveSimulations (MyPutAssoc obj self DATUM))
          (_ self InitializeState))))
```

(RemoteActorContext.InitializeManually

```
(Method ((RemoteActorContext InitializeManually)               (* TAL "20-Mar-88 18.49")
        self)                                                   (* New method template)
        (COND
           ((@ running)
            (_ self TmpPrint "Can't initialize while running"))
           ((_ self SendRTE (QUOTE Init)))
           (T (_ self TmpPrint "Can't initialize, not attached")))))
```

(RemoteActorContext.InitializeState

```
(Method ((RemoteActorContext InitializeState)                  (* TAL "18-Mar-88 16:59")
        self)                                                   (* Setup to begin running a program)
        (LET* ((program (@ :program))
               (svHash (@ :stateVariables))
               (macroProgs (@ program :macroPrograms)))
          (_ self Reset)
          [COND
             ((HARRAYP svHash)
              (CLRHASH svHash))
             (T (SETQ svHash (_@ :stateVariables (HASHARRAY 30))]
          self)))
```

(RemoteActorContext.LoadProc

```
(Method ((RemoteActorContext LoadProc)                         (* TAL " 2-Jun-88 14.52")
        self)                                                   (* New method template)
        [LET ((rte (@ rte)))
          (COND
             (rte (_ rte Attach (@ :object:printName)
                     self
                     (QUOTE LoadActor))]))
```

(RemoteActorContext.MacroFromNum

```
(Method ((RemoteActorContext MacroFromNum)                     (* TAL "14-Mar-88 13.12")
        self macroNum)                                          (* Lookup macro prog from number)
              (GETHASH macroNum (@ macroHash))))
```

(RemoteActorContext.MsgTrace

```
(Method ((RemoteActorContext MsgTrace)
         self win src dest type data)
                                        (* TAL "19-May-88 17 14")
                                        (* Trace msg sent or received by remote process)
      (LET [(msg (_ (LOADTIMECONSTANT ($ MMFSMessage))
                    NewTemp))
            (s/d (SELECTQ win
                          (1      (* window 1 is src, 2 is dest)
                             (QUOTE Source))
                          (QUOTE Destination]
        (change (@ msg source)
                src)
        (change (@ msg destination)
                dest)
        (change (@ msg rawData)
                data)
        (SELECTQ type
            (0                  (* Raw msg For now always use MMFSMessage and set data to hex
                                   string)
               (change (@ msg data)
                       (@ msg asciiHex)))
            NIL)
        (for filter in (@ MapNetwork :traceFilters)
           when (_ msg MatchFilter? filter s/d)
           do (_ (@ filter :traceBrowser)
                 AddToTrace msg)))))
```

(RemoteActorContext.OneManualScan

```
(Method ((RemoteActorContext OneManualScan)
         self)
                                        (* TAL "20-Mar-88 19.57")
                                        (* New method template)
      (COND
        [(NOT (@ running))
         (COND
           [(@ :myBrowser:displayedStateVariables)
            (_ self SendRTE (QUOTE Scan)
                   (QUOTE (1 1 1)))]
           (T (_ self SendRTE (QUOTE Scan)
                     (QUOTE (1 0 0)))]
        (T (_ self TmpPrint "Can't single scan while running")))))
```

Page 15

(RemoteActorContext.RTEAckIn

```
(Method ((RemoteActorContext RTEAckIn)
         self cmd result)
                                        (* TAL "22-May-88 13:28")
                                        (* New method template)
      (COND
        ((NEQ result 0)
         (_ self TmpPrint "RTE NAK " (CONCAT cmd " " result)))
        (T (SELECTQ cmd
               (Scan (SELECTQ (@ running)
                         (NIL (_ self PrintState "Scan"))
                         NIL))
               (Stop (_ self PrintState "Stop"))
               (Continue (_ self PrintState "Run"))
               (Detach (_@ procNum NIL)
                       (_ self PrintState "Det"))
               (Init (SHOULDNT))
               NIL)))))
```

(RemoteActorContext.RTEMsgIn

```
(Method ((RemoteActorContext RTEMsgIn)
         self cmd msg)
                                        (* TAL " 3-Jun-88 15:51")
                                        (* New method template)
      (LET ((arg1 (CAR msg))
            (arg2 (CADR msg))
            (arg3 (CADDR msg)))
        (SELECTQ cmd
            (StateChange (_ self UpdateActiveStepHighlights arg3))
            (VarValues (_ self VarValues arg2 arg3))
            (ScanDone (_ self ScanDone arg2))
            (Text (_ self Text arg2 arg3))
            (State (_ self UpdateActiveStepHighlights arg3 T))
            (MsgTrace [LET ((tmp (CDDDR msg)))
                        (_ self MsgTrace arg2 arg3 (CAR tmp)
                               (CADR tmp)
                               (CAR (CDDDDR tmp)))])
            ((Attached ActorLoaded)
                (_ self Attached arg1 arg2))
            NIL))))
```

(RemoteActorContext.RemovingTraceFilter

```
(Method ((RemoteActorContext RemovingTraceFilter)
         self filter)
                                        (* TAL "21-May-88 17 22")
                                        (* Specialization)
      [LET ((newTrace (_ self SummarizeTraceFilters)))
        (for lst in (CDR newTrace) as dir in (QUOTE (Src Dst Off))
           do (for conn inside lst do (_ self RequestMsgTrace conn dir)]))
```

(RemoteActorContext.RequestMsgTrace

```
(Method ((RemoteActorContext RequestMsgTrace)
        self conn dir)                              (* TAL "21-May-88 16:40")

      (* Send command to trace msgs. We always use window 1 for src and 2 for dest)

                  (_ self SendRTE (QUOTE TraceMsgs)
                        (CONS conn (SELECTQ dir
                                            (Both (QUOTE (1 2)))
                                            (Src (QUOTE (1 0)))
                                            (Dst (QUOTE (0 2)))
                                            (Off (QUOTE (0 0)))
                                            (SHOULDNT))))))
```

(RemoteActorContext.Reset

```
(Method ((RemoteActorContext Reset)
        self)                                       (* TAL "17-Mar-88 11:11")
                                                    (* Shut down a running grafcet)
            (_ self ClearAllHighlights)))
```

(RemoteActorContext.RunMode

```
(Method ((RemoteActorContext RunMode)
        self mode)                                  (* TAL " 8-Apr-88 08:54")
                                                    (* New method template)
              (COND
                 ((EQ mode (@ updateMode)))
                 ((@ running)
                  (_ self TmpPrint "Can't"))
                 (T (_@ updateMode mode)))))
```

(RemoteActorContext.ScanDone

```
(Method ((RemoteActorContext ScanDone)
        self scanNum)                               (* TAL "20-Mar-88 20:03")
                                                    (* New method template)
                 (SELECTQ (@ running)
                     (Pulse [COND
                              [(@ :myBrowser:displayedStateVariables)
                               (_ self SendRTE (QUOTE Scan)
                                      (QUOTE (1 1 1)))]
                              (T (_ self SendRTE (QUOTE Scan)
                                        (QUOTE (1 0 0)))])
                    (NIL (_ self PrintState "Stop"))
                    NIL)))
```

(RemoteActorContext.SetStateVariable

```
(Method ((RemoteActorContext SetStateVariable)
        self var value)                             (* TAL "18-Mar-88 16:34")
                                                    (* New method template)
                  (LET NIL
                    (CVAR.SET var value (@ :stateVariables))
                    (_ self SendRTE (QUOTE SetVar)
                             (LIST (COND
                                      ((FLOATP value)
                                       16)
                                      ((FIXP value)
                                       (COND
                                          ((MINUSP value)
                                           12)
                                          (T 4)))
                                      (T (SHOULDNT)))
                                   value var)))))
```

(RemoteActorContext.StopProcess

```
(Method ((RemoteActorContext StopProcess)
        self)                                       (* TAL "27-May-88 17:34")
                                                    (* New method template)
            (LET NIL                                (* (SELECTQ (@ running) (T (_@ running NIL)
                                                    (_ self SendRTE (QUOTE Stop)) (_ self SendRTE
                                                    (QUOTE GetActorState) (QUOTE (0 1 1))))
                                                    (Pulse (_@ running NIL)) NIL))
              (_@ running NIL)
              (_ self SendRTE (QUOTE Stop))
              (_ self SendRTE (QUOTE GetActorState)
                     (QUOTE (0 1 1)))
              NIL)))
```

(RemoteActorContext.SummarizeTraceFilters

```
(Method ((RemoteActorContext SummarizeTraceFilters)
        self)                                       (* TAL "22-May-88 15:02")
                                                    (* Returns list of lists of connection numbers to trace
                                                    (both src dst off))
            (LET ((obj (@ object))
                  connSpecs srcLst dstLst nConns res)
```

```
[COND
   ((SETQ connSpecs (@ obj mapAssociations))
    (SETQ connSpecs (@ connSpecs elements))
    (bind filterNames corr for filter in (@ MapNetwork traceFilters)
       when [SETQ filterNames (CDR (FASSOC obj (@ filter filterProgs)]
       do (SETQ corr (@ filter correspondent))
          (bind local for spec in connSpecs as idx from 1
             do (SETQ local (@ spec local))
                (COND
                   ((AND (FMEMB local filterNames)
                         (OR (NULL corr)
                             (FMEMB (@ spec remote)
                                    corr)))
                    (COND
                       ((OR (FMEMB local (@ filter source))
                            (FMEMB local (@ filter either)))
```

```
                        (pushnew srcLst idx)))
                    (COND
                       ((OR (FMEMB local (@ filter destination))
                            (FMEMB local (@ filter either)))
                        (pushnew dstLst idx]
(SETQ nConns (LENGTH connSpecs))
(SETQ res (LIST (FIntersection srcLst dstLst)
                (FLDifference srcLst dstLst)
                (FLDifference dstLst srcLst)
                (for idx from 1 to nConns unless (OR (FMEMB idx srcLst)
                                                     (FMEMB idx dstLst))

                   collect idx)))
[COND
   ((NEQ nConns 0)
    (for x on res when (EQ nConns (LENGTH (CAR x))) do (change (CAR x)
                                                                0]

res)))
```

(RemoteActorContext.Text

```
  (Method ((RemoteActorContext Text)
           self dest string)                              (* TAL "30-Mar-88 15.00")

          (* Display string in specified window. RTE EOL char is LF, so this destructively changes the string!)

                    [LET (stream)
                      (DECLARE (GLOBALVARS GlobalTraceStream GlobalDeviceStream))
                      (SETQ stream (SELECTQ dest
                                       (1 GlobalTraceStream)
                                       (2 GlobalDeviceStream)
                                       (3 (FISGetCompileErrorStream))
                                       (FISGetCompileErrorStream)))
                      (COND
                         ([AND (STREAMP stream)
                               (NOT (GETSTREAMPROP stream (QUOTE NULLDEVICE]
                          [for i from 1 to (NCHARS string) do (COND
                                                                 ((EQ (NTHCHARCODE string i)
                                                                      (CHARCODE LF))
                                                                  (RPLCHARCODE string i (CHARCODE
                                                                                          CR]

                          (COND
                             ((TEXTSTREAMP stream)    (* Much faster)
                              (TEDIT.INSERT stream string))
                             (T (PRIN3 string stream]))
```

(RemoteActorContext.TmpPrint

```
  (Method ((RemoteActorContext TmpPrint)
           self m1 m2 m3)                                 (* TAL "20-Mar-88 18:33")
                                                          (* New method template)
                (FISCompileMsg (CONCAT m1 (OR m2 "")
                                       (OR m3 "")
                                       FISTwoCR))))
```

(RemoteActorContext.UpdateActiveStepHighlights

```
  (Method ((RemoteActorContext UpdateActiveStepHighlights)
           self stepLst resetFlg)                         (* TAL " 8-Apr-88 09:54")
                                                          (* New method template)
                    [LET NIL
                      (DECLARE (GLOBALVARS LightStepShade DarkStepShade))
                      (COND
                         (resetFlg (_ self ClearAllHighlights)))
                      [bind ds step macroNum stepHash macro state tail (macroHash _
                                                                        (@ macroHash))

                         for x in stepLst
                         when (AND [COND
                                      ((EQ macroNum (CAR x))
                                       macro)
                                      ([SETQ macro (CAR (SETQ stepHash (GETHASH (SETQ macroNum
                                                                                   (CAR x))
                                                                                macroHash]
                                    (AND (SETQ ds (@ macro :displayStream))
                                         (NEQ (IMAGESTREAMTYPE ds)
                                              (QUOTE DISPLAY))
                                         (SETQ ds NIL))
                                    [COND
                                       ((NOT resetFlg)
                                        (for x in (CDDR stepHash)
                                           do (SELECTQ (IDIFFERENCE (CADR x)
                                                                    128)
                                                  (0 (_ (CAR x)
```

```
                                Highlight ds (QUOTE Off)))
                            (1 (_ (CAR x)
                                Highlight ds NIL NIL (QUOTE Run)))
                            (2 (_ (CAR x)
                                Highlight ds NIL NIL (QUOTE Active))

                            (3 (_ (CAR x)
                                Highlight ds NIL NIL (QUOTE
                                                          RunActive
                                                           )))
                            (SHOULDNT]
                  (change (CDDR stepHash)
                          NIL)
                  (SETQ tail (CDR stepHash))
                  (SETQ stepHash (CADR stepHash]
              (SETQ step (GETHASH (CADR x)
                                  stepHash)))
    do (COND
          ((ILESSP (SETQ state (CADDR x))
                   128)
           (SELECTQ state
                (0 (_ step Highlight ds (QUOTE Off)))
                (1 (_ step Highlight ds NIL NIL (QUOTE Run)))
                (2 (_ step Highlight ds NIL NIL (QUOTE Active)))
                (3 (_ step Highlight ds NIL NIL (QUOTE RunActive)))
                (SHOULDNT)))
          (T [SETQ tail (CDR (RPLACD tail (CONS (LIST step state]
             (SELECTQ state
                  (128 (_ step Highlight ds NIL LightStepShade (QUOTE Run)))

                  (129 (_ step Highlight ds NIL DarkStepShade (QUOTE Run)))
                  (130 (_ step Highlight ds NIL DarkStepShade (QUOTE Active
                                                                      )))

                  (131 (_ step Highlight ds NIL DarkStepShade (QUOTE
                                                              RunActive
                                                                )))

                  (SHOULDNT]
   (COND
      ((AND (NOT resetFlg)
            (EQ T (@ running))
            (EQ (@ updateMode)
                (QUOTE Time)))
       (_ self SendRTE (QUOTE GetActorState)
              (QUOTE (0 1 1)))]))
```

(RemoteActorContext.VarValues

```
  (Method ((RemoteActorContext VarValues)
           self scanNum lst)                    (* TAL "19-Mar-88 18:57")
                                                (* New method template)
                    (LET ((svs (@ :stateVariables))
                          (mergeFlg (QUOTE Merge)))
                      (COND
                         ((IEQP scanNum 0)
                          (SETQ mergeFlg T)
                          (_@ :scanNum scanNum))
                         ((NOT (IEQP scanNum (@ :scanNum)))
                          (SETQ mergeFlg NIL)
                          (_@ :scanNum scanNum)))
                      (for x in lst do (PUTHASH (CADDR x)
                                                (CADR x)
                                                svs))
                      (_ (@ :myBrowser)
                         UpdateStateVariableDisplay NIL mergeFlg))))
```

(RemoteProcessContext.PrintState

```
  (Method ((RemoteProcessContext PrintState)
           self msg)                            (* TAL "28-Apr-88 16:00")
                                                (* New method template)
               (printout (@ :myBrowser:window)
                         .TAB0 0 msg)))
```

(RemoteProcessContext.RTEConnected

```
  (Method ((RemoteProcessContext RTEConnected)
           self rte)                            (* TAL "28-Apr-88 16:04")
                                                (* New method template)
               (COND
                  ((NEQ rte (@ rte))
                   (_@ :rte rte)
                   (_ self PrintState "Det")))))
```

(RemoteProcessContext.RTEDisconnected

```
  (Method ((RemoteProcessContext RTEDisconnected)
           self)                                (* TAL "18-May-88 15:11")
                                                (* New method template)
            (_@ rte NIL)
            (_ self PrintState " ")))
```

(RemoteProcessContext.RTEMsgIn

```
(Method ((RemoteProcessContext RTEMsgIn)                     (* TAL " 8-Mar-88 18.40")
         self cmd msg)                                       (* New method template)

                      self))
```

(RemoteProcessContext.SendRTE

```
(Method ((RemoteProcessContext SendRTE)                      (* TAL "28-Apr-88 15.45")
         self cmd args vLen)                                 (* New method template)
                     [LET ((procNum (@ procNum))
                           (rte (@ rte)))
                       (COND
                          ((AND procNum rte)
                           (_ rte SendMsg cmd (CONS procNum args)
                                  vLen)])])
```

(RemoteRTE.Attach

```
(Method ((RemoteRTE Attach)                                  (* TAL " 2-Jun-88 14.54")
         self name context cmd)                              (* cmd is Attach or LoadActor)
                        (LET NIL
                          (_ self ProcEntry NIL name context)
                          (_ self SendMsg cmd (LIST name)))))
```

(RemoteRTE.Connect

```
(Method ((RemoteRTE Connect)                                 (* TAL "18-May-88 12.30")
         self ctx dev him me)                                (* New method template)

      (* * when open init process map, create self entry)

                      (pushnew (@ owners)
                             ctx)
                      (_ self DoAsProcess (QUOTE Connect1)
                             (LIST dev him me))))
```

(RemoteRTE.Connect1

```
(Method ((RemoteRTE Connect1)                                (* TAL "18-May-88 15.16")
         self dev him me)                                    (* New method template)

      (* * when open init process map, create self entry)

                   (PROG ((me (OR me (@ :pdeName)))
                          (him (OR him (@ :rteName)))
                          channel)
                         (COND
                            ((@ connStat)
                             (_ self TmpPrint "PDE already " (@ connStat))
                             (RETURN NIL)))
                         [COND
                            [(EQ dev (QUOTE RS232))
                             (change (@ conn)
                                    (LIST (OPENSTREAM (QUOTE (RS232))
                                                  (QUOTE INPUT))
                                          (OPENSTREAM (QUOTE (RS232))
                                                  (QUOTE OUTPUT))
                                          NIL))
                             (change (@ connStat)

                                    (QUOTE RS232))
                             (change (CADDR (@ conn))
                                    (ADD.PROCESS (BQUOTE (ApplyMethod , (KWOTE self)
                                                                (QUOTE RS232Input)))

                                           (QUOTE NAME)
                                           (QUOTE PDE-Input]
                            (T (change (@ connStat)
                                      (QUOTE Registering))
                               (COND
                                  ((NULL (_ MapNetwork MapRegister me self NIL (@ :gateway)))
                                   (change (@ connStat)
                                          NIL)
                                   (_ self TmpPrint "PDE couldn't register")
                                   (RETURN NIL)))
                               (change (@ connStat)
                                      (QUOTE Connecting))
                               (COND
                                  ((EQ (SETQ channel (_ MapNetwork MapAssociate me him NIL NIL
                                                                (@ :gateway)
                                                                (QUOTE Raw)))
                                       -1)
                                   (change (@ connStat)
                                          NIL)
                                   (_ self TmpPrint "PDE couldn't connect to RTS")
                                   (RETURN NIL))
                                  (T (change (@ connStat)
                                            (QUOTE Open))
                                     (change (@ conn)
                                            channel]
                         (_ self TmpPrint "PDE - RTS connection open")
                         (for x in (@ owners) when (ObjectExists? x)
                            do (_ x RTEConnected self)))))
```

(RemoteRTE.Detach

```
  (Method ((RemoteRTE Detach)
          self ctx)                                  (* TAL "22-Mar-88 17:19")
                                                     (* New method template)
                     self))
```

(RemoteRTE.Disconnect

```
  (Method ((RemoteRTE Disconnect)
          self)                                      (* TAL "28-Apr-88 16:21")
                                                     (* New method template)
                (_ self DoAsProcess (QUOTE Disconnect1))))
```

(RemoteRTE.Disconnect1

```
  (Method ((RemoteRTE Disconnect1)
          self)                                      (* TAL "18-May-88 15:09")
                                                     (* New method template)
                (LET ((conn (@ conn)))
                  (SELECTQ (@ connStat)
                       (NIL (_ self TmpPrint "PDE not connected"))
                       (Open (change (@ connStat)
                                     (QUOTE Closing))
                             (_ MapNetwork MapRelease conn)
                             (_ MapNetwork MapDeRegister (@ :pdeName))
                             (_ self Disconnected))
                       (RS232 (AND (PROCESSP (CADDR conn))
                                   (DEL.PROCESS (CADDR conn)))
                              (AND (STREAMP (CAR conn))
                                   (CLOSEF? (CAR conn)))
                              (AND (STREAMP (CADR conn))
                                   (CLOSEF? (CADR conn)))
                              (_ self Disconnected))
                       (PROGN (_ self TmpPrint "PDE already " (@ connStat)
                                       ", wait until that completes or times out")))
                  NIL)))
```

(RemoteRTE.Disconnected

```
  (Method ((RemoteRTE Disconnected)
          self)                                      (* TAL "28-Apr-88 16:39")
                                                     (* New method template)
                [LET NIL
                  (COND
                     ((@ connStat)
                      (change (@ connStat)
                              NIL)
                      (change (@ conn)
                              NIL)
                      (_ self TmpPrint "PDE - RTS connection closed")
                      (for x in (@ owners) when (ObjectExists? x) do (_ x RTEDisconnected self))
                      (change (@ owners)
                              NIL]))
```

(RemoteRTE.DoAsProcess

```
  (Method ((RemoteRTE DoAsProcess)
          self selector argList)                     (* TAL "18-Mar-88 17:07")
                                                     (* New method template)
                        (ADD.PROCESS (BQUOTE (ApplyMethod , (KWOTE self)
                                                     ,
                                                     (KWOTE selector)
                                                     ,
                                                     (KWOTE argList)))
                               (QUOTE NAME)
                               selector)))
```

(RemoteRTE.MessageReceive

```
  (Method ((RemoteRTE MessageReceive)
          self id cmd local remote)                  (* TAL "28-Apr-88 16:38")
                                                     (* Sent by MapNetwork when receive data or control msg)
                      (SELECTQ cmd
                           (Receive (bind msg while (SETQ msg (_ MapNetwork GetMessage local
                                                                     NIL remote))
                                       do (_ self MsgIn (@ msg :rawData))))
                           ((Release Abort)
                              (_ self Disconnected))
                           (Association          (* Not expecting incoming assoc)
                                       (SHOULDNT))
                           NIL)))
```

(RemoteRTE.MsgIgnored

```
  (Method ((RemoteRTE MsgIgnored)
          self m1 m2 m3)                             (* TAL " 8-Mar-88 19:11")
                                                     (* New method template)
             (_ self TmpPrint (CONCAT m1 (OR m2 "")
                                     (OR m3 "")
                                     " - Message ignored."))))
```

(RemoteRTE.MsgIn

```
(Method ((RemoteRTE MsgIn)
        self buf)                                    (* TAL "20-Mar-88 18.54")
                                                     (* Decode msg from RTE)
    [PROG (cmd procNum msg bme procDesc)
          (SETQ msg (RTM.ParseMsg buf))
          (SETQ bme (pop msg))
          (SETQ cmd (CAR msg))
          (COND
             ((STRINGP cmd)                          (* string is error msg)
              (_ self MsgIgnored cmd))
             ((NUMBERP cmd)
              (_ self MsgIgnored "Unknown remote command:" cmd))
             (T (SETQ procNum (SELECTQ cmd
                                  ((ProcNames ActorNames)
                                     -1)
                                  (CADR msg)))
                [SETQ procDesc (OR (GETHASH procNum (@ procMap))
                                   (_ self ProcEntry procNum
                                          (SELECTQ cmd
                                              ((Attached ProcStarted ActorLoaded)
                                                  (CADDDR msg))
                                              (PROGN (_ self MsgIgnored "Received command
                                                            for unknown process: "
                                                            (CONCAT procNum " " cmd))
                                                     (RETURN]
                (SELECTQ bme
                     (3                                  (* Whole msg)
```

Page 22

```
                       (COND
                          ((fetch RTEProcQ of procDesc)
                           (_ self MsgIgnored "BME not ended:" (CAAR (fetch RTEProcQ
                                                                         of procDesc)))
                           (change (fetch RTEProcQ of procDesc)
                                   NIL)))
                       (_ self RTEMsgIn cmd (CDR msg)
                              procDesc))
                     (1                                  (* B)
                       (COND
                          ((fetch RTEProcQ of procDesc)
                           (_ self MsgIgnored "BME not ended:" (CAAR (fetch RTEProcQ
                                                                         of procDesc)))
                           (change (fetch RTEProcQ of procDesc)
                                   NIL)))
                       (push (fetch RTEProcQ of procDesc)
                             msg))
                     (0                                  (* M)
                       (COND
                          ((fetch RTEProcQ of procDesc)
                           (push (fetch RTEProcQ of procDesc)
                                 msg))
                          (T (_ self MsgIgnored "BME not started:" cmd))))
                     (2                                  (* E)
                       (COND
                          ((fetch RTEProcQ of procDesc)
                           (bind (lst _ (CAR (LAST msg))) for qm
                              in (PROG1 (fetch RTEProcQ of procDesc)
                                        (change (fetch RTEProcQ of procDesc)
                                                NIL))
                              do (COND
                                    ((NEQ cmd (CAR qm))
                                     (_ self MsgIgnored "BME not same command:" cmd)
                                     (RETURN)))
                                 (SETQ lst (NCONC (CAR (LAST qm))
                                                  lst))
                              finally (change (CAR (LAST msg))
                                              lst)
                                      (_ self RTEMsgIn cmd (CDR msg)
                                             procDesc)))
                          (T (_ self MsgIgnored "BME not started:" cmd))))
                     (_ self MsgIgnored "Invalid BME:" bme)]))
```

(RemoteRTE.ProcEntry

```
(Method ((RemoteRTE ProcEntry)
        self procNum name obj)                     (* TAL "17-Mar-88 12.16")
                                                   (* Build or add to RTEProc record and check consistancy)
    (PROG ((map (@ procMap))
           desc)
          (OR (LITATOM name)
              (SETQ name (MKATOM name)))
          [COND
             [(AND procNum (SETQ desc (GETHASH procNum map]
             [(AND name (SETQ desc (GETHASH name map]
             [(AND obj (SETQ desc (GETHASH obj map]
             (T (SETQ desc (create RTEProc]
          [COND
             ((NULL procNum))
             ((NULL (fetch RTEProcNum of desc))
              (change (fetch RTEProcNum of desc)
                      procNum))
```

```
            ((NEQ procNum (fetch RTEProcNum of desc))
             (ERROR "RTE assigned process number already in use:"
                    (LIST procNum name (fetch RTEProcName of desc]
        [COND
            ((NULL name))
            ((NULL (fetch RTEProcName of desc))
             (change (fetch RTEProcName of desc)
                     name))
            ((NEQ name (fetch RTEProcName of desc))
             (ERROR "RTE process name conflict:" (LIST name
                                                       (fetch RTEProcName
                                                          of desc]
        [COND
            ((NULL obj))
            ((NULL (fetch RTEProcObj of desc))
             (change (fetch RTEProcObj of desc)
                     obj))
            ((NEQ obj (fetch RTEProcObj of desc))
             (ERROR "RTE process object conflict:"
                    (LIST obj (fetch RTEProcObj of desc]
```

Page 23

```
        (AND procNum (PUTHASH procNum desc map))
        (AND name (PUTHASH name desc map))
        (AND obj (PUTHASH obj desc map))
        (RETURN desc))))
```

(RemoteRTE.RS232Input

```
  (Method ((RemoteRTE RS232Input)
          self)                                    (* TAL "18-May-88 15.48")
                                                   (* Runs as process)
        (PROG ((ins (CAR (@ conn)))
               (synch 18)
               byte chk chk1 string len)
              (while (READP ins) do (BIN ins))     (* First flush input buffer)
          SYNCH
                                                   (* RS432BIN macro does (GO SYNCH) when it reads an unquoted DLE)
              (until (EQ (BIN ins)
                         synch)
                 do T)
              (while (EQ (PEEKCCODE ins)
                         synch)
                 do (BIN ins))
              (SETQ len (LOGOR (LLSH (RS432BIN ins)
                                     8)
                               (RS432BIN ins)))
              (SETQ string (ALLOCSTRING len))
              (SETQ chk 0)
              (for i from 1 to len do (RPLCHARCODE string i (SETQ byte (RS432BIN ins)))
                                      (add chk byte))
              (SETQ chk1 (LOGOR (LLSH (RS432BIN ins)
                                      8)
                                (RS432BIN ins)))
              (COND
                 ((DestroyedObject? self)
                  (RETURN))
                 ((IEQP chk1 (LOGAND chk 65535))
                  (_ self MsgIn string))
                 (T (_ self MsgIgnored "Bad checksum")))
              (GO SYNCH))))
```

(RemoteRTE.RTEAckIn

```
  (Method ((RemoteRTE RTEAckIn)
          self cmd result)                         (* TAL "20-Mar-88 17 23")
                                                   (* New method template)
        [COND
           ((NEQ result 0)
            (_ self TmpPrint "RTE NAK " (CONCAT cmd " " result))]))
```

(RemoteRTE.RTEMsgIn

```
  (Method ((RemoteRTE RTEMsgIn)
          self cmd msg procDesc)                   (* TAL "28-Apr-88 16 17")
                                                   (* New method template)
        [LET [(obj (ObjectExists? (fetch RTEProcObj of procDesc]
          (SELECTQ cmd
              (Ack [LET* ((ackCmd (CADR msg))
                          (ackRes (CADDR msg))
                          (ackDesc (fetch RTMDesc of ackCmd)))
                     (COND
                        ((NOT ackDesc)
                         (_ self TmpPrint "Received Ack for unknown RTE command: "
                            ackCmd))
                        (obj (_ obj RTEAckIn (fetch RTMCmd of ackDesc)
                                ackRes)]))
              (Detached)
              ((ProcNames ActorNames))
              (COND
                 (obj (_ obj RTEMsgIn cmd msg)]))
```

(RemoteRTE.SendMsg

```
(Method ((RemoteRTE SendMsg)
         self cmd args vLen)                  (* TAL "18-May-88 13:01")
                                              (* New method template)
      (LET ((conn (@ conn))
            data msg)
        (COND
          ((NULL conn)                        (* Check if open?)
           NIL)
          ((NULL (SETQ data (RTM.BuildMsg cmd args vLen)))
           (ERROR "Error building RTE message:" cmd)
           NIL)
          ((EQ (@ connStat)
               (QUOTE RS232))
           (_ self SendRS232 conn data))
          (T                                  (* data is string or list of strings if multiple msgs needed)
            (for x inside data do (SETQ msg (_ (LOADTIMECONSTANT ($ MapMessage))
                                               NewTemp))
                                  (change (@ msg rawData)
                                          x)
                                  (change (@ msg source)
                                          (@ pdeName))
                                  (change (@ msg destination)
                                          (@ rteName))
                                  (_ MapNetwork SendMessage msg conn))
            T)))))
```

(RemoteRTE.SendRS232

```
(Method ((RemoteRTE SendRS232)
         self conn data)                      (* TAL "18-May-88 15.20")
                                              (* New method template)
      (LET ((outs (CADR conn))
            len byte)
        (for string inside data do (to 3 do (BOUT outs 18))
                                   (SETQ len (NCHARS string))
                                   (RS432WOUT outs len)
                                   (bind (chk _ 0) for i from 1 to len
                                      do (SETQ byte (NTHCHARCODE string i))
                                         (RS432BOUT outs byte)
                                         (add chk byte)
                                      finally (RS432WOUT outs chk)
                                              (FORCEOUTPUT outs)))
      T)))
```

(RemoteRTE.TmpPrint

```
(Method ((RemoteRTE TmpPrint)
         self m1 m2 m3)                       (* TAL " 6-Mar-88 20:58")
                                              (* New method template)
      (FISCompileMsg (CONCAT m1 (OR m2 "")
                             (OR m3 "")
                             FISTwoCR))))

)
(DECLARE: EVAL@COMPILE

(PUTPROPS RS432BIN MACRO [OPENLAMBDA (stream)         (* This macro does (GO SYNCH) if it finds a DLE)
                           (LET ((byte (BIN stream)))
                             (COND
                               [(EQ byte 16)
                                (COND
                                  ((EQ (SETQ byte (BIN stream))
                                       18)
                                   (GO SYNCH))
                                  (T (IDIFFERENCE byte 32]
                               ((EQ byte 18)
                                (GO SYNCH))
                               (T byte])

(PUTPROPS RS432BOUT MACRO [OPENLAMBDA (stream byte)
                            (COND
                              ((WithinRange? byte 16 19)
                               (BOUT stream 16)
                               (BOUT stream (IPLUS byte 32)))
                              (T (BOUT stream byte])

(PUTPROPS RS432WOUT MACRO (OPENLAMBDA (stream word)
                            (RS432BOUT stream (LOGAND 255 (LRSH word 8)))
                            (RS432BOUT stream (LOGAND 255 word))))
)
```

```
(DECLARE: EVAL@COMPILE

(RECORD RTEProc (RTEProcObj RTEProcQ RTEProcName RTEProcNum))
)

        (* * Move to FISMODULETL)
```

```
(RPAQQ FISRemoteModuleTLMethodItems
       [(View (FISTLView DoCommand)
              "View the Grafcet Program(s)")
        (Hierarchy (FISTLHierarchy DoCommand)
               "Bring up a hierarchy display for each selected item")
        (Communication (FISTLCommunication DoCommand)
               "Bring up a communications window on the selected processes")
        ("MAP Network" FISTLNetworkStatus "Examine the status of the MAP network" (SUBITEMS
                                                                                   ("MAP Network"
                                                                                         FISTLNetworkStatus
                                                                                         "Examine the status
                                                                                         of the MAP
                                                                                         network")
                                                                                   ("Network Configuration"
                                                                                    FISTLGateConfig
                                                                                    "Examine or change the
                                                                                    Network Configuration
                                                                                    defaults")
                                                                                   ("Manual Interface"
                                                                                    (FISTLManualMMFS
                                                                                         DoCommand)
                                                                                    "Bring up an interface
                                                                                    for sending and receiving
                                                                                    MMFS messages manually")
                                                                                   ("Reset Network"
                                                                                         FISTLGateReset
                                                                                         "Reset the MAP
                                                                                         Network connection
                                                                                         to the gateway")))
        (Execute (FISTLSimulation DoCommand)
               "Execute the selected processes"
               (SUBITEMS ("Execute Local" (FISTLSimulation DoCommand)
                                "Execute the selected processes on this machine")
                      ("Execute Remote" (FISTLRemoteExec DoCommand)
                             "Control execution of selected processes on a remote machine")))
        (Compile (FISTLCompile DoCommand)
               "Compile the selected processes"
               (SUBITEMS (Compile (FISTLCompile DoCommand)
                                "Compile the selected processes")
                      ("Download" (FISTLDownload DoCommand)
                             "Download process to remote runtime machine")
                      ("Check Grafcet Syntax" (FISTLCheckGrafcetSyntax DoCommand)
                             "Check the Grafcet syntax of the selected processes without compiling")))
        (Create (FISTLCreate DoCommand)
               "Create a new process")
        (Copy (FISTLCopy DoCommand)
              "Copy selected object(s)"
              (SUBITEMS (Copy (FISTLCopy DoCommand)
                              "Copy selected object(s)")
                     (Rename (FISTLRename DoCommand)
                            "Rename selected object(s)")))
        (Save (FISTLSave DoCommand)
              "Save selected objects on associated files"
              (SUBITEMS (Save (FISTLSave DoCommand)
                              "Save selected objects on associated files")
                     ("Save and Compile" (FISTLSaveCompile DoCommand)
                            "Save and then compile selected objects")
                     (Remove (FISTLUnLoad DoCommand)
                            "Remove the selected process(es) from the system")))
        (Document (FISTLDocAll DoCommand)
               "Document the selected object(s) and its sub-objects"
               (SUBITEMS ("Document All" (FISTLDocAll DoCommand)
                                "Document the selected object(s) and its sub-objects")
                      ("Document One" (FISTLDocOne DoCommand)
                             "Document the selected object(s)")
                      ("Document Hierarchy" (FISTLDocHierarchy DoCommand)
                             "Document only the hierarchy of the selected object(s)")
                      ("Document Alphabetically" (FISTLDocAlph DoCommand)
                             "Document this portion of hierarchy in alphabetical order"])

(RPAQ FISModuleTLMethodItems FISRemoteModuleTLMethodItems)

(PUTPROPS FISREMOTE COPYRIGHT ("Savoir, Inc." 1988))
```

Appendix B: FLEXIS Grafcet Summary

Grafcet is a program for designing and developing a complex system by charting the structure and control flow logic of its separate, asynchronous processes.

GRAFCET CHARTS

Grafcet charts consist of *steps*, *transitions*, and *links*. Creating a Grafcet chart of a program is a matter of positioning the individual steps and links that constitute the chart, specifying the C statements and messages for the steps and transitions, and compiling the program.

Figure B-1 shows a Grafcet chart of the SavoirActor2, the initial process in a system.

Figure B-1

Grafcet Chart

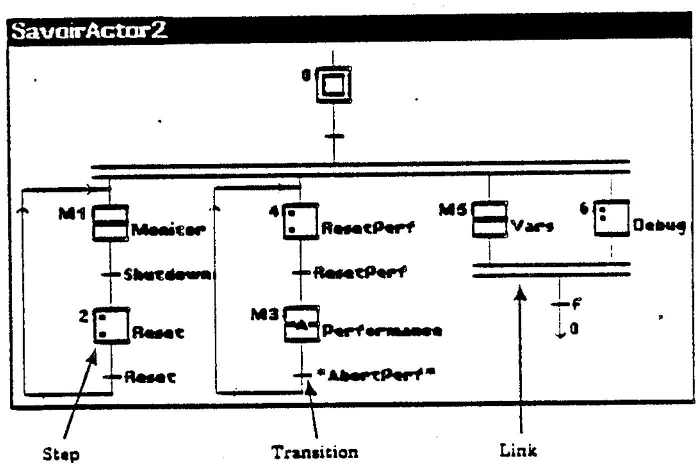

GRAFCET STEPS

FLEXIS Grafcet provides four types of steps with which to represent the actions occurring in a process. They are:

- Initial Steps
- Regular Steps
- Macro Steps
- Communication Steps

Initial Steps

Your main Grafcet chart may contain more than one initial step. Execution starts in all initial steps simultaneously.

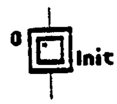

Initial Step

Regular Steps

Regular steps contain C programs that perform the actual process control.

Regular Step

Each regular step may contain 0-3 sets of C statements:

- Activation - Any initialization required for the action.
- Continuous - Any parts of the action that are to be executed repeatedly until the controlling transition becomes TRUE.
- Deactivation - Any wrapup required before control passes from the step.

*Dots in Regular Step Icons*

Dots in the regular step icons indicate which statements in the step have been defined. The two dots in the regular step shown above would indicate that the activation and continuous statements are defined for this step.

Macro Steps

Macro steps signal a chart embedded within a chart. In this way, you expand and develop the hierarchical relationships among the charts that make up the system.

Macro Step

Send and Receive Steps

Send and receive steps contain the information that allows you to pass messages between processes on the FLEXIS Workstation and over a Manufacturing Automation Protocol (MAP) or Ethernet network.

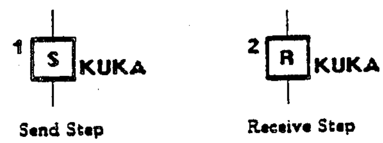

As a result of receiving valid messages, receive steps can set variables and enable transitions between steps.

*MMFS Message Templates*

You set up the messages in Manufacturing Message Format Standard (MMFS) format by completing message templates like the one seen in Figure B-2 on the next page.

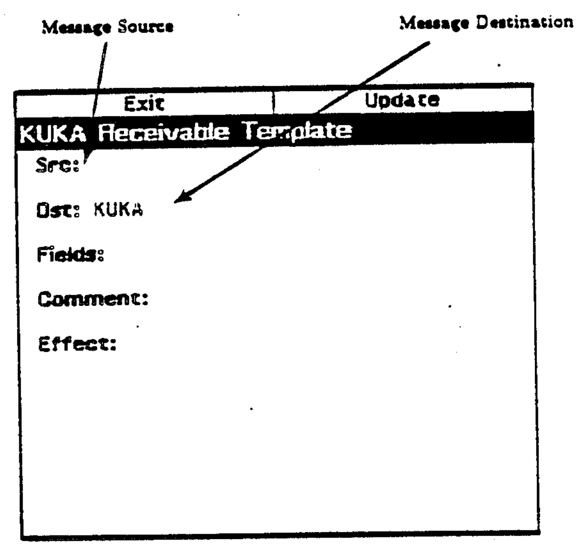

Figure B-2

Message Template

TRANSITIONS

Transitions between steps represent the circumstances under which control flows through the Grafcet program.

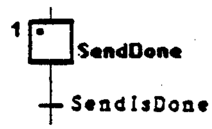

Transition

Transition conditions are Boolean expressions written in C. Transitions can test variables set by regular assignment in a C statement or from the Effect field of a Grafcet receive step.

LINKS

Links connect the steps in a Grafcet chart and represent the path of control. The three types of links are:

- Sequential links
- Branching links
- Joining links

Sequential Links

Sequential links connect one step with another and have a single transition.

Control flows straight through a sequential link when the transition is TRUE.

Sequential Link

Branching Links

Branching links connect one step with two or more steps.

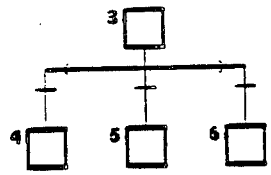

Asynchronous Branch

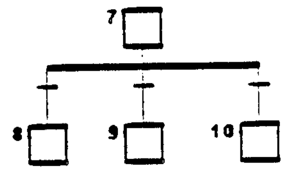

First TRUE Branch

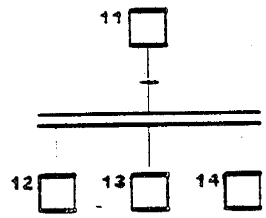

Synchronous Branch

- Asynchronous branch links have a transition associated with each of the linked steps. Control flows through any of the TRUE transitions.

The control actions represented by the steps in an asynchronous branch are initiated independently in parallel.

- First TRUE branch links have a transition associated with each of the linked steps. Control flows only through the first TRUE transition. Transitions are evaluated from left to right.

- Synchronous branch links have a single transition through which control flows simultaneously to all linked steps when the transition is TRUE.

Joining Links

Joining links connect two or more steps with one step.

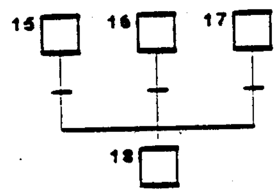

Asynchronous Join

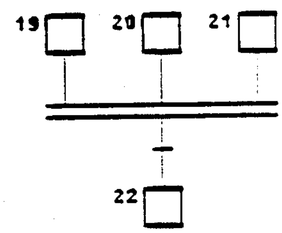

Synchronous Join

- Asynchronous join links have a transition associated with each of the multiple steps linked to the one step. Control flows independently to the one step from any of the multiple steps when their transitions are TRUE.

- Synchronous join links have a single transition associated with the one step. Control remains in the multiple steps until a single transition becomes TRUE. The control flows to the common step.

GRAFCET EXECUTION

Grafcet allows you to compile and run programs before you have finished them. Running a Grafcet program provides views of:

- Control "flowing" through the chart
- Messages sent and/or received by any or all elements in the program
- Status of variables at any point in the program
-

Appendix C: FLEXIS Grafcet Scan Procedure

This section describes the scan procedure for FLEXIS Grafcet, as implemented in the FLEXIS Designer.

DEFINITIONS

A Grafcet step is *active* from the time its execution begins to the time execution passes from it to some following step or steps. At all other times, the step is *inactive*.

A transition is *enabled* when the step or steps preceding it are active. In FLEXIS Grafcet, the transition following a macro step is enabled if the OUT step of the macro program is active. An enabled transition is thus a transition through which control is waiting to pass. An enabled transition is *cleared* when its Boolean expression evaluates to TRUE. Clearing a transition causes its predecessor steps to deactivate and its successor steps to activate. A cleared transition is thus a transition through which control has passed.

A Grafcet program executes in a series of individual cycles called *scans*. A scan represents a clock tick in the execution: all actions that occur during a single scan are considered to be simultaneous. The set of active steps changes from scan to scan as different transitions are enabled and cleared.

FIRST SCAN

When a FLEXIS Grafcet program begins execution, all the initial steps are processed in a special first scan.

1. The system highlights the initial steps if they are currently on the Designer display.
2. The activation parts of all initial steps execute.
3. The continuous parts of all initial steps execute.
4. The system updates the displays of selected C variable values (if any) on the Designer screen.

SUBSEQUENT SCANS

1. The system gathers all enabled transitions and evaluates their conditions.

Transitions following a macro step are enabled when the OUT step of that macro program is active.

2. Enabled transitions whose conditions evaluate to TRUE are cleared.

The steps preceding and following the cleared transitions are collected in the deactivation and activation lists.

3. The deactivation parts of steps on the deactivation list execute.

A communication step has no deactivation part.

A macro step has no deactivation part *per se*; the deactivation part of the OUT step executes, and the OUT step becomes inactive (the macro step becomes inactive as well).

4. The system removes the steps on the deactivation list from the list of active steps.

In the case of a macro step, the system removes both the macro step and its OUT step from the list of active steps. Some steps in the macro program might remain active.

5. The system highlights the currently active steps if they are on the Designer display.

To distinguish macro steps, only the top half is highlighted. The top half of a macro step is active when any step in the macro program other than the OUT step is active. When the OUT step is active, the system unhighlights the top half and highlights the bottom half.

6. The activation parts of steps on the activation list execute.

A communication step has no activation part.

A macro step has no activation part *per se*; the activation part of the IN step executes, and the IN step becomes active (the macro step becomes active as well).

If a regular step is both deactivated and activated on the same scan, i.e., if the step is on both the activation and deactivation lists, its deactivation part executes and then its activation part executes.

If a regular step is re-activated, i.e., if it is on both the active list and the activation list, the activation part will not execute again on this scan. This occurs when the step was active on the previous scan, and the following transition is not cleared, and the preceding transition is cleared again.

7. The system adds steps just activated to the list of active steps.

When a macro step becomes active, the system adds both the macro step and its IN step to the list of active steps.

8. The continuous parts of the active steps execute.

In the case of communication steps, the system processes any pending message traffic, i.e., receive steps receive all messages waiting to be received.

A macro step has no continuous part; however, the continuous part of any active regular step within a macro program executes.

9. The system updates the displays of selected C variable values (if any) on the Designer screen. ⋇

Appendix D: FLEXIS Documentation Example
The following pages are an example of FLEXIS's automatic documentation.
Documentation for KUKAController hierarchy

KUKAController Documentation 18-Mar-88 17:29:27

Table of Contents

KUKAController ..... 1
KUKADeviceActions ..... 7
KUKAControllerComm ..... 10

KUKAController Documentation 18-Mar-88 17:29:27 Page 1

Documentation for: KUKAController

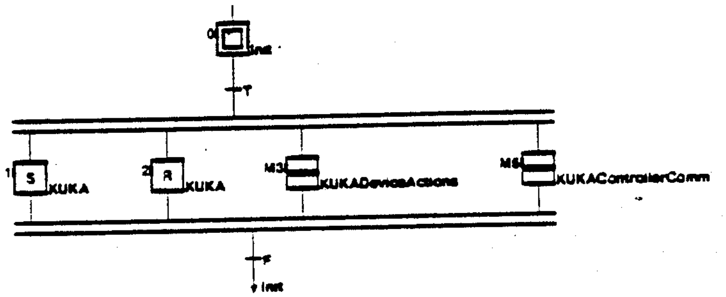

C Declarations for: KUKAController

```
/****************************************************************************/

/**************************** KUKAController ****************************/

#include "<LISPFILES>INCLUDE>COMMON.H"


/******************************** DEFINES ********************************/

/* Main Program Directives (mpds) for KUKA robot. */

#define MPD_CALIBRATE              1
#define MPD_DIAGNOSTICS            2
#define MPD_FAULT_RECOVERY         3
#define MPD_CHANGEOVER             4
#define MPD_DEPALLETIZE_AXLE       5
#define MPD_PALLETIZE_AXLE         6
#define MPD_INITIALIZE             7
#define MPD_LOAD_AXLE              8
#define MPD_UNLOAD_AXLE            9
#define MPD_CRIMP_SMALL_OETIKER    10
#define MPD_LOAD_CHYSLR_AXLE       11
#define MPD_LOCATE_SMALL_OETIKER   12
#define MPD_CHECK_OETIKER_SEATING  13
#define MPD_CHECK_CRIMP_QUALITY    14
#define MPD_LOCATE_LARGE_OETIKER   15
#define MPD_PROCESS_PALLET         16

/* defines for message types */
```

```
#define US80Type 1
#define WRIType 2
#define REAType 3
#define CSTType 4
#define SP1Type 5


/******************************** Variables ********************************/


int     KUKA_CRKUKA,      /* mmfs variables */
        TNS,              /* transaction number for outgoing messages */
        TNR,              /* transaction number for incoming messages */
        CmdS,
        CmdR,
        CountS,
        CountR,
        RegsS[60],
        RegsR[20],
        ErrorS,
        ErrorR,
        value,
        CurrentTN = 0,

        /* working variables */
        CurrentAction,
        W;


char    DataNameR[10],
        DataNameS[10],
        ErrorStrS[81],
        ErrorStrR[81],

        *MMFSstr[] =    /* don't forget to add string names right below*/
        {
                " ",
                "<US80>",
                "<WRI>",
                "<REA>",
                "<CST>",
                "<SP1>",
        },

        *MPDstr[] =
        {
                " ",
                "MPD_Calibrate",
                "MPD_Diagnostics",
                "MPD_FaultRecovery",
                "MPD_Changeover",
                "MPD_DepalletizeAxle",
                "MPD_PalletizeAxle",
                "MPD_Initalize",
                "MPD_LoadAxle",
                "MPD_UnloadAxle",
```

```
                "MPD_CrimpSmallOetiker",
                "MPD_LoadChysirAxle",
                "MPD_LocateSmallOetiker",
                "MPD_CheckOetikerSeating",
                "MPD_CheckCrimpQuality",
                "MPD_LocateLargeOetiker",
                "MPD_ProcessPallet",
        };


/****************************** Functions () ******************************/


/* This function is executed upon receipt of non-MPD messages (e.g. register
   reads & writes, start cycle, etc).
*/

CRKUKANonMPDActions(actiontype)
int actiontype;
{
int i;
        switch (actiontype)
        {
                case WRIType:
                        fprintf(dtrace,
                          "\nKUKACntlr: Write register command received.");
                        TNS = TNR;
                        mmfs_send(KUKA_CRKUKA, 4);
                        fprintf(dtrace,
                                "\nKUKACntlr: Writing to register(s):%s: ",
                                DataNameR);
                        if (streq(DataNameR,"REG45"))
                                RegsS[44] = RegsR[0];

                        if (streq(DataNameR,"REG28"))
                                RegsS[27] = RegsR[0];

                        for (i = 0;i<CountR; i++)
                                fprintf(dtrace, "  %d,", RegsR[i]);
                        break;

                case REAType:
                        fprintf(dtrace,
                                "\nKUKACntlr:   Read command received");
                        TNS = TNR;
                        CountS = CountR;
                        mmfs_send(KUKA_CRKUKA, 6);
                        break;

                case CSTType:
                        fprintf(dtrace,
                                "\nKUKACntlr:  CycleStart command received");
                        TNS = TNR;
                        mmfs_send(KUKA_CRKUKA, 8);
                        break;

                case SP1Type:
```

```
			fprintf(dtrace,
				"\nKUKACntlr:	CycleStop command received");
			TNS = TNR;
			mmfs_send(KUKA_CRKUKA, 10);
			break;

		default:
			fprintf(dtrace,
				"\nKUKACntlr:	ERROR:Unknown non-MPD action!");

	} /*end of switch*/

} /*end of function*/


/*  This function is executed upon the receipt of a US80 command from CRKUKA
    (the kuka actor).  It puts up a trace message and checks to make sure
    Reg2 is 0 else it complains bitterly. We use the RegsS registers to hold
    the current "real" register values.
*/

CRKUKACmdRcvd()
{
int i;
	fprintf(dtrace,
		"\nKUKACntlr:	Request for %s action received  (MPD = %d).",
		MPDstr(CmdR), CmdR);

	TNS = TNR;
	CmdS = CmdR;

	/* Reg2 must be empty; can only queue ahead one element */
	if (RegsS[1] != 0) /* NOTE: registers are offset by 1 */
	{
		fprintf(dtrace,
			"\nKUKACntlr:	ERROR: Reg 2 not zero.");
		mmfs_send(KUKA_CRKUKA, 3); /* NRS */
		return;
	}

	/* print the register values received and transfer the parameters
	   sent with the US80 message into the appropriate registers
	*/
	for (i = 0; i<CountR; i += 2)
	{
		fprintf(dtrace,"\n	Reg(%d) = %d",
			RegsR[i], RegsR[i + 1]);

		RegsS[RegsR[i] - 1] = RegsR[i + 1] ; /* offset the reg */
	}

	RegsS[1] = CmdR ;  /* put the command in Reg2 */


	/* send FRS */
	mmfs_send(KUKA_CRKUKA,2);
}
```

0. Activation program: KUKAController__Init__activation

```
int i ;

for (i = 0 ; i < 59 ; i++)
        RegsS[i] = 0 ;
```

KUKAController Documentation 18-Mar-88 17:29:27 Page 6

KUKA Sendable Message Templates:

| Msg# | Dst | Fields | Comment |
|---|---|---|---|
| 1 | CRKUKA | <TN:TNS> <CMD> <US89> <CT:CountS> {CountS <SI:RegsS>} | Unsolicited status |
| 2 | CRKUKA | <TN:TNS> <FRS> <US80:CmdS> | FRS for US80 |
| 3 | CRKUKA | <TN:TNS> <NRS> <US80:CmdS> | NRS for US80 |
| 4 | CRKUKA | <TN:TNS> <FRS> <WRI> | FRS for Write |
| 5 | CRKUKA | <TN:TNS> <NRS> <WRI> [<DI:ErrorS>] [<ES:ErrorStrS>] | NRS for Write |
| 6 | CRKUKA | <TN:TNS> <FRS> <REA> <CT:CountS> {CountS <SI:RegsS>} | FRS for Read |
| 7 | CRKUKA | <TN:TNS> <NRS> <REA> [<DI:ErrorS>] [<ES:ErrorStrS>] | NRS for Read |
| 8 | CRKUKA | <TN:TNS> <FRS> <CST> | FRS for CycleStart |
| 9 | CRKUKA | <TN:TNS> <NRS> <CST> [<DI:ErrorS>] [<ES:ErrorStrS>] | NRS for CycleStart |
| 10 | CRKUKA | <TN:TNS> <FRS> <SPI> | FRS for CycleStop |
| 11 | CRKUKA | <TN:TNS> <NRS> <SPI> [<DI:ErrorS>] [<ES:ErrorStrS>] | NRS for CycleStart |

KUKA Receivable Message Templates:

| Src | Fields | Comment | Effect |
|---|---|---|---|
| CRKUKA | <TN:TNR> <CRQ> <US80:CmdR> <CT:CountR> {CountR <SI:RegsR>} | Received US80 command | CRKUKACmdRcvd() |
| CRKUKA | <TN:TNR> <CRQ> <WRI> <DN:DataNameR> <CT:CountR> {CountR <SI:RegsR>} | RegisterWrite command | CRKUKANonHPDActions(WRIType) |
| CRKUKA | <TN:TNR> <CRQ> <REA> <DN:DataNameR> <CT:CountR> | RegisterRead command | CRKUKANonHPDActions(REAType) |
| CRKUKA | <TN:TNR> <CRQ> <CST> | CycleStart command | CRKUKANonHPDActions(CSTType) |
| CRKUKA | <TN:TNR> <CRQ> <SPI> | StopCycle command | CRKUKANonHPDActions(SPIType) |
| CRKUKA | <TN:TNR> <CRQ> <US80:CmdR> | Received US80 command | CRKUKACmdRcvd() |

KUKAController Documentation 18-Mar-88 17:29:27 Page 7

Documentation for: KUKADeviceActions

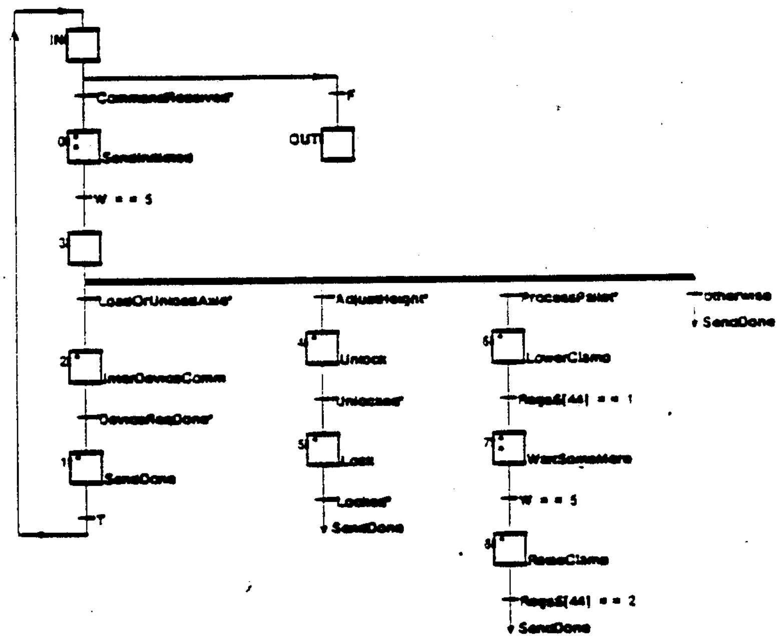

KUKADeviceActions Transition Label Abbreviations:

ProcessPallet: CurrentAction == MPD_PROCESS_PALLET

Locked: RegsS[44] == 3

Unlocked: RegsS[44] == 4

AdjustHeight: CurrentAction == MPD_CHANGEOVER && RegsS[16] == 4005

LoadOrUnloadAxle: CurrentAction == MPD_LOAD_AXLE || CurrentAction == MPD_UNLOAD_AXLE

DeviceReqDone: RegsS[44] == 1 || RegsS[44] == 2

CommandReceived: RegsS[1] != 0 && sap_opened(KUKA_CRKUKA)

0. Activation program: KUKADeviceActions_SendInitiated_activation

W = 0;

```
CurrentAction = RegsS[1] ;
CountS = 11;
RegsS[0] = 1;            /* register 1 = 1 means status */
RegsS[2] = -RegsS[1] ;   /* reg 3 is working register */
RegsS[1] = 0 ;           /* clear Register 2 */
TNS = ++CurrentTN ;
mmfs_send(KUKA_CRKUKA, 1);
fprintf(dtrace,
        "\nKUKACntlr:   %s action initiated (MPD = %d), Oettiker id = %d.",
        MPDstr[CurrentAction], CurrentAction, RegsS[27]);
```

0. Continuous program: KUKADeviceActions__SendInitiated__continuous

```
++W;/*wait 5 scans*/
```

1. Activation program: KUKADeviceActions__SendDone__activation

```
/* Send Done message */
CountS = 11;
RegsS[0] = 1; /* register 1 = 1 means status */
RegsS[2] = CurrentAction ; /* reg 3 is working register */
TNS = ++CurrentTN ;
mmfs_send(KUKA_CRKUKA, 1);

fprintf(dtrace,"\nKUKACntlr:   %s action done (MPD = %d), Oetiker id = %d.", MPDstr[Curren
tAction], CurrentAction, RegsS[27]) ;
```

2. Activation program: KUKADeviceActions__InterDeviceComm__activation

```
RegsS[44] = 0;
switch (CurrentAction)
{
        case MPD_LOAD_AXLE:
                RegsS[4] = 1; /* reg5 = 1 means lower clamp */

                fprintf(dtrace,
                    "\nKUKACntlr: Msg to CRKUKA: Tell MCL to lower clamp");
                break;
        case MPD_UNLOAD_AXLE:
                RegsS[4] = 2; /* reg5 = 2 means raise clamp */

                fprintf(dtrace,
                .  "\nKUKACntlr: Msg to CRKUKA: Tell MCL to raise clamp");
                break;

        default:
                 /* should never happen */
                RegsS[44] = 1 ;
                return;
 }

CountS = 11 ;
RegsS[0] = 2 ; /* register 1 = 2 means communicate with device */
TNS = ++CurrentTN ;
```

```
mmfs_send(KUKA_CRKUKA,1) ;
```

4. Activation program: KUKADeviceActions_Unlock_activation

```
RegsS[4] = 4 ;  /* reg5 = 4 means unlock clamp */
fprintf(dtrace,
        "\nKUKACntlr:   Msg to CRKUKA: Tell MCL machine to unlock clamp");
CountS = 11 ;
RegsS[0] = 2 ; /* register 1 = 2 means communicate with device */
TNS = ++CurrentTN ;
mmfs_send(KUKA_CRKUKA, 1) ;
```

5. Activation program: KUKADeviceActions_Lock_activation

```
RegsS[4] = 3; /* reg5 = 3 means lock clamp */

fprintf(dtrace,
        "\nKUKACntlr:   Msg to CRKUKA: Tell MCL machine to lock clamp");



CountS = 11 ;
RegsS[0] = 2 ; /* register 1 = 2 means communicate with device */
TNS = ++CurrentTN ;
mmfs_send(KUKA_CRKUKA, 1) ;
```

6. Activation program: KUKADeviceActions_LowerClamp_activation

```
RegsS[44] = 0;
RegsS[4] = 1; /* reg5 = 1 means lower clamp */
fprintf(dtrace, "\nKUKACntlr: Msg to CRKUKA: Tell MCL to lower clamp");
CountS = 11 ;
RegsS[0] = 2 ; /* register 1 = 2 means communicate with device */
TNS = ++CurrentTN ;
mmfs_send(KUKA_CRKUKA,1) ;
```

7. Activation program: KUKADeviceActions_WaitSomeMore_activation

```
W = 0;
```

7. Continuous program: KUKADeviceActions_WaitSomeMore_continuous

```
++W;/*wait 5 scans*/
```

8. Activation program: KUKADeviceActions_RaiseClamp_activation

```
RegsS[44] = 0;
RegsS[4] = 2; /* reg5 = 2 means raise clamp */
fprintf(dtrace, "\nKUKACntlr: Msg to CRKUKA: Tell MCL to raise clamp");
CountS = 11 ;
RegsS[0] = 2 ; /* register 1 = 2 means communicate with device */
TNS = ++CurrentTN ;
mmfs_send(KUKA_CRKUKA,1) ;
```

KUKAController Documentation 18-Mar-88 17:29:27 Page 10

Documentation for: KUKAControllerComm

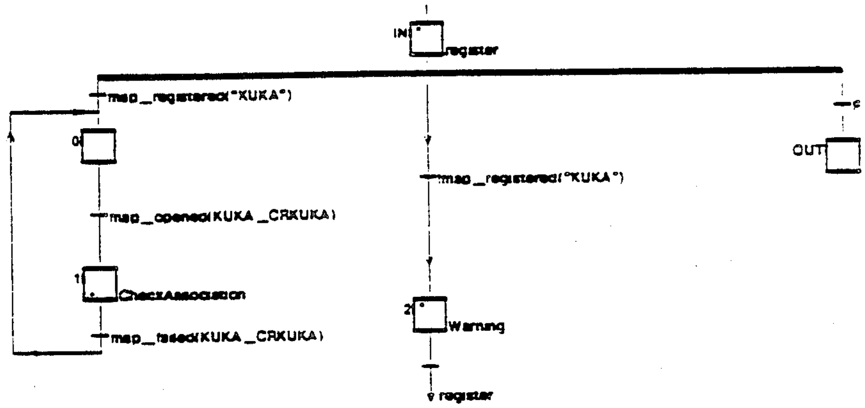

IN. Activation program: KUKAControllerComm__register__activation

```
map_register("KUKA") ;
```

1. Deactivation program: KUKAControllerComm__CheckAssociation__deactivation

```
fprintf(dtrace, "\nKUKACntlr:   ERROR: map connection from KUKAController to CRKUKA has fa
iled!  Retrying to associate.") ;
```

2. Activation program: KUKAControllerComm__Warning__activation

```
fprintf(trace,
 "\nKUKACntlr:   WARNING: map register failed in KUKAController. Retrying!");
```

Index

C Declarations:

KUKAController ........ 1

Step Programs:

Activation Programs:

KUKAControllerComm__register__activation ........ 10
KUKAControllerComm__Warning__activation ........ 10
KUKAController__Init__activation ........ 5
KUKADeviceActions__InterDeviceComm__activation ........ 8
KUKADeviceActions__Lock__activation ........ 9
KUKADeviceActions__LowerClamp__activation ........ 9
KUKADeviceActions__RaiseClamp__activation ........ 9
KUKADeviceActions__SendDone__activation ........ 8
KUKADeviceActions__SendInitiated__activation ........ 7
KUKADeviceActions__Unlock__activation ........ 9
KUKADeviceActions__WaitSomeMore__activation ........ 9

Continuous Programs:

KUKADeviceActions__SendInitiated__continuous ........ 8
KUKADeviceActions__WaitSomeMore__continuous ........ 9

De-Activation Programs:

KUKAControllerComm__CheckAssociation__deactivation ........ 10

Grafcet Programs:

KUKAController ........ 1
KUKAControllerComm ........ 10
KUKADeviceActions ........ 7

Message Templates:

Sendable Templates:

KUKA ........ 6

Receivable Templates:

KUKA ........ 6

We claim:

1. An apparatus for designing and debugging a control system comprising in combination:

means for preparing a specification of said control system, including means for developing requirements for said control system and for documenting said control system requirements;

means coupled to said preparing means to receive said specification for designing and organizing said control system as an abstraction with abstraction documentation;

means coupled to receive said abstraction and said specification for developing said control system including means for implementing said abstraction as a design implementation and means for generating design implementation documentation to produce a developed system;

means for simulating and emulating said control system, including means coupled to receive said design implementation for activating said design implementation in an artificial environment to demonstrate control system dynamics;

means for debugging said system, including means for isolating and correcting cause of undesired behavior using simulation techniques to anticipate eventual behavior;

means coupled to receive said developed system for translating and transferring said developed system into an operational system;

means for integrating and checking out said control system in an operating environment, including means coupled to said operational system for verifying that each element of said operational system interacts and cooperates properly with the other ones of said elements;

means coupled to said operational system for monitoring and interacting with said operational system;

means coupled to said operational system for diagnosing malfunctions of devices and undesired behavior in said operational system; and means coupled to said diagnosing means, to said monitoring means and to said debugging means to receive said specification for modifying said operational system by modification of said specification.

2. The apparatus recited in claim 1 further including means for communicating information using the Manufacturing Automation Protocol.

3. The apparatus recited in claim 1 further including a third programming object that provides means for creating visual images of Grafcet objects.

4. An apparatus comprising a computer and a computer program for designing, constructing and interacting with a control system, said control system comprising functional elements running on computer processors, said functional elements capable of operating concurrently and asynchronously, said computer program comprising in combination:

means for designing said control system as a combination of objects, including means for creating a visual representation of said control system;

means coupled to said designing means for generating actual instructions that implement said control system from said objects;

means coupling to said generating means for sending said actual instructions to selected ones of said computer processors;

a run time module means for operating on selected ones of said computer processors and for controlling execution of said actual instructions; and means coupled to said computer processors and to said designing means for allowing said run time module means to interact with said objects such that a user interacts with a single representation of said control system for specifying, designing and implementing said control system.

5. The apparatus recited in claim 4 further including means for communicating information using the Manufacturing Automation Protocol.

6. The apparatus recited in claim 4 further including a third programming object that provides means for creating visual images of Grafcet objects.

7. A method for designing, constructing and interacting with a control system, said control system comprising functional elements running on computer processors, said functional elements capable of operating concurrently and asynchronously, comprising the steps of:

designing said control system by creating a plurality of interacting objects;

generating actual instructions that implement said control system from said objects, thereafter:

simulating effects of the actual instructions;

sending said actual instructions to selected ones of said computer processors;

operating a run time module means on selected ones of said computer processors to control the execution of said actual instructions; and allowing said run time module means to interact with said objects such that a user interacts with a single common representation of said control system for specifying, designing and implementing said control system.

8. An apparatus comprising a computer and a computer program, said computer program comprising in combination:

a plurality of design objects for designing a control system that includes functional elements that are capable of operating concurrently and asynchronously;

first programming objects that provide a means for generating a graphical description of a set of concurrent asynchronous functional elements that comprise an integrated control system;

second programming objects that provide means for generating programming code that implements said integrated control system; and a run time module means for managing the execution of a portion of said integrated control system, whereby a complex system can be easily designed and implemented.

9. The apparatus recited in claim 8 further including: programming objects that provide means for generating means for communicating between concurrently operating one of said functional elements.

10. The apparatus recited in claim 9 further including: programming objects that include means for simulating the operation of said integrated control system.

11. The apparatus recited in claim 9 further including: programming objects that include means for presenting visual representations of static structure of said integrated control system.

12. The apparatus recited in claim 9 further including: programming objects that include means for presenting visual representations of dynamic behavior of said system.

13. The apparatus recited in claim 8 further including a third programming object that provides means for creating visual images of Grafcet objects.

14. The apparatus recited in claim 8 further including means for transmitting communication objects for communicating information between said functional elements.

15. The apparatus recited in claim 14 wherein said transmitting means comprises means for communicating information using the Manufacturing Automation Protocol.

* * * * *